US011101435B2

(12) United States Patent
Li et al.

(10) Patent No.: US 11,101,435 B2
(45) Date of Patent: Aug. 24, 2021

(54) TETRADENTATE PLATINUM AND PALLADIUM COMPLEXES BASED ON BISCARBAZOLE AND ANALOGUES

(71) Applicant: Arizona Board of Regents on behalf of Arizona State University, Scottsdale, AZ (US)

(72) Inventors: Jian Li, Tempe, AZ (US); Zhi-Qiang Zhu, Mesa, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 15/984,036

(22) Filed: May 18, 2018

(65) Prior Publication Data

US 2018/0337350 A1 Nov. 22, 2018

Related U.S. Application Data

(60) Provisional application No. 62/508,849, filed on May 19, 2017.

(51) Int. Cl.

| | |
|---|---|
| ***C07F 15/00*** | (2006.01) |
| ***H01L 51/50*** | (2006.01) |
| ***H01L 51/00*** | (2006.01) |
| ***C09K 11/06*** | (2006.01) |

(52) U.S. Cl.

CPC ........ *H01L 51/0084* (2013.01); *C07F 15/006* (2013.01); *C07F 15/0086* (2013.01); *C09K 11/06* (2013.01); *H01L 51/0087* (2013.01); *C09K 2211/1029* (2013.01); *C09K 2211/1033* (2013.01); *C09K 2211/1037* (2013.01); *C09K 2211/1044* (2013.01); *C09K 2211/185* (2013.01); *H01L 51/5012* (2013.01); *H01L 51/5016* (2013.01)

(58) Field of Classification Search

CPC ..... H01L 51/0087; H01L 51/50; C07F 15/006
USPC .................................... 546/4, 2, 10; 313/504
See application file for complete search history.

(56) References Cited

U.S. PATENT DOCUMENTS

| | | | |
|---|---|---|---|
| 4,769,292 | A | 9/1988 | Tang |
| 5,451,674 | A | 9/1995 | Silver |
| 5,641,878 | A | 6/1997 | Dandliker |
| 5,707,745 | A | 1/1998 | Forrest et al. |
| 5,844,363 | A | 12/1998 | Gu |
| 6,200,695 | B1 | 3/2001 | Arai |
| 6,303,238 | B1 | 10/2001 | Thompson |
| 6,780,528 | B2 | 8/2004 | Tsuboyama et al. |
| 7,002,013 | B1 | 2/2006 | Chi |
| 7,037,599 | B2 | 5/2006 | Culligan et al. |
| 7,064,228 | B1 | 6/2006 | Yu |
| 7,268,485 | B2 | 9/2007 | Tyan |
| 7,279,704 | B2 | 10/2007 | Walters |
| 7,332,232 | B2 | 2/2008 | Ma |
| 7,442,797 | B2 | 10/2008 | Itoh et al. |
| 7,501,190 | B2 | 3/2009 | Ise |
| 7,635,792 | B1 | 12/2009 | Cella |
| 7,655,322 | B2 | 2/2010 | Forrest et al. |
| 7,854,513 | B2 | 12/2010 | Quach |
| 7,947,383 | B2 | 5/2011 | Ise et al. |
| 8,106,199 | B2 | 1/2012 | Jabbour |
| 8,133,597 | B2 | 3/2012 | Yasukawa |
| 8,389,725 | B2 | 3/2013 | Li et al. |
| 8,617,723 | B2 | 12/2013 | Stoessel |
| 8,669,364 | B2 | 3/2014 | Li |
| 8,778,509 | B2 | 7/2014 | Yasukawa |
| 8,816,080 | B2 | 8/2014 | Li et al. |
| 8,846,940 | B2 | 9/2014 | Li |
| 8,871,361 | B2 | 10/2014 | Xia et al. |
| 8,927,713 | B2 | 1/2015 | Li et al. |
| 8,946,417 | B2 | 2/2015 | Li et al. |
| 8,987,451 | B2 | 3/2015 | Tsai |
| 9,059,412 | B2 | 6/2015 | Zeng et al. |
| 9,076,974 | B2 | 7/2015 | Li |
| 9,082,989 | B2 | 7/2015 | Li |
| 9,203,039 | B2 | 12/2015 | Li |
| 9,221,857 | B2 | 12/2015 | Li |
| 9,224,963 | B2 | 12/2015 | Li et al. |
| 9,238,668 | B2 | 1/2016 | Li et al. |
| 9,312,502 | B2 | 4/2016 | Li |
| 9,312,505 | B2 | 4/2016 | Brooks et al. |
| 9,318,725 | B2 | 4/2016 | Li |
| 9,324,957 | B2 | 4/2016 | Li et al. |
| 9,382,273 | B2 | 7/2016 | Li |
| 9,385,329 | B2 | 7/2016 | Li et al. |
| 9,425,415 | B2 | 8/2016 | Li et al. |
| 9,461,254 | B2 | 10/2016 | Tsai |
| 9,493,698 | B2 | 11/2016 | Beers |
| 9,502,671 | B2 | 11/2016 | Li |
| 9,550,801 | B2 | 1/2017 | Li et al. |
| 9,598,449 | B2 | 3/2017 | Li |
| 9,617,291 | B2 | 4/2017 | Li et al. |
| 9,666,822 | B2 | 5/2017 | Forrest |
| 9,673,409 | B2 | 6/2017 | Li |
| 9,698,359 | B2 | 7/2017 | Li et al. |
| 9,711,739 | B2 | 7/2017 | Li |
| 9,711,741 | B2 | 7/2017 | Li |
| 9,711,742 | B2 | 7/2017 | Li et al. |

(Continued)

FOREIGN PATENT DOCUMENTS

| | | |
|---|---|---|
| CN | 1680366 A | 10/2005 |
| CN | 1777663 | 5/2006 |

(Continued)

OTHER PUBLICATIONS

Dorwald, Side Reactions in Organic Synthesis 2005, Wiley:VCH Weinheim Preface, pp. 1-15 & Chapter 1, pp. 279-308.*

(Continued)

*Primary Examiner* — Charanjit Aulakh
(74) *Attorney, Agent, or Firm* — Riverside Law LLP

(57) ABSTRACT

Tetradentate platinum and palladium complexes based on biscarbazole and analogues for full color displays and lighting applications.

3 Claims, 7 Drawing Sheets

(56) References Cited

U.S. PATENT DOCUMENTS

| | | | |
|---|---|---|---|
| 9,735,397 | B2 | 8/2017 | Riegel |
| 9,755,163 | B2 | 9/2017 | Li et al. |
| 9,818,959 | B2 | 11/2017 | Li |
| 9,865,825 | B2 | 1/2018 | Li |
| 9,879,039 | B2 | 1/2018 | Li |
| 9,882,150 | B2 | 1/2018 | Li |
| 9,899,614 | B2 | 2/2018 | Li |
| 9,920,242 | B2 | 3/2018 | Li |
| 9,923,155 | B2 | 3/2018 | Li et al. |
| 9,941,479 | B2 | 4/2018 | Li |
| 9,947,881 | B2 | 4/2018 | Li |
| 9,985,224 | B2 | 5/2018 | Li |
| 10,020,455 | B2 | 7/2018 | Li |
| 10,033,003 | B2 | 7/2018 | Li |
| 10,056,564 | B2 | 8/2018 | Li |
| 10,056,567 | B2 | 8/2018 | Li |
| 10,158,091 | B2 | 12/2018 | Li |
| 10,177,323 | B2 | 1/2019 | Li |
| 10,211,411 | B2 | 2/2019 | Li |
| 10,211,414 | B2 | 2/2019 | Li |
| 10,263,197 | B2 | 4/2019 | Li |
| 10,294,417 | B2 | 5/2019 | Li |
| 10,392,387 | B2 | 8/2019 | Li |
| 10,411,202 | B2 | 9/2019 | Li |
| 10,414,785 | B2 | 9/2019 | Li |
| 10,516,117 | B2 | 12/2019 | Li |
| 10,566,553 | B2 | 2/2020 | Li |
| 10,566,554 | B2 | 2/2020 | Li |
| 2001/0019782 | A1 | 9/2001 | Igarashi |
| 2002/0068190 | A1 | 6/2002 | Tsuboyama |
| 2003/0062519 | A1 | 4/2003 | Yamazaki et al. |
| 2003/0186077 | A1 | 10/2003 | Chen |
| 2004/0230061 | A1 | 11/2004 | Seo |
| 2005/0037232 | A1 | 2/2005 | Tyan |
| 2005/0139810 | A1 | 6/2005 | Kuehl |
| 2005/0170207 | A1 | 8/2005 | Ma et al. |
| 2005/0260446 | A1 | 11/2005 | Mackenzie et al. |
| 2006/0024522 | A1 | 2/2006 | Thompson |
| 2006/0032528 | A1 | 2/2006 | Wang |
| 2006/0066228 | A1 | 3/2006 | Antoniadis |
| 2006/0073359 | A1 | 4/2006 | Ise et al. |
| 2006/0094875 | A1 | 5/2006 | Itoh et al. |
| 2006/0127696 | A1 | 6/2006 | Stossel |
| 2006/0182992 | A1 | 8/2006 | Nii et al. |
| 2006/0202197 | A1 | 9/2006 | Nakayama et al. |
| 2006/0210831 | A1 | 9/2006 | Sano et al. |
| 2006/0255721 | A1 | 11/2006 | Igarashi et al. |
| 2006/0263635 | A1 | 11/2006 | Ise |
| 2006/0286406 | A1 | 12/2006 | Igarashi et al. |
| 2007/0057630 | A1 | 3/2007 | Nishita et al. |
| 2007/0059551 | A1 | 3/2007 | Yamazaki |
| 2007/0082284 | A1 | 4/2007 | Stoessel et al. |
| 2007/0103060 | A1 | 5/2007 | Itoh et al. |
| 2007/0160905 | A1 | 7/2007 | Morishita |
| 2007/0252140 | A1 | 11/2007 | Limmert |
| 2008/0001530 | A1 | 1/2008 | Ise et al. |
| 2008/0036373 | A1 | 2/2008 | Itoh et al. |
| 2008/0054799 | A1 | 3/2008 | Satou |
| 2008/0079358 | A1 | 4/2008 | Satou |
| 2008/0102310 | A1 | 5/2008 | Thompson |
| 2008/0111476 | A1 | 5/2008 | Choi et al. |
| 2008/0241518 | A1 | 10/2008 | Satou et al. |
| 2008/0241589 | A1 | 10/2008 | Fukunaga et al. |
| 2008/0269491 | A1 | 10/2008 | Jabbour |
| 2008/0315187 | A1 | 12/2008 | Bazan |
| 2009/0026936 | A1 | 1/2009 | Satou et al. |
| 2009/0026939 | A1 | 1/2009 | Kinoshita et al. |
| 2009/0032989 | A1 | 2/2009 | Karim |
| 2009/0039768 | A1 | 2/2009 | Igarashi et al. |
| 2009/0079340 | A1 | 3/2009 | Kinoshita et al. |
| 2009/0126796 | A1 | 5/2009 | Yang |
| 2009/0128008 | A1 | 5/2009 | Ise et al. |
| 2009/0136779 | A1 | 5/2009 | Cheng et al. |
| 2009/0153045 | A1 | 6/2009 | Kinoshita et al. |
| 2009/0167167 | A1 | 7/2009 | Aoyama |
| 2009/0205713 | A1 | 8/2009 | Mitra |
| 2009/0218561 | A1 | 9/2009 | Kitamura et al. |
| 2009/0261721 | A1 | 10/2009 | Murakanni et al. |
| 2009/0267500 | A1 | 10/2009 | Kinoshita et al. |
| 2010/0000606 | A1 | 1/2010 | Thompson |
| 2010/0013386 | A1 | 1/2010 | Thompson |
| 2010/0043876 | A1 | 2/2010 | Tuttle |
| 2010/0093119 | A1 | 4/2010 | Shimizu |
| 2010/0127246 | A1 | 5/2010 | Nakayama |
| 2010/0141127 | A1 | 6/2010 | Xia |
| 2010/0147386 | A1 | 6/2010 | Benson-Smith |
| 2010/0171111 | A1 | 7/2010 | Takada et al. |
| 2010/0171418 | A1 | 7/2010 | Kinoshita et al. |
| 2010/0200051 | A1 | 8/2010 | Triani |
| 2010/0204467 | A1 | 8/2010 | Lamarque et al. |
| 2010/0270540 | A1 | 10/2010 | Chung |
| 2010/0288362 | A1 | 11/2010 | Hatwar |
| 2010/0297522 | A1 | 11/2010 | Creeth |
| 2010/0307594 | A1 | 12/2010 | Zhu |
| 2011/0028723 | A1 | 2/2011 | Li |
| 2011/0049496 | A1 | 3/2011 | Fukuzaki |
| 2011/0062858 | A1 | 3/2011 | Yersin |
| 2011/0132440 | A1 | 6/2011 | Sivarajan |
| 2011/0217544 | A1 | 9/2011 | Young |
| 2011/0227058 | A1 | 9/2011 | Masui et al. |
| 2011/0301351 | A1 | 12/2011 | Li |
| 2012/0024383 | A1 | 2/2012 | Kaiho |
| 2012/0025588 | A1 | 2/2012 | Humbert |
| 2012/0039323 | A1 | 2/2012 | Hirano |
| 2012/0095232 | A1 | 4/2012 | Li et al. |
| 2012/0108806 | A1 | 5/2012 | Li |
| 2012/0146012 | A1 | 6/2012 | Limmert |
| 2012/0181528 | A1 | 7/2012 | Takada et al. |
| 2012/0199823 | A1 | 8/2012 | Molt |
| 2012/0202997 | A1 | 8/2012 | Parham et al. |
| 2012/0204960 | A1 | 8/2012 | Kato |
| 2012/0215001 | A1 | 8/2012 | Li et al. |
| 2012/0223634 | A1 | 9/2012 | Xia et al. |
| 2012/0264938 | A1 | 10/2012 | Li |
| 2012/0273736 | A1 | 11/2012 | James et al. |
| 2012/0302753 | A1 | 11/2012 | Li |
| 2013/0048963 | A1 | 2/2013 | Beers et al. |
| 2013/0082245 | A1 | 4/2013 | Kottas et al. |
| 2013/0137870 | A1 | 5/2013 | Li |
| 2013/0168656 | A1 | 7/2013 | Tsai et al. |
| 2013/0172561 | A1 | 7/2013 | Tsai et al. |
| 2013/0200340 | A1 | 8/2013 | Otsu |
| 2013/0203996 | A1 | 8/2013 | Li et al. |
| 2013/0237706 | A1 | 9/2013 | Li |
| 2013/0341600 | A1 | 12/2013 | Lin et al. |
| 2014/0014922 | A1 | 1/2014 | Lin et al. |
| 2014/0014931 | A1 | 1/2014 | Riegel |
| 2014/0027733 | A1 | 1/2014 | Zeng et al. |
| 2014/0042475 | A1 | 2/2014 | Park |
| 2014/0066628 | A1 | 3/2014 | Li |
| 2014/0073798 | A1 | 3/2014 | Li |
| 2014/0084261 | A1 | 3/2014 | Brooks et al. |
| 2014/0114072 | A1 | 4/2014 | Li et al. |
| 2014/0147996 | A1 | 5/2014 | Vogt |
| 2014/0148594 | A1 | 5/2014 | Li |
| 2014/0191206 | A1 | 7/2014 | Cho |
| 2014/0203248 | A1 | 7/2014 | Zhou et al. |
| 2014/0249310 | A1 | 9/2014 | Li |
| 2014/0326960 | A1 | 11/2014 | Kim et al. |
| 2014/0330019 | A1 | 11/2014 | Li et al. |
| 2014/0364605 | A1 | 12/2014 | Li et al. |
| 2015/0008419 | A1 | 1/2015 | Li |
| 2015/0018558 | A1 | 1/2015 | Li |
| 2015/0028323 | A1 | 1/2015 | Xia et al. |
| 2015/0060804 | A1 | 3/2015 | Kanitz |
| 2015/0069334 | A1 | 3/2015 | Xia et al. |
| 2015/0105556 | A1 | 4/2015 | Li et al. |
| 2015/0123047 | A1 | 5/2015 | Maltenberger |
| 2015/0162552 | A1 | 6/2015 | Li et al. |
| 2015/0194616 | A1 | 7/2015 | Li et al. |
| 2015/0207086 | A1 | 7/2015 | Li et al. |
| 2015/0228914 | A1 | 8/2015 | Li et al. |
| 2015/0274762 | A1 | 10/2015 | Li et al. |
| 2015/0287938 | A1 | 10/2015 | Li et al. |

(56) References Cited

U.S. PATENT DOCUMENTS

| | | | |
|---|---|---|---|
| 2015/0311456 | A1 | 10/2015 | Li |
| 2015/0318500 | A1 | 11/2015 | Li |
| 2015/0349279 | A1 | 12/2015 | Li et al. |
| 2015/0380666 | A1 | 12/2015 | Szigethy |
| 2016/0028028 | A1 | 1/2016 | Li et al. |
| 2016/0028029 | A1 | 1/2016 | Li |
| 2016/0043331 | A1 | 2/2016 | Li |
| 2016/0072082 | A1 | 3/2016 | Brooks et al. |
| 2016/0133861 | A1 | 5/2016 | Li |
| 2016/0133862 | A1 | 5/2016 | Li et al. |
| 2016/0181529 | A1 | 6/2016 | Tsai |
| 2016/0194344 | A1 | 7/2016 | Li |
| 2016/0197285 | A1 | 7/2016 | Zeng |
| 2016/0197291 | A1 | 7/2016 | Li et al. |
| 2016/0285015 | A1 | 9/2016 | Li et al. |
| 2016/0359120 | A1 | 12/2016 | Li |
| 2016/0359125 | A1 | 12/2016 | Li |
| 2017/0005278 | A1 | 1/2017 | Li et al. |
| 2017/0012224 | A1 | 1/2017 | Li et al. |
| 2017/0040555 | A1 | 2/2017 | Li et al. |
| 2017/0047533 | A1 | 2/2017 | Li et al. |
| 2017/0066792 | A1 | 3/2017 | Li et al. |
| 2017/0069855 | A1 | 3/2017 | Li et al. |
| 2017/0077420 | A1 | 3/2017 | Li |
| 2017/0125708 | A1 | 5/2017 | Li |
| 2017/0267923 | A1 | 9/2017 | Li |
| 2017/0271611 | A1 | 9/2017 | Li et al. |
| 2017/0301871 | A1 | 10/2017 | Li |
| 2017/0305881 | A1 | 10/2017 | Li et al. |
| 2017/0309943 | A1 | 10/2017 | Angell |
| 2017/0331056 | A1 | 11/2017 | Li et al. |
| 2017/0342098 | A1 | 11/2017 | Li |
| 2017/0373260 | A1 | 12/2017 | Li |
| 2018/0006246 | A1 | 1/2018 | Li |
| 2018/0013096 | A1 | 1/2018 | Hamada |
| 2018/0053904 | A1 | 2/2018 | Li |
| 2018/0130960 | A1 | 5/2018 | Li |
| 2018/0138428 | A1 | 5/2018 | Li |
| 2018/0148464 | A1 | 5/2018 | Li |
| 2018/0159051 | A1 | 6/2018 | Li |
| 2018/0166655 | A1 | 6/2018 | Li |
| 2018/0175329 | A1 | 6/2018 | Li |
| 2018/0194790 | A1 | 7/2018 | Li |
| 2018/0219161 | A1 | 8/2018 | Li |
| 2018/0226592 | A1 | 8/2018 | Li |
| 2018/0226593 | A1 | 8/2018 | Li |
| 2018/0277777 | A1 | 9/2018 | Li |
| 2018/0301641 | A1 | 10/2018 | Li |
| 2018/0312750 | A1 | 11/2018 | Li |
| 2018/0331307 | A1 | 11/2018 | Li |
| 2018/0334459 | A1 | 11/2018 | Li |
| 2018/0337345 | A1 | 11/2018 | Li |
| 2018/0337349 | A1 | 11/2018 | Li |
| 2018/0337350 | A1 | 11/2018 | Li |
| 2019/0013485 | A1 | 1/2019 | Li |
| 2019/0067602 | A1 | 2/2019 | Li |
| 2019/0109288 | A1 | 4/2019 | Li |
| 2019/0119312 | A1 | 4/2019 | Chen |
| 2019/0194536 | A1 | 6/2019 | Li |
| 2019/0259963 | A1 | 8/2019 | Li |
| 2019/0276485 | A1 | 9/2019 | Li |
| 2019/0312217 | A1 | 10/2019 | Li |
| 2019/0367546 | A1 | 12/2019 | Li |
| 2019/0389893 | A1 | 12/2019 | Li |
| 2020/0006678 | A1 | 1/2020 | Li |
| 2020/0071330 | A1 | 3/2020 | Li |
| 2020/0075868 | A1 | 3/2020 | Li |
| 2020/0119288 | A1 | 4/2020 | Li |
| 2020/0119289 | A1 | 4/2020 | Lin |
| 2020/0140471 | A1 | 5/2020 | Chen |
| 2020/0152891 | A1 | 5/2020 | Li |
| 2020/0239505 | A1 | 7/2020 | Li |
| 2020/0243776 | A1 | 7/2020 | Li |

FOREIGN PATENT DOCUMENTS

| | | | |
|---|---|---|---|
| CN | 1894267 | | 1/2007 |
| CN | 1894269 | | 1/2007 |
| CN | 101142223 | | 3/2008 |
| CN | 101667626 | | 3/2010 |
| CN | 102449108 | A | 5/2012 |
| CN | 102892860 | | 1/2013 |
| CN | 102971396 | | 3/2013 |
| CN | 103102372 | | 5/2013 |
| CN | 104232076 | | 12/2014 |
| CN | 104377231 | | 2/2015 |
| CN | 104576934 | | 4/2015 |
| CN | 104693243 | | 6/2015 |
| CN | 105367605 | | 3/2016 |
| CN | 105418591 | | 3/2016 |
| CN | 106783922 | | 5/2017 |
| EP | 1617493 | | 1/2006 |
| EP | 1808052 | | 7/2007 |
| EP | 1874893 | | 1/2008 |
| EP | 1874894 | | 1/2008 |
| EP | 1919928 | | 5/2008 |
| EP | 1968131 | | 9/2008 |
| EP | 2020694 | | 2/2009 |
| EP | 2036907 | | 3/2009 |
| EP | 2096690 | A2 | 9/2009 |
| EP | 2417217 | | 2/2012 |
| EP | 2112213 | | 7/2012 |
| EP | 2684932 | | 1/2014 |
| EP | 2711999 | | 3/2014 |
| EP | 3032293 | | 6/2016 |
| JP | 2002010505 | | 1/2002 |
| JP | 2002105055 | A | 4/2002 |
| JP | 2003342284 | | 12/2003 |
| JP | 2005031073 | | 2/2005 |
| JP | 2005267557 | | 9/2005 |
| JP | 2005310733 | | 11/2005 |
| JP | 2006047240 | A | 2/2006 |
| JP | 2006232784 | | 9/2006 |
| JP | 2006242080 | | 9/2006 |
| JP | 2006242081 | A | 9/2006 |
| JP | 2006256999 | | 9/2006 |
| JP | 2006257238 | | 9/2006 |
| JP | 2006261623 | | 9/2006 |
| JP | 2006290988 | | 10/2006 |
| JP | 2006313796 | | 11/2006 |
| JP | 2006332622 | | 12/2006 |
| JP | 2006351638 | | 12/2006 |
| JP | 2007019462 | | 1/2007 |
| JP | 2007031678 | A | 2/2007 |
| JP | 2007042875 | | 2/2007 |
| JP | 2007051243 | | 3/2007 |
| JP | 2007053132 | | 3/2007 |
| JP | 2007066581 | | 3/2007 |
| JP | 2007073620 | | 3/2007 |
| JP | 2007073845 | | 3/2007 |
| JP | 2007073900 | | 3/2007 |
| JP | 2007080593 | | 3/2007 |
| JP | 2007080677 | | 3/2007 |
| JP | 2007088105 | | 4/2007 |
| JP | 2007088164 | | 4/2007 |
| JP | 2007096259 | | 4/2007 |
| JP | 2007099765 | A | 4/2007 |
| JP | 2007110067 | | 4/2007 |
| JP | 2007110102 | | 4/2007 |
| JP | 2007519614 | | 7/2007 |
| JP | 2007258550 | | 10/2007 |
| JP | 2007324309 | | 12/2007 |
| JP | 2008010353 | A | 1/2008 |
| JP | 2008091860 | | 4/2008 |
| JP | 2008103535 | | 5/2008 |
| JP | 2008108617 | | 5/2008 |
| JP | 2008109085 | | 5/2008 |
| JP | 2008109103 | A | 5/2008 |
| JP | 2008116343 | A | 5/2008 |
| JP | 2008117545 | A | 5/2008 |
| JP | 2008160087 | | 7/2008 |
| JP | 2008198801 | | 8/2008 |
| JP | 2008270729 | | 11/2008 |

(56) References Cited

FOREIGN PATENT DOCUMENTS

| | | |
|---|---|---|
| JP | 2008270736 | 11/2008 |
| JP | 2008310220 A | 12/2008 |
| JP | 2009016184 | 1/2009 |
| JP | 2009016579 | 1/2009 |
| JP | 2009032977 | 2/2009 |
| JP | 2009032988 | 2/2009 |
| JP | 2009059997 | 3/2009 |
| JP | 2009076509 A | 4/2009 |
| JP | 2009161524 | 7/2009 |
| JP | 2009247171 | 10/2009 |
| JP | 2009266943 | 11/2009 |
| JP | 2009267171 | 11/2009 |
| JP | 2009267244 | 11/2009 |
| JP | 2009272339 | 11/2009 |
| JP | 2009283891 | 12/2009 |
| JP | 2010135689 | 6/2010 |
| JP | 2010171205 | 8/2010 |
| JP | 2011071452 | 4/2011 |
| JP | 2012079895 | 4/2012 |
| JP | 2012079898 | 4/2012 |
| JP | 2012522843 | 9/2012 |
| JP | 2012207231 | 10/2012 |
| JP | 2012222255 | 11/2012 |
| JP | 2012231135 | 11/2012 |
| JP | 2013023500 | 2/2013 |
| JP | 2013048256 | 3/2013 |
| JP | 2013053149 | 3/2013 |
| JP | 2013525436 | 6/2013 |
| JP | 2014019701 | 2/2014 |
| JP | 2014058504 | 4/2014 |
| JP | 2014520096 | 8/2014 |
| JP | 5604505 | 10/2014 |
| JP | 2012709899 | 11/2014 |
| JP | 2014221807 | 11/2014 |
| JP | 2014239225 | 12/2014 |
| JP | 2015081257 | 4/2015 |
| KR | 20060011537 | 2/2006 |
| KR | 20060015371 | 2/2006 |
| KR | 1020060115371 | 11/2006 |
| KR | 2007061830 | 6/2007 |
| KR | 2007112465 | 11/2007 |
| KR | 1020130043460 | 4/2013 |
| KR | 101338250 | 12/2013 |
| KR | 20140052501 | 5/2014 |
| TW | 200701835 | 1/2007 |
| TW | 201249851 | 12/2012 |
| TW | 201307365 | 2/2013 |
| TW | 201710277 | 3/2017 |
| WO | 2000070655 | 11/2000 |
| WO | WO2000070655 | 11/2000 |
| WO | WO2004003108 | 1/2004 |
| WO | 2004070655 | 8/2004 |
| WO | WO2004085450 | 10/2004 |
| WO | WO2004108857 | 12/2004 |
| WO | WO2005042444 | 5/2005 |
| WO | WO2005042550 | 5/2005 |
| WO | WO2005113704 | 12/2005 |
| WO | WO2006033440 | 3/2006 |
| WO | WO2006067074 | 6/2006 |
| WO | 2006081780 | 8/2006 |
| WO | WO2006098505 | 9/2006 |
| WO | 2006113106 | 10/2006 |
| WO | WO2006115299 | 11/2006 |
| WO | WO2006115301 | 11/2006 |
| WO | WO2007034985 | 3/2007 |
| WO | 2007069498 A1 | 6/2007 |
| WO | 2008054578 | 5/2008 |
| WO | WO2008066192 | 6/2008 |
| WO | WO2008066195 | 6/2008 |
| WO | WO2008066196 | 6/2008 |
| WO | WO2008101842 | 8/2008 |
| WO | WO2008117889 | 10/2008 |
| WO | WO2008123540 | 10/2008 |
| WO | 2008131932 A1 | 11/2008 |
| WO | 2009003455 | 1/2009 |
| WO | 2009008277 | 1/2009 |
| WO | 2009011327 | 1/2009 |
| WO | WO2009017211 | 2/2009 |
| WO | WO2009023667 | 2/2009 |
| WO | 2009086209 | 7/2009 |
| WO | 2009111299 | 9/2009 |
| WO | WO2010007098 | 1/2010 |
| WO | WO2010056669 | 5/2010 |
| WO | WO2010093176 | 8/2010 |
| WO | 2010105141 | 9/2010 |
| WO | 2010118026 | 10/2010 |
| WO | WO2010118026 | 10/2010 |
| WO | WO2011064335 | 6/2011 |
| WO | WO2011070989 | 6/2011 |
| WO | 2011089163 | 7/2011 |
| WO | 2011137429 | 11/2011 |
| WO | 2011137431 | 11/2011 |
| WO | WO2011137429 | 11/2011 |
| WO | WO2011137431 | 11/2011 |
| WO | 2012074909 | 6/2012 |
| WO | 2012112853 | 8/2012 |
| WO | WO2012112853 | 8/2012 |
| WO | WO2012116231 | 8/2012 |
| WO | 2012142387 | 10/2012 |
| WO | WO2012142387 | 10/2012 |
| WO | 2012162488 | 11/2012 |
| WO | WO2012162488 | 11/2012 |
| WO | WO2012163471 | 12/2012 |
| WO | 2013130483 | 9/2013 |
| WO | WO2013130483 | 9/2013 |
| WO | 2014009310 | 1/2014 |
| WO | WO2014016611 | 1/2014 |
| WO | 2014031977 | 2/2014 |
| WO | WO2014031977 | 2/2014 |
| WO | 2014047616 | 3/2014 |
| WO | WO2014047616 | 3/2014 |
| WO | 2014109814 | 7/2014 |
| WO | WO2014109814 | 7/2014 |
| WO | WO2014208271 | 12/2014 |
| WO | 2015027060 | 2/2015 |
| WO | WO2015027060 | 2/2015 |
| WO | 2015131158 | 9/2015 |
| WO | WO2015131158 | 9/2015 |
| WO | 2016025921 | 2/2016 |
| WO | 2016029186 | 2/2016 |
| WO | WO2016025921 | 2/2016 |
| WO | WO2016029137 | 2/2016 |
| WO | WO2016029186 | 2/2016 |
| WO | WO2016197019 | 12/2016 |
| WO | 2017117935 | 7/2017 |
| WO | WO2018071697 | 4/2018 |
| WO | WO2018140765 | 8/2018 |
| WO | 2019079505 | 4/2019 |
| WO | 2019079508 | 4/2019 |
| WO | 2019079509 | 4/2019 |
| WO | 2019236541 | 12/2019 |
| WO | 2020018476 | 1/2020 |

OTHER PUBLICATIONS

Wong; Challenges in organometallic research—Great opportunity for solar cells and OLEDs, Journal of Organometallic Chemistry, 2009, 694, 2644-2647.

JP2009267244, English Translation from EPO, Nov. 2009, 80 pages.

JP2010135689, English translation from EPO, Jun. 2010, 95 pages.

Chi et al.; Transition-metal phosphors with cyclometalating ligands: fundamentals and applications, Chemical Society Reviews, vol. 39, No. 2, Feb. 2010, pp. 638-655.

Satake et al., "Interconvertible Cationic and Neutral Pyridinylimidazole η3-Allylpalladium Complexes. Structural Assignment by 1H, 13C, and 15N NMR and X-ray Diffraction", Organometallics, vol. 18, No. 24, 1999, pp. 5108-5111.

Baldo et al., "Highly Efficient Phosphorescent Emission from Organic Electroluminescent Devices," Nature, vol. 395, Sep. 10, 1998, pp. 151-154.

(56) References Cited

OTHER PUBLICATIONS

Baldo et al., "Very high-efficiency green organic light-emitting devices based on electrophosphorescence," Applied Physics Letters, vol. 75, No. 1, Jul. 5, 1999, pp. 4-6.
Ayan Maity et al., "Room-temperature synthesis of cyclometalated iridium(III) complexes; kinetic isomers and reactive functionalities" Chem. Sci., vol. 4, pp. 1175-1181 (2013).
Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).
Ji Hyun Seo et al., "Efficient blue-green organic light-emitting diodes based on heteroleptic tris-cyclometalated iridium (III) complexes". Thin Solid Films, vol. 517, pp. 1807-1810 (2009).
Barry O'Brien et al.: White organic light emitting diodes using Pt-based red, green and blue phosphorescent dopants. Proc. SPIE, vol. 8829, pp. 1-6, Aug. 25, 2013.
Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.
Shizuo Tokito et al., "Confinement of triplet energy on phosphorescent molecules for highly-efficient organic blue-light-emitting devices," Applied Physics Letters, vol. 83, No. 3, Jul. 21, 2003, pp. 569-571.
Brian W. D'Andrade et al., "Controlling Exciton Diffusion in Multilayer White Phosphorescent Organic Light Emitting Devices," Adv. Mater. , vol. 14, No. 2, Jan. 16, 2002, pp. 147-151.
Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.
Evan L. Williams et al., "Excimer-Based White Phosphorescent Organic Light Emitting Diodes with Nearly 100% Internal Quantum Efficiency," Adv. Mater., vol. 19, 2007, pp. 197-202.
Shih-Chun Lo et al., "High-Triplet-Energy Dendrons: Enhancing the Luminescence of Deep Blue Phosphorescent Iridium(III) Complexes," J. Am. Chem. Soc., vol. 131, 2009, pp. 16681-16688.
Jan Kalinowski et al., "Light-emitting devices based on organometallic platinum complexes as emitters," Coordination Chemistry Reviews, vol. 255, 2011, pp. 2401-2425.
Ke Feng et al., "Norbornene-Based Copolymers Containing Platinum Complexes and Bis(carbazolyl)benzene Groups in Their Side-Chains," Macromolecules, vol. 42, 2009, pp. 6855-6864.
Chi-Ming Che et al., "Photophysical Properties and OLED Applications of Phosphorescent Platinum(II) Schiff Base Complexes," Chem. Eur. J., vol. 16, 2010, pp. 233-247.
Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.
Hirohiko Fukagawa et al., "Highly Efficient and Stable Red Phosphorescent Organic Light-Emitting Diodes Using Platinum Complexes," Adv. Mater., 2012, vol. 24, pp. 5099-5103.
Eric Turner et al., "Cyclometalated Platinum Complexes with Luminescent Quantum Yields Approaching 100%," Inorg. Chem., 2013, vol. 52, pp. 7344-7351.
Steven C. F. Kui et al., "Robust Phosphorescent Platinum(II) Complexes Containing Tetradentate ONCN Ligands: Excimeric Excited State and Application in Organic White-Light-Emitting Diodes," Chem. Eur. J., 2013, vol. 19, pp. 69-73.
Steven C. F. Kui et al., "Robust phosphorescent platinum(II) complexes with tetradentate ONCN ligands: high efficiency OLEDs with excellent efficiency stability," Chem. Commun., 2013, vol. 49, pp. 1497-1499.
Guijie Li et al., "Efficient and stable red organic light emitting devices from a tetradentate cyclometalated platinum complex," Organic Electronics, 2014, vol. 15 pp. 1862-1867.
Guijie Li et al., Efficient and Stable White Organic Light-Emitting Diodes Employing a Single Emitter, Adv. Mater., 2014, vol. 26, pp. 2931-2936.
Barry O'Brien et al., "High efficiency white organic light emitting diodes employing blue and red platinum emitters," Journal of Photonics for Energy, vol. 4, 2014, pp. 043597-1-043597-8.
Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.
Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.
Murakami; JP 2007258550, English machine translation from EPO, Oct. 4, 2007. 80 pages.
Murakami; JP 2007324309, English machine translation from EPO, Dec. 13, 2007, 89 pages.
Marc Lepeltier et al., "Efficient blue green organic light-emitting devices based on a monofluorinated heteroleptic iridium(III) complex," Synthetic Metals, vol. 199, 2015, pp. 139-146.
Stefan Bernhard, "The First Six Years: A Report," Department of Chemistry, Princeton University, May 2008, 11 pages.
Zhi-Qiang Zhu et.al., "Harvesting All Electrogenerated Excitons through Metal Assisted Delayed Fluorescent Materials," Adv. Mater. 27 (2015) 2533-2537.
Zhi-Qiang Zhu et. al.. "Efficient Cyclometalated Platinum(II) Complex with Superior Operational Stability," Adv. Mater. 29 (2017) 1605002, pp. 1-5.
Chew, S. et al.: Photoluminescence and electroluminescence of a new blue-emitting homoleptic iridium complex. Applied Phys. Letters; 2006, vol. 88, pp. 093510-1-093510-3.
Xin Li et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.
Sylvia Bettington et al. "Tris-Cyclometalated Iridium(III) Complexes of Carbazole(fluorenyl)pyridine Ligands: Synthesis, Redox and Photophysical Properties, and Electrophosphorescent Light-Emitting Diodes" Chemistry: A European Journal, 2007, vol. 13, pp. 1423-1431.
Christoph Ulbricht et al., "Synthesis and Characterization of Oxetane-Functionalized Phosphorescent Ir(III)—Complexes", Macromol. Chem. Phys. 2009, 210, pp. 531-541.
Dan Wang et al., "Carbazole and arylamine functionalized iridium complexes for efficient electro-phosphorescent light-emitting diodes", Inorganica Chimica Acta 370 (2011) pp. 340-345.
Huaijun Tang et al., "Novel yellow phosphorescent iridium complexes containing a carbazoleeoxadiazole unit used in polymeric light-emitting diodes", Dyes and Pigments 91 (2011) pp. 413-421.
Hoe-Joo Seo et al., "Blue phosphorescent iridium(III) complexes containing carbazole-functionalized phenyl pyridine for organic light-emitting diodes: energy transfer from carbazolyl moieties to iridium(III) cores", RSC Advances, 2011, vol. 1, pp. 755-757.
Jack W. Levell et al., "Carbazole/iridium dendrimer side-chain phosphorescent copolymers for efficient light emitting devices", New J. Chem., 2012, vol. 36, pp. 407-413.
Z Liu et al., "Green and blue-green phosphorescent heteroleptic iridium complexes containing carbazole-functionalized beta-diketonate for non-doped organic light-emitting diodes", Organic Electronics 9 (2008) pp. 171-182.
Zhaowu Xu et al., "Synthesis and properties of iridium complexes based 1,3,4-oxadiazoles derivatives", Tetrahedron 64 (2008) pp. 1860-1867.
D.F. O'Brien et al., "Improved energy transfer in electrophosphorescent devices," Appl. Phys. Lett., vol. 74, No. 3, Jan. 18, 1999, pp. 442-444.
Vadim Adamovich et al., "High efficiency single dopant white electrophosphorescent light emitting diodes," New J. Chem., 2002, 26, pp. 1171-1178.
Kwon-Hyeon Kim et al., "Controlling Emitting Dipole Orientation with Methyl Substituents on Main Ligand of Iridium Complexes for Highly Efficient Phosphorescent Organic Light-Emitting Diodes", Adv. Optical Mater. 2015, 3, pp. 1191-1196.

(56) References Cited

OTHER PUBLICATIONS

Matthew J. Jurow et al., "Understanding and predicting the orientation of heteroleptic phosphors in organic light-emitting materials", Nature Materials, vol. 15, Jan. 2016, pp. 85-93.
Kwon-Hyeon Kim et al., "Crystal Organic Light-Emitting Diodes with Perfectly Oriented Non-Doped Pt-Based Emitting Layer", Adv. Mater. 2016, 28, pp. 2526-2532.
Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.
Guijie Li et al., "Modifying Emission Spectral Bandwidth of Phosphorescent Platinum(II) Complexes Through Synthetic Control," Inorg. Chem. 2017, 56, 8244-8256.
Tyler Fleetham et al., "Efficient Red-Emitting Platinum Complex with Long Operational Stability," ACS Appl. Mater. Interfaces 2015, 7, 16240-16246.
Supporting Information: Xiao-Chun Hang et al., "Highly Efficient Blue-Emitting Cyclometalated Platinum(II) Complexes by Judicious Molecular Design," Wiley-VCH 2013, 7 pages.
Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.
Pui Keong Chow et al., "Strongly Phosphorescent Palladium(II) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.
Pui-Keong Chow et al., "Highly luminescent palladium(II) complexes with sub-millisecond blue to green phosphorescent excited states. Photocatalysis and highly efficient PSF-OLEDs," Chem. Sci., 2016, 7, 6083-6098.
U.S. Appl. No. 16/668,010, filed Oct. 30, 2019.
U.S. Appl. No. 16/739,480, filed Jan. 10, 2020.
U.S. Appl. No. 16/751,561, filed Jan. 24, 2020.
Adachi, C. et al., "High-efficiency organic electrophosphorescent devices with tris(2-phenylpyridine)iridium doped into electron-transporting materials", Applied Physics Letters, Aug. 2000, vol. 77, No. 6, pp. 904-906 <DOI:10.1063/1.1306639>.
Baldo et al., "Very high-efficiency green organic light-emitting devices based on electrophosphorescence," Appl. Phys. Lett., vol. 75, No. 3, 4-6 (1999).
Baldo et al., Very High-Efficiency Green Organic Light-Emitting Devices Based on Electrophosphorescence, Appl Phys Lett, 75(3):4-6 (1999).
Baldo, M. et al., "Excitonic singlet-triplet ratio in a semiconducting organic thin film", Physical Review B, Nov. 1999, vol. 60, No. 20, pp. 14422-14428 <DOI:10.1103/PhysRevB.60.14422>.
Baldo, M. et al., "High-efficiency fluorescent organic light-emitting devices using a phosphorescent sensitizer", Nature, Feb. 2000, vol. 403, pp. 750-753.
Berson et al. (2007). "Poly(3-hexylthiophene) fibers for photovoltaic applications," Adv. Funct. Mat., 17, 1377-84.
Bouman et al. (1994). "Chiroptical properties of regioregular chiral polythiophenes," Mol. Cryst. Liq. Cryst., 256, 439-48.
Bronner; Dalton Trans., 2010, 39, 180-184. DOI: 10.1039/b908424j (Year: 2010) (5 pages).
Brooks, J. et al., "Synthesis and Characterization of Phosphorescent Cyclometalated Platinum Complexes", Inorganic Chemistry, May 2002, vol. 41, No. 12, pp. 3055-3066 <DOI:10.1021/ic0255508>.
Brown, A. et al., "Optical spectroscopy of triplet excitons and charged excitations in poly(p-phenylenevinylene) light-emitting diodes", Chemical Physics Letters, Jul. 1993, vol. 210, No. 1-3, pp. 61-66 <DOI:10.1016/0009-2614(93)89100-V>.
Burroughes, J. et al., "Light-emitting diodes based on conjugated polymers", Nature, Oct. 1990, vol. 347, pp. 539-541.
Campbell et al. (2008). "Low-temperature control of nanoscale morphology for high performance polymer photovoltaics," Nano Lett., 8, 3942-47.
Chen, F. et al., "High-performance polymer light-emitting diodes doped with a red phosphorescent iridium complex", Applied Physics Letters, Apr. 2002 [available online Mar. 2002], vol. 80, No. 13, pp. 2308-2310 <10.1063/1.1462862>.
Chen, X., et al., "Fluorescent Chemosensors Based on Spiroring-Opening of Xanthenes and Related Derivatives", Chemical Reviews, 2012 [available online Oct. 2011], vol. 112, No. 3, pp. 1910-1956 <DOI:10.1021/cr200201z>.
Chow; Angew. Chem. Int. Ed. 2013, 52, 11775-11779. DOI: 10.1002/anie.201305590 (Year: 2013) (5 pages).
Coakley et al. (2004). "Conjugated polymer photovoltaic cells," Chem. Mater., 16, 4533-4542.
Colombo, M. et al., "Synthesis and high-resolution optical spectroscopy of bis[2-(2-thienyl)pyridinato-C3,N'](2,2'-bipyridine)iridium(III)", Inorganic Chemistry, Jul. 1993, vol. 32, No. 14, pp. 3081-3087 <DOI:10.1021/ic00066a019>.
D'Andrade, B. et al., "Operational stability of electrophosphorescent devices containing p and n doped transport layers", Applied Physics Letters, Nov. 2003, vol. 83, No. 19, pp. 3858-3860 <DOI:10.1063/1.1624473>.
Dorwald; "Side Reactions in Organic Synthesis: A Guide to Successful Synthesis Design," Chapter 1, 2005 Wiley-VCH Verlag GmbH & Co. KGaA, Wienheim, 32 pages.
Dsouza, R., et al., "Fluorescent Dyes and Their Supramolecular Host/Guest Complexes with Macrocycles in Aqueous Solution", Oct. 2011, vol. 111, No. 12, pp. 7941-7980 <DOI:10.1021/cr200213s>.
Finikova,M.A. et al., New Selective Synthesis of Substituted Tetrabenzoporphyris, Doklady Chemistry, 2003, vol. 391, No. 4-6, pp. 222-224.
Fuchs, C. et al., "Enhanced light emission from top-emitting organic light-emitting diodes by optimizing surface plasmon polariton losses", arXiv, submitted Mar. 2015, 11 pages, arXiv:1503.01309.
Fuchs, C. et al., "Enhanced light emission from top-emitting organic light-emitting diodes by optimizing surface plasmon polariton losses", Physical Review B, Dec. 2015, vol. 92, No. 24, pp. 245306-1-245306-10 <DOI:10.1103/PhysRevB.92.245306>.
Galanin et al. Synthesis and Properties of meso-Phenyl-Substituted Tetrabenzoazaporphines Magnesium Complexes. Russian Journal of Organic Chemistry (Translation of Zhurnal Organicheskoi Khimii) (2002), 38(8), 1200-1203.
Galanin et al., meso-Phenyltetrabenzoazaporphyrins and their zinc complexes. Synthesis and spectral properties, Russian Journal of General Chemistry (2005), 75(4), 651-655.
Gather, M. et al., "Recent advances in light outcoupling from white organic light-emitting diodes," Journal of Photonics for Energy, May 2015, vol. 5, No. 1, 057607-1-057607-20 <DOI:10.1117/1.JPE.5.057607>.
Glauco Ponterini et al., "Comparison of Radiationless Decay Processes in Osmium and Platinum Porphyrins," J. Am. Chem. Soc., vol. 105, No. 14, 1983, pp. 4639-4645.
Gong et al., Highly Selective Complexation of Metal Ions by the Self-Tuning Tetraazacalixpyridine macrocycles, Tetrahedron, 65(1): 87-92 (2009).
Gottumukkala,V. et al., Synthesis, cellular uptake and animal toxicity of a tetra carboranylphenyl N-tetrabenzoporphyr in, Bioorganic &Medicinal Chemistry, 2006, vol. 14, pp. 1871-1879.
Graf, A. et al., "Correlating the transition dipole moment orientation of phosphorescent emitter molecules in OLEDs with basic material properties", Journal of Materials Chemistry C, Oct. 2014, vol. 2, No. 48, pp. 10298-10304 <DOI:10.1039/c4tc00997e>.
Hansen (1969). "The universality of the solubility parameter," I & EC Product Research and Development, 8, 2-11.
Hatakeyama, T. et al., "Ultrapure Blue Thermally Activated Delayed Fluorescence Molecules: Efficient HOMO-LUMO Separation by the Multiple Resonance Effect", Advanced Materials, Apr. 2016, vol. 28, No. 14, pp. 2777-2781, <DOI:10.1002/adma.201505491>.
Holmes, R. et al., "Efficient, deep-blue organic electrophosphorescence by guest charge trapping", Applied Physics Letters, Nov. 2003 [available online Oct. 2003], vol. 83, No. 18, pp. 3818-3820 <DOI:10.1063/1.1624639>.

(56) References Cited

OTHER PUBLICATIONS

Imre et al (1996). "Liquid-liquid demixing ffrom solutions of polystyrene. 1. A review. 2. Improved correlation with solvent properties," J. Phys. Chem. Ref. Data, 25, 637-61.
Ivaylo Ivanov et al., "Comparison of the INDO band structures of polyacetylene, polythiophene, polyfuran, and polypyrrole," Synthetic Metals, vol. 116, Issues 1-3, Jan. 1, 2001, pp. 111-114.
Jeong et al. (2010). "Improved efficiency of bulk heterojunction poly (3-hexylthiophene):[6,6]-phenyl-C61-butyric acid methyl ester photovoltaic devices using discotic liquid crystal additives," Appl. Phys. Lett.. 96, 183305. (3 pages).
Jeonghun Kwak et al., "Bright and Efficient Full-Color Colloidal Quantum Dot Light-Emitting Diodes Using an Inverted Device Structure," Nano Letters 12, Apr. 2, 2012, pp. 2362-2366.
Kim et al (2009). "Altering the thermodynamics of phase separation in inverted bulk-heterojunction organic solar cells," Adv. Mater., 21, 3110-15.
Kim et al. (2005). "Device annealing effect in organic solar cells with blends of regioregular poly (3-hexylthiophene) and soluble fullerene," Appl. Phys. Lett. 86, 063502. (3 pages).
Kim, HY. et al., "Crystal Organic Light-Emitting Diodes with Perfectly Oriented Non-Doped Pt-Based Emitting Layer", Advanced Functional Materials, Feb. 2016, vol. 28, No. 13, pp. 2526-2532 <DOI:10.1002/adma.201504451>.
Kim, JJ., "Setting up the new efficiency limit of OLEDs; Abstract" [online], Electrical-Engineering-Princeton University, Aug. 2014 [retrieved on Aug. 24, 2016], retrieved from the internet: <URL:http://ee.princeton.edu/events/setting-new-efficiency-limit-oled> 2 pages.
Kim, SY. et al., "Organic Light-Emitting Diodes with 30% External Quantum Efficiency Based on a Horizontally Oriented Emitter", Advanced Functional Materials, Mar. 2013, vol. 23, No. 31, pp. 3896-3900 <DOI:10.1002/adfm.201300104 >.
Kroon et al. (2008). "Small bandgap olymers for organic solar cells," Polymer Reviews, 48, 531-82.
Kwong, R. et al., "High operational stability of electrophosphorescent devices", Applied Physics Letters, Jul. 2002 [available online Jun. 2002], vol. 81, No. 1, pp. 162-164 <DOI:10.1063/1.1489503>.
Lamansky, S. et al., "Cyclometalated Ir complexes in polymer organic light-emitting devices", Journal of Applied Physics, Aug. 2002 [available online Jul. 2002], vol. 92, No. 3, pp. 1570-1575 <10.1063/1.1491587>.
Lamansky, S. et al., "Synthesis and Characterization of Phosphorescent Cyclometalated Iridium Complexes", Inorganic Chemistry, Mar. 2001, vol. 40, No. 7, pp. 1704-1711 <DOI:10.1021/ic0008969>.
Lampe, T. et al., "Dependence of Phosphorescent Emitter Orientation on Deposition Technique in Doped Organic Films", Chemistry of Materials, Jan. 2016, vol. 28, pp. 712-715 <DOI:10.1021/acs.chemmater.5b04607>.
Lee et al. (2008). "Processing additives for inproved efficiency from bulk heterojunction solar cells," J. Am. Chem. Soc, 130, 3619-23.
Li et al. (2005). "Investigation of annealing effects and film thickness dependence of polymer solar cells based on poly (3-hexylthiophene)," J. Appl. Phys., 98, 043704. (5 pages).
Li et al. (2007). "Solvent annealing effect in polymer solar cells based on poly(3-hexylthiophene) and methanofullerenes," Adv. Funct. Mater, 17, 1636-44.
Li, J. et al., "Synthesis and characterization of cyclometalated Ir(III) complexes with pyrazolyl ancillary ligands", Polyhedron, Jan. 2004, vol. 23, No. 2-3, pp. 419-428 <DOI:10.1016/j.poly.2003.11.028>.
Li, J., "Efficient and Stable OLEDs Employing Square Planar Metal Complexes and Inorganic Nanoparticles", in DOE SSL R&D Workshop (Raleigh, North Carolina, 2016), Feb. 2016, 15 pages.
Li, J., et al., "Synthetic Control of Excited-State Properties in Cyclometalated Ir(III) Complexes Using Ancillary Ligands", Inorganic Chemistry, Feb. 2005, vol. 44, No. 6, pp. 1713-1727 <DOI:10.1021/ic048599h>.
Liang, et al. (2010). "For the bright future-bulk heterojunction polymer solar cells with power conversion efficiency of 7.4%," Adv. Mater. 22, E135-38.
Lin, TA et al., " Sky-Blue Organic Light Emitting Diode with 37% External Quantum Efficiency Using Thermally Activated Delayed Fluorescence from Spiroacridine-Triazine Hybrid", Advanced Materials, Aug. 2016, vol. 28, No. 32, pp. 6876-6983 <DOI:10.1002/adma.201601675>.
Markham, J. et al., "High-efficiency green phosphorescence from spin-coated single-layer dendrimer light-emitting diodes", Applied Physics Lettersm Apr. 2002, vol. 80, vol. 15, pp. 2645-2647 <DOI:10.1063/1.1469218>.
Michl, J., "Relationship of bonding to electronic spectra", Accounts of Chemical Research, May 1990, vol. 23, No. 5, pp. 127-128 <DOI:10.1021/ar00173a001>.
Miller, R. et al., "Polysilane high polymers", Chemical Reviews, Sep. 1989, vol. 89, No. 6, pp. 1359-1410 <DOI:10.1021/cr00096a006>.
Morana et al. (2007). "Organic field-effect devices as tool to characterize the bipolar transport in polymer-fullerene blends: the case of P3HT-PCBM," Adv. Funct. Mat., 17, 3274-83.
Moule et al. (2008). "Controlling morphology in Polymer-Fullerene mixtures," Adv. Mater., 20, 240-45.
Nazeeruddin, M. et al., "Highly Phosphorescence Iridium Complexes and Their Application in Organic Light-Emitting Devices", Journal of the American Chemical Society, Jun. 2003, vol. 125, No. 29, pp. 8790-8797 <DOI:10.1021/ja021413y>.
Nillson et al. (2007). "Morphology and phase segregation of spin-casted films of polyfluorene/PCBM Blends," Macromolecules, 40, 8291-8301.
Olynick et al. (2009). "The link between nanoscale feature development in a negative resist and the Hansen solubility sphere," Journal of Polymer Science: Part B: Polymer Physics, 47, 2091-2105.
Peet et al. (2007). "Efficiency enhancement in low-bandgap polymer solar cells by processing with alkane dithiols," Nature Materials, 6, 497-500.
Pivrikas et al. (2008). "Substituting the postproduction treatment for bulk-heterojunction solar cells using chemical additives," Organic Electronics, 9, 775-82.
Results from SciFinder Compound Search on Dec. 8, 2016. (17 pages).
Rui Zhu et al., "Color tuning based on a six-membered chelated iridium (III) complex with aza-aromatic ligand,", Chemistry Letters, vol. 34, No. 12, 2005, pp. 1668-1669.
Sajoto, T. et al., "Temperature Dependence of Blue Phosphorescent Cyclometalated Ir(III) Complexes", Journal of the American Chemical Society, Jun. 2009, vol. 131, No. 28, pp. 9813-9822 <DOI:10.1021/ja903317w>.
Sakai, Y. et al., "Simple model-free estimation of orientation order parameters of vacuum-deposited and spin-coated amorphous films used in organic light-emitting diodes", Applied Physics Express, Aug. 2015, vol. 8, No. 9, pp. 096601-1-096601-4 <DOI:10.7567/APEX.8.096601>.
Saricifci et al. (1993). "Semiconducting polymerbuckminsterfullerene heterojunctions: diodes photodiodes, and photovoltaic cells," Appl. Phys. Lett., 62, 585-87.
Saunders et al. (2008). "Nanoparticle-polymer photovoltaic cells," Advances in Colloid and Interface Science, 138, 1-23.
Senes, A. et al., "Transition dipole moment orientation in films of solution processed fluorescent oligomers: investigating the influence of molecular anisotropy", Journal of Materials Chemistry C, Jun. 2016, vol. 4, No. 26, pp. 6302-6308 <DOI:10.1039/c5tc03481g>.
Shin et al. (2010). "Abrupt morphology change upon thermal annealing in Poly(3-hexathiophene)/ soluble fullerene blend films for polymer solar cells," Adv. Funct. Mater., 20, 748-54.
Stephen R. Forrest, "The path to ubiquitous and low-cost organic electronic appliances on plastic," Nature, vol. 428, Apr. 29, 2004, pp. 911-918.
Strouse, G. et al., "Optical Spectroscopy of Single Crystal [Re(bpy)(CO)4](PF6): Mixing between Charge Transfer and Ligand Centered Excited States", Inorganic Chemistry, Oct. 1995, vol. 34, No. 22, pp. 5578-5587 <DOI:10.1021/ic00126a031>.

(56) References Cited

OTHER PUBLICATIONS

Tang, C. et al., "Organic electroluminescent diodes", Applied Physics Letters, Jul. 1987, vol. 51, No. 12, pp. 913-915 <DOI:10.1063/1.98799>.

Tsuoboyama, A. et al., "Homoleptic Cyclometalated Iridium Complexes with Highly Efficient Red Phosphorescence and Application to Organic Light-Emitting Diode", Journal of the American Chemical Society, Sep. 2003, vol. 125, No. 42, pp. 12971-12979 <DOI:10.1021/ja034732d>.

Turro, N., "Modern Molecular Photochemistry" (Sausalito, California, University Science Books, 1991), p. 48. (3 pages).

U.S. Appl. No. 16/751,561, filed Jan. 24, 2020, has not yet published. Inventor: Li.

U.S. Appl. No. 16/751,586, filed Jan. 24, 2020, has not yet published. Inventor: Li et al.

U.S. Appl. No. 61/692,937.

U.S. Appl. No. 61/719,077.

V. Thamilarasan et al., "Green-emitting phosphorescent iridium(III) complex: Structural, photophysical and electrochemical properties," Inorganica Chimica Acta, vol. 408, 2013, pp. 240-245.

Vanessa Wood et al., "Colloidal quantum dot light-emitting devices," Nano Reviews 1, Jul. 2010, pp. 5202. (7 pages).

Wang et al. (2010). "The development of nanoscale morphology in polymer: fullerene photovoltaic blends during solvent casting," Soft Matter, 6, 4128-4134.

Wang et al., C(aryl)-C(alkyl) bond formation from Cu(CI04)2-mediated oxidative cross coupling reaction between arenes and alkyllithium reagents through structurally well-defined Ar-Cu(III) intermediates, Chem Commun, 48: 9418-9420 (2012).

Williams, E. et al., "Excimer□Based White Phosphorescent Organic Light□Emitting Diodes with Nearly 100 % Internal Quantum Efficiency", Advanced Materials, Jan. 2007, vol. 19, No. 2, pp. 197-202 <DOI:10.1002/adma.200602174>.

Williams, E. et al., "Organic light-emitting diodes having exclusive near-infrared electrophosphorescence", Applied Physics Letters, Aug. 2006, vol. 89, No. 8, pp. 083506-1-083506-3 <DOI:10.1063/1.2335275>.

Xiaofan Ren et al., "Ultrahigh Energy Gap Hosts in Deep Blue Organic Electrophosphorescent Devices," Chem. Mater., vol. 16, 2004, pp. 4743-4747.

Yakubov, L.A. et al., Synthesis and Properties of Zinc Complexes of mesoHexadecyloxy-Substituted Tetrabenzoporphyrin and Tetrabenzoazaporphyrins, Russian Journal of Organic Chemistry, 2008, vol. 44, No. 5, pp. 755-760.

Yang et al. (2005). "Nanoscale morphology of high-performance polymer solar cells," Nano Lett., 5, 579-83.

Yang, X. et al., "Efficient Blue□ and White□Emitting Electrophosphorescent Devices Based on Platinum(II) [1,3⎵Difluorou⎵4,6 di(2⎵pyridinyl)benzene] Chloride", Advanced Materials, Jun. 2008, vol. 20, No. 12, pp. 2405-2409 <DOI:10.1002/adma.200702940>.

Yao et al. (2008). "Effect of solvent mixture on nanoscale phase separation in polymer solar cells," Adv. Funct. Mater.,18, 1783-89.

Yao et al., Cu(CI04)2-Mediated Arene C—H Bond Halogenations of Azacalixaromatics Using Alkali Metal Halides as Halogen Sources, The Journal of Organic Chemistry, 77(7): 3336-3340 (2012).

Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.

Yu et al. (1995). "Polymer Photovoltaic Cells: Enhanced efficiencies via a network of internal donor-acceptor heterojunctions," Science, 270, 1789-91.

Zhu, W. et al., "Highly efficient electrophosphorescent devices based on conjugated polymers doped with iridium complexes", Applied Physics Letters, Mar. 2002, vol. 80, No. 12, pp. 2045-2047 <DOI:10.1063/1.1461418>.

Office Action dated Sep. 16, 2020 for U.S. Appl. No. 15/947,092 (pp. 1-13).

* cited by examiner

TETRADENTATE PLATINUM AND PALLADIUM COMPLEXES BASED ON BISCARBAZOLE AND ANALOGUES

CROSS-REFERENCE TO RELATED APPLICATION

This application claims the benefit of U.S. Patent Application No. 62/508,849 entitled "TETRADENTATE PLATINUM AND PALLADIUM COMPLEXES BASED ON BISCARBAZOLE AND ANALOGUES" and filed on May 19, 2017, which is incorporated by reference herein in its entirety.

TECHNICAL FIELD

This invention relates to tetradentate platinum and palladium complexes based on biscarbazole and analogues for full color displays and lighting applications.

BACKGROUND

Compounds capable of absorbing or emitting light can be used in a variety of optical and electro-optical devices, including photo-absorbing devices (e.g., solar- and photosensitive devices), photo-emitting devices, organic light-emitting diodes (OLEDs), and devices capable of photo-absorption and photo-emission. Much research has been devoted to the discovery and optimization of organic and organometallic materials for use in optical and electro-optical devices. Metal complexes can be used for many applications, such as emitters for OLEDs. Despite advances in research devoted to optical and electro-optical materials, many currently available materials exhibit a number of disadvantages, including poor processing ability, inefficient emission or absorption, and insufficient stability.

SUMMARY

Tetradentate platinum and palladium complexes based on biscarbazole and analogues for full color displays and lighting applications are shown in General Formulas I-VI.

General Formula I

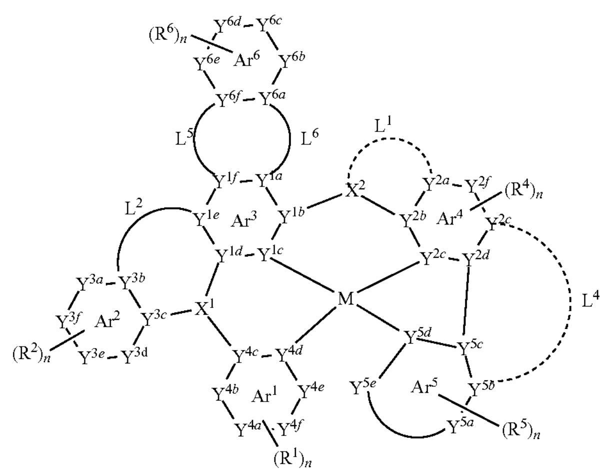

General Formula II

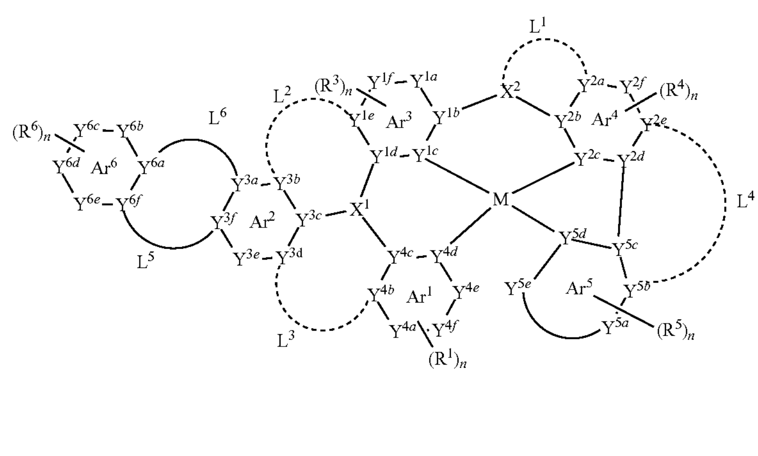

-continued
General Formula III
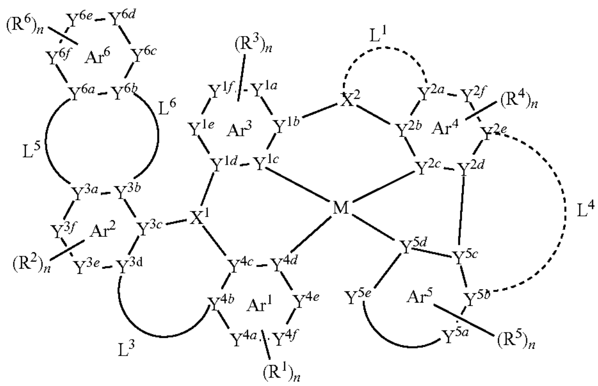
General Formula IV
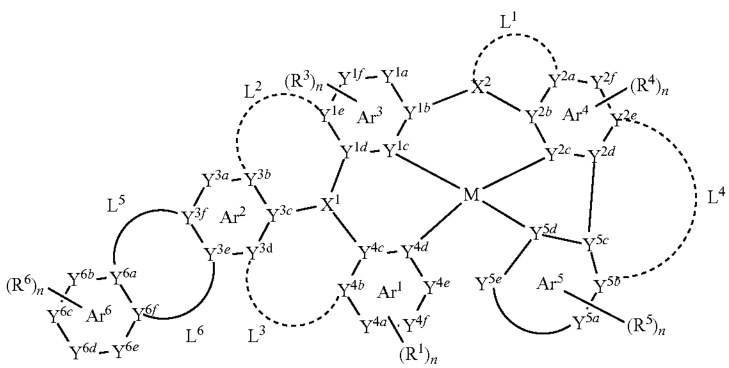
General Formula V
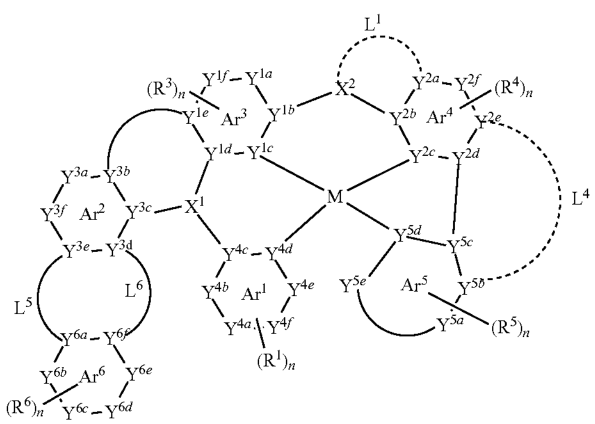

-continued

General Formula VI

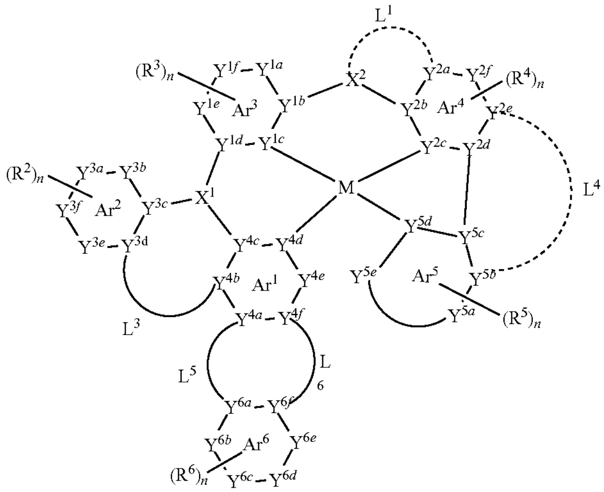

In General Formulas I-VI,

M is $Pt^2$ or $Pd^{2+}$, each $R^1$, $R^2$, $R^3$, $R^4$, $R^5$, and $R^6$ independently represents hydrogen, halogen, hydroxy, amino, nitro, cyanide, thiol, or optionally substituted $C_1$-$C_4$ alkyl, alkoxy, or aryl, $Y^{1a}$, $Y^{1b}$, $Y^{1c}$, $Y^{1d}$, $Y^{1e}$, $Y^{1f}$, $Y^{2a}$, $Y^{2b}$, $Y^{2c}$, $Y^{2d}$, $Y^{2e}$, $Y^{2f}$, $Y^{3a}$, $Y^{3b}$, $Y^{3c}$, $Y^{3d}$, $Y^{3e}$, $Y^{3f}$, $Y^{4a}$, $Y^{4b}$, $Y^{4c}$, $Y^{4d}$, $Y^{4e}$, $Y^{4f}$, $Y^{5a}$, $Y^{5b}$, $Y^{5c}$, $Y^{5d}$, $Y^{5e}$, $Y^{5f}$, $Y^{6a}$, $Y^{6b}$, $Y^{6c}$, $Y^{6d}$, $Y^{6e}$, and $Y^{6f}$ each independently represents C, N, Si, O, or S, each of $X^1$ and $X^2$ is present or absent, and each $X^1$ and $X^2$ present independently represents a single bond, NR, PR, CRR', SiRR', CRR', SiRR', O, S, S═O, O═S═O, Se, Se═O, or O═Se═O, and wherein R and R' each independently represents hydrogen, cyanide, halogen, hydroxy, amino, nitro, thiol, or optionally substituted $C_1$-$C_4$ alkyl, alkoxy, aryl, $L^1$, $L^2$, $L^3$, $L^4$, $L^5$, and $L^6$, where indicated by a solid line is present, and where indicated by a dashed line is each independently present or absent, and each of $L^1$, $L^2$, $L^3$, $L^4$, $L^5$, and $L^6$ present independently represents a substituted (valency permitting) or unsubstituted linking atom or group comprising alkyl, alkoxy, alkenyl, alkynyl, hydroxy, amine, amide, thiol, aryl, heteroaryl, cycloalkyl, and heterocyclyl moieties, each $Ar^1$, $Ar^2$, $Ar^3$, $Ar^4$, $Ar^{5\prime}$ and $Ar^6$ present is independently an aryl group, and each n is independently an integer, valency permitting.

Implementations also include a light emitting diode including a complex of General Formulas I-VI and a light emitting device including the light emitting diode.

These general and specific aspects may be implemented using a device, system or method, or any combination of devices, systems, or methods. The details of one or more embodiments are set forth in the accompanying drawings and the description below. Other features, objects, and advantages will be apparent from the description and drawings, and from the claims.

DETAILED DESCRIPTION

Figure 1:
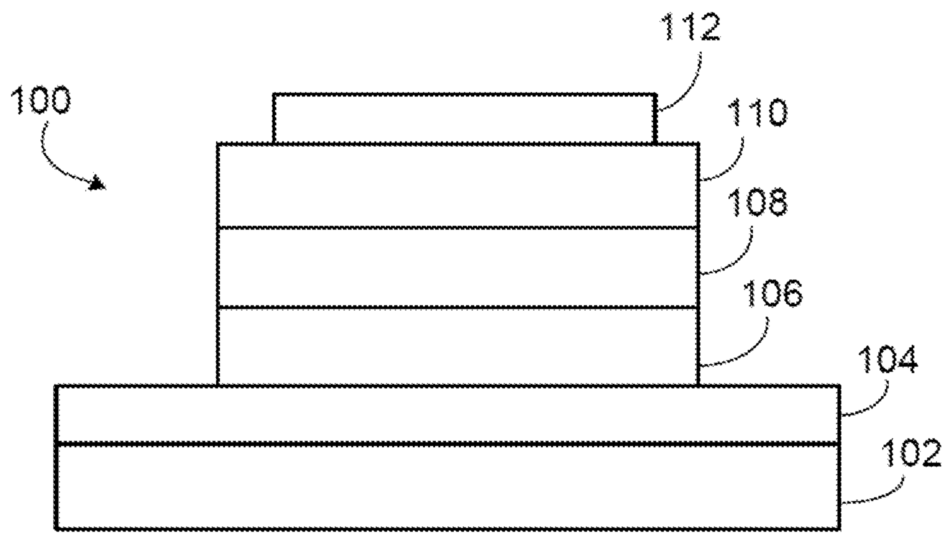
FIG. 1 depicts a cross-sectional view of an organic light emitting diode (OLED).

General Formulas I-VI represent biscarbazole-based platinum (II) and palladium (II) complexes and analogues. These emitters are suitable for full color displays and lighting applications. General Formulas I-VI are shown below.

General Formula I
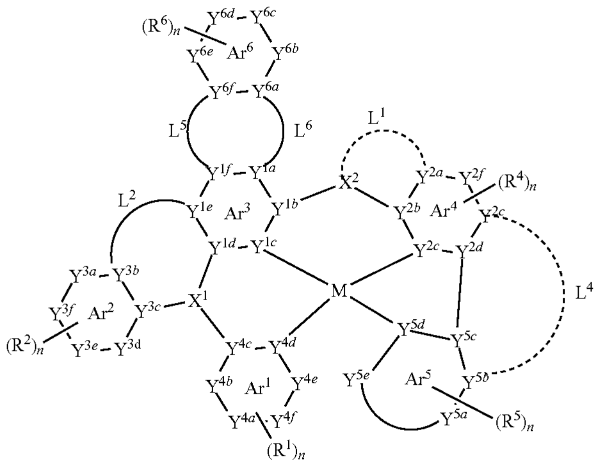
General Formula II
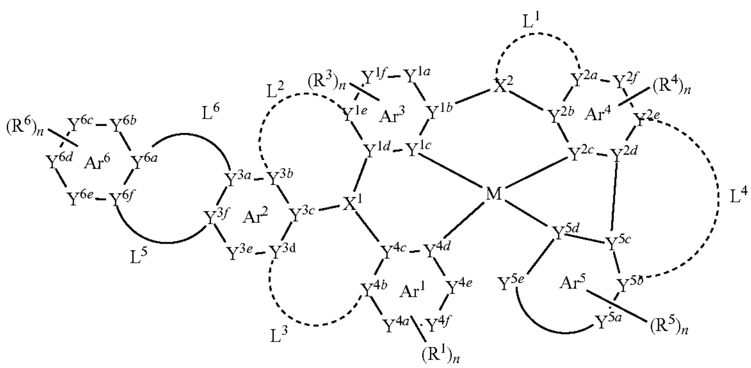
General Formula III
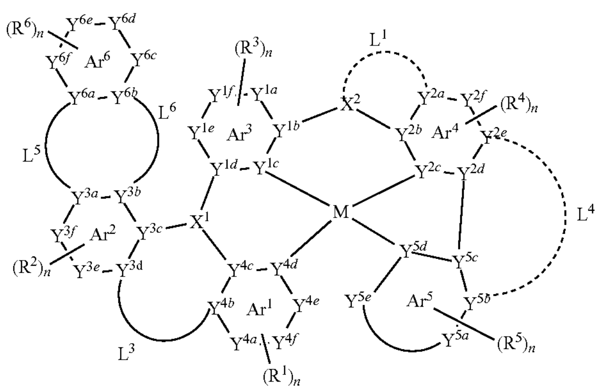
General Formula IV
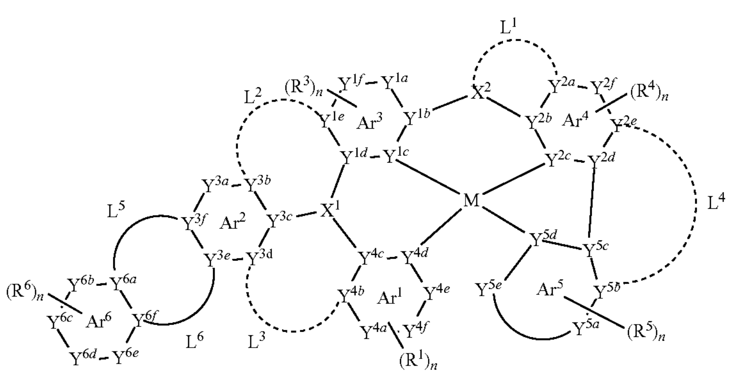

-continued

General Formula V

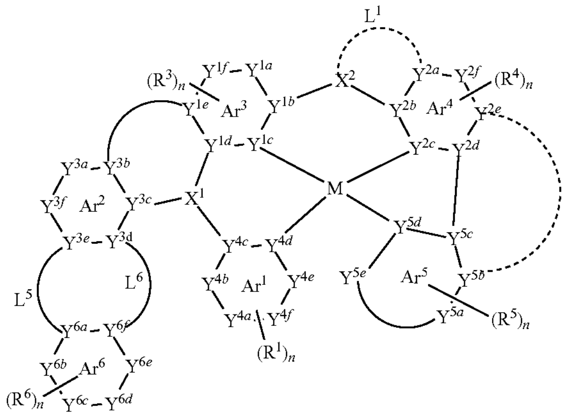

General Formula VI

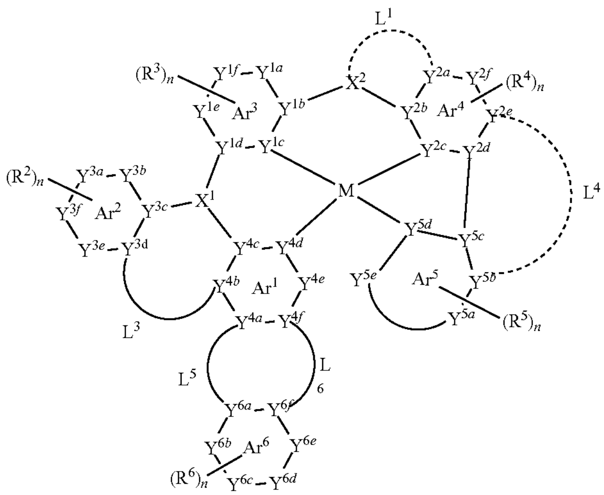

In General Formulas I-VI:

M is $Pt^{2+}$ or $Pd^{2+}$.

each n independently represents an integer, valency permitting, each $R^1$, $R^2$, $R^3$, $R^4$, $R^5$, and $R^6$ independently represents hydrogen, halogen, hydroxy, amino, nitro, cyanide, thiol, or optionally substituted $C_1$-$C_4$ alkyl, alkoxy, or aryl.

$Y^{1a}$, $Y^{1b}$, $Y^{1c}$, $Y^{1d}$, $Y^{1e}$, $Y^{1f}$, $Y^{2a}$, $Y^{2b}$, $Y^{2c}$, $Y^{2d}$, $Y^{2e}$, $Y^{2f}$, $Y^{3a}$, $Y^{3b}$, $Y^{3c}$, $Y^{3d}$, $Y^{3e}$, $Y^{3f}$, $Y^{4a}$, $Y^{4b}$, $Y^{4c}$, $Y^{4d}$, $Y^{4e}$, $Y^{4f}$, $Y^{5a}$, $Y^{5b}$, $Y^{5c}$, $Y^{5d}$, $Y^{5e}$, $Y^{5f}$, $Y^{6a}$, $Y^{6b}$, $Y^{6c}$, $Y^{6d}$, $Y^{6e}$, and $Y^{6f}$ each independently represents C, N, Si, O, or S, each of $X^1$ and $X^2$ is present or absent, and each $X^1$ and $X^2$ present independently represents a single bond, NR, PR, CRR', SiRR', CRR', SiRR', O, S, S═O, O═S═O, Se, Se═O, or O═Se═R, where R and R' each independently represents hydrogen, cyanide, halogen, hydroxy, amino, nitro, thiol or optionally substituted $C_1$-$C_4$ alkyl, alkoxy, aryl, $L^1$, $L^2$, $L^3$, $L^4$, $L^5$, and $L^6$, where indicated by a solid line is present, and where indicated by a dashed line is each independently present or absent, and each of $L^1$, $L^2$, $L^3$, $L^4$, $L^5$, and $L^6$ present independently represents a substituted or unsubstituted linking atom or group, valency permitting. Suitable substituents include alkyl, alkoxy, alkenyl, alkynyl, aryl, heteroaryl, cycloalkyl, and heterocyclyl moieties, each $Ar^1$, $Ar^2$. $Ar^3$, $Ar^4$, $Ar^{5'}$ and $Ar^6$ present is independently an aryl group, and each n is independently an integer, valency permitting.

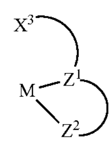

Implementations of General Formulas I-VI are shown below, where represents one of following chemical moieties:

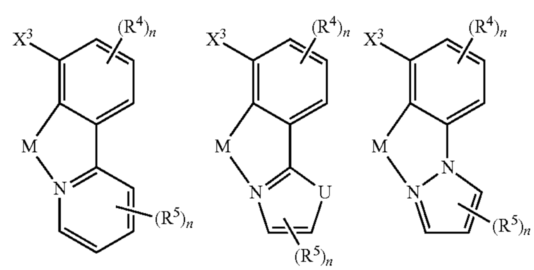

-continued
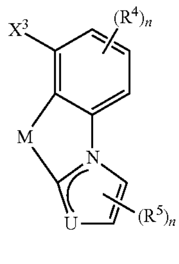
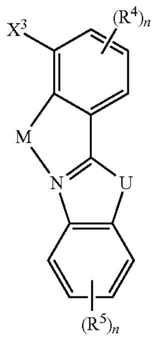
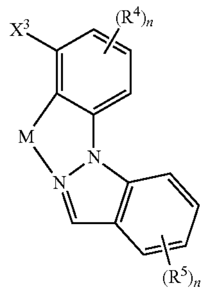
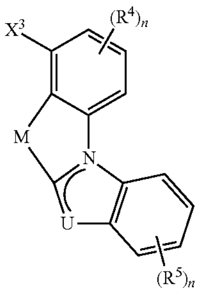
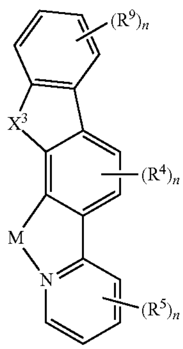
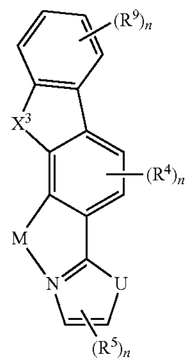
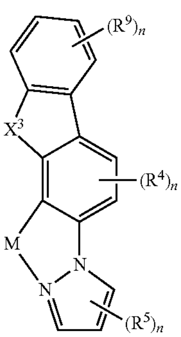
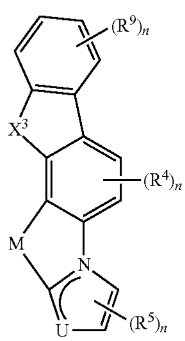
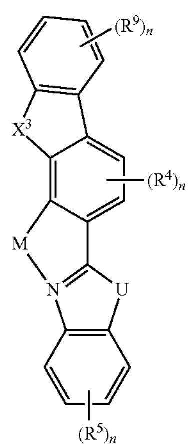
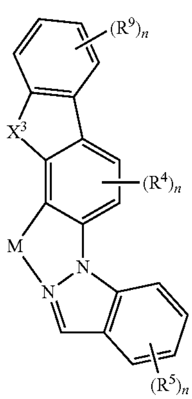
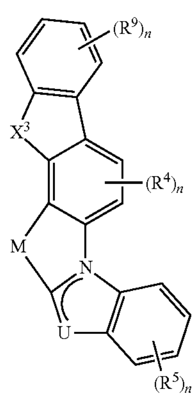
-continued
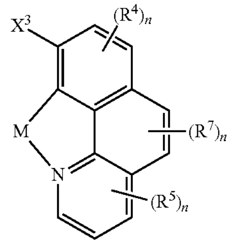
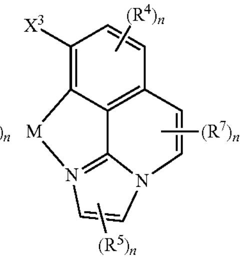
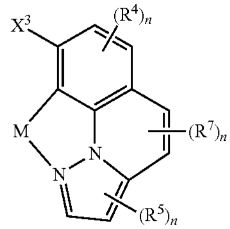
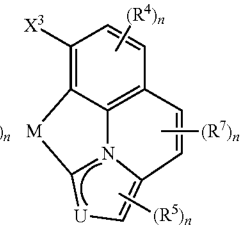
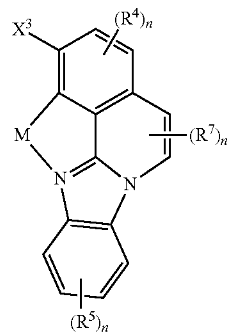
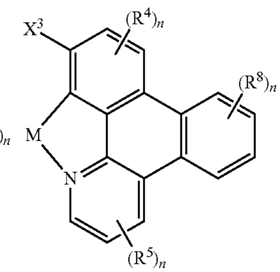
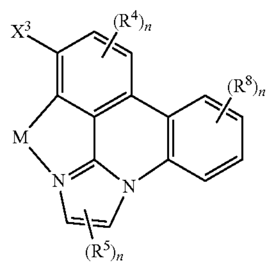
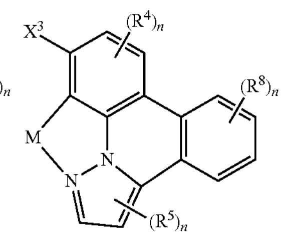
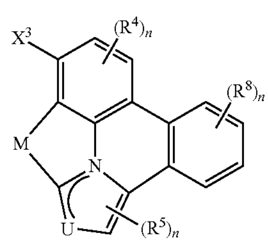
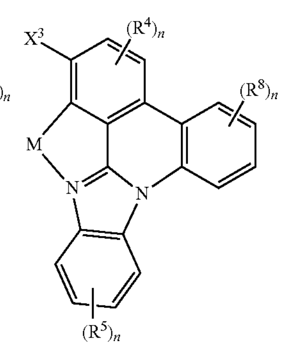

-continued
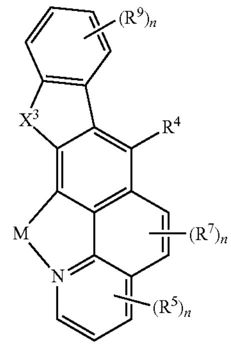
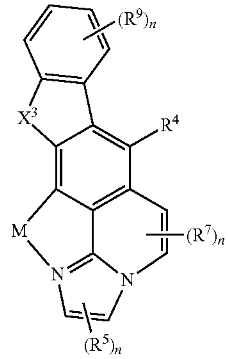
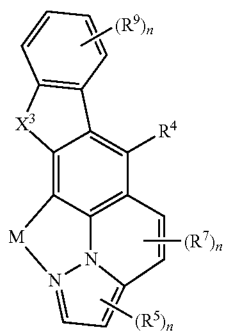
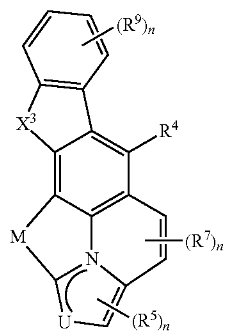
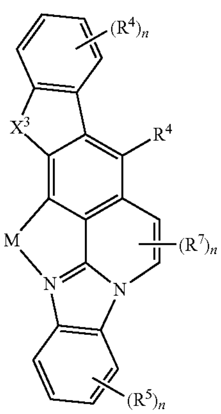
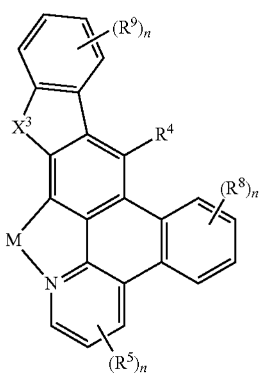
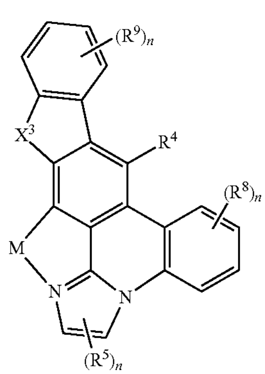
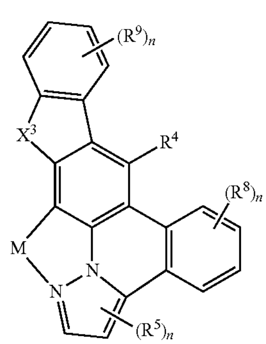
-continued
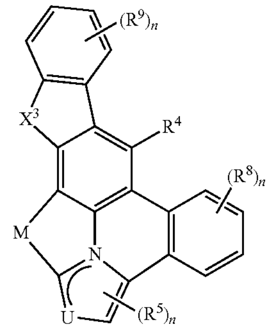
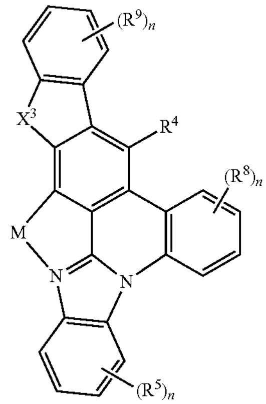
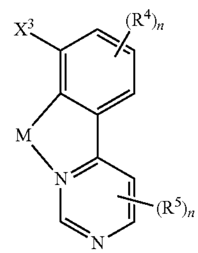
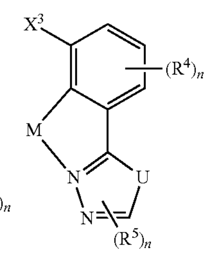
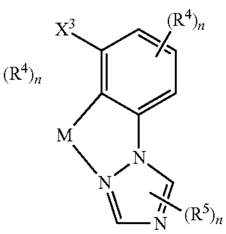
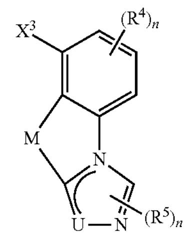
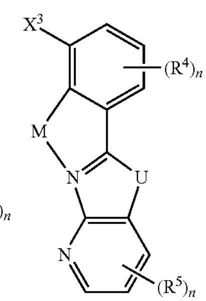
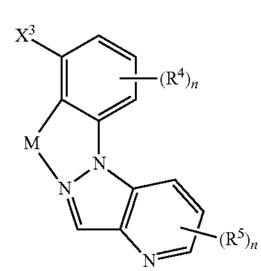
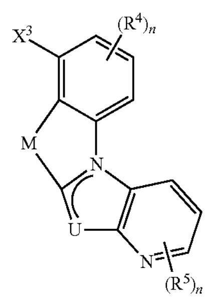
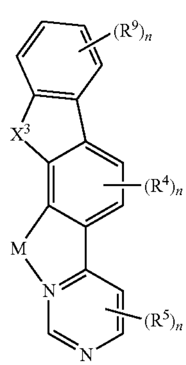
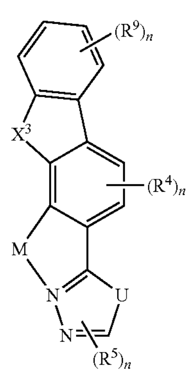
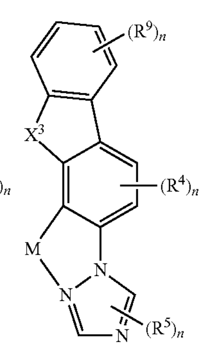

-continued
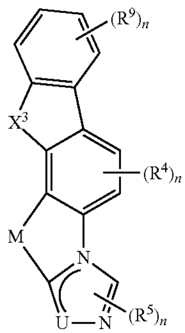
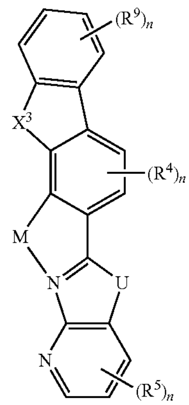
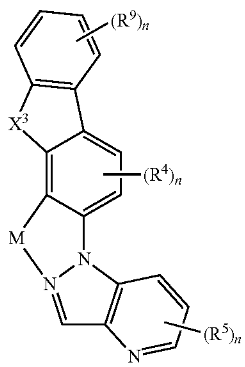
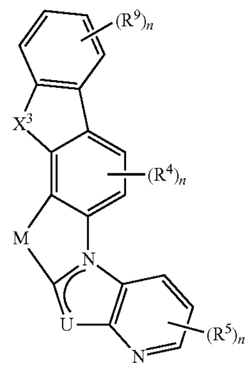
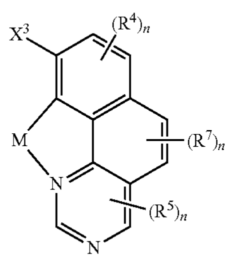
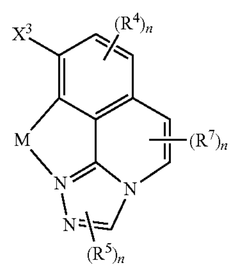
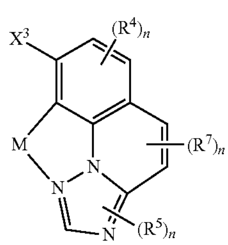
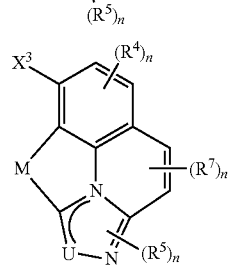
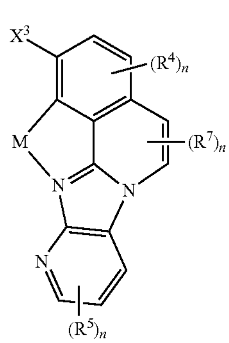
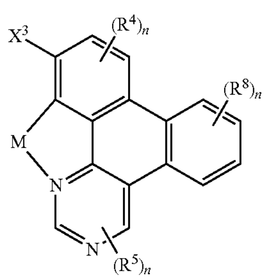
-continued
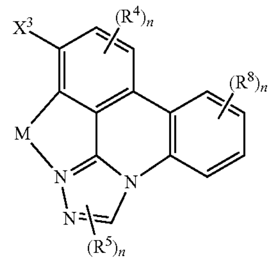
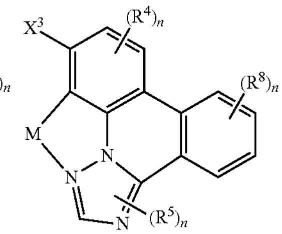
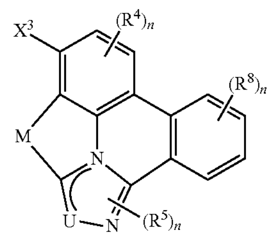
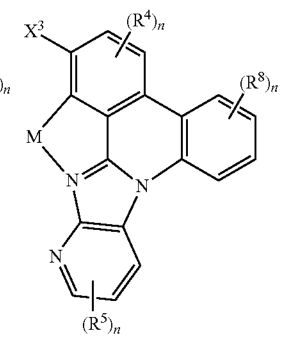
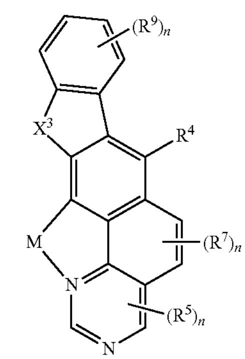
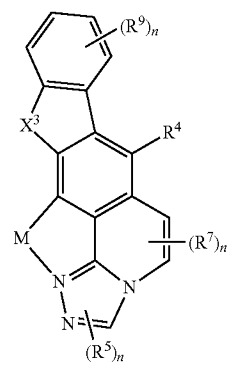
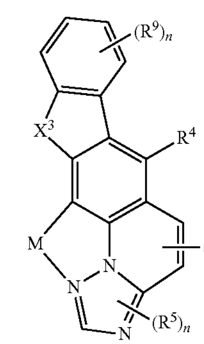
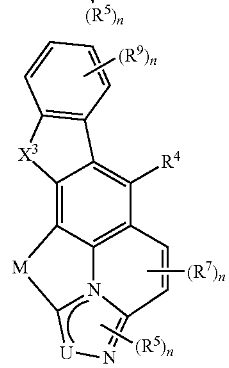
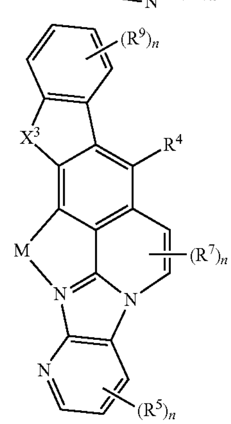
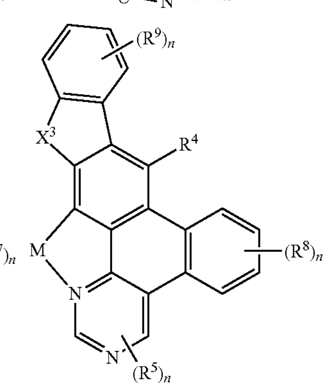

-continued
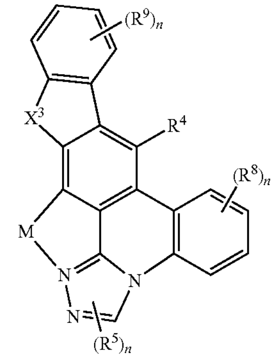
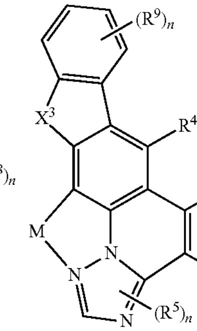
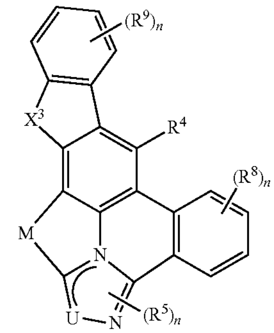
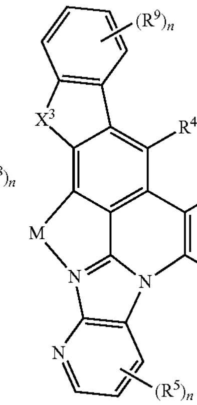
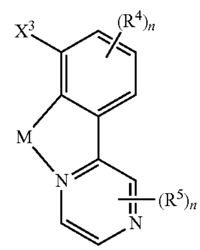
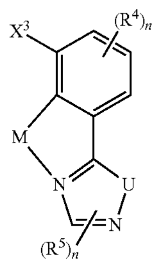
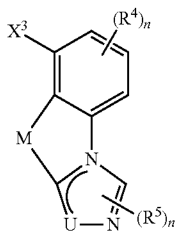
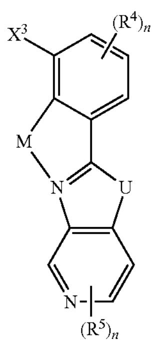
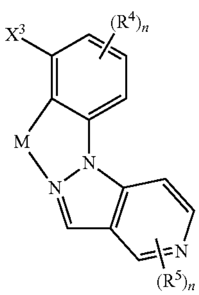
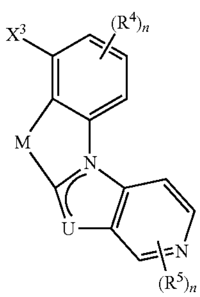
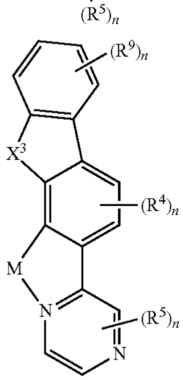
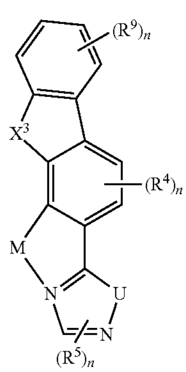
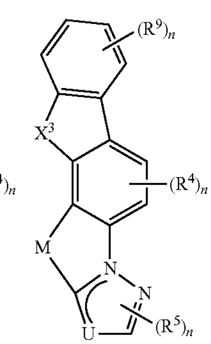
-continued
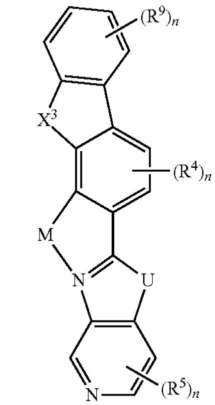
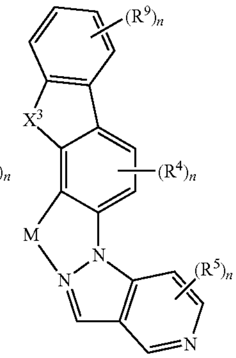
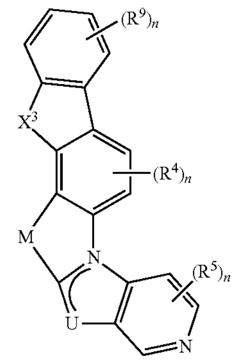
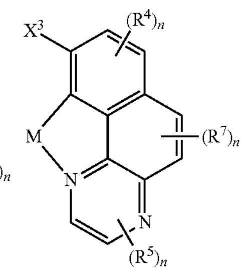
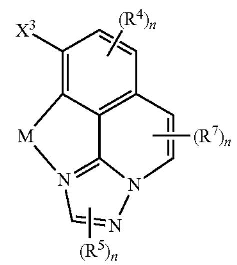
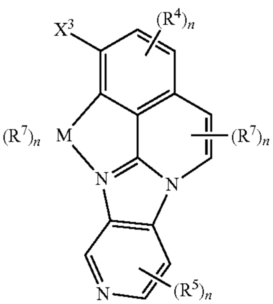
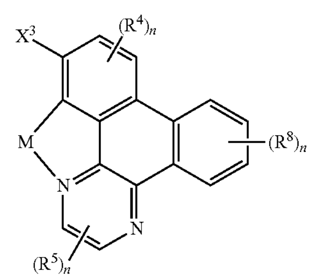
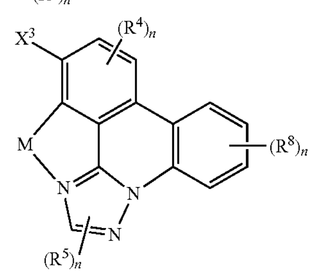

-continued
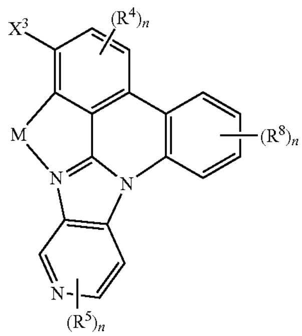
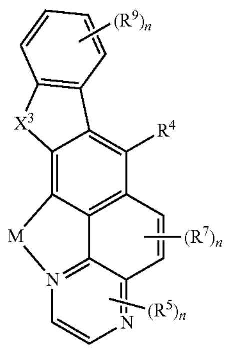
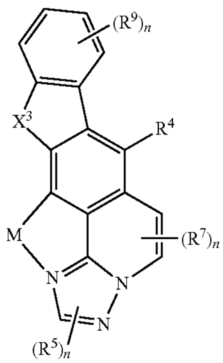
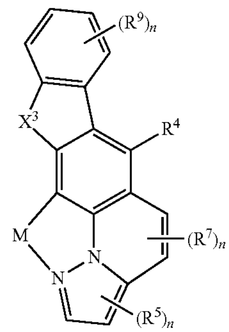
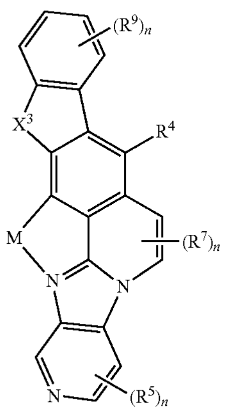
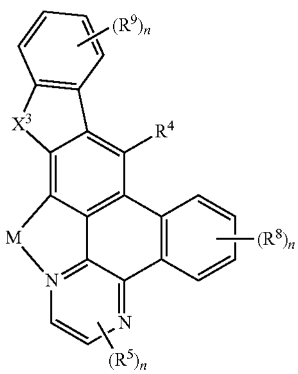
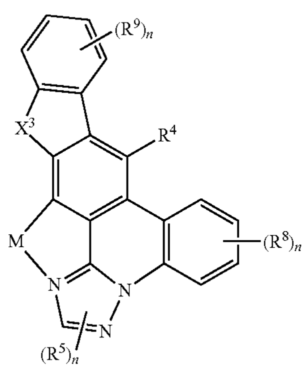
-continued
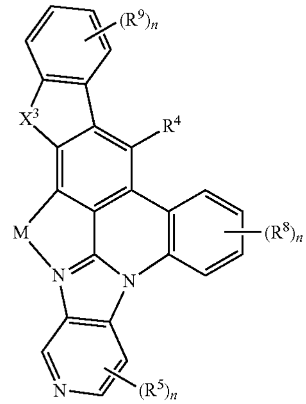
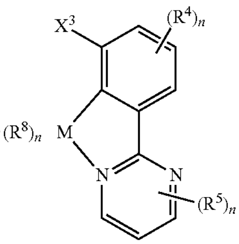
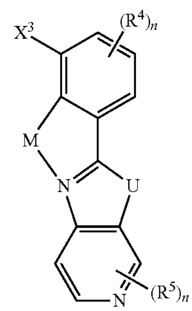
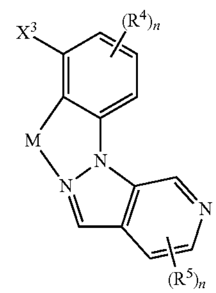
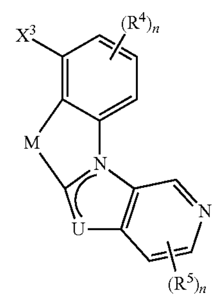
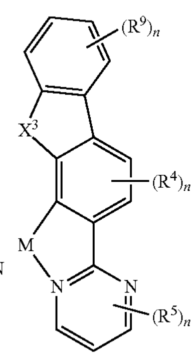
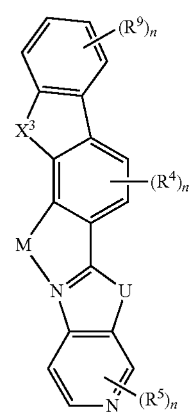
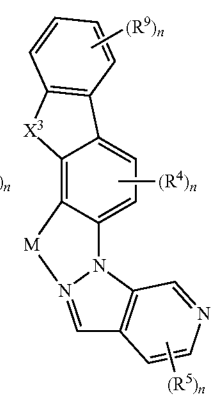

-continued
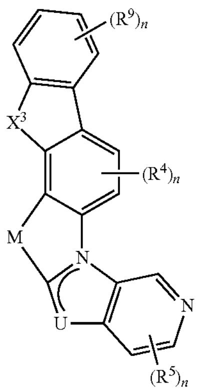
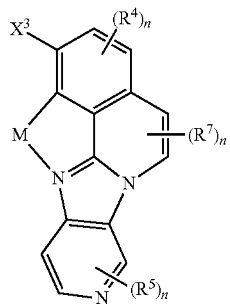
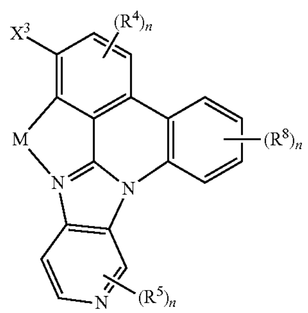
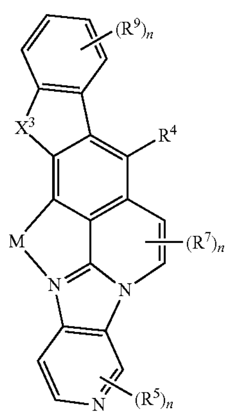
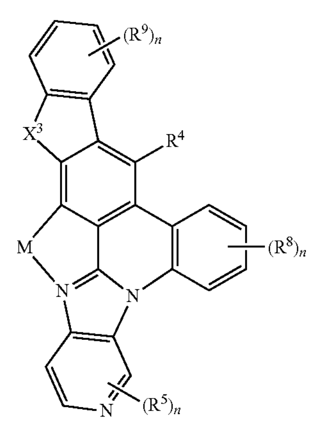
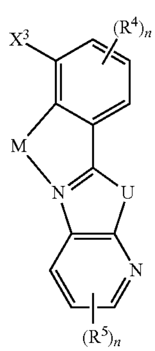
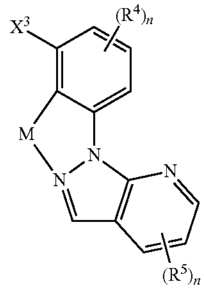
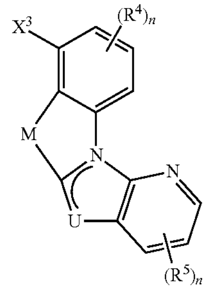
-continued
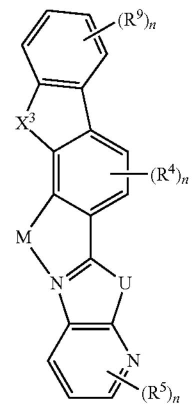
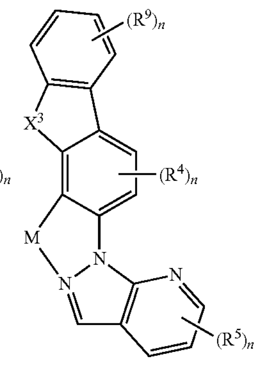
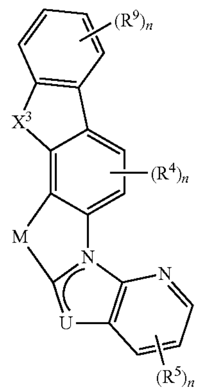
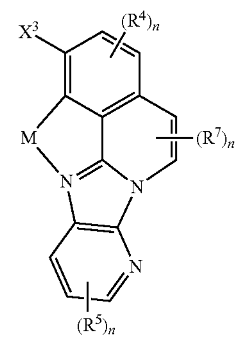
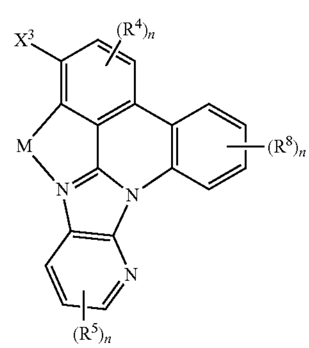
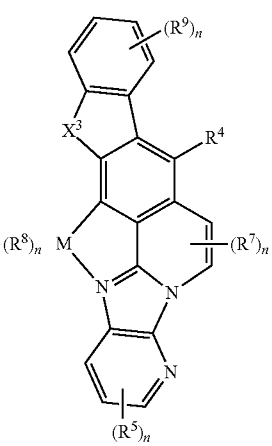
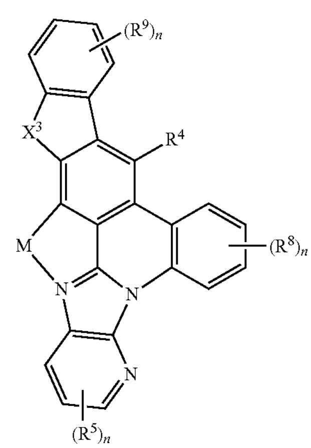

-continued
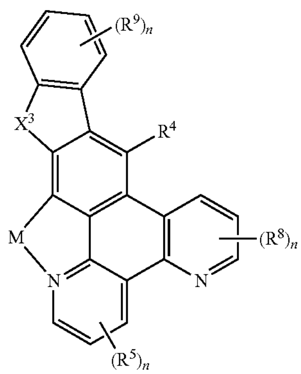
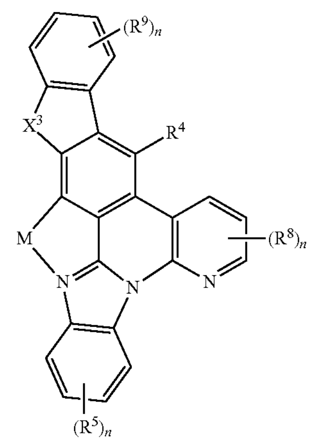
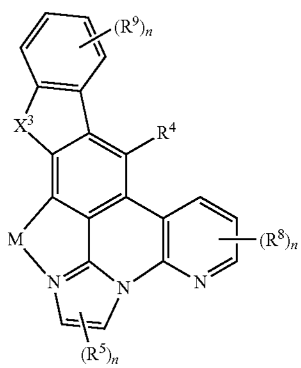
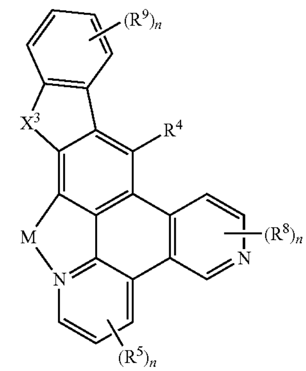
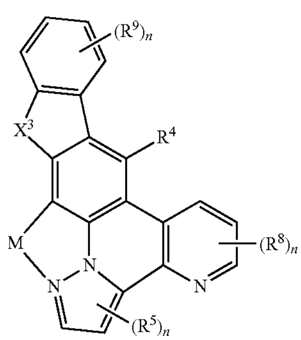
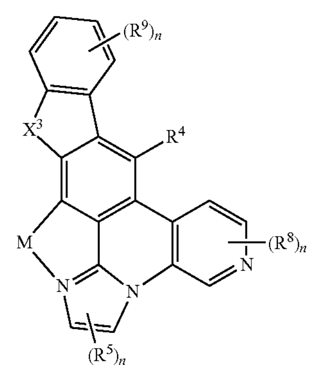
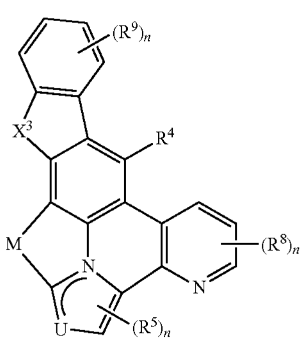
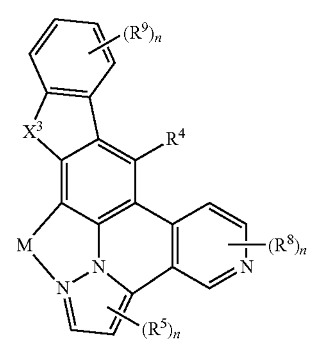

-continued
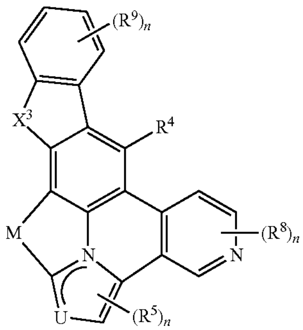
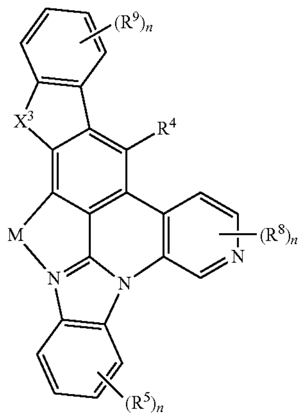
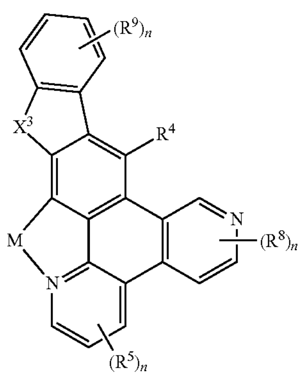
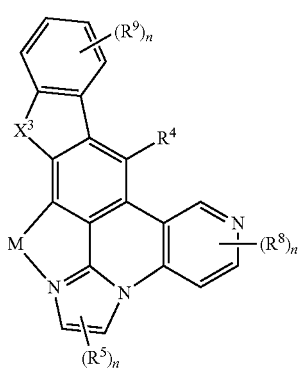
-continued
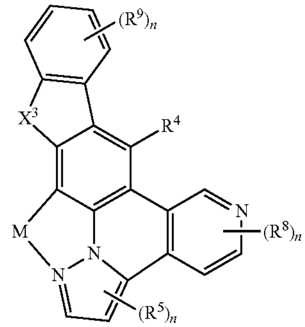
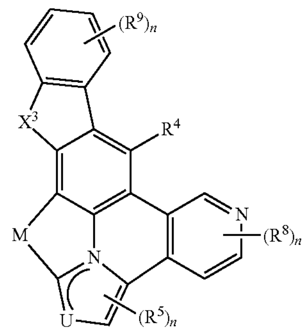
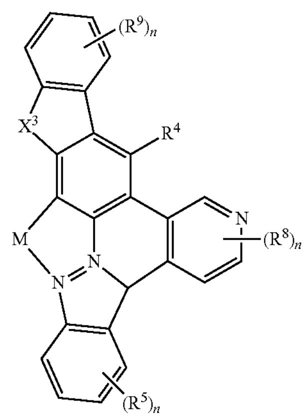
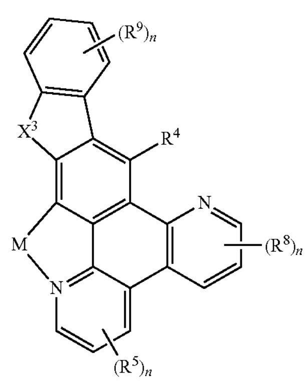

-continued
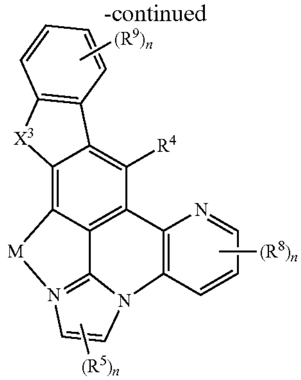
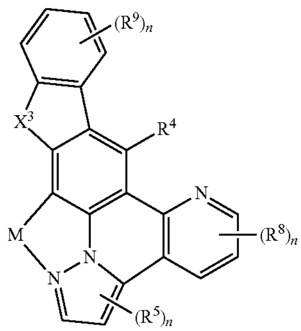
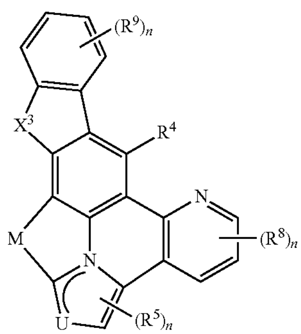
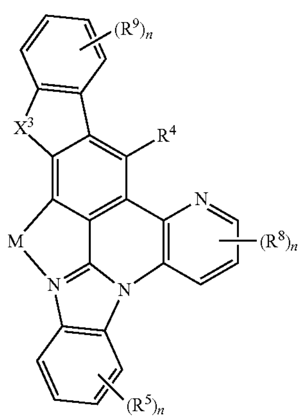
-continued
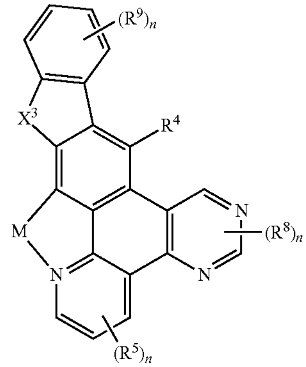
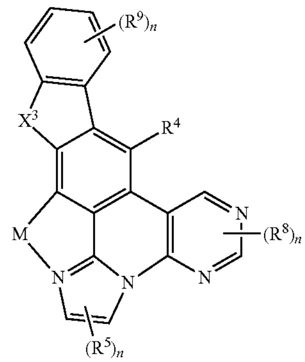
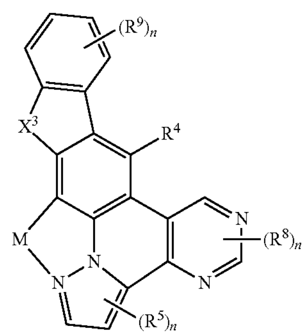
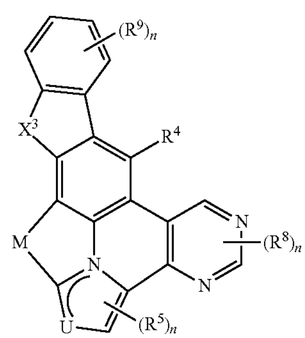

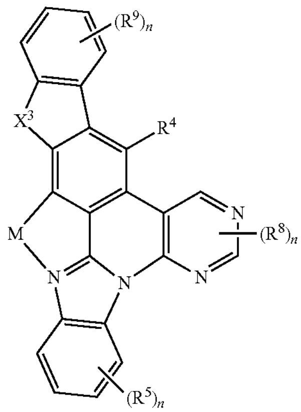
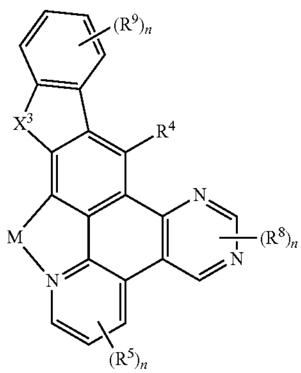
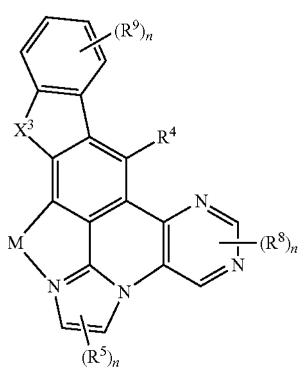
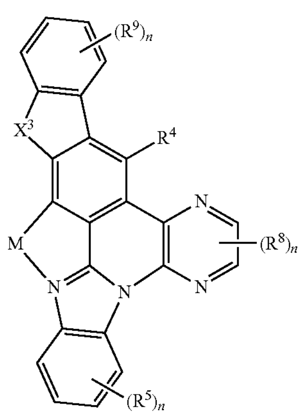
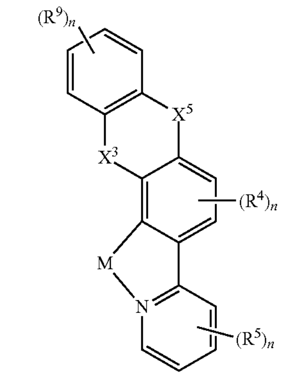
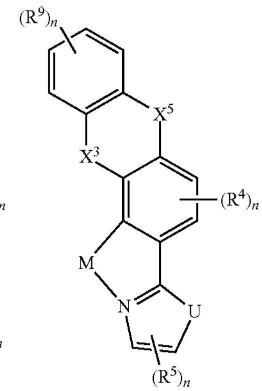
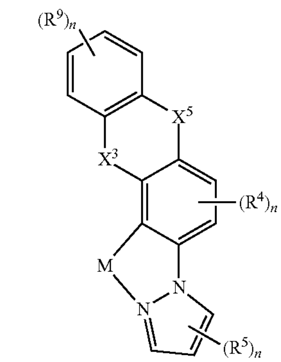
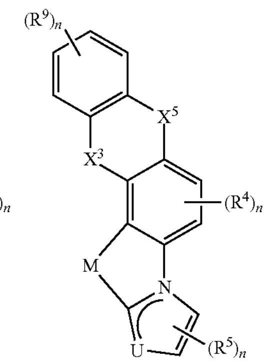
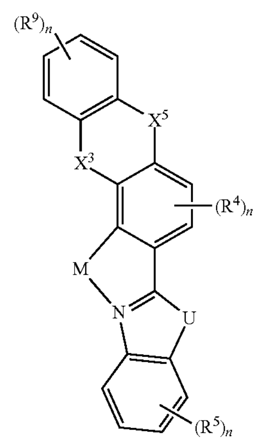
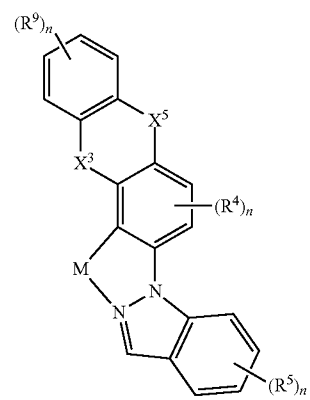
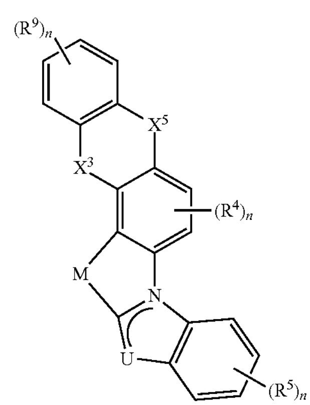
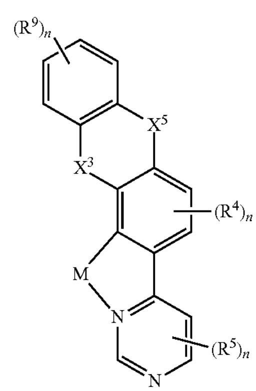

-continued
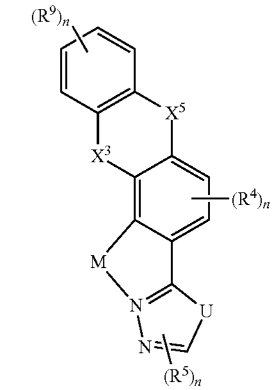
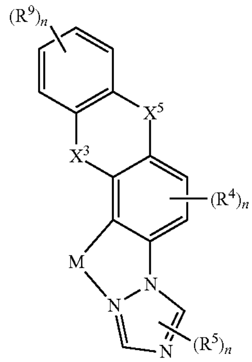
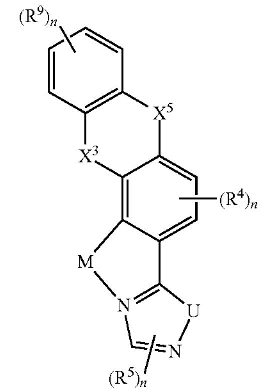
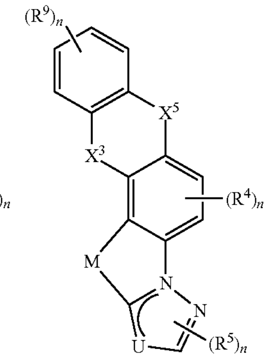
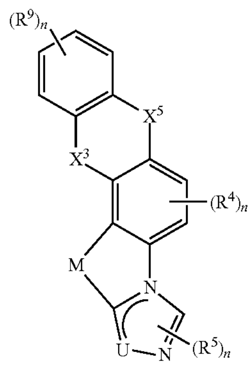
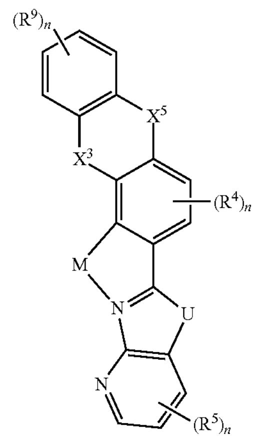
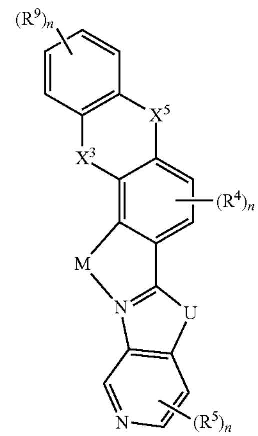
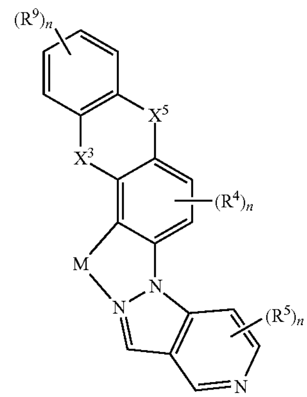
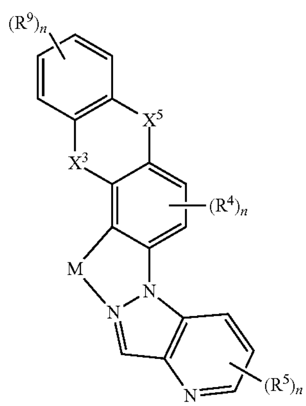
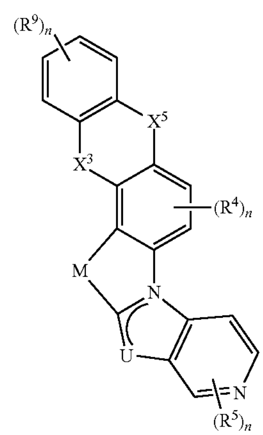
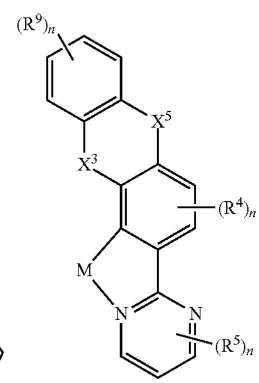
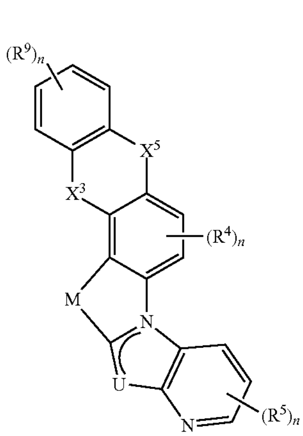
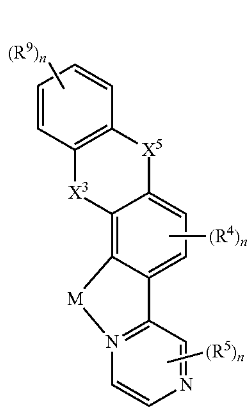
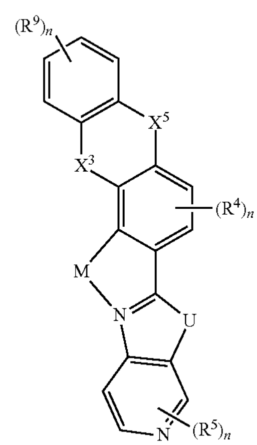
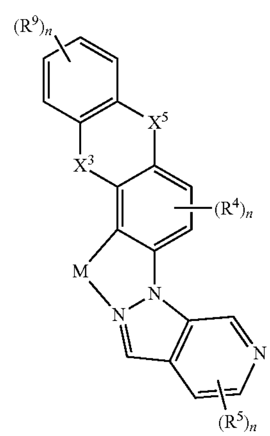

-continued

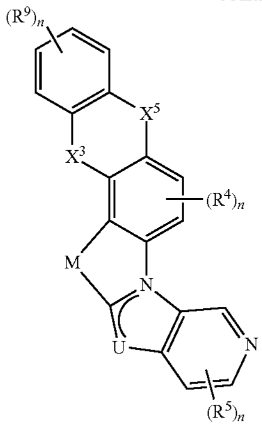

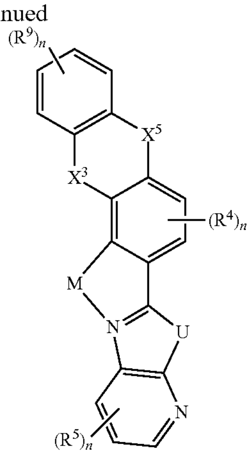

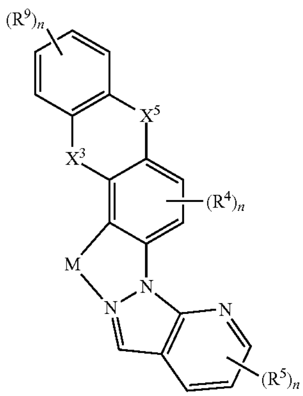

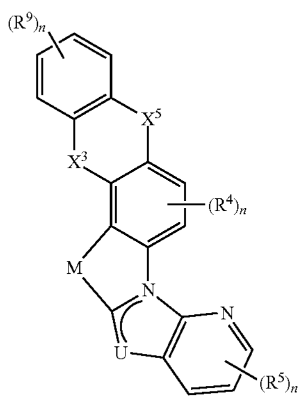

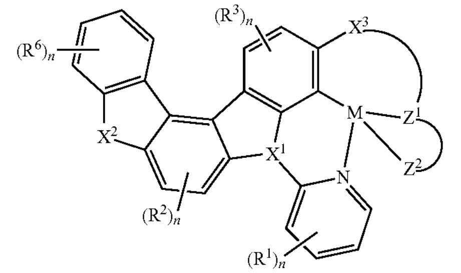

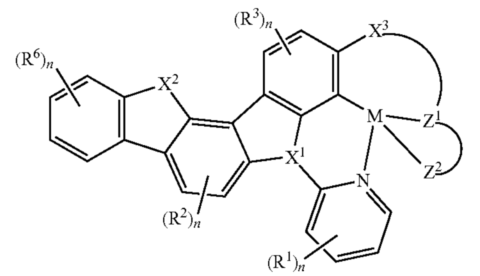

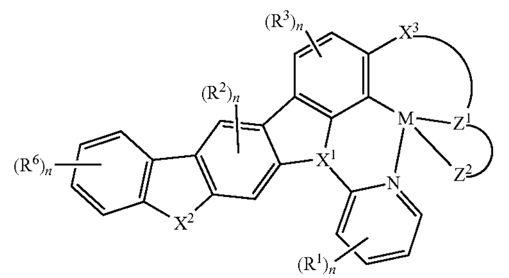

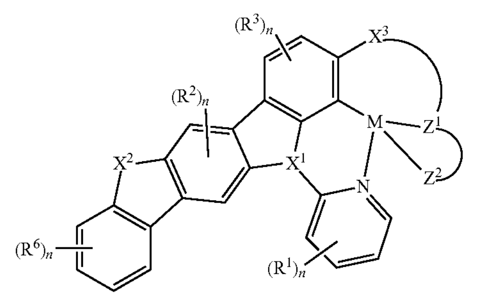

where:

$X^3$ and $X^5$ each independently represents NR, PR, CRR', SiRR', CRR', SiRR', O, S, S═O, O═S═O, Se, Se═O, or O═Se═O, where R and R' each independently represents hydrogen, cyanide, halogen, hydroxy, amino, nitro, thiol, or optionally substituted $C_1$-$C_4$ alkyl, alkoxy, aryl.

$R^4$, $R^5$, $R^7$, $R^8$, and $R^9$ each independently represents hydrogen, halogen, hydroxy, amino, nitro, cyanide, thiol, and substituted or unsubstituted $C_1$-$C_4$ alkyl, alkoxy, or aryl, U represents O, S. NR, or PR, where R is hydrogen, cyanide, halogen, hydroxy, amino, nitro, thiol, or optionally substituted $C_1$-$C_4$ alkyl, alkoxy, aryl, and each n is independently an integer, valency permitting.

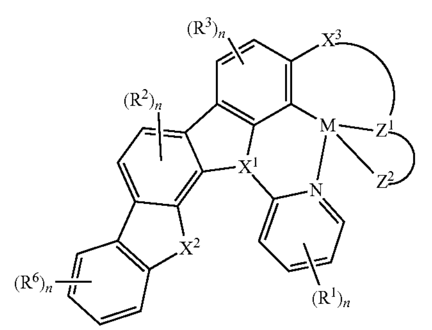

-continued
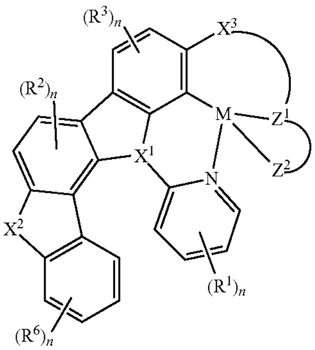
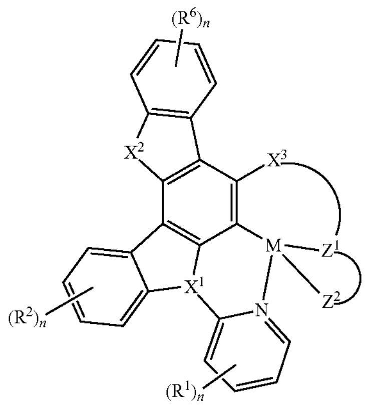
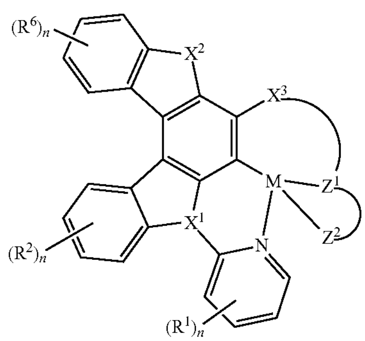
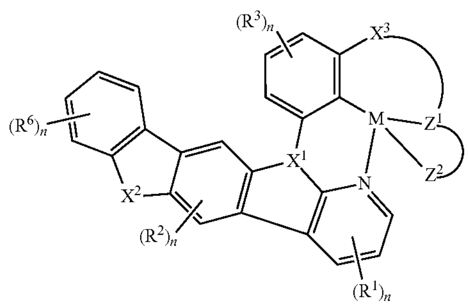
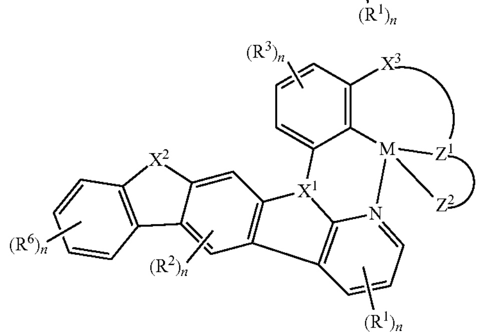
-continued
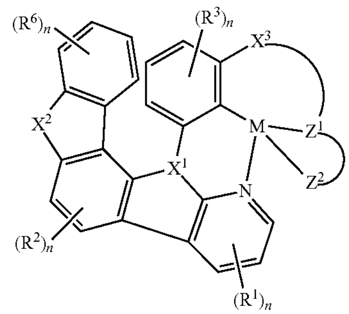
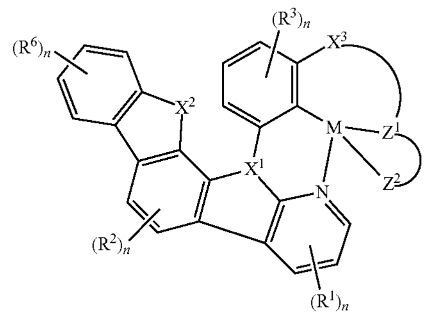
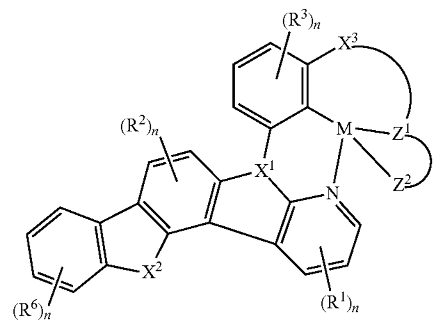
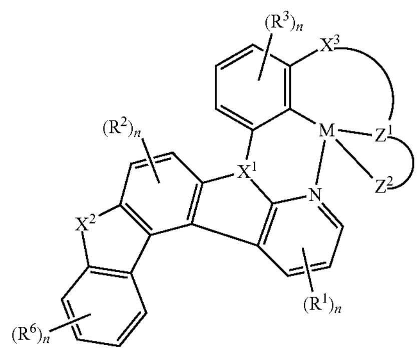
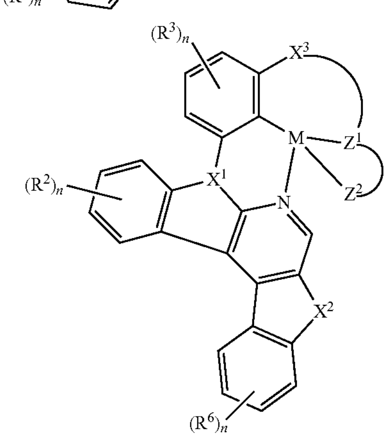

-continued
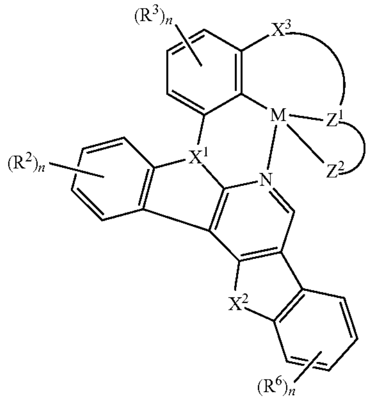
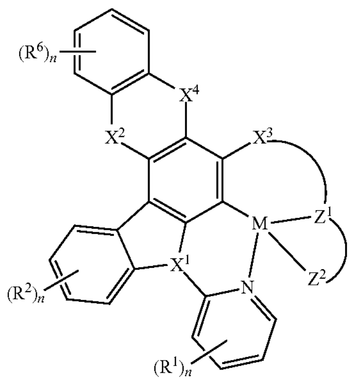
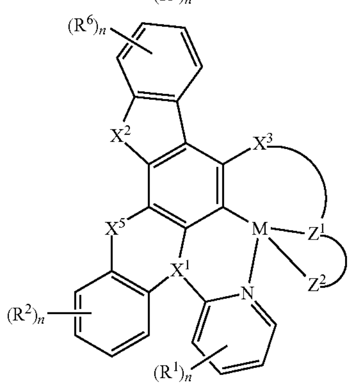
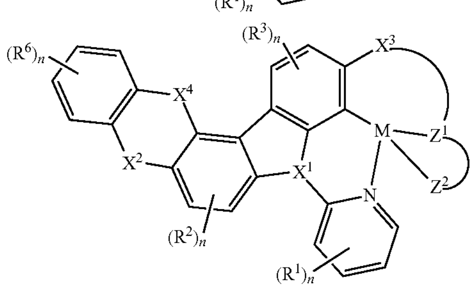
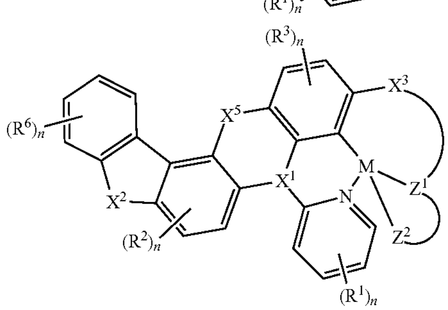
-continued
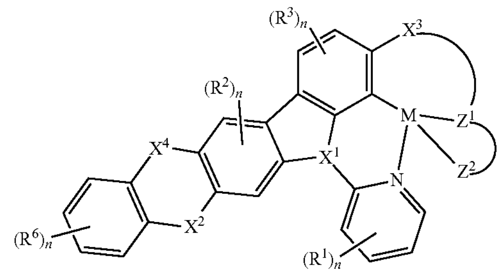
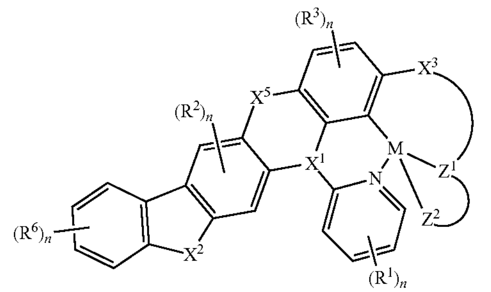
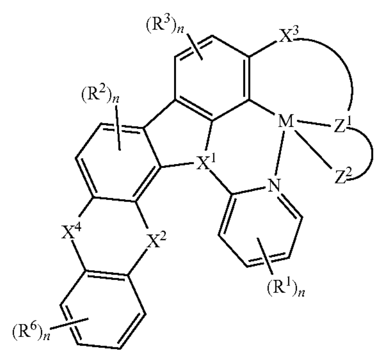
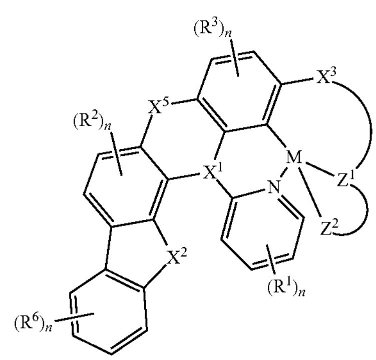
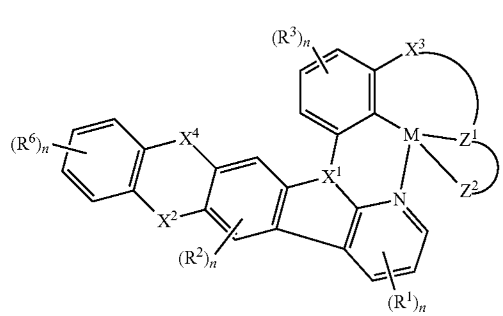

-continued
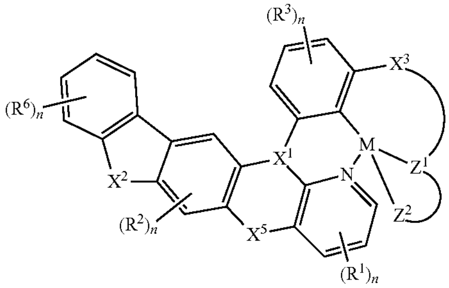
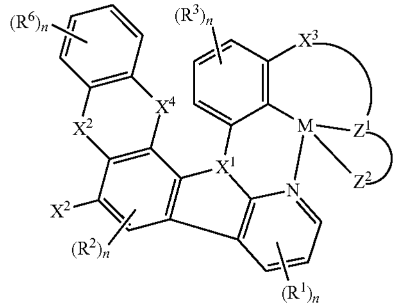
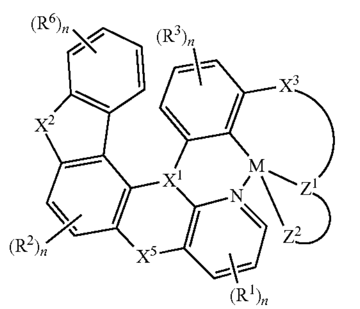
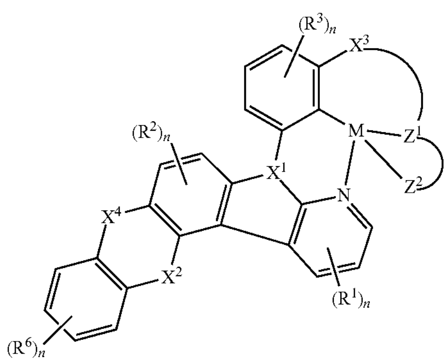
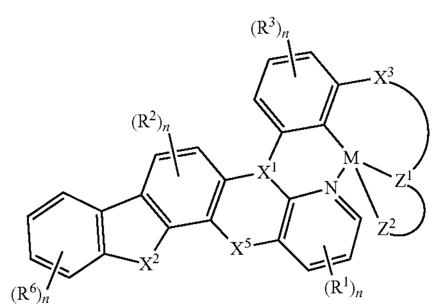
-continued
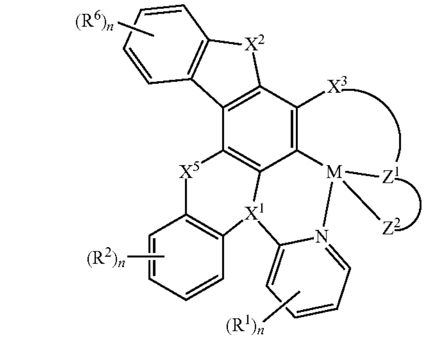
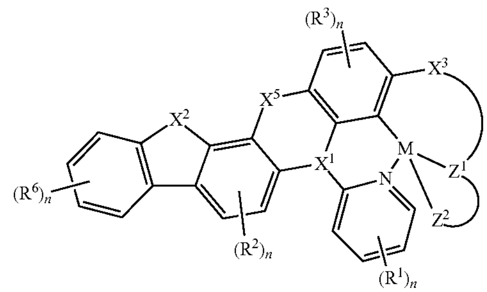
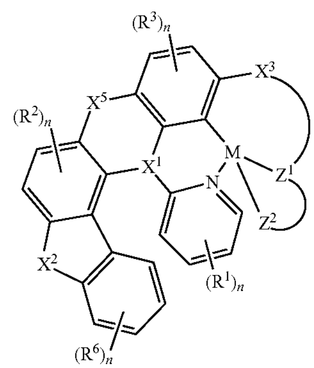
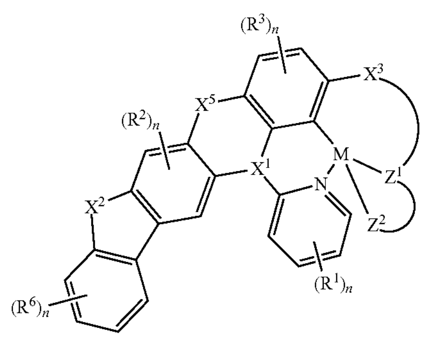
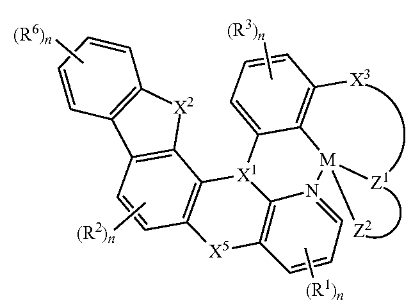

-continued
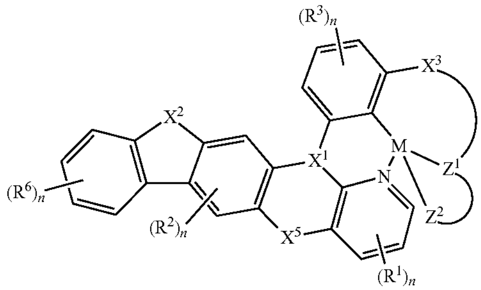
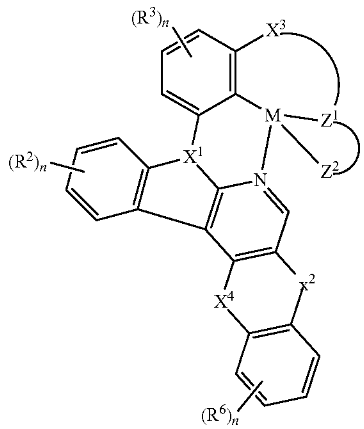
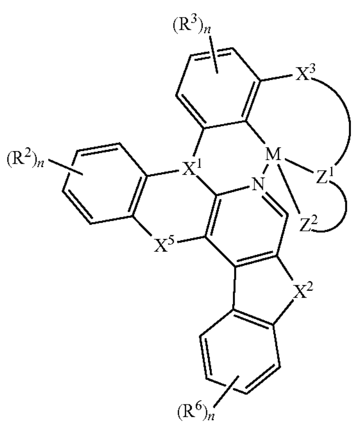
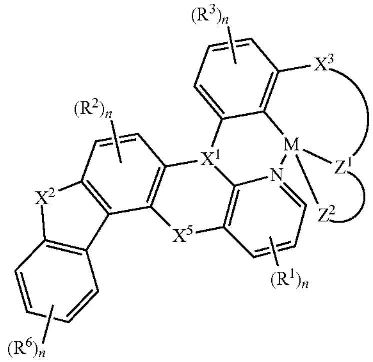
-continued
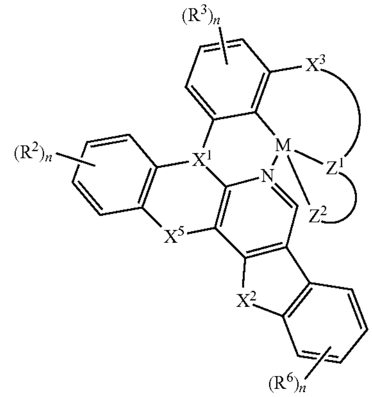
Complexes of General Formulas I-VI are shown below, where Ph is phenyl and
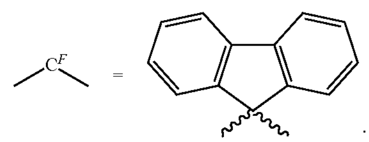
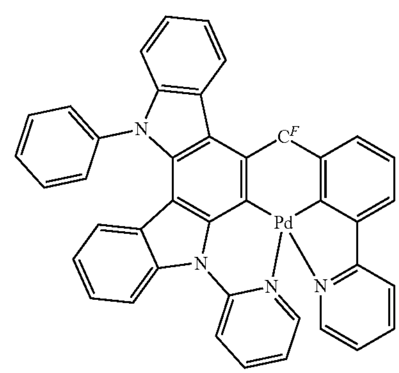
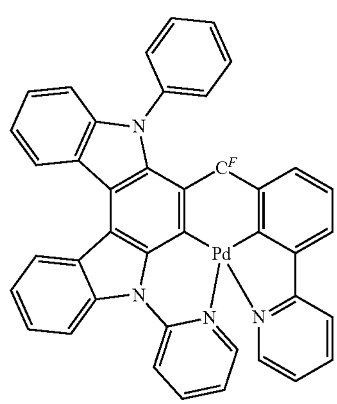

-continued
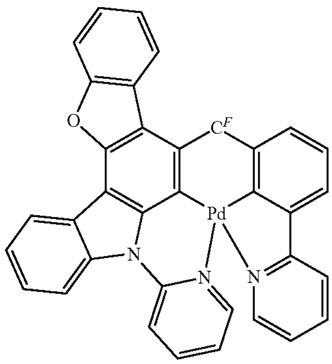
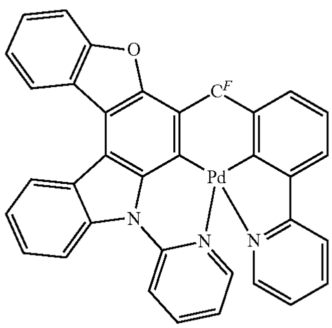
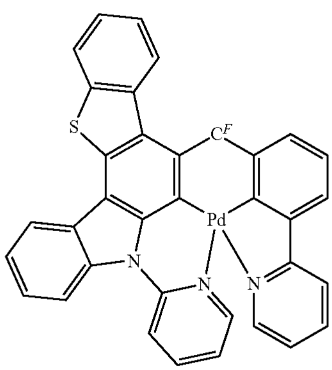
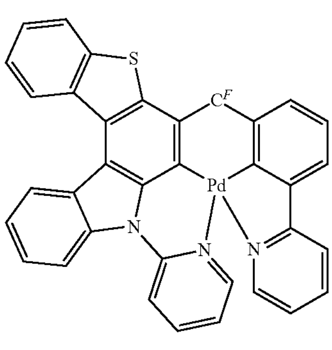
-continued
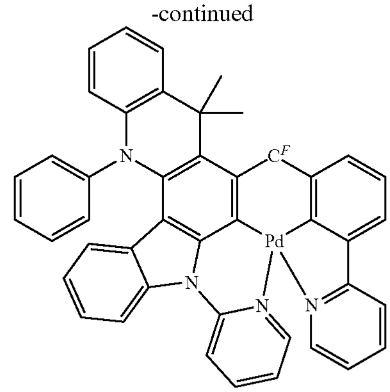
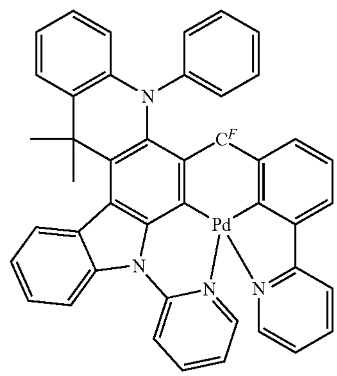
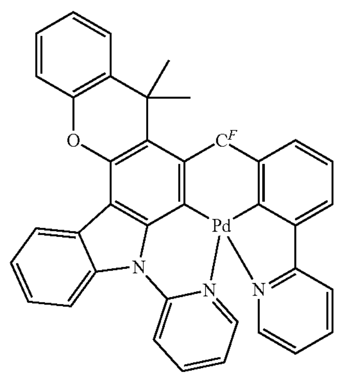
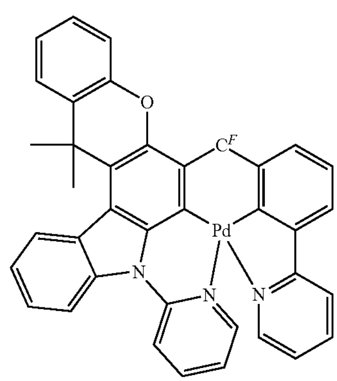

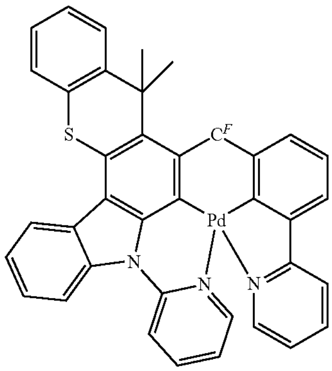
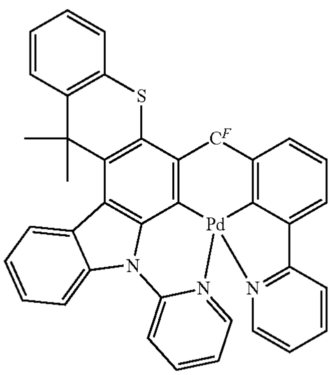
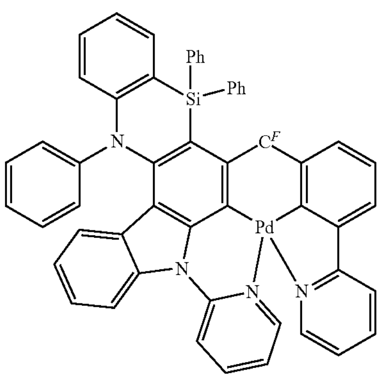
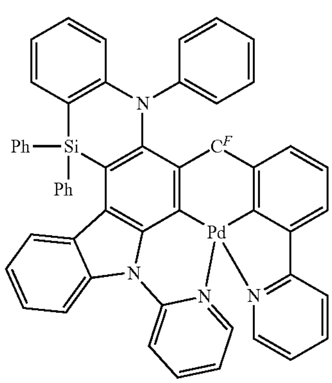
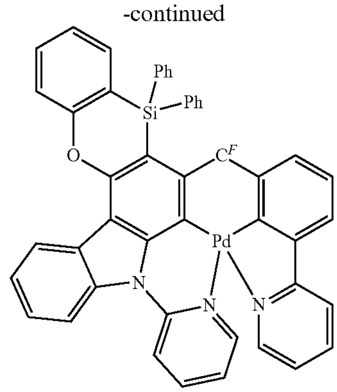
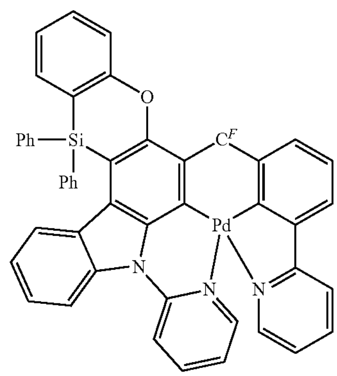
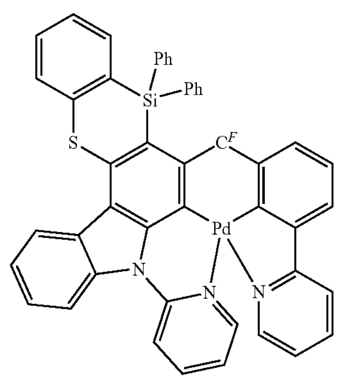
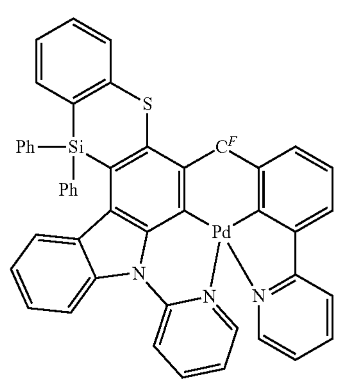

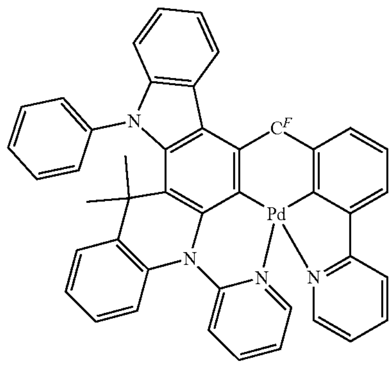
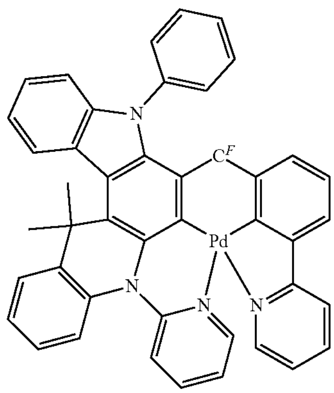
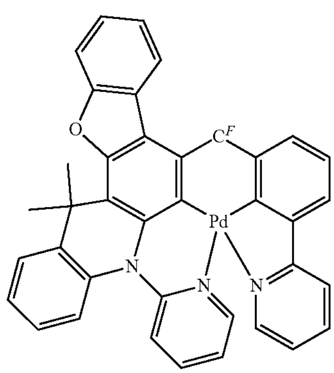
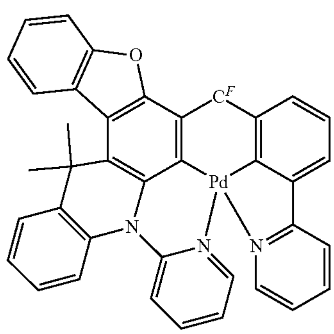
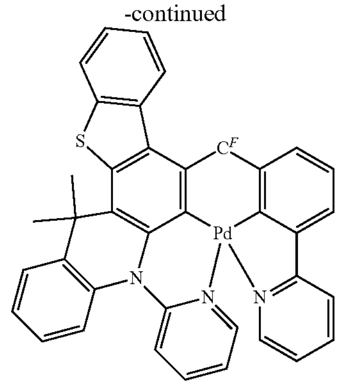
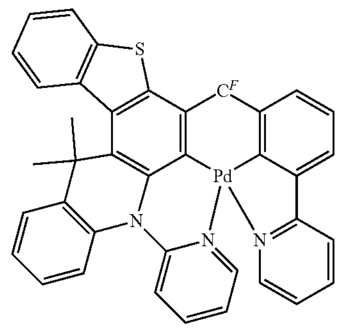
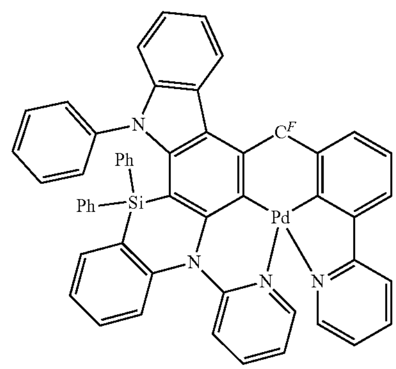
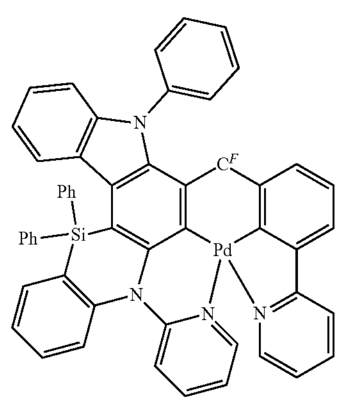

-continued
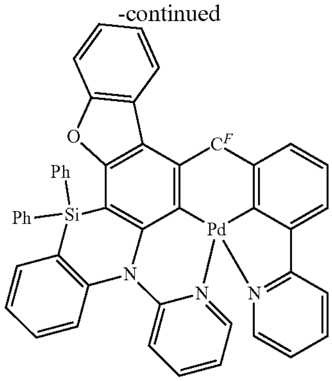
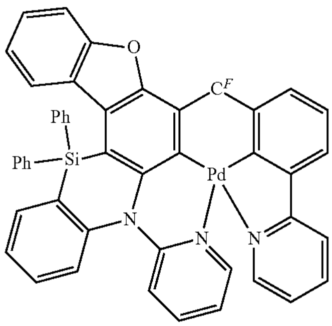
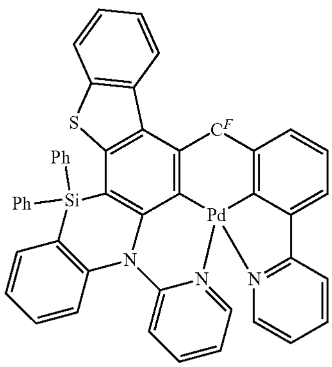
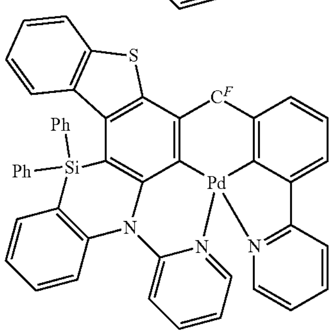
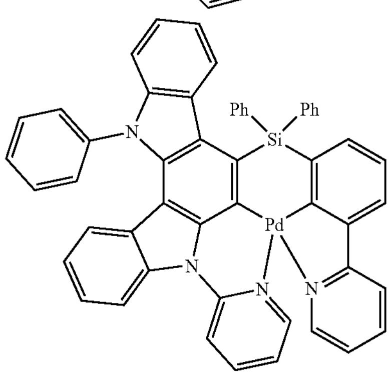
-continued
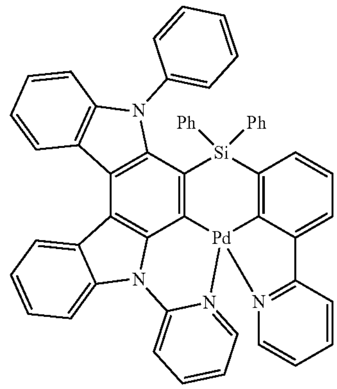
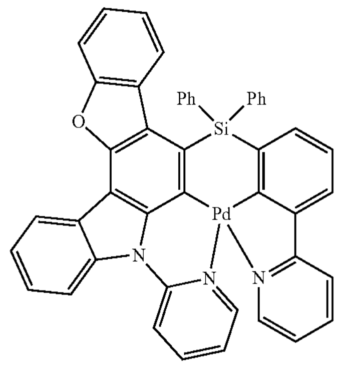
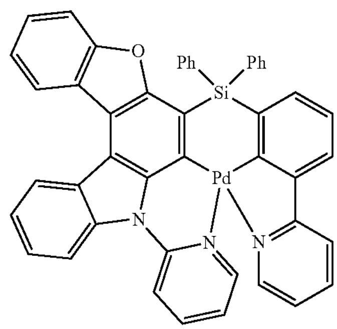
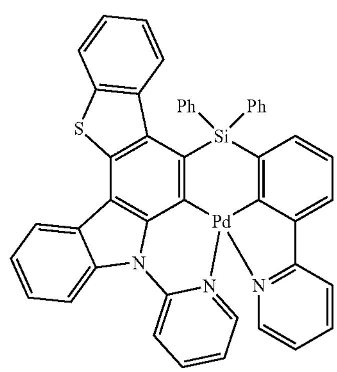

-continued
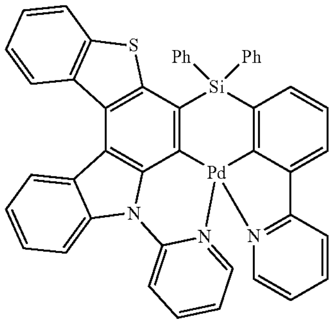
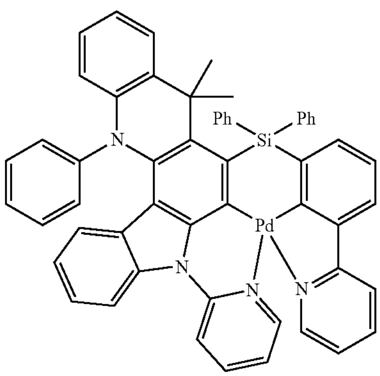
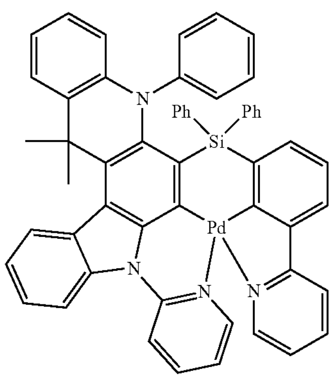
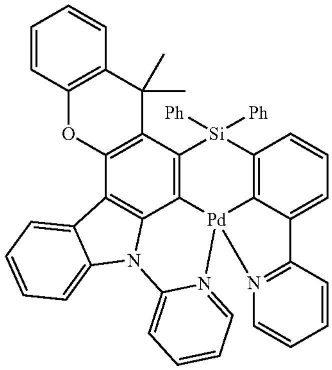
-continued
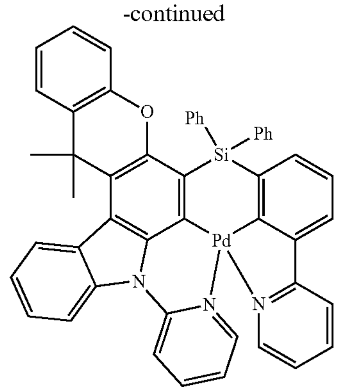
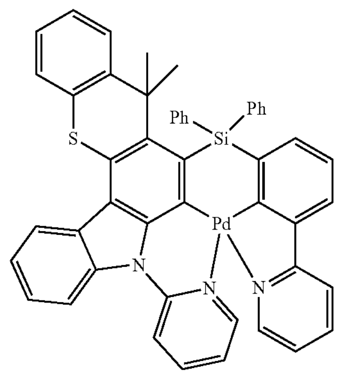
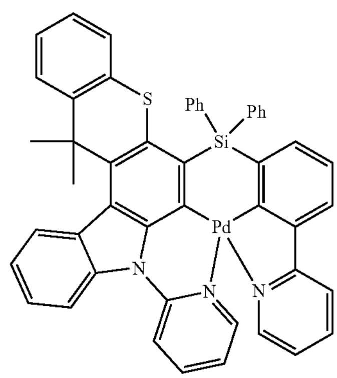
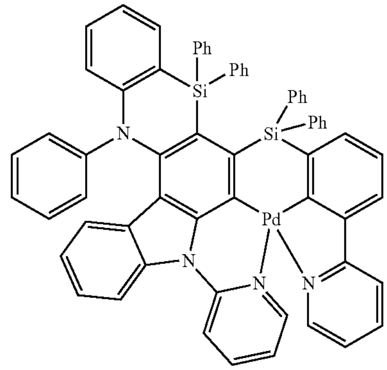

-continued
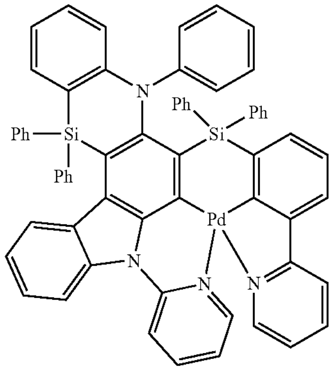
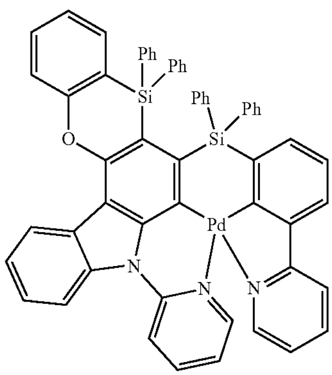
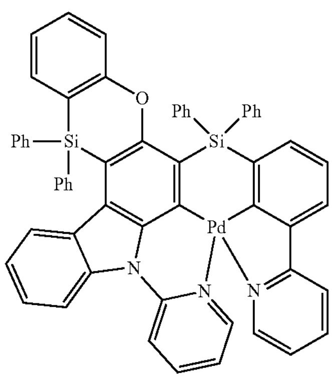
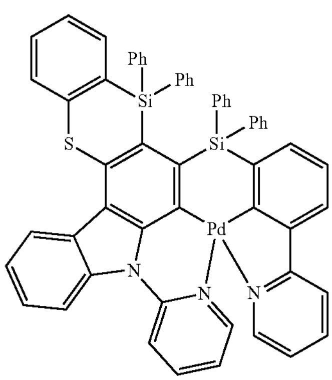
-continued
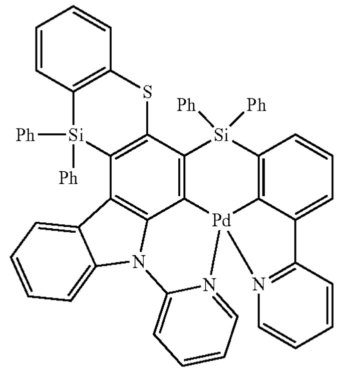
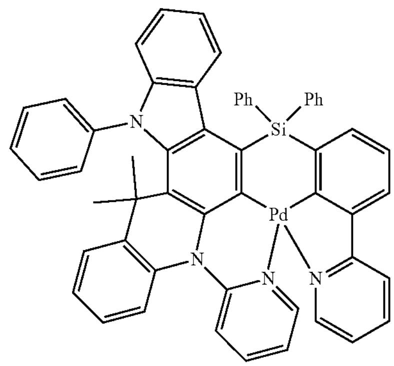
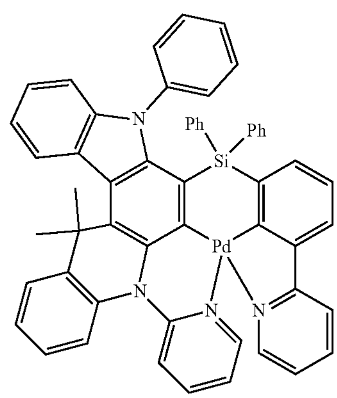
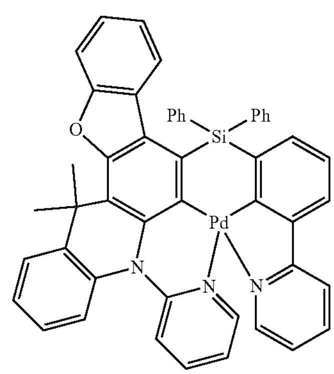

-continued
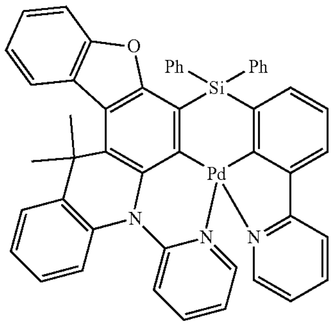
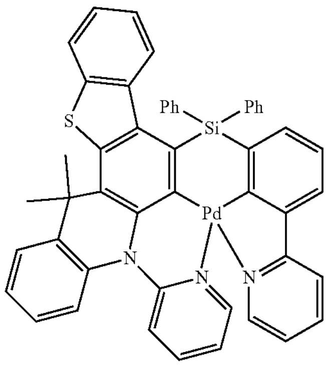
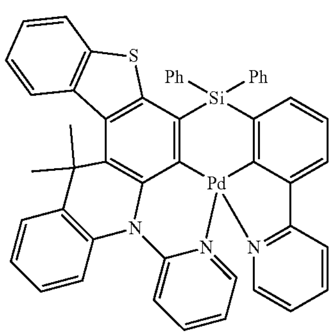
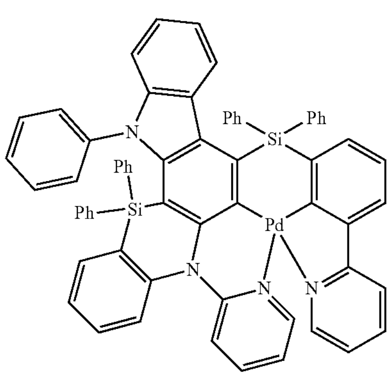
-continued
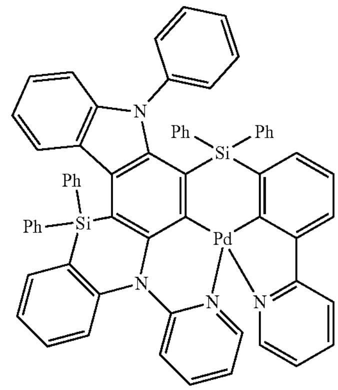
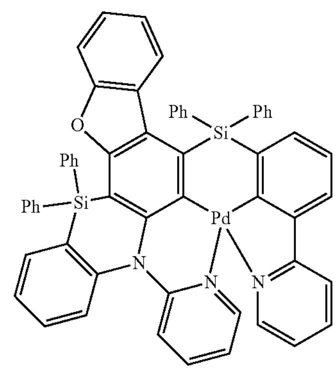
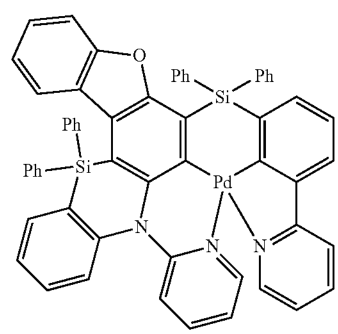
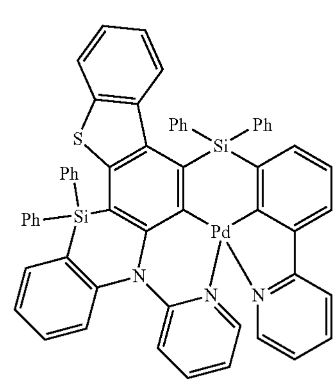

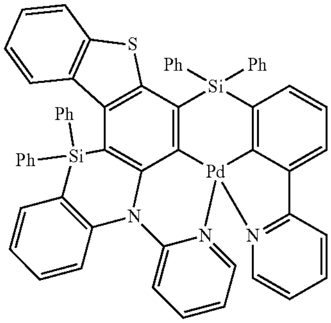
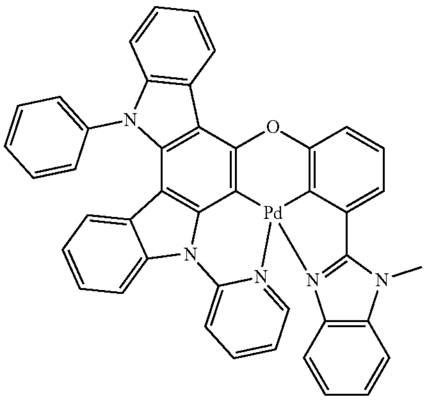
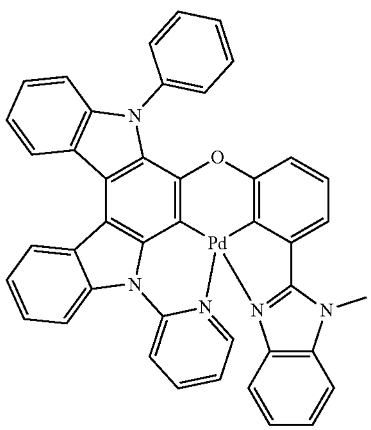
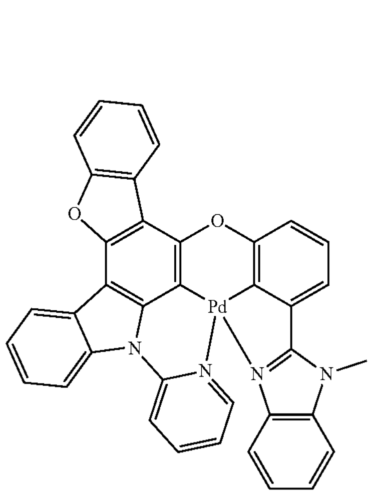
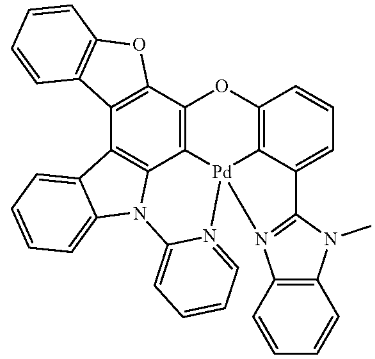
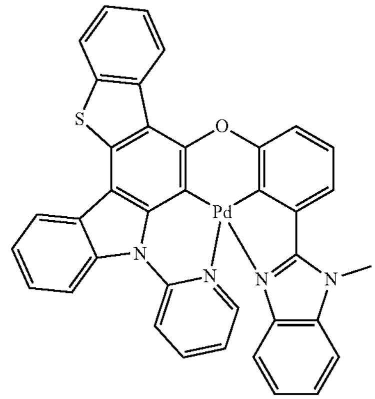
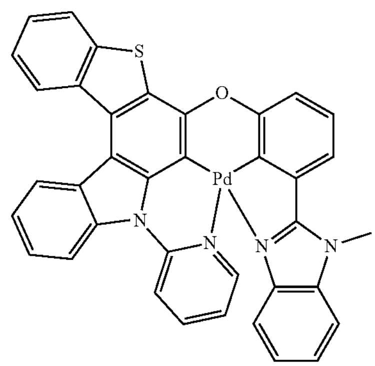
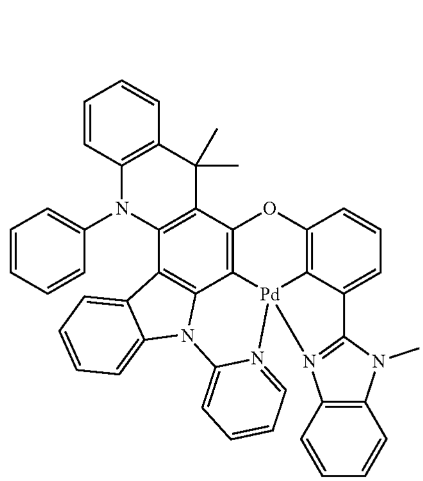

-continued
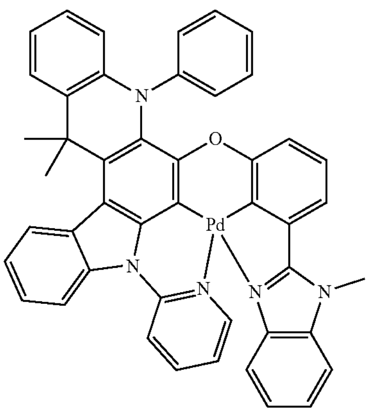
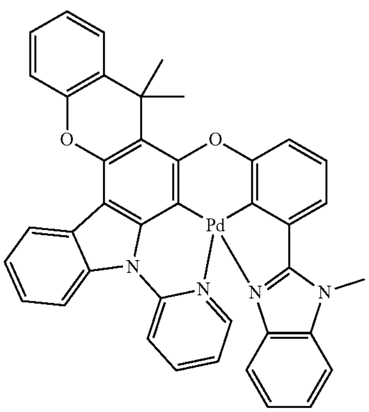
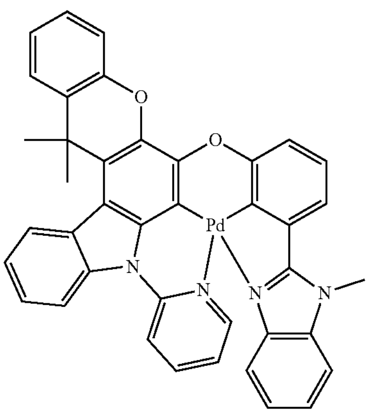
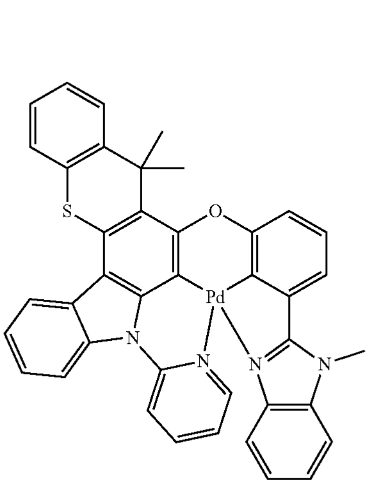
-continued
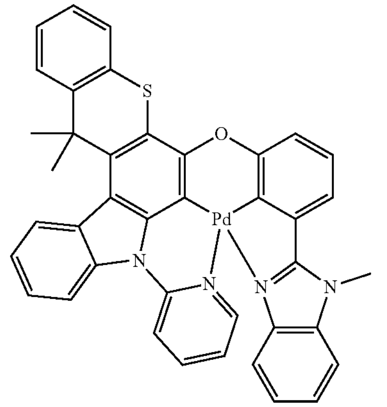
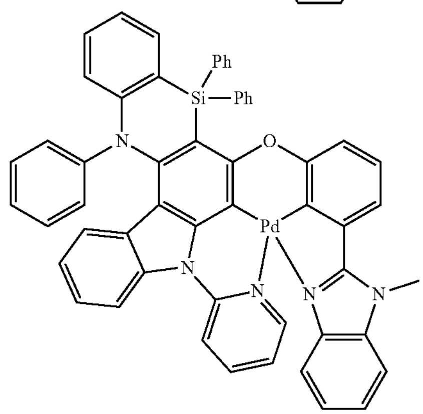
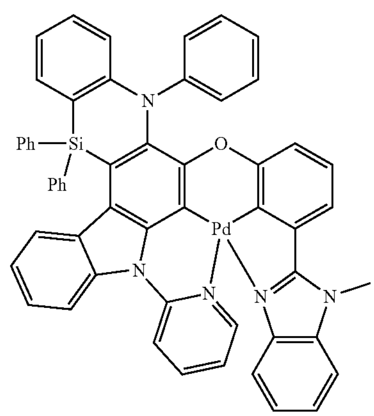
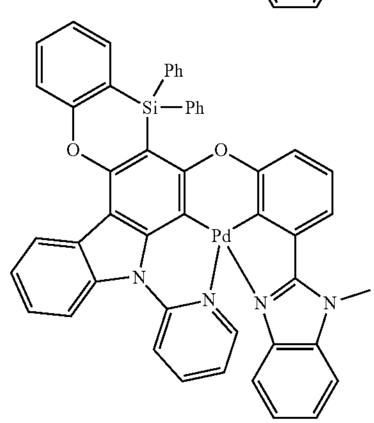

-continued
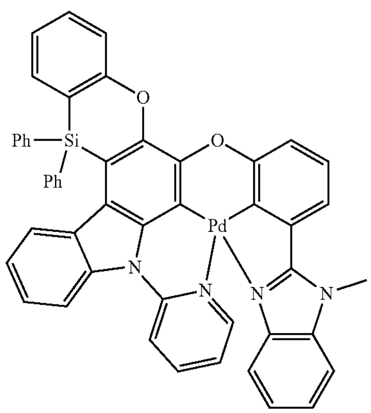
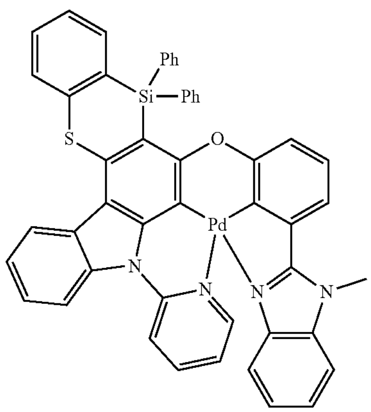
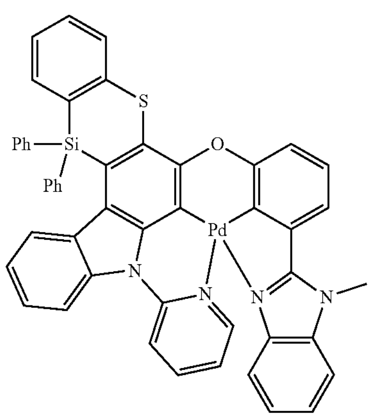
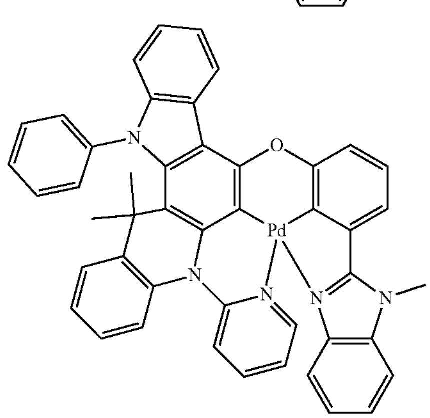
-continued
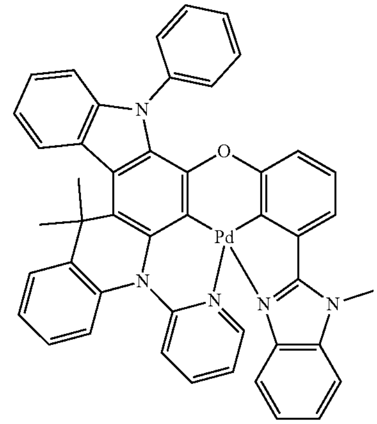
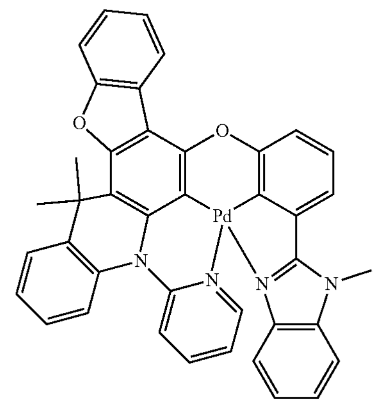
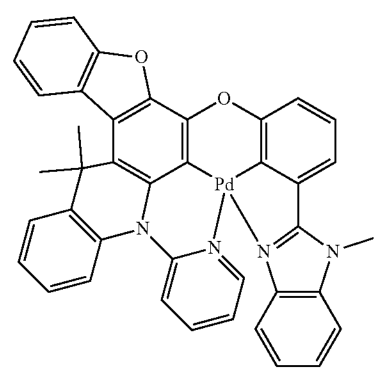
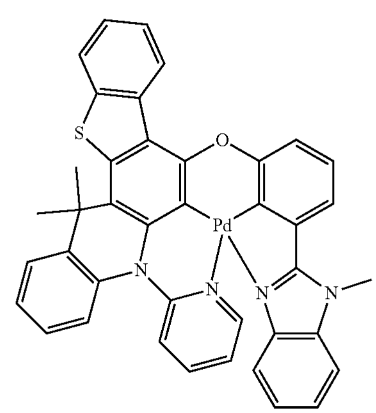

-continued
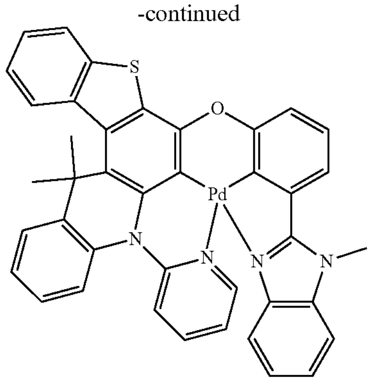
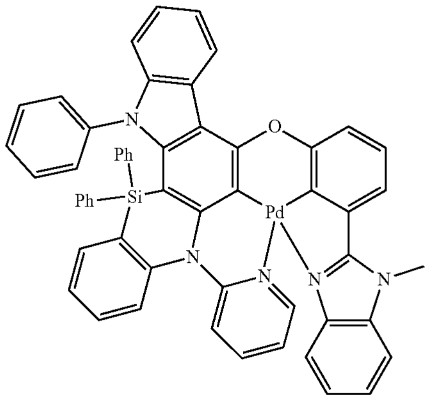
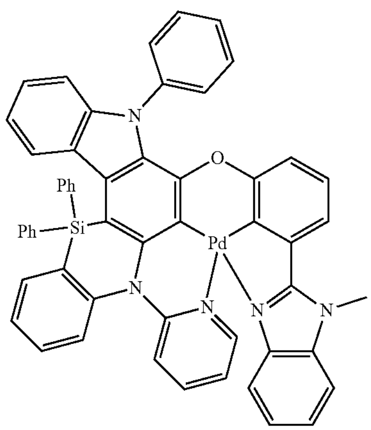
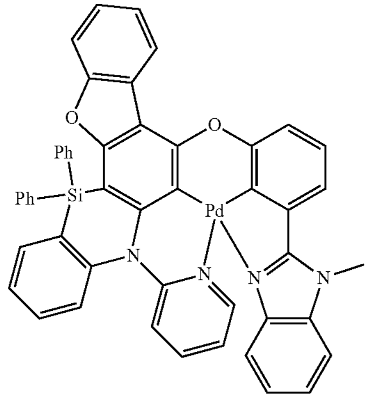
-continued
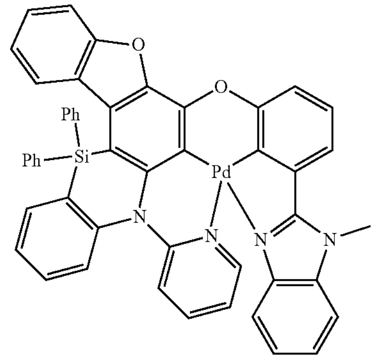
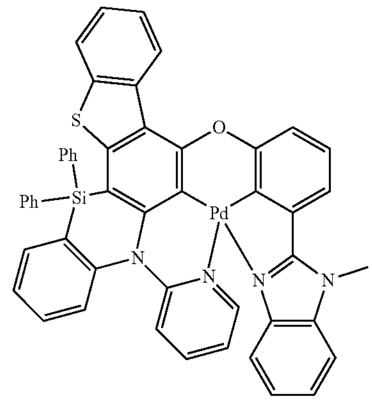
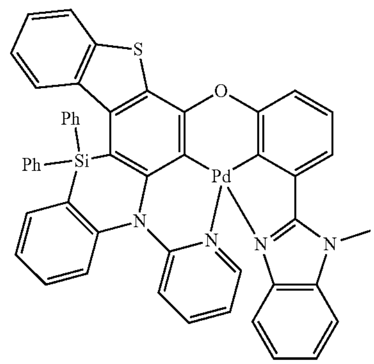
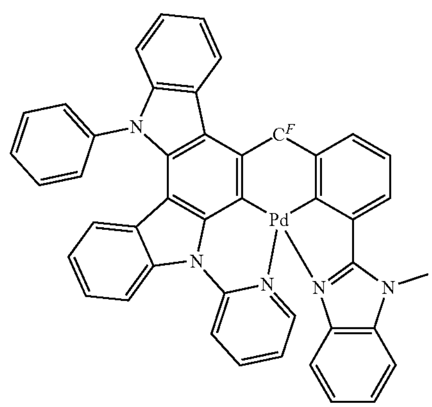

-continued
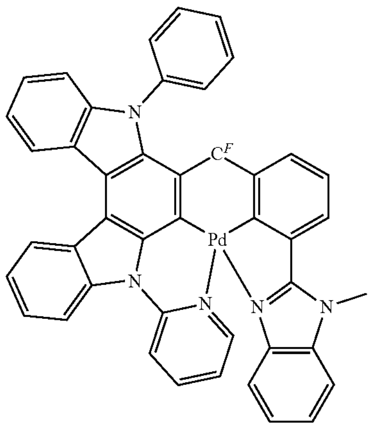
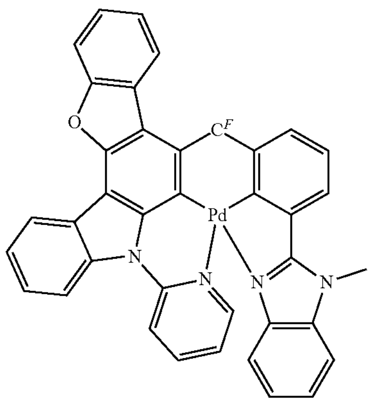
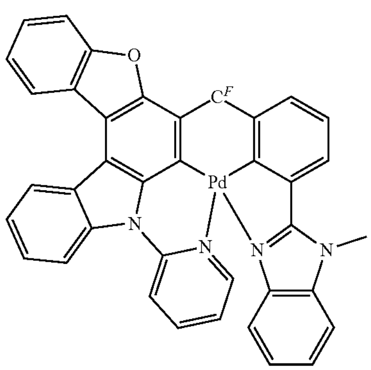
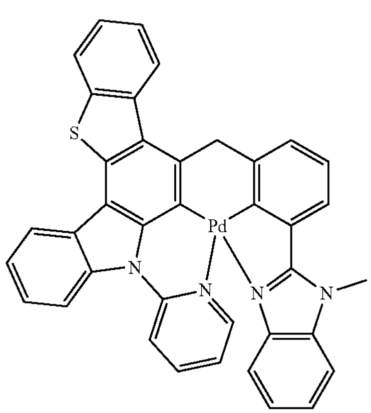
-continued
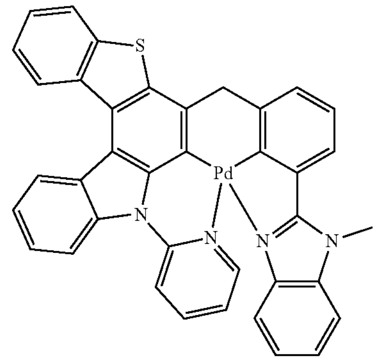
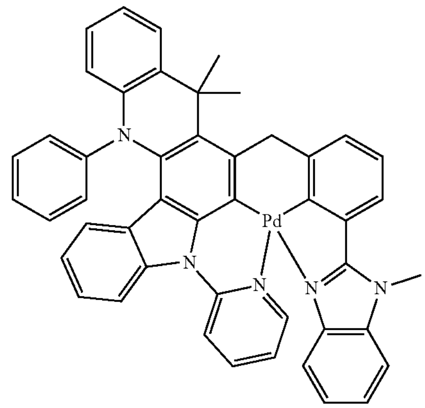
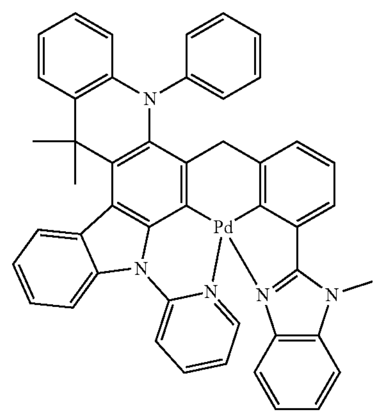
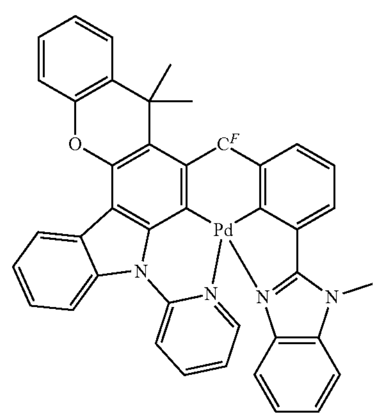

-continued
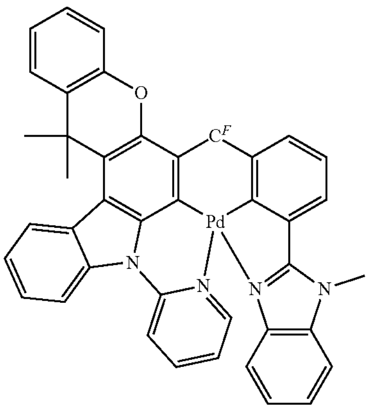
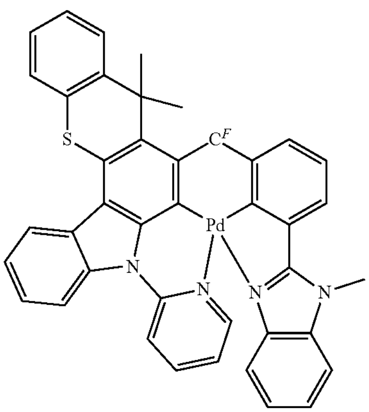
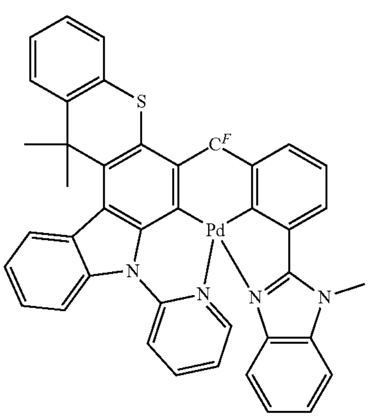
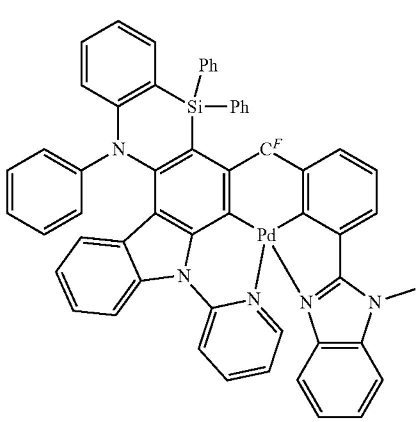
-continued
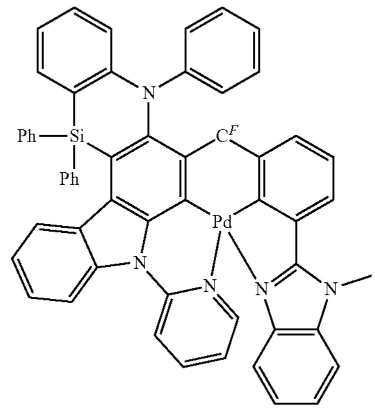
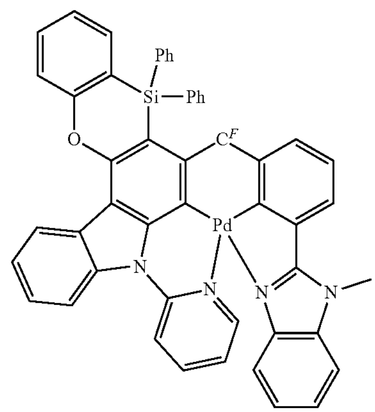
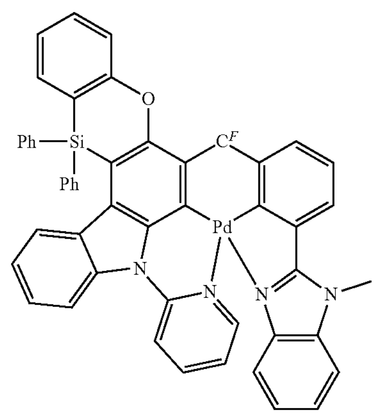
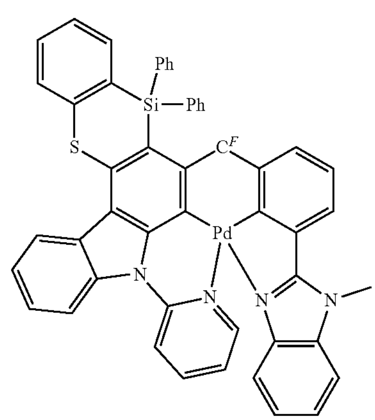

-continued
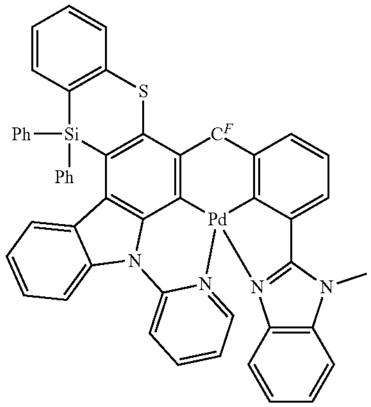
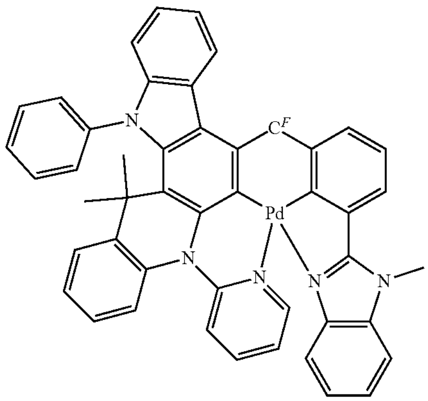
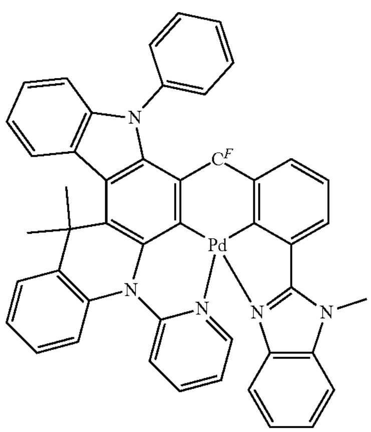
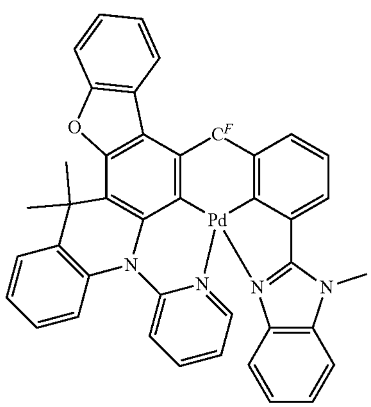
-continued
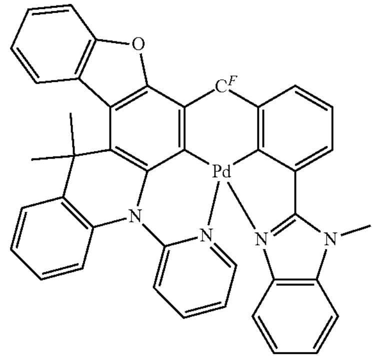
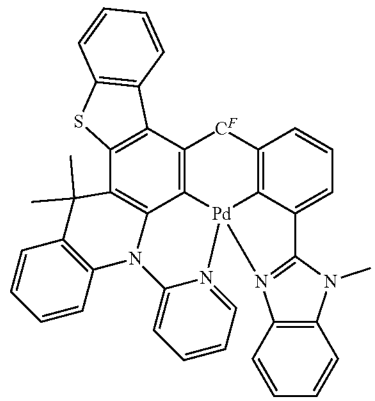
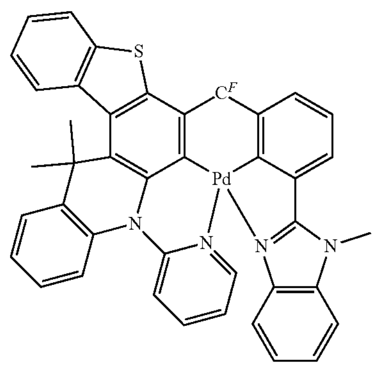
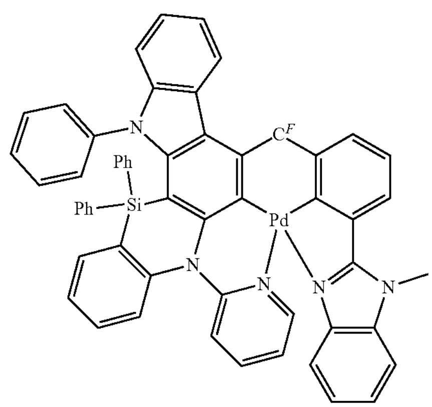

-continued
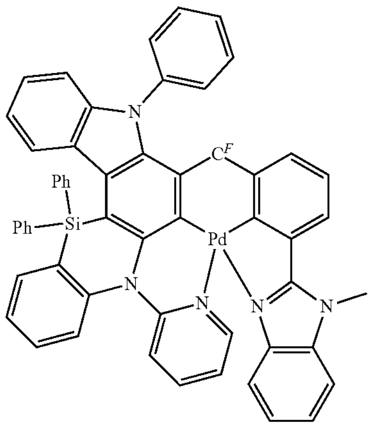
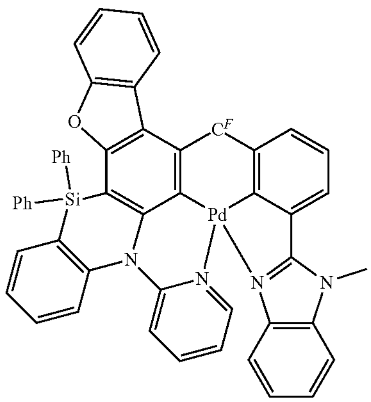
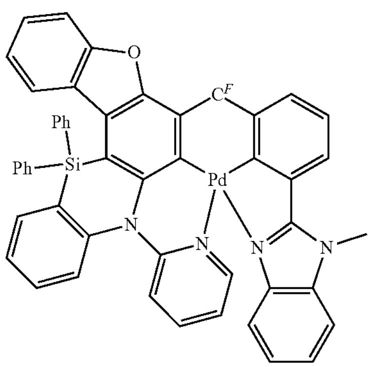
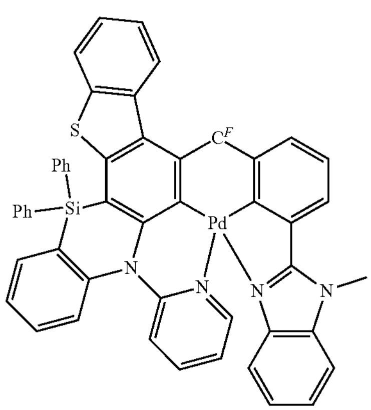
-continued
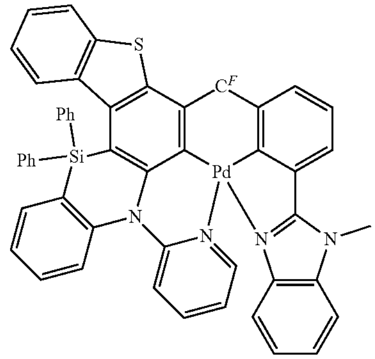
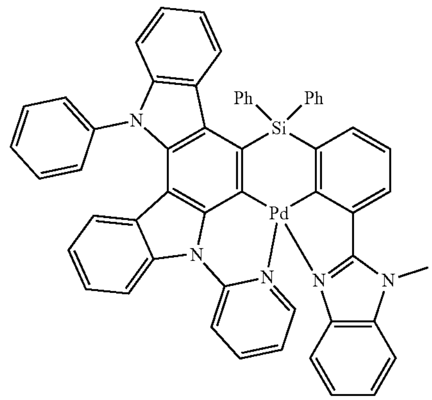
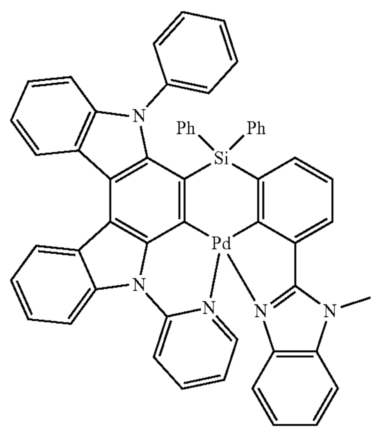
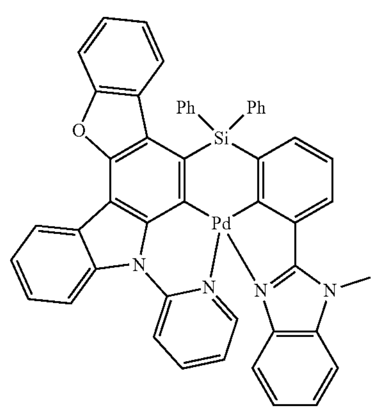

-continued
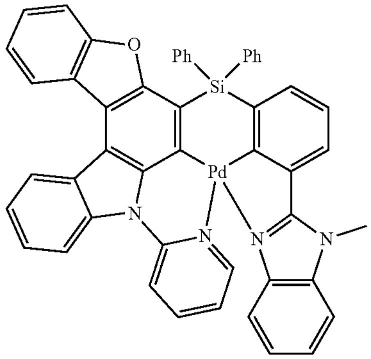
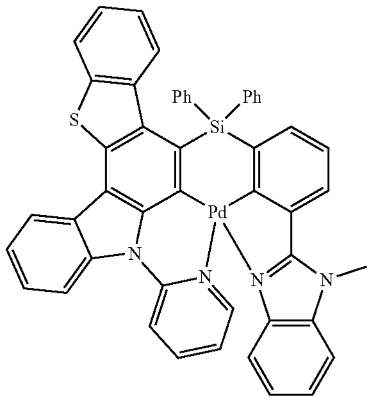
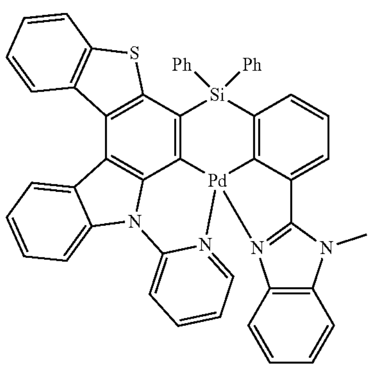
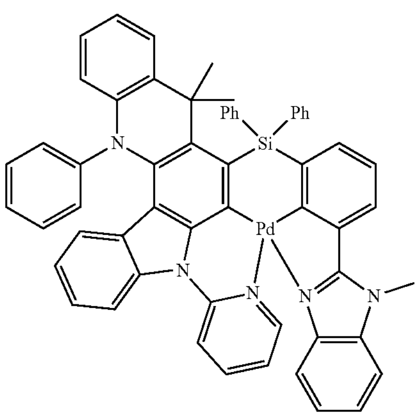
-continued
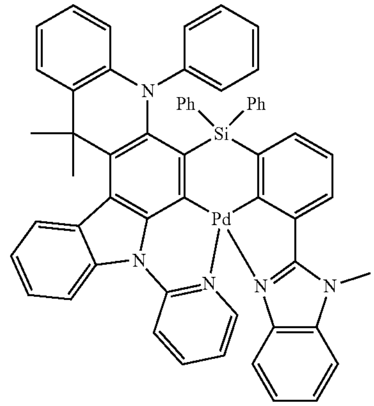
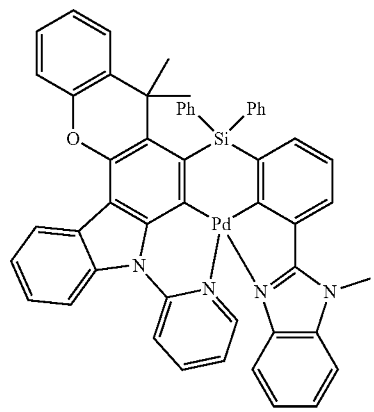
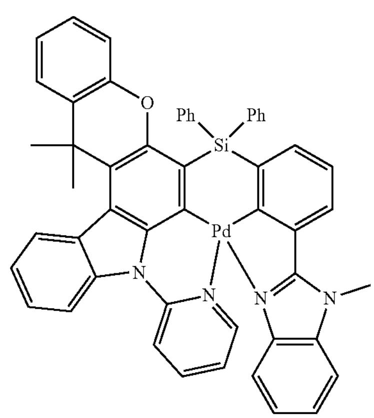
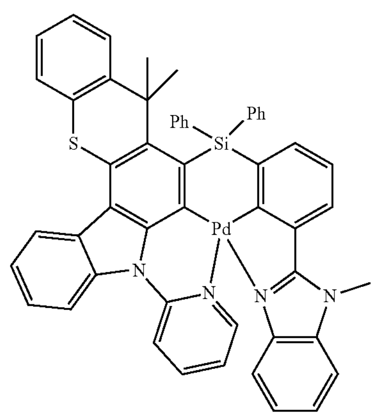

-continued
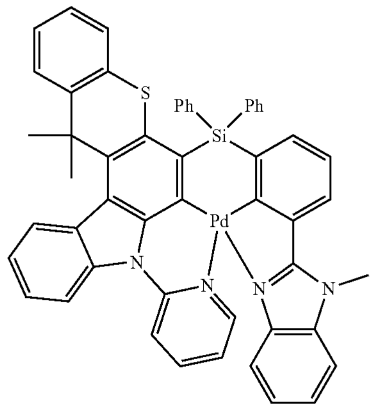
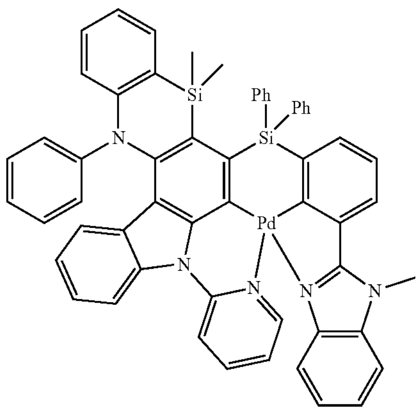
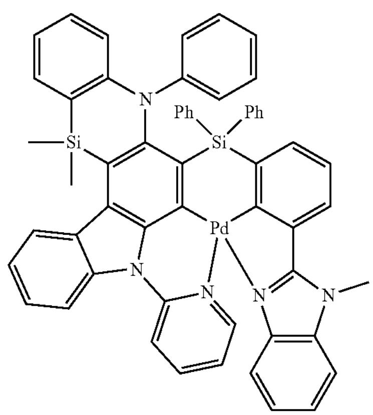
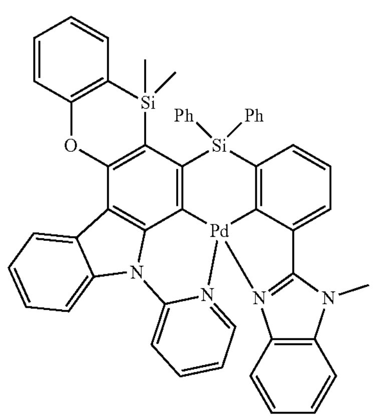
-continued
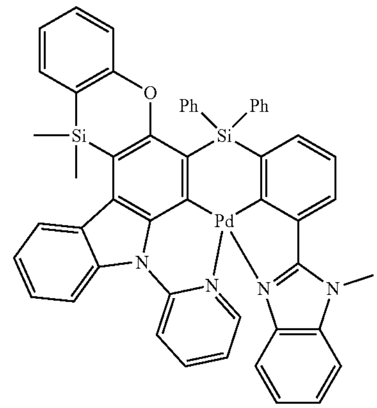
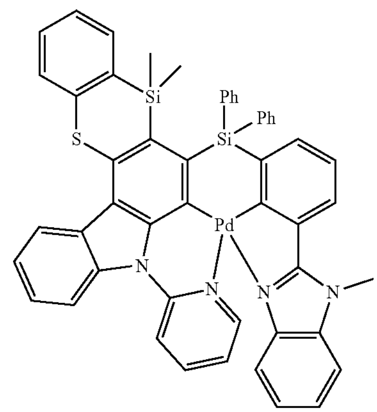
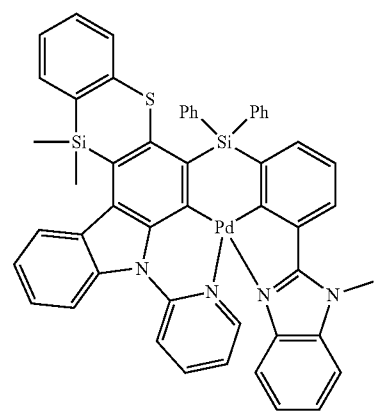
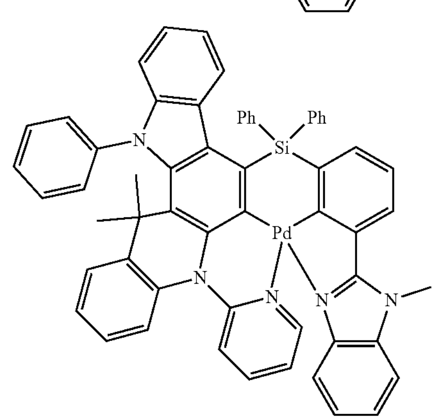

-continued
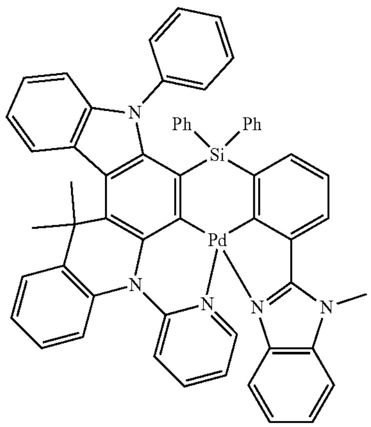
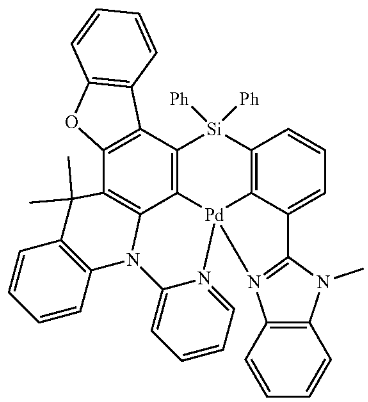
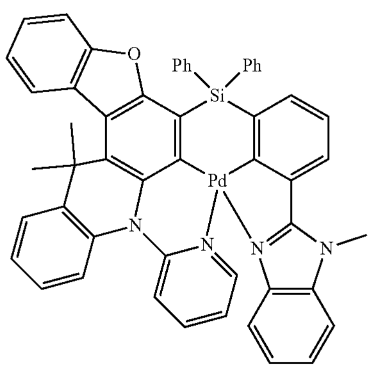
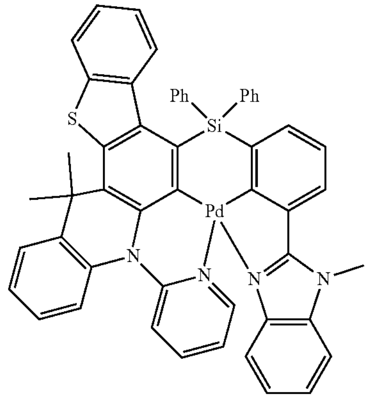
-continued
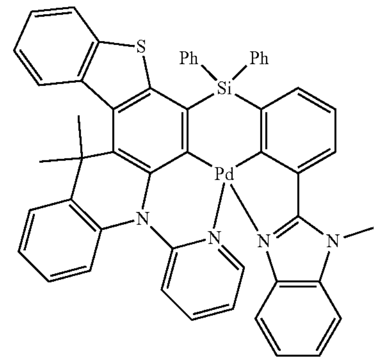
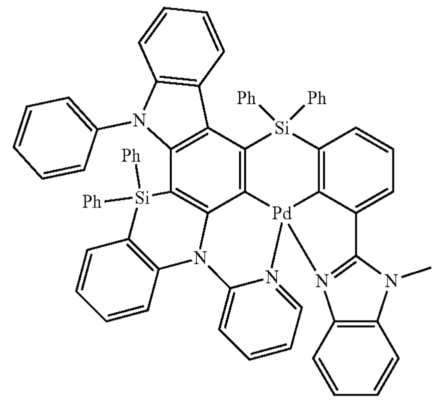
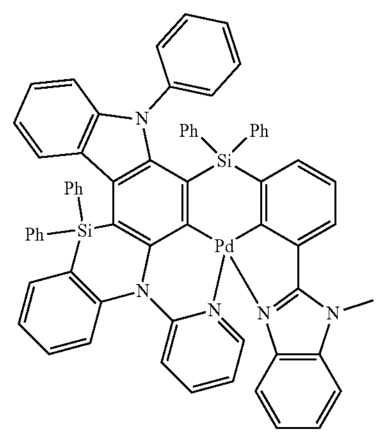
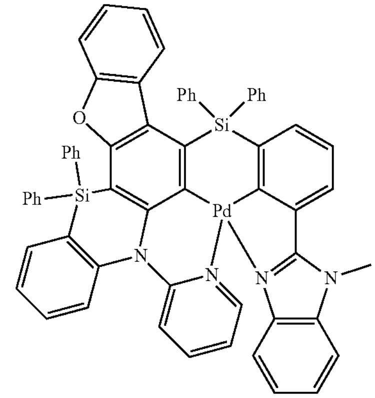

-continued
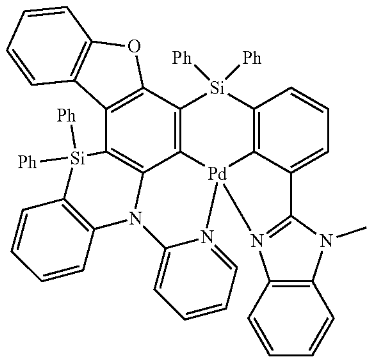
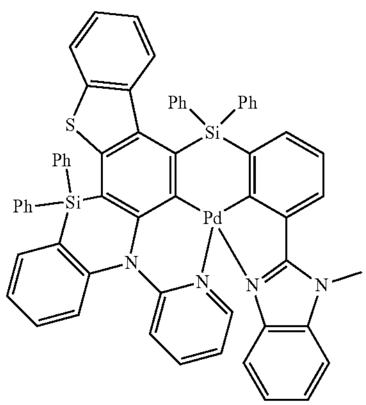
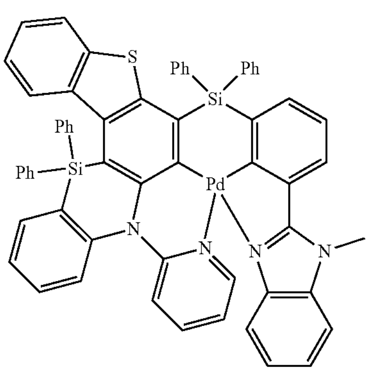
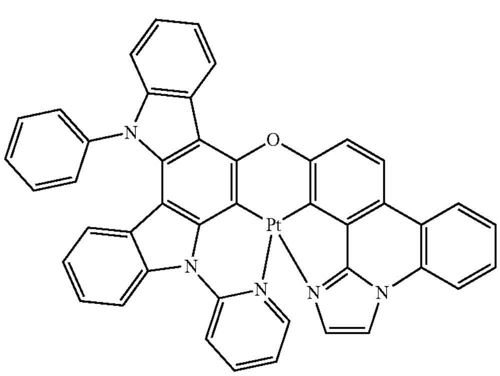
-continued
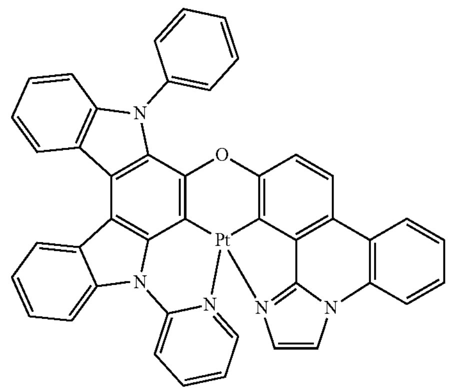
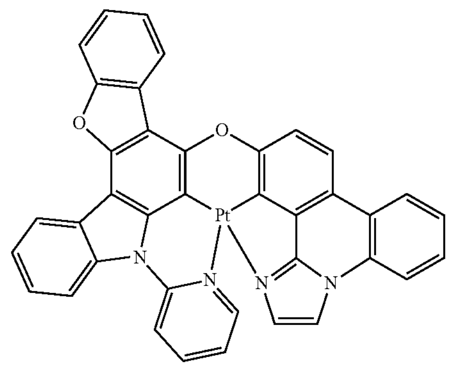
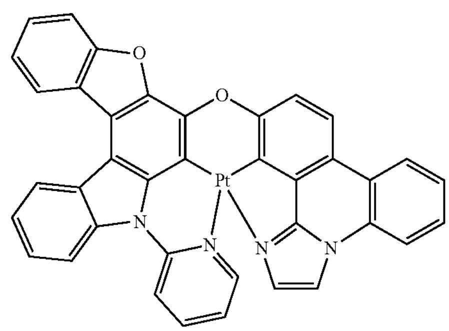
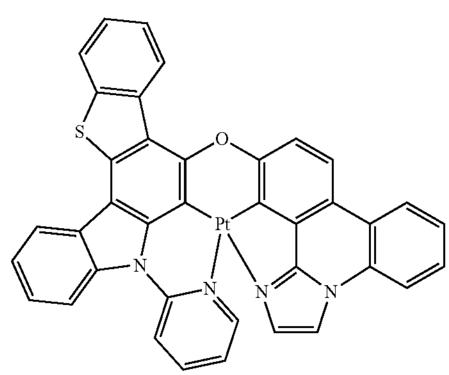

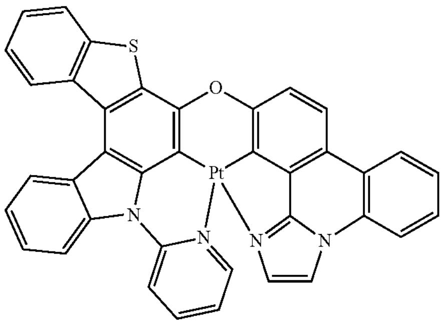
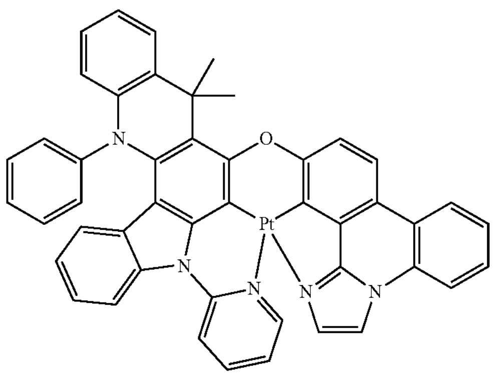
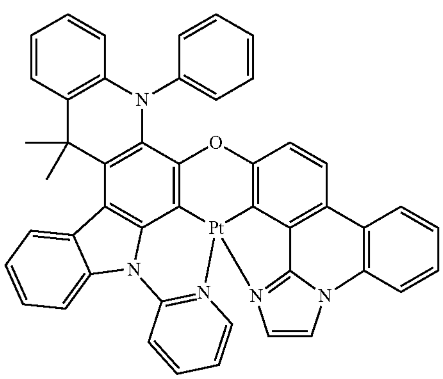
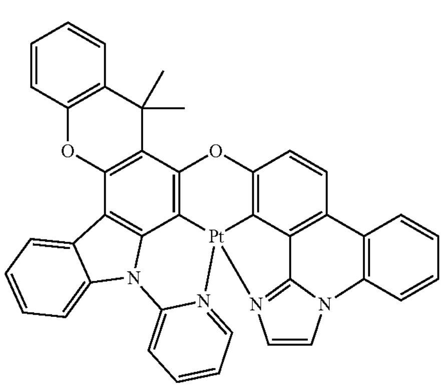
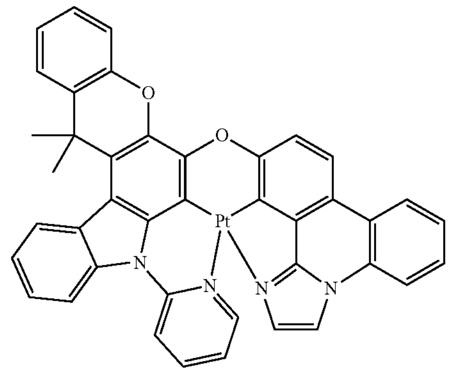
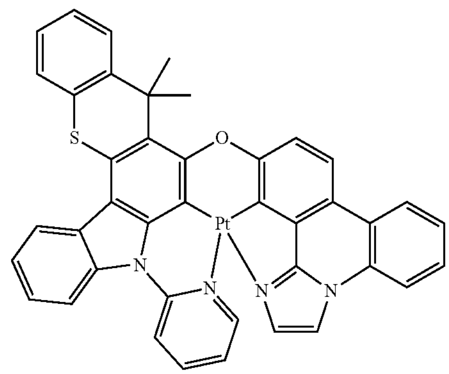
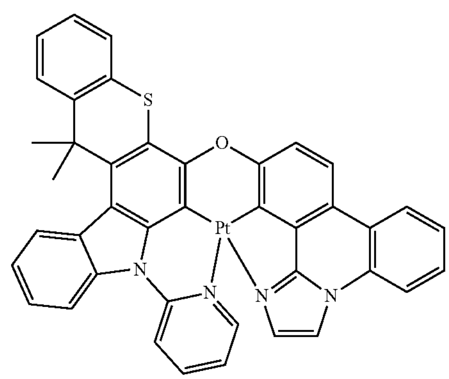
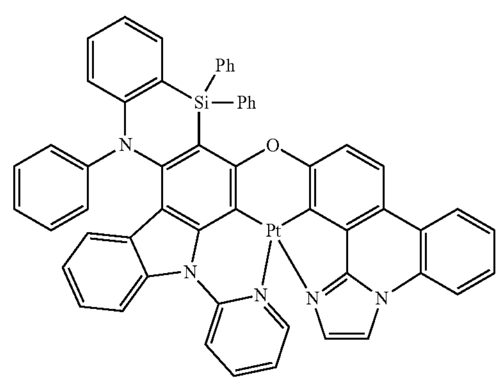
Ph
Si
Ph

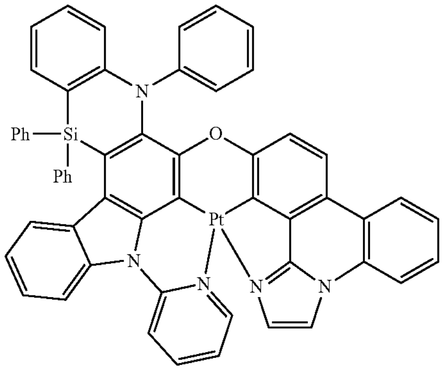
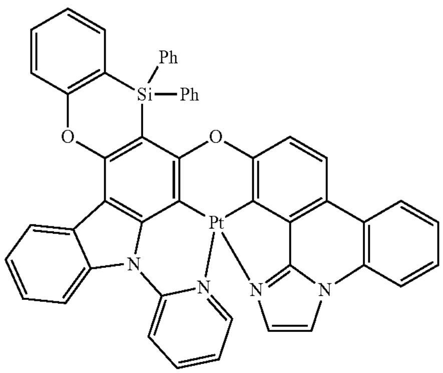
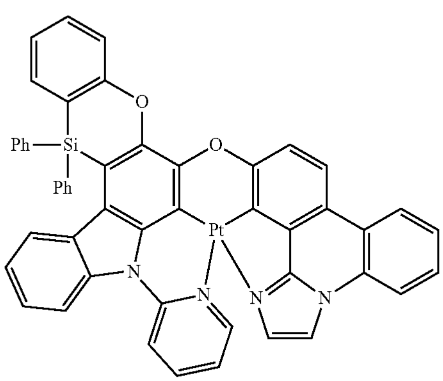
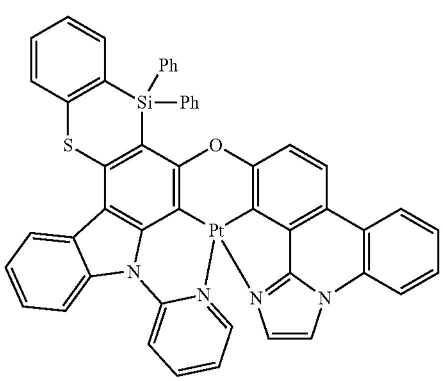
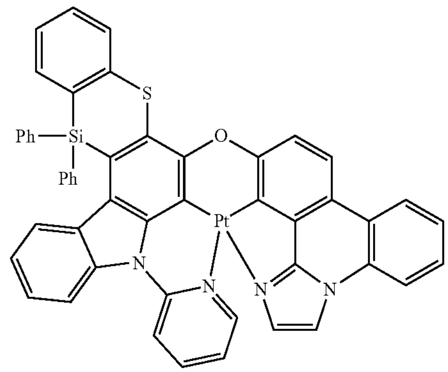
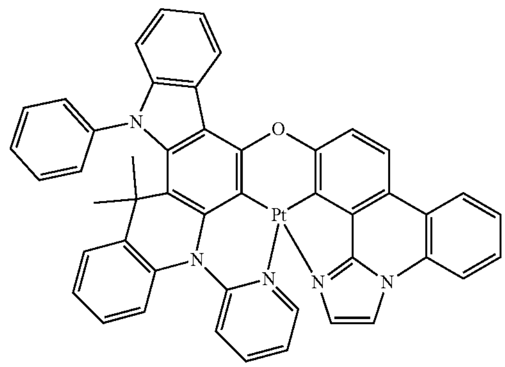
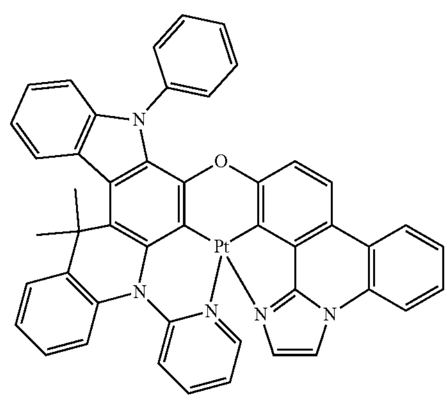
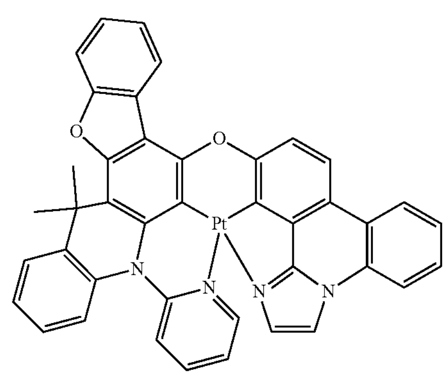

-continued
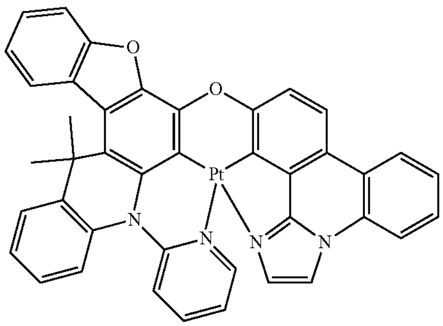
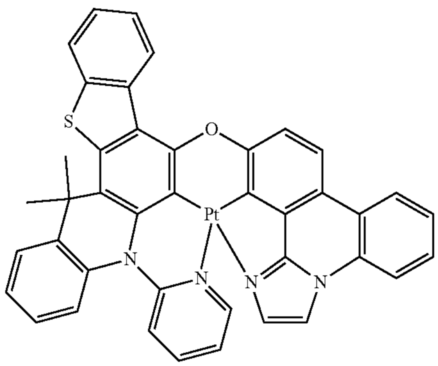
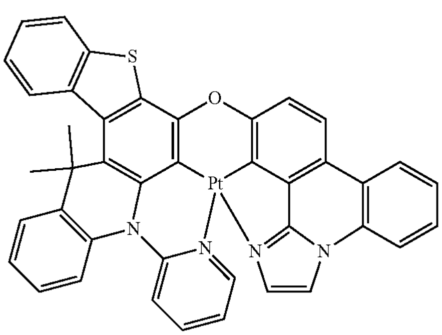
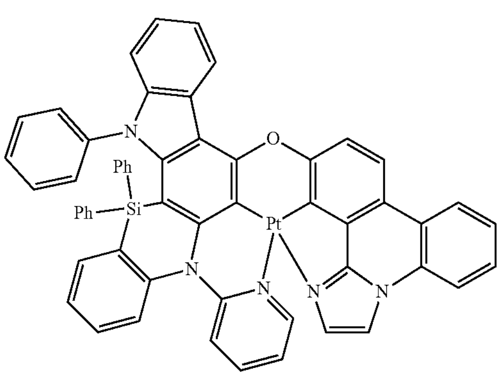
-continued
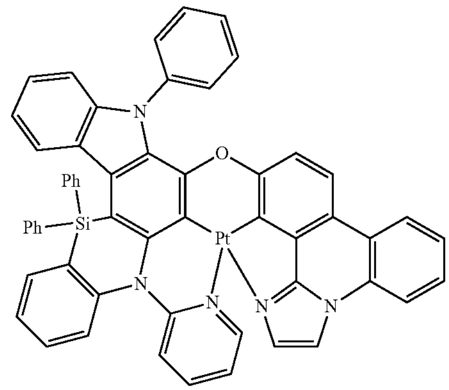
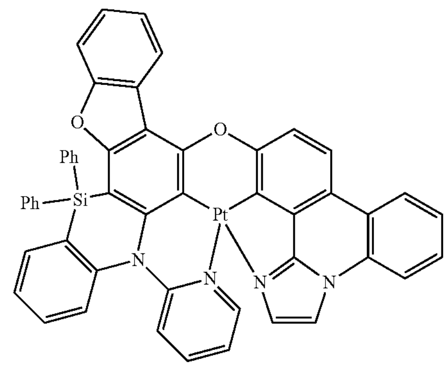
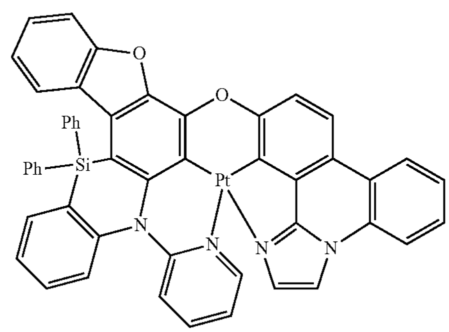
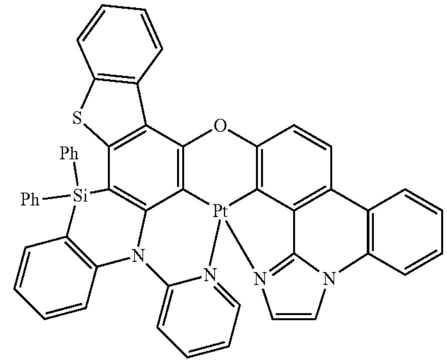

-continued
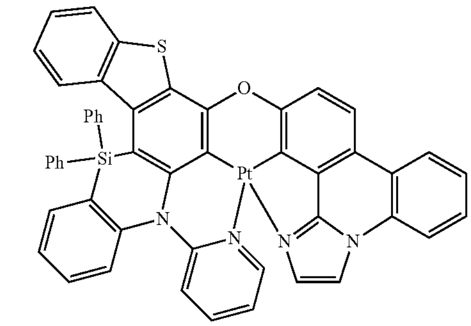
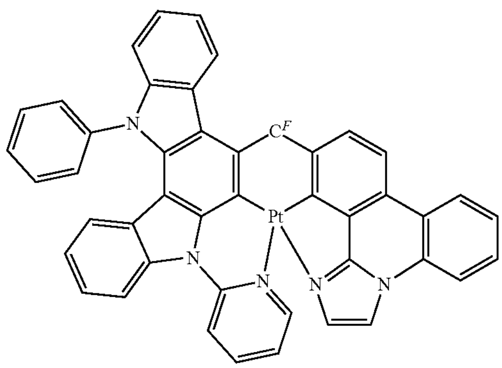
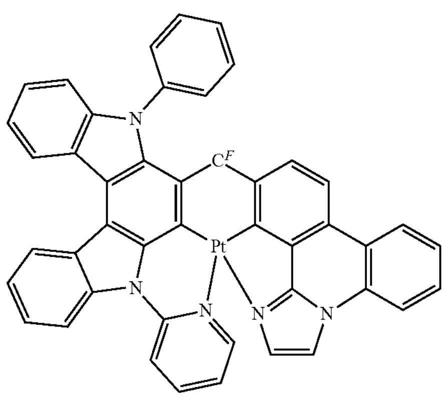
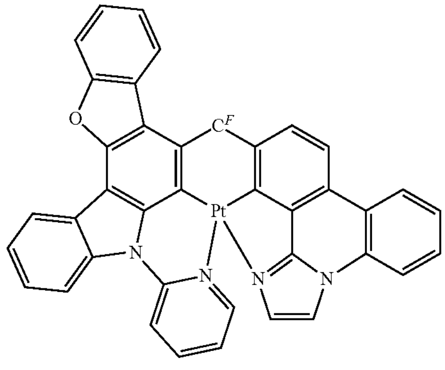
-continued
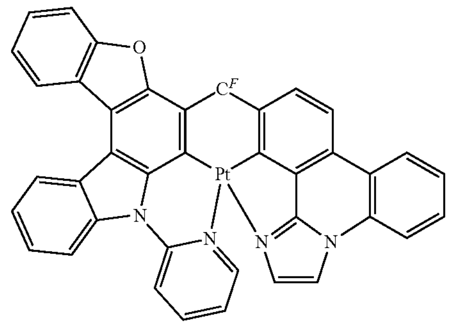
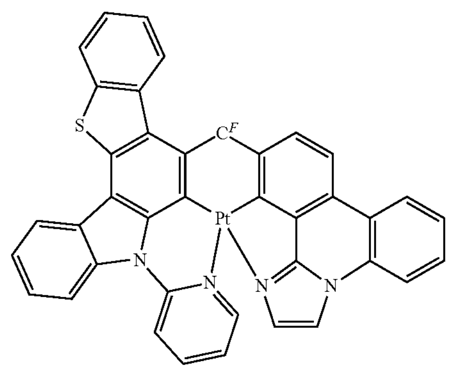
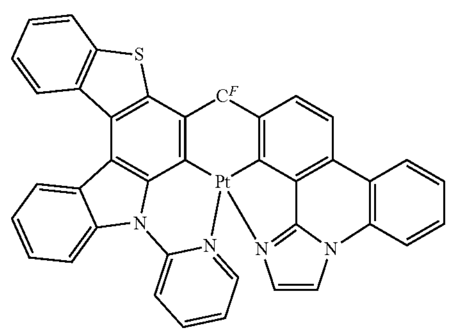
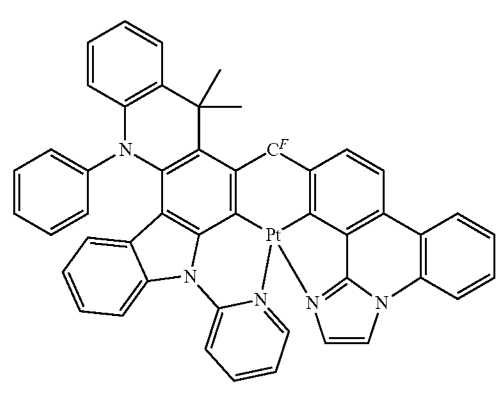

-continued
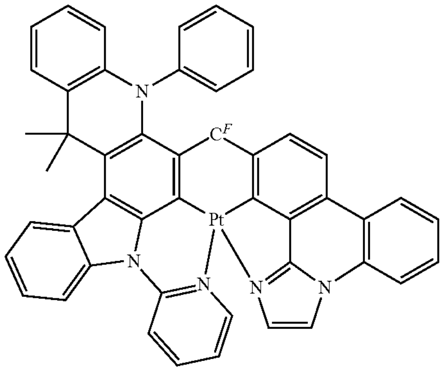
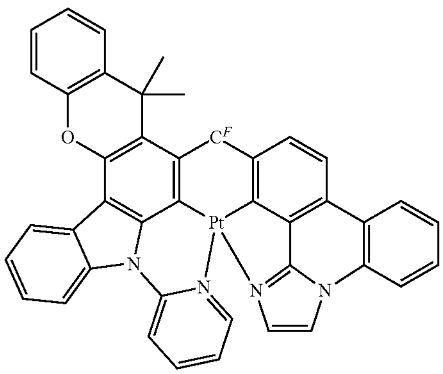
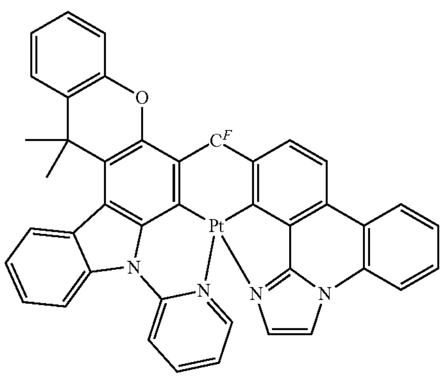
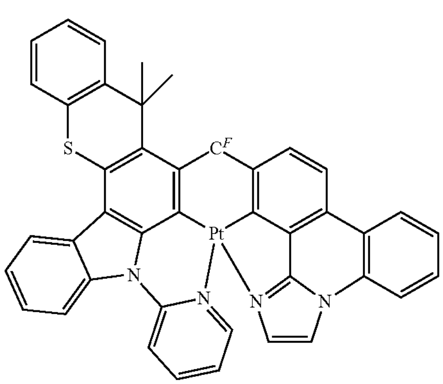
-continued
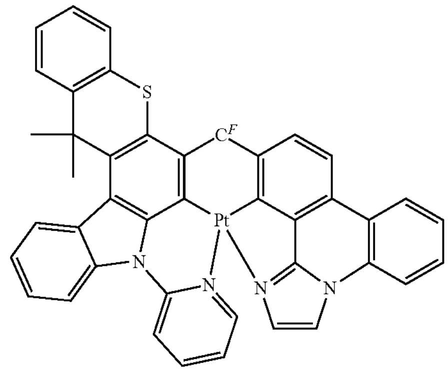
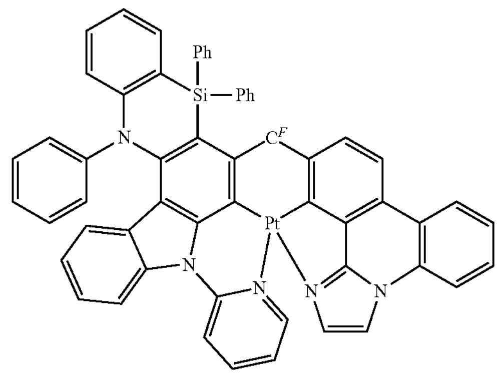
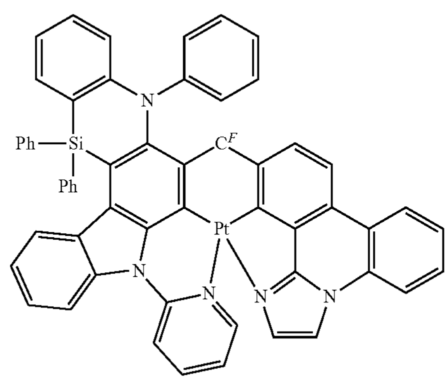
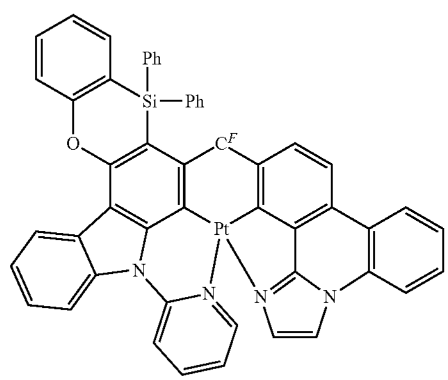

-continued
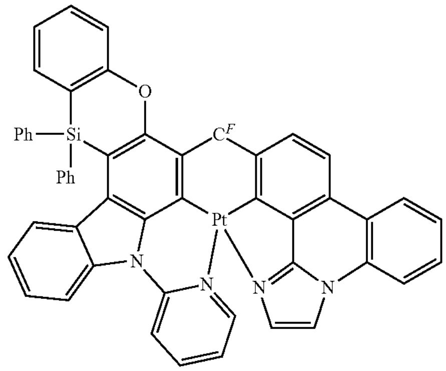
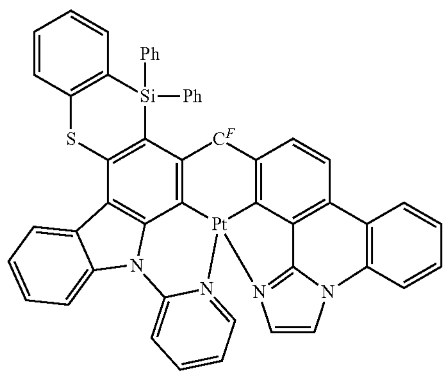
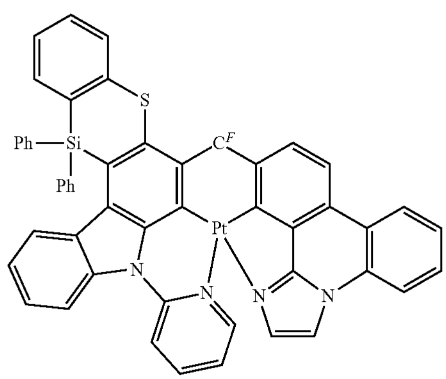
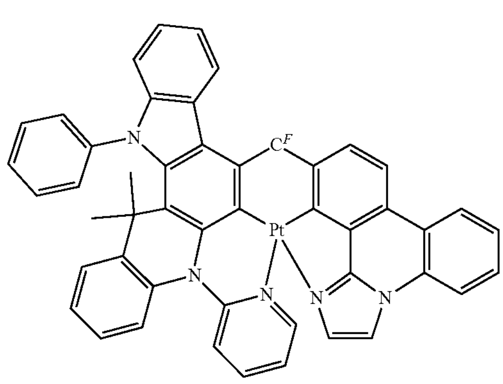
-continued
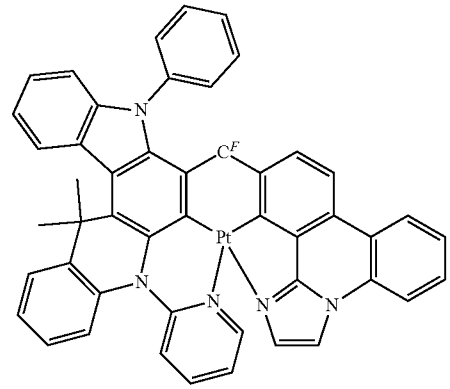
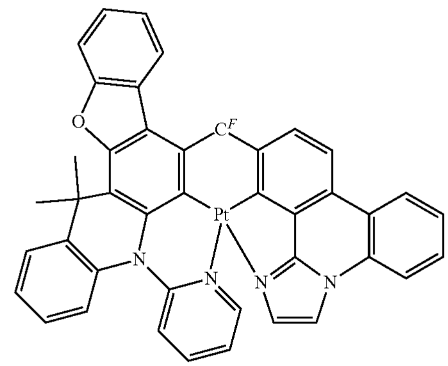
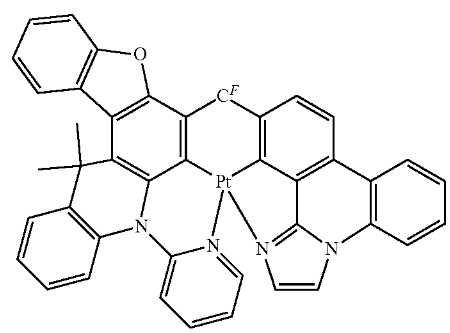
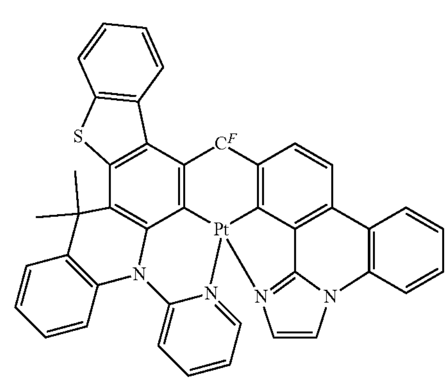

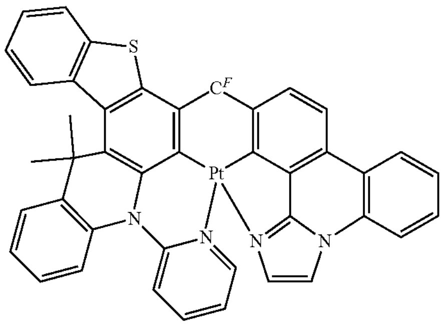
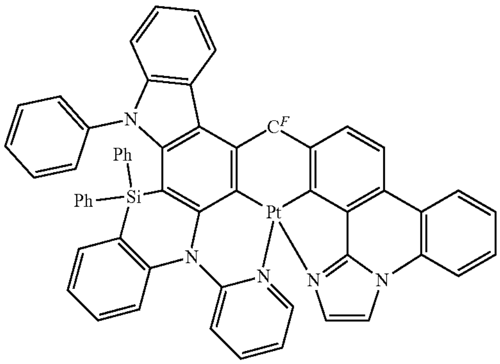
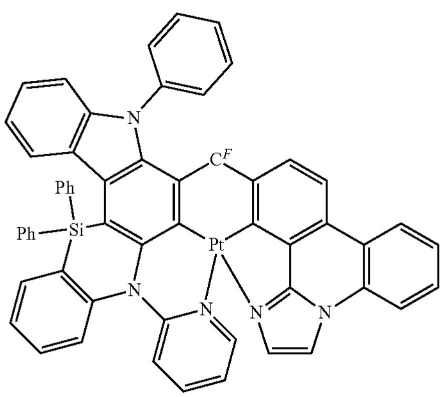
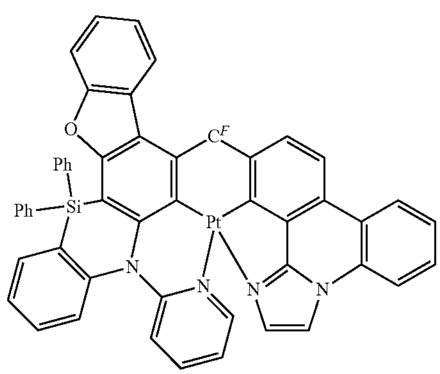
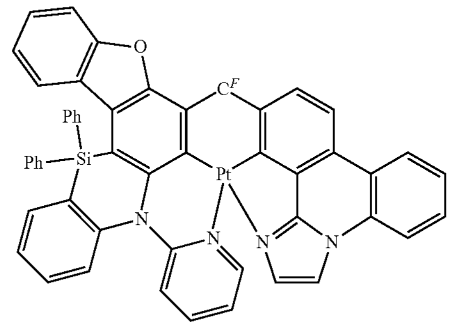
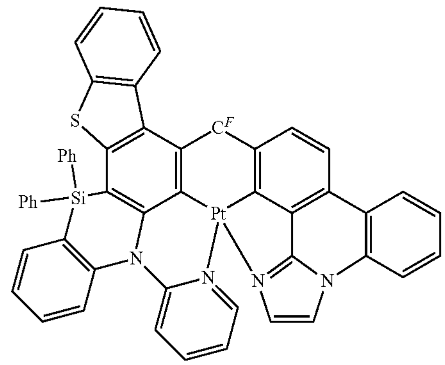
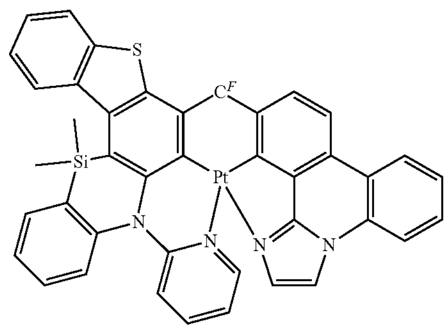
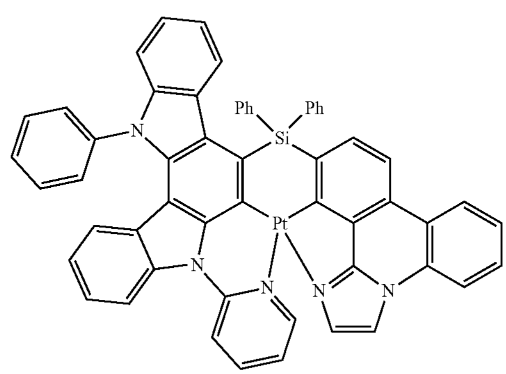

-continued
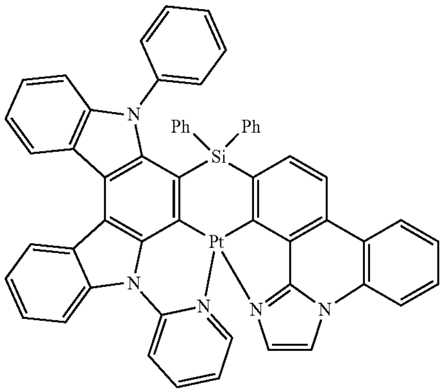
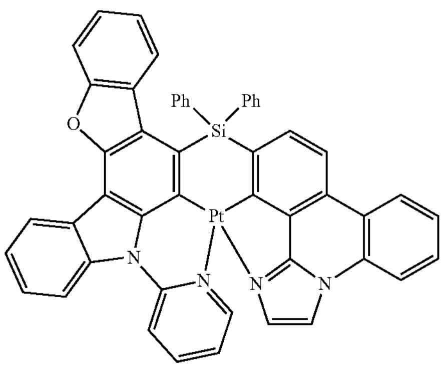
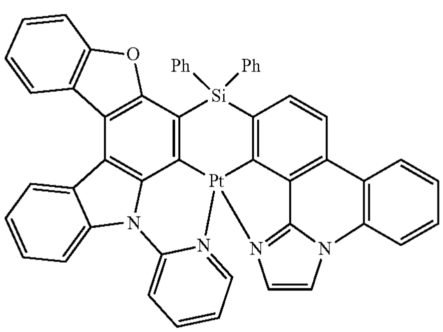
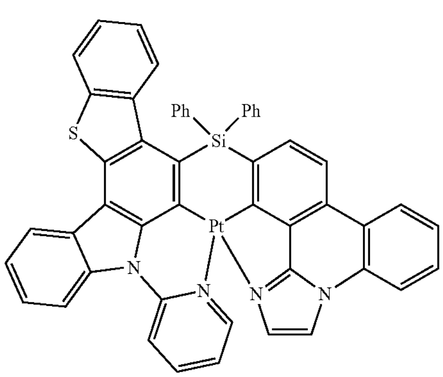
-continued
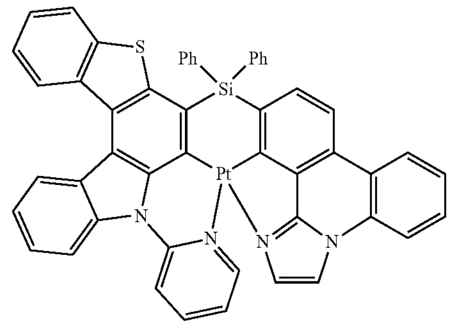
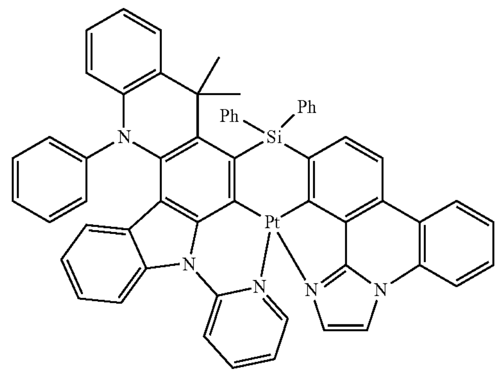
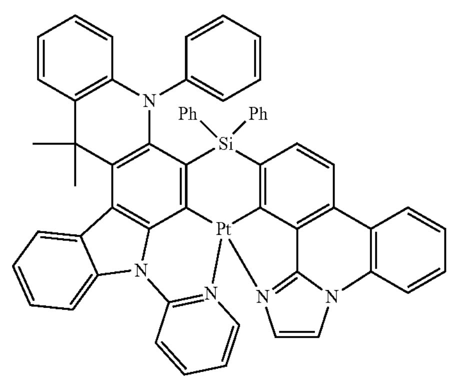
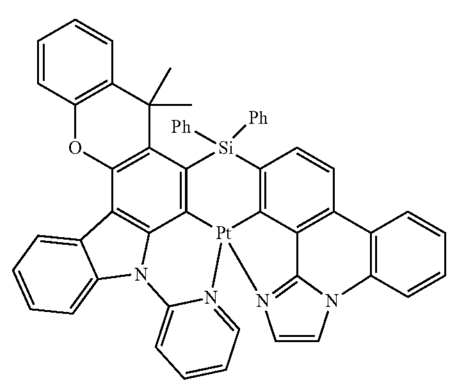

-continued
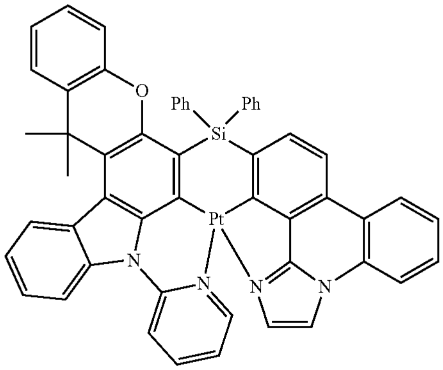
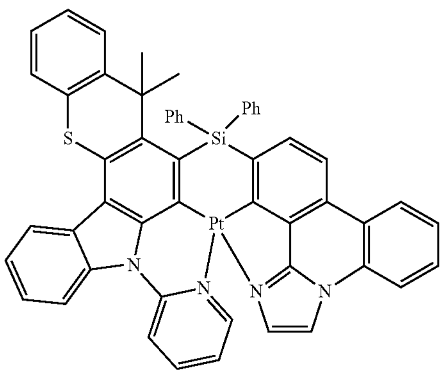
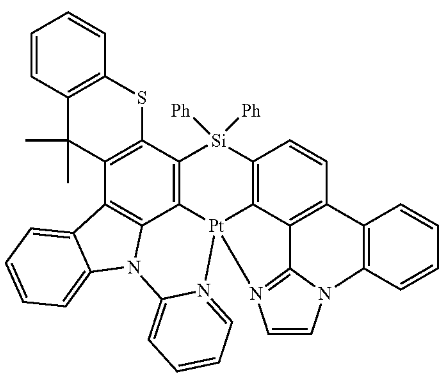
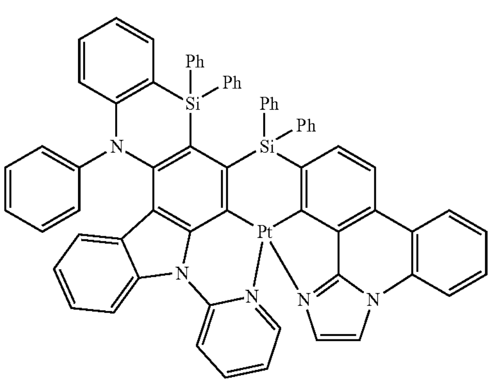
-continued
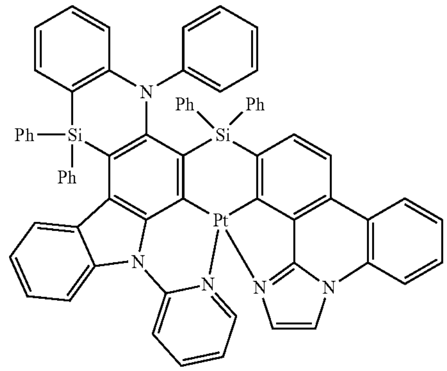
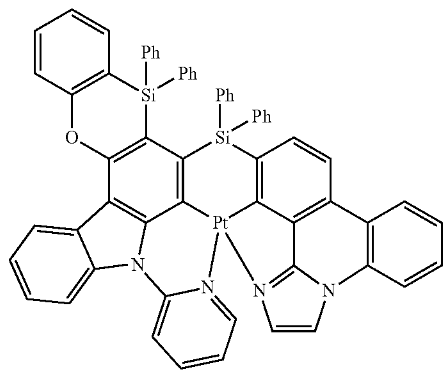
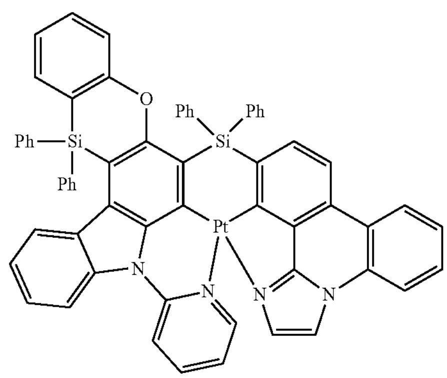
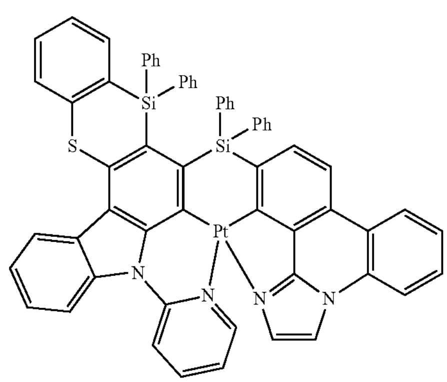

-continued
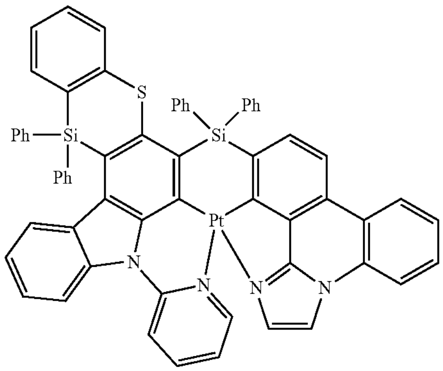
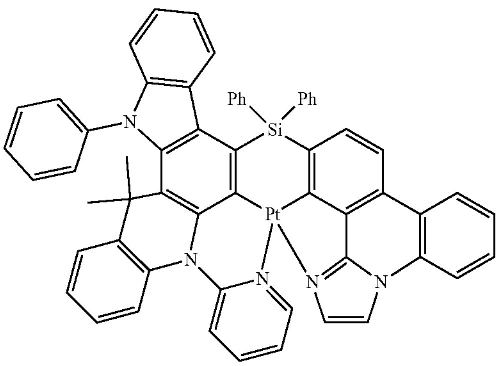
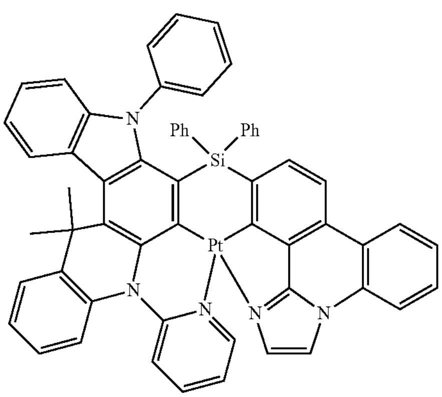
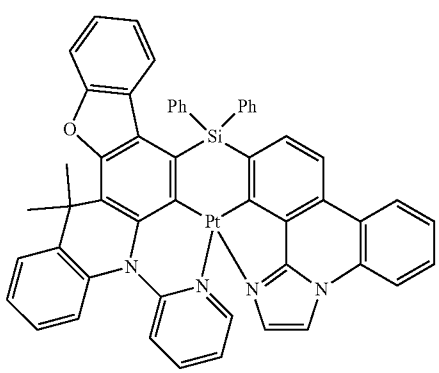
-continued
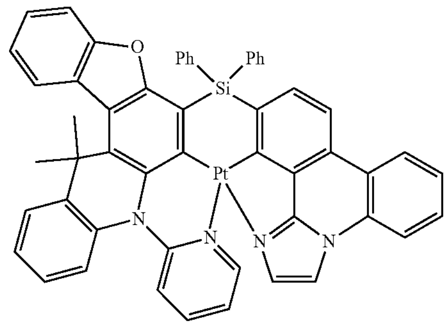
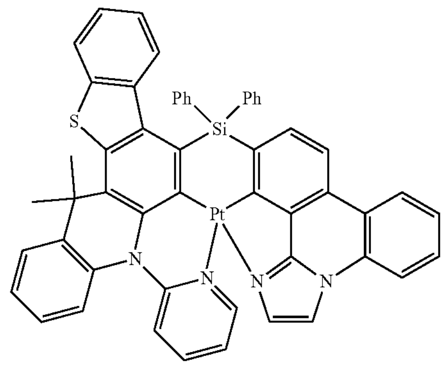
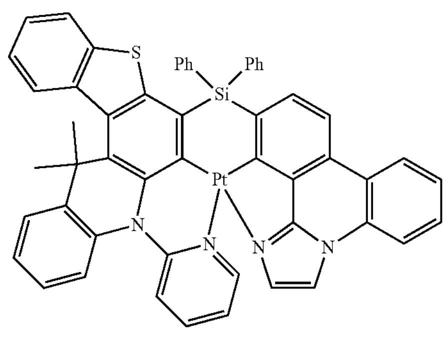
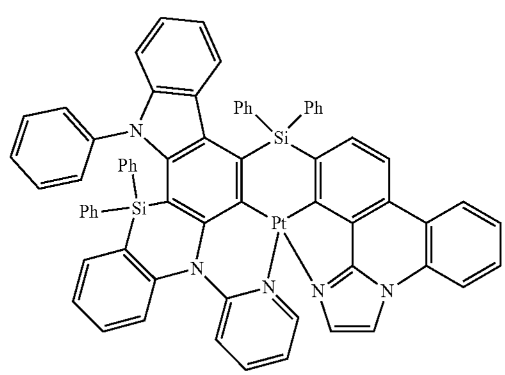

-continued
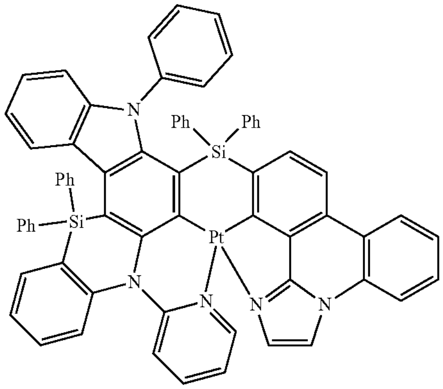
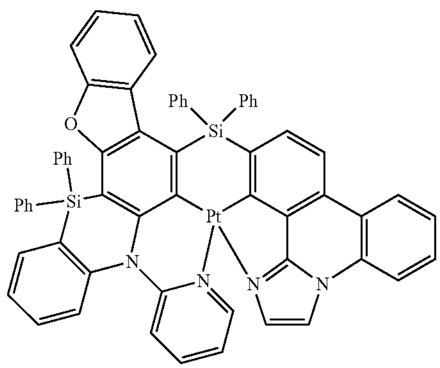
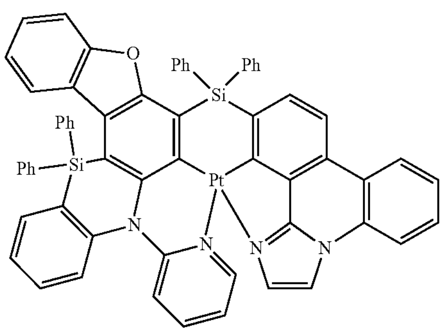
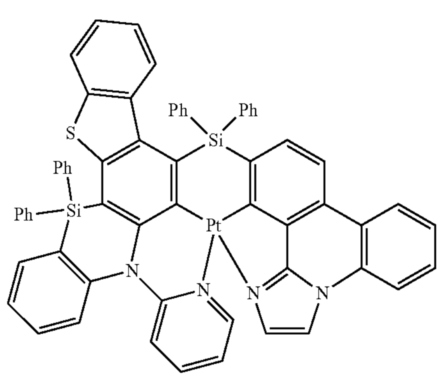
-continued
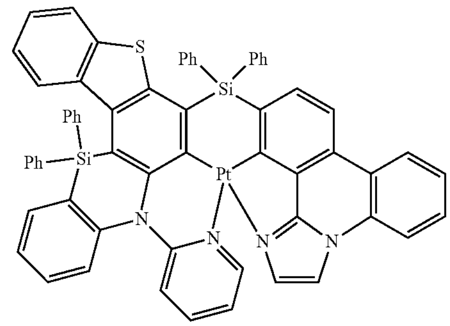
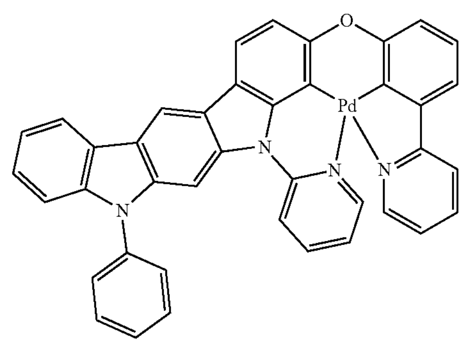
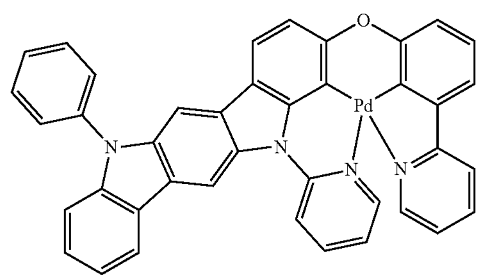
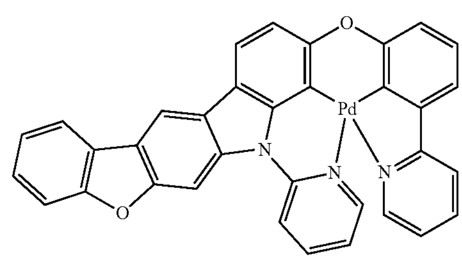
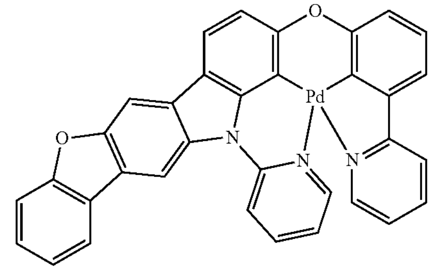

-continued
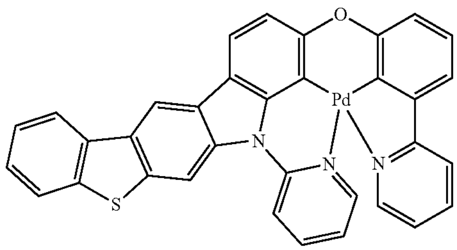
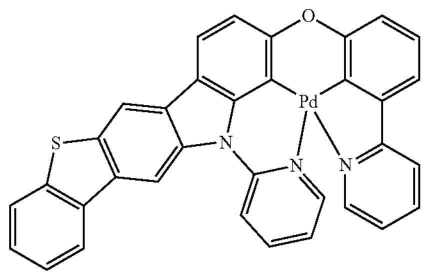
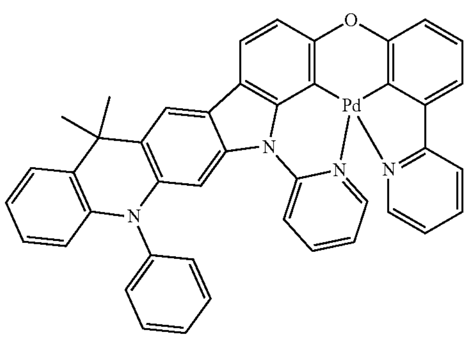
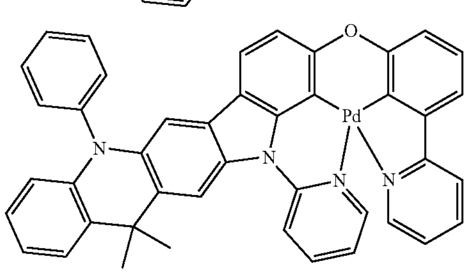
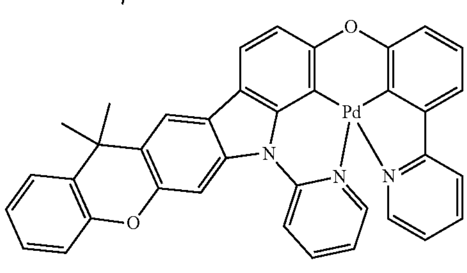
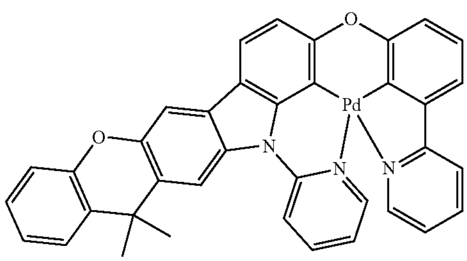
-continued
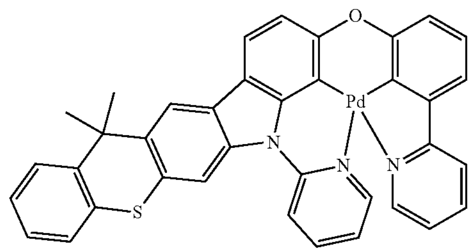
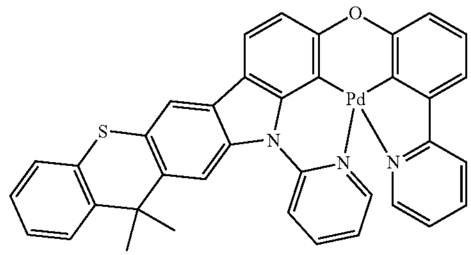
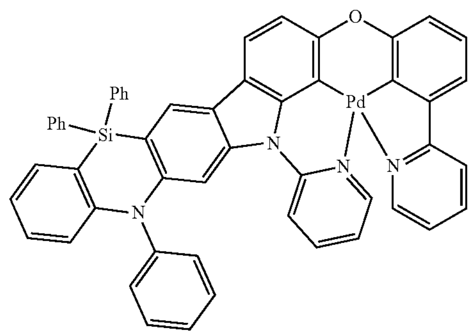
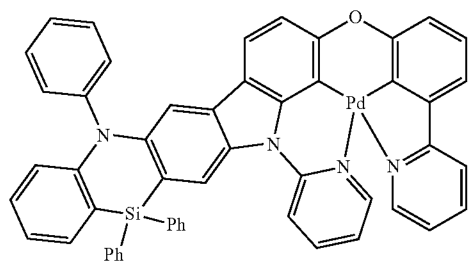
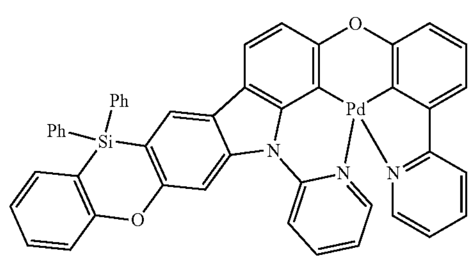
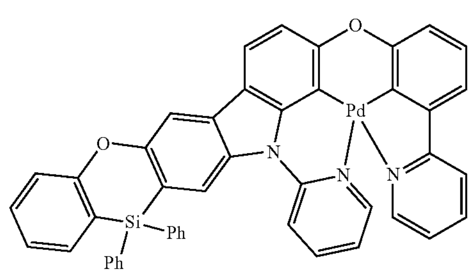

-continued
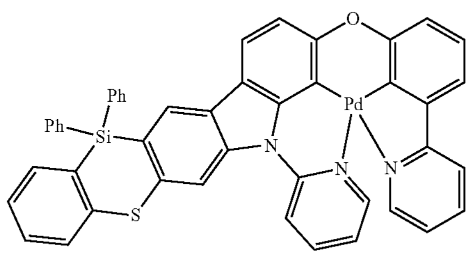
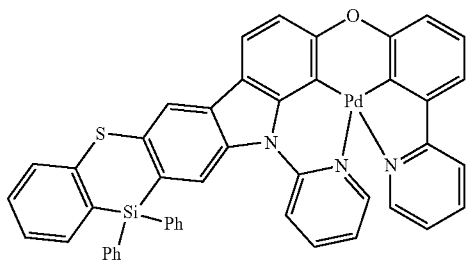
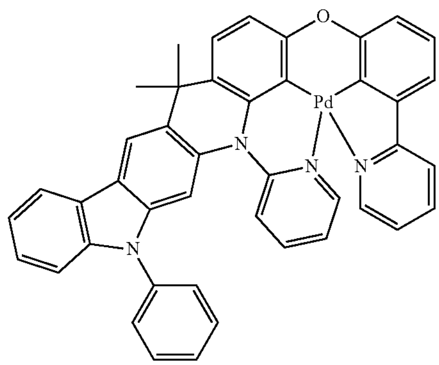
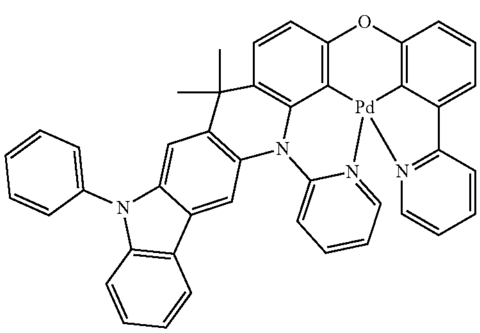
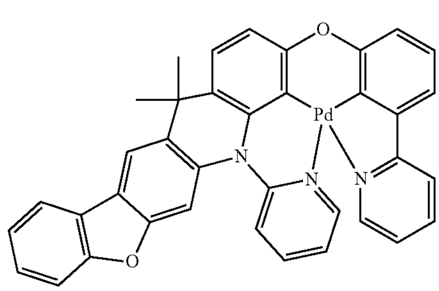
-continued
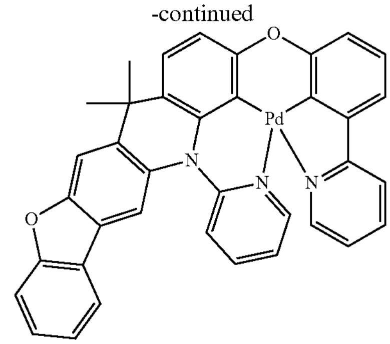
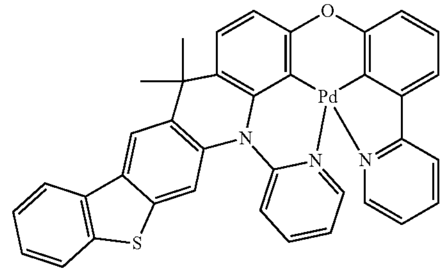
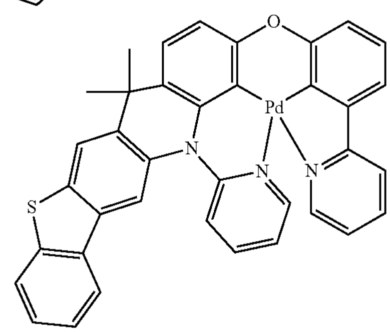
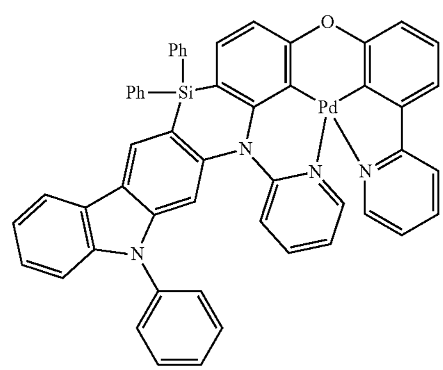
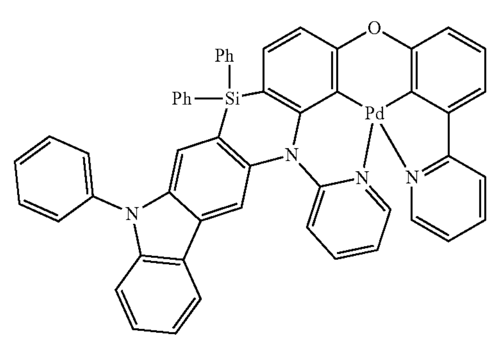

-continued
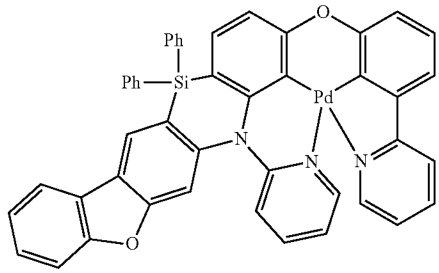
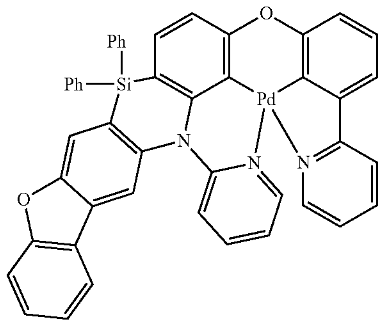
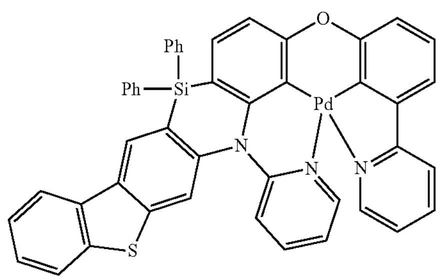
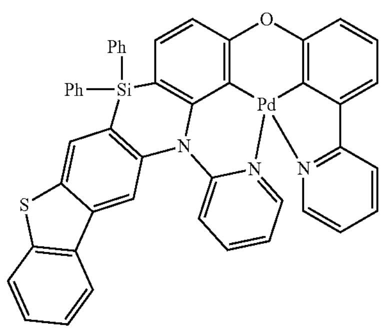
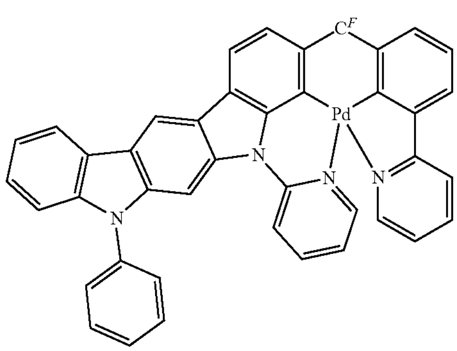
-continued
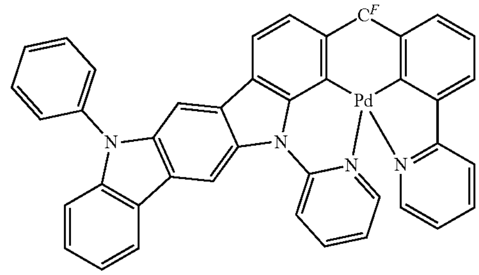
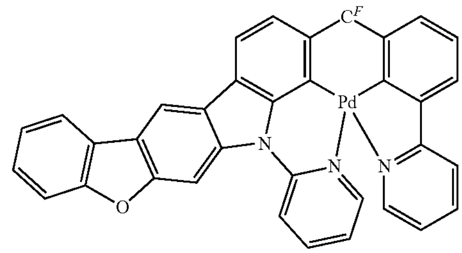
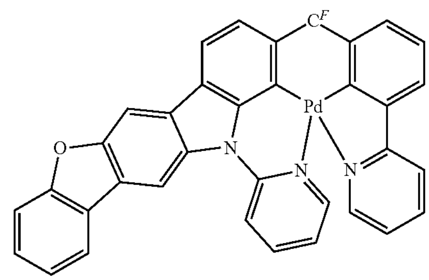
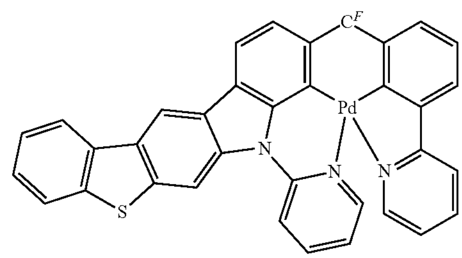
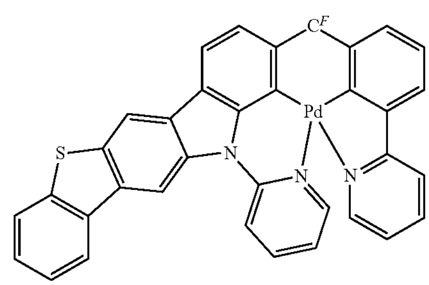
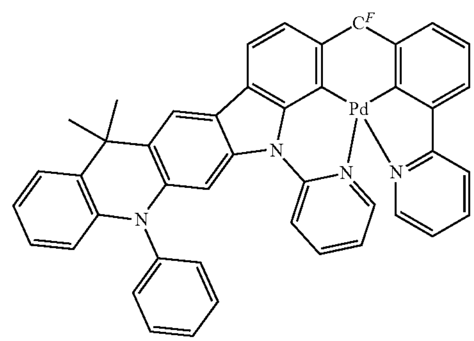

-continued
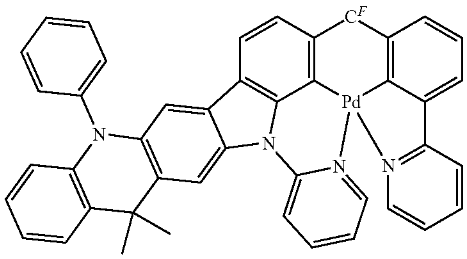
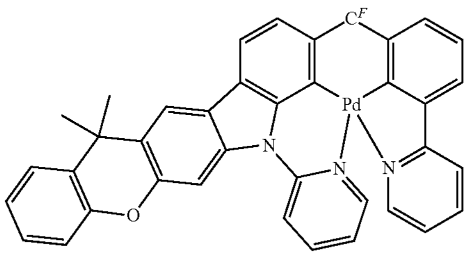
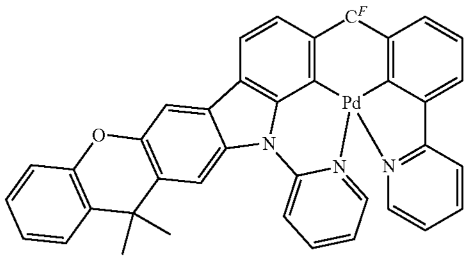
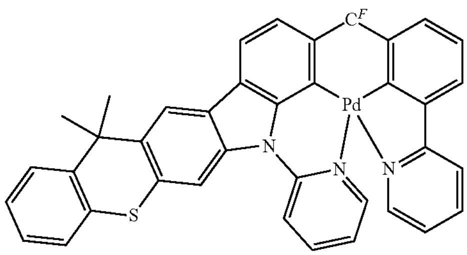
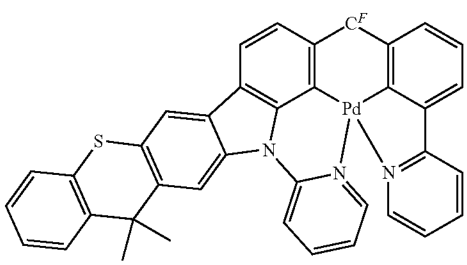
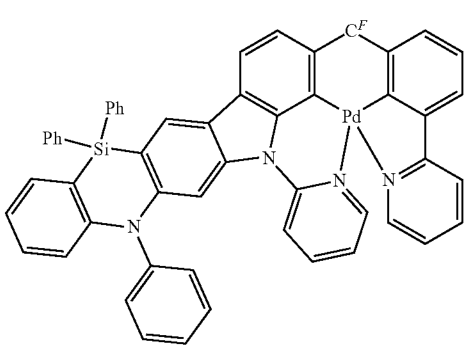
-continued
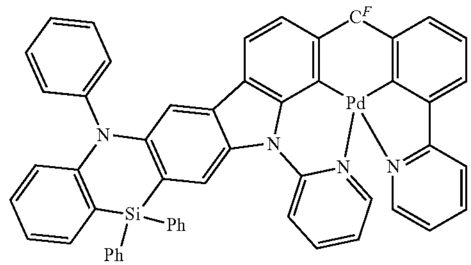
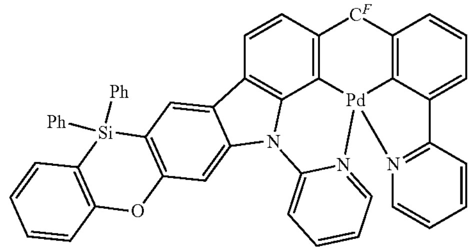
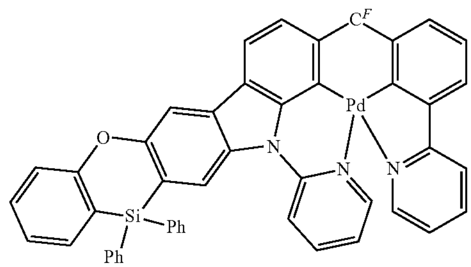
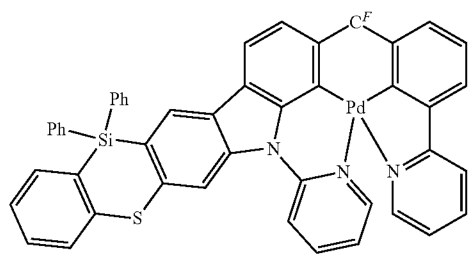
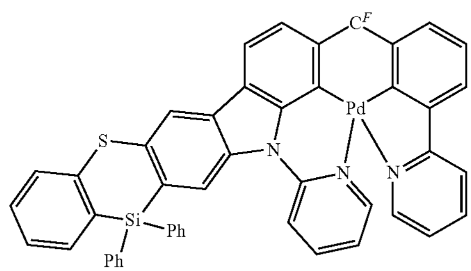
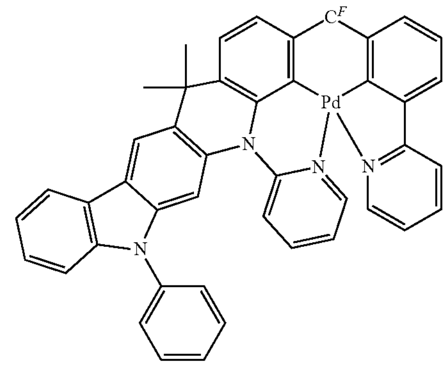

-continued
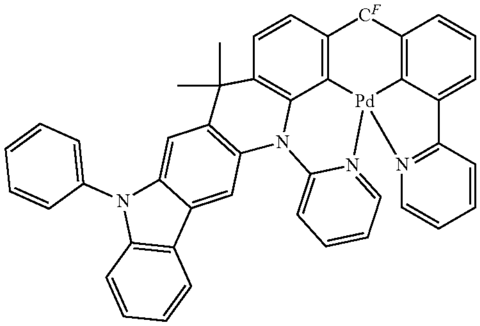
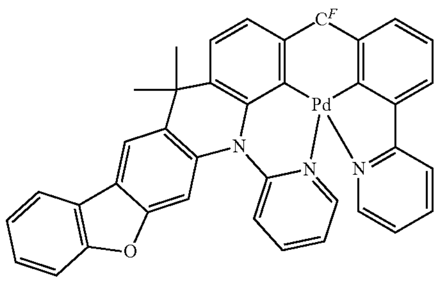
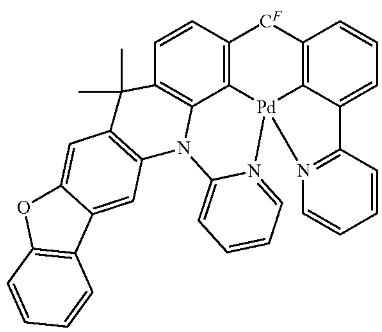
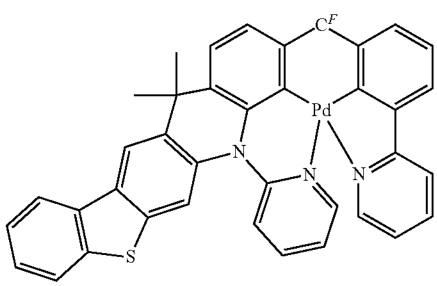
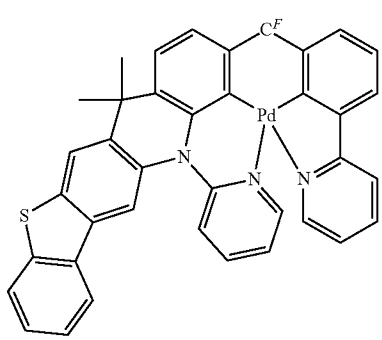
-continued
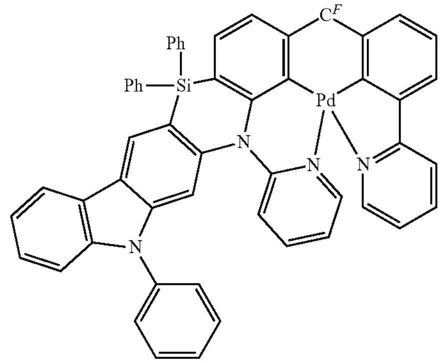
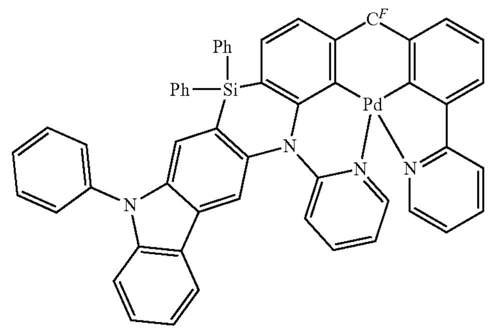
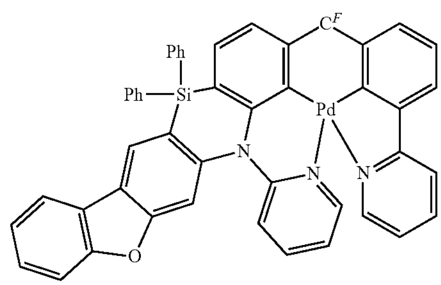
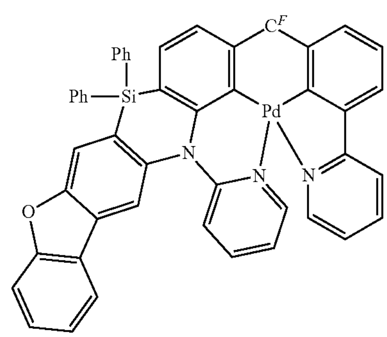
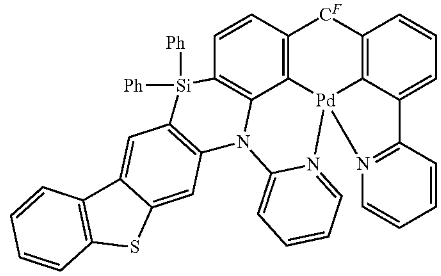

-continued
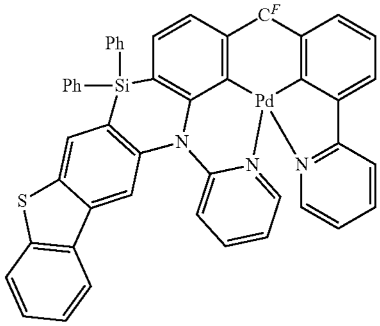
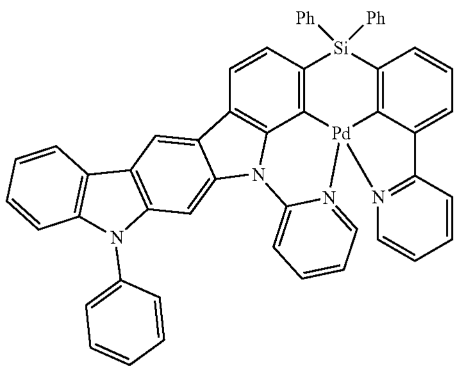
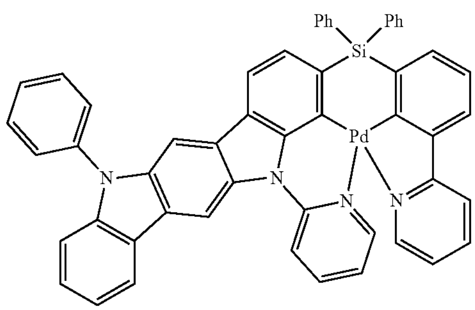
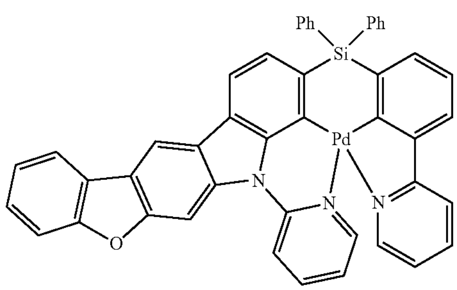
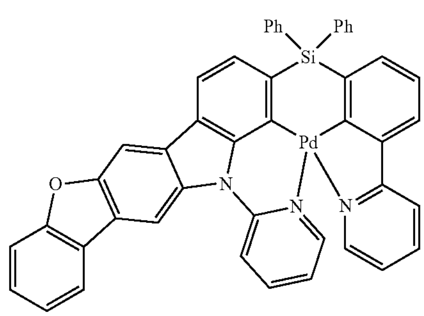
-continued
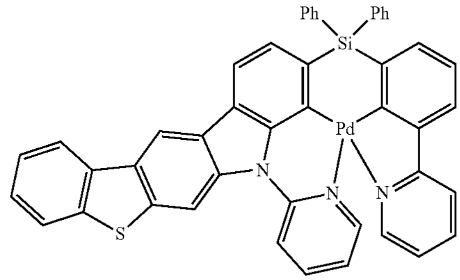
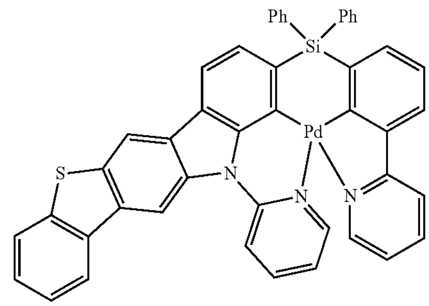
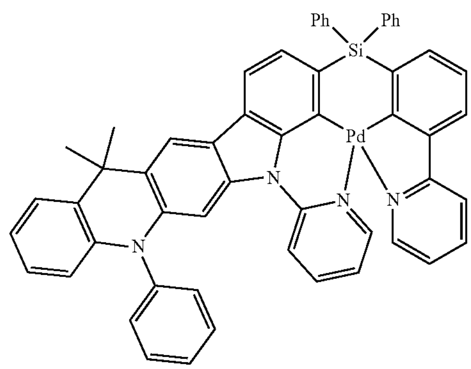
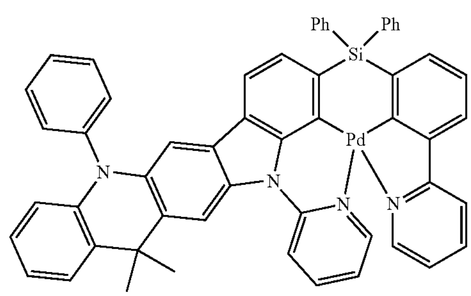
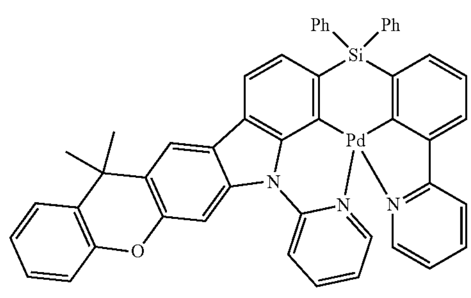

-continued
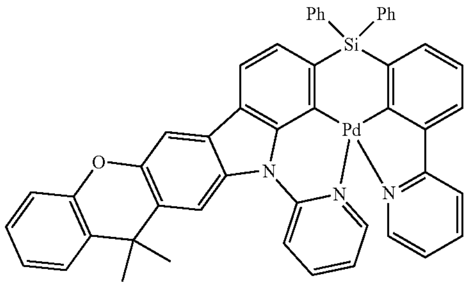
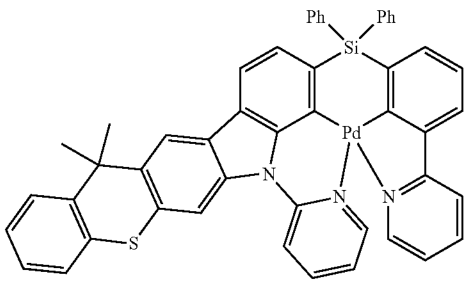
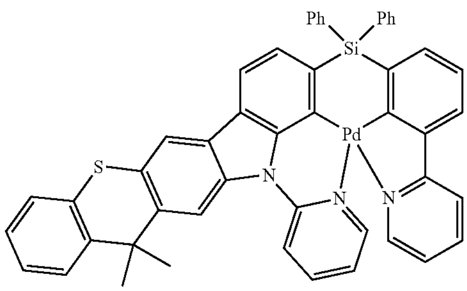
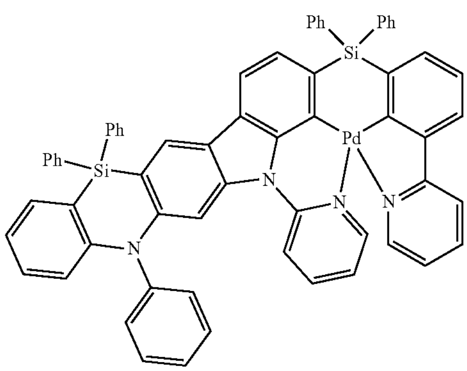
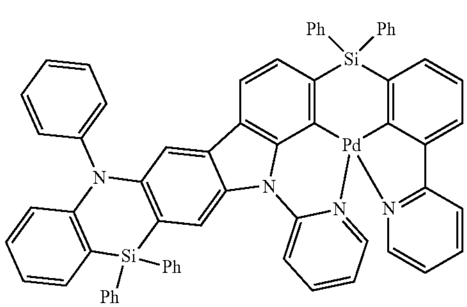
-continued
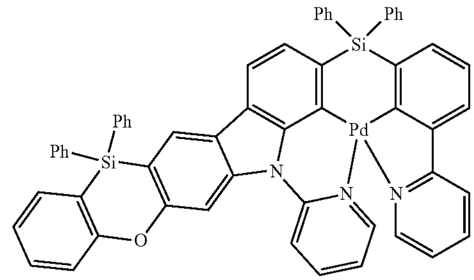
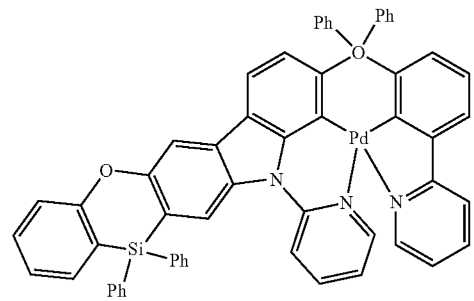
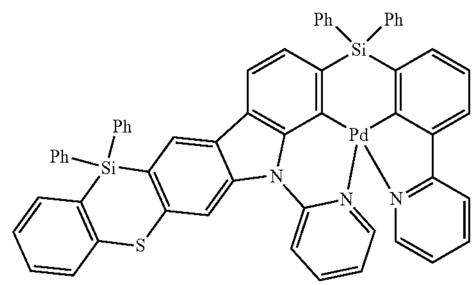
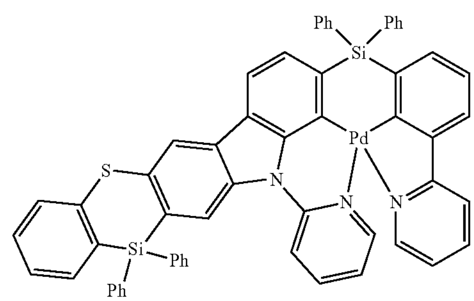
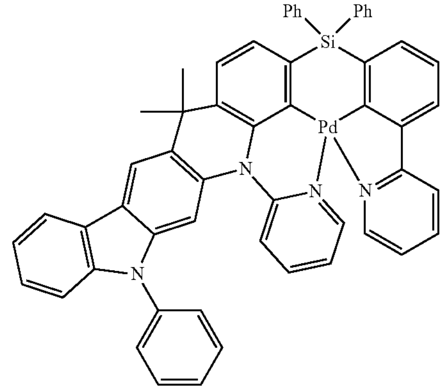

-continued
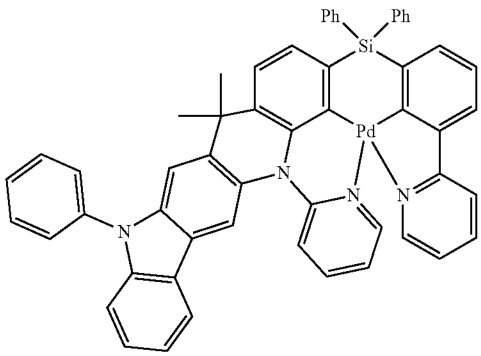
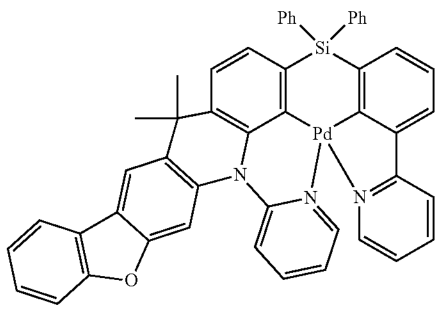
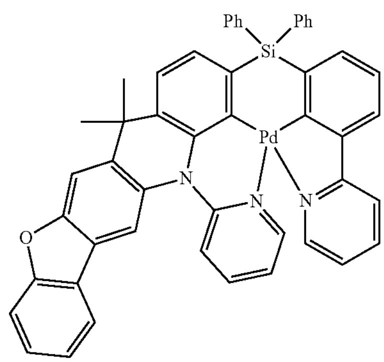
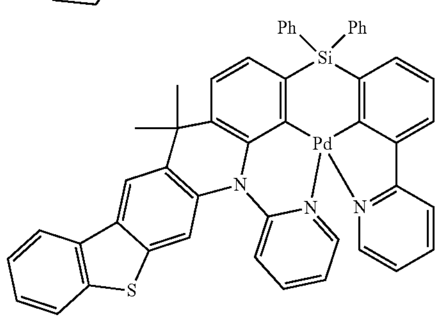
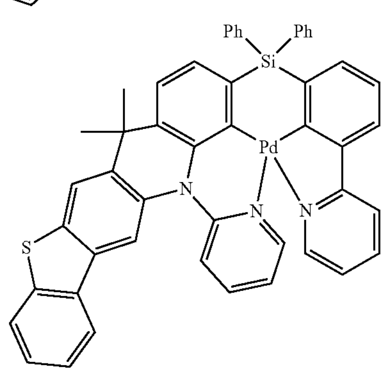
-continued
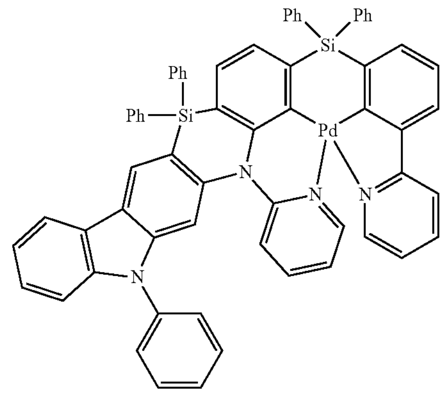
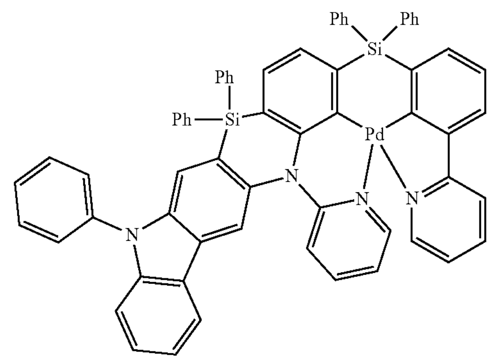
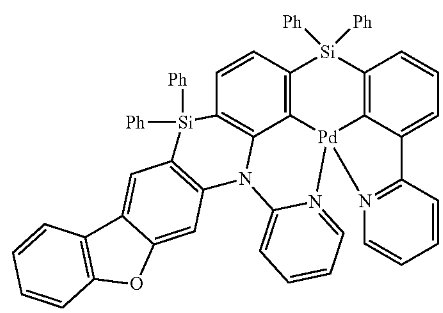
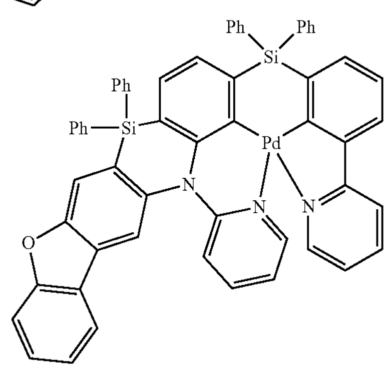
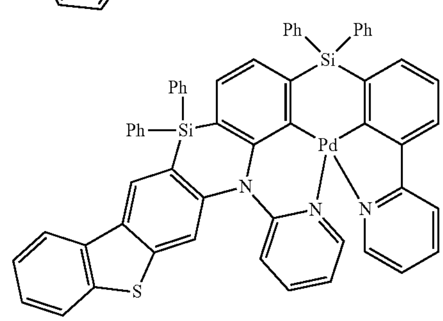

-continued
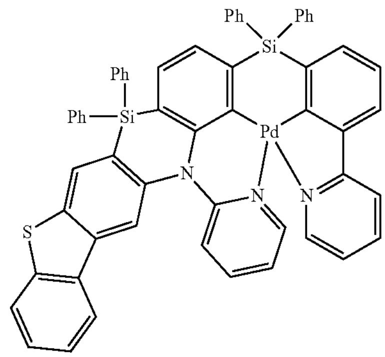
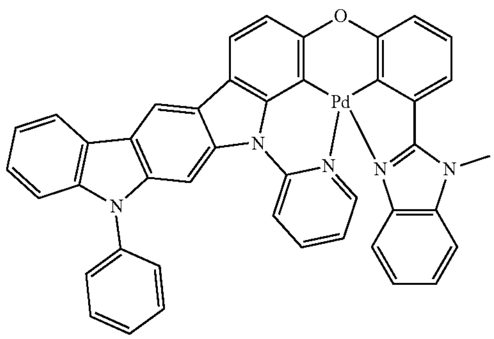
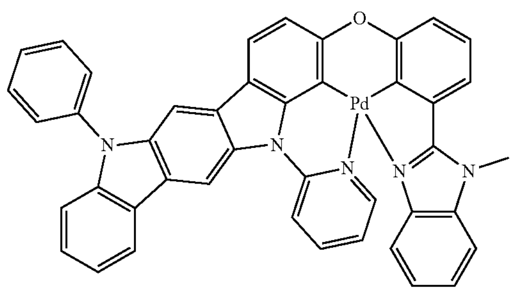
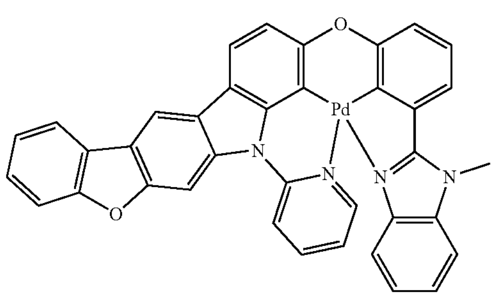
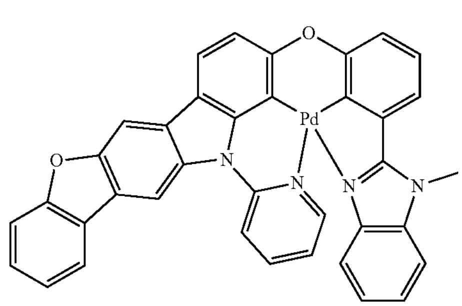
-continued
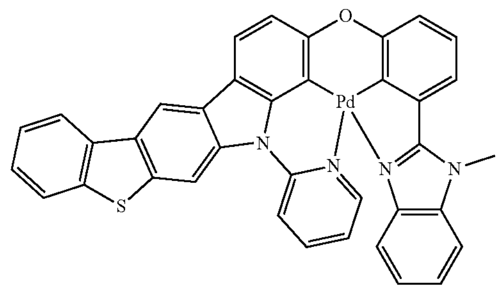
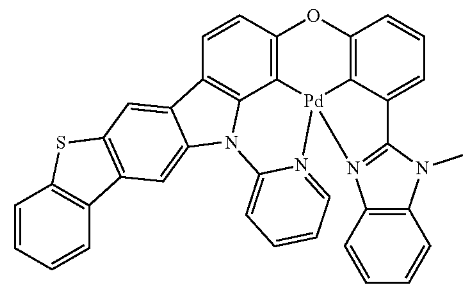
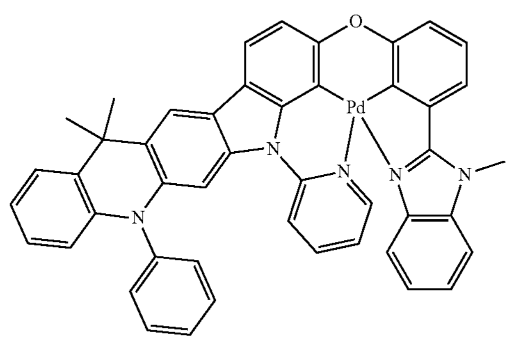
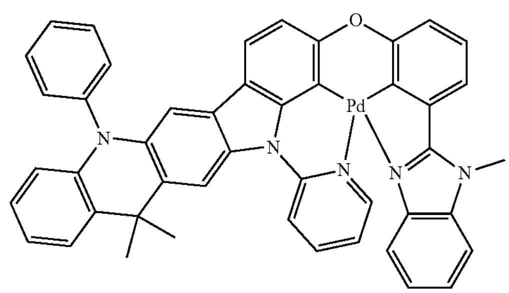
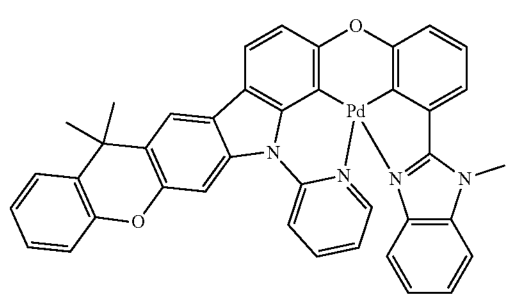

-continued
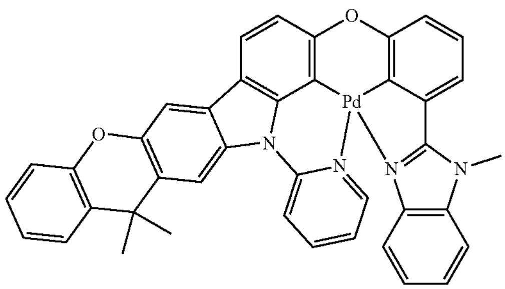
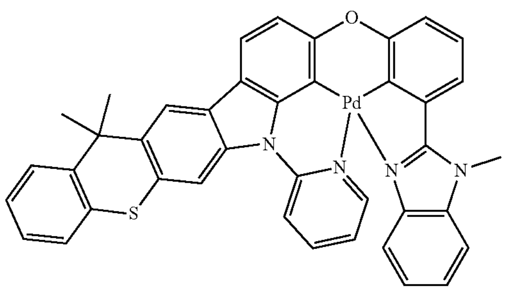
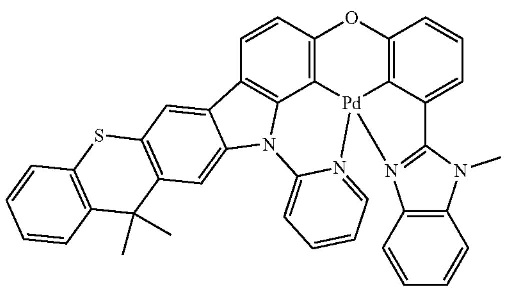
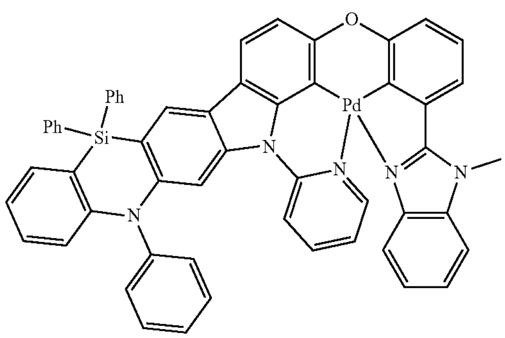
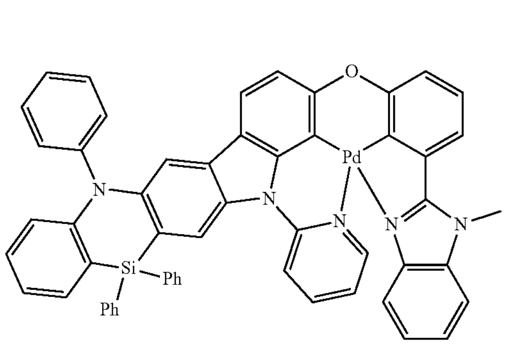
-continued
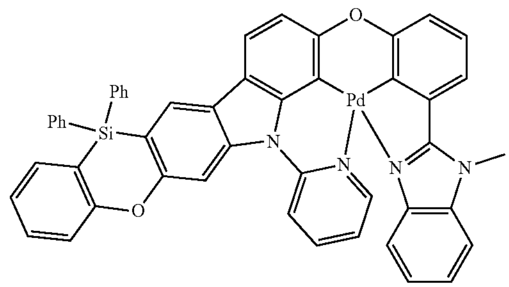
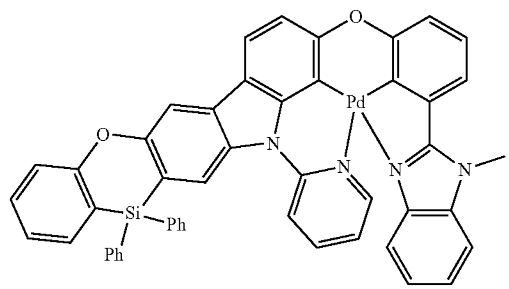
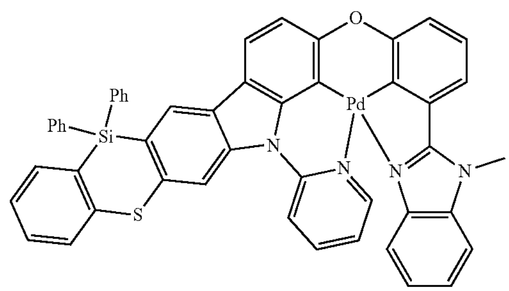
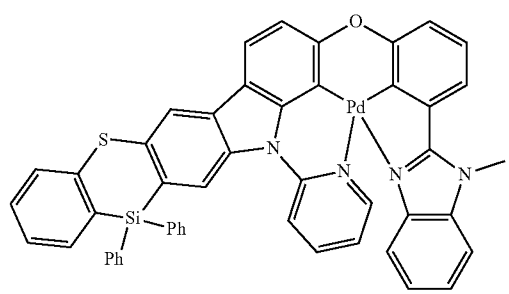
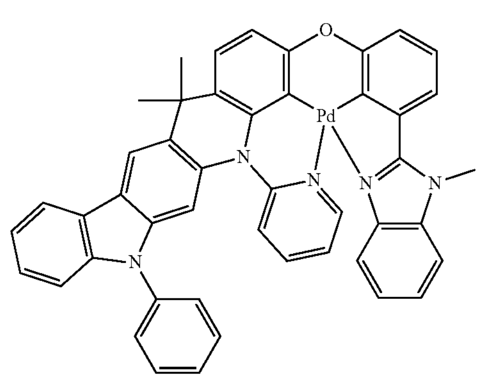

-continued
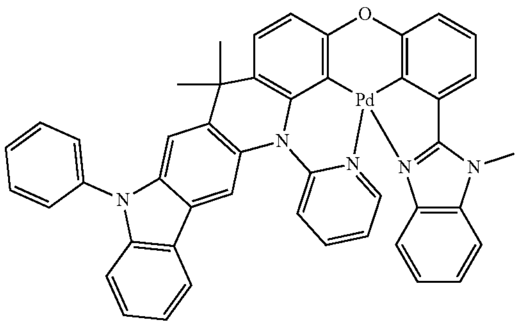
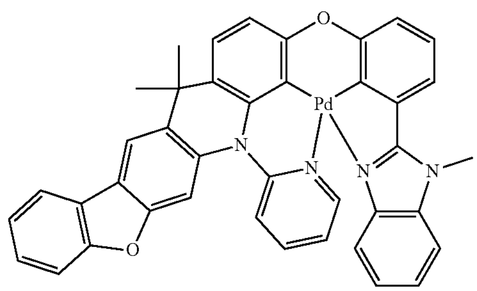
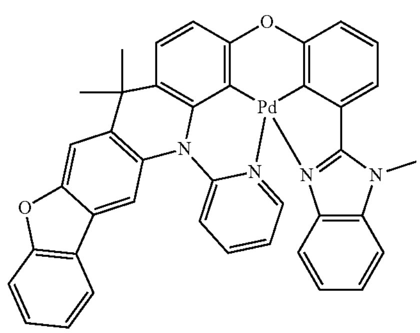
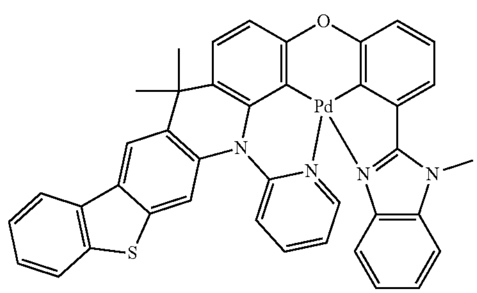
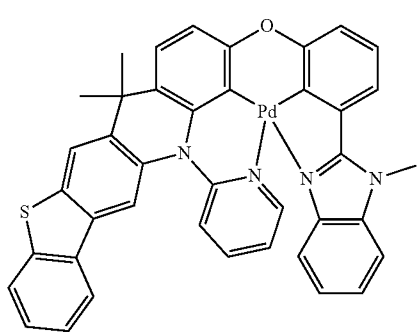
-continued
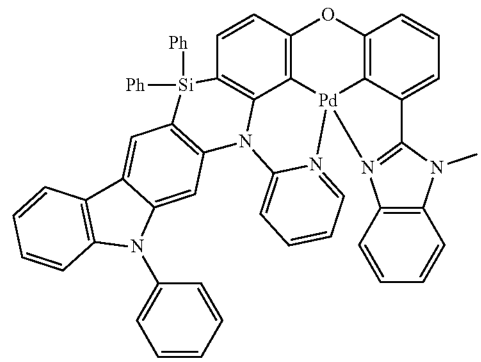
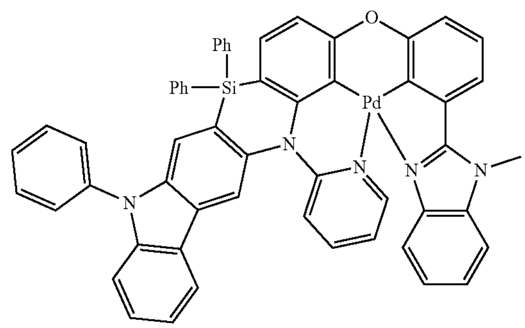
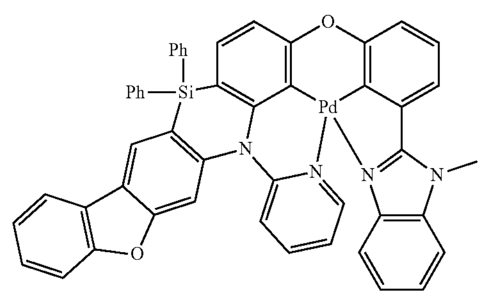
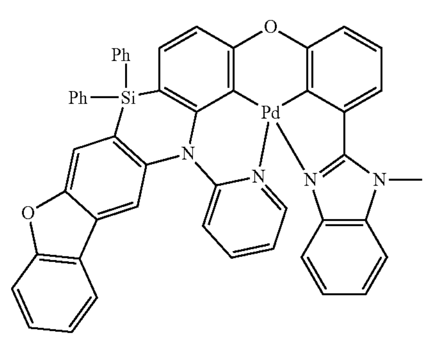
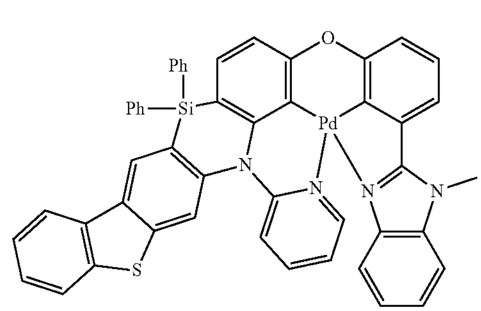

-continued
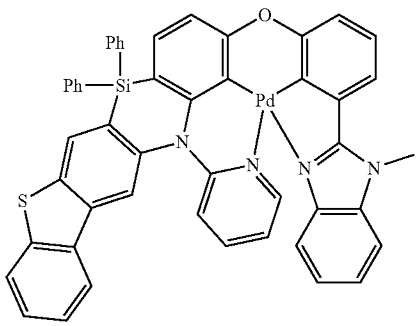
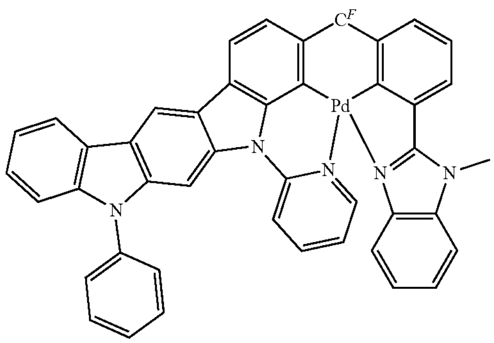
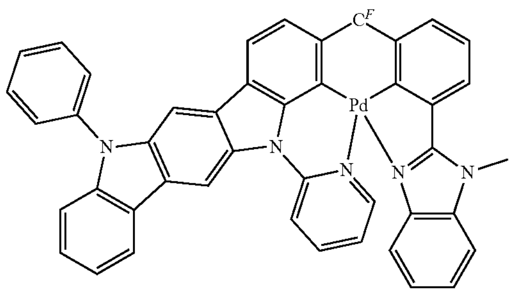
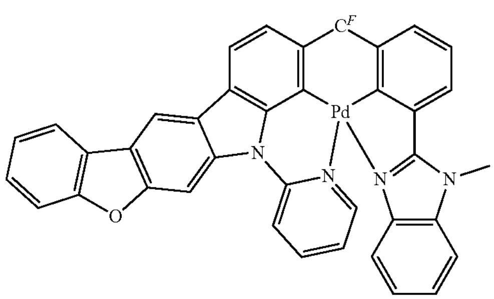
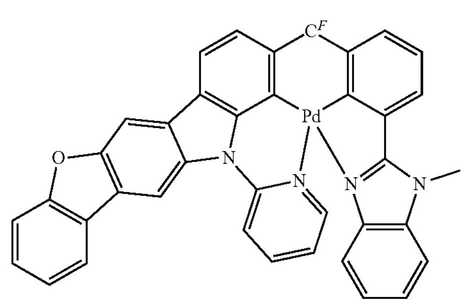
-continued
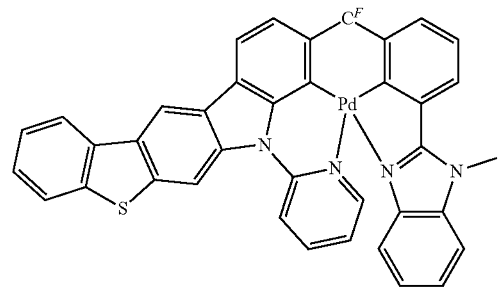
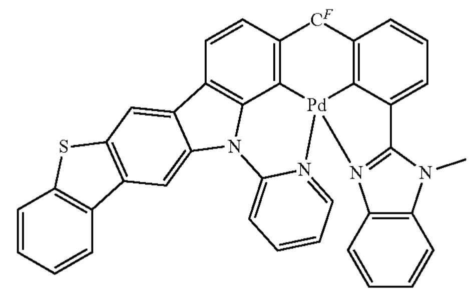
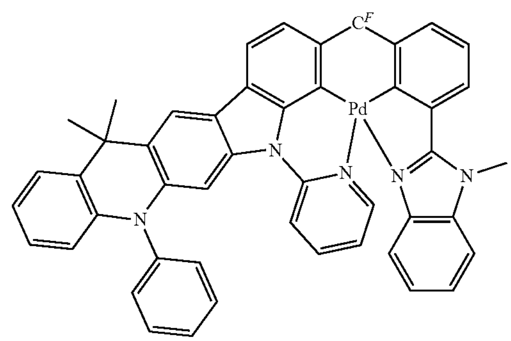
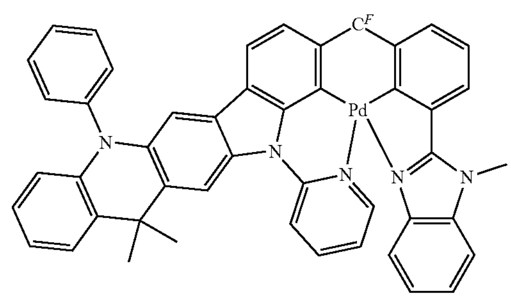
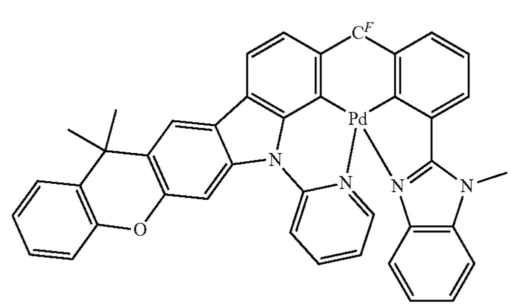

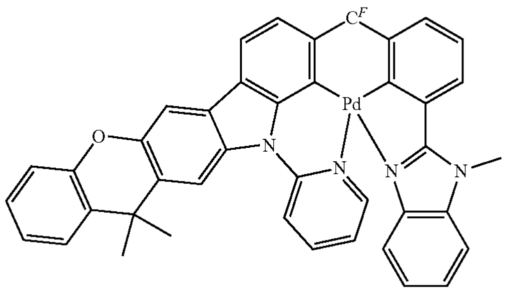
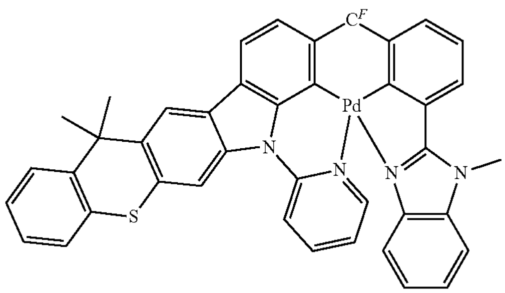
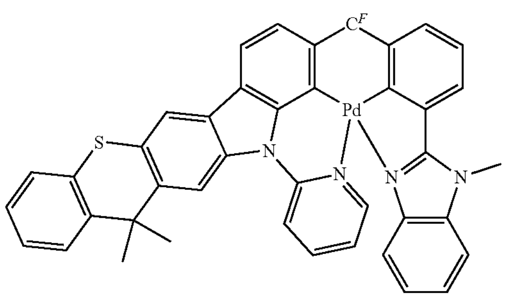
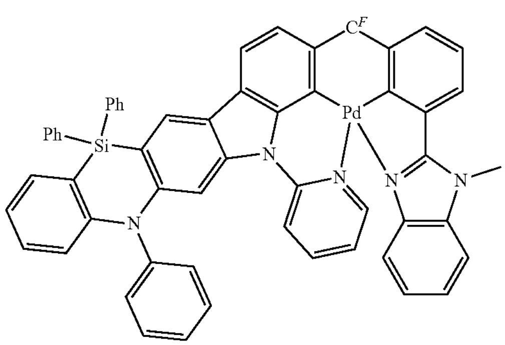
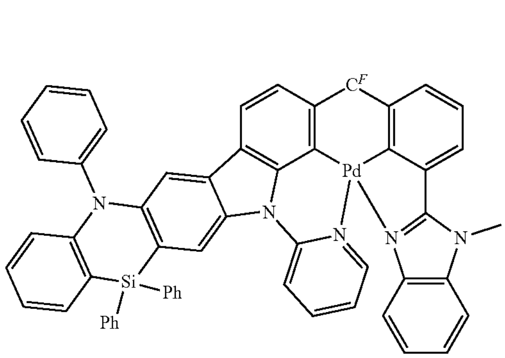
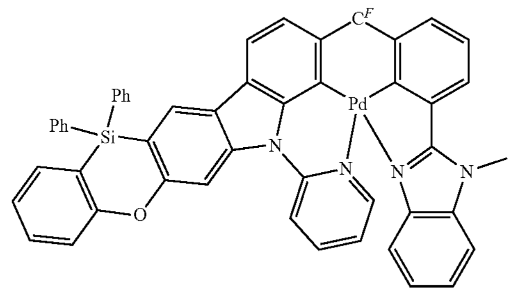
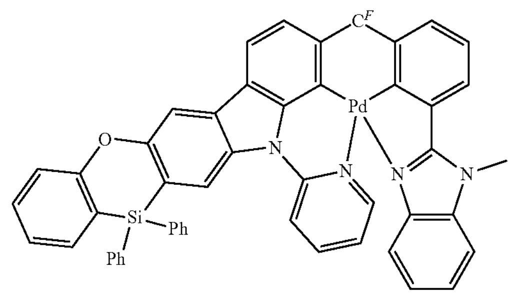
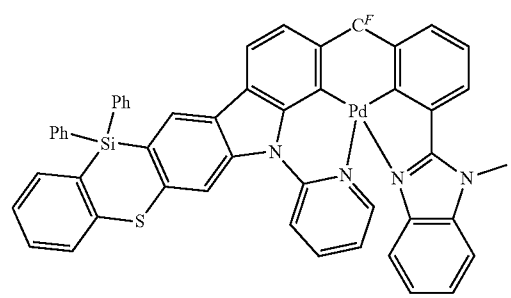
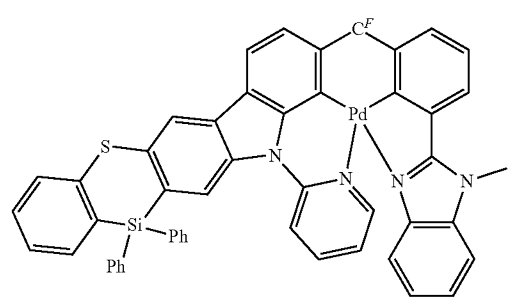
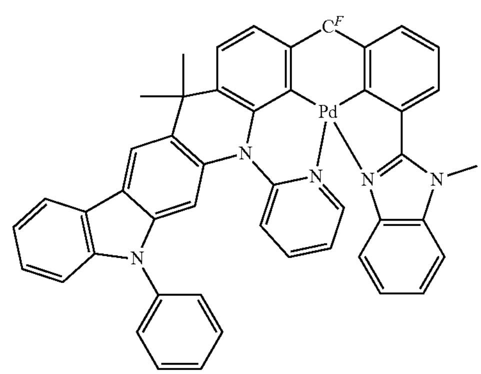

-continued
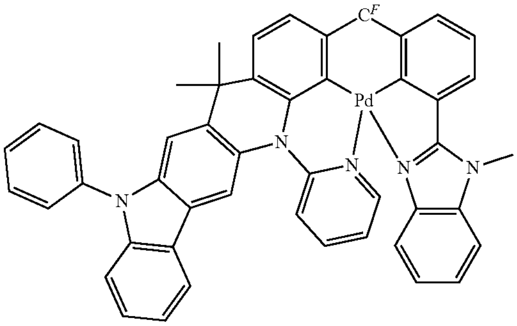
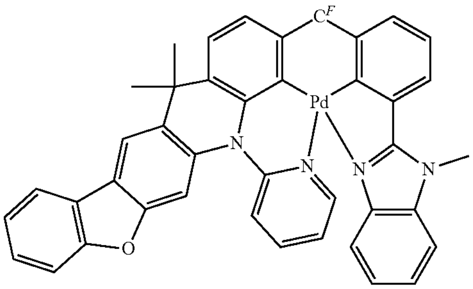
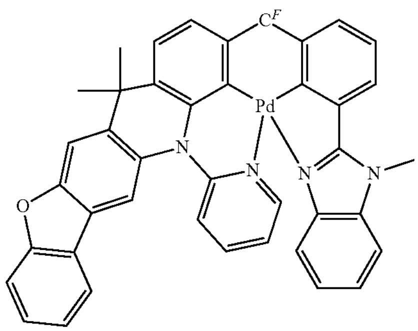
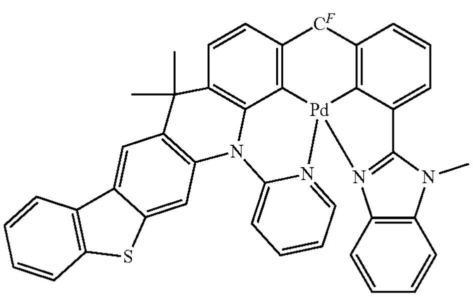
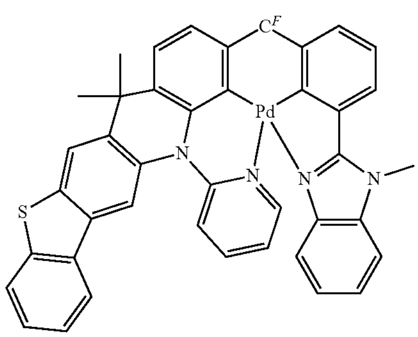
-continued
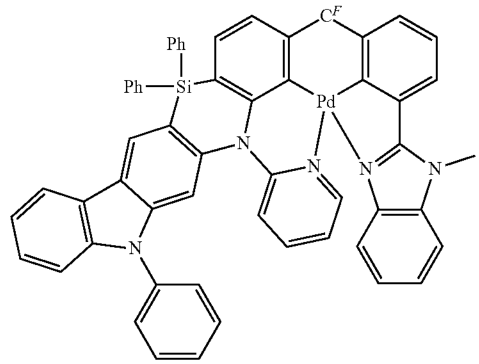
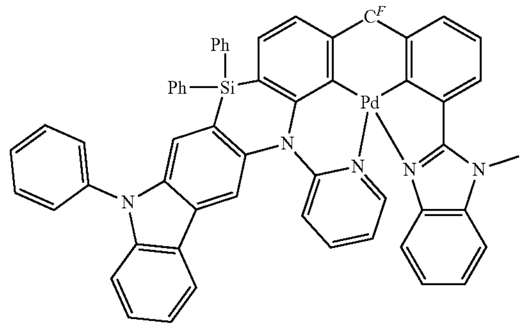
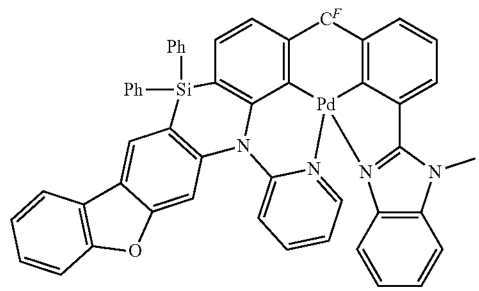
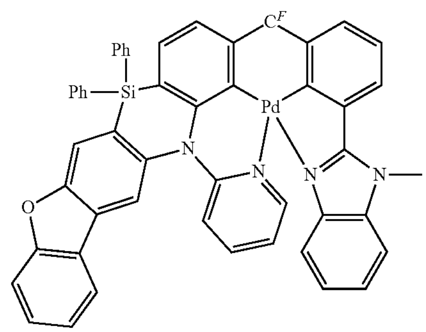
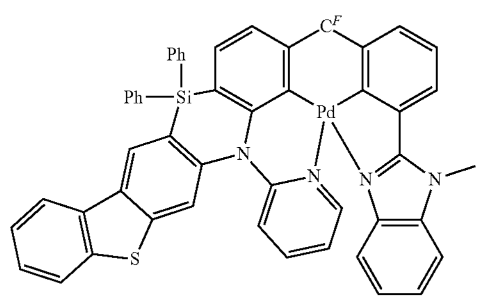

-continued
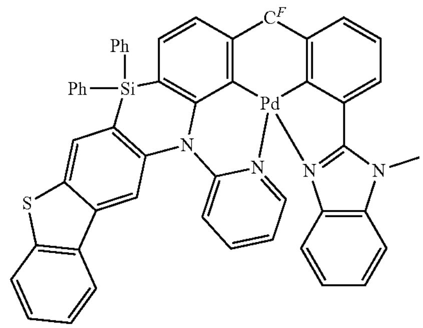
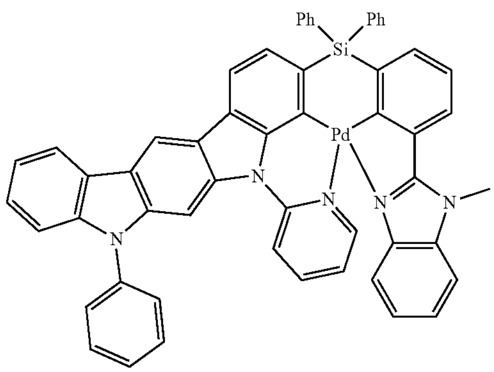
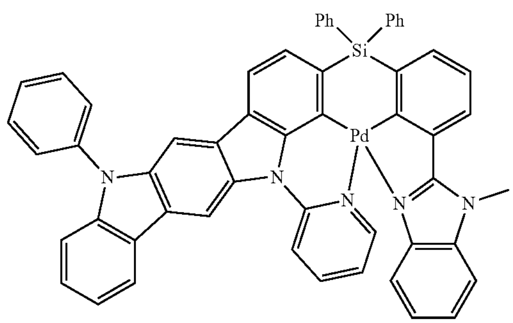
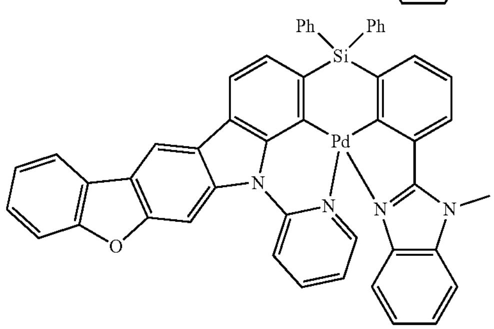
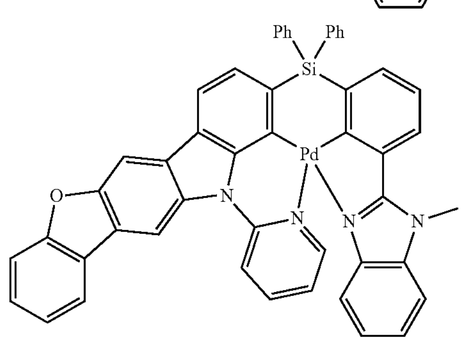
-continued
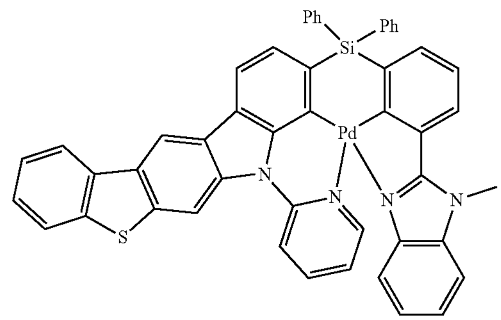
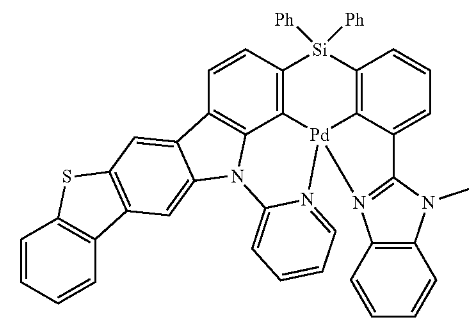
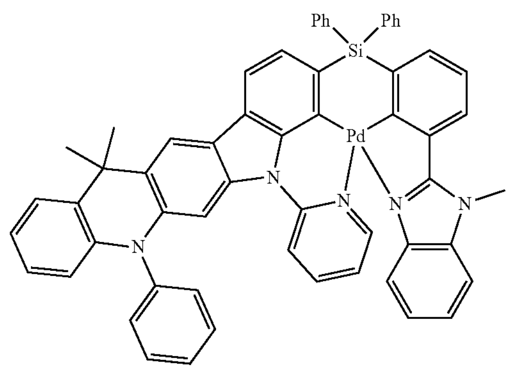
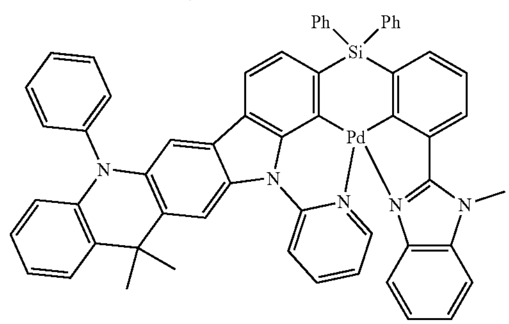
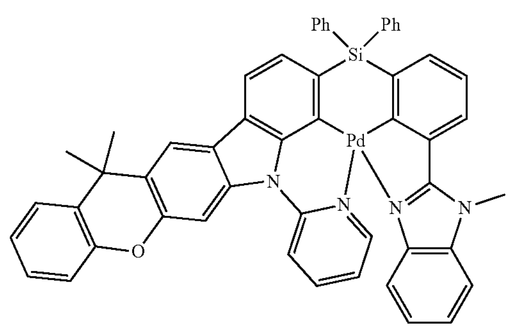

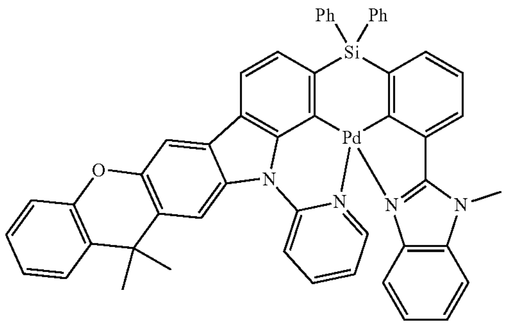
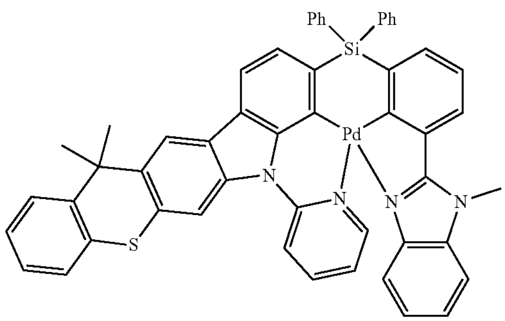
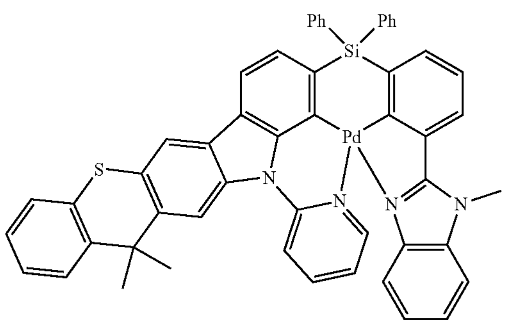
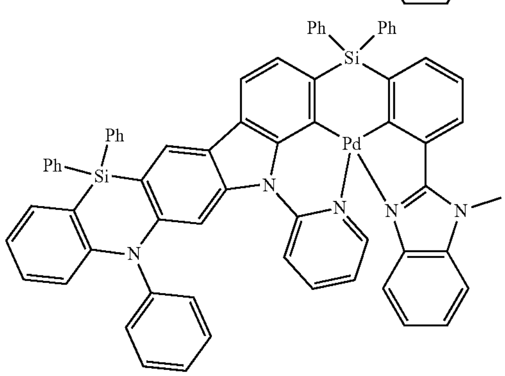
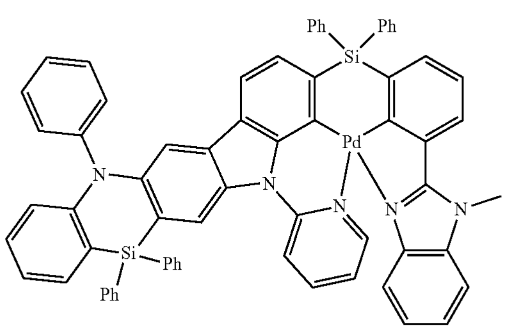
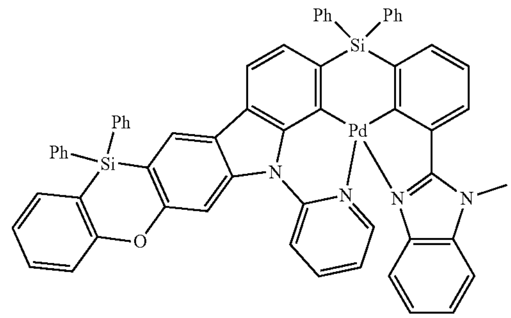
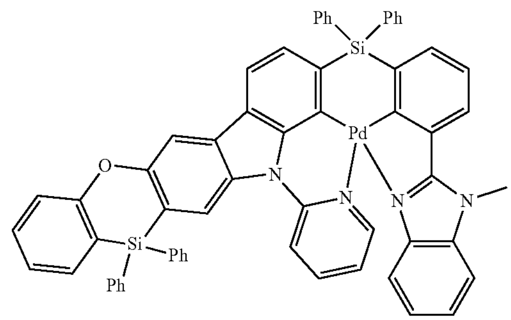
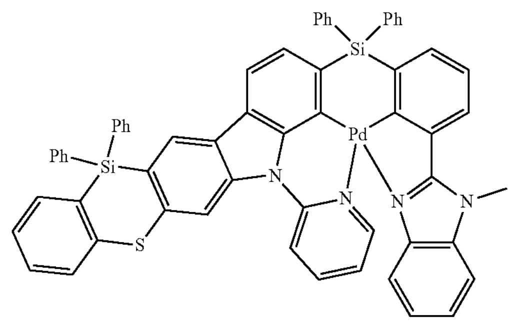
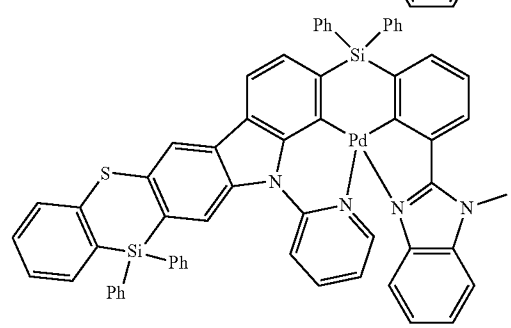
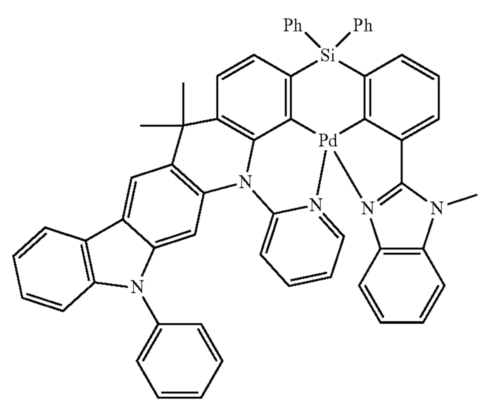

-continued
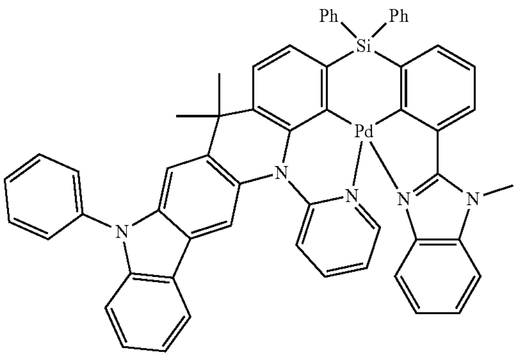
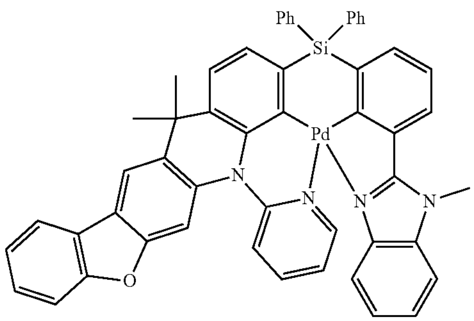
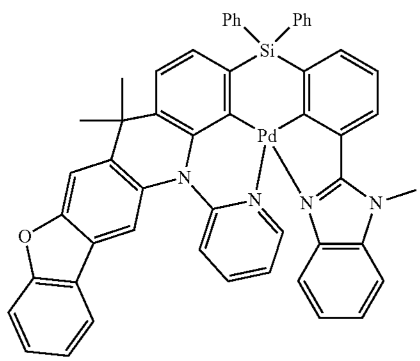
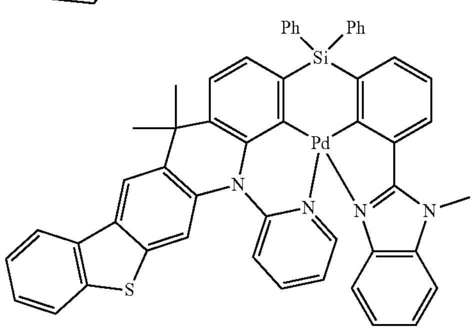
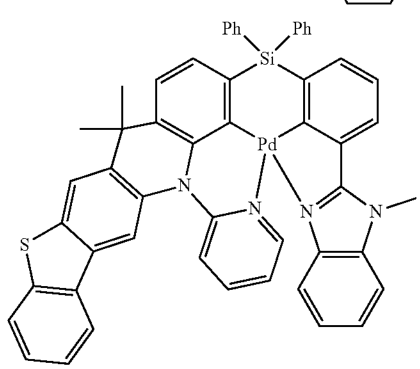
-continued
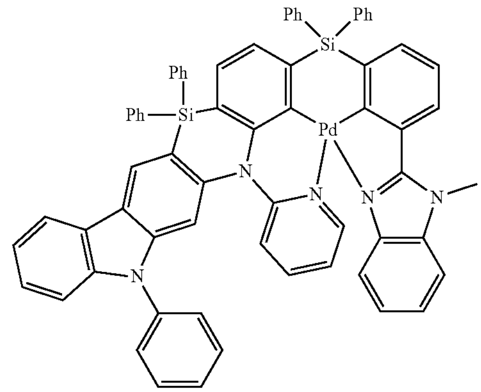
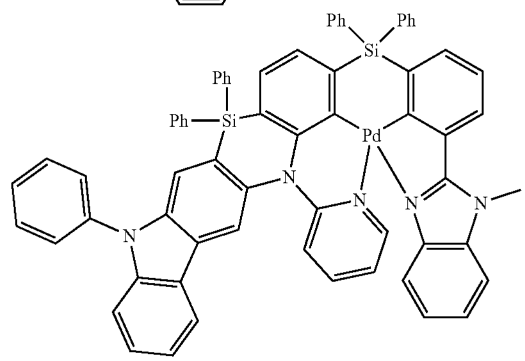
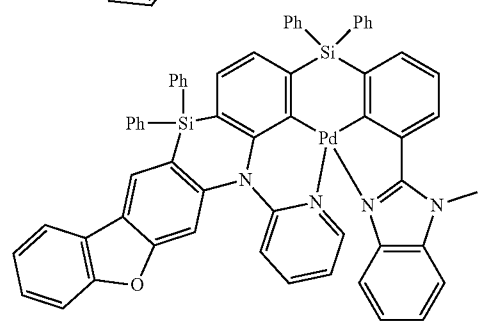
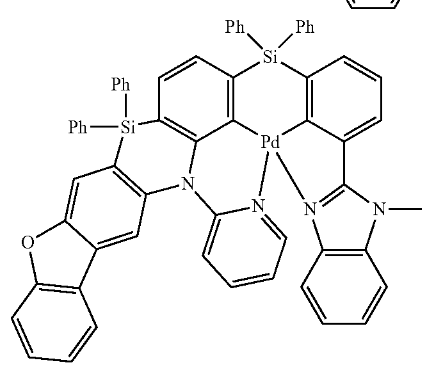
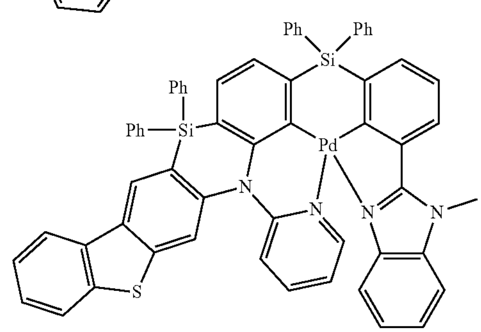

-continued
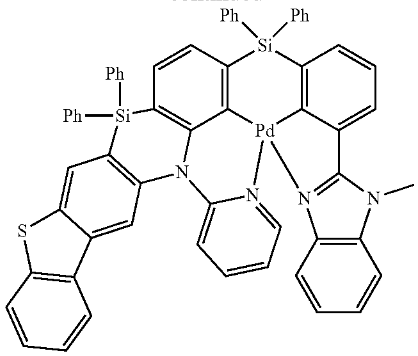
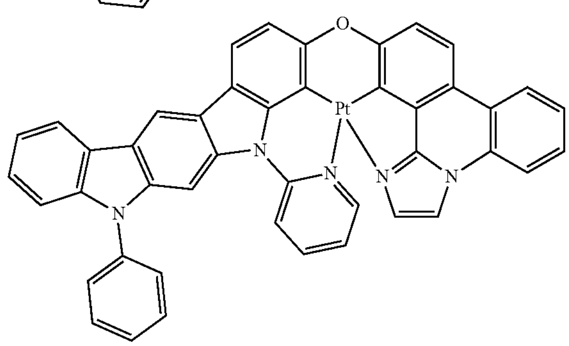
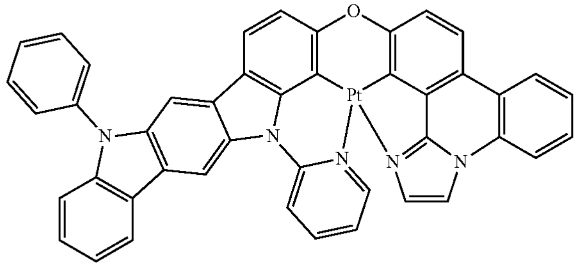
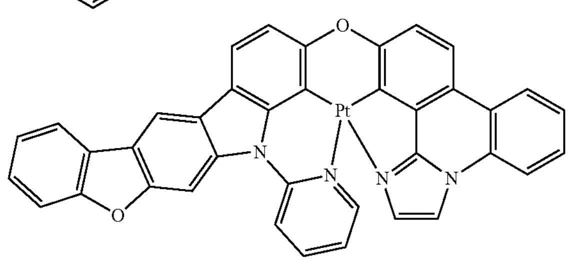
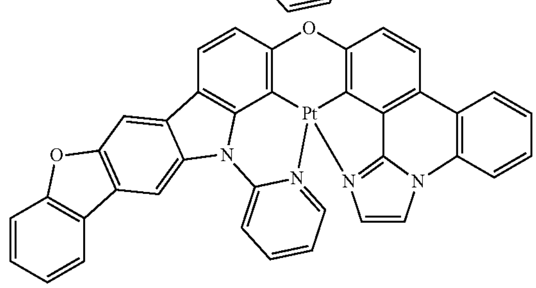
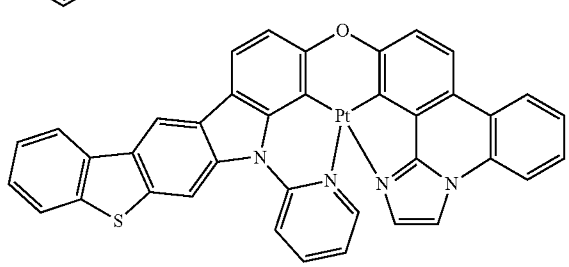
-continued
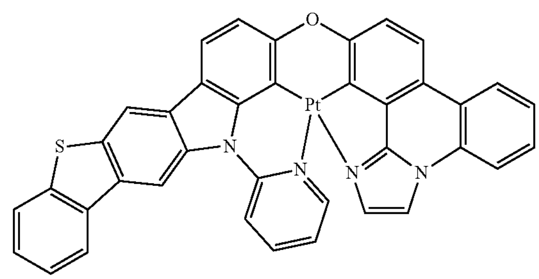
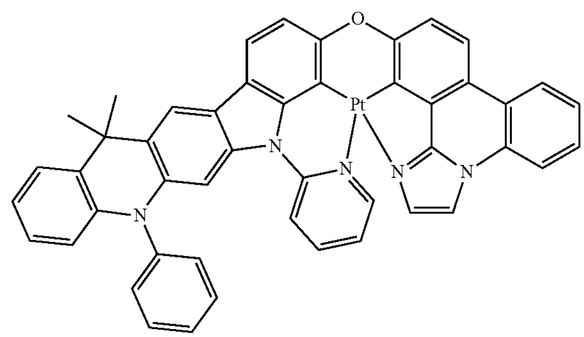
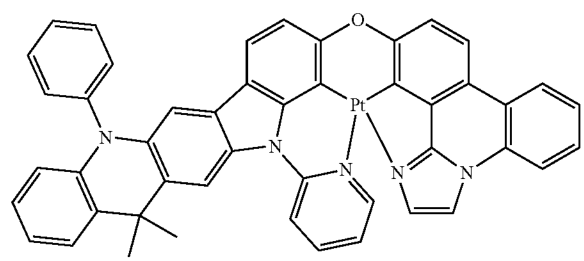
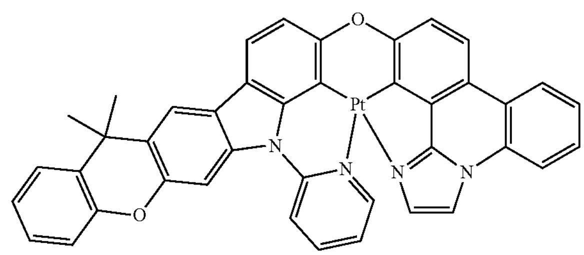
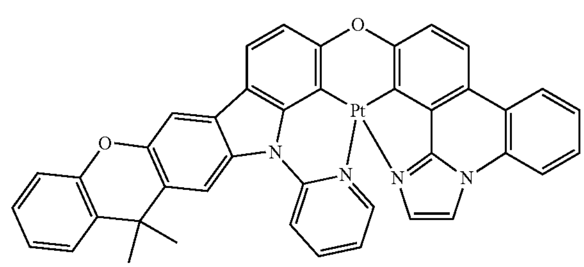
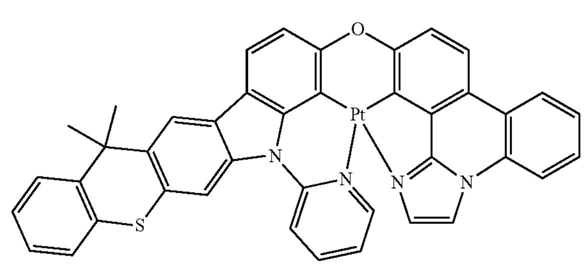

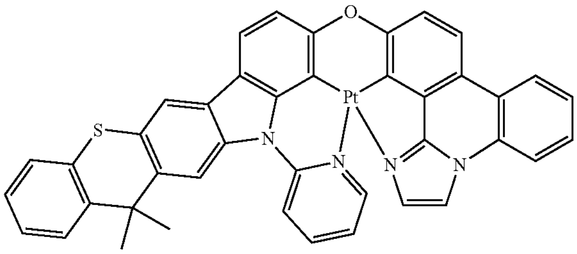
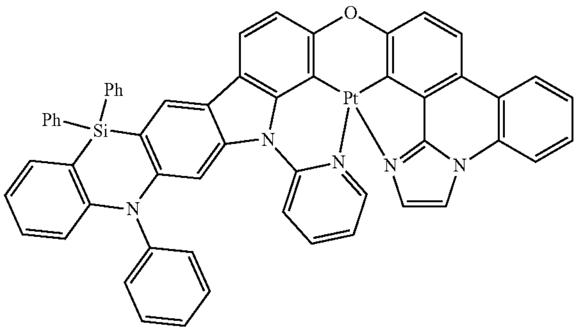
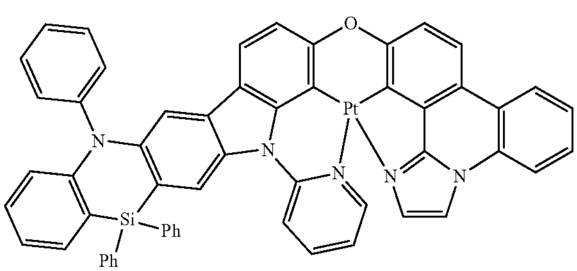
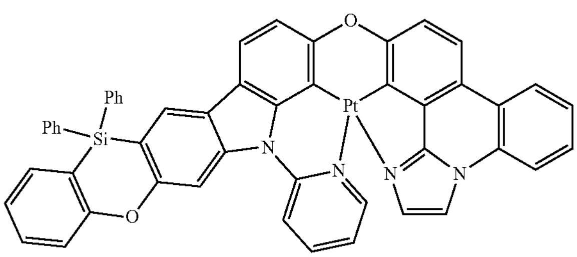
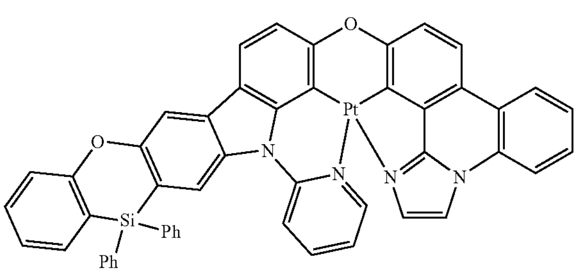
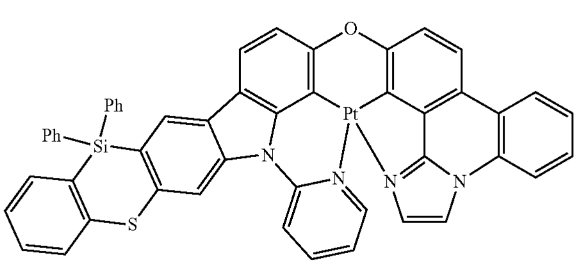
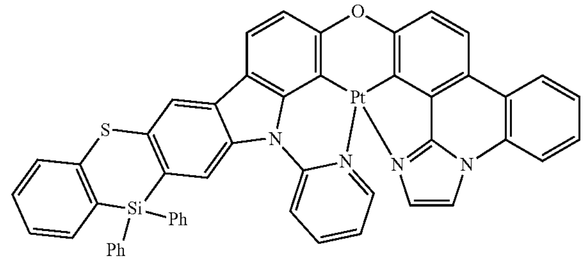
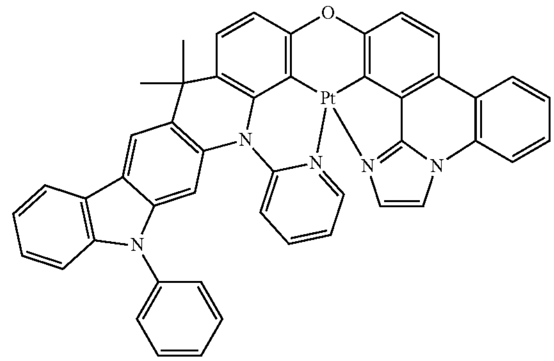
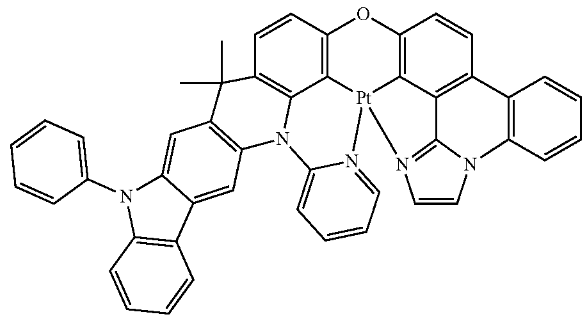
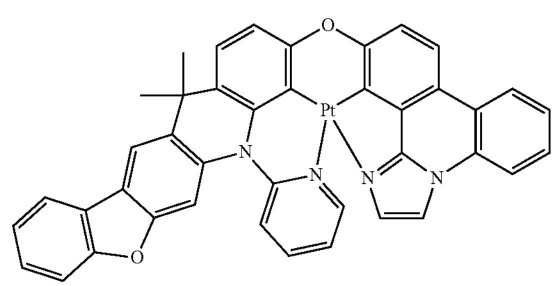
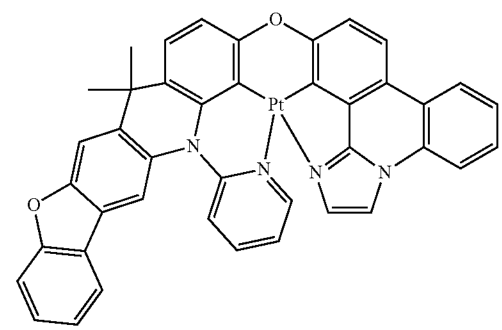

-continued
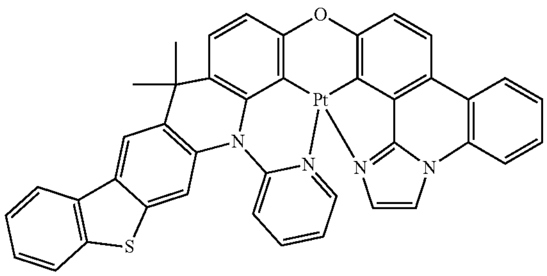
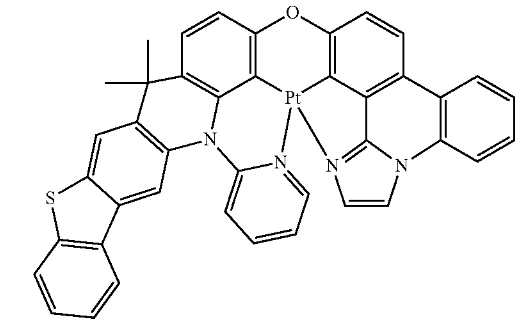
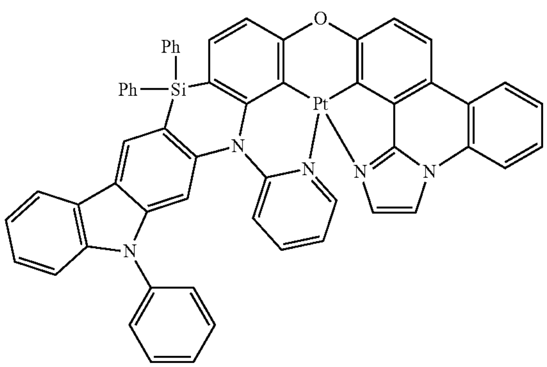
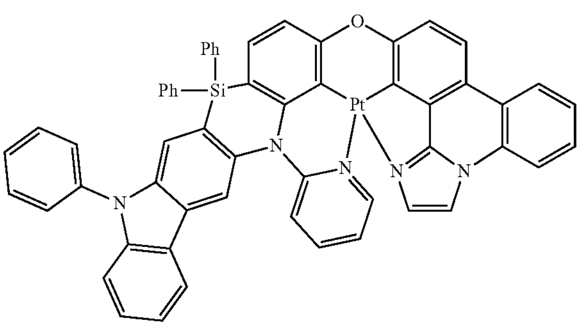
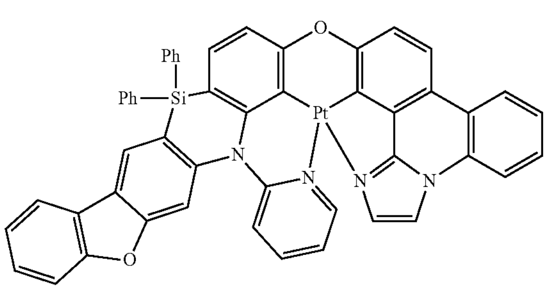
-continued
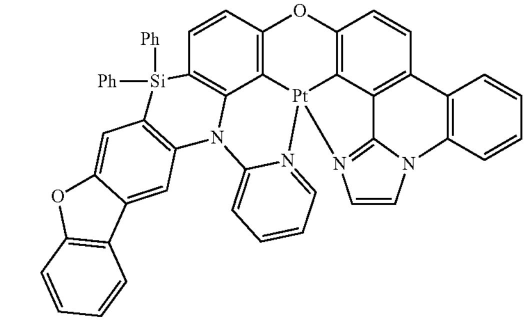
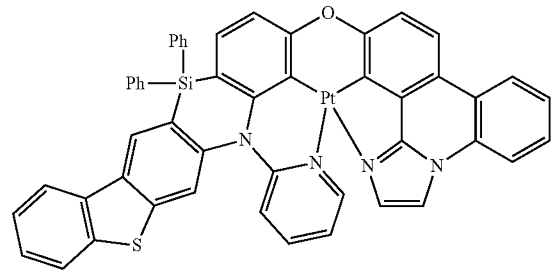
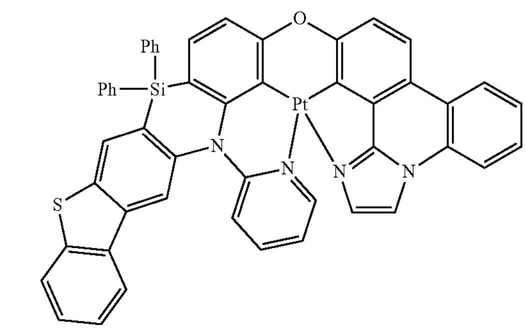
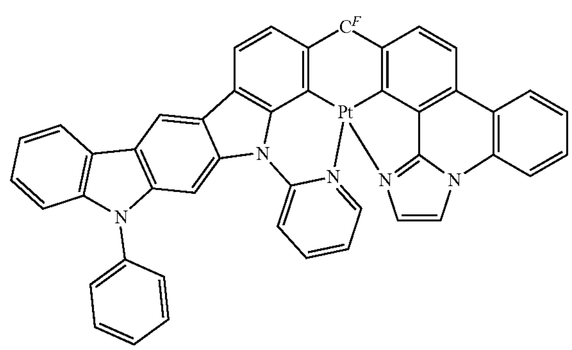
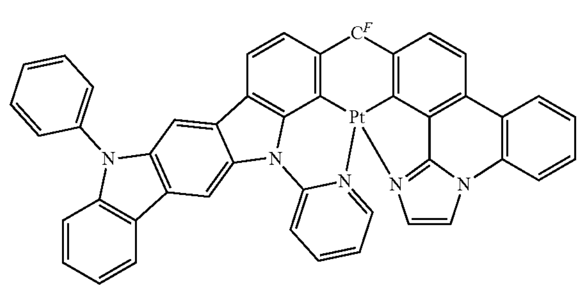

-continued
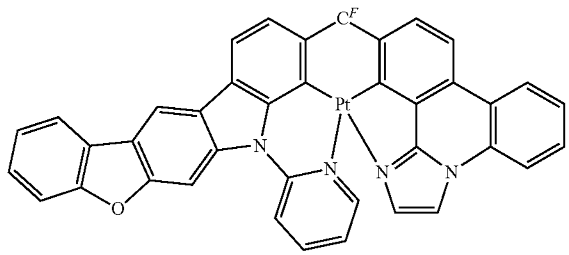
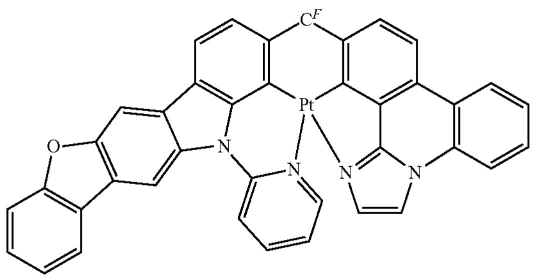
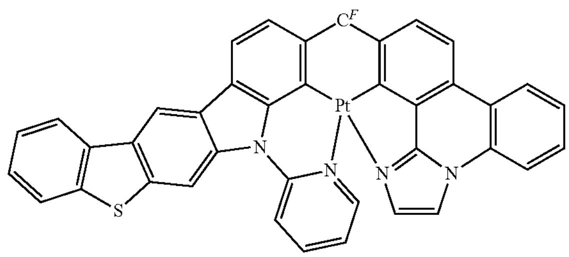
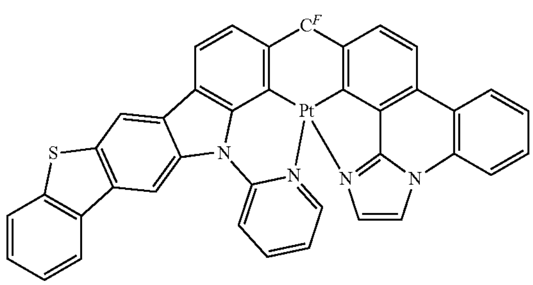
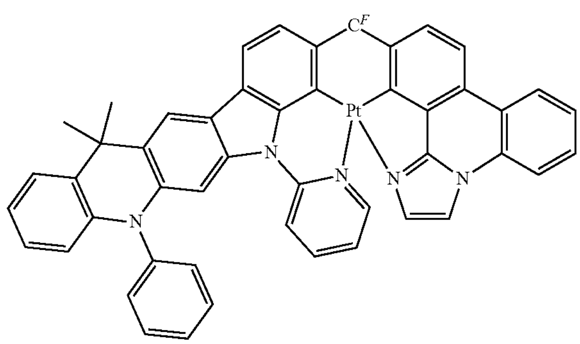
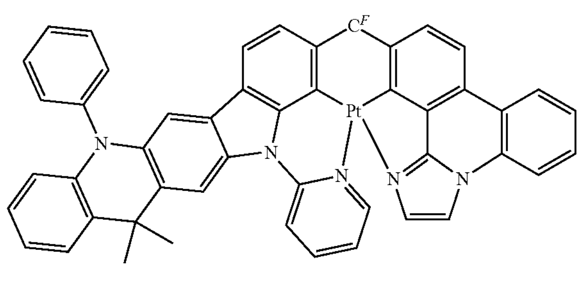
-continued
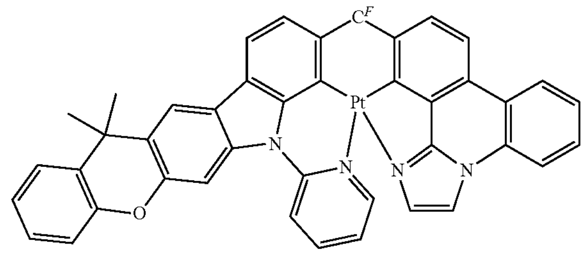
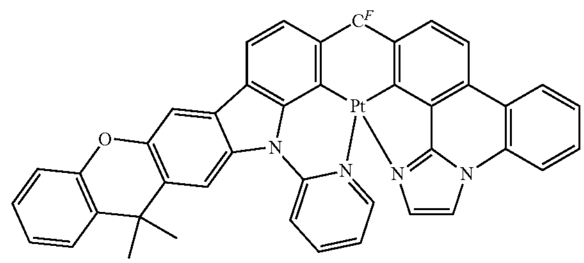
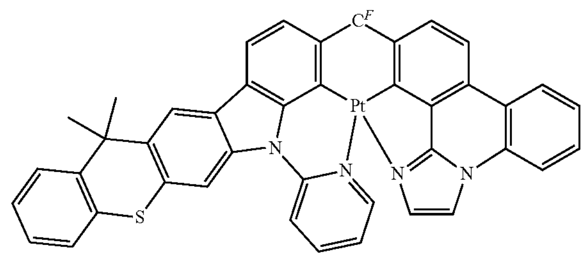
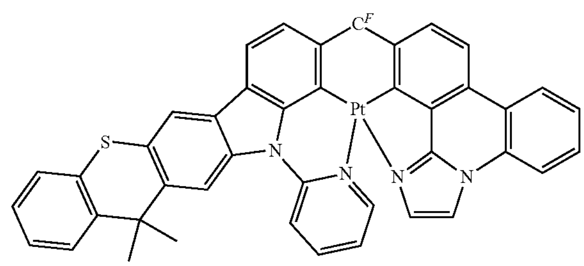
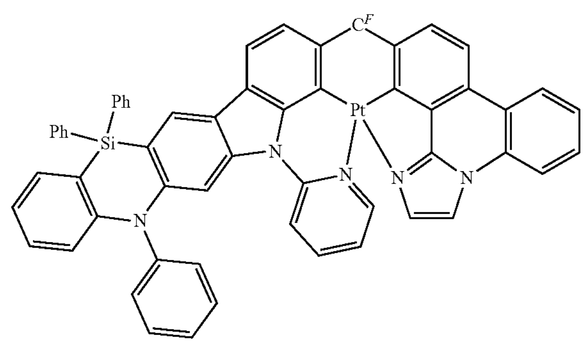
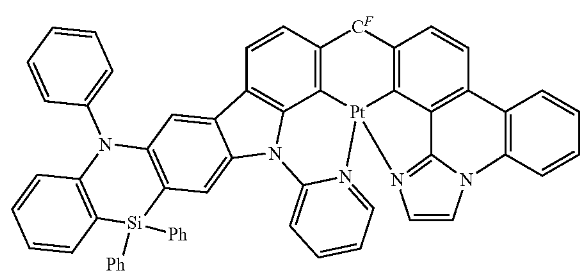

-continued
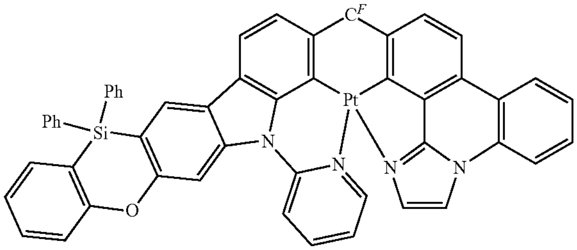
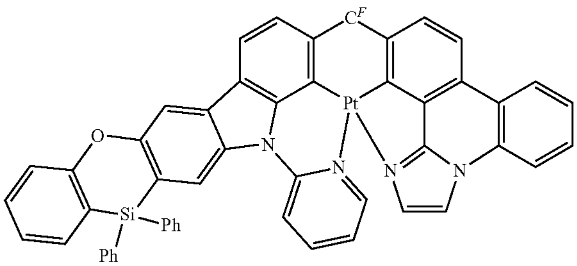
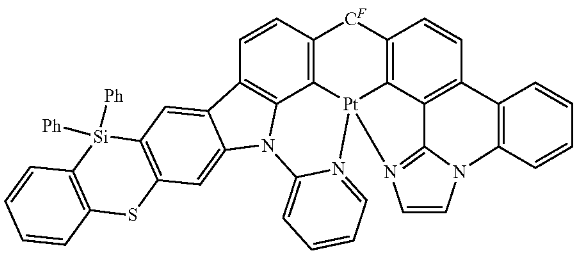
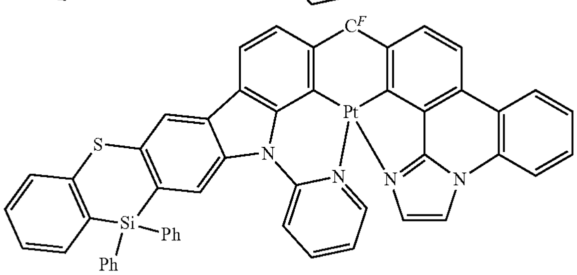
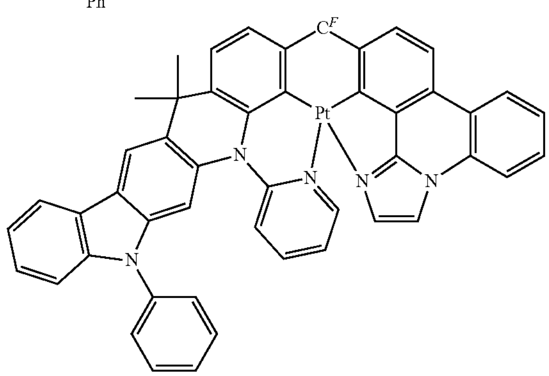
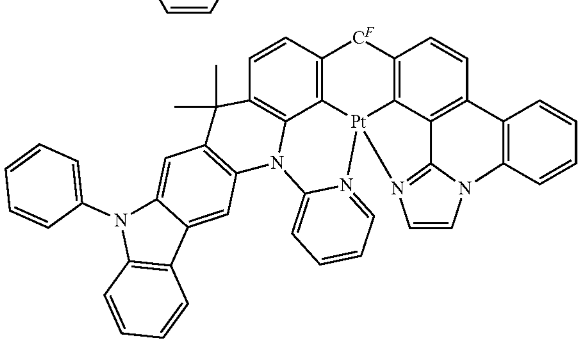
-continued
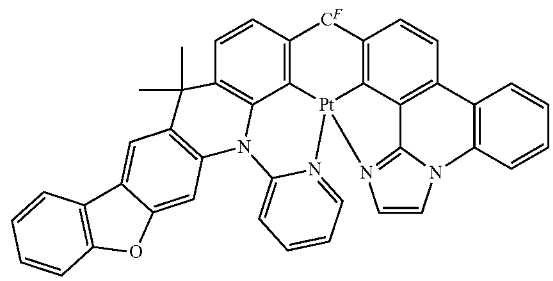
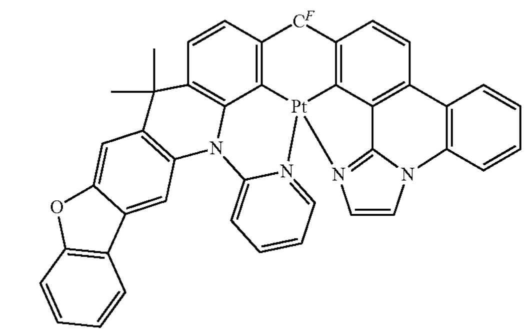
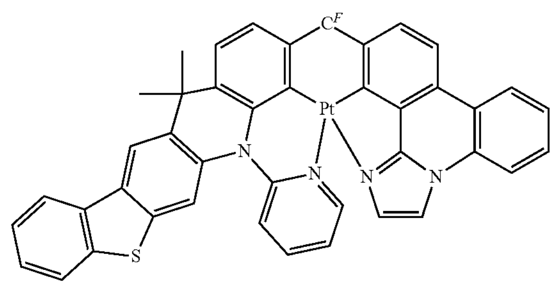
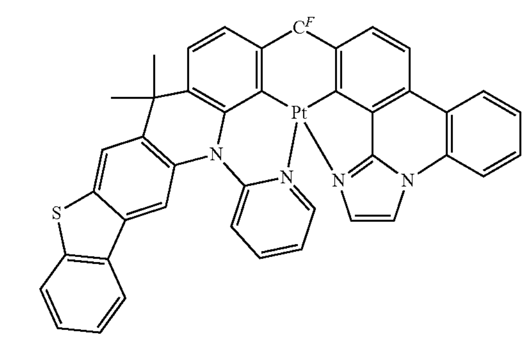
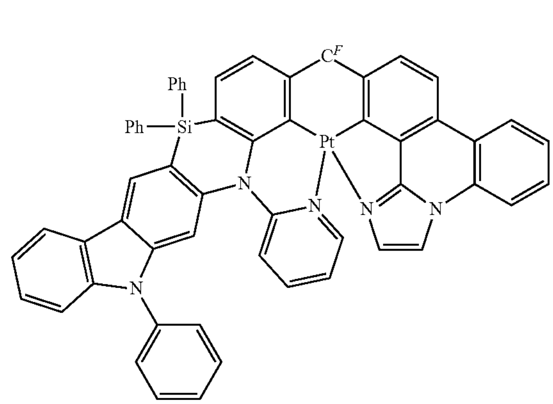

-continued
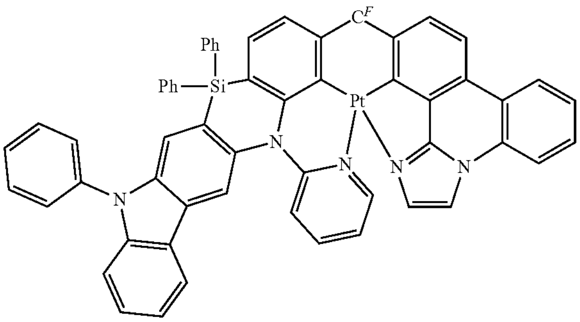
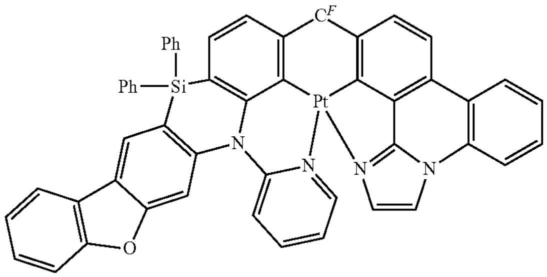
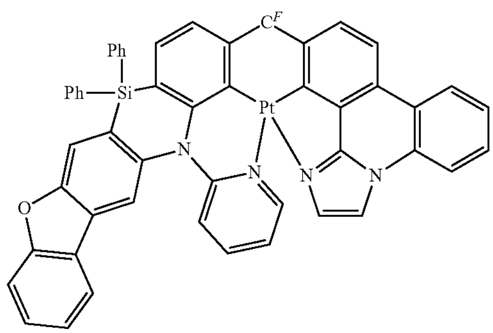
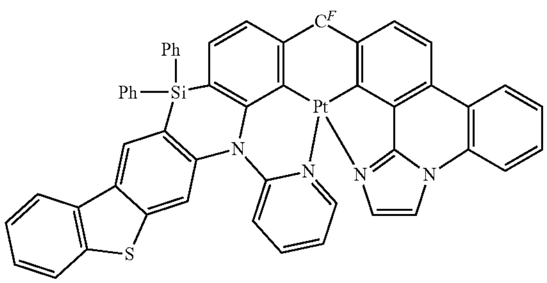
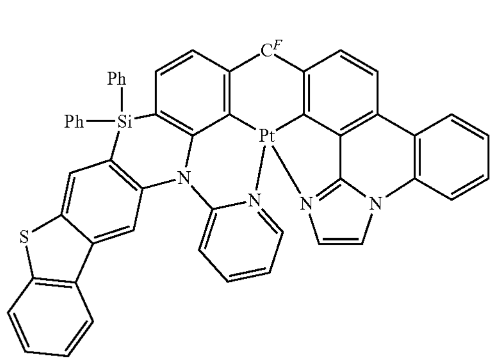
-continued
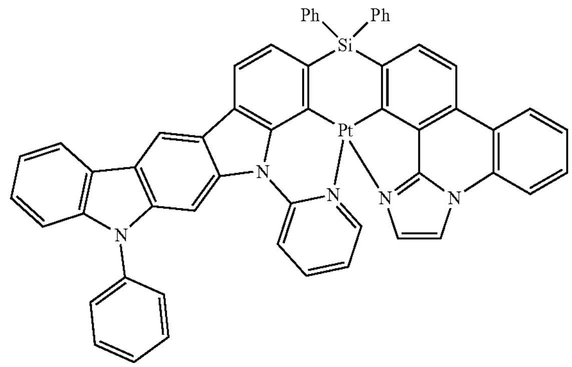
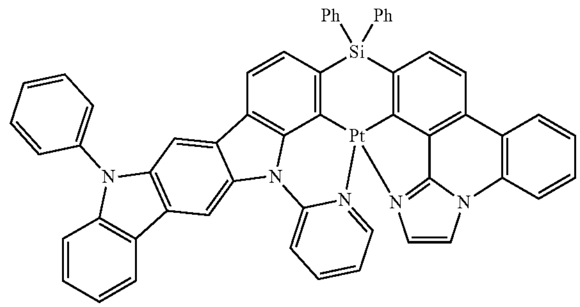
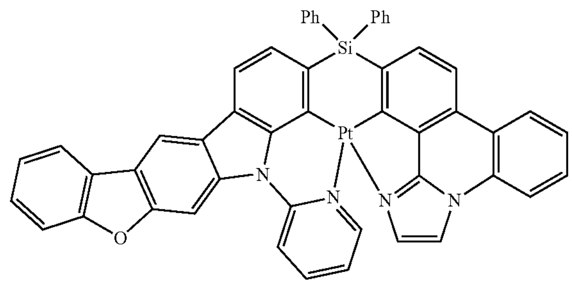
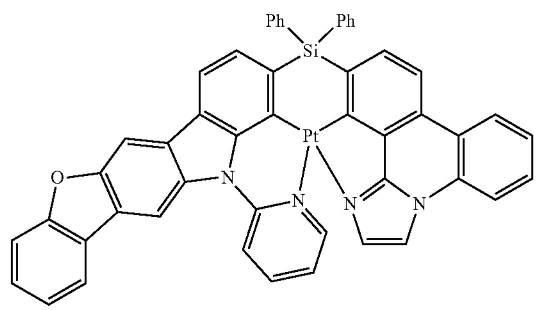
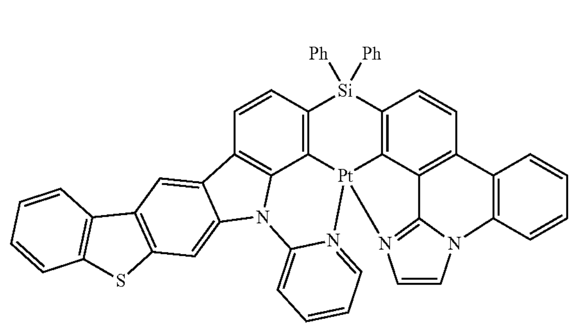

-continued
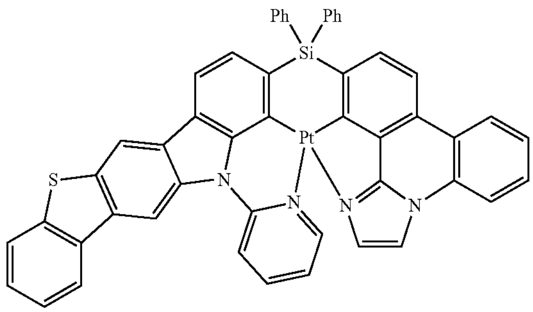
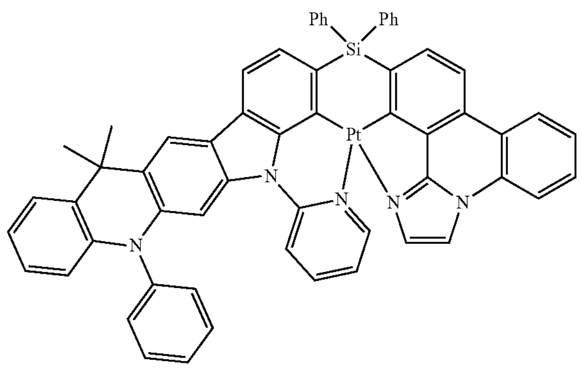
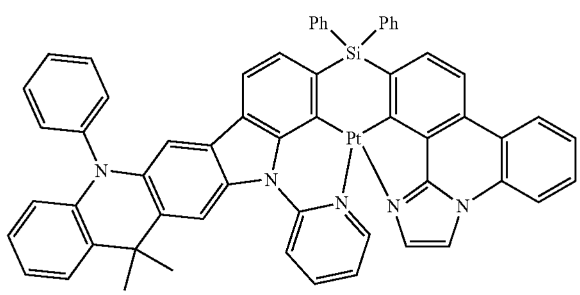
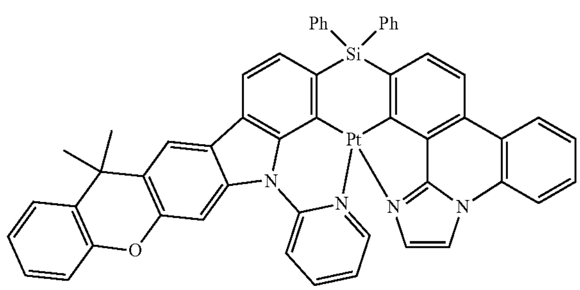
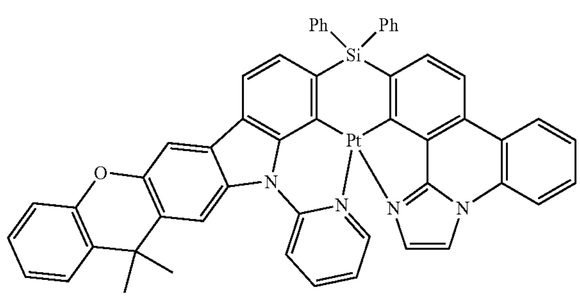
-continued
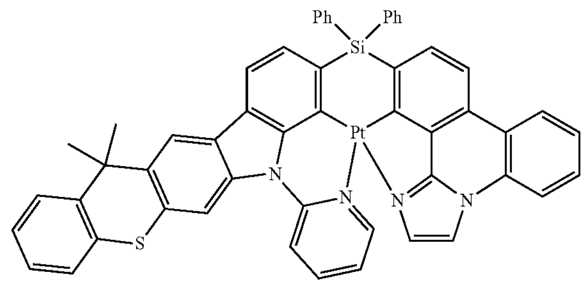
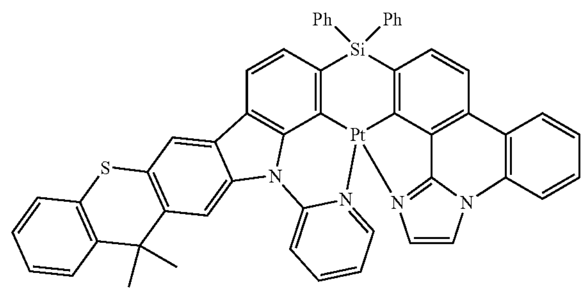
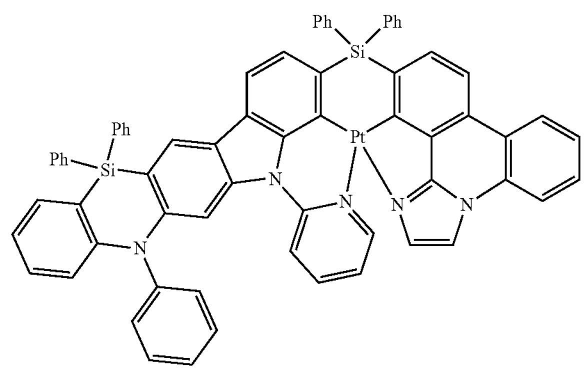
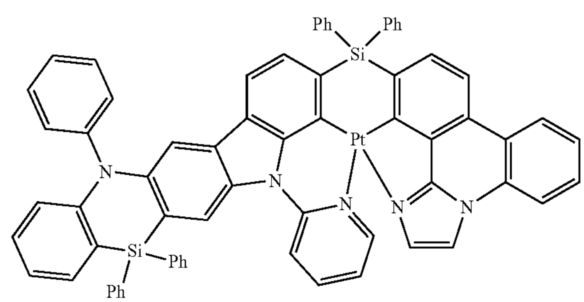
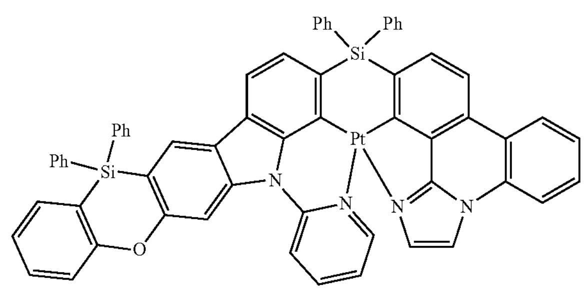

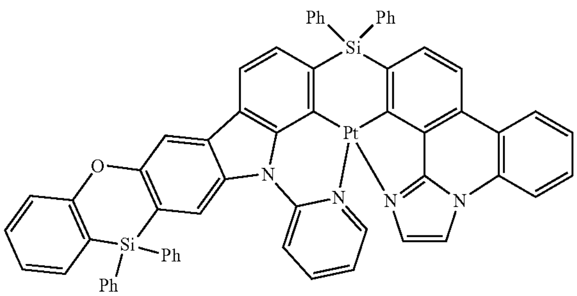
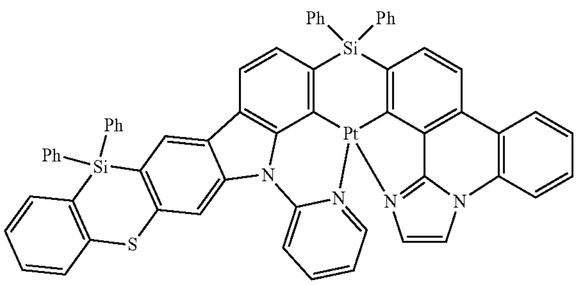
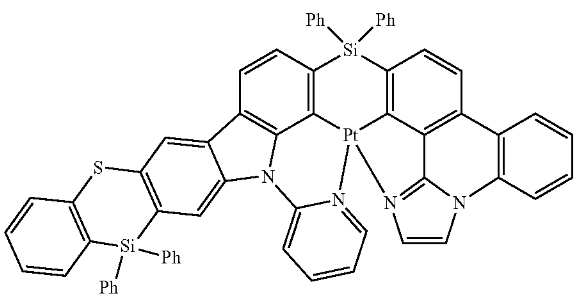
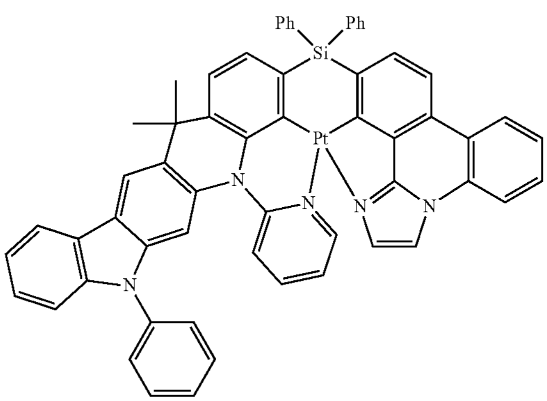
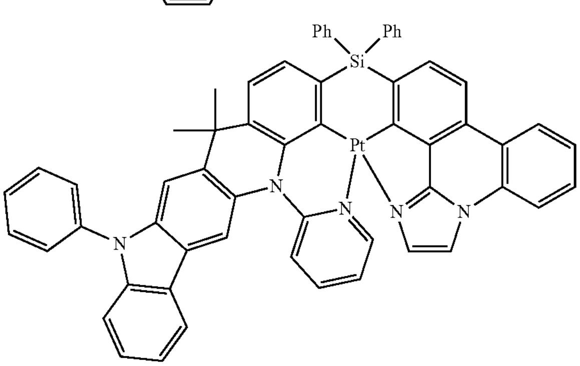
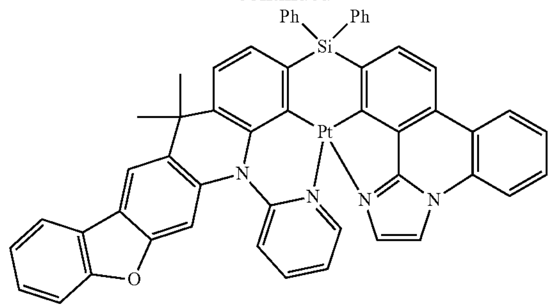
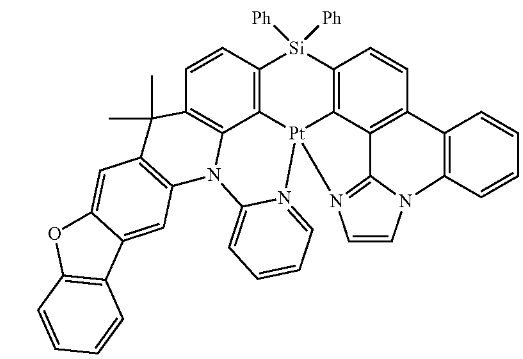
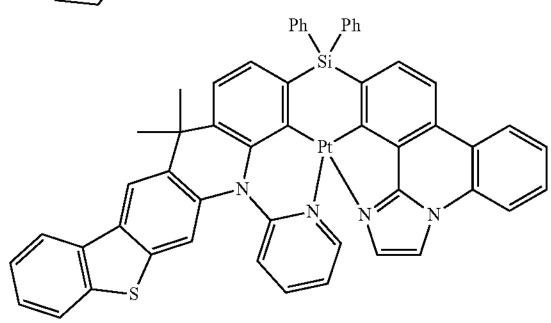
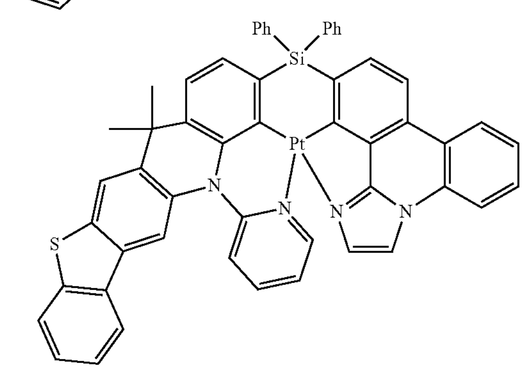
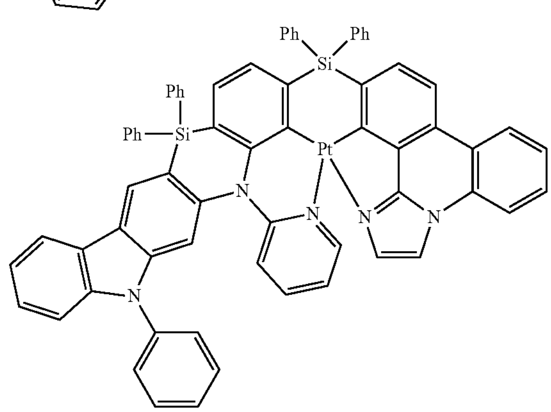

-continued
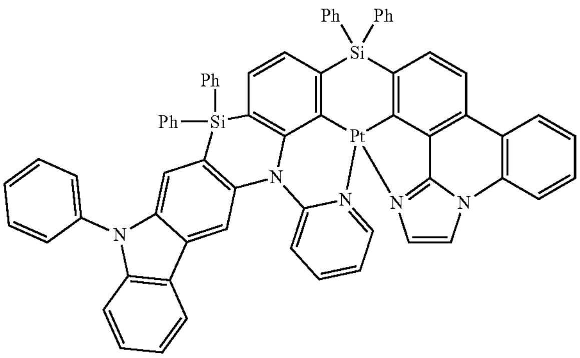
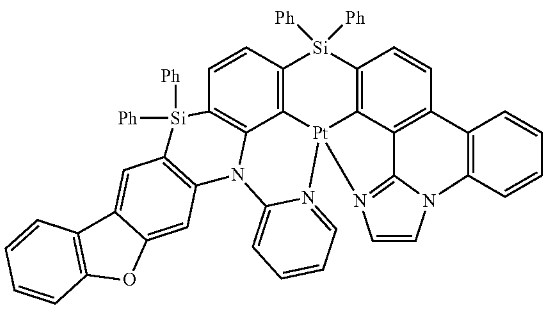
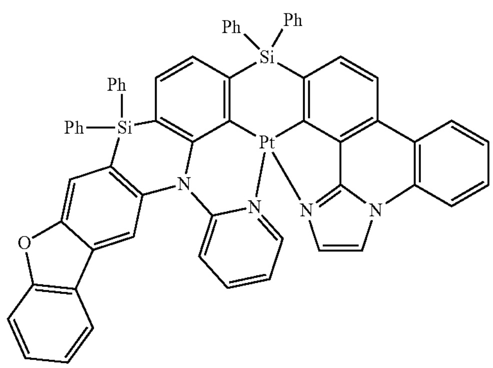
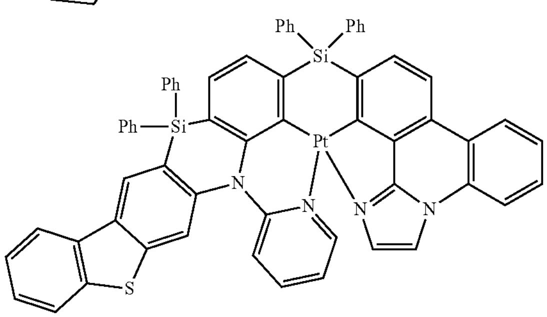
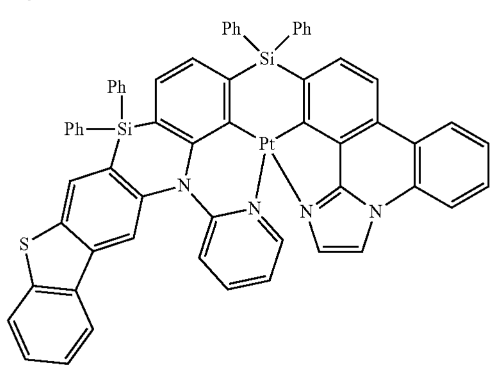
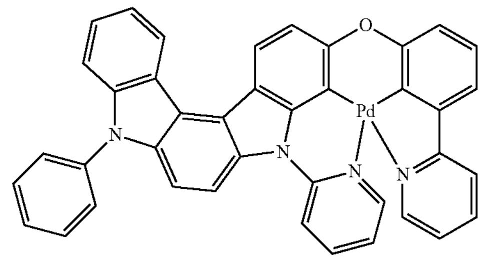
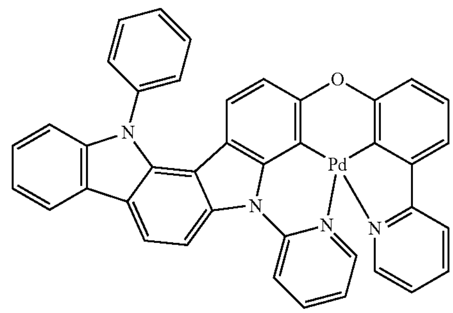
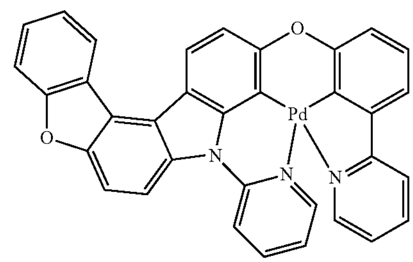
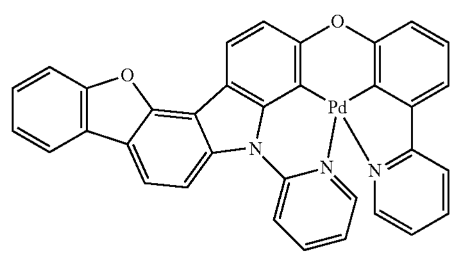
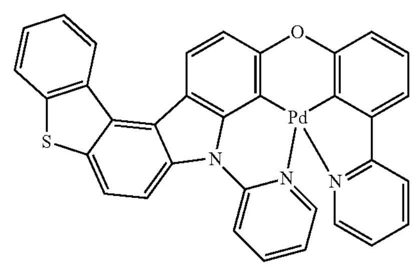
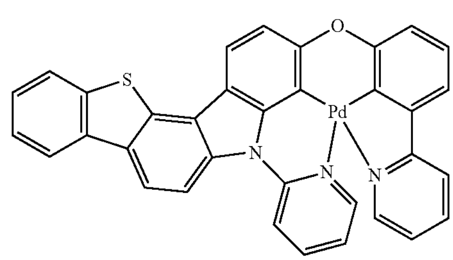

-continued
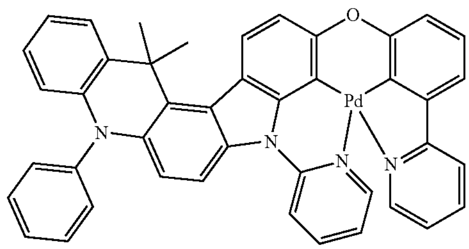
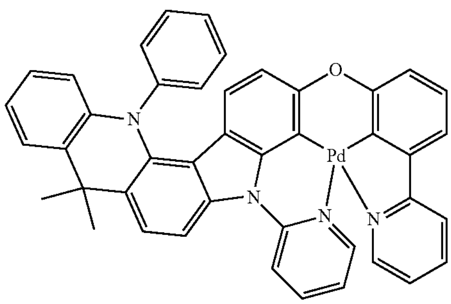
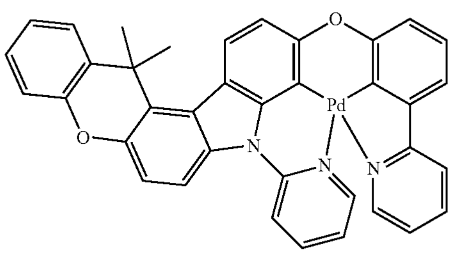
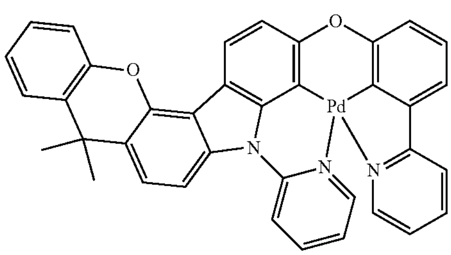
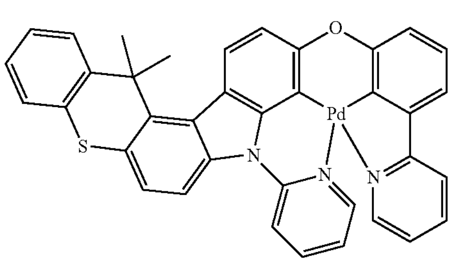
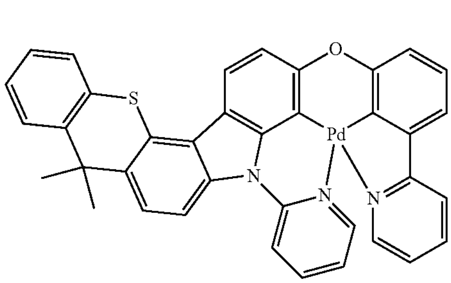
-continued
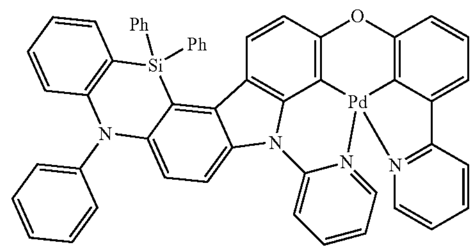
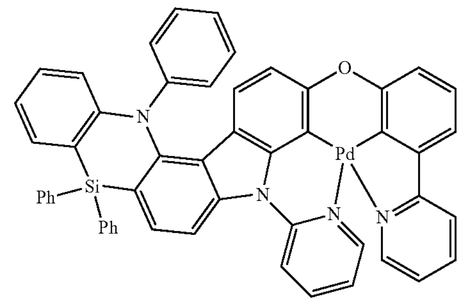
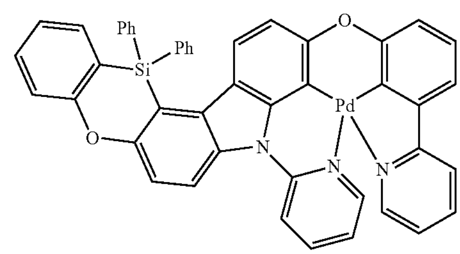
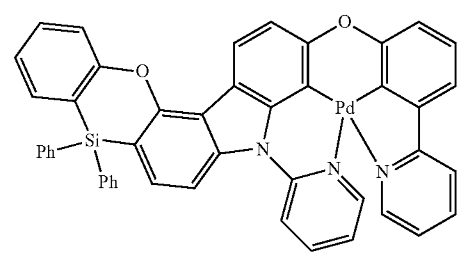
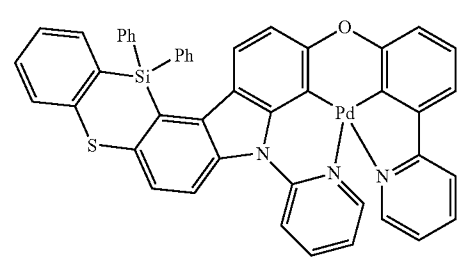
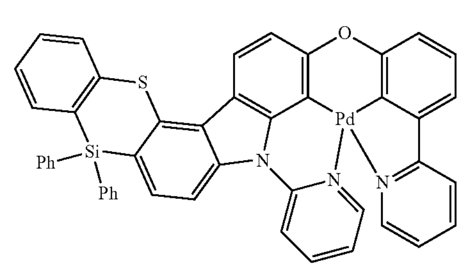

-continued
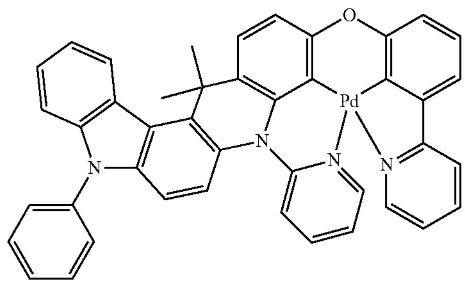
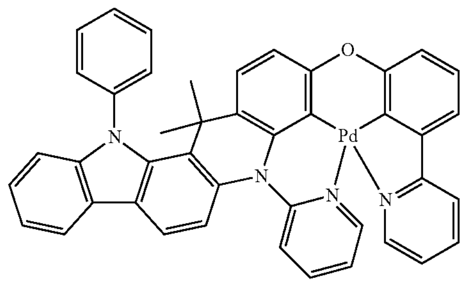
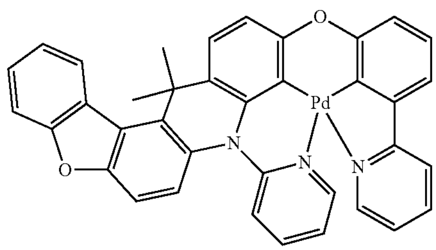
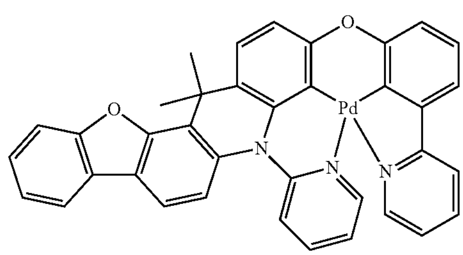
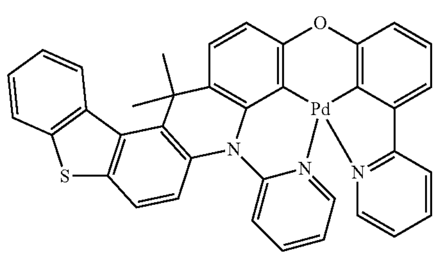
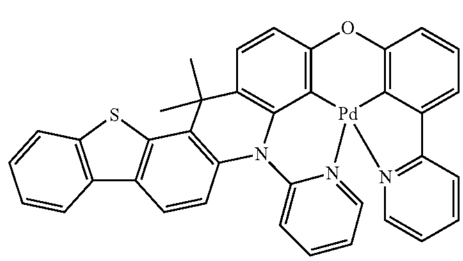
-continued
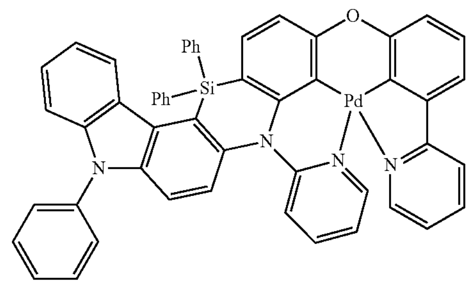
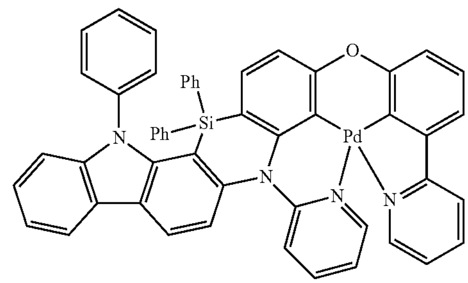
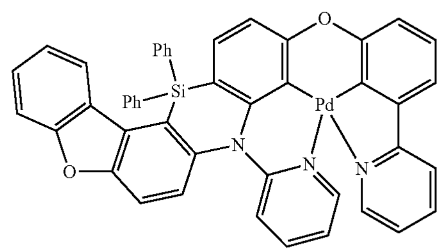
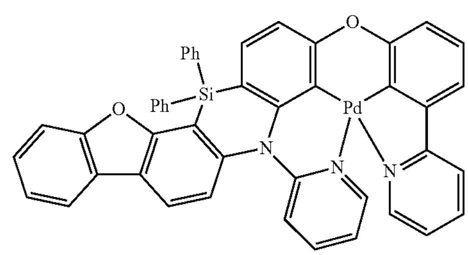
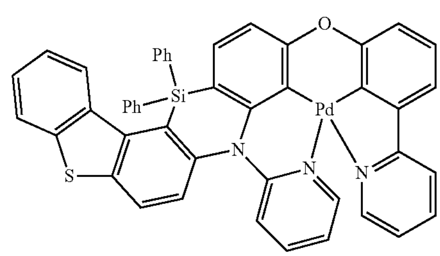
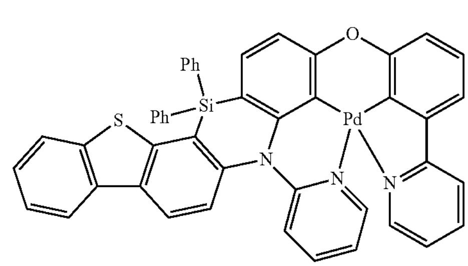

-continued
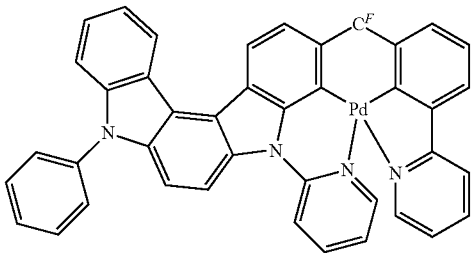
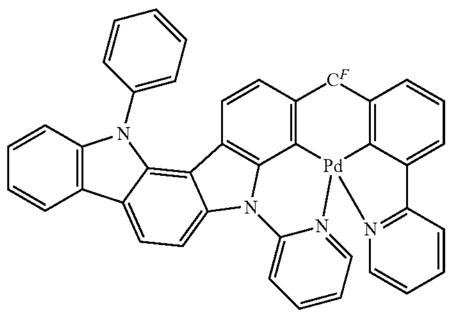
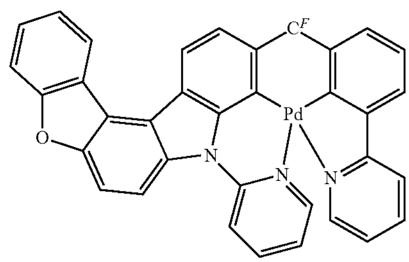
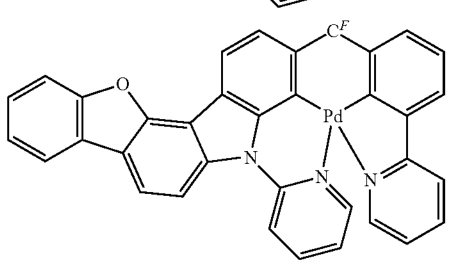
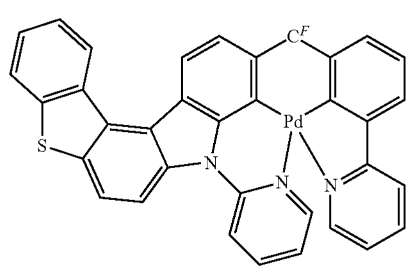
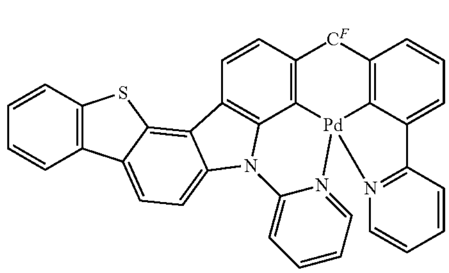
-continued
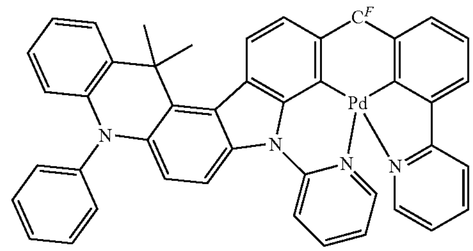
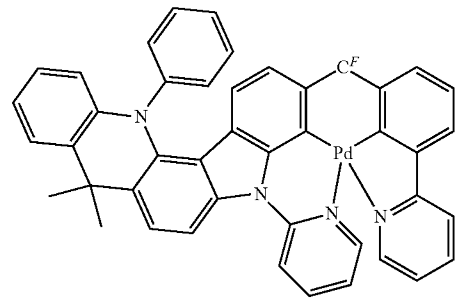
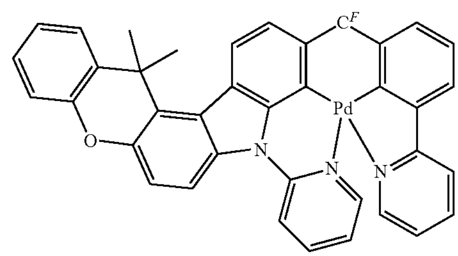
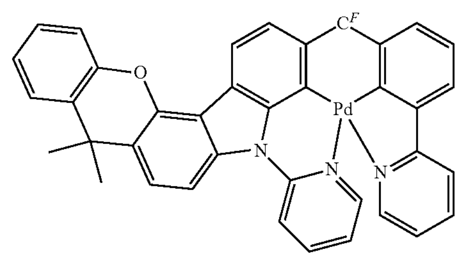
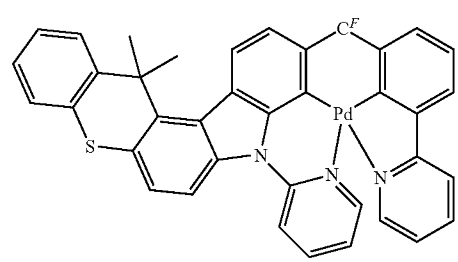
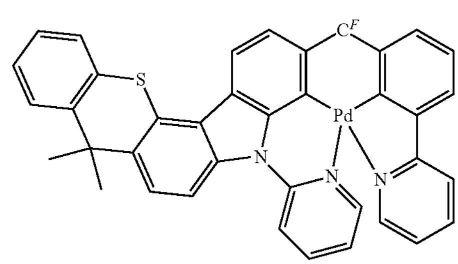

-continued
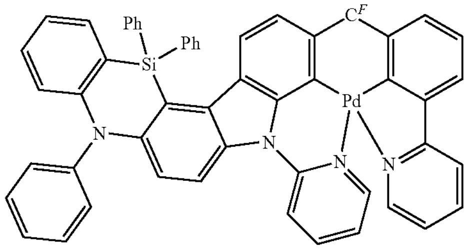
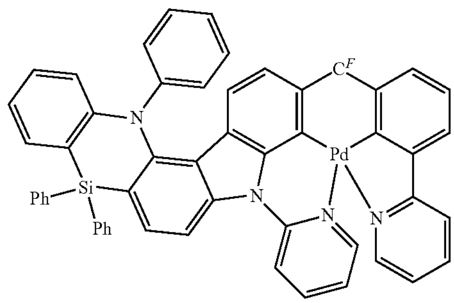
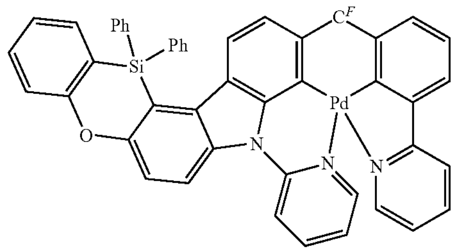
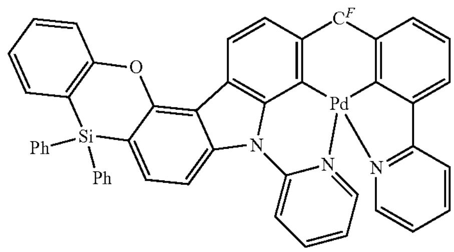
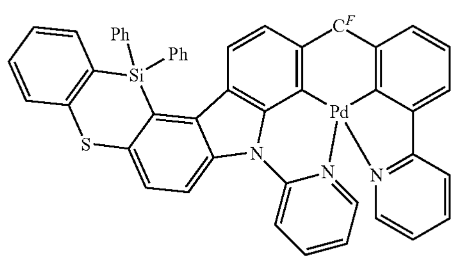
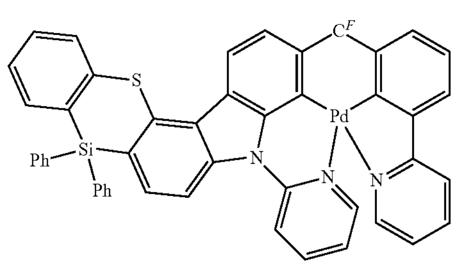
-continued
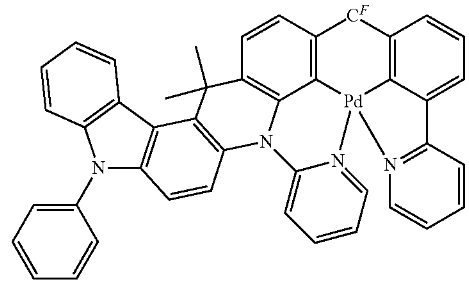
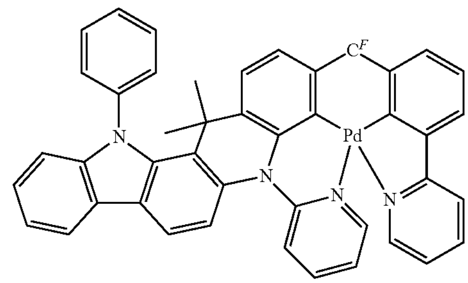
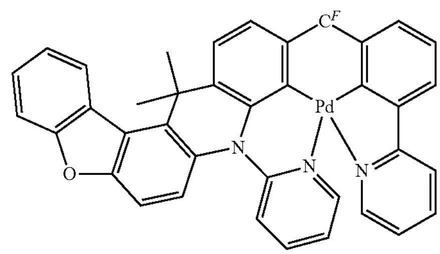
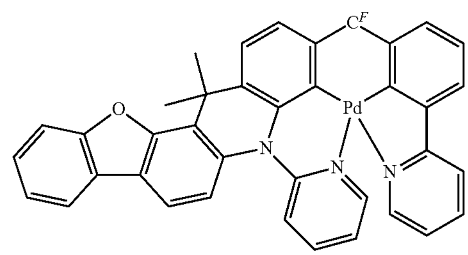
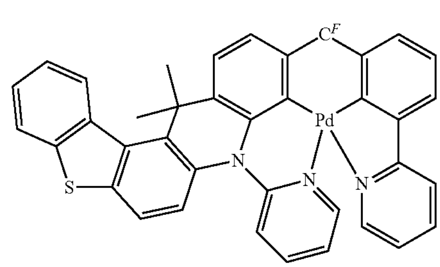
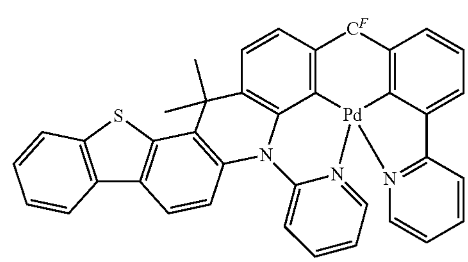

-continued
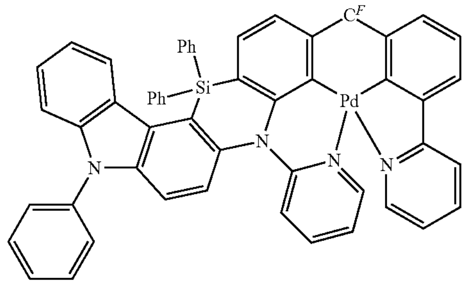
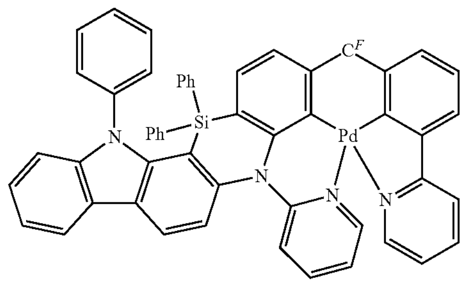
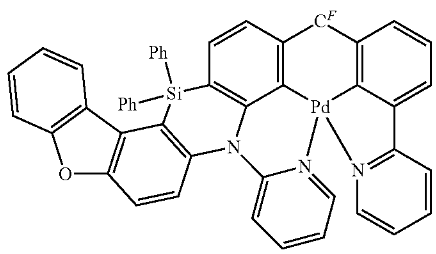
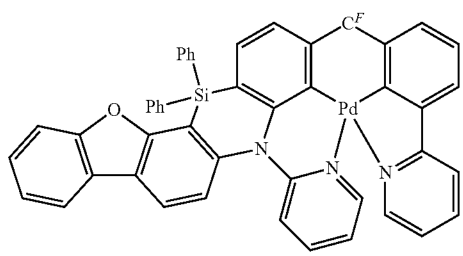
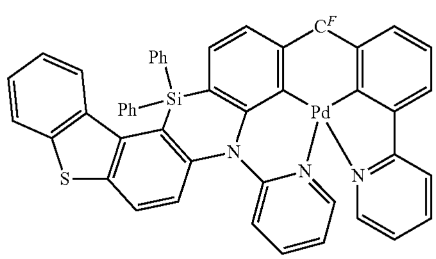
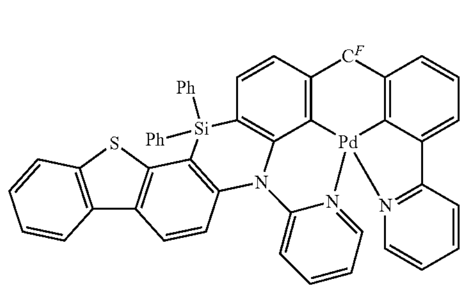
-continued
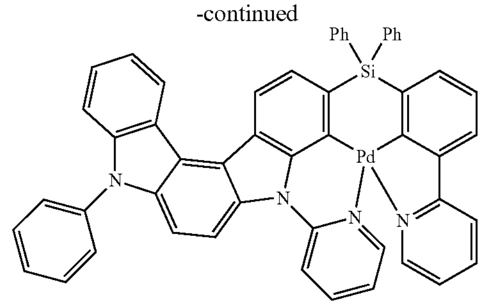
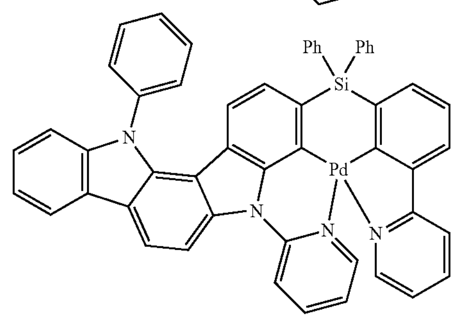
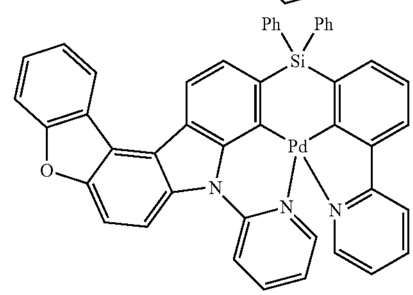
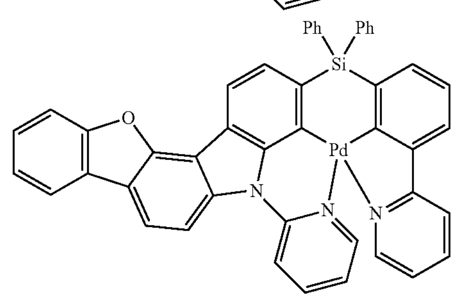
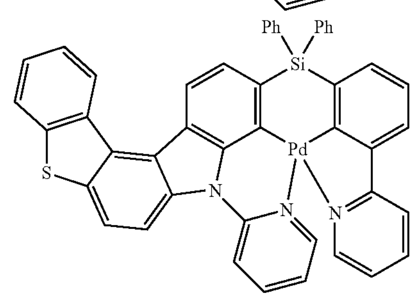
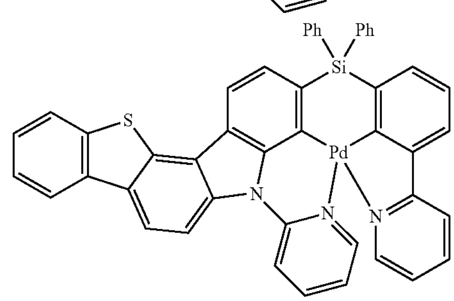

-continued
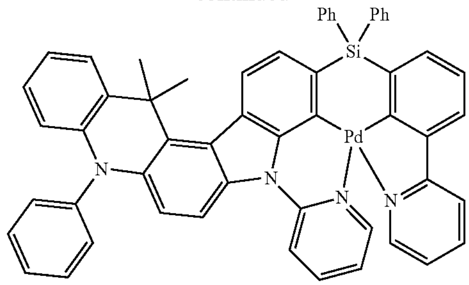
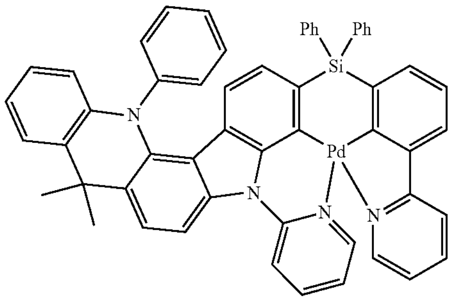
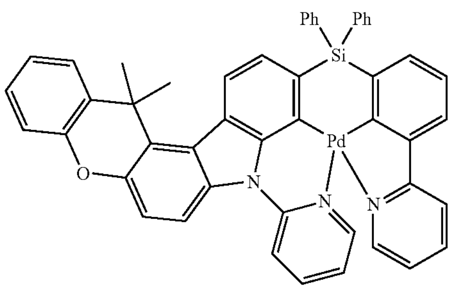
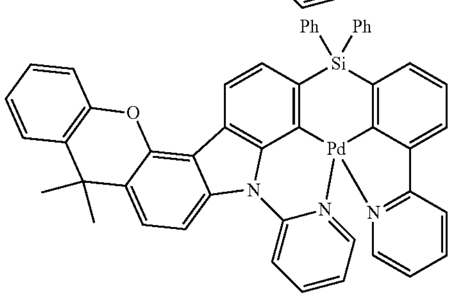
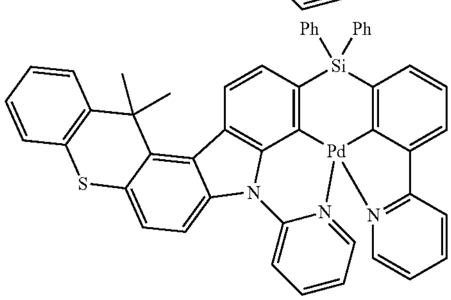
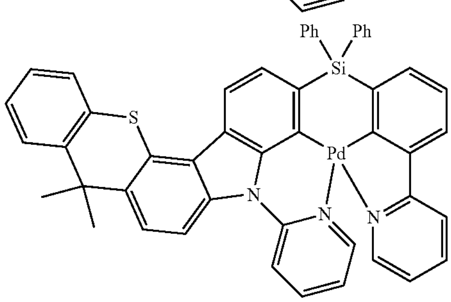
-continued
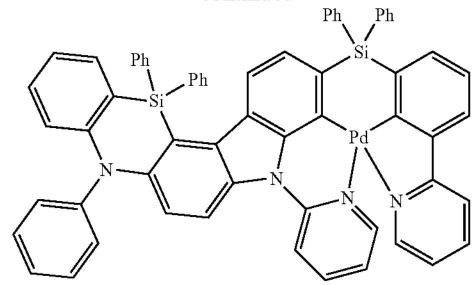
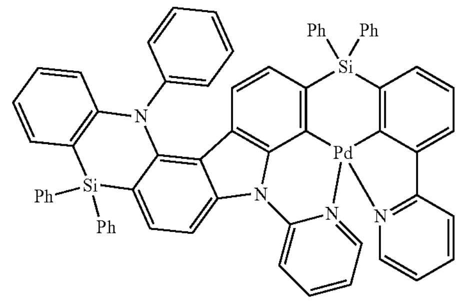
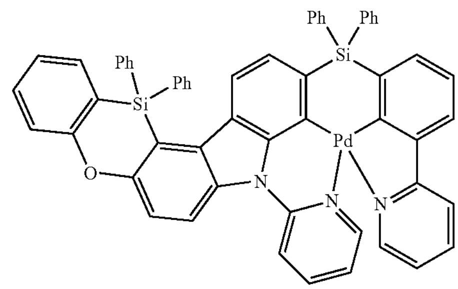
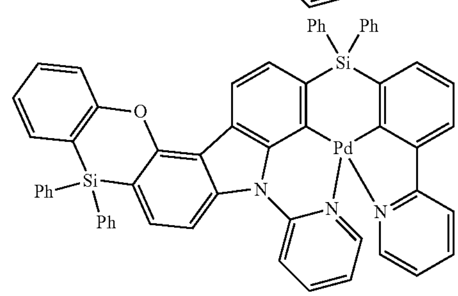
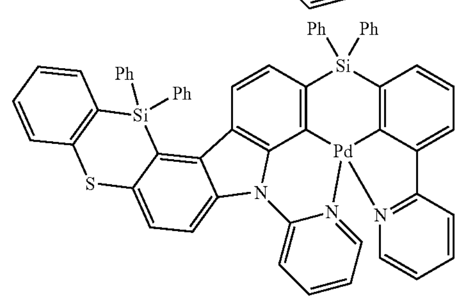
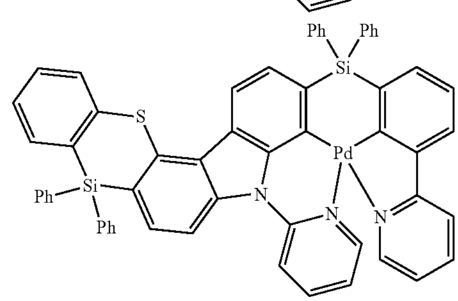

-continued
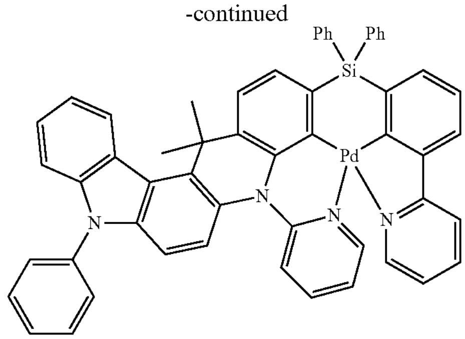
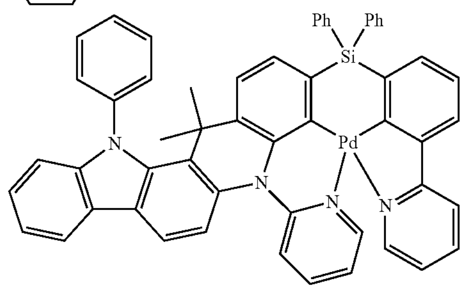
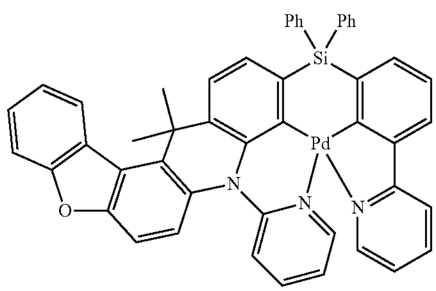
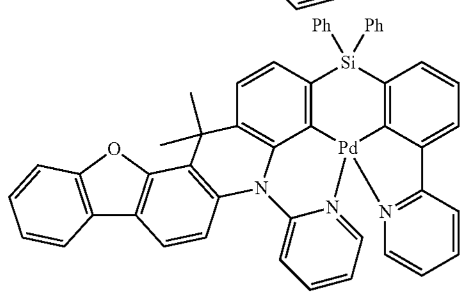
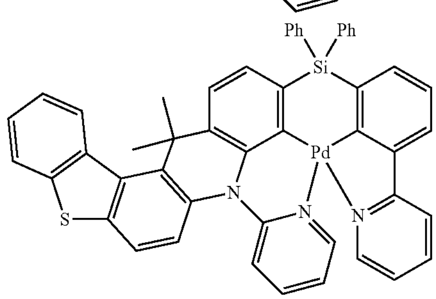
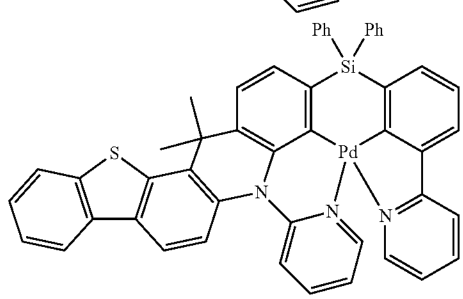
-continued
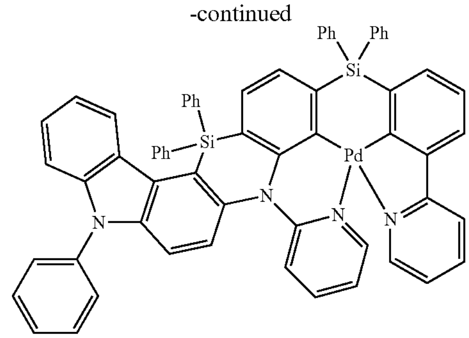
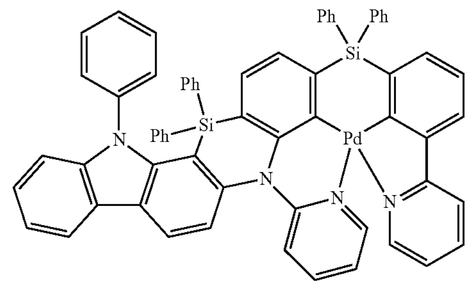
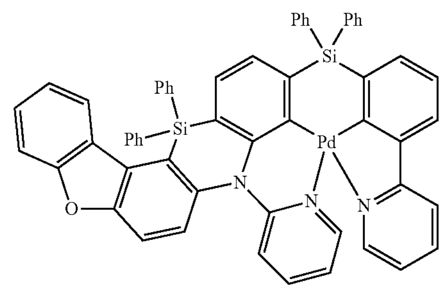
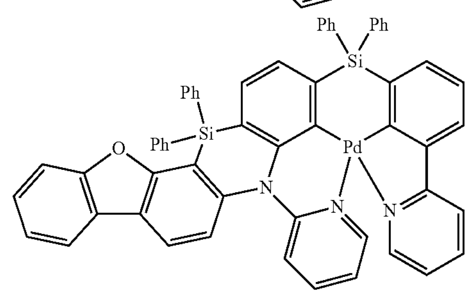
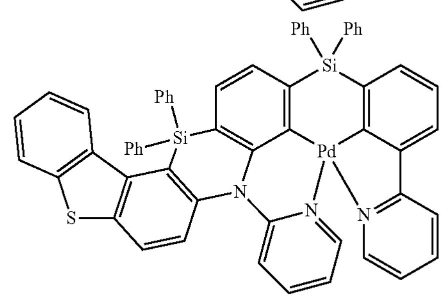
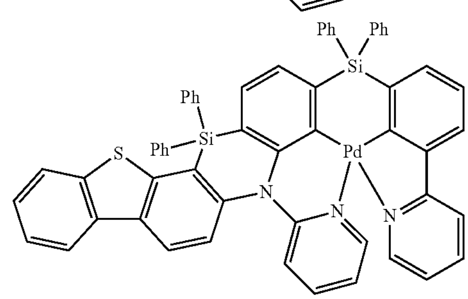

-continued
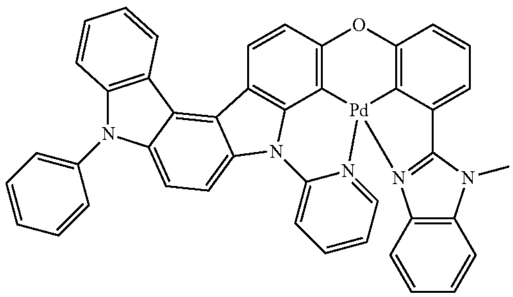
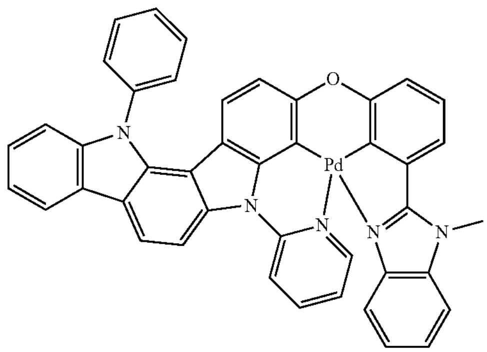
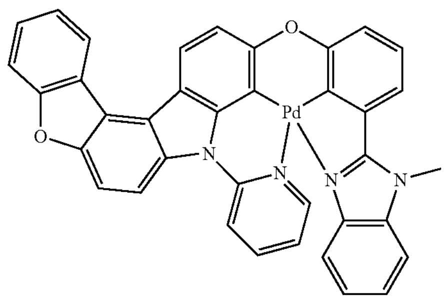
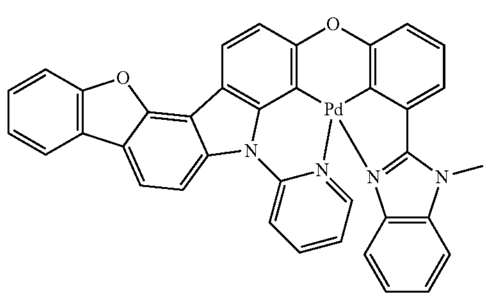
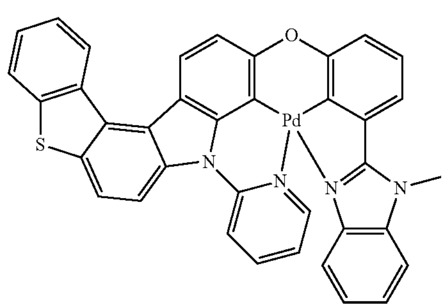
-continued
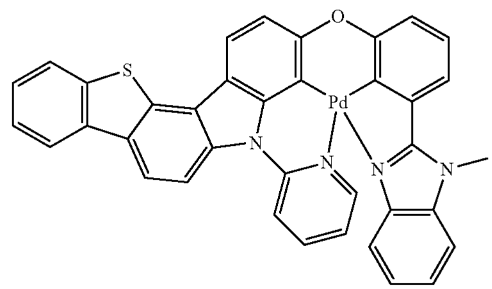
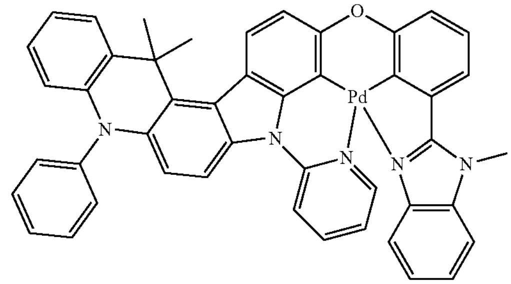
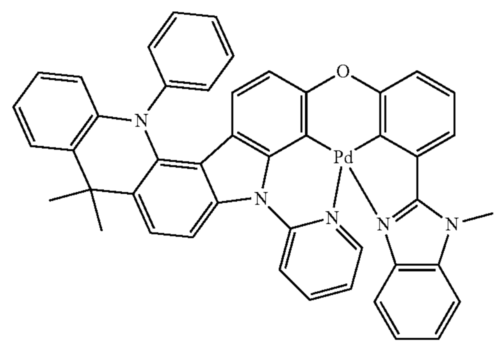
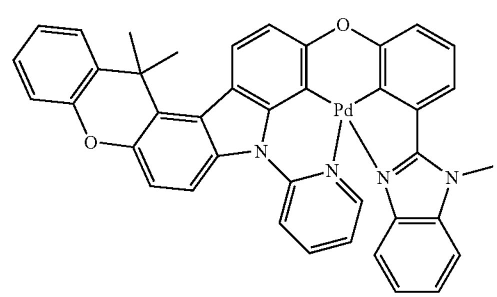
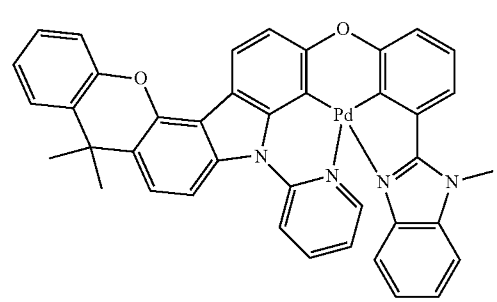

-continued
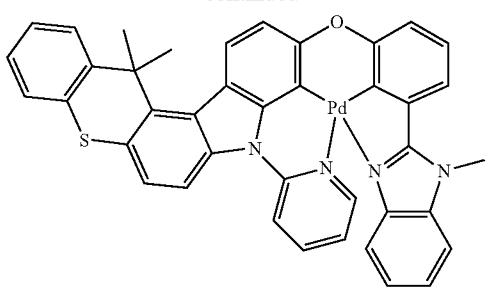
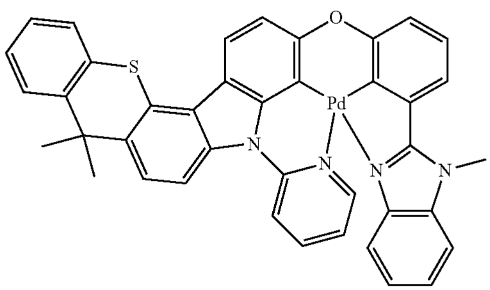
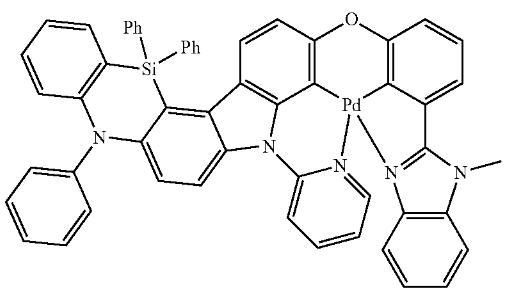
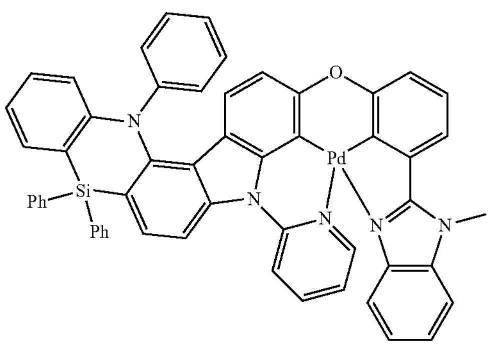
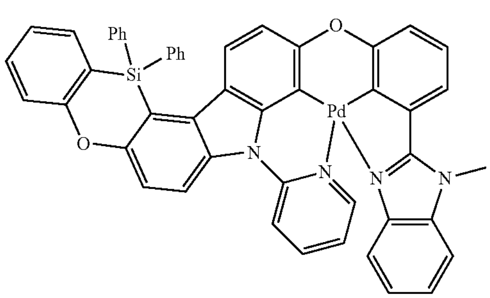
-continued
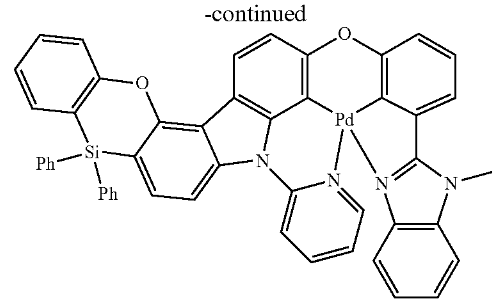
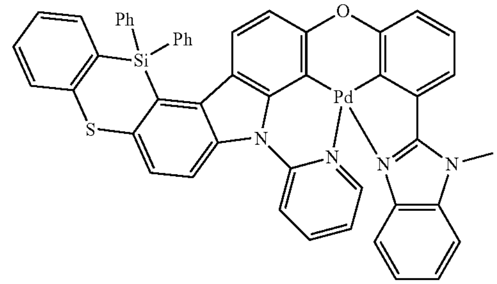
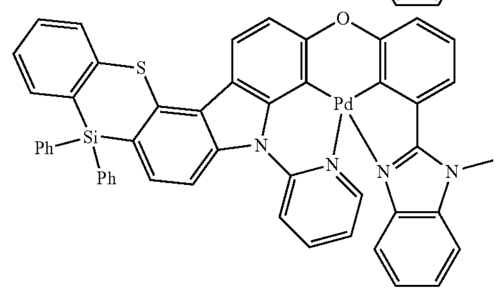
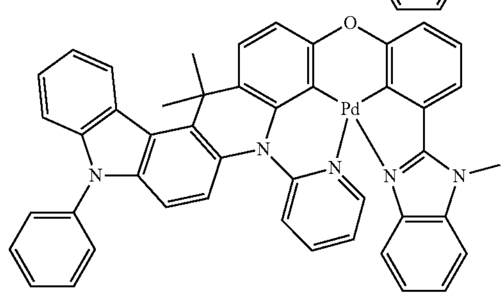
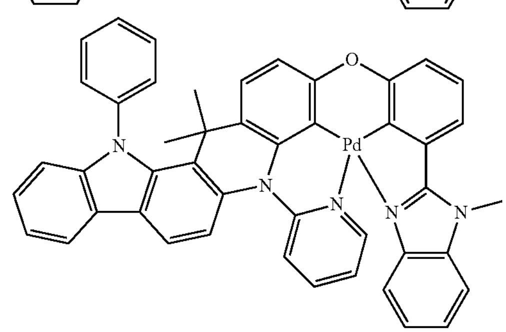
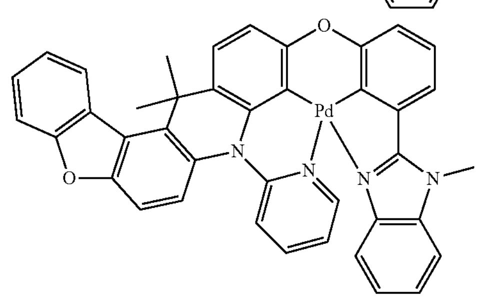

-continued
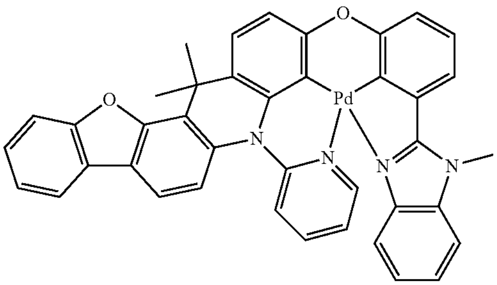
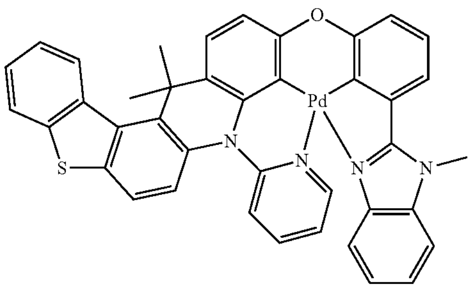
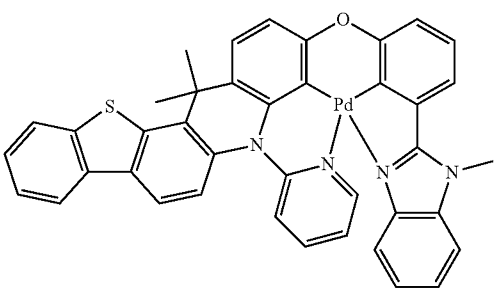
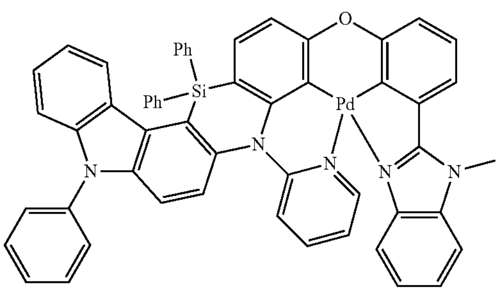
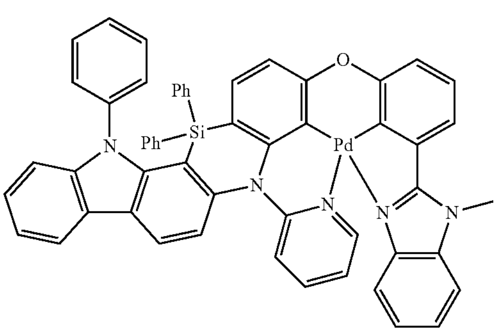
-continued
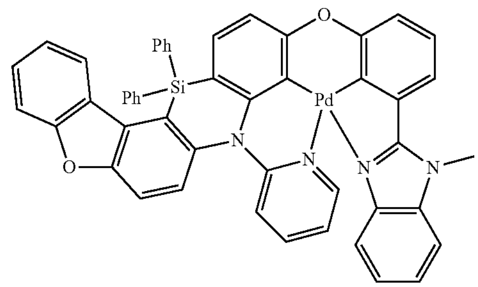
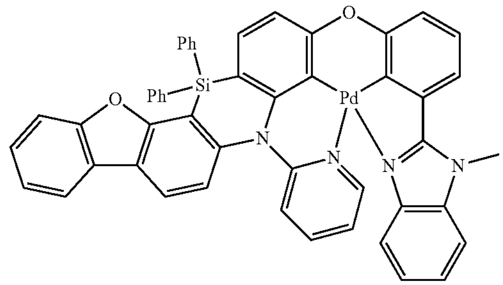
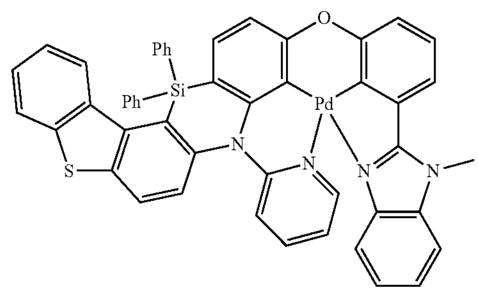
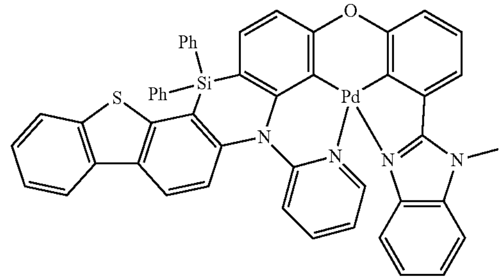
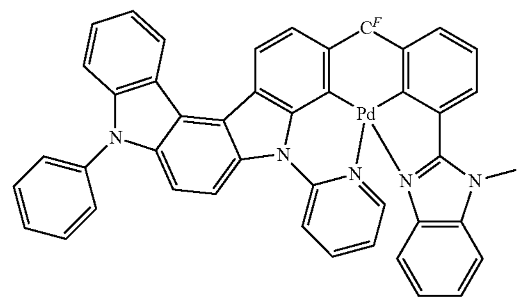

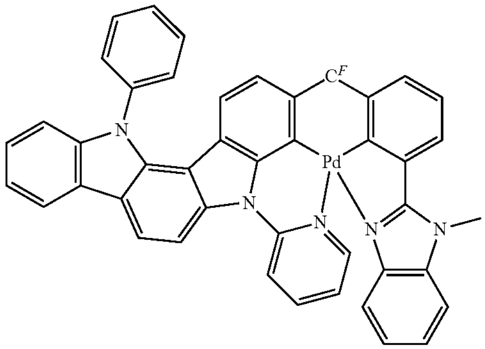
N
CF
Pd
N
N
N
N
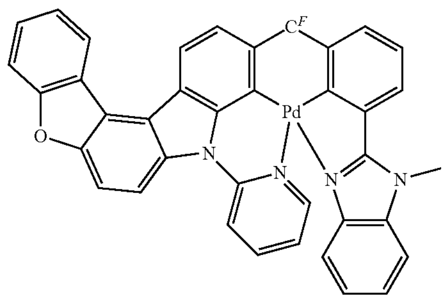
O
CF
Pd
N
N
N
N
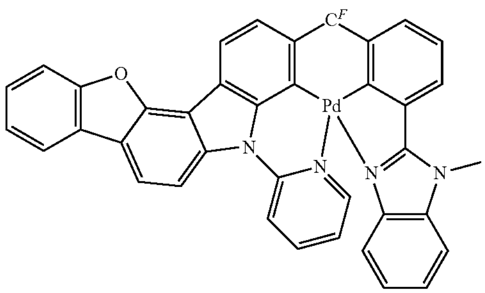
O
CF
Pd
N
N
N
N
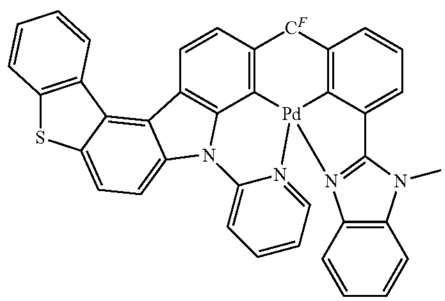
S
CF
Pd
N
N
N
N
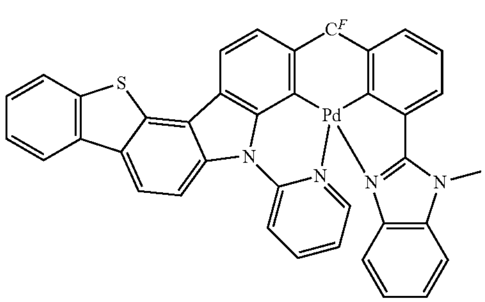
S
CF
Pd
N
N
N
N
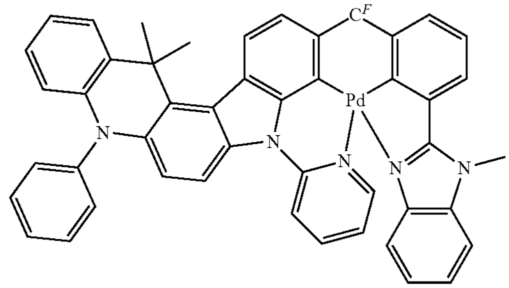
CF
Pd
N
N
N
N
N
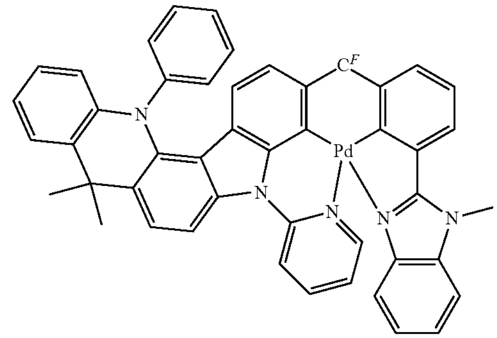
N
CF
Pd
N
N
N
N
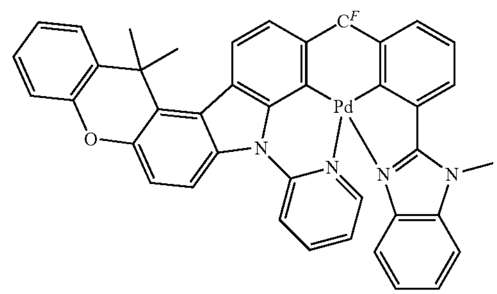
CF
Pd
O
N
N
N
N
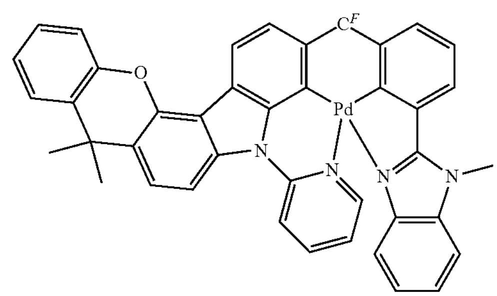
O
CF
Pd
N
N
N
N
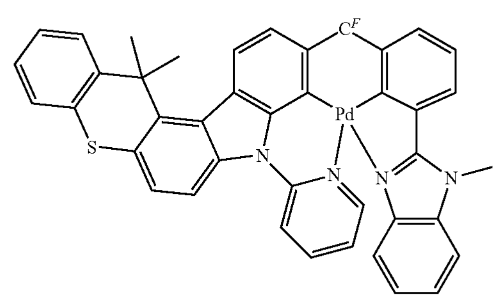
CF
Pd
S
N
N
N
N -continued
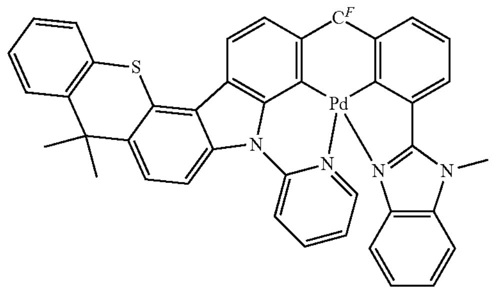
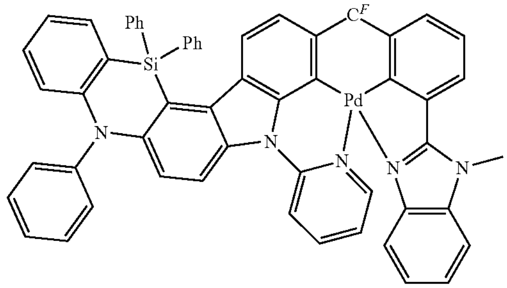
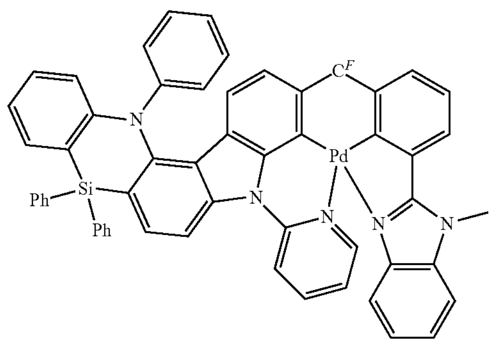
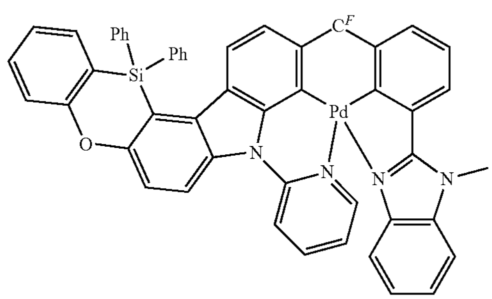
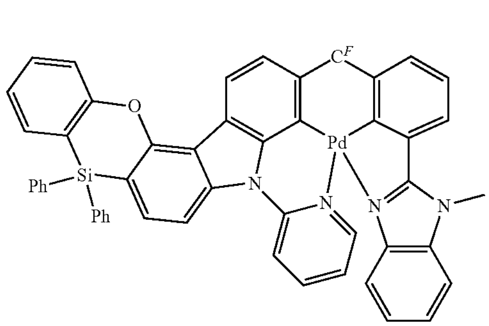
-continued
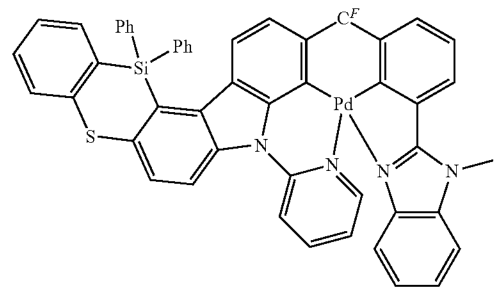
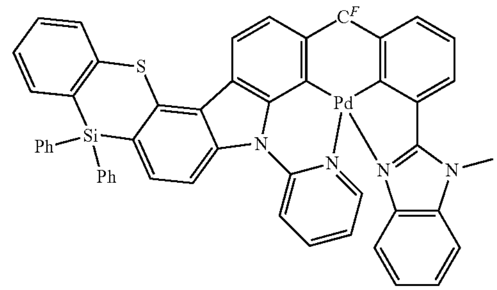
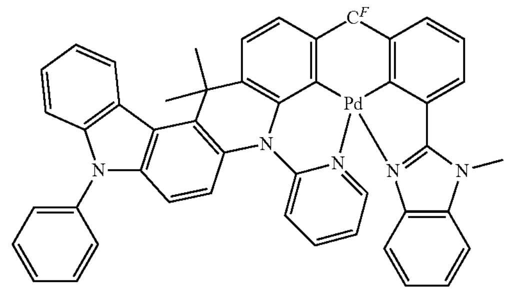
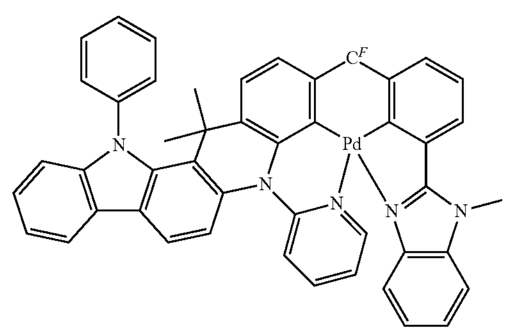
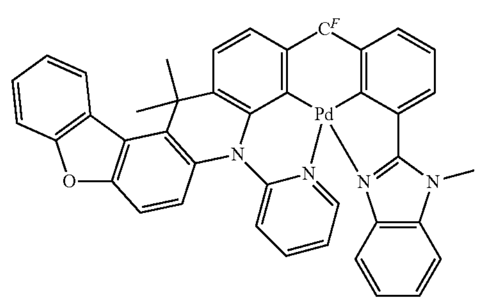

-continued
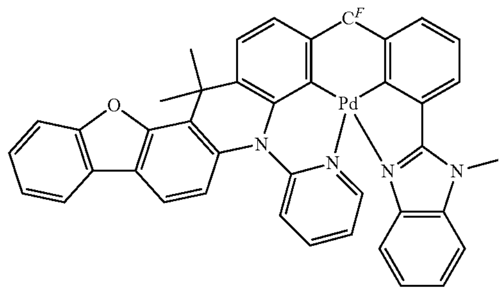
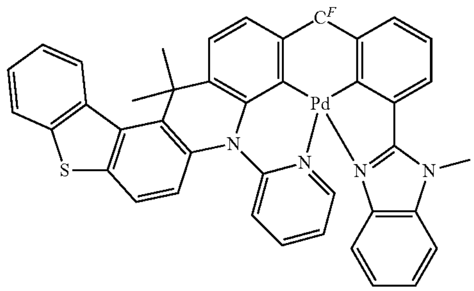
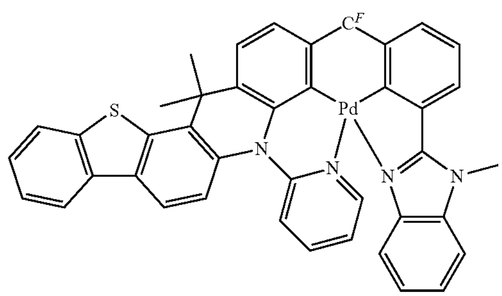
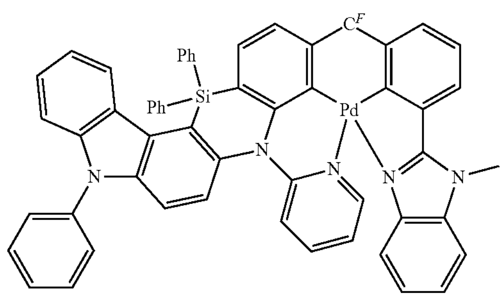
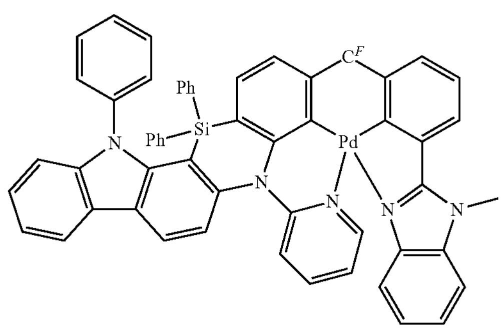
-continued
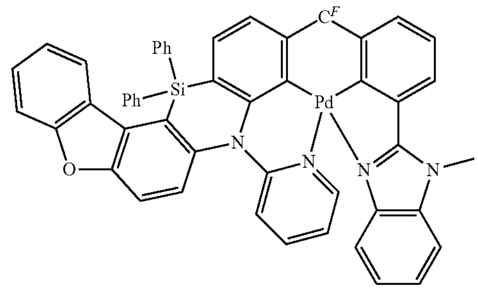
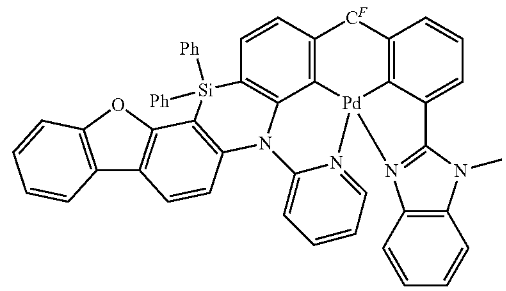
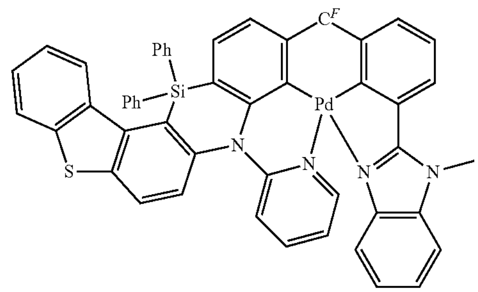
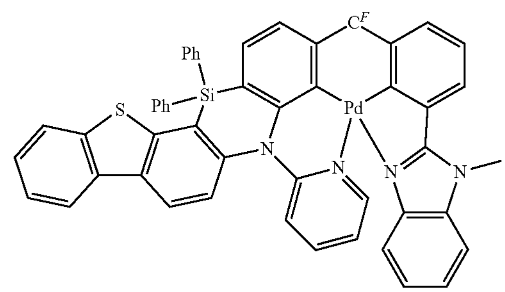
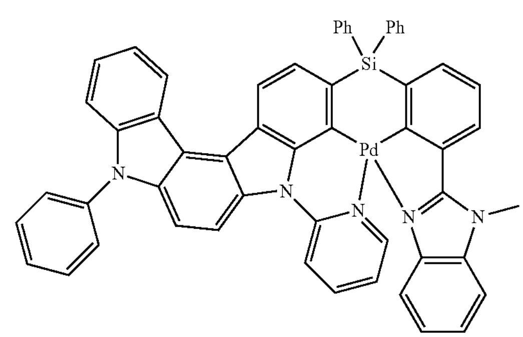

-continued
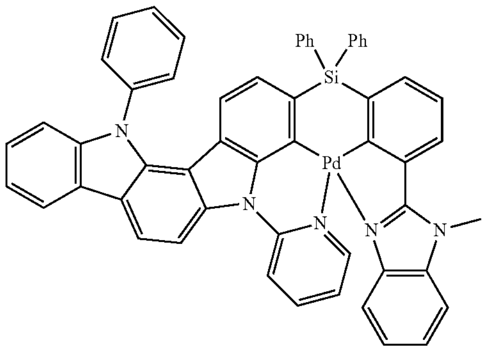
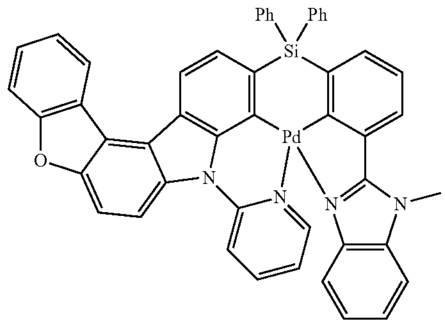
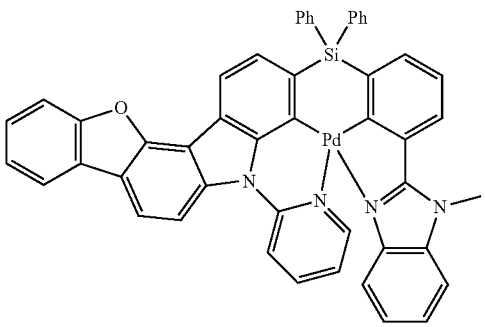
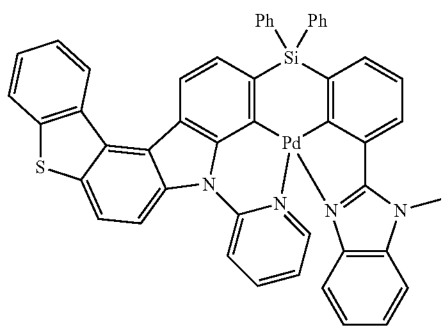
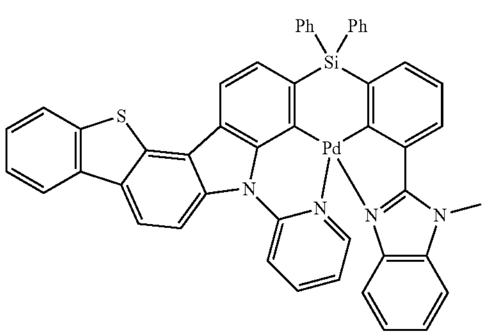
-continued
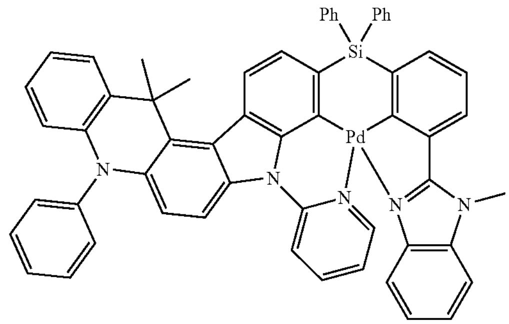
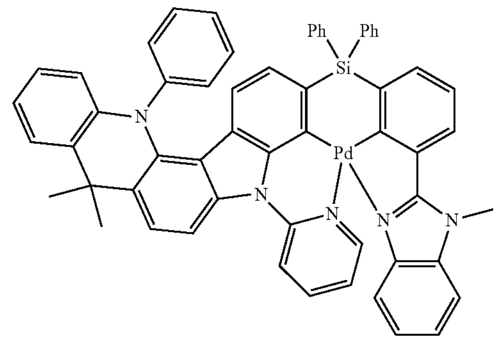
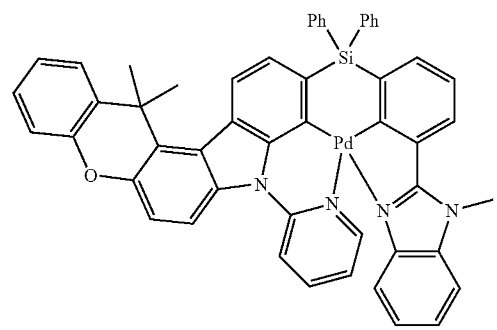
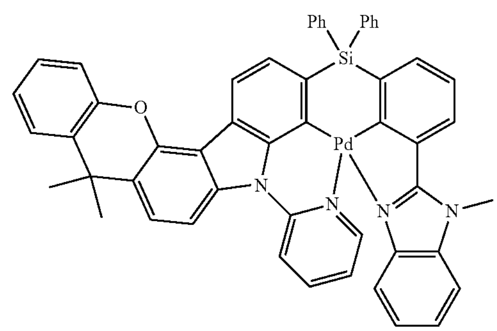
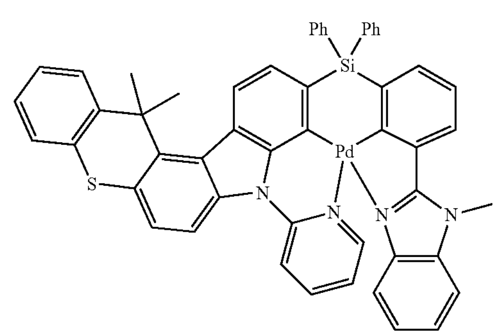

-continued
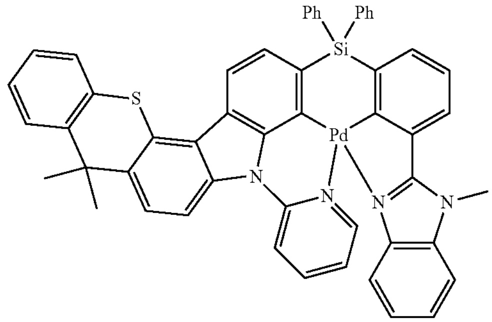
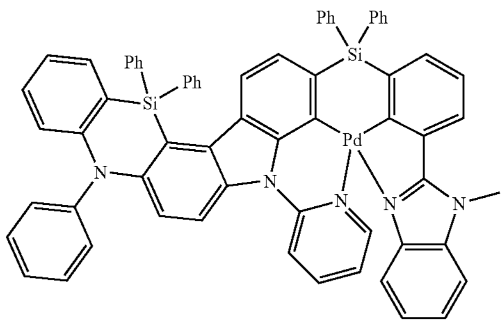
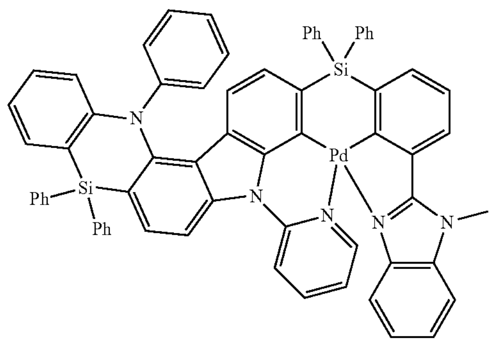
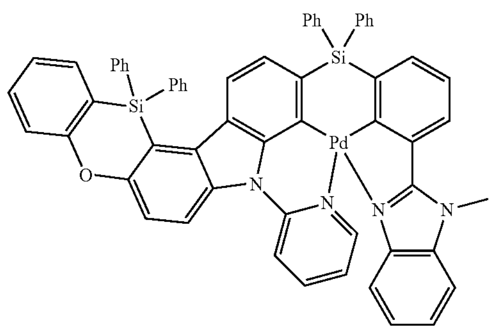
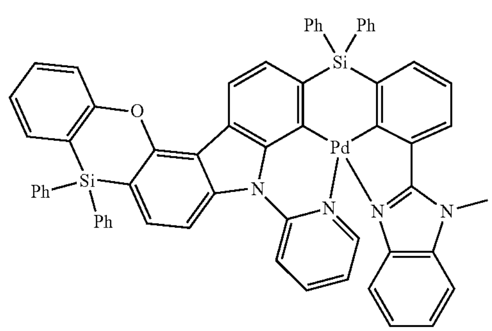
-continued
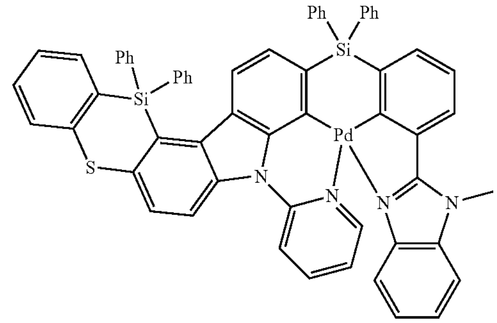
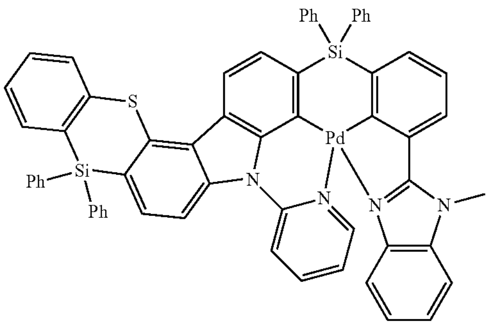
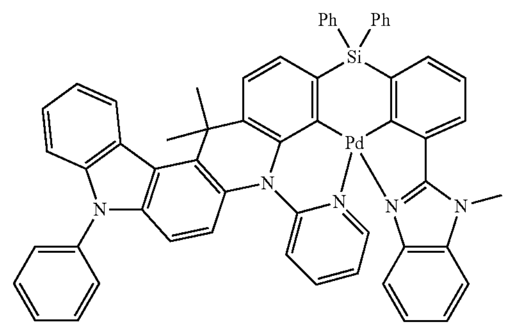
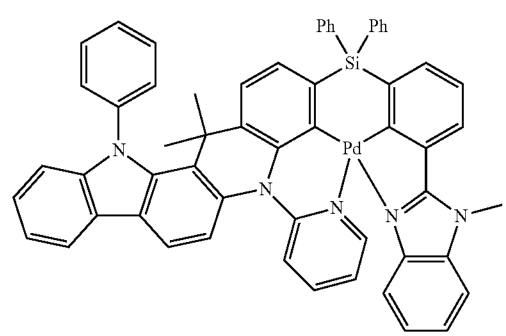
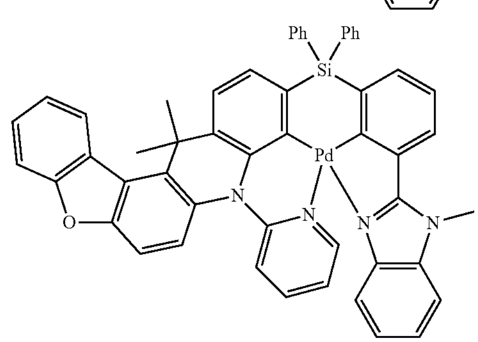

-continued
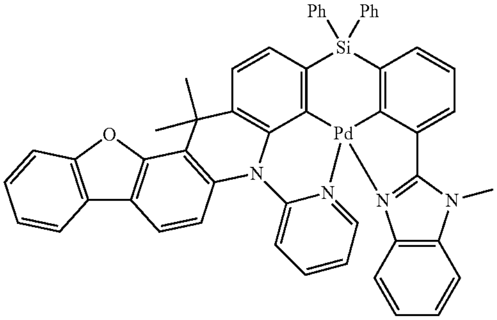
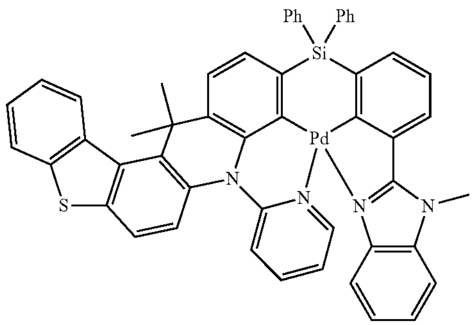
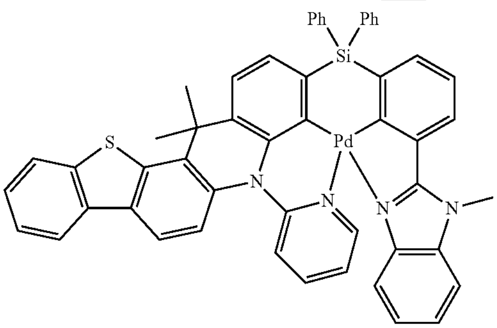
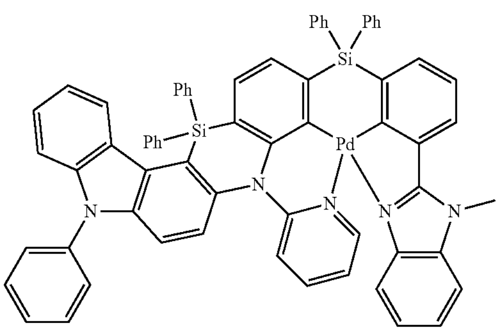
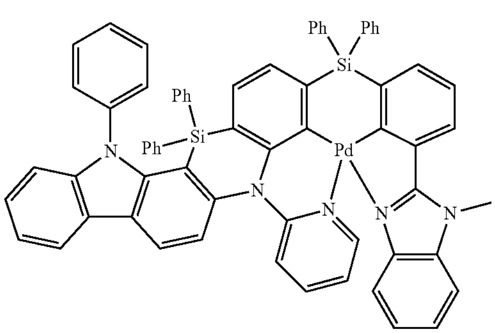
-continued
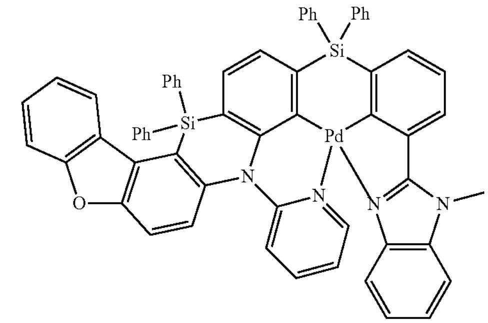
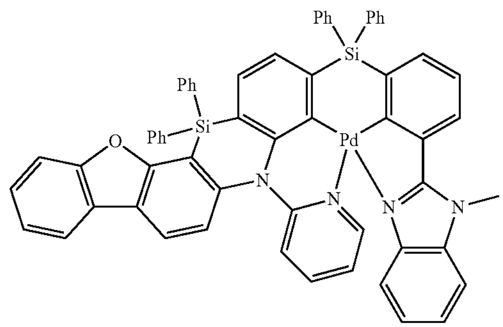
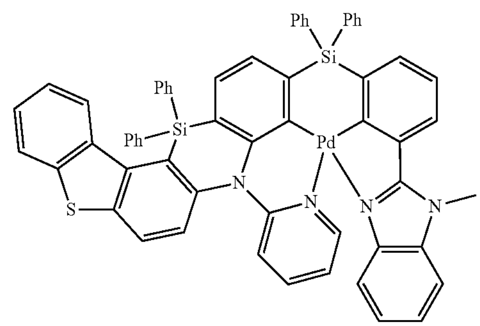
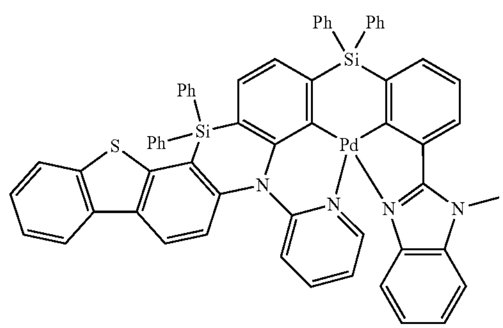
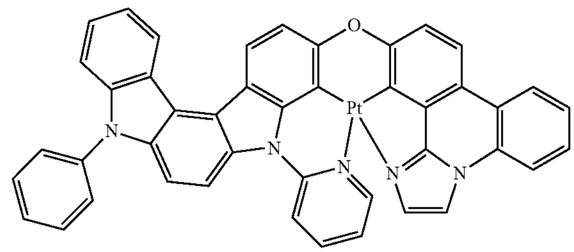

-continued
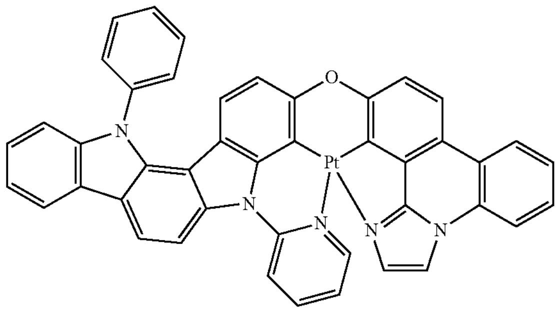
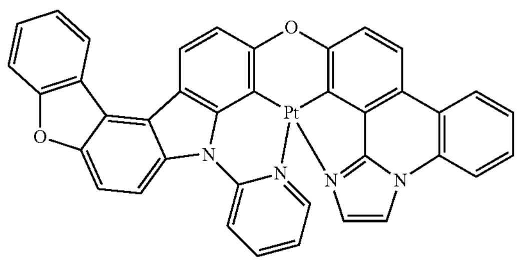
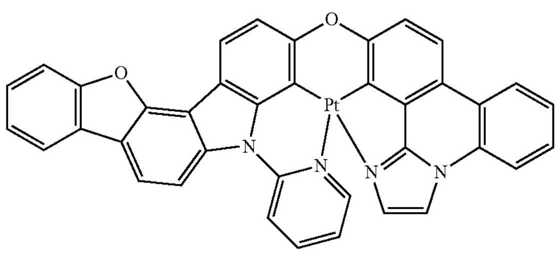
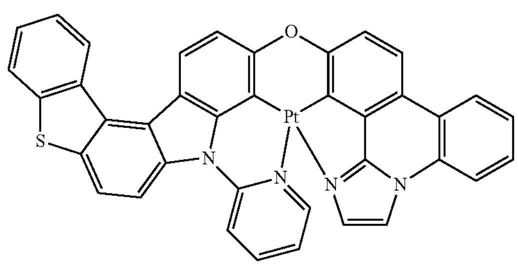
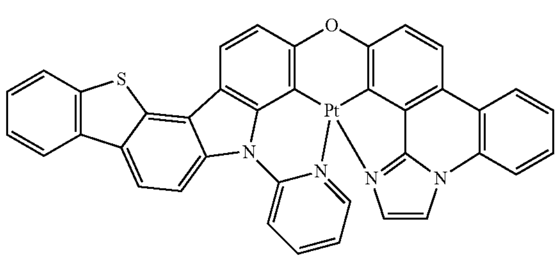
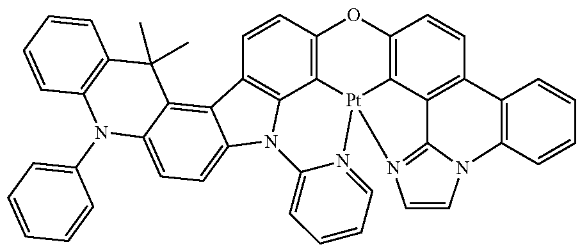
-continued
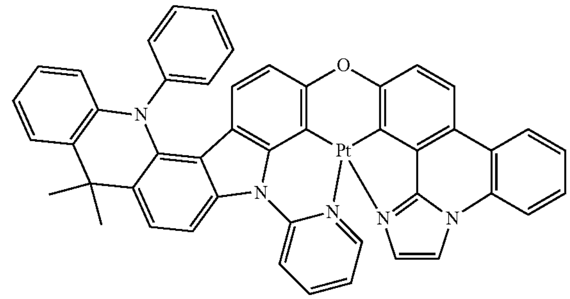
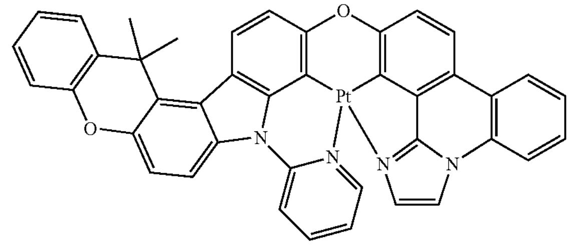
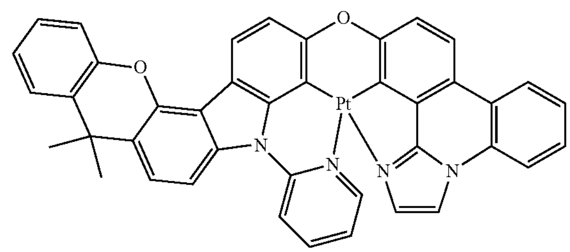
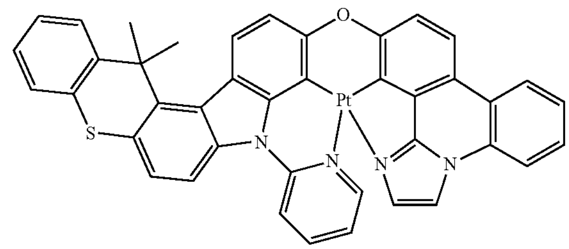
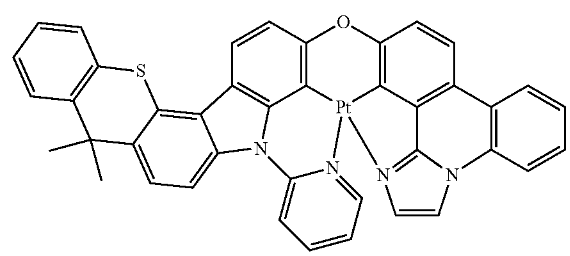
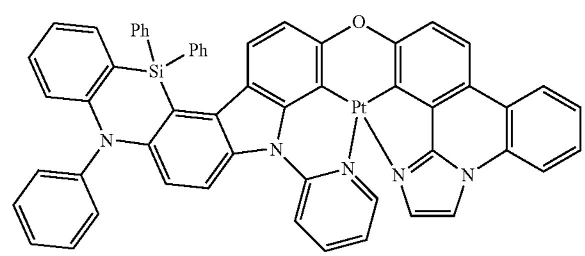

-continued
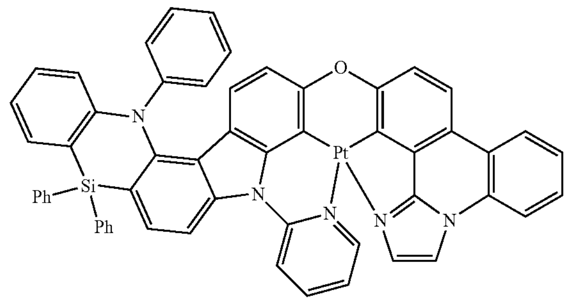
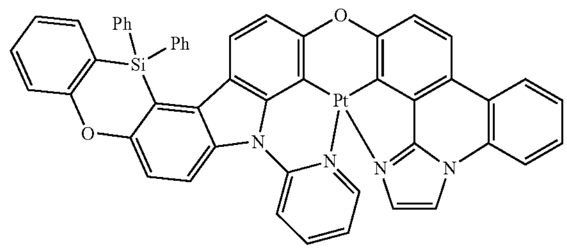
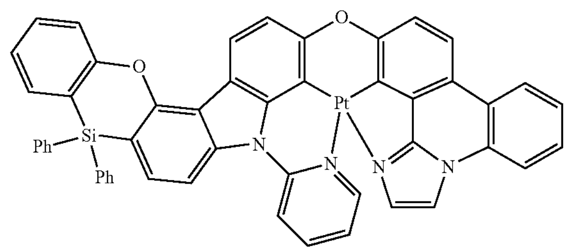
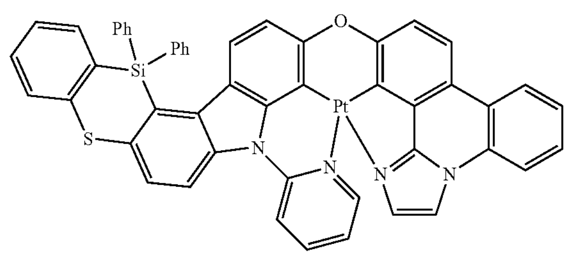
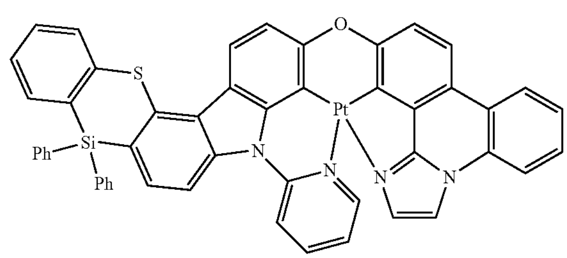
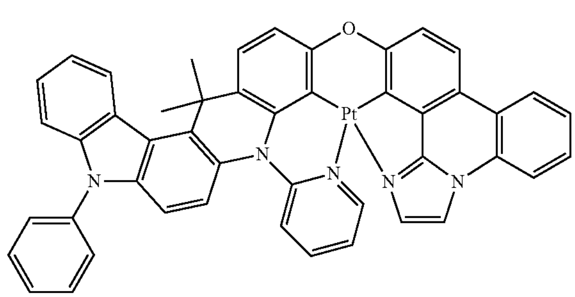
-continued
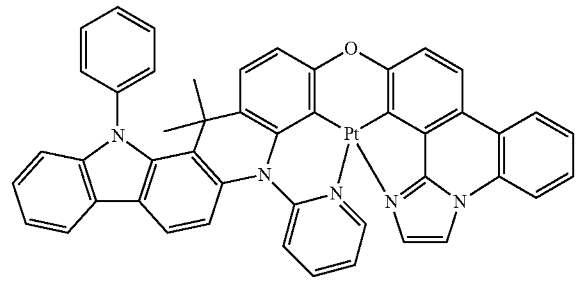
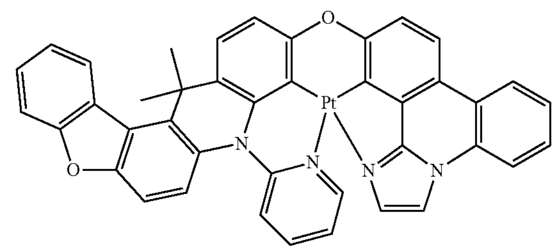
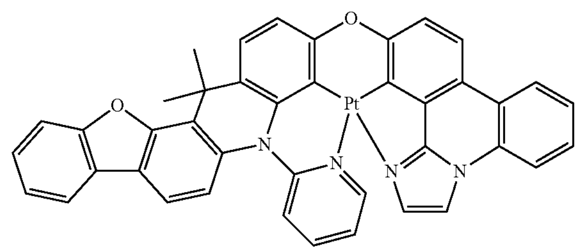
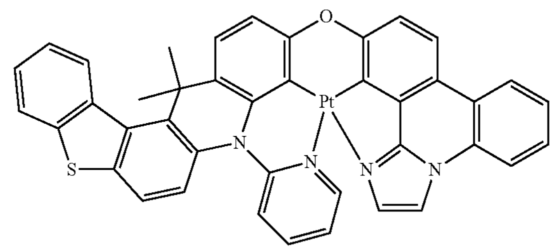
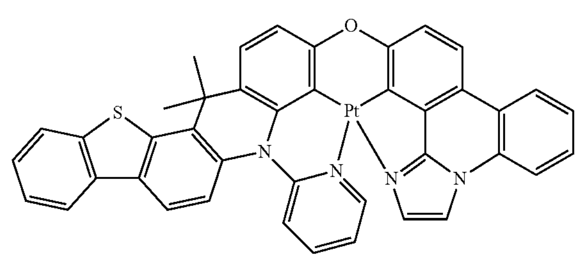
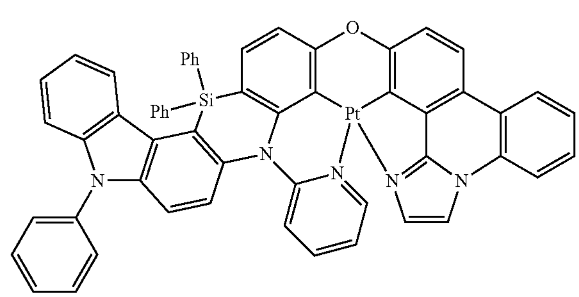

-continued
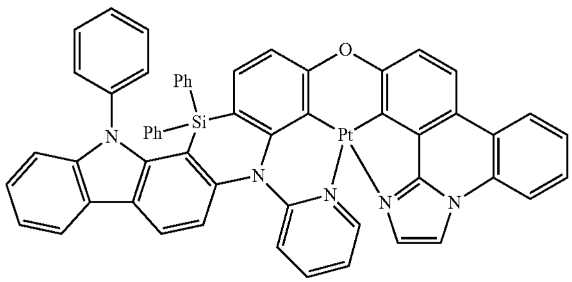
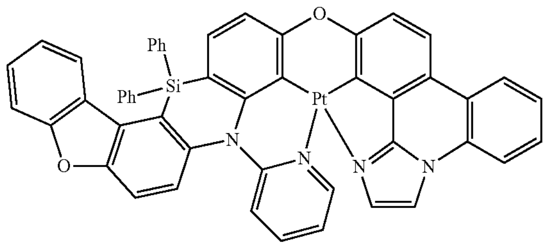
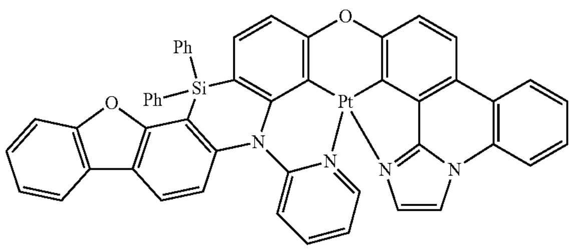
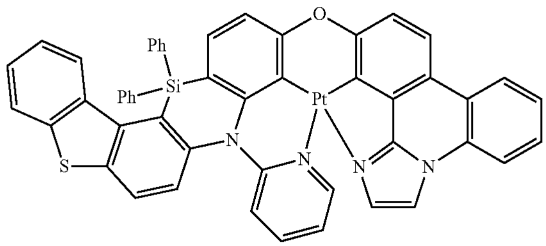
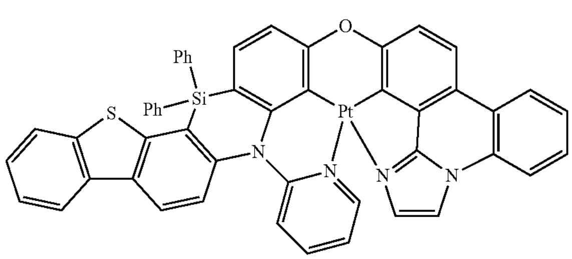
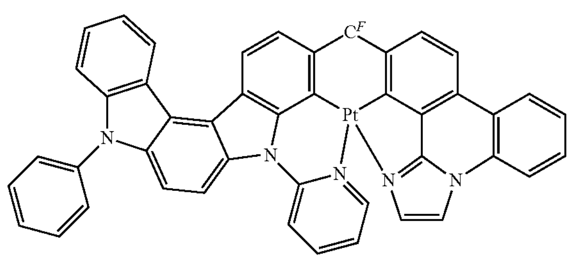
-continued
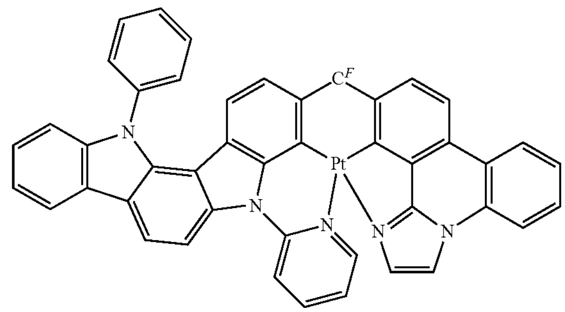
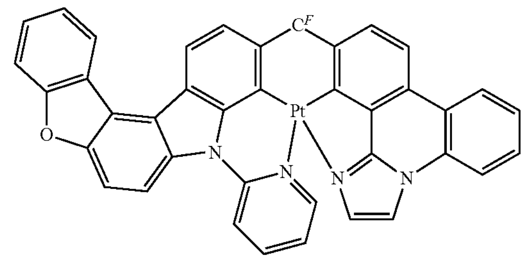
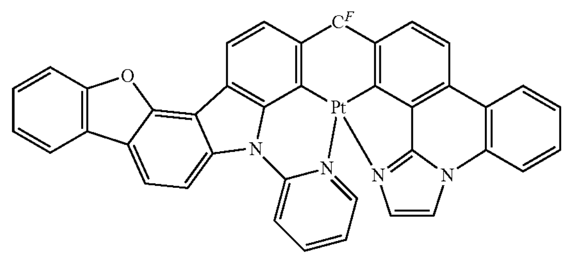
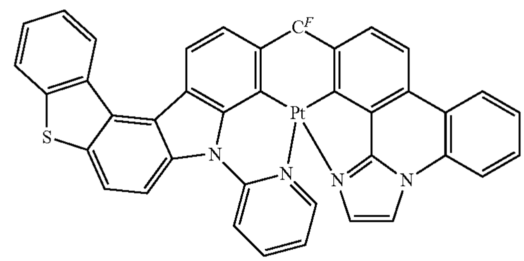
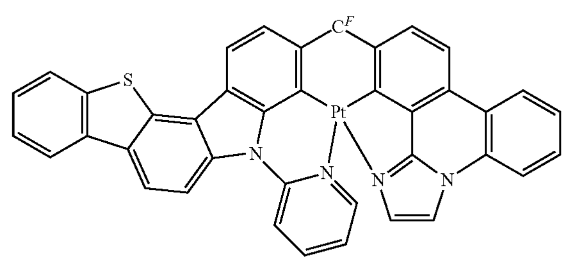
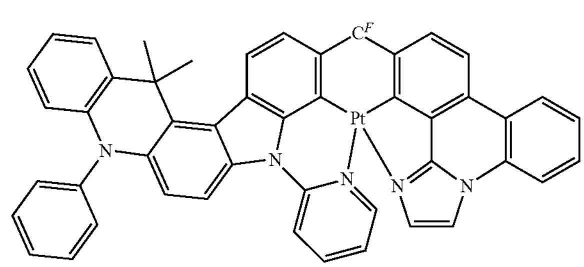

-continued
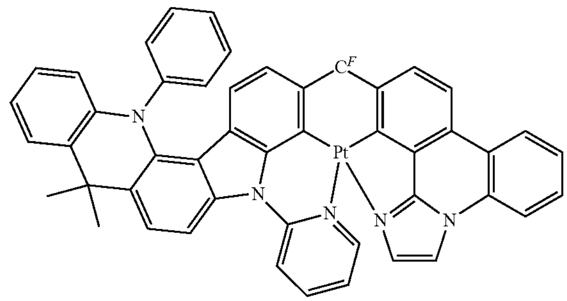
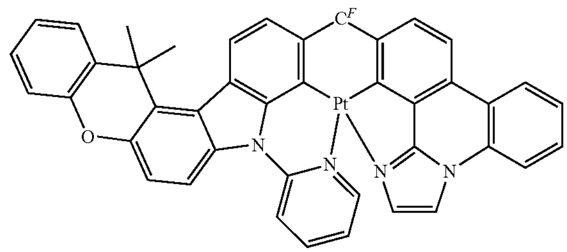
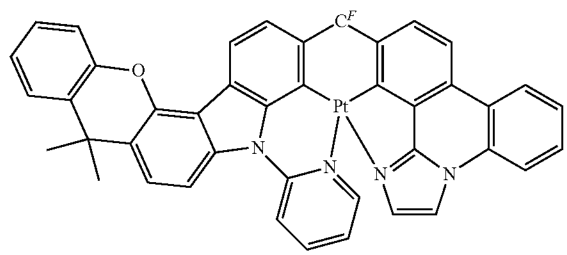
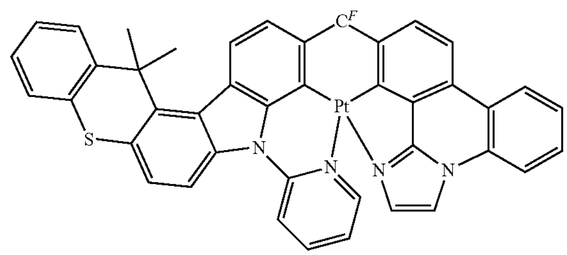
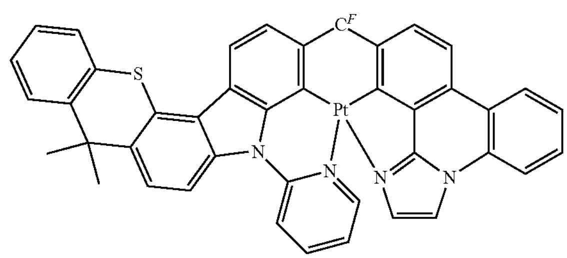
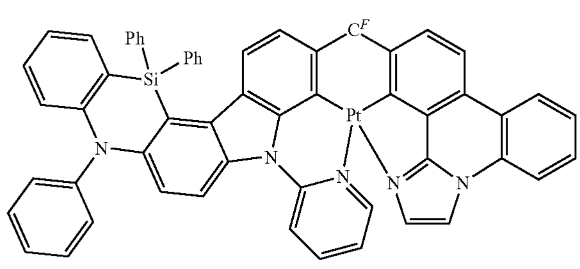
-continued
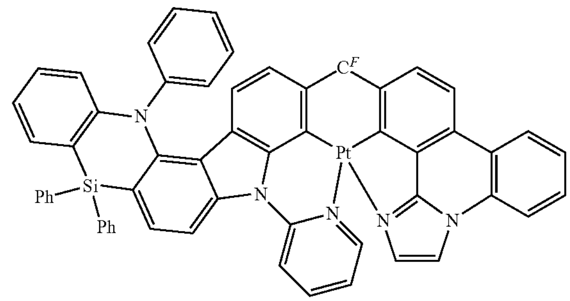
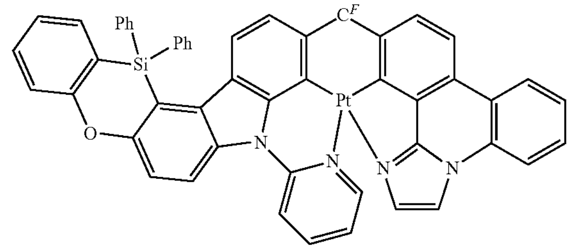
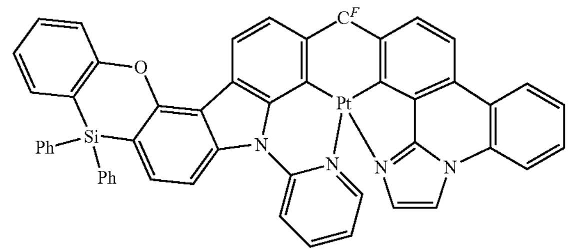
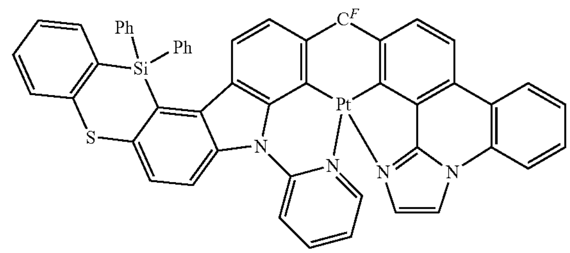
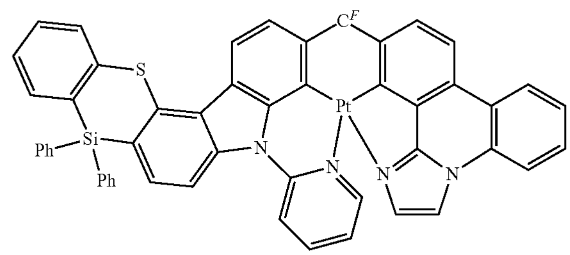
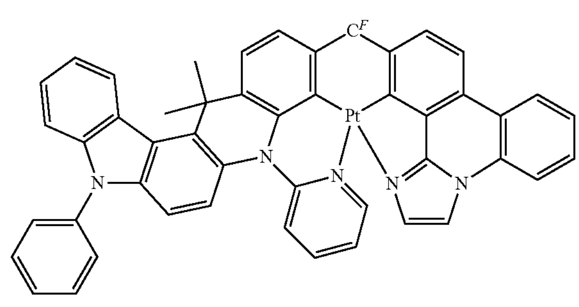

-continued
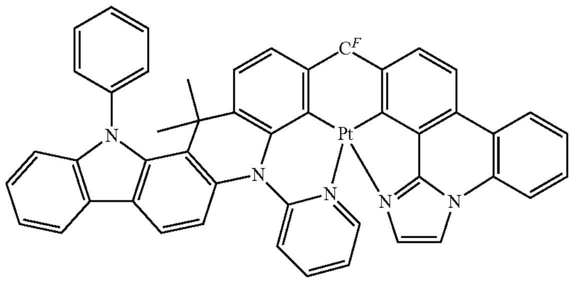
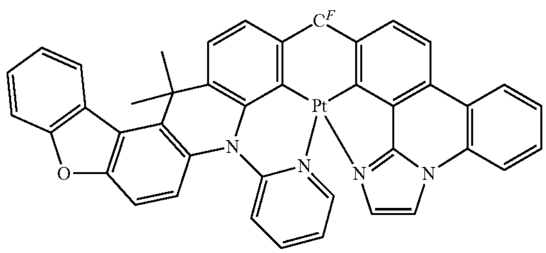
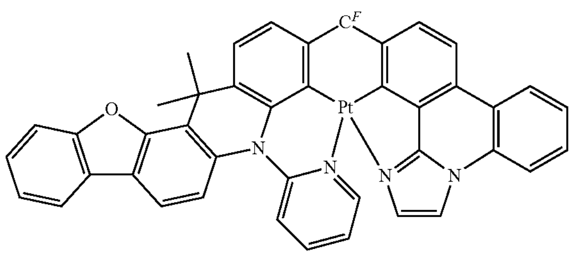
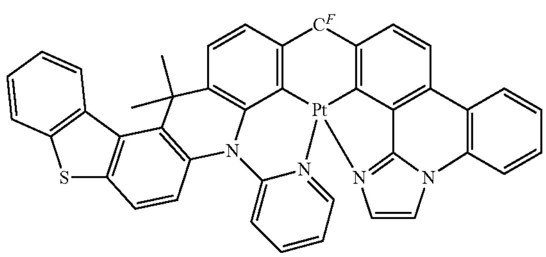
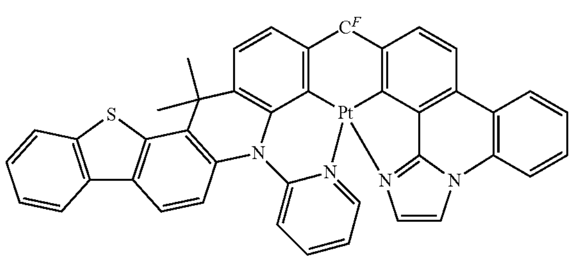
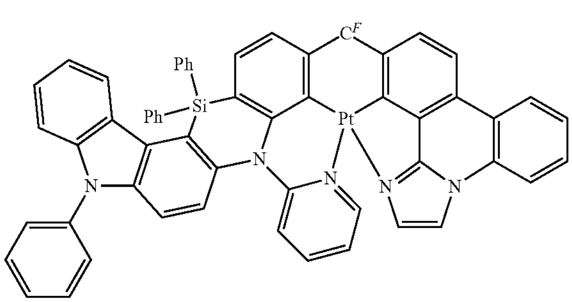
-continued
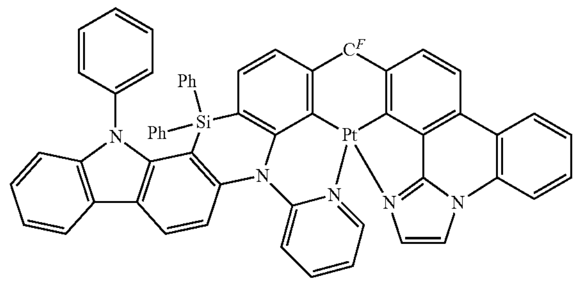
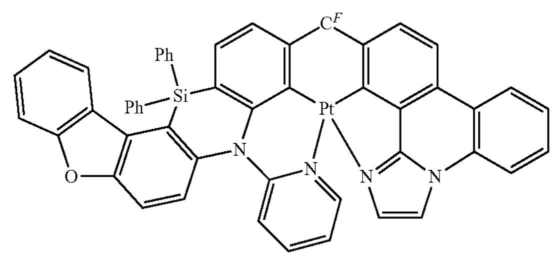
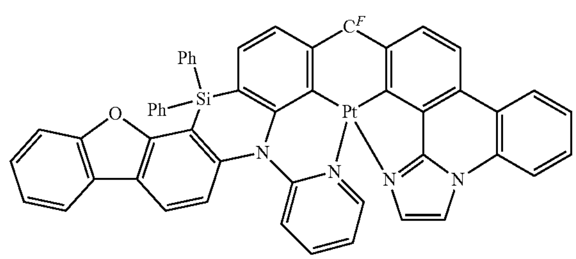
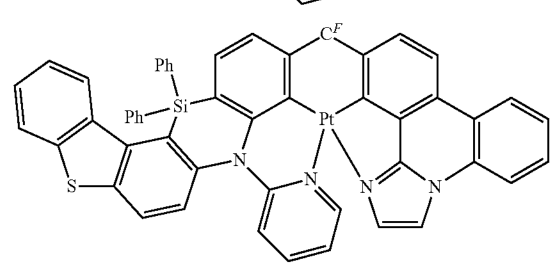
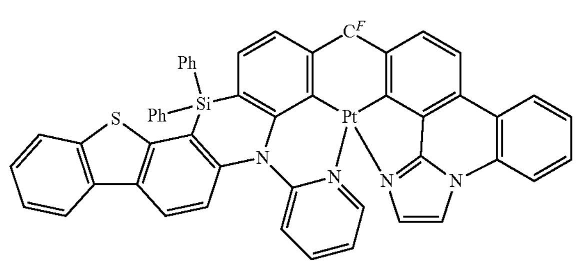
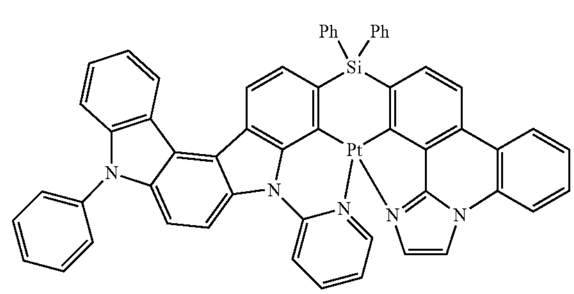

-continued
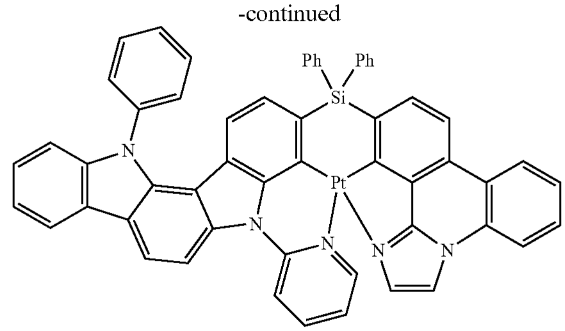
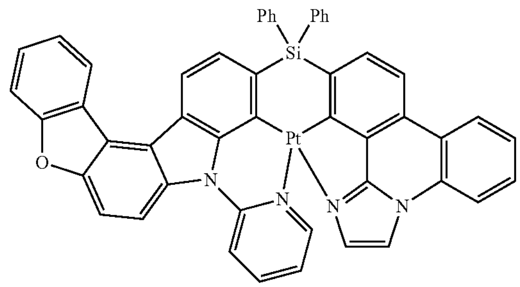
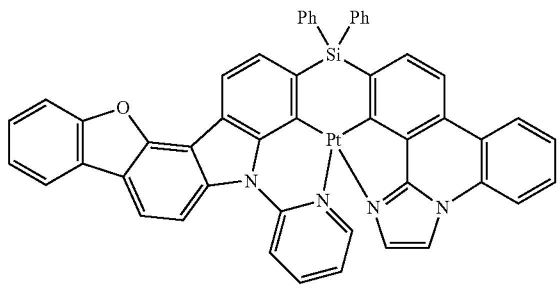
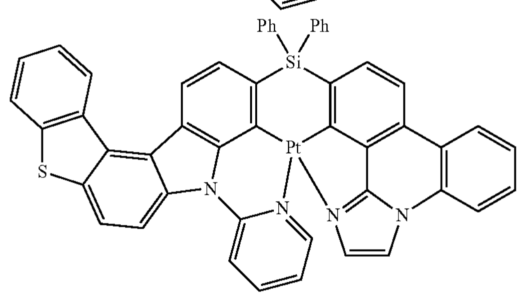
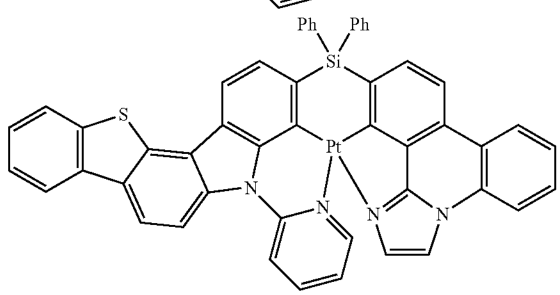
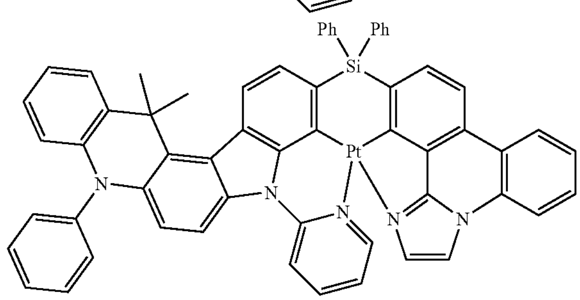
-continued
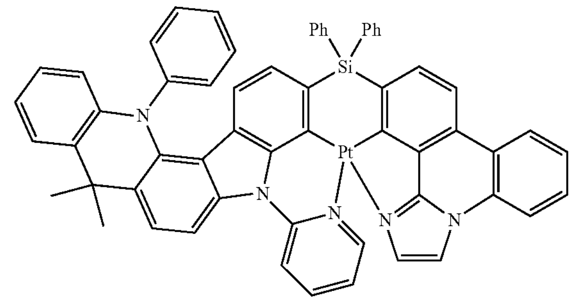
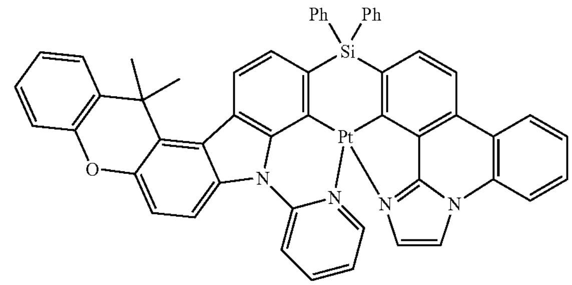
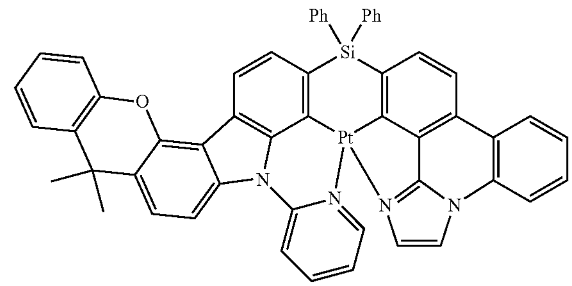
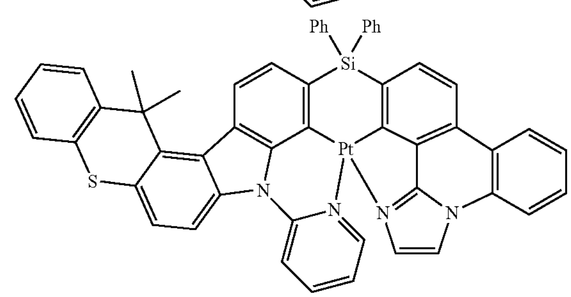
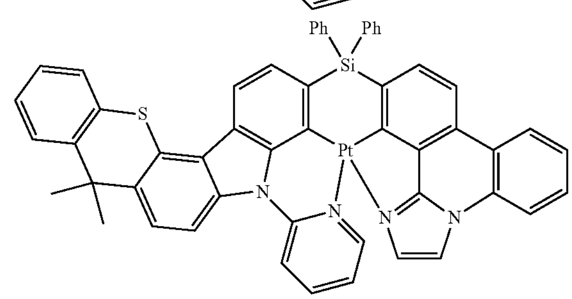
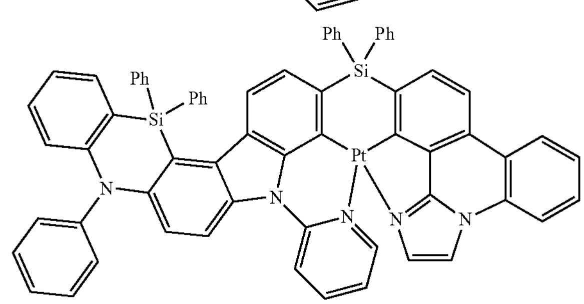

-continued
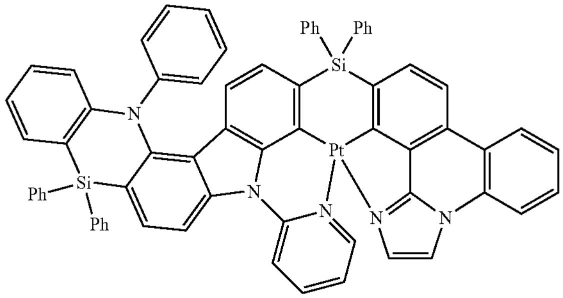
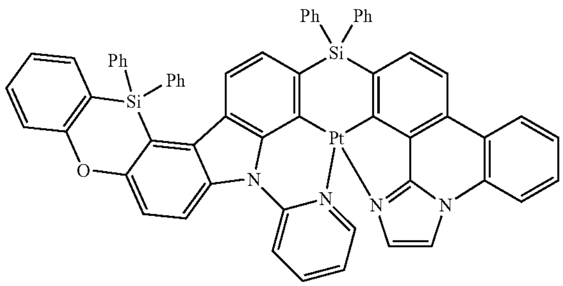
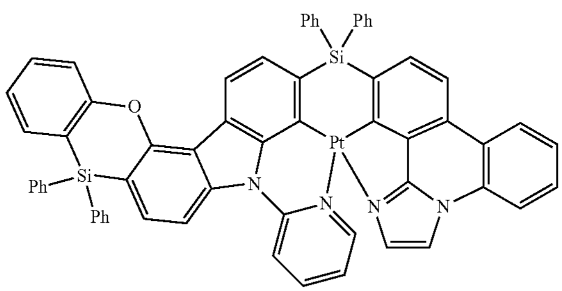
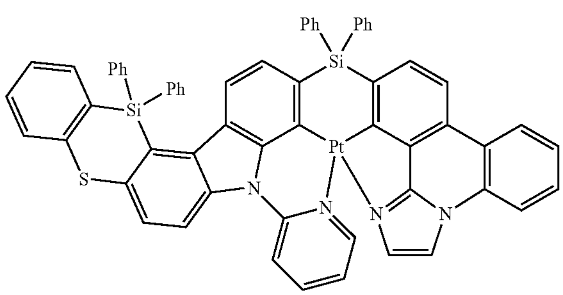
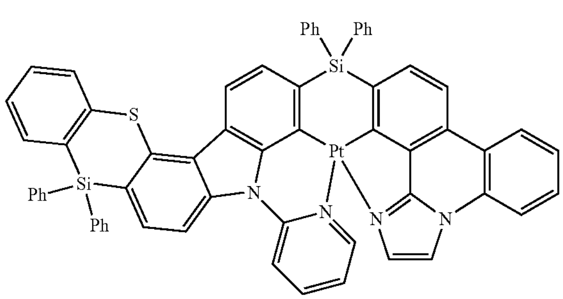
-continued
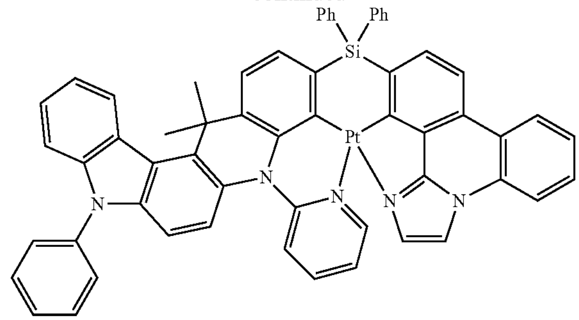
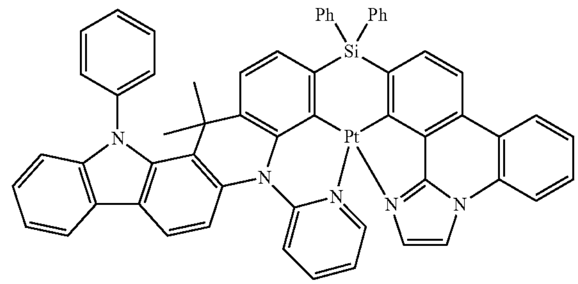
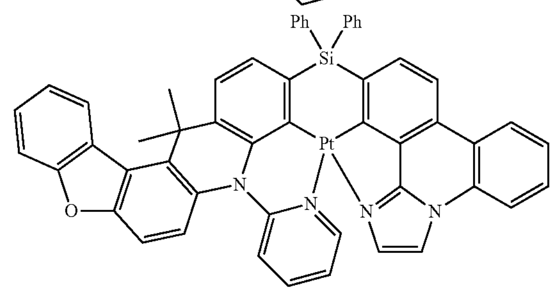
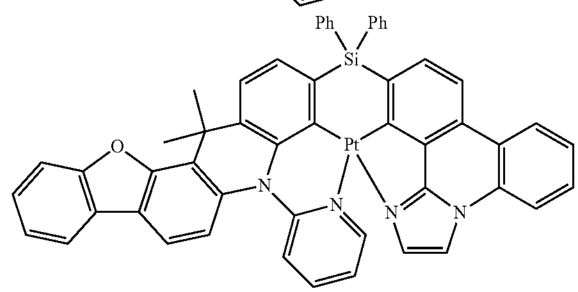
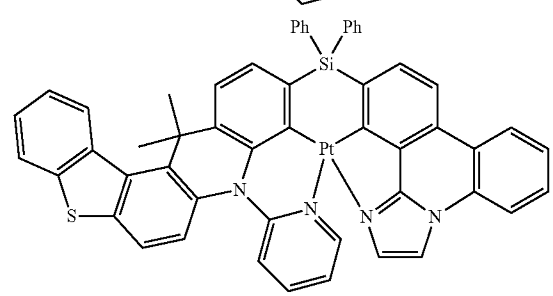
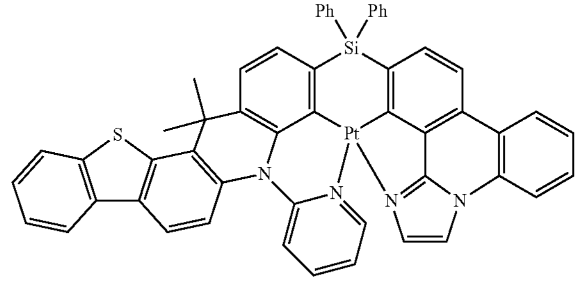

-continued
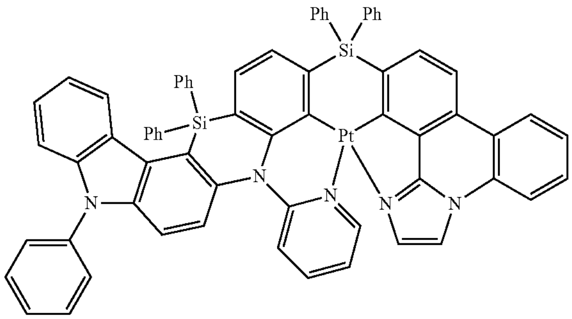
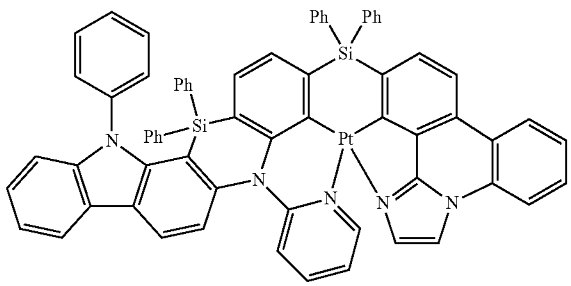
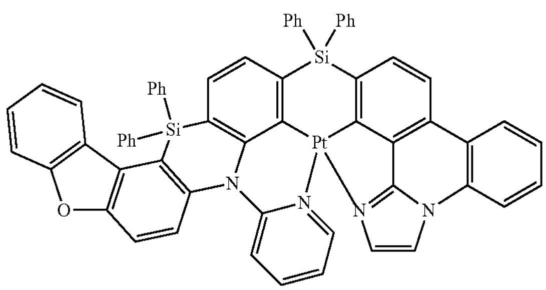
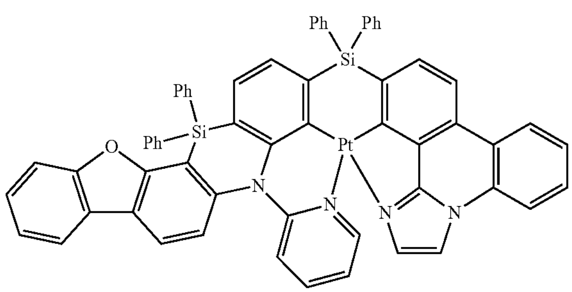
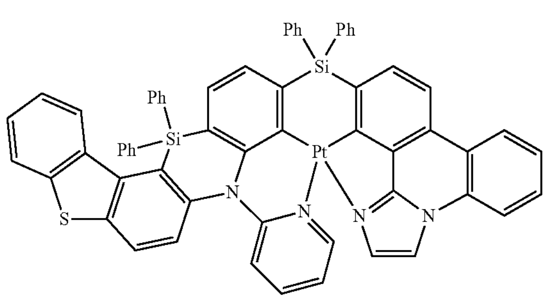
-continued
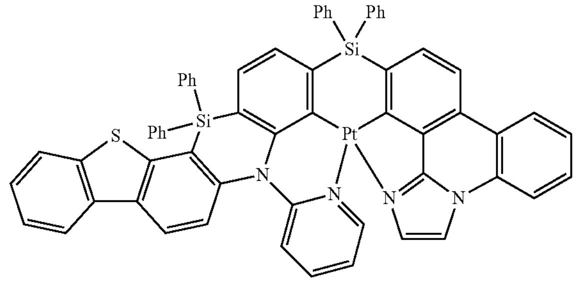
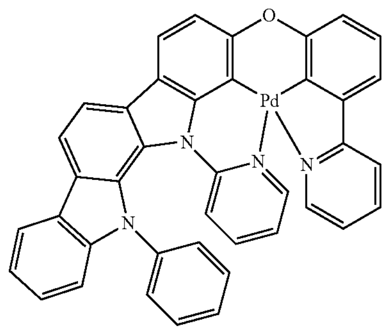
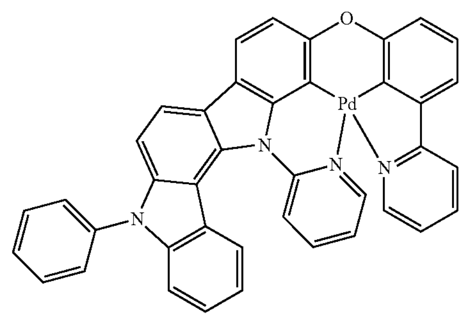
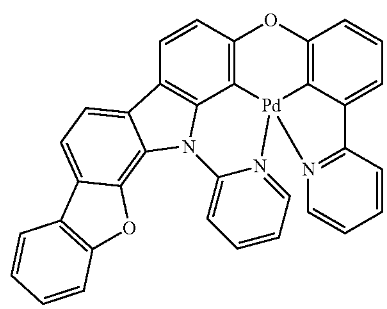
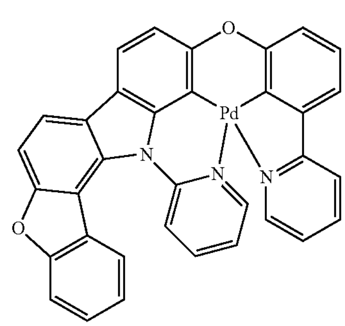

-continued
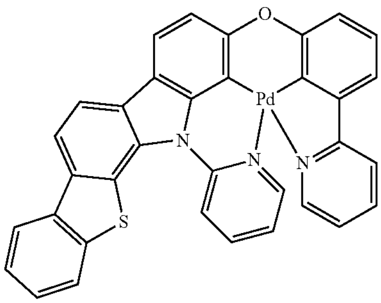
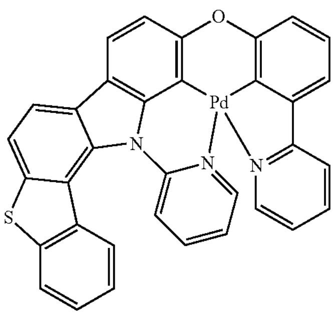
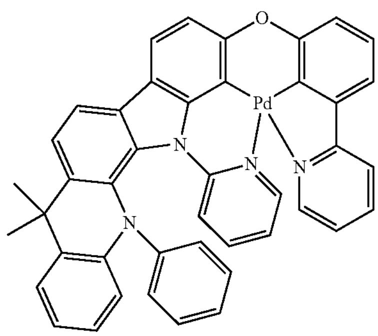
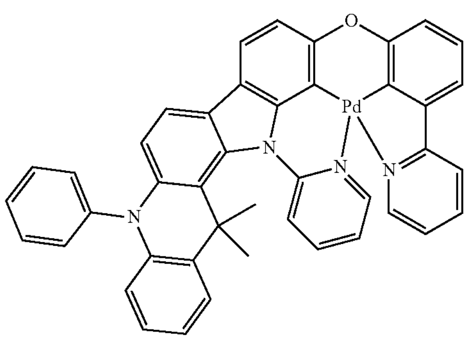
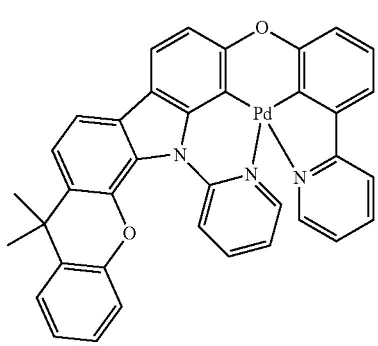
-continued
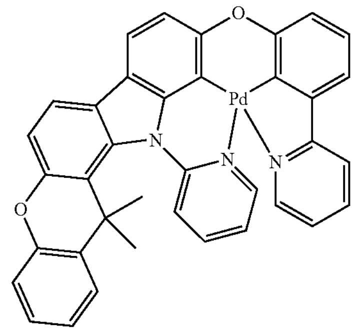
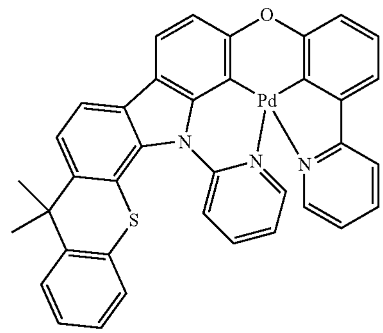
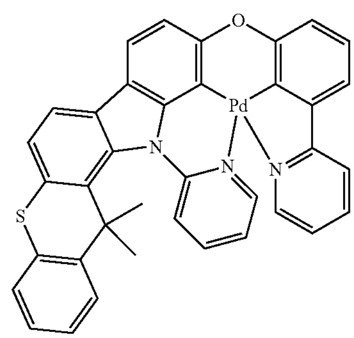
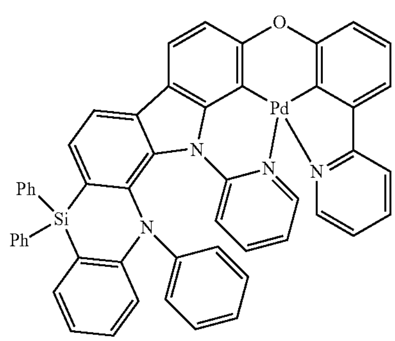
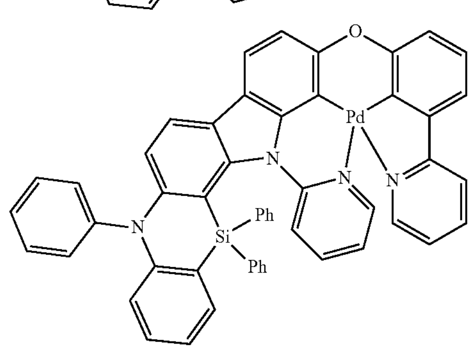

-continued
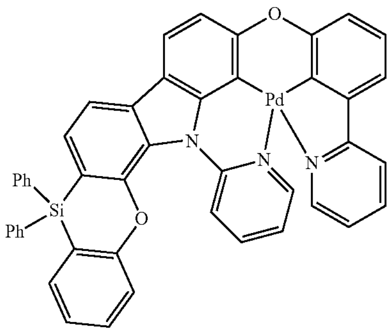
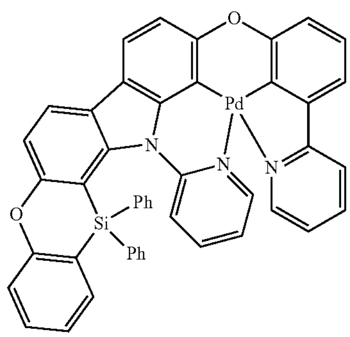
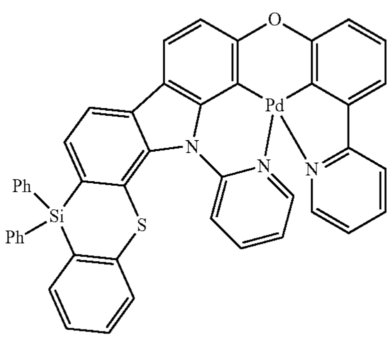
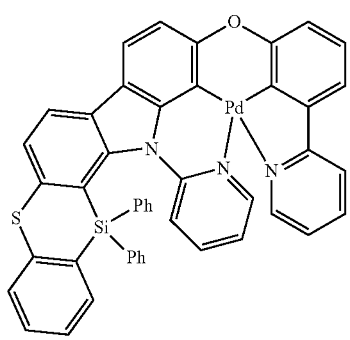
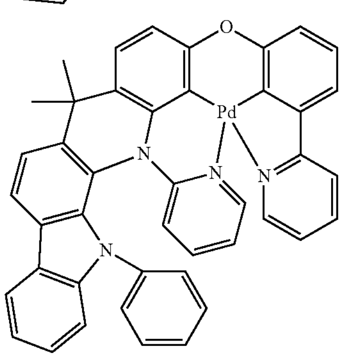
-continued
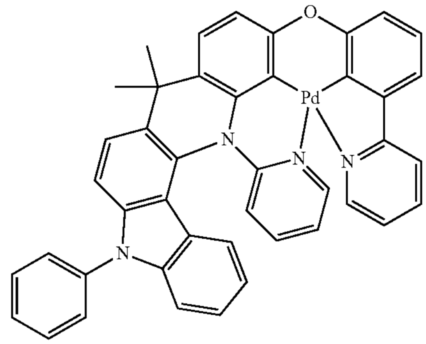
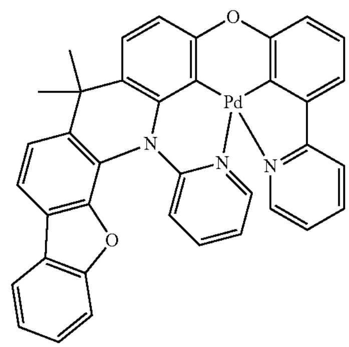
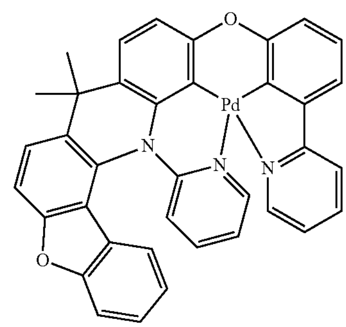
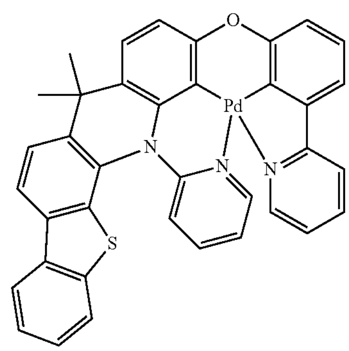
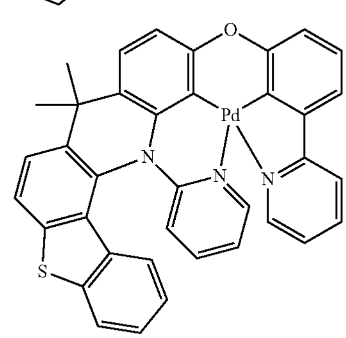

-continued
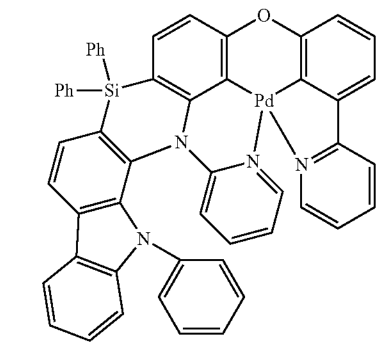
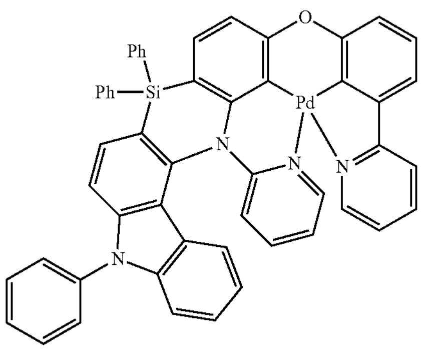
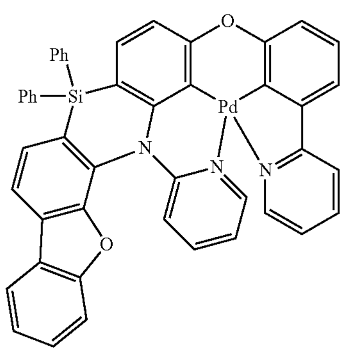
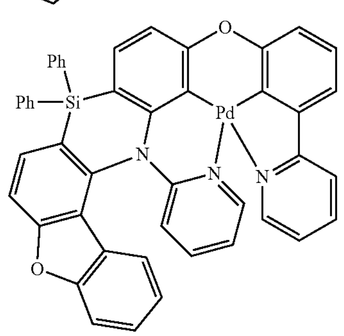
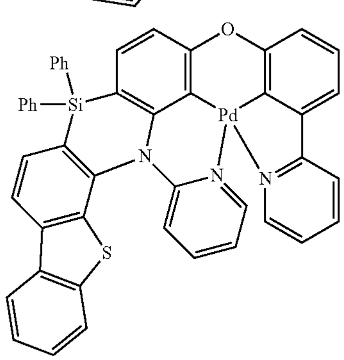
-continued
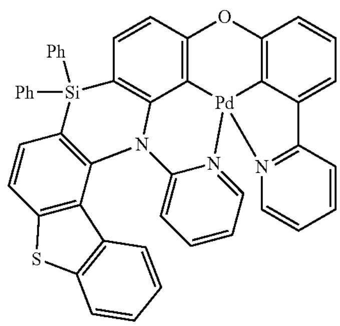
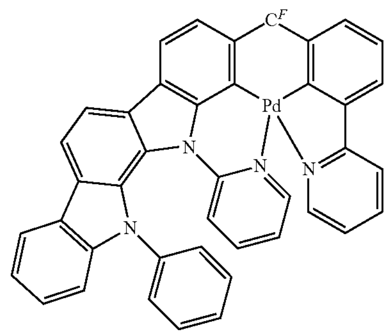
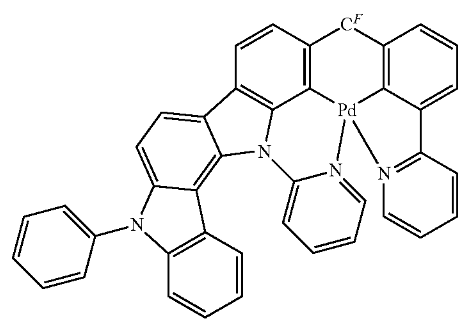
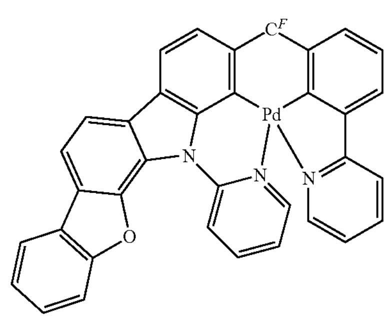
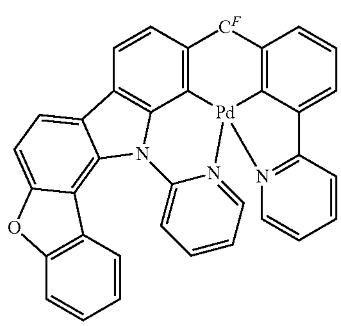

-continued
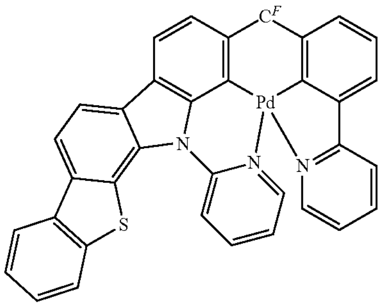
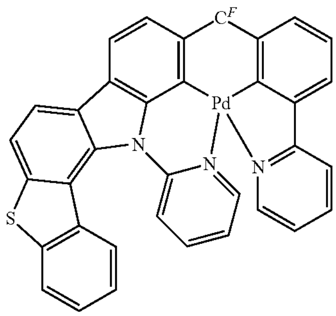
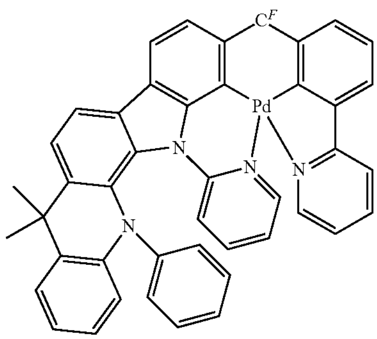
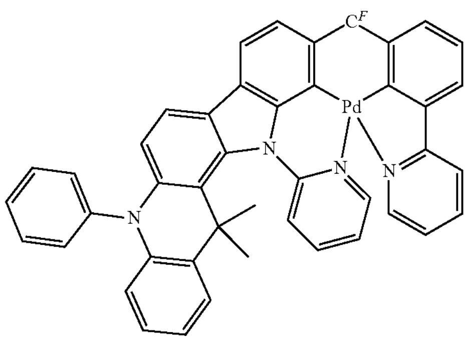
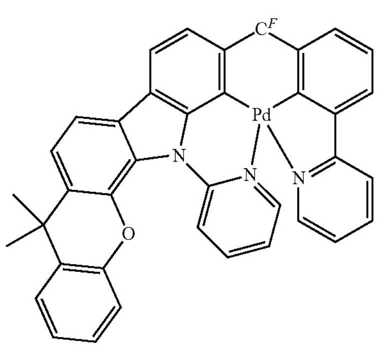
-continued
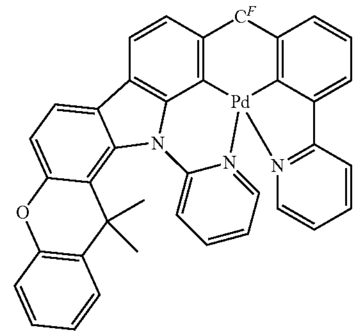
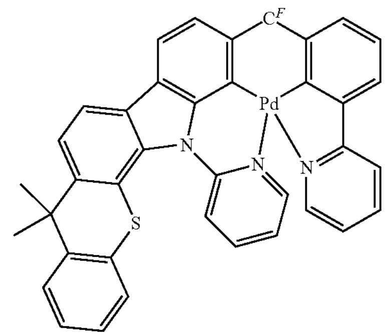
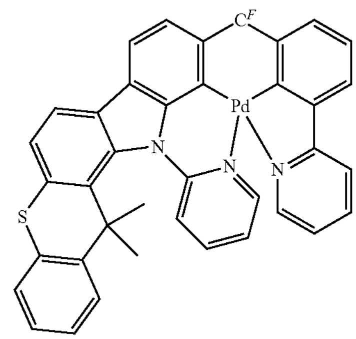
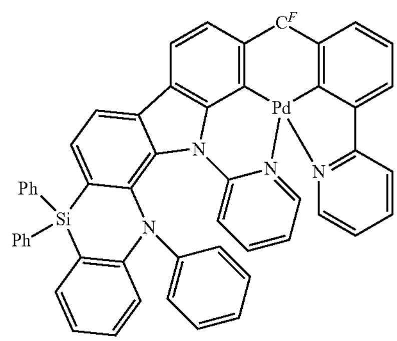
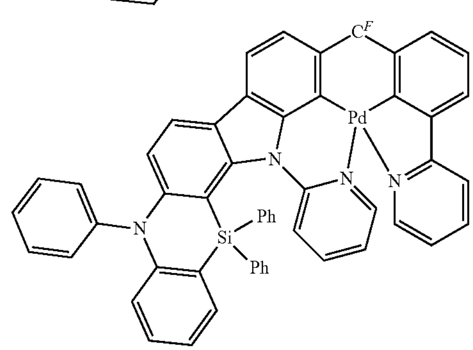

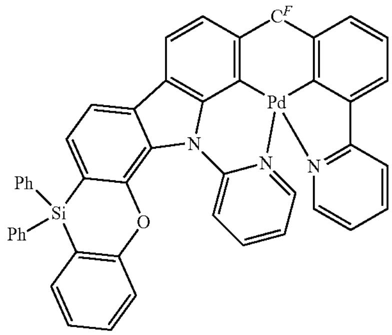
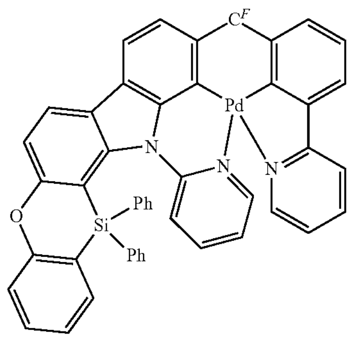
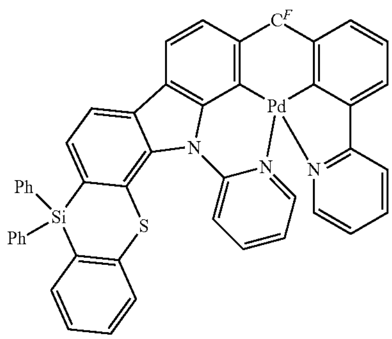
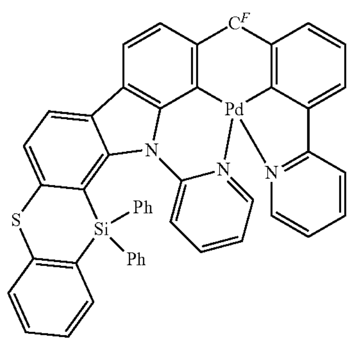
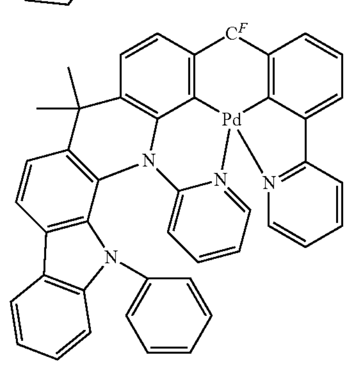
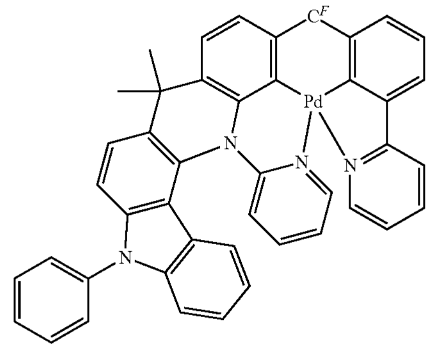
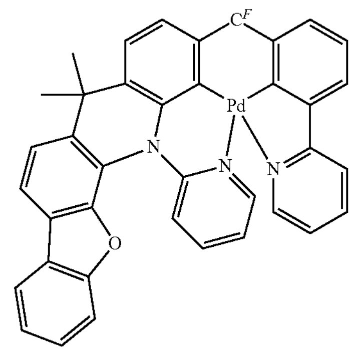
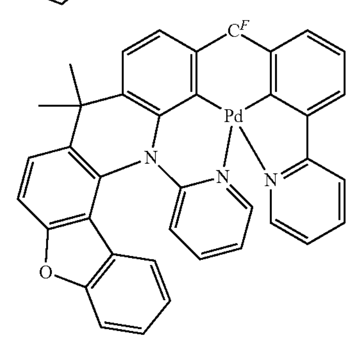
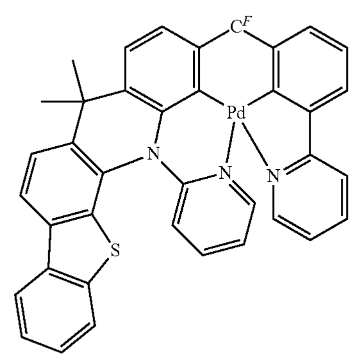
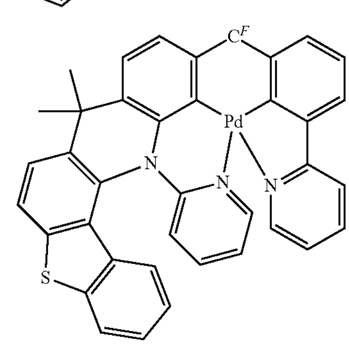

-continued
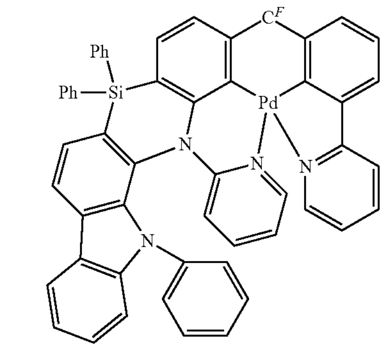
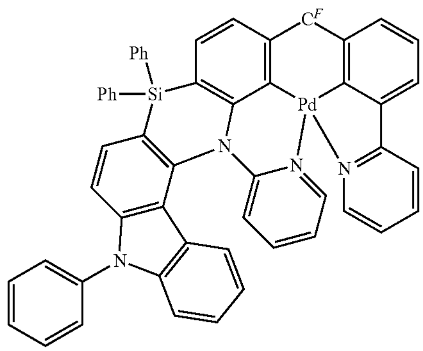
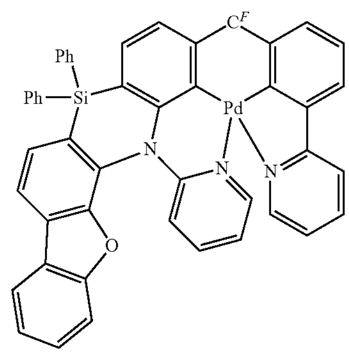
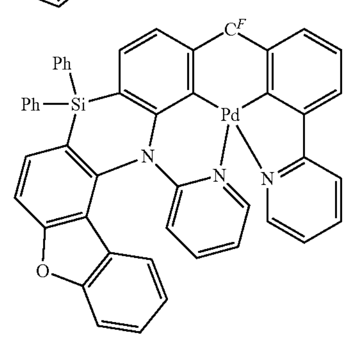
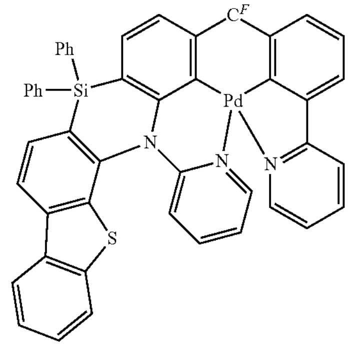
-continued
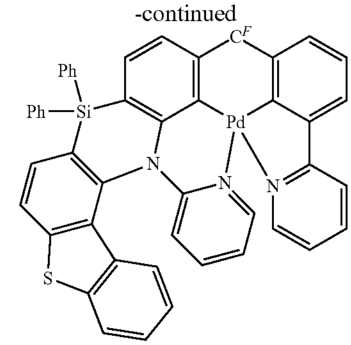
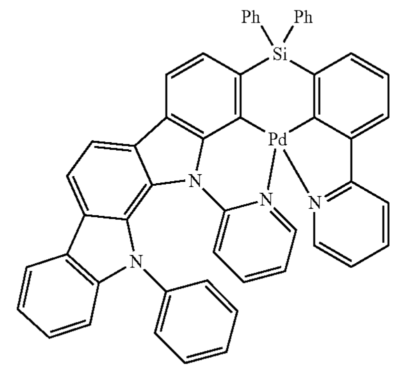
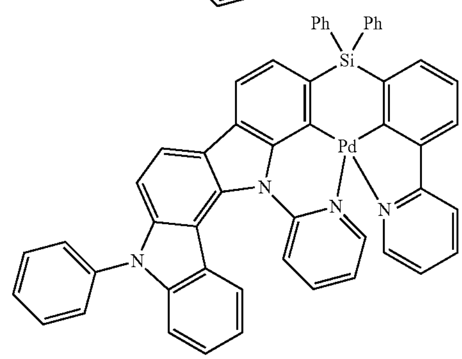
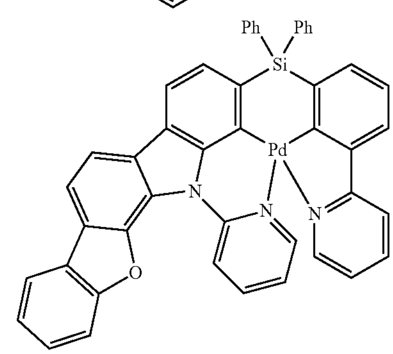
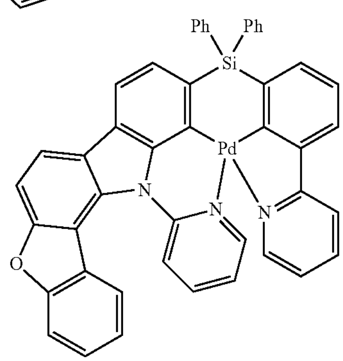

-continued
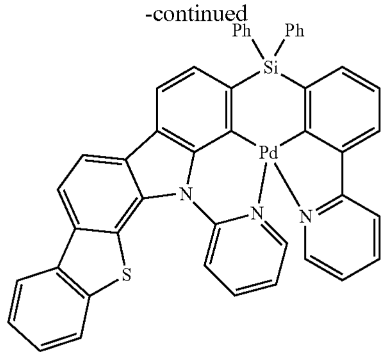
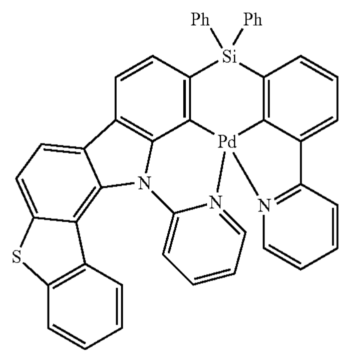
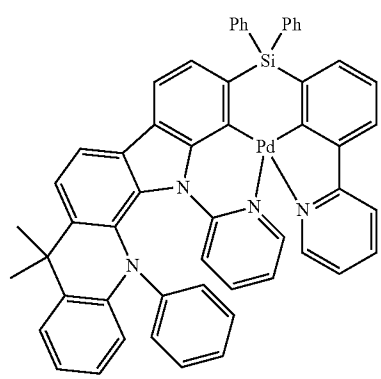
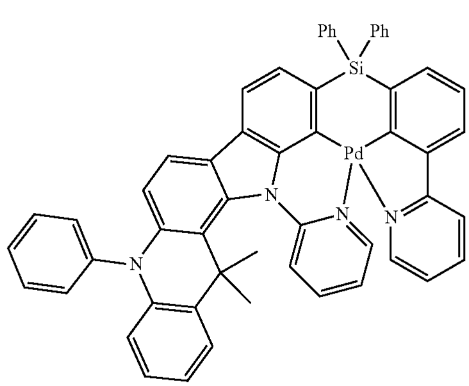
-continued
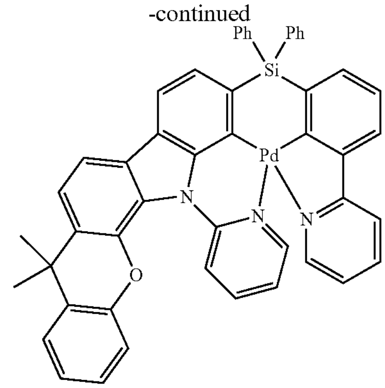
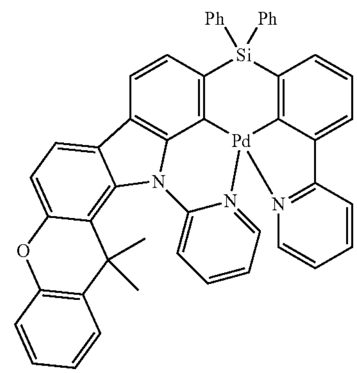
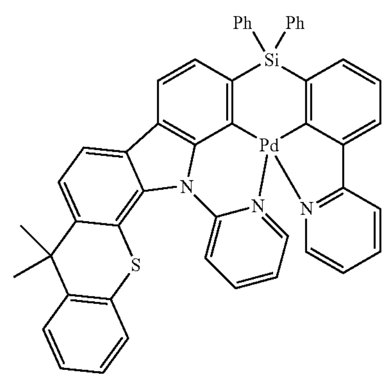
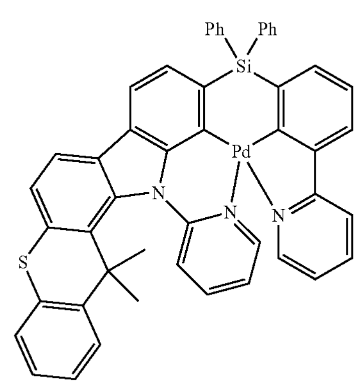

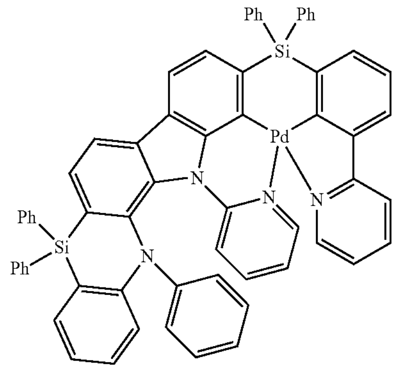
Ph
Ph
Si
Pd
N
N
N
Ph
Si
Ph
N
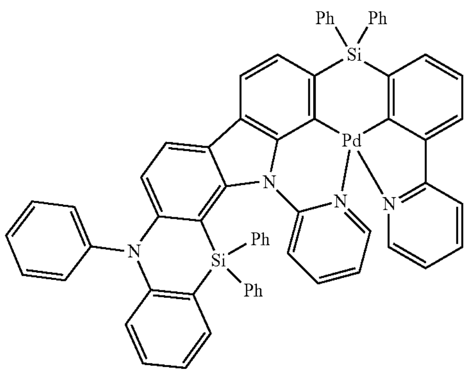
Ph
Ph
Si
Pd
N
N
N
N
Si
Ph
Ph
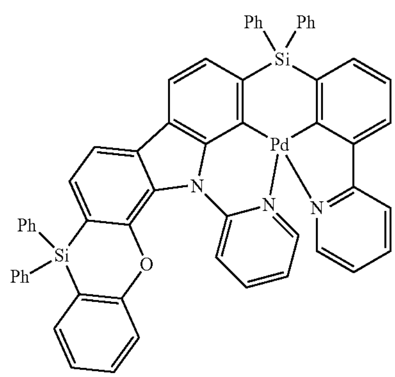
Ph
Ph
Si
Pd
N
N
N
Ph
Si
Ph
O
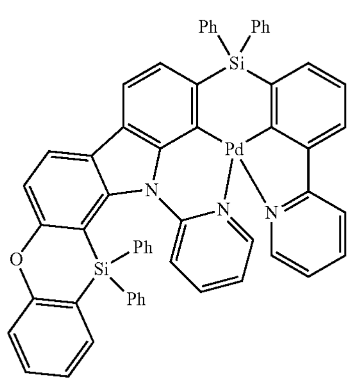
Ph
Ph
Si
Pd
N
N
N
O
Si
Ph
Ph
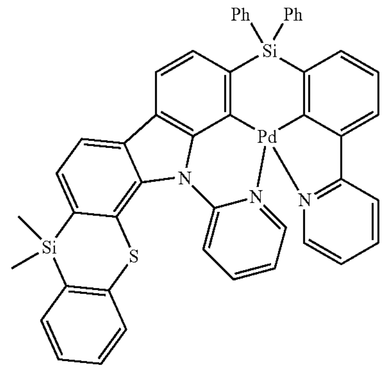
Ph
Ph
Si
Pd
N
N
N
Si
S
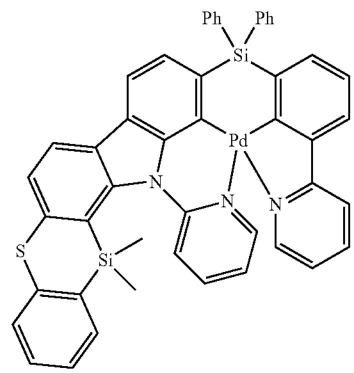
Ph
Ph
Si
Pd
N
N
N
S
Si
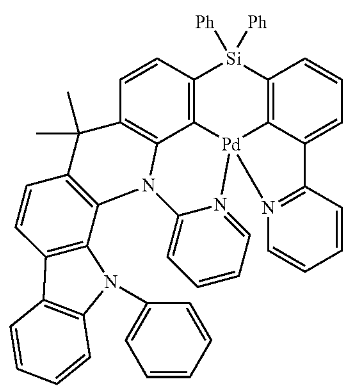
Ph
Ph
Si
Pd
N
N
N
N
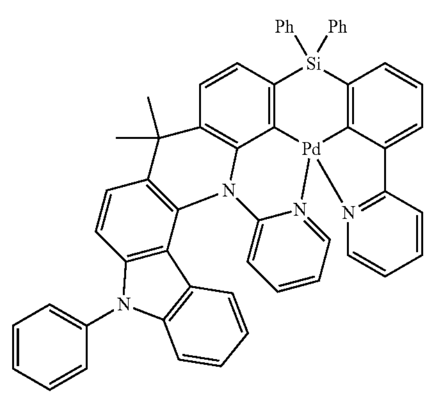
Ph
Ph
Si
Pd
N
N
N
N -continued
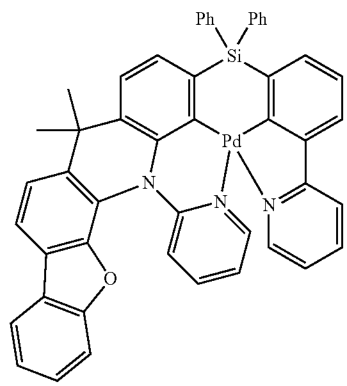
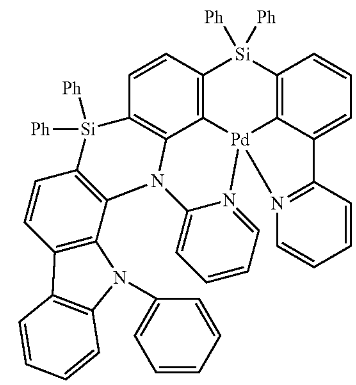
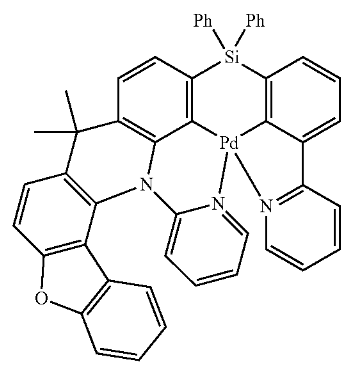
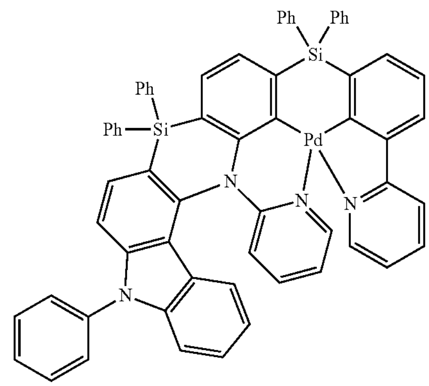
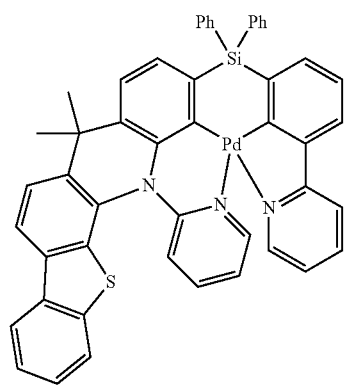
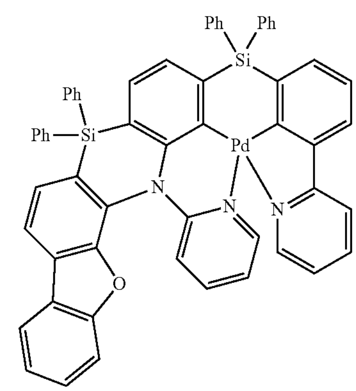
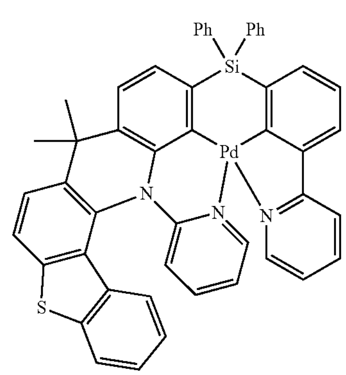
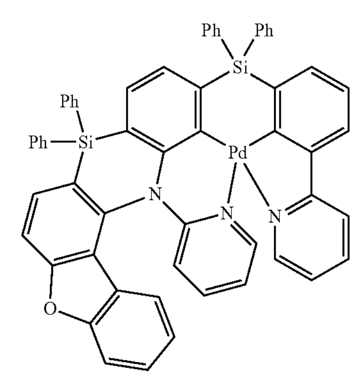

-continued
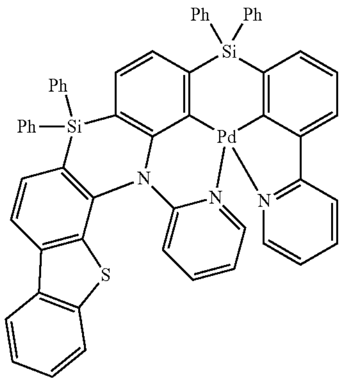
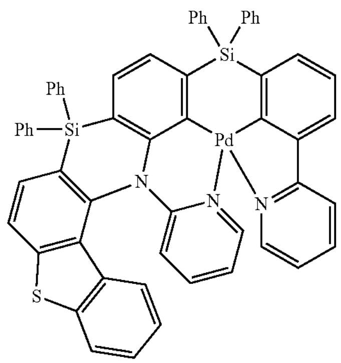
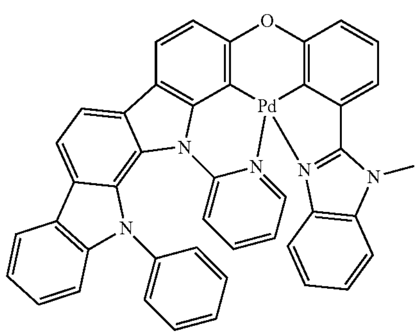
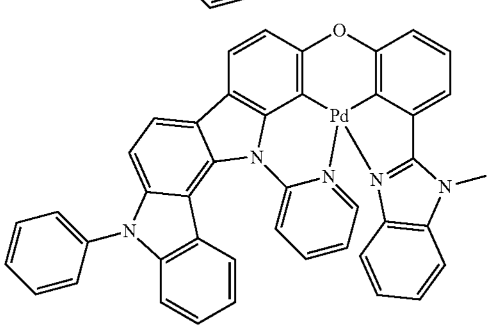
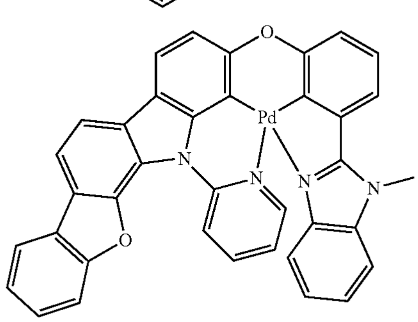
-continued
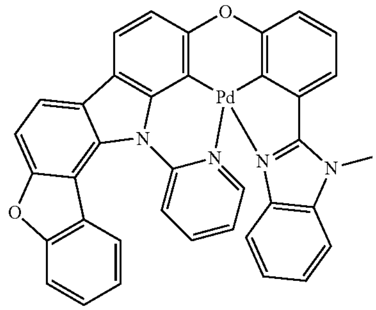
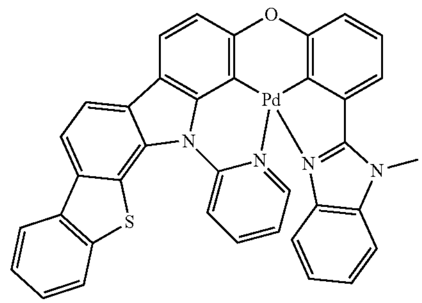
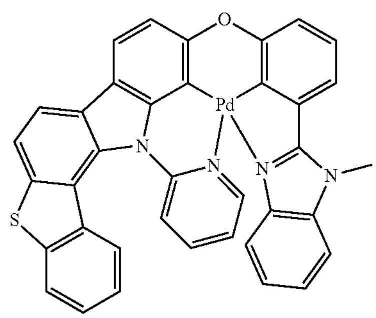
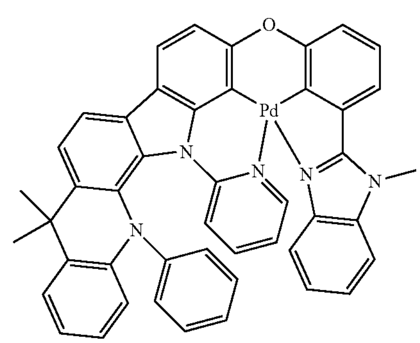
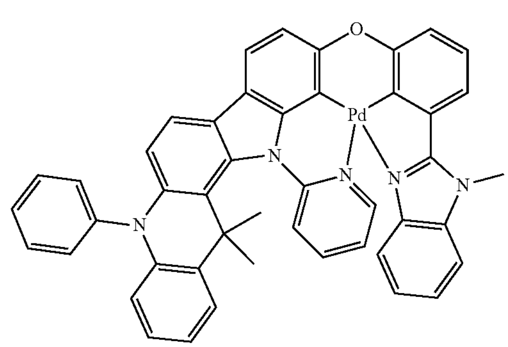

-continued
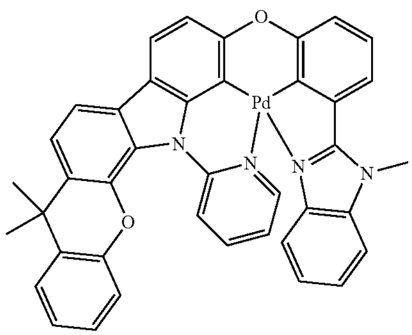
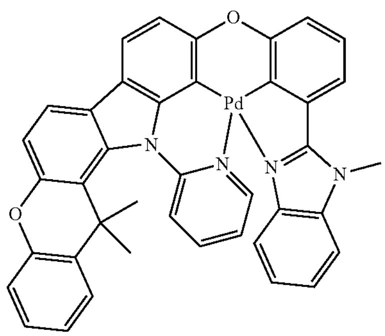
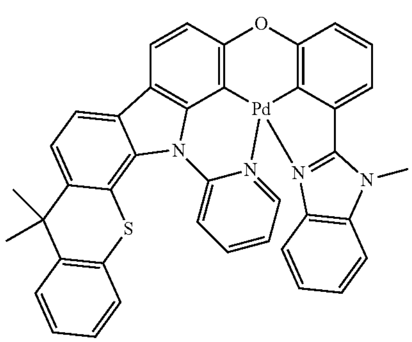
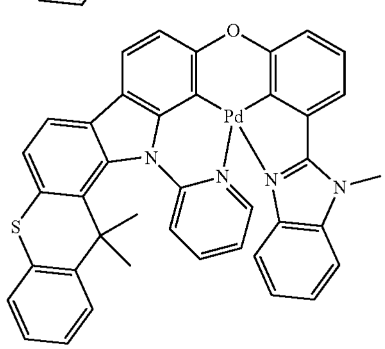
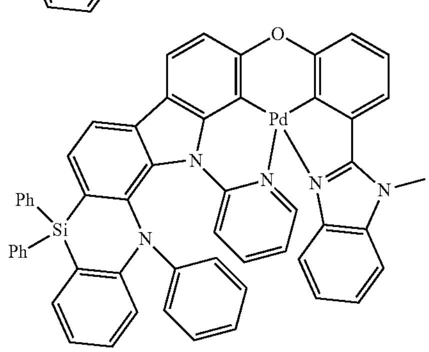
-continued
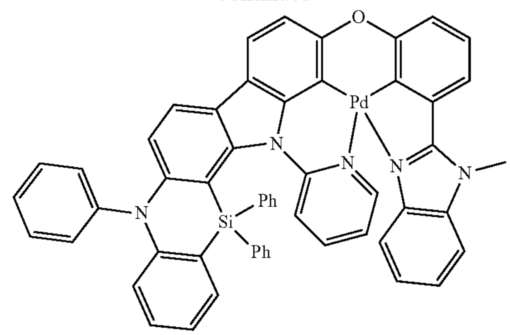
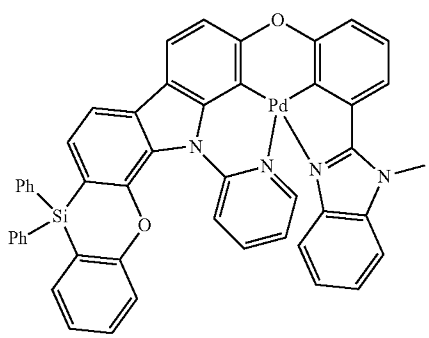
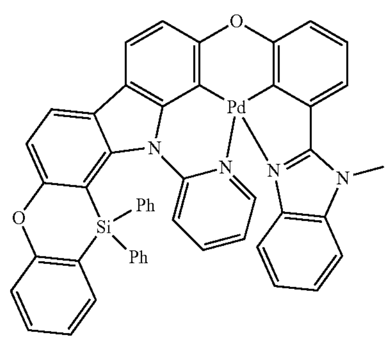
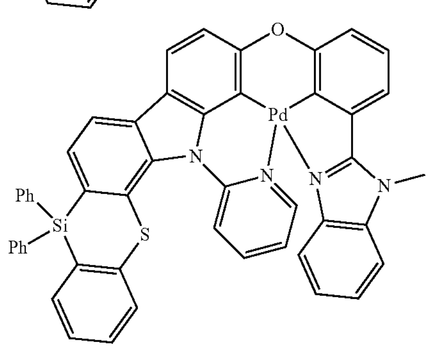
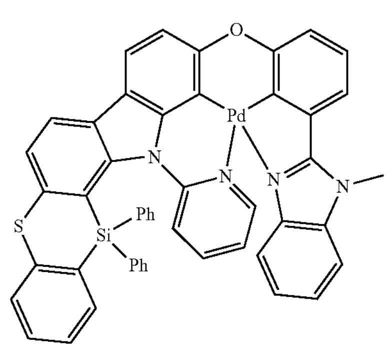

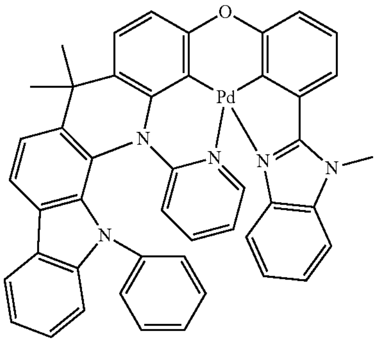
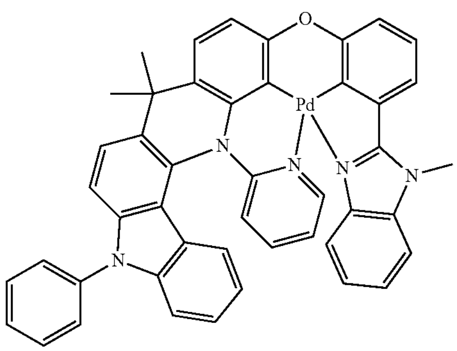
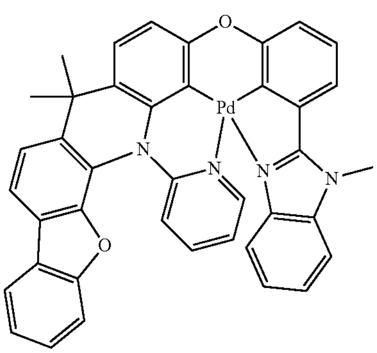
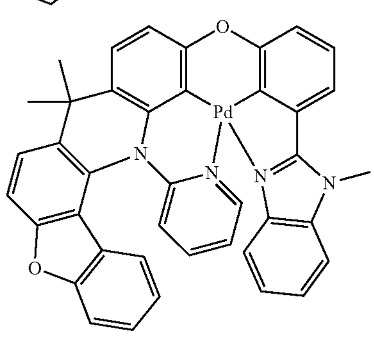
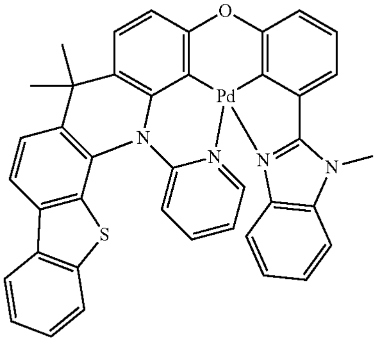
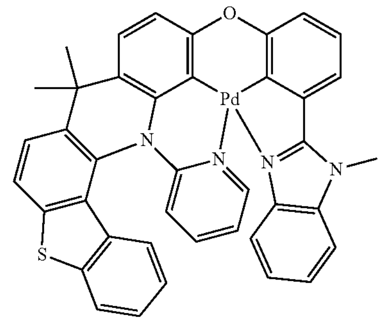
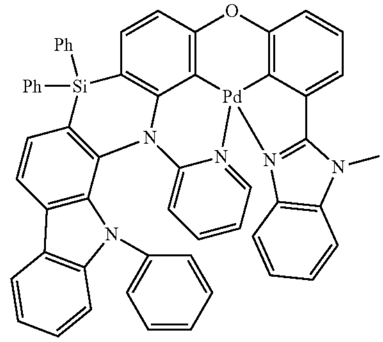
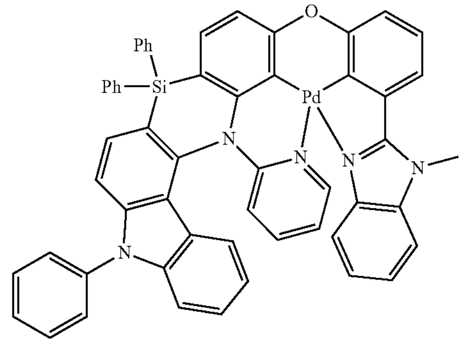
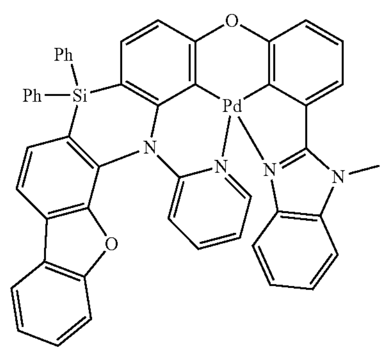
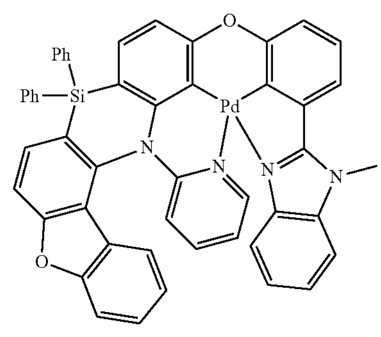

-continued
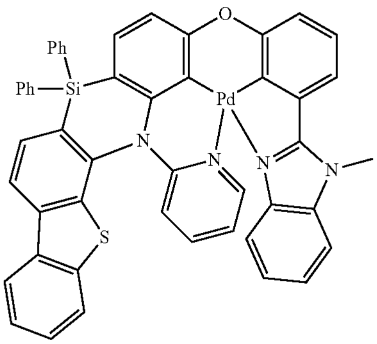
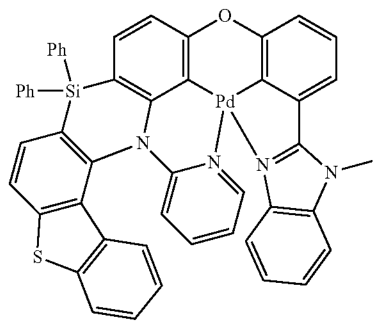
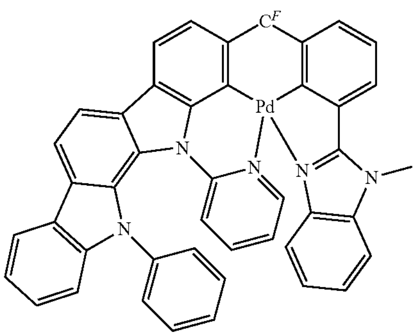
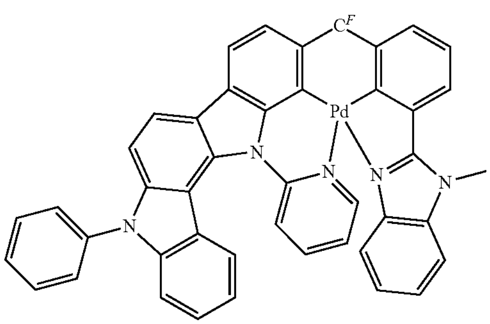
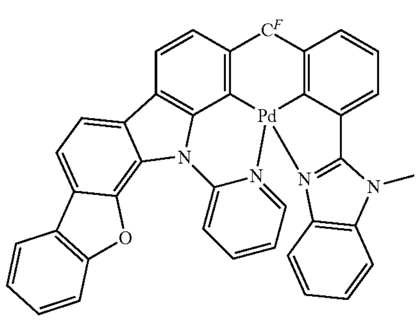
-continued
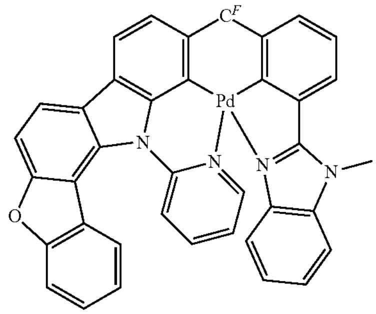
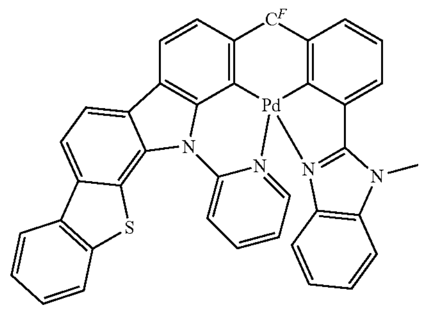
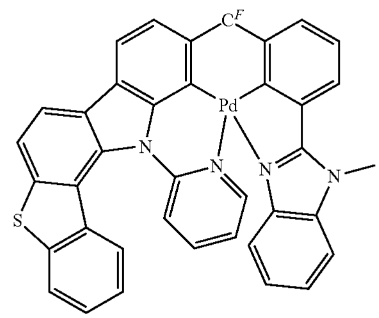
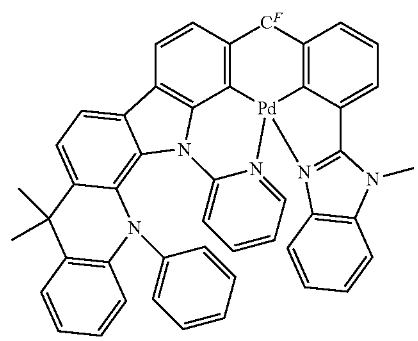
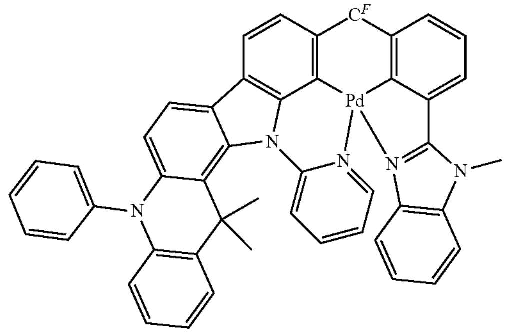

-continued
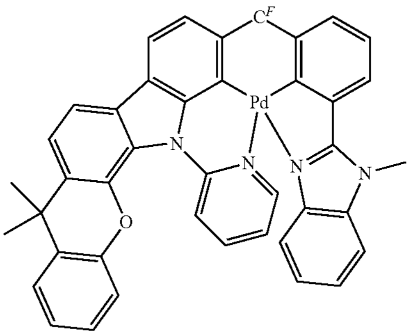
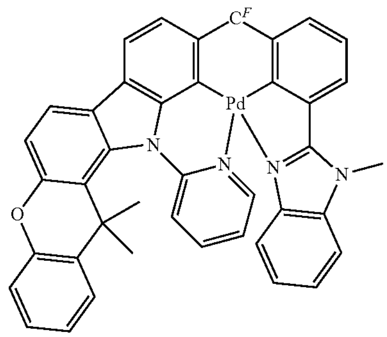
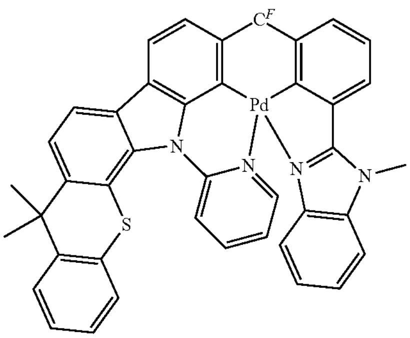
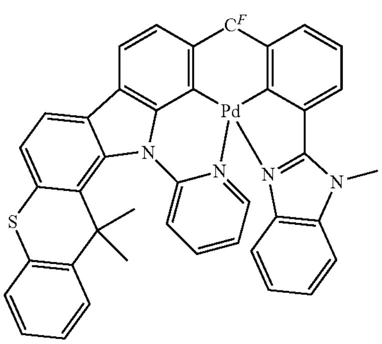
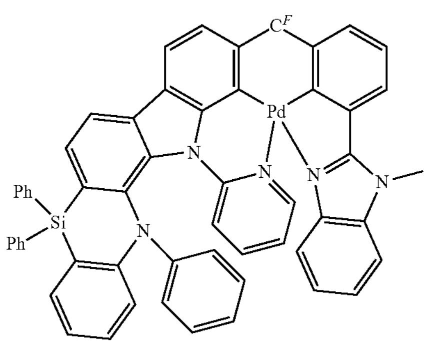
-continued
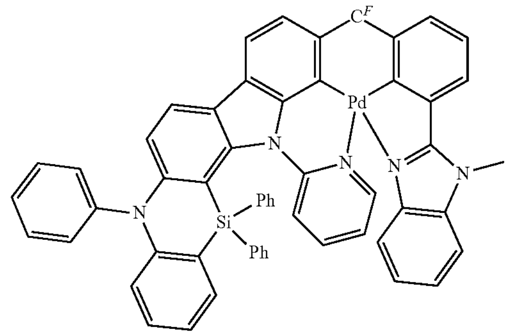
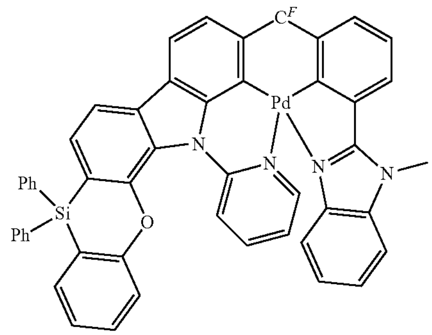
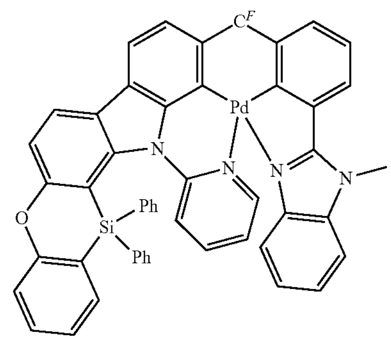
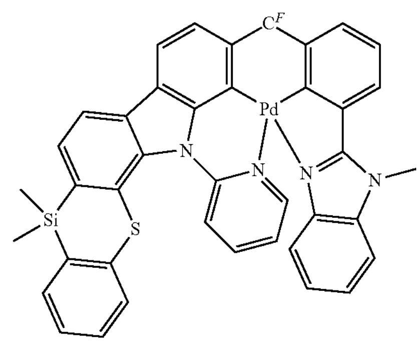
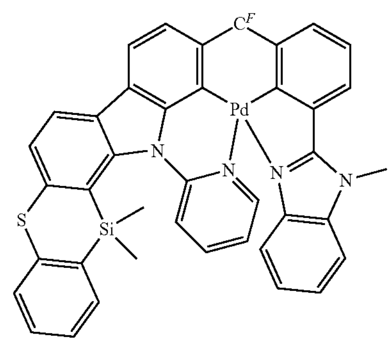

-continued
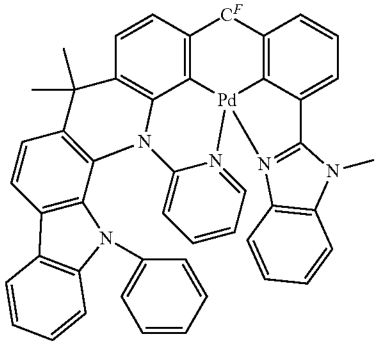
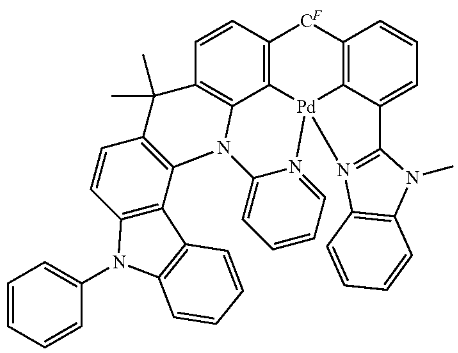
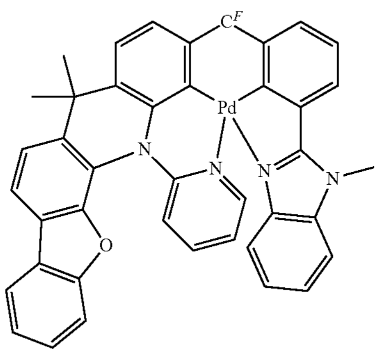
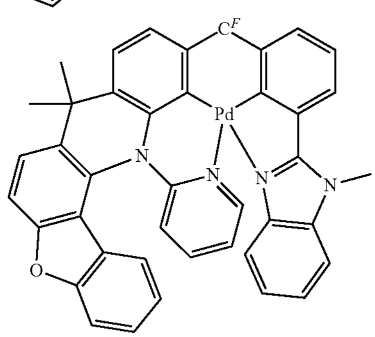
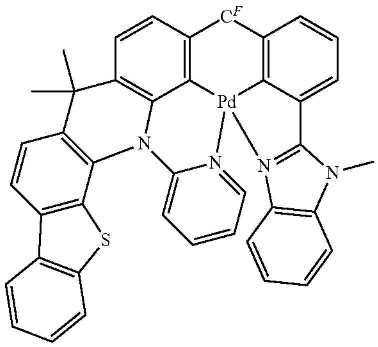
-continued
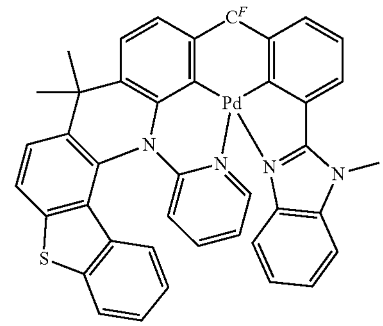
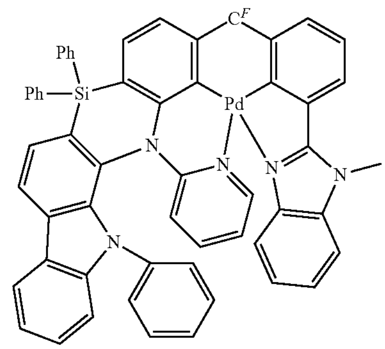
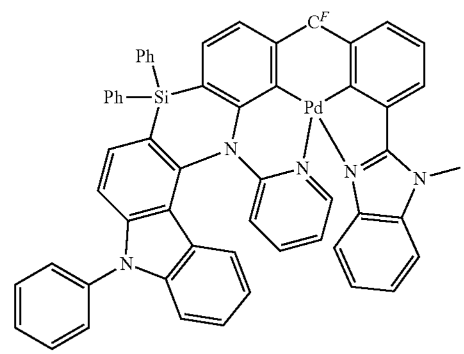
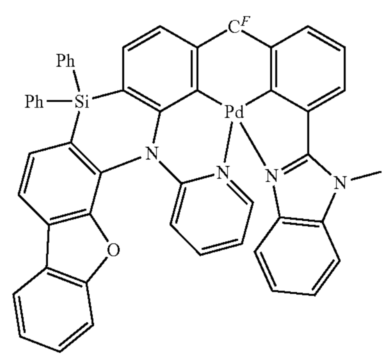
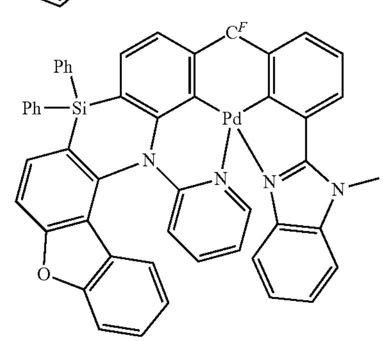

-continued
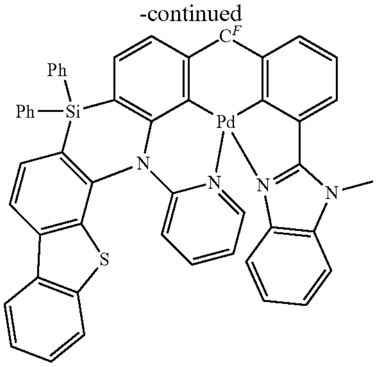
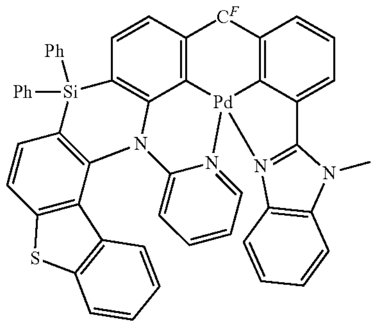
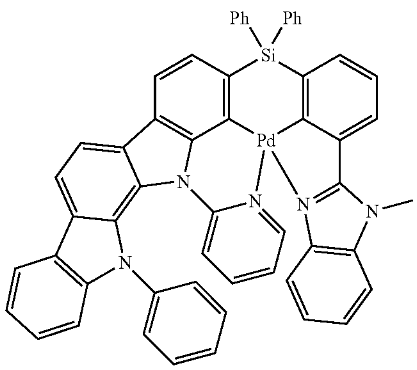
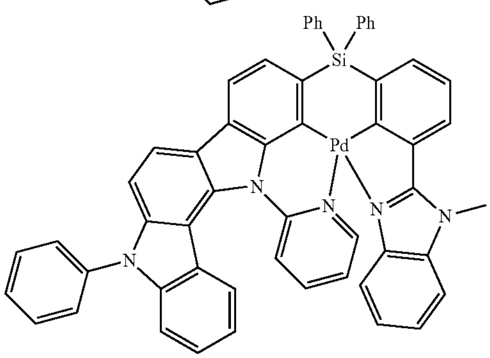
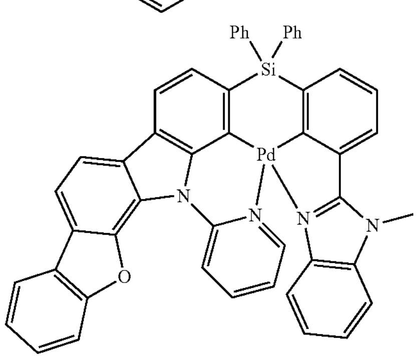
-continued
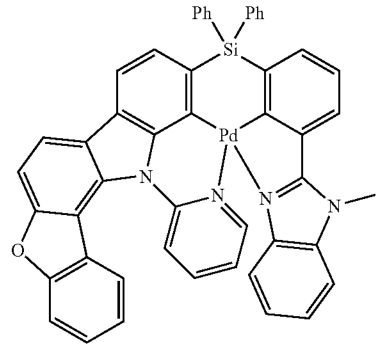
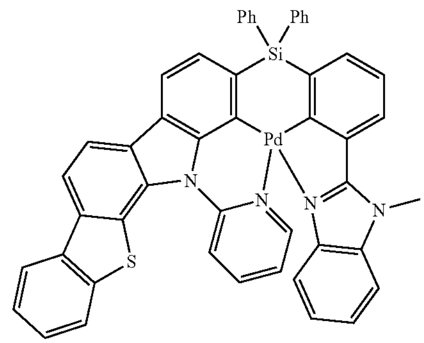
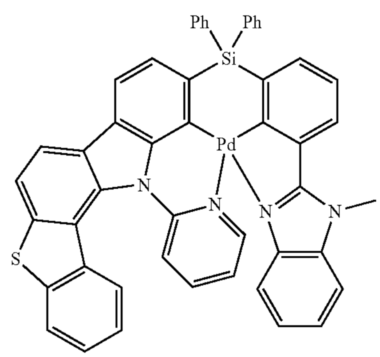
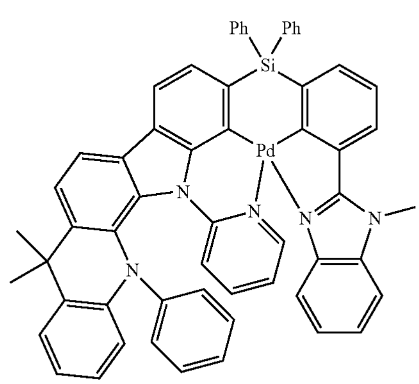

-continued
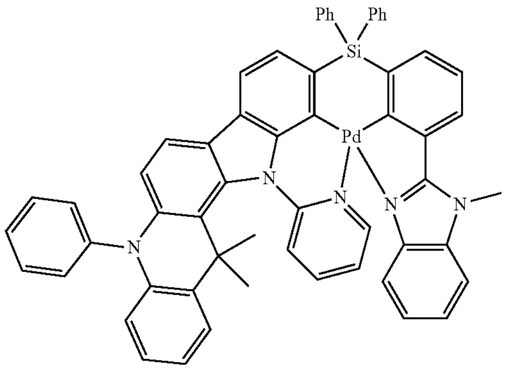
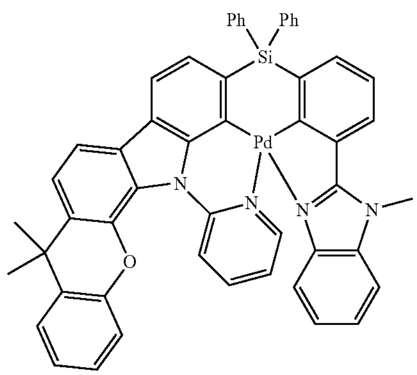
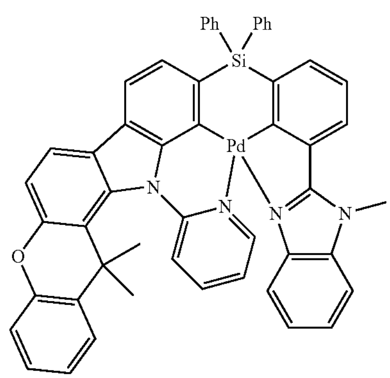
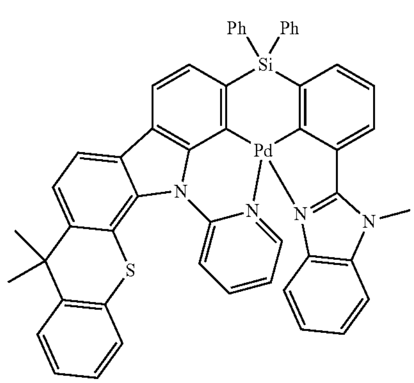
-continued
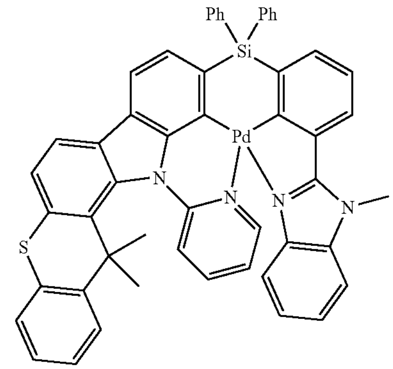
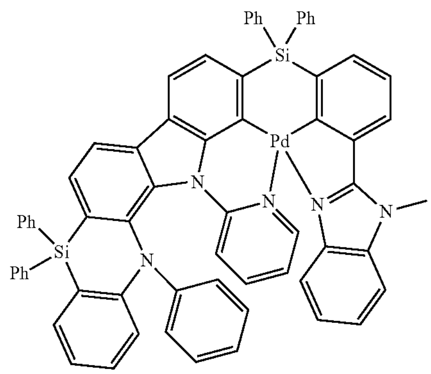
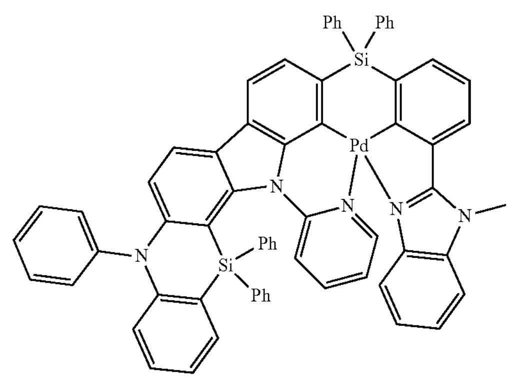
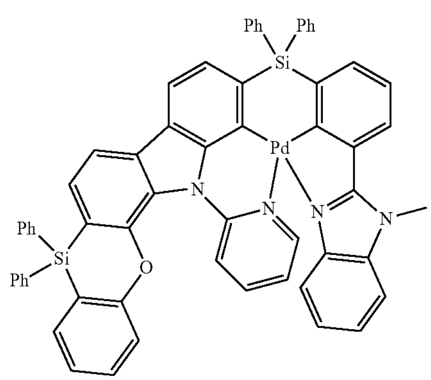

-continued
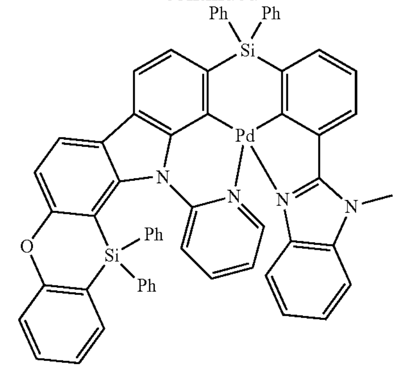
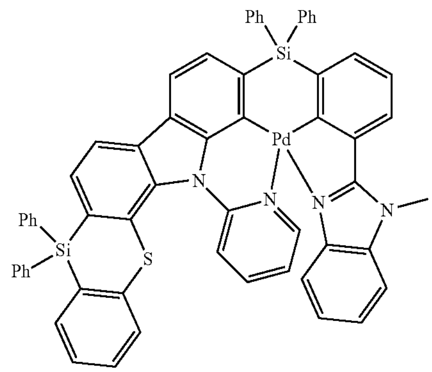
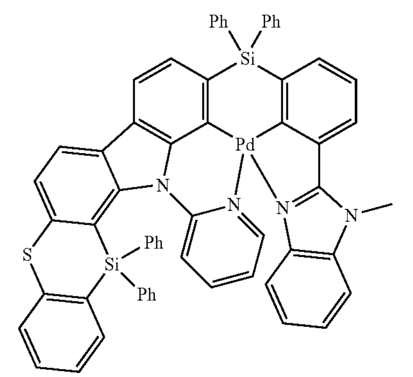
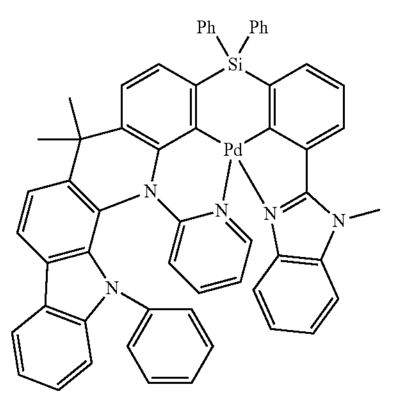
-continued
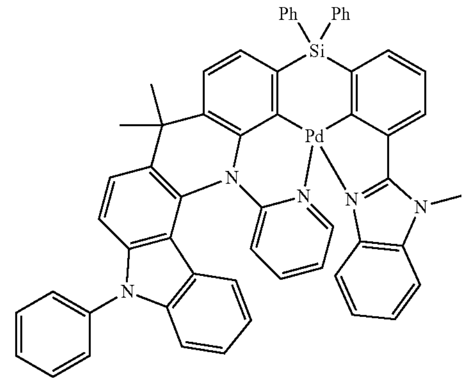
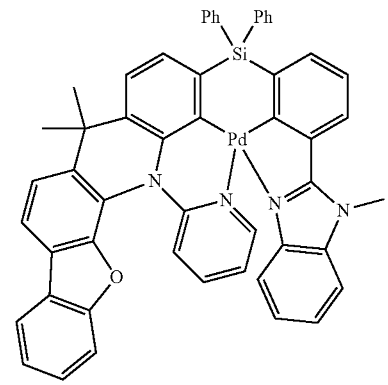
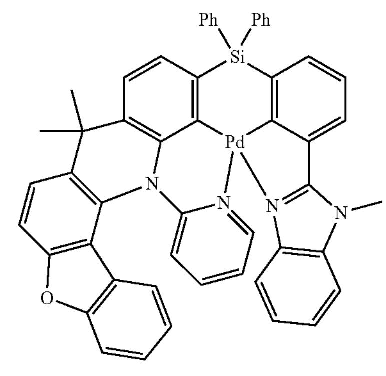
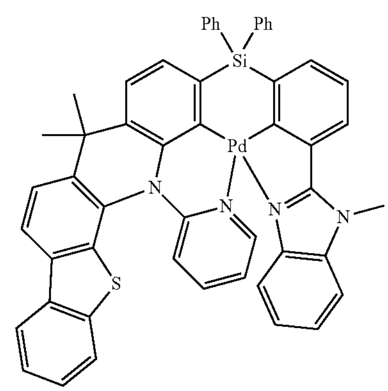

-continued
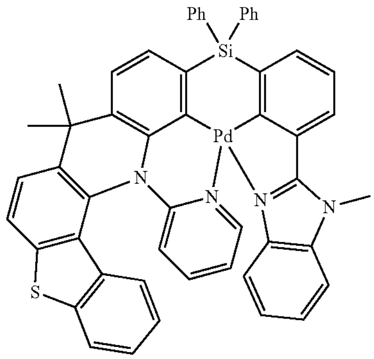
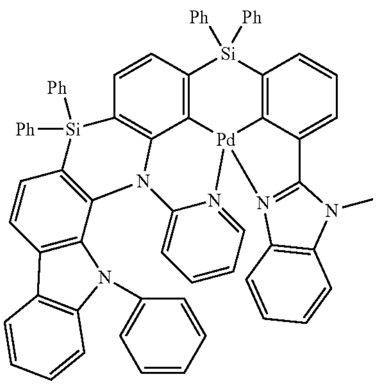
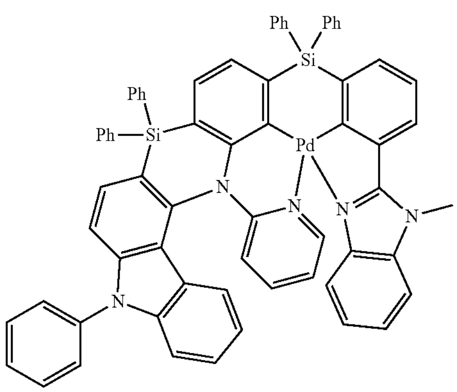
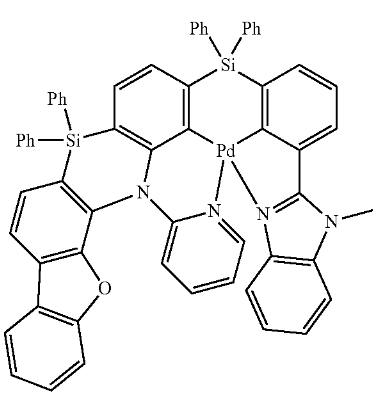
-continued
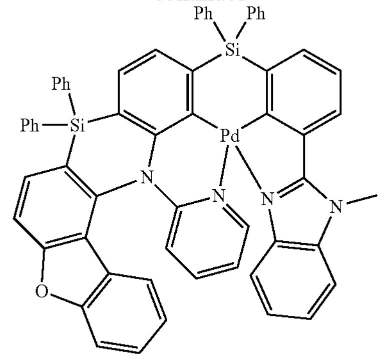
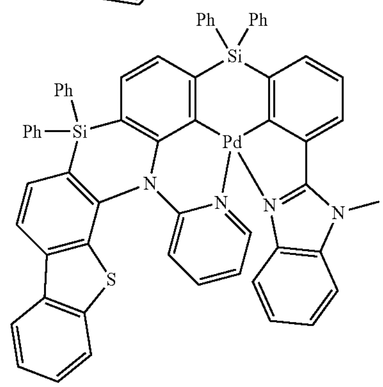
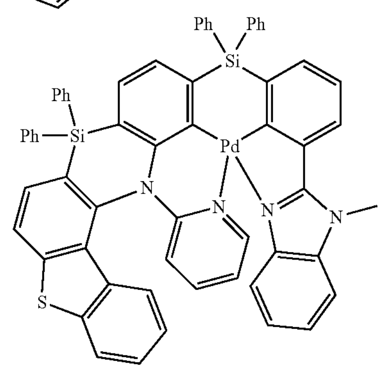
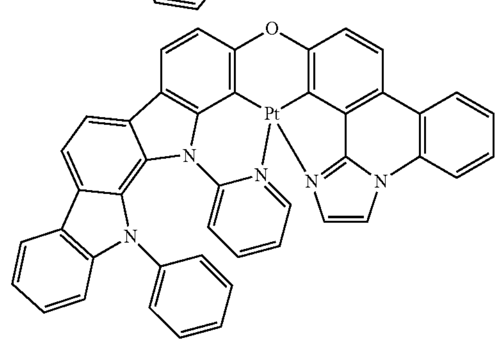
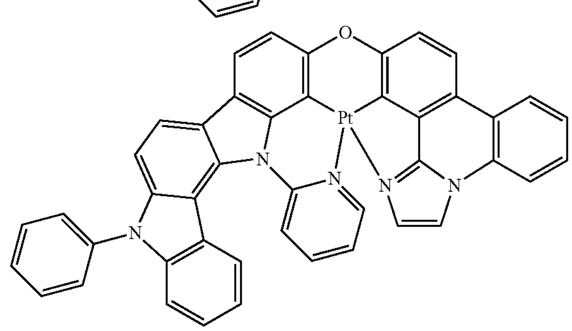

-continued
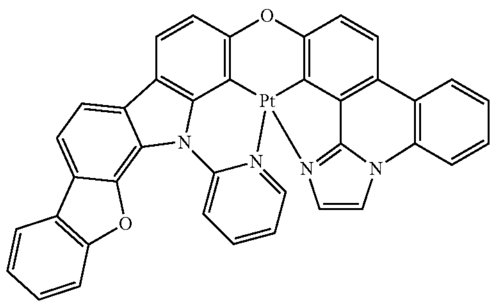
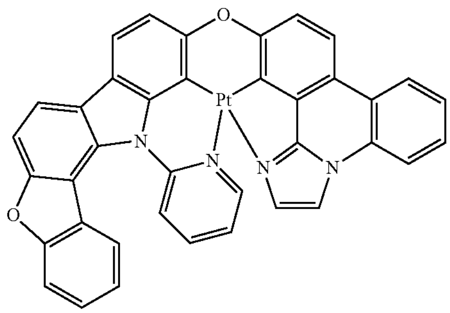
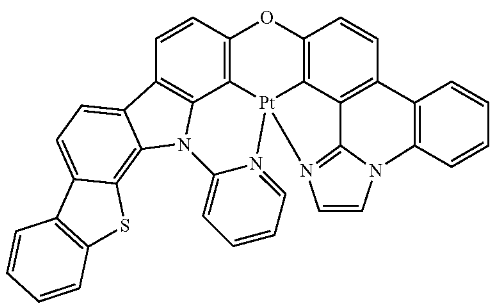
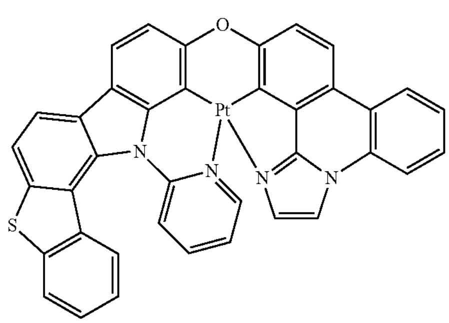
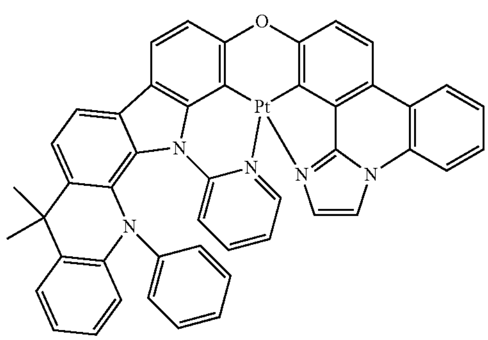
-continued
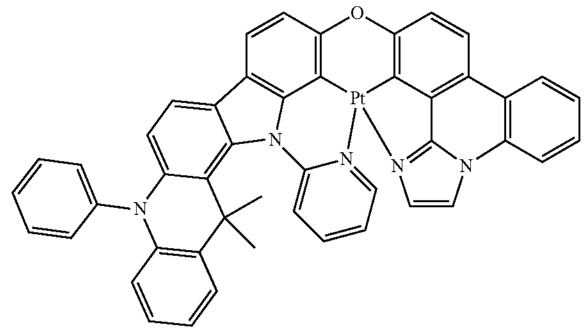
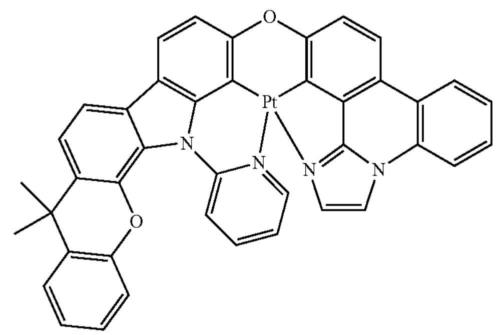
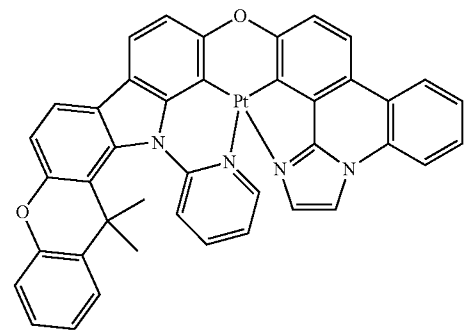
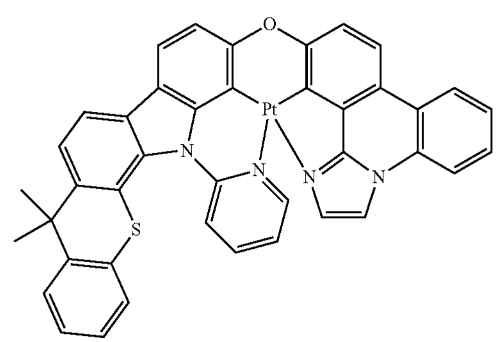
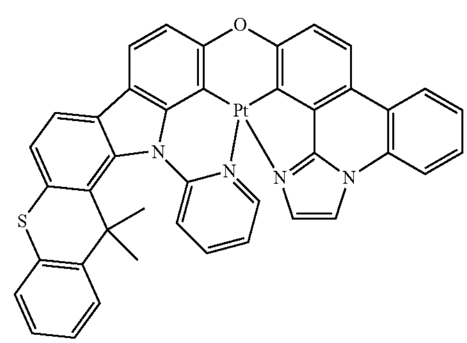

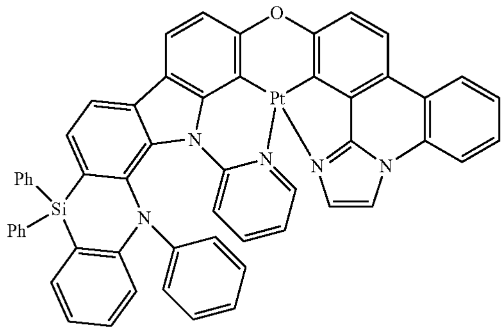
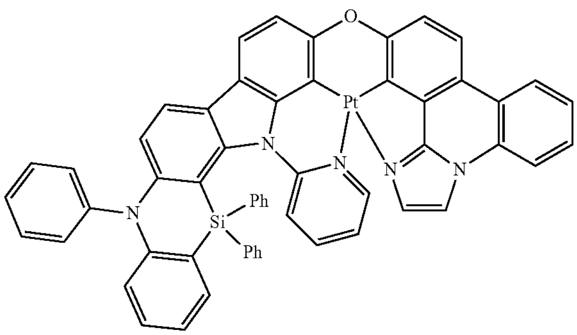
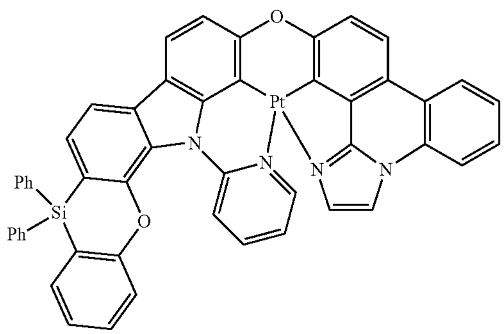
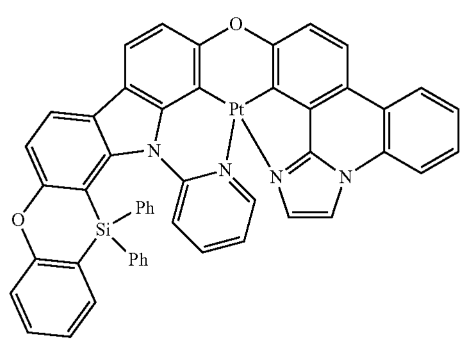
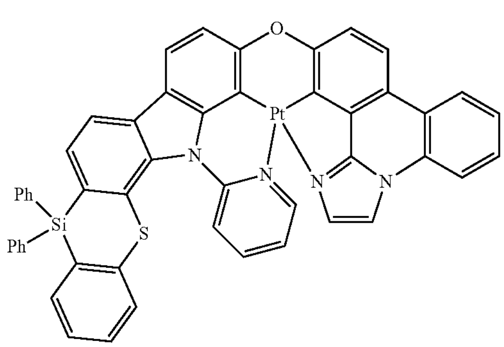
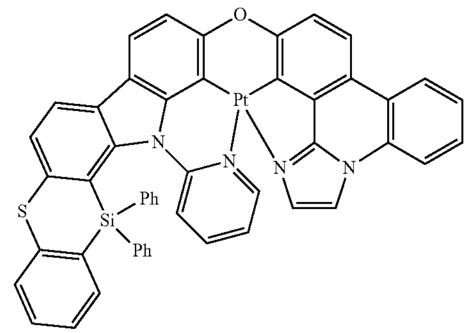
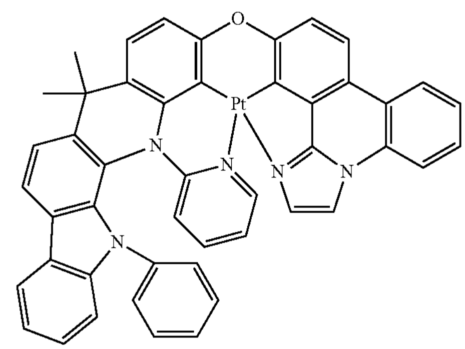
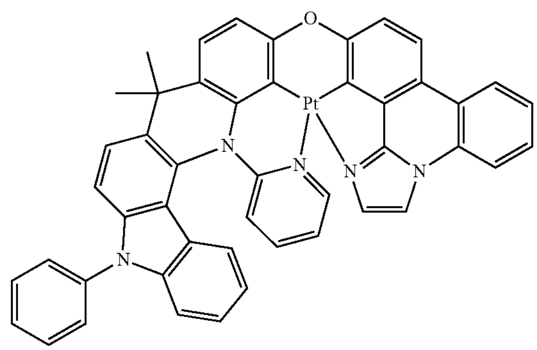
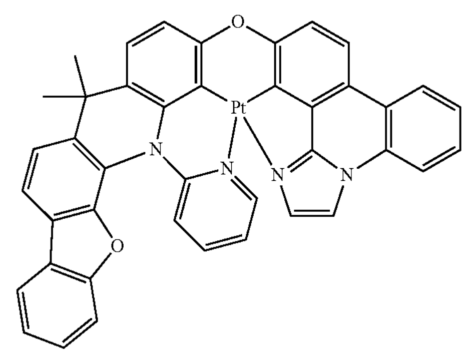
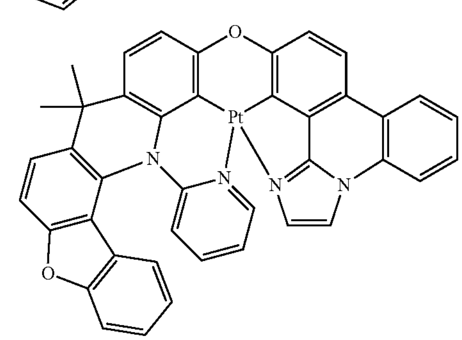

-continued
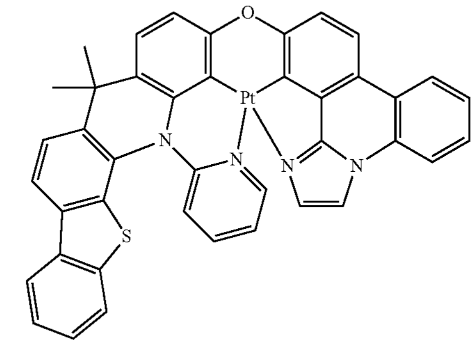
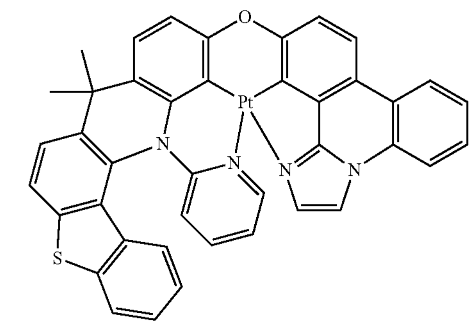
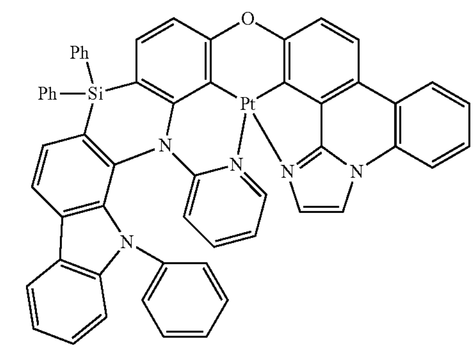
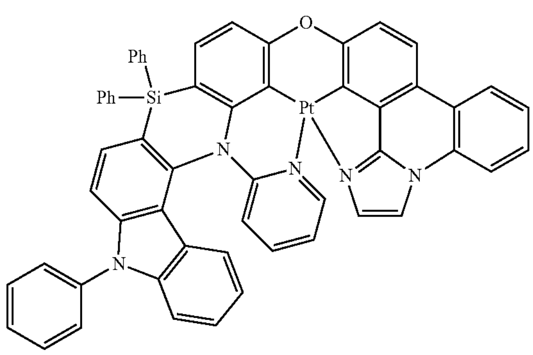
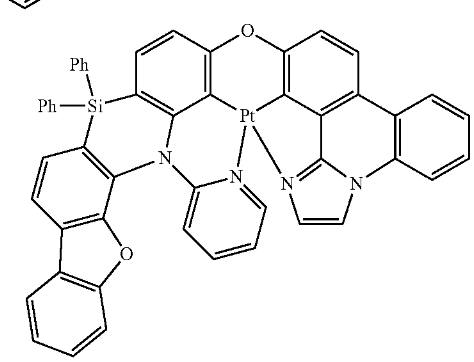
-continued
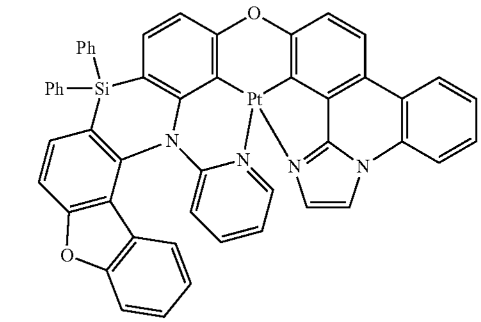
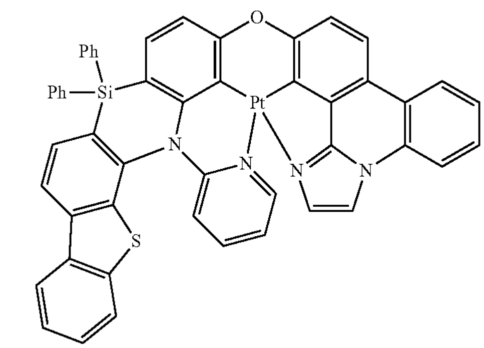
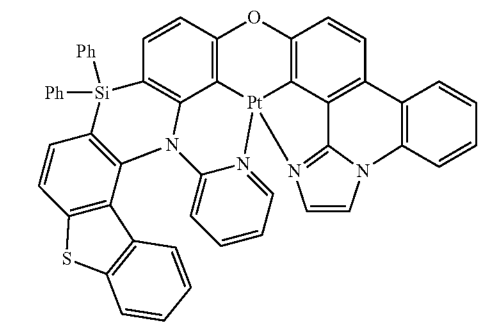
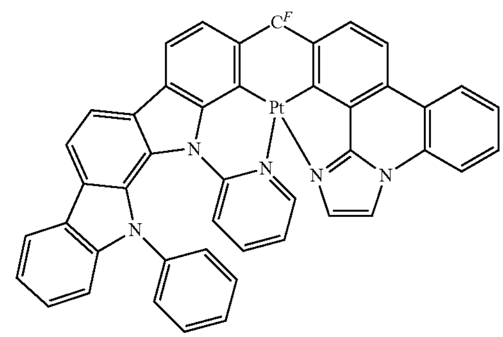
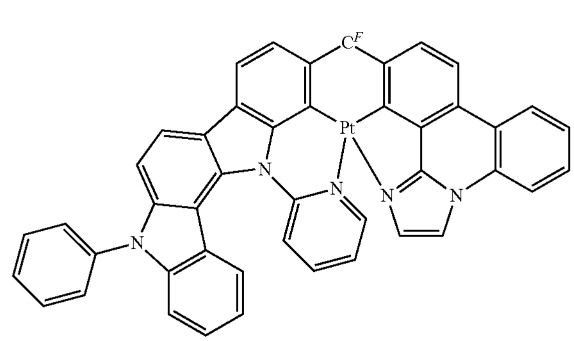

-continued
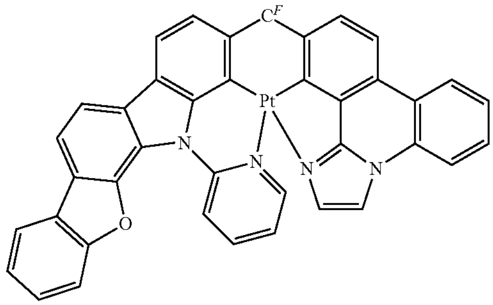
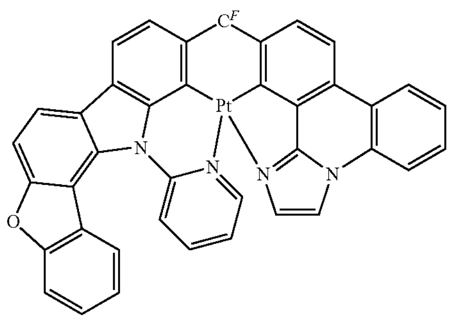
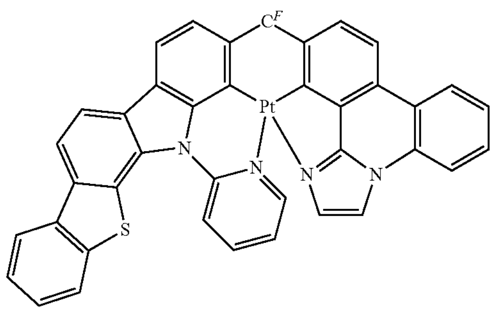
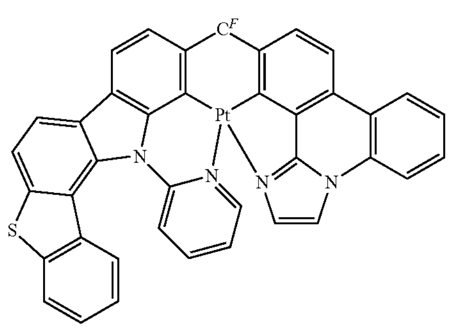
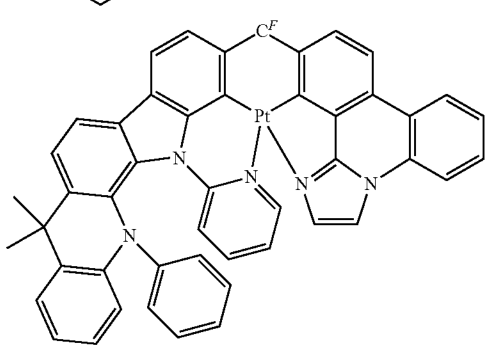
-continued
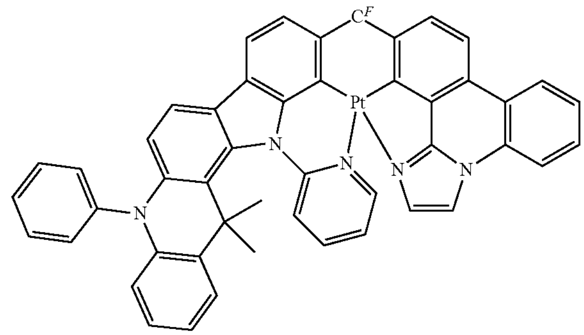
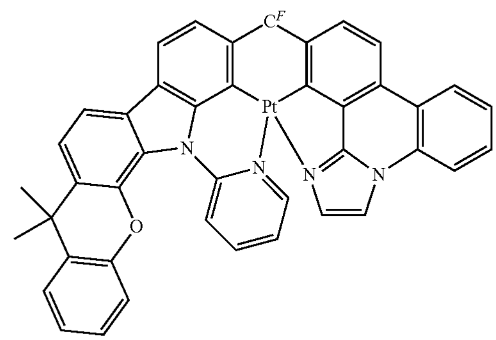
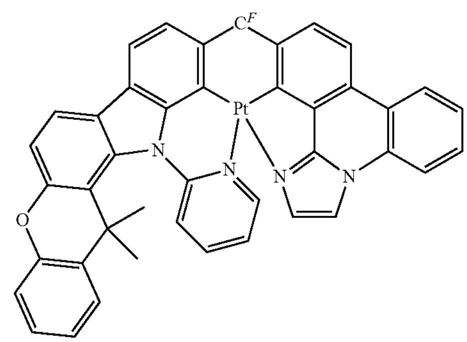
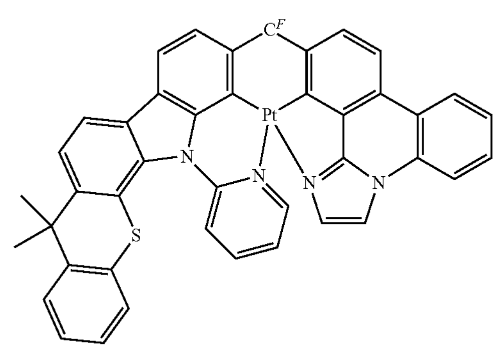
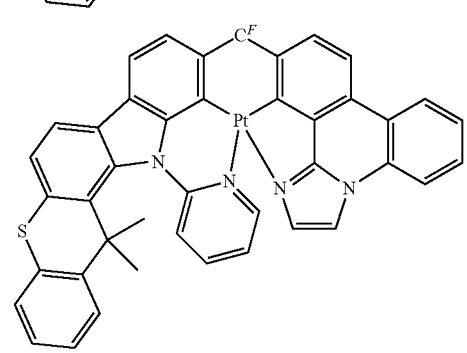

-continued
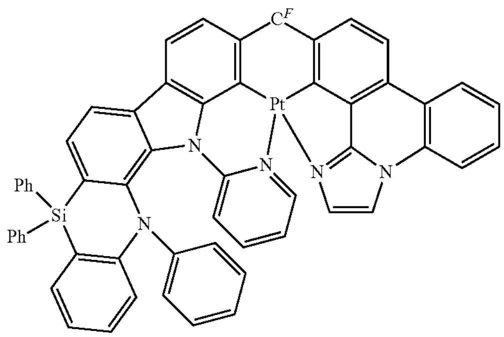
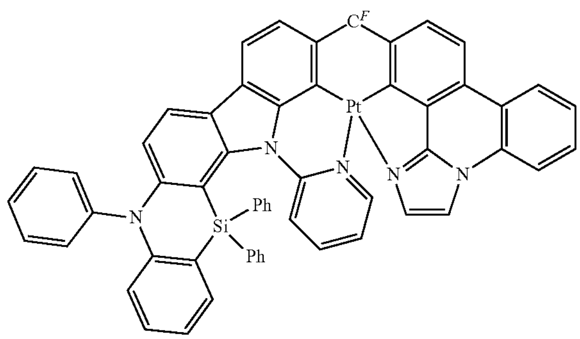
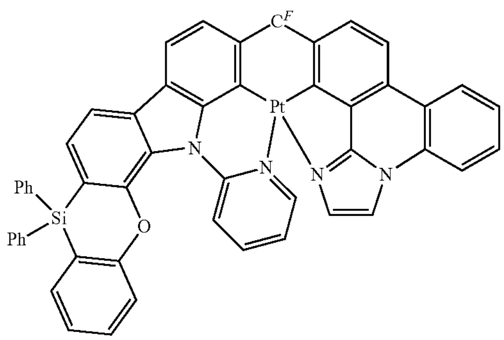
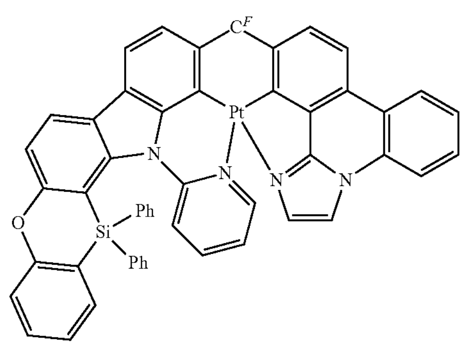
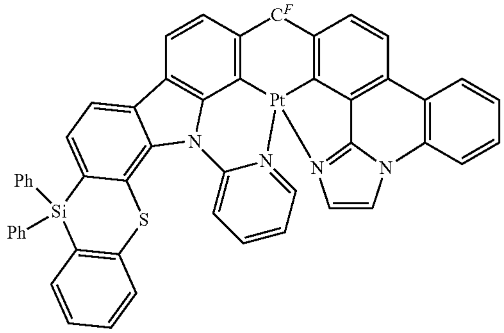
-continued
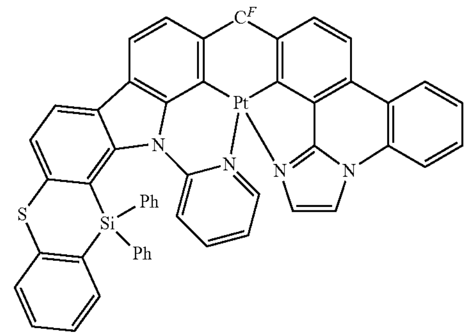
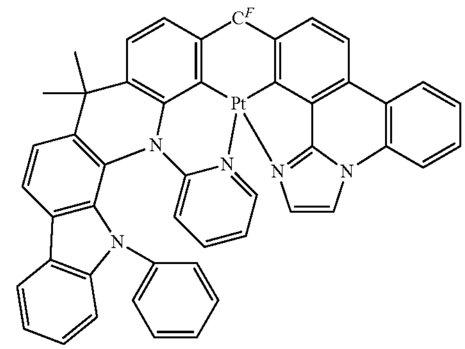
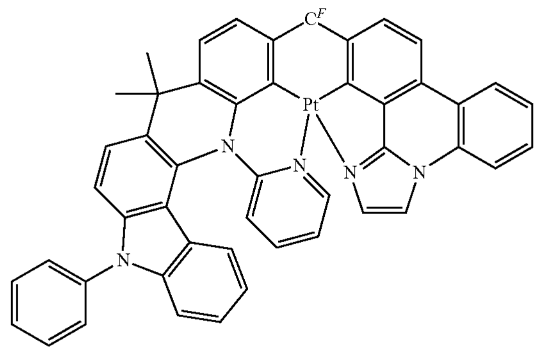
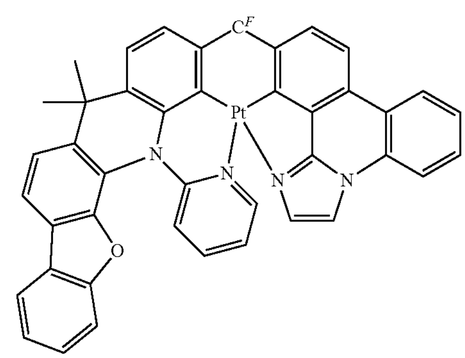
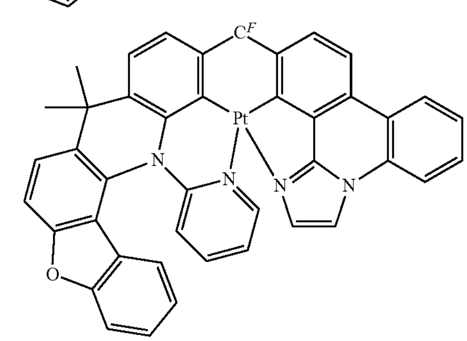

252
-continued
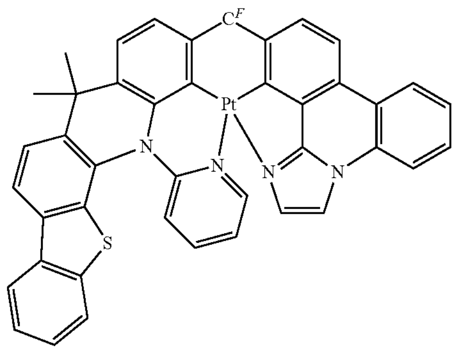
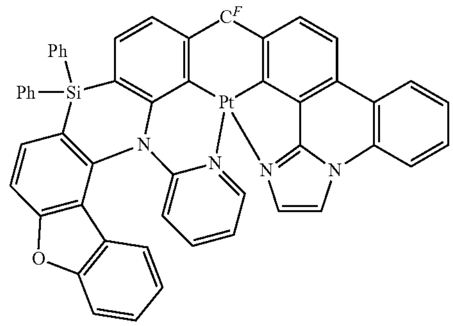
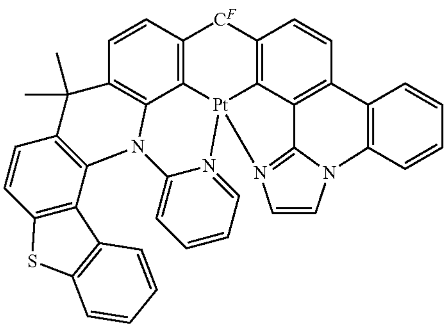
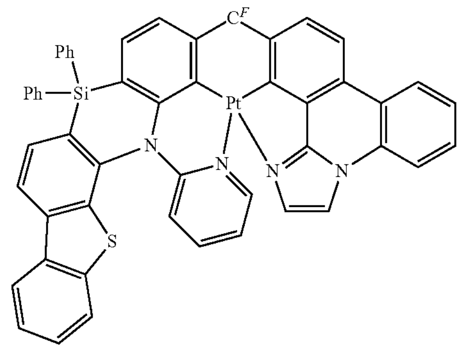
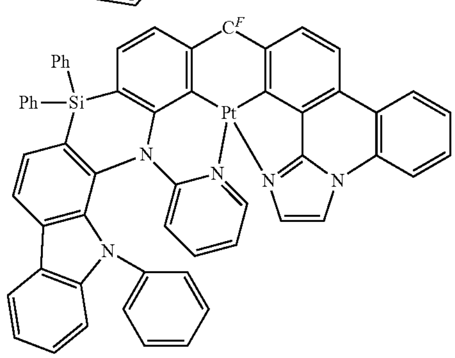
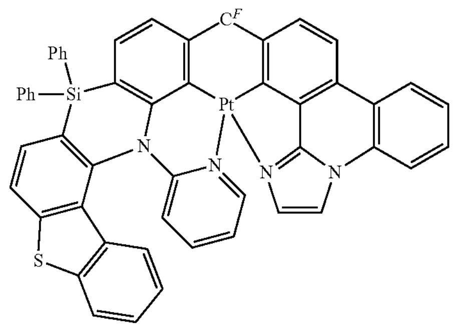
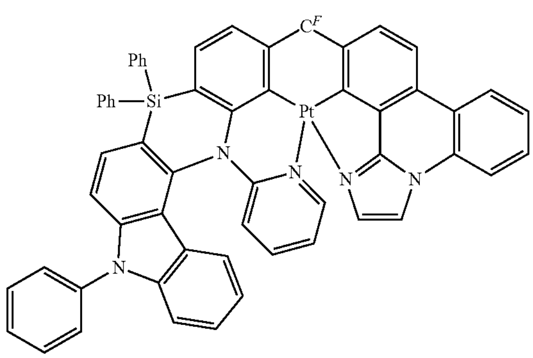
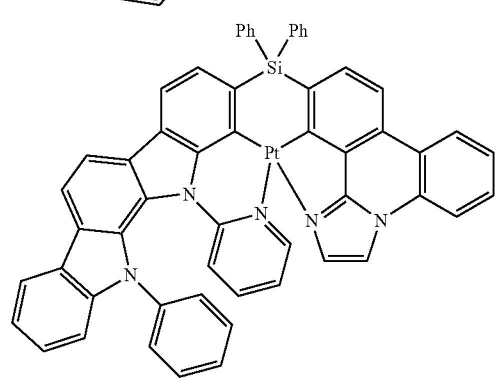
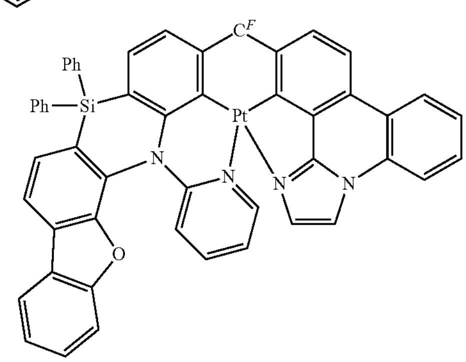
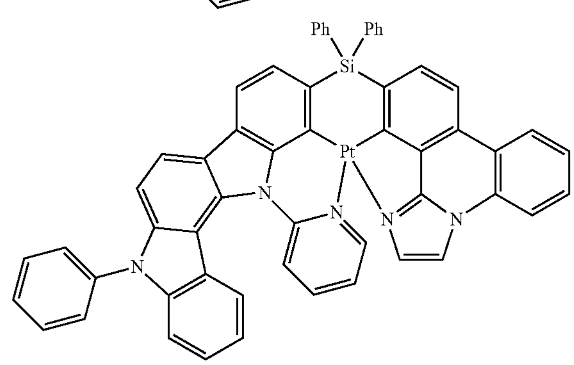

-continued
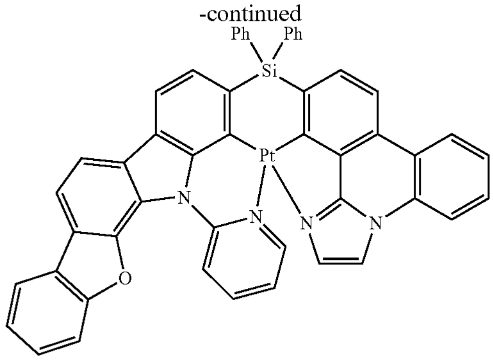
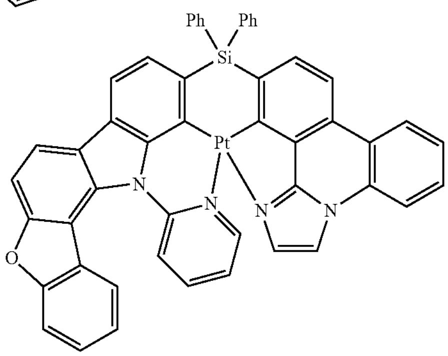
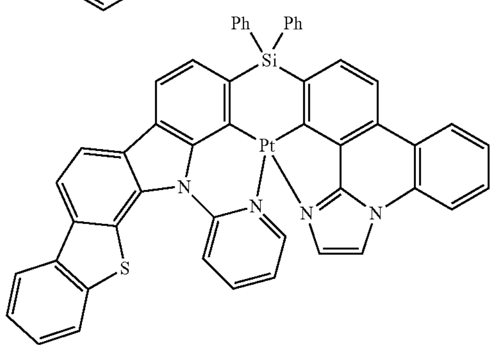
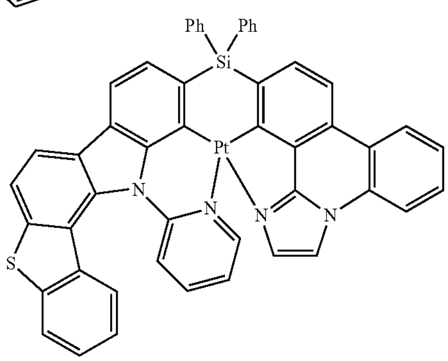
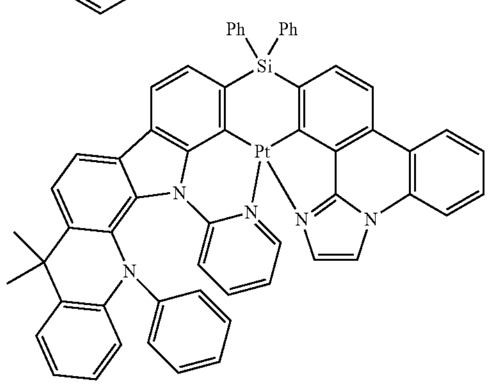
-continued
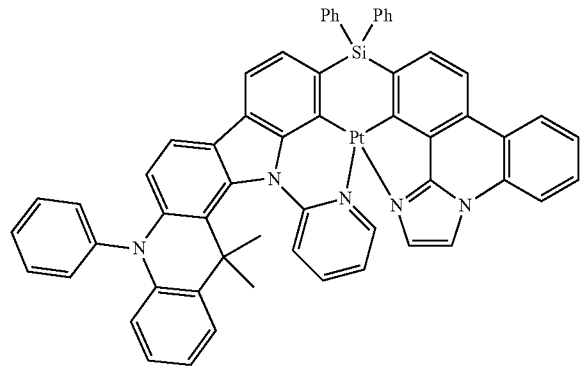
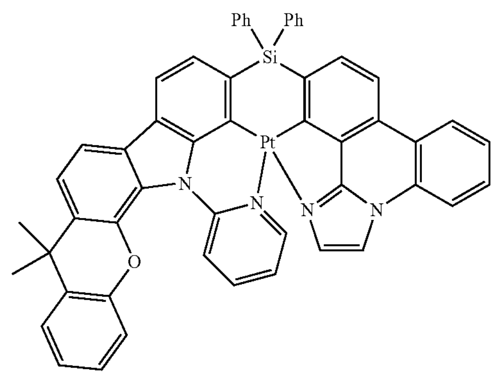
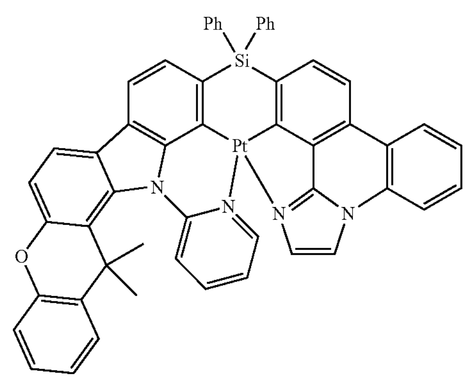
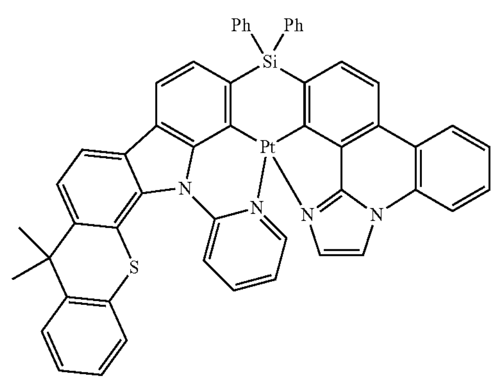

-continued
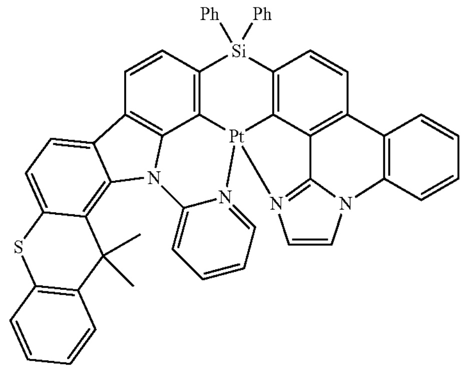
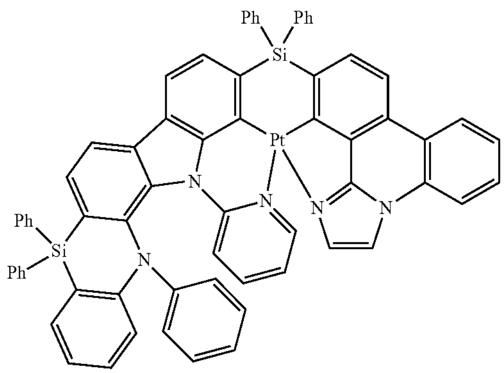
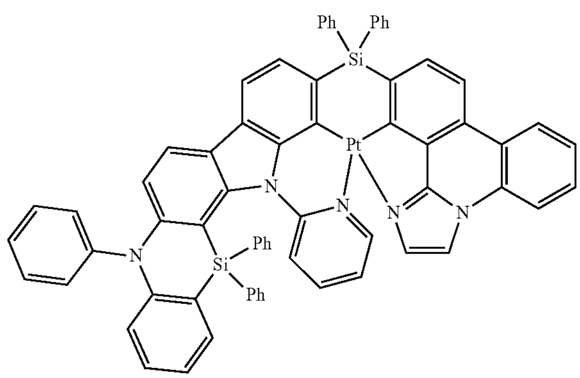
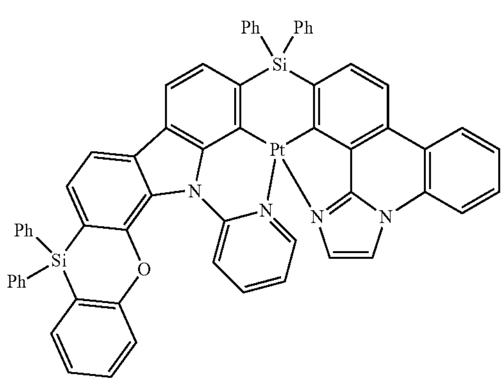
-continued
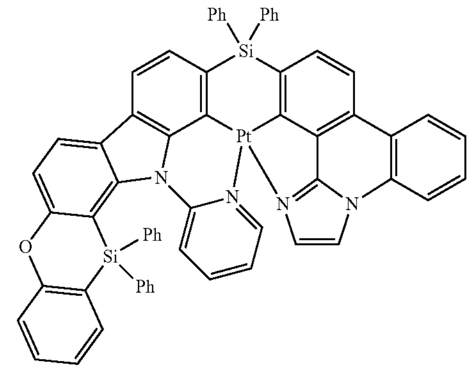
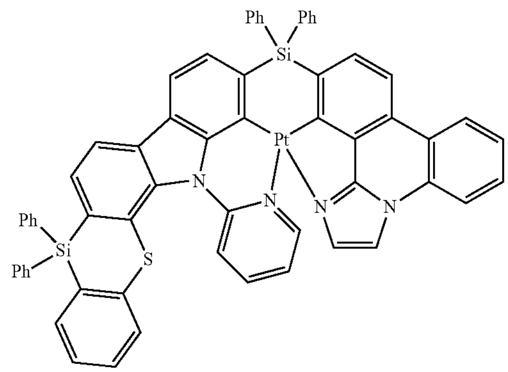
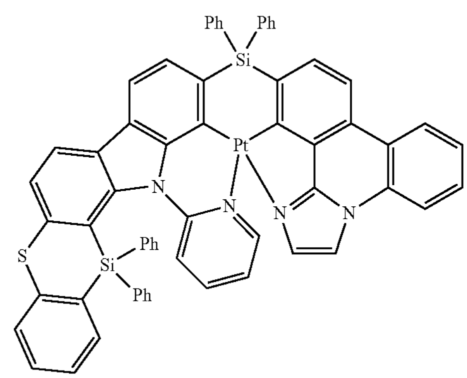
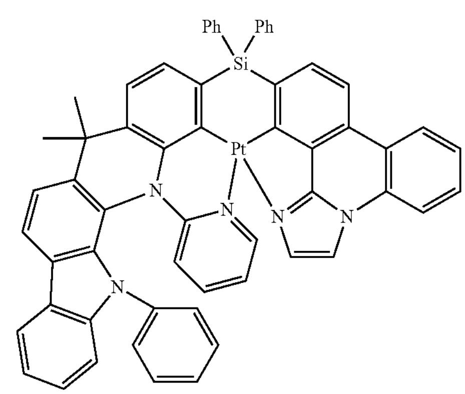

-continued
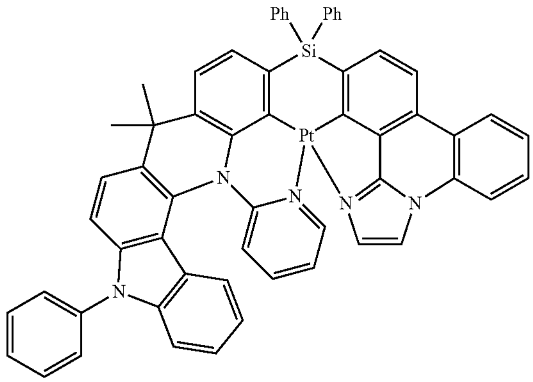
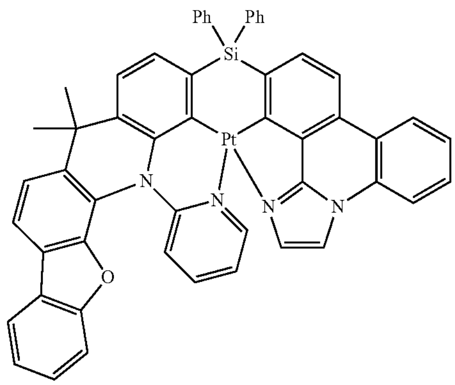
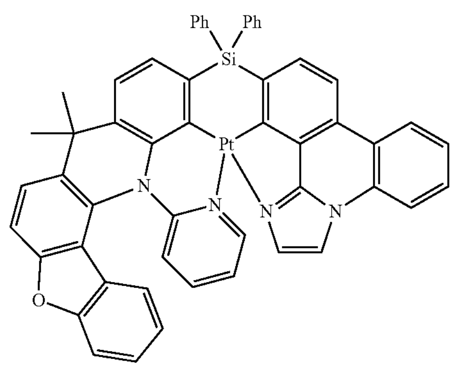
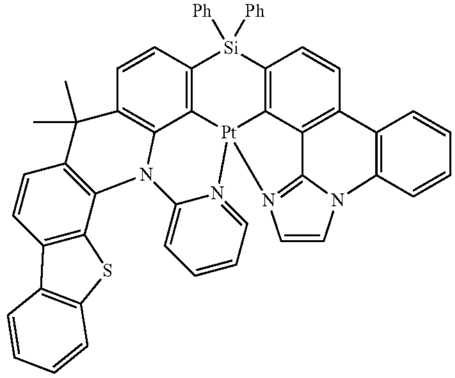
-continued
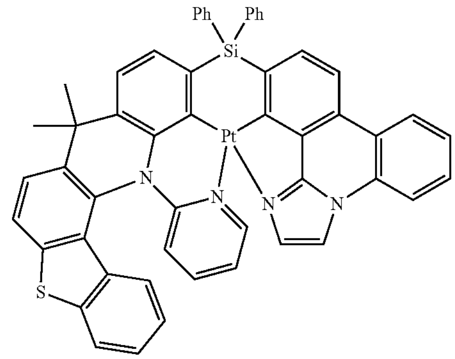
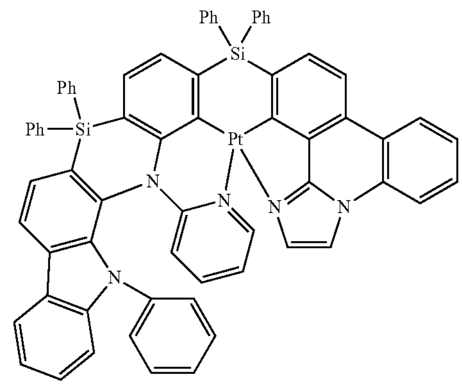
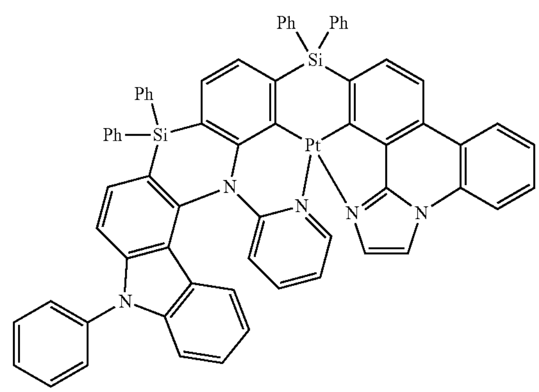
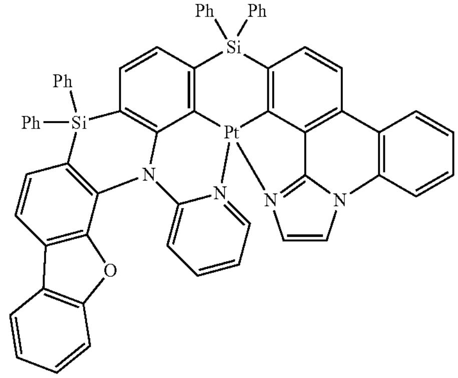

-continued
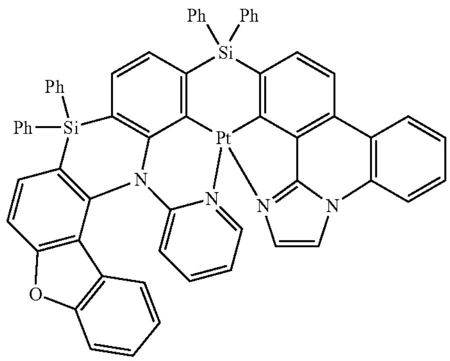
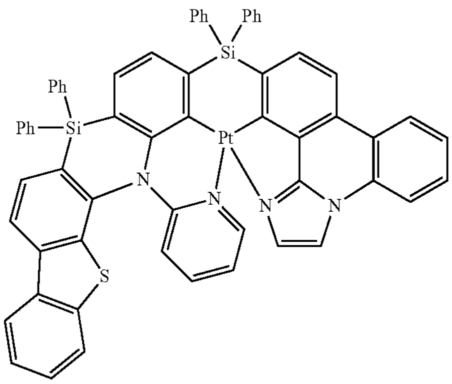
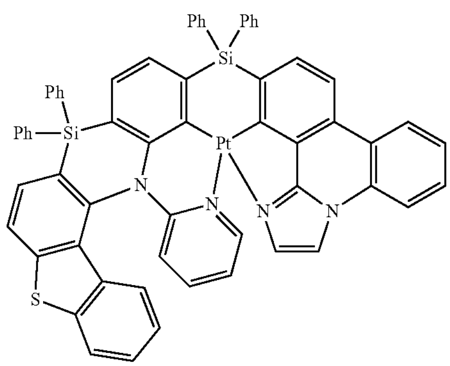
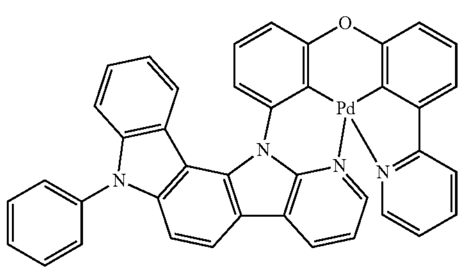
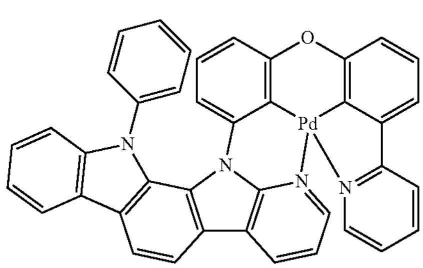
-continued
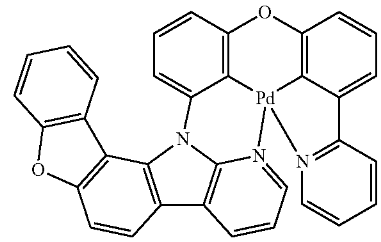
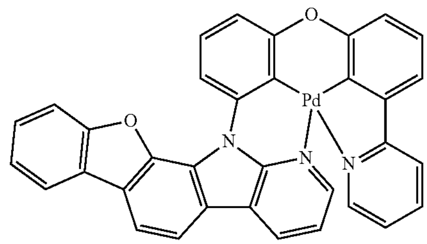
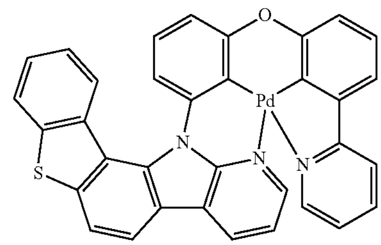
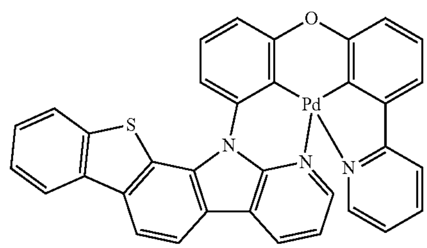
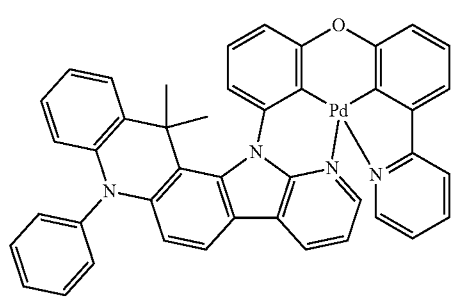
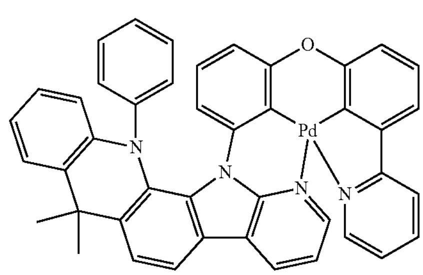

-continued
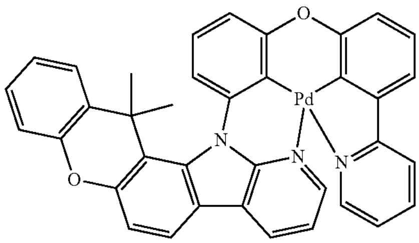
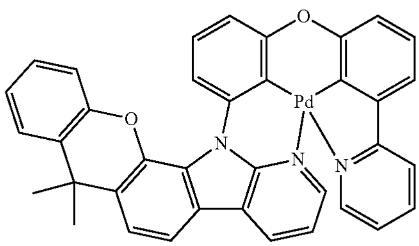
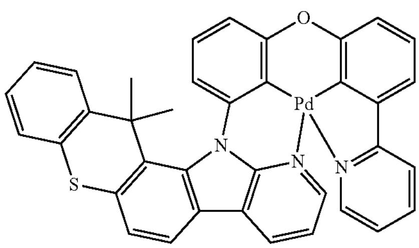
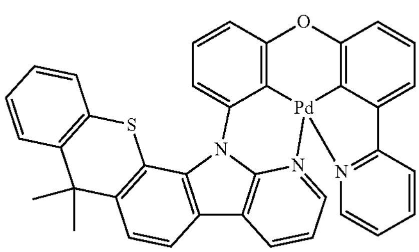
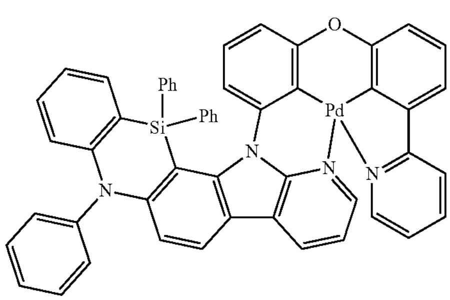
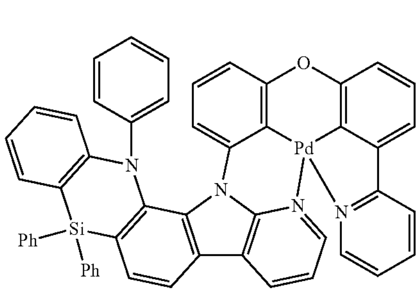
-continued
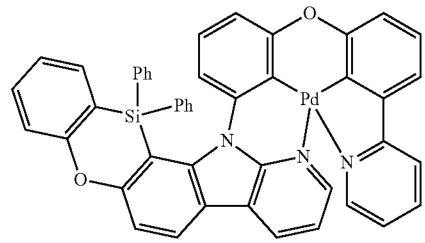
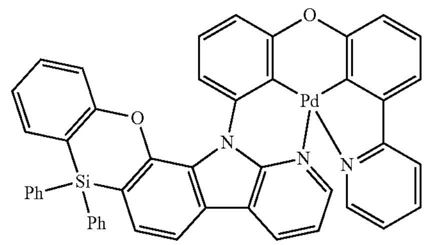
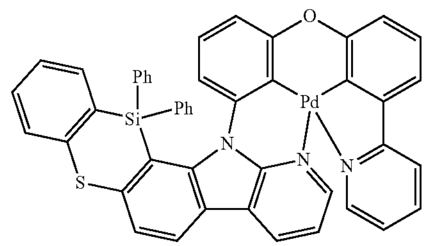
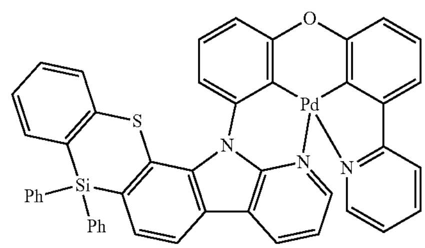
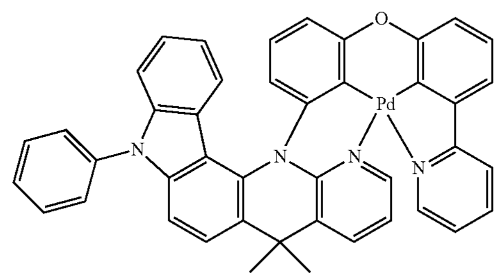
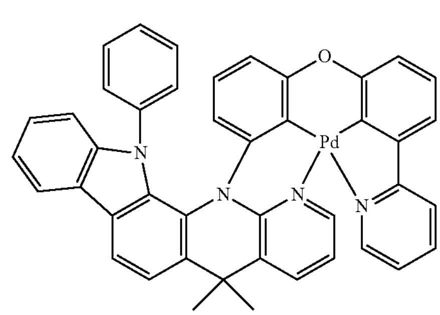

-continued
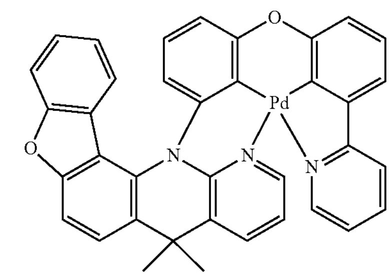
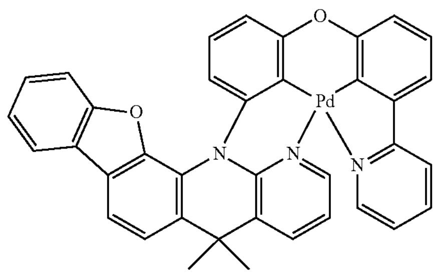
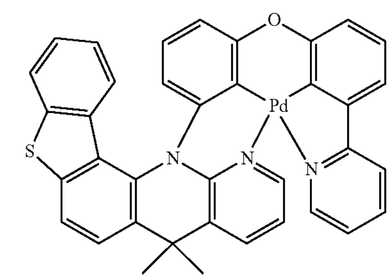
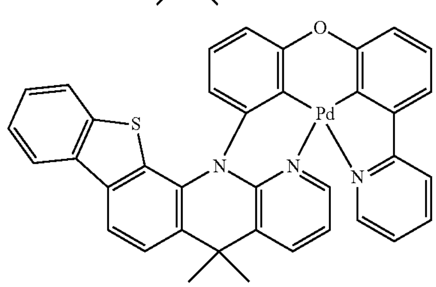
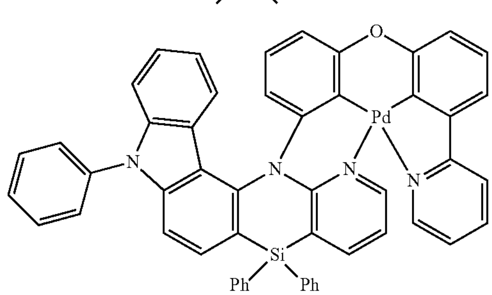
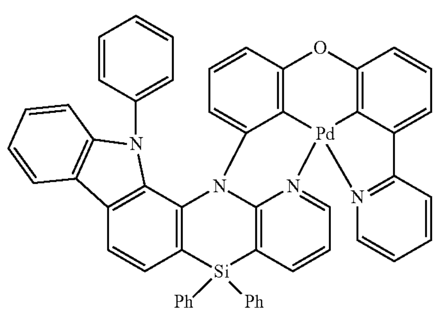
-continued
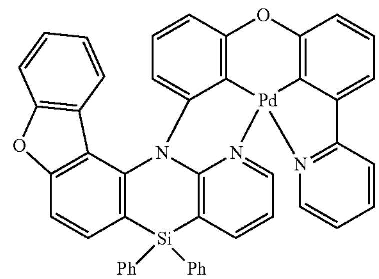
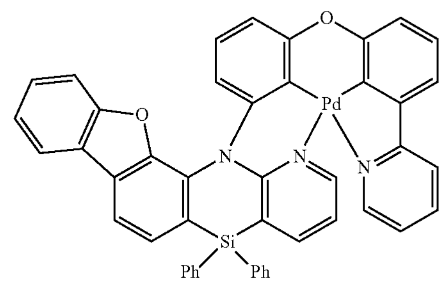
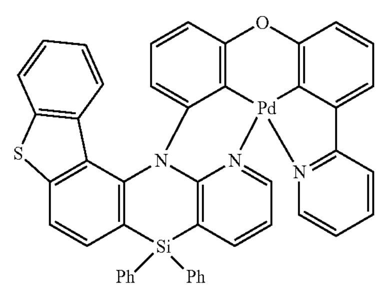
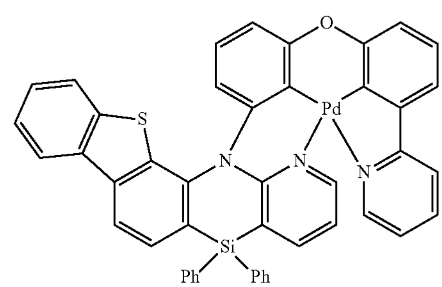
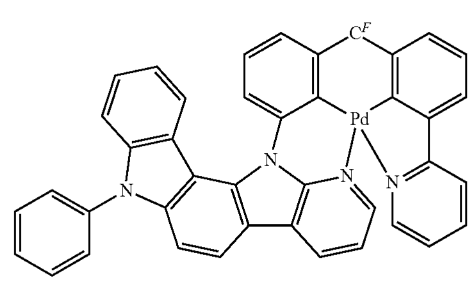
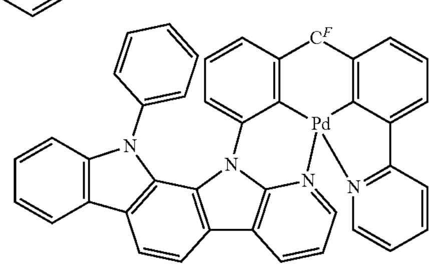

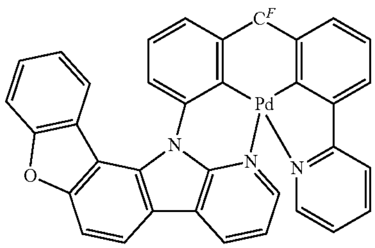
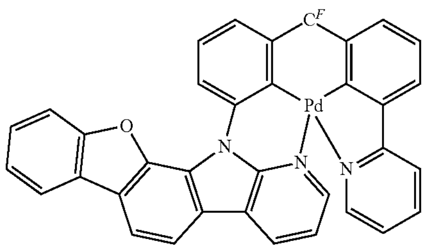
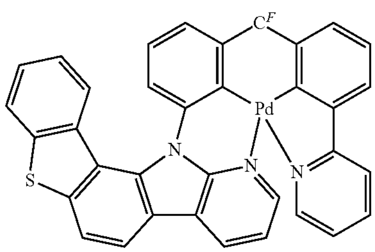
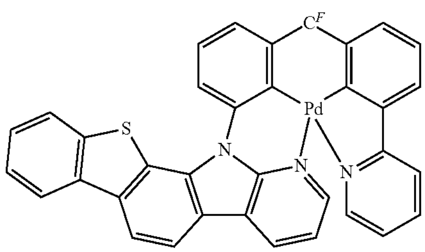
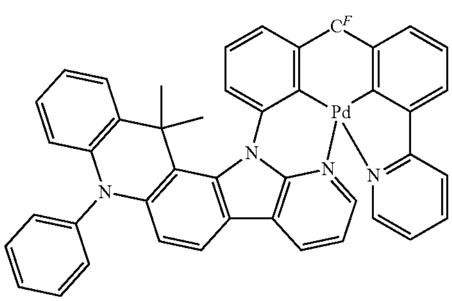
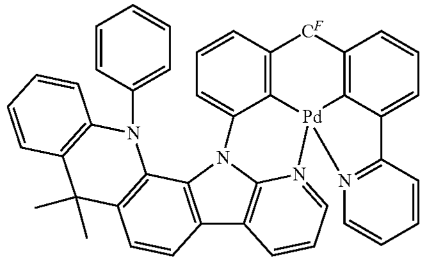
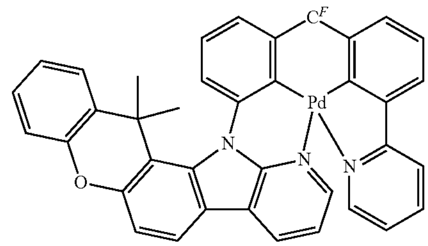
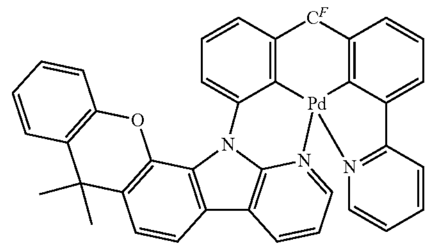
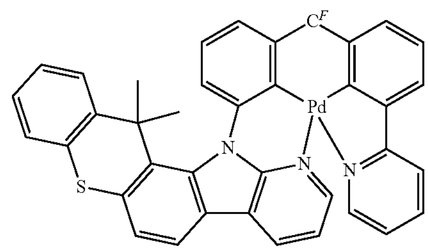
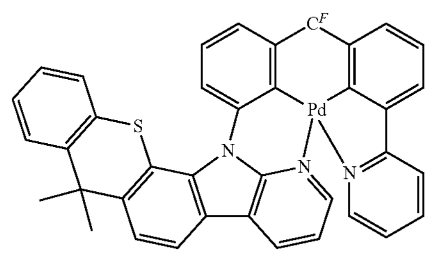
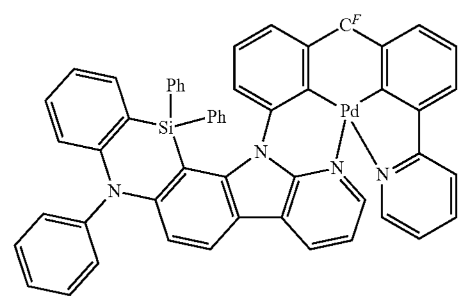
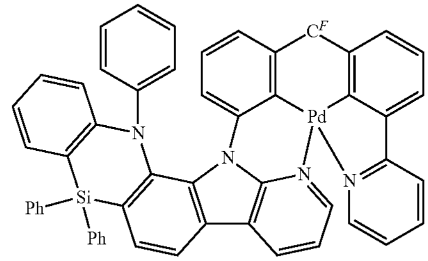

-continued
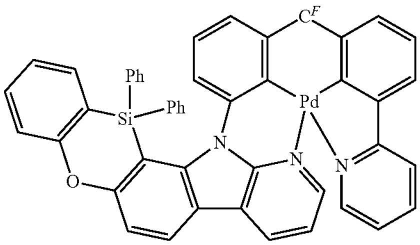
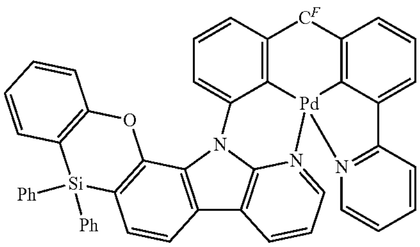
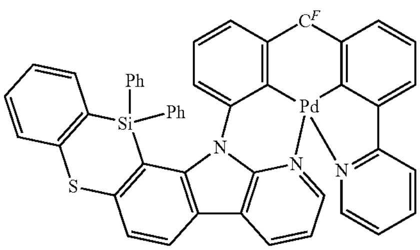
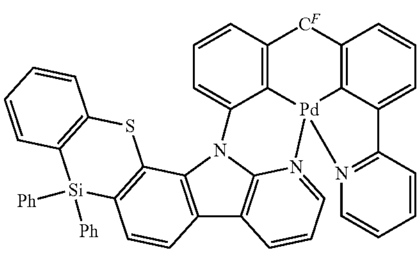
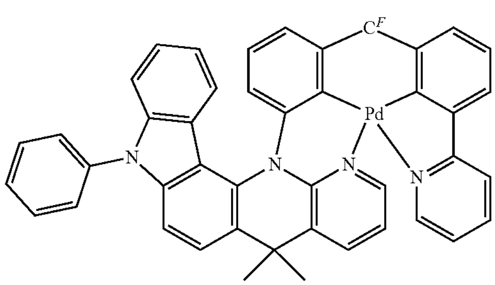
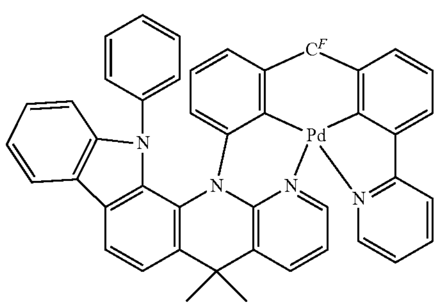
-continued
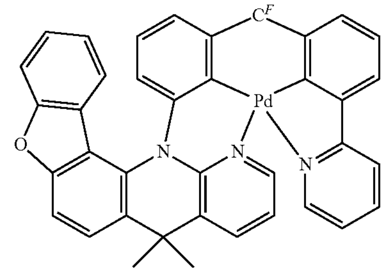
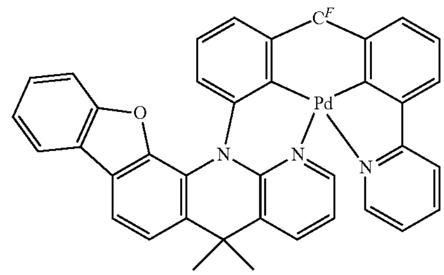
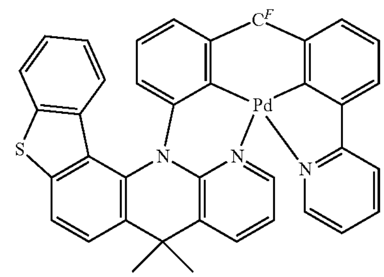
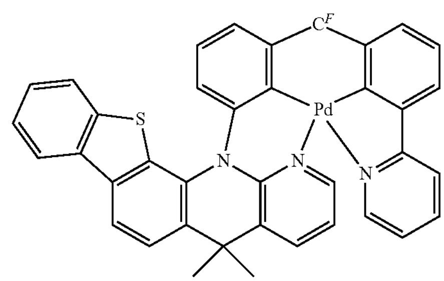
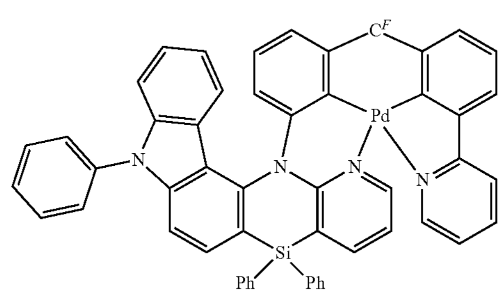
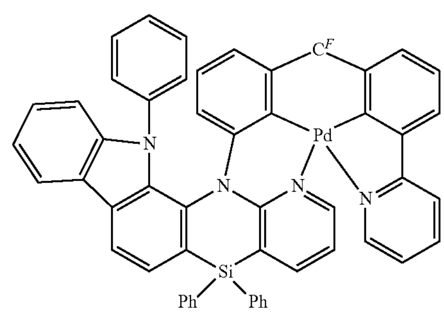

-continued
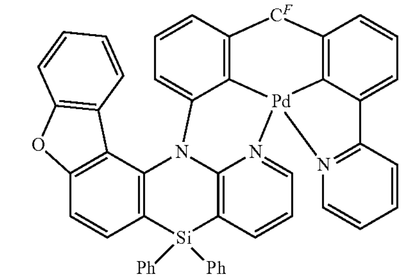
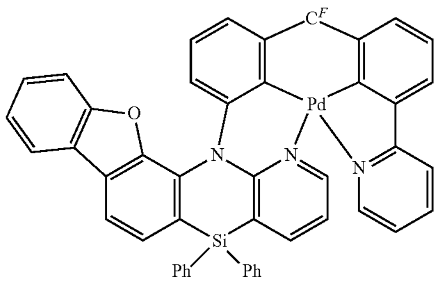
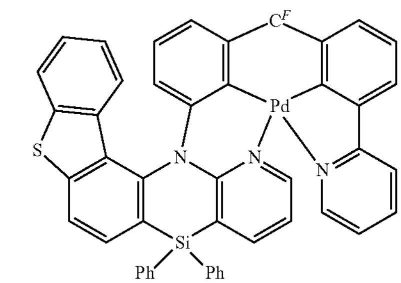
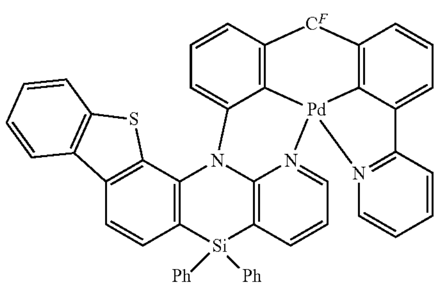
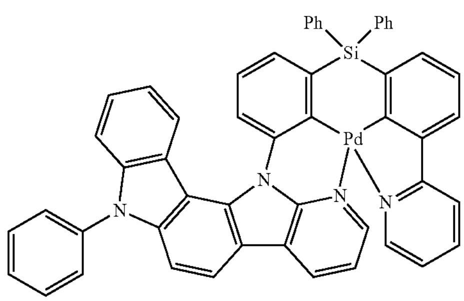
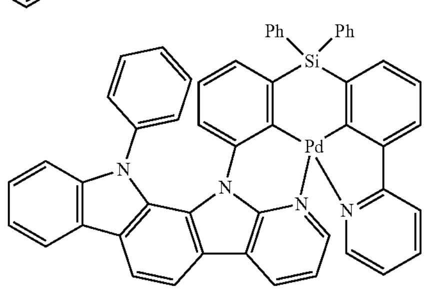
-continued
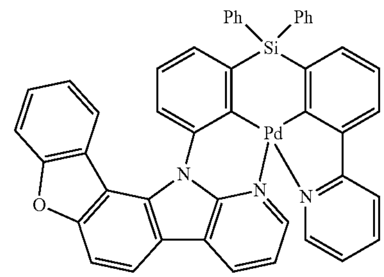
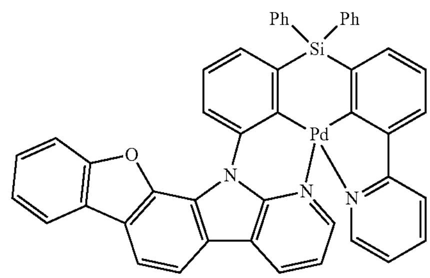
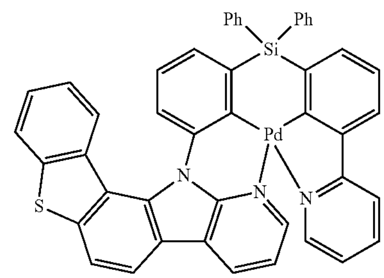
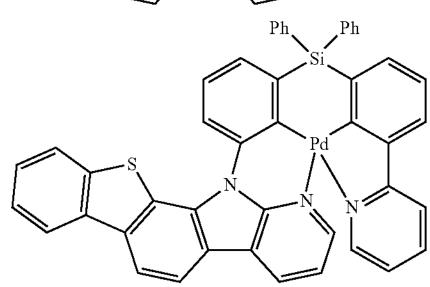
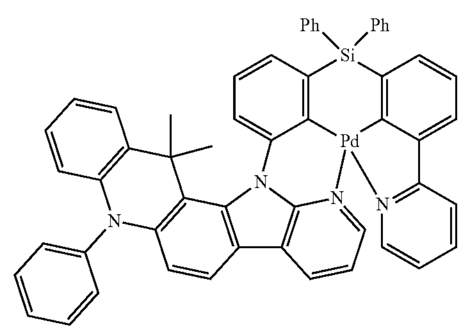
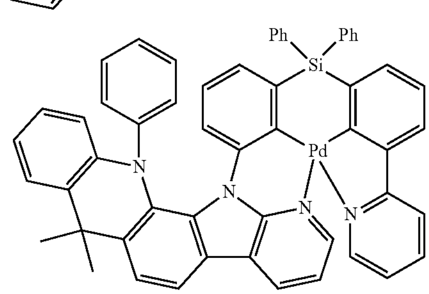

-continued
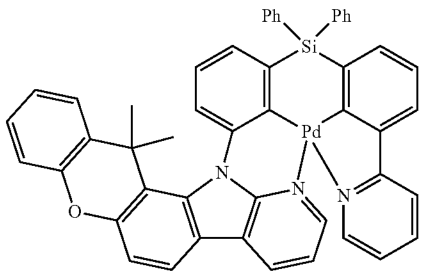
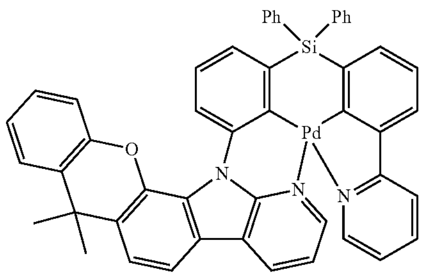
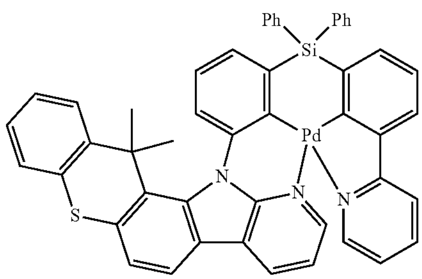
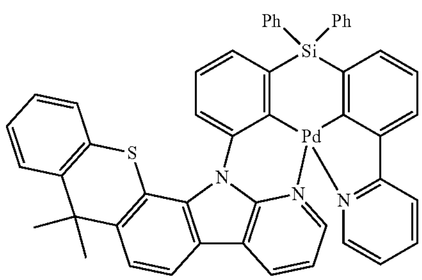
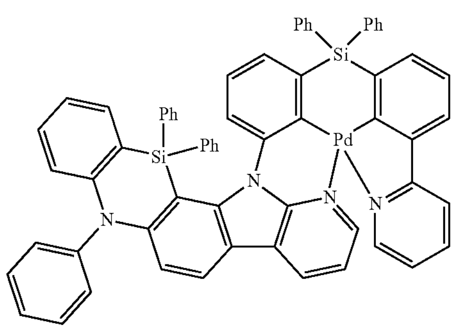
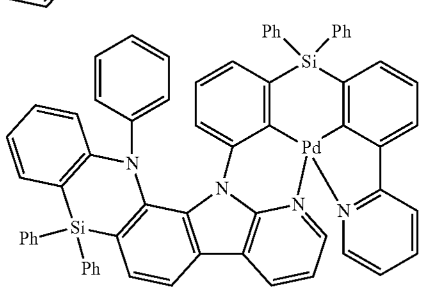
-continued
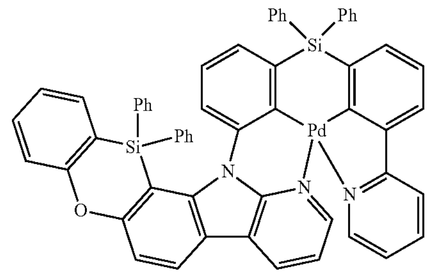
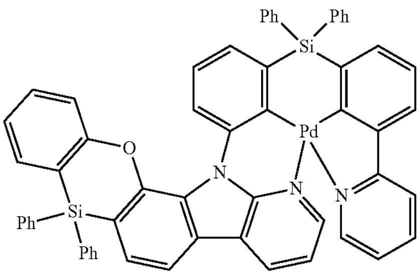
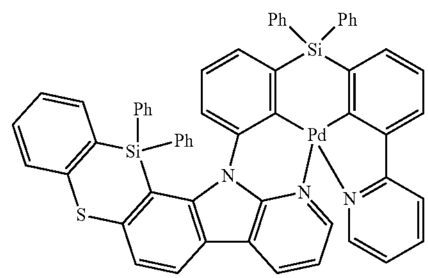
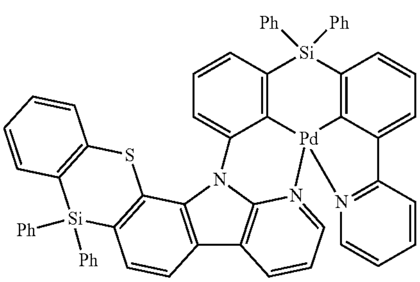
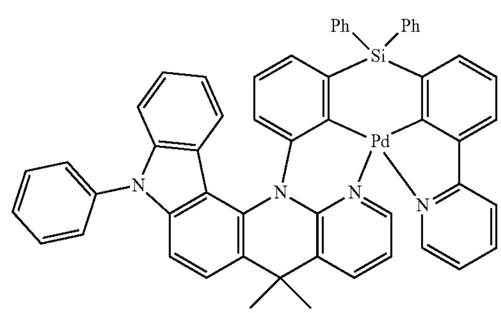
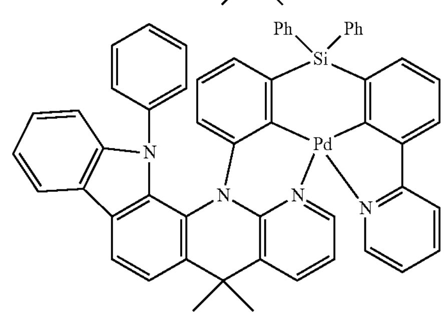

-continued
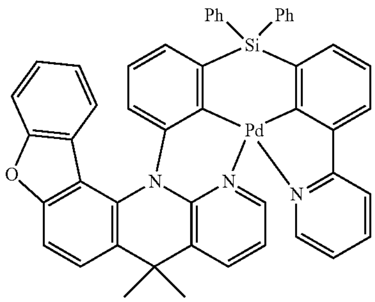
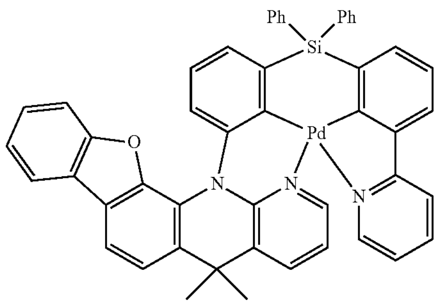
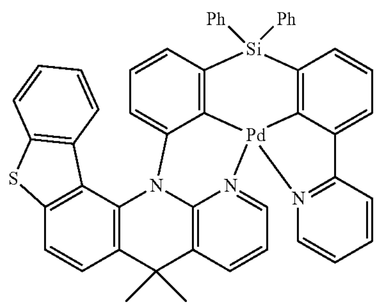
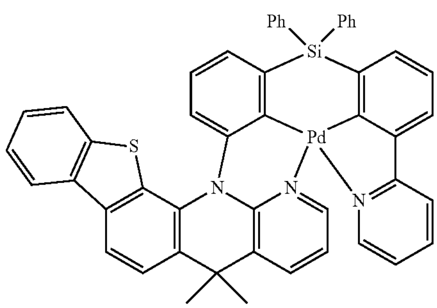
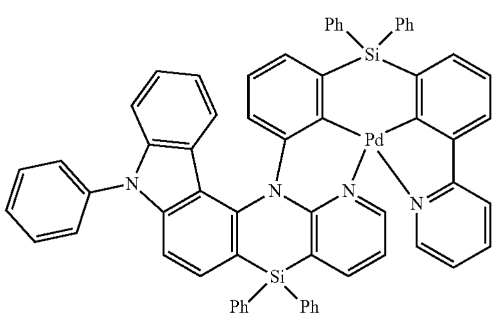
-continued
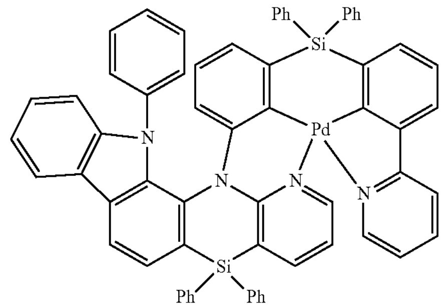
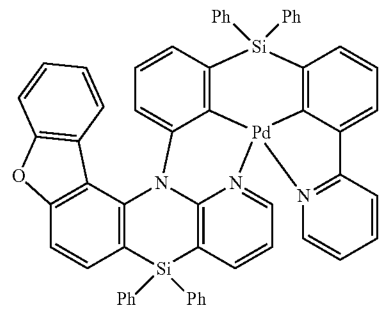
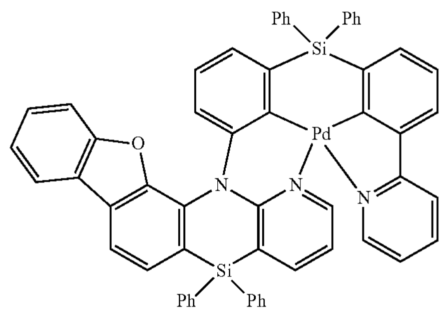
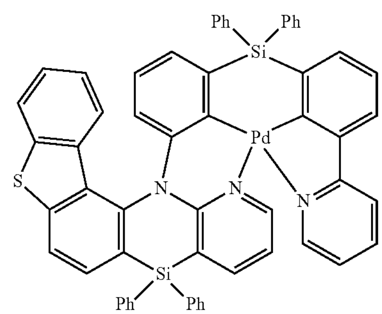
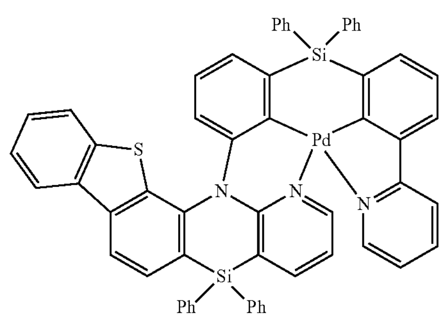

-continued
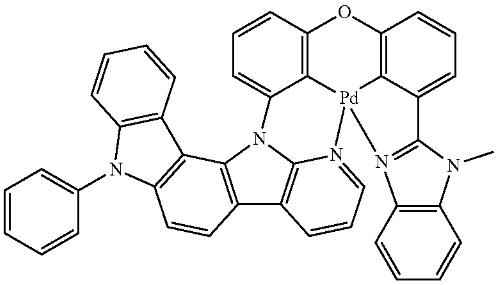
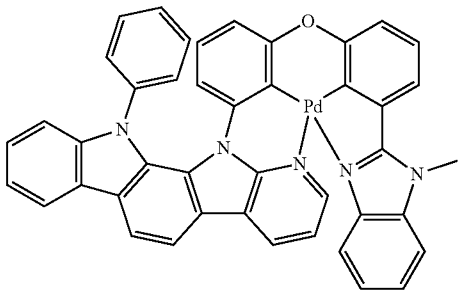
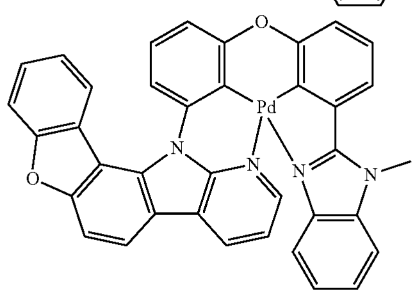
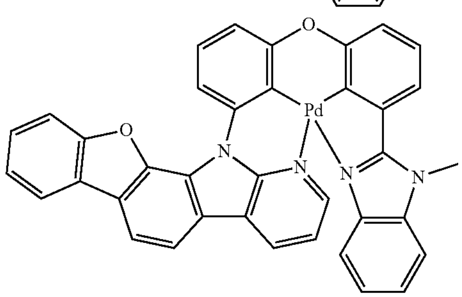
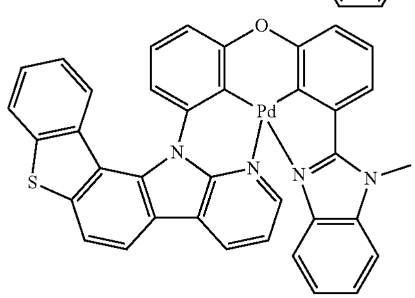
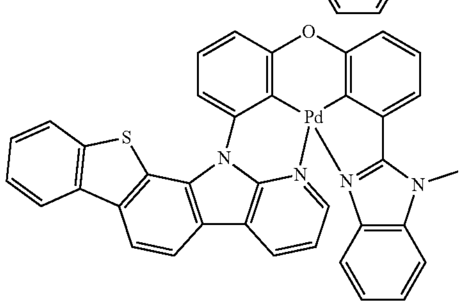
-continued
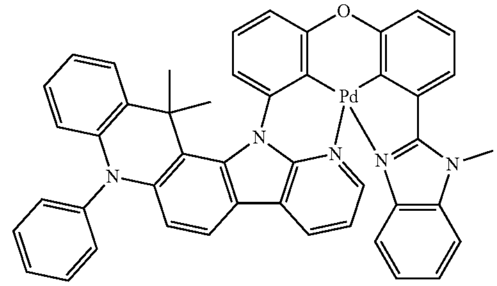
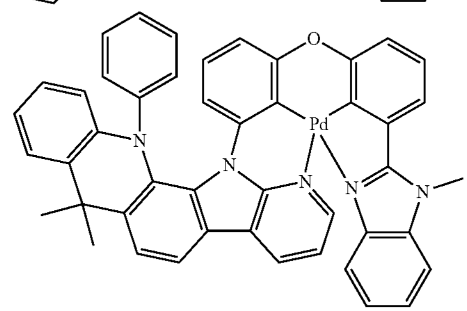
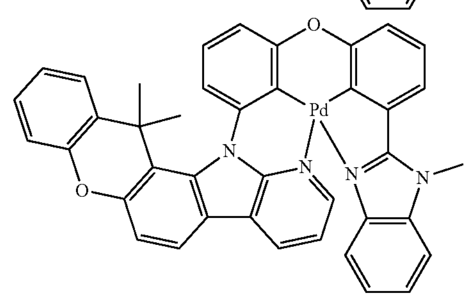
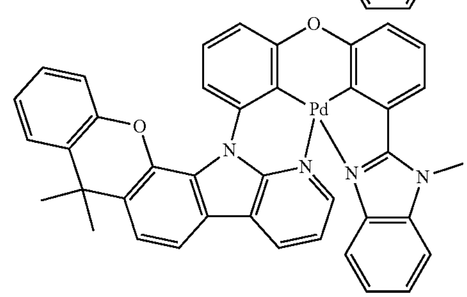
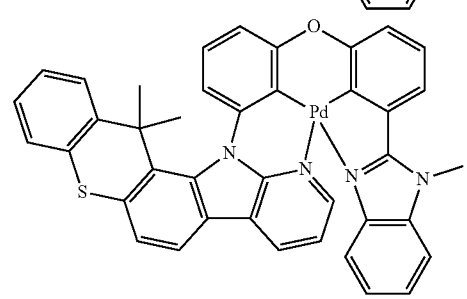
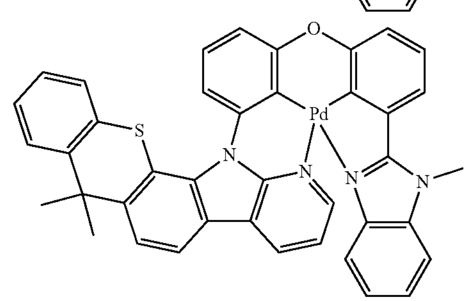

-continued
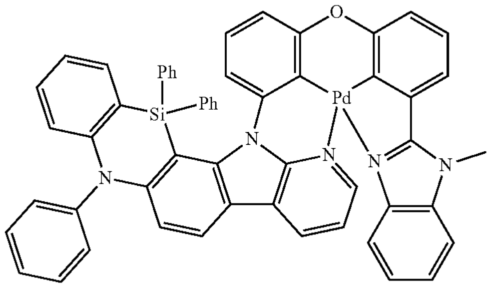
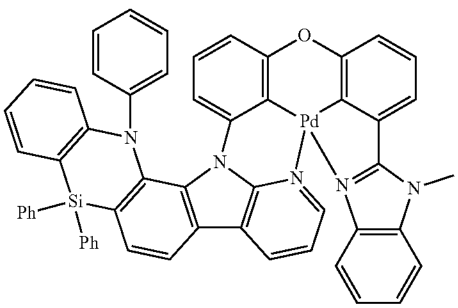
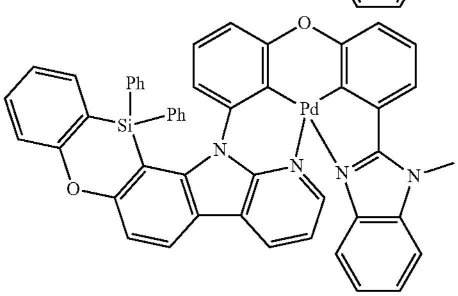
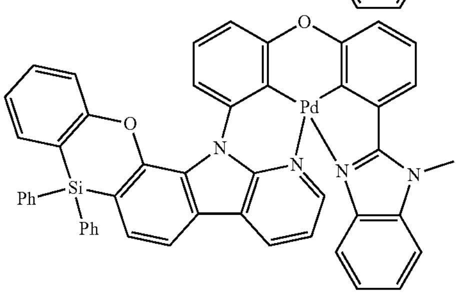
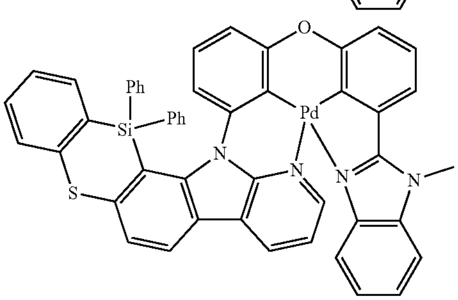
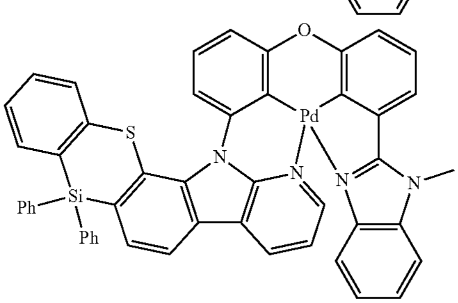
-continued
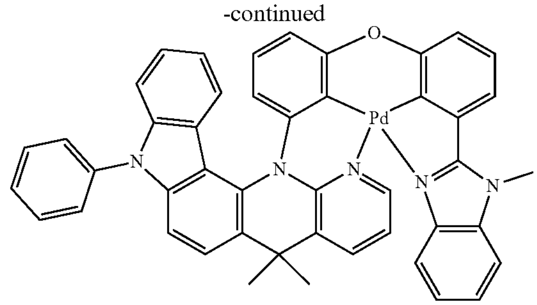
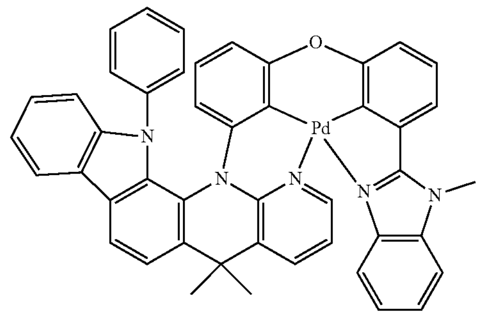
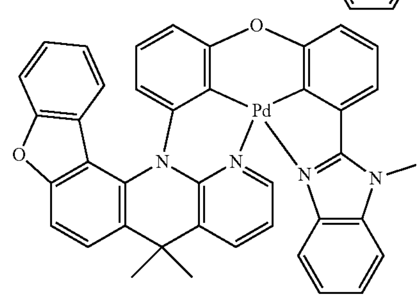
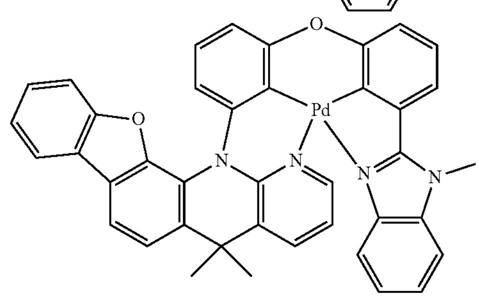
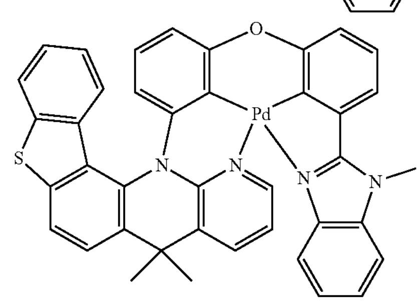
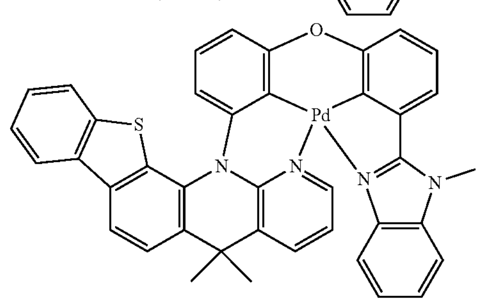

-continued
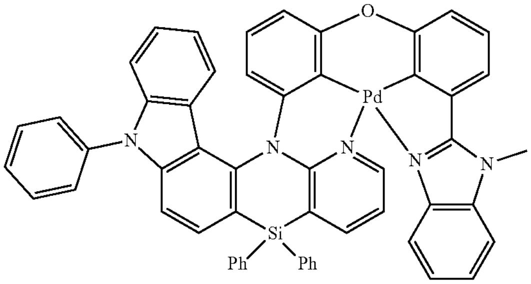
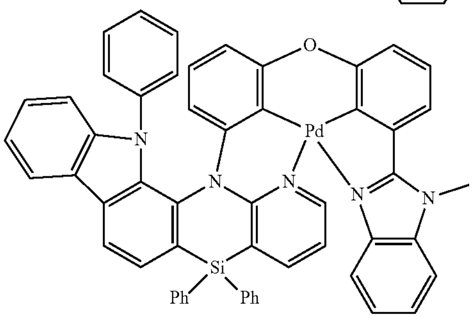
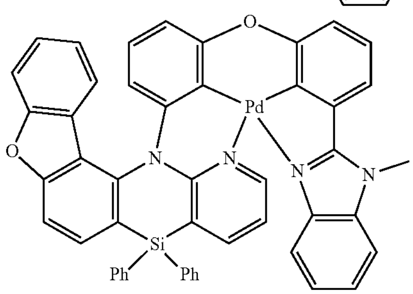
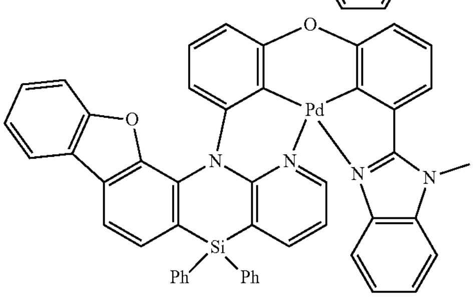
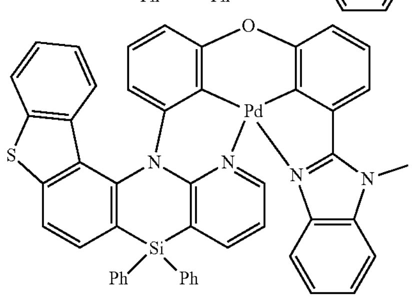
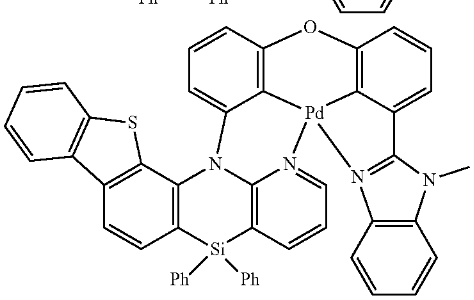
-continued
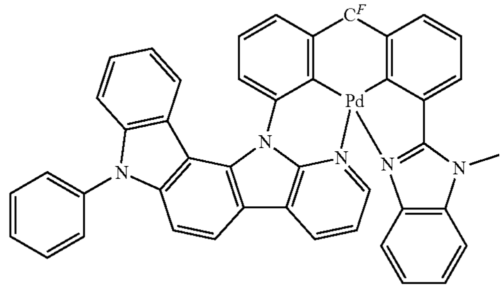
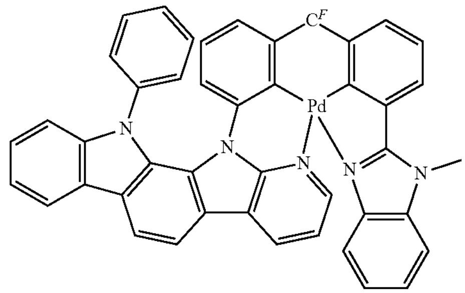
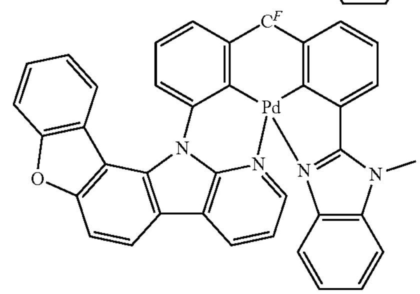
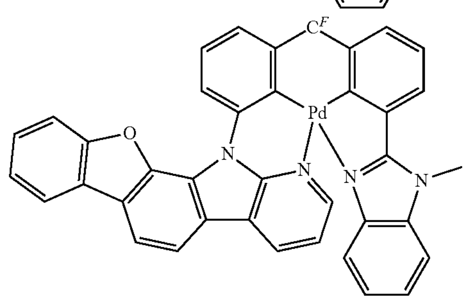
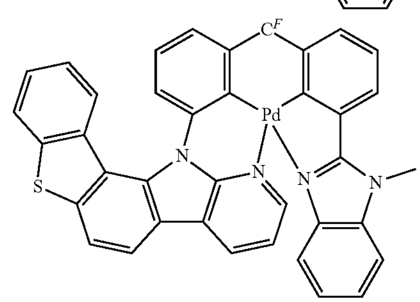
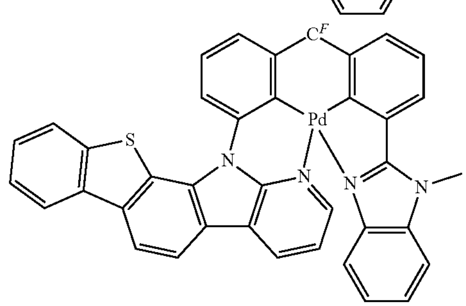

-continued
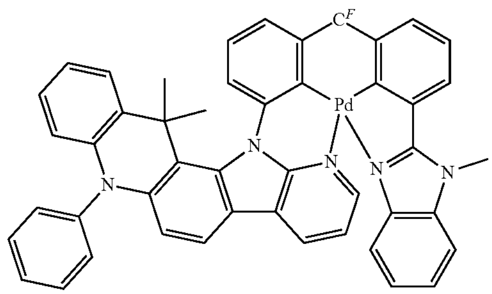
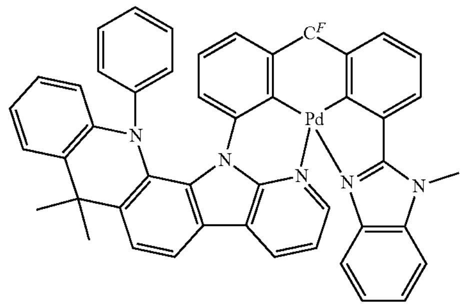
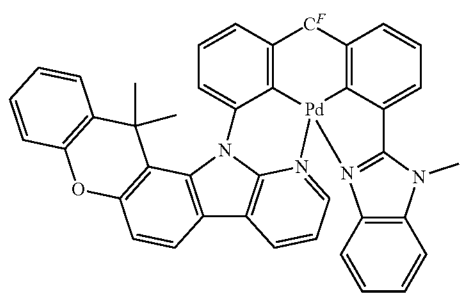
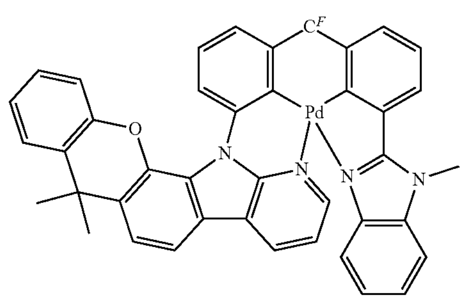
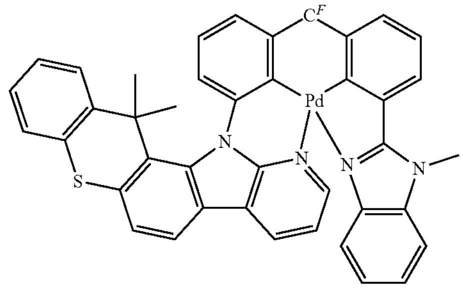
-continued
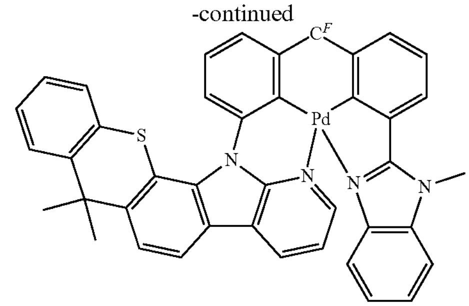
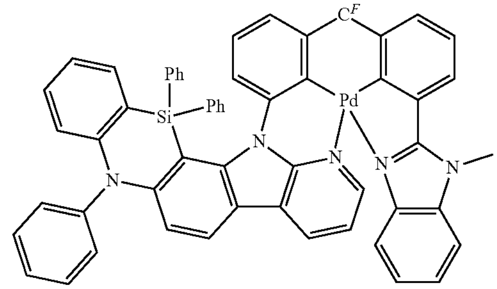
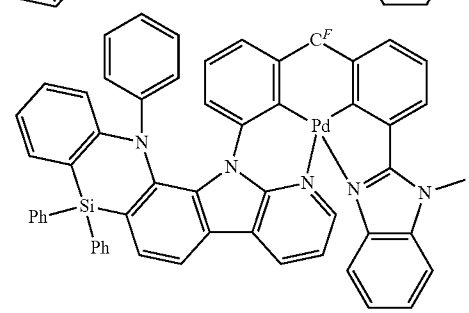
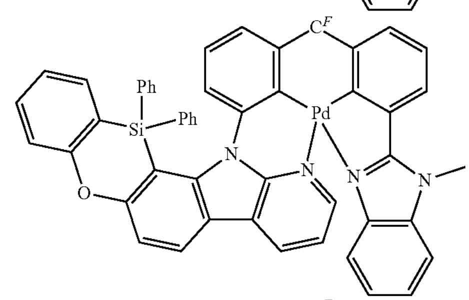
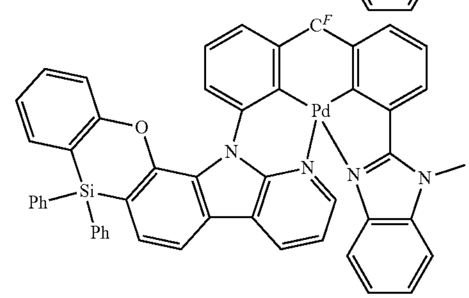
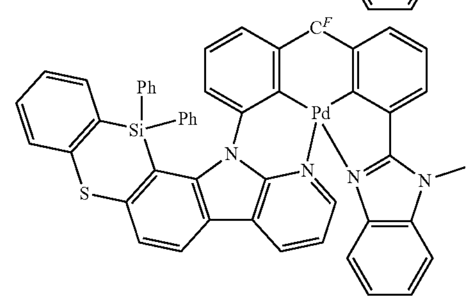

-continued
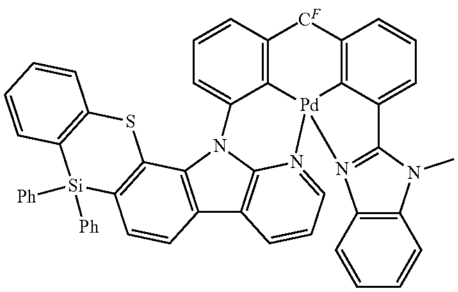
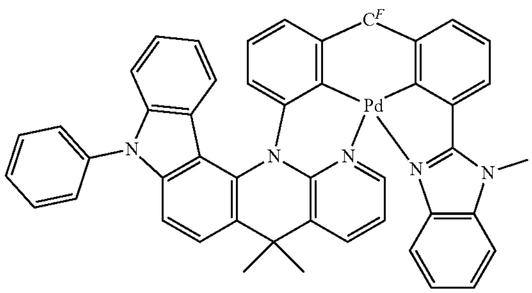
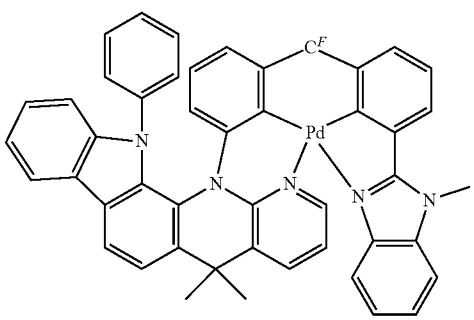
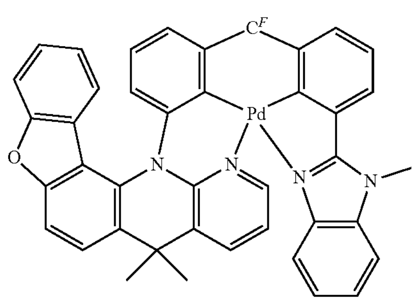
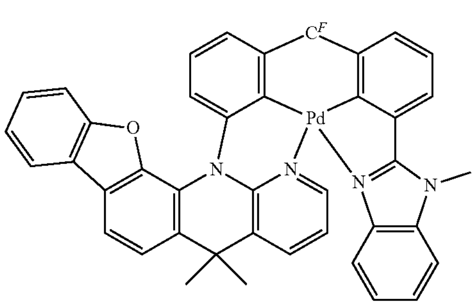
-continued
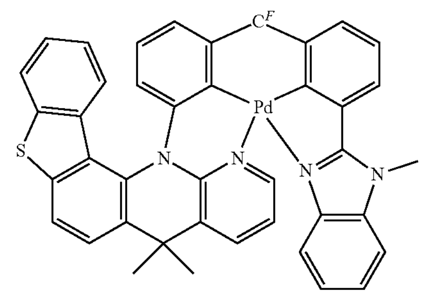
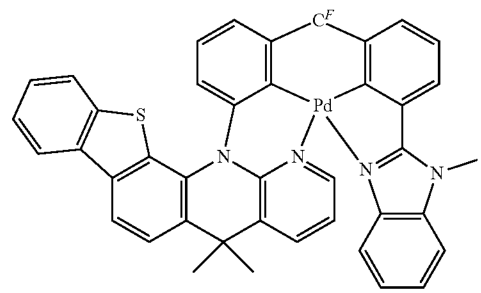
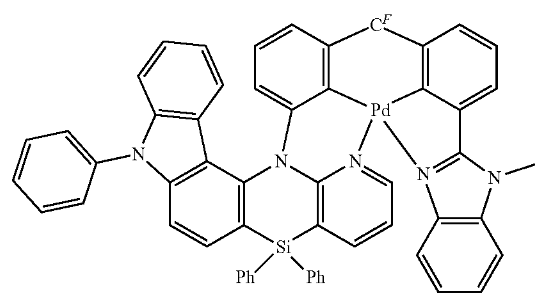
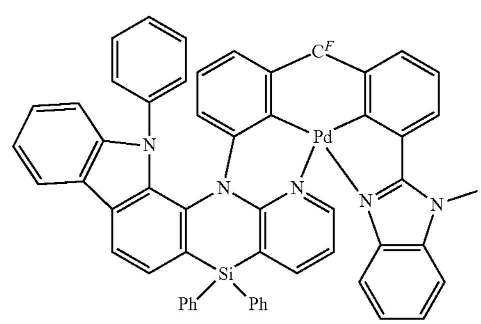
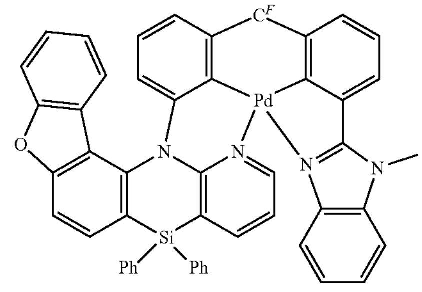

-continued
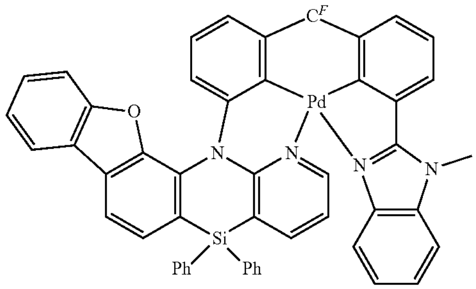
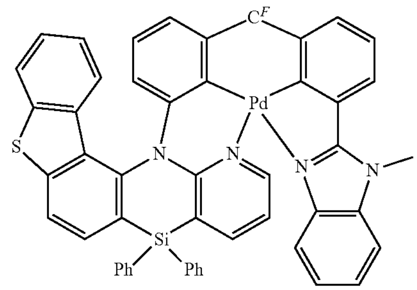
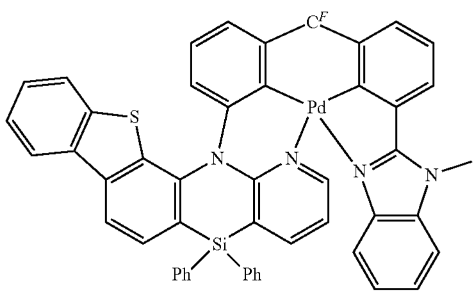
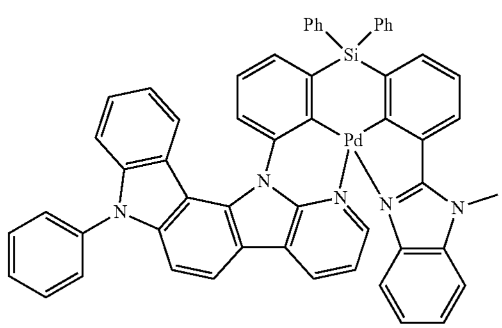
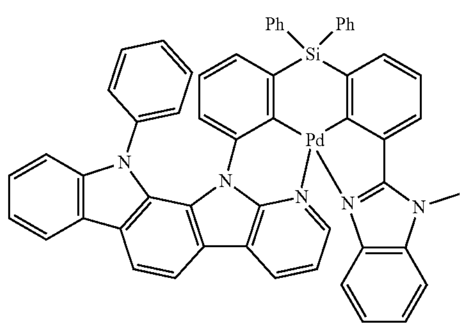
-continued
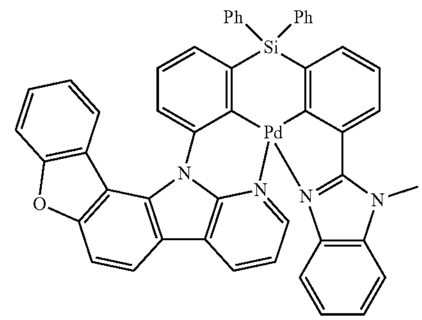
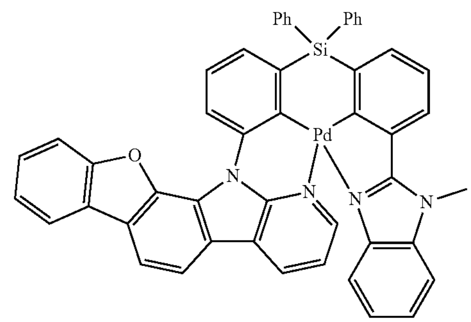
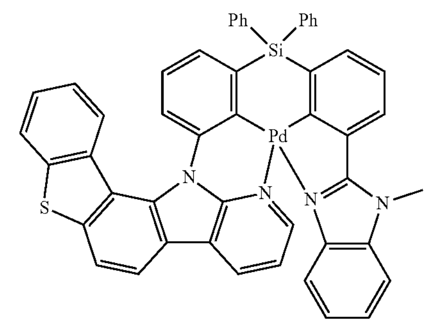
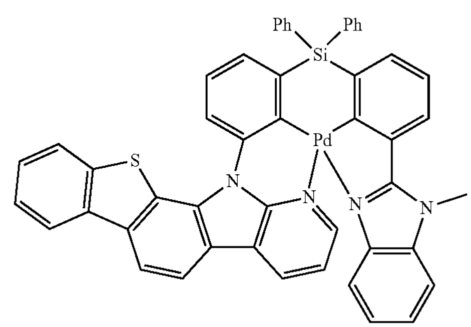
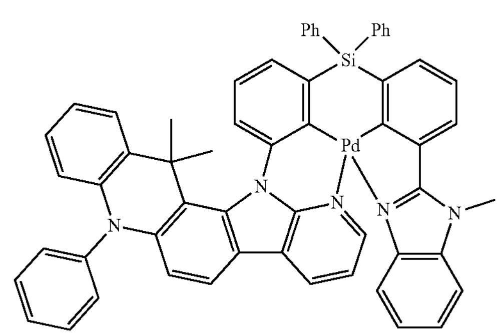

-continued
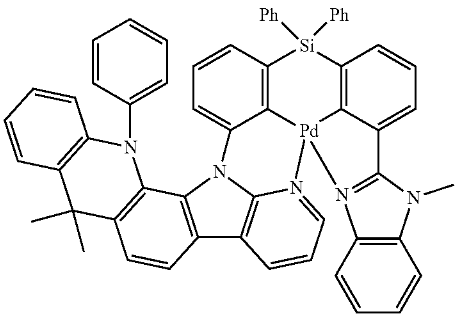
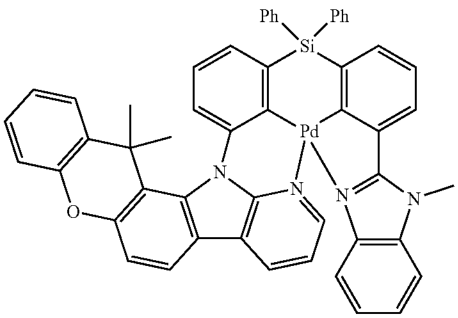
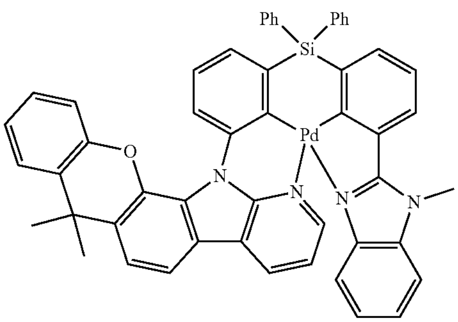
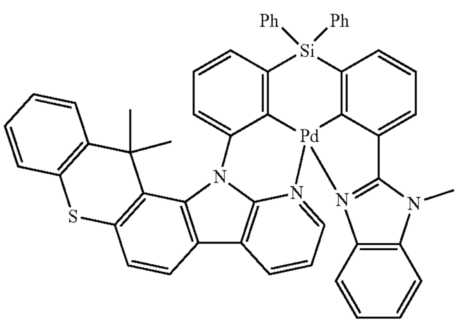
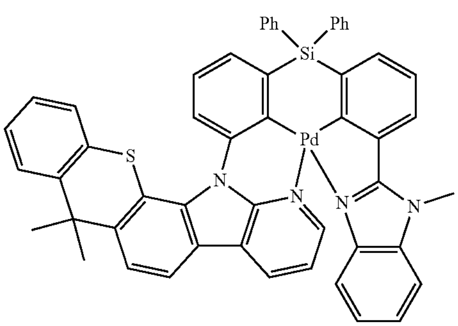
-continued
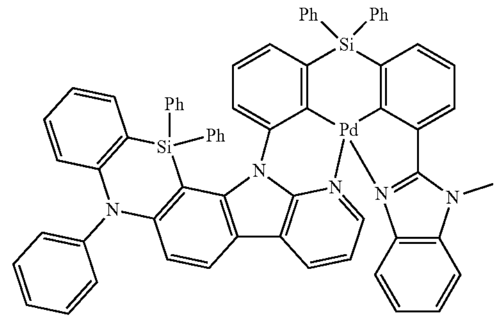
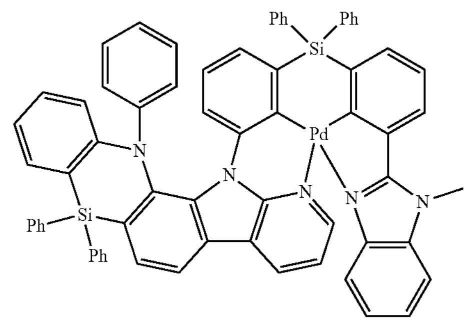
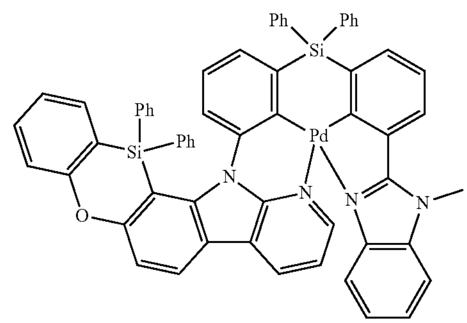
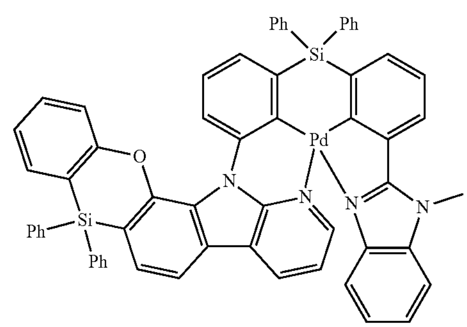
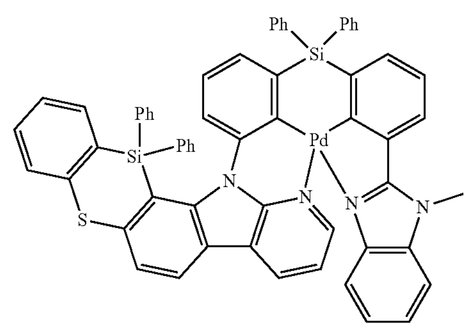

-continued
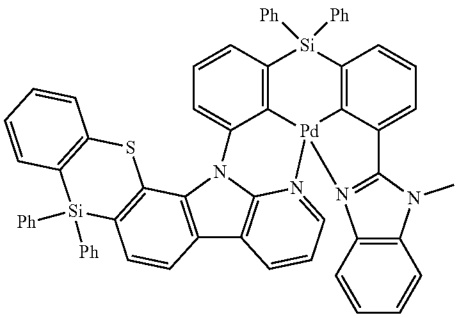
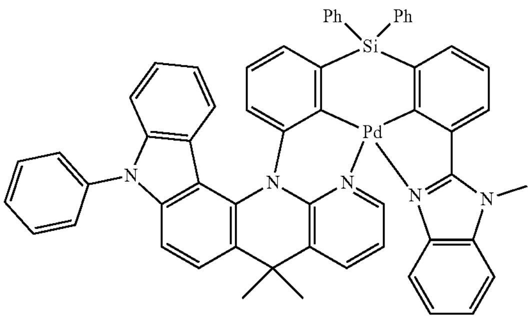
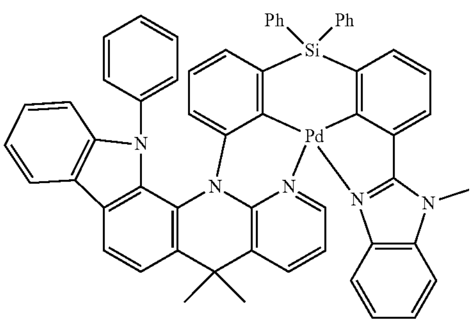
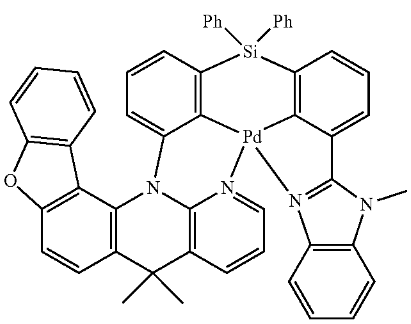
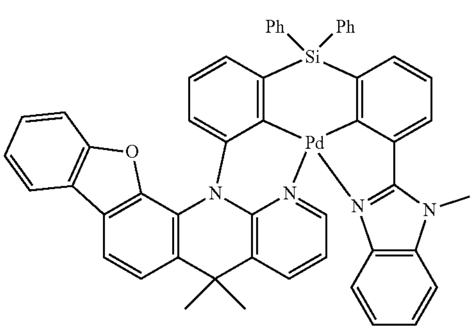
-continued
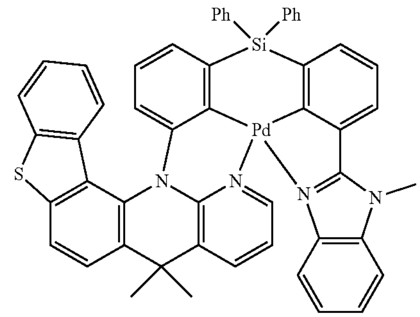
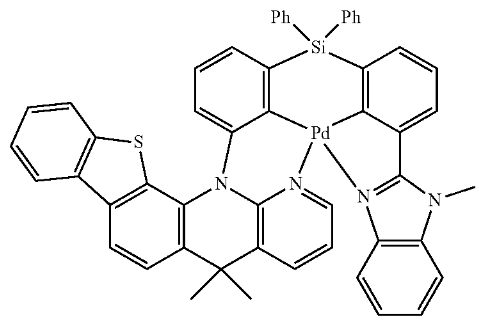
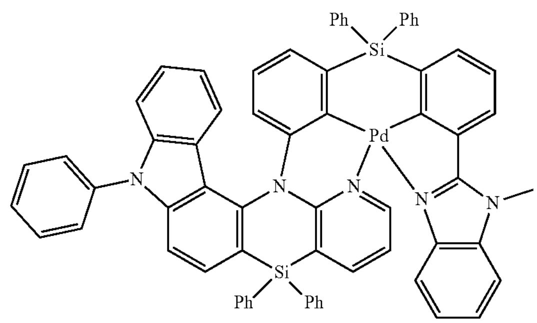
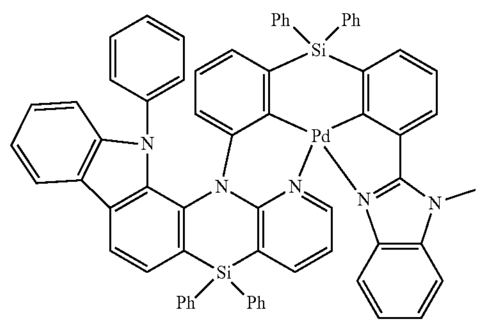
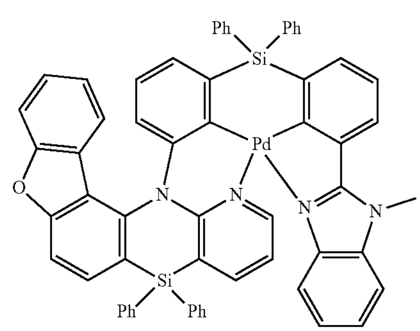

-continued
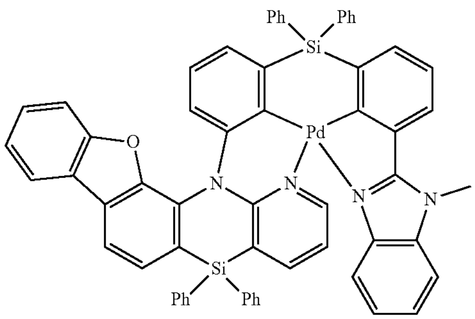
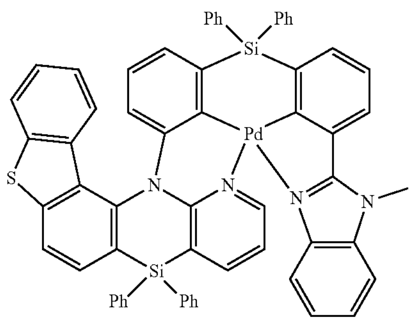
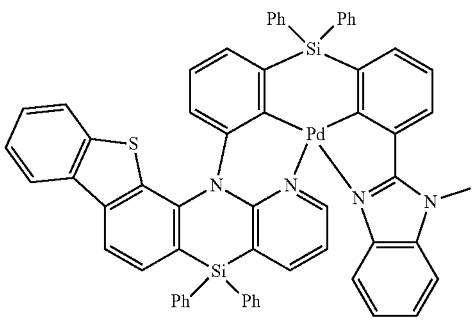
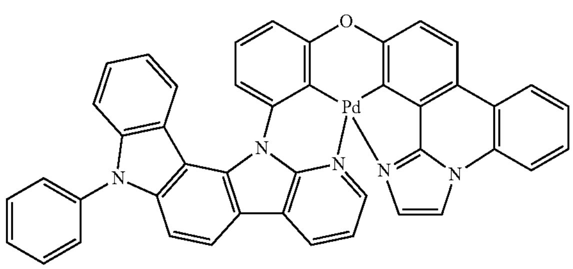
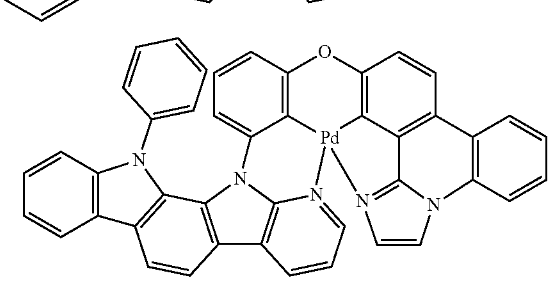
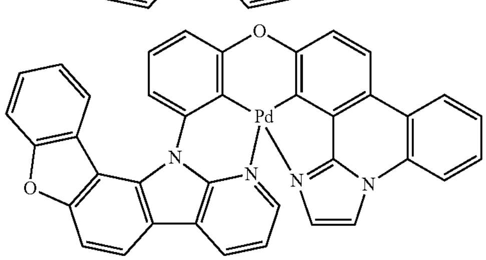
-continued
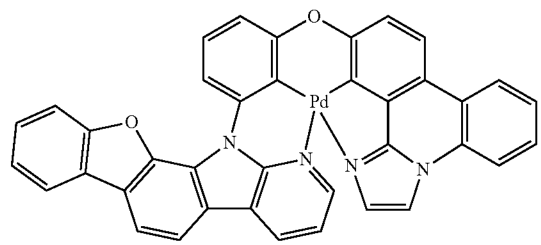
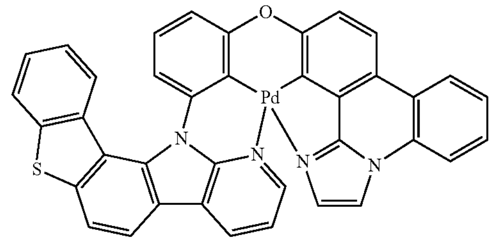
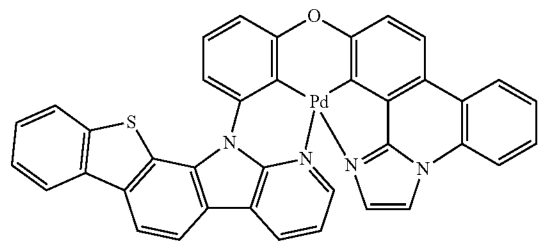
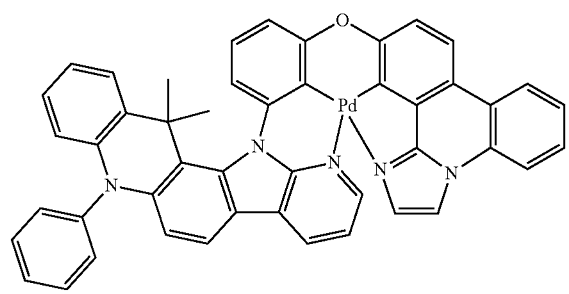
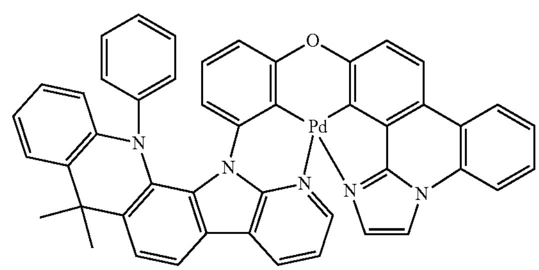
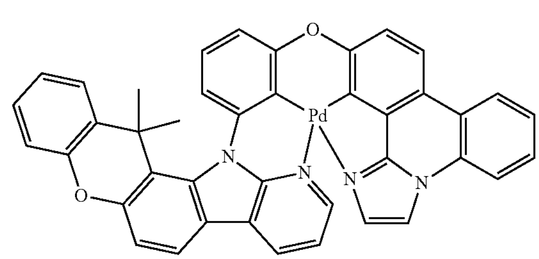

-continued
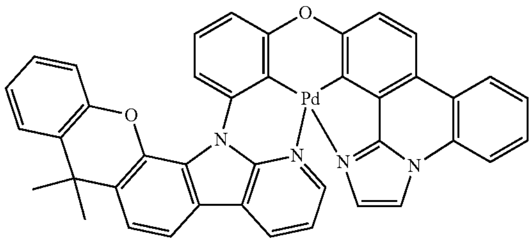
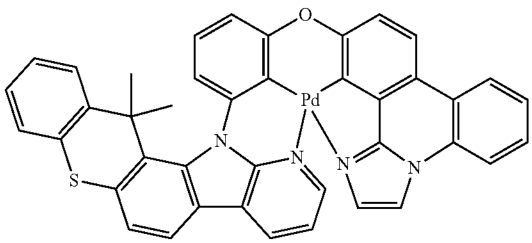
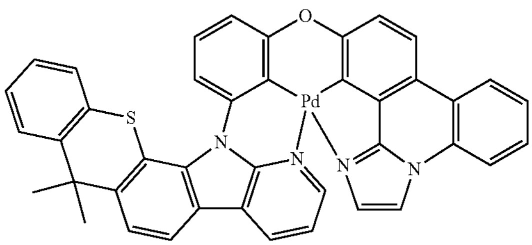
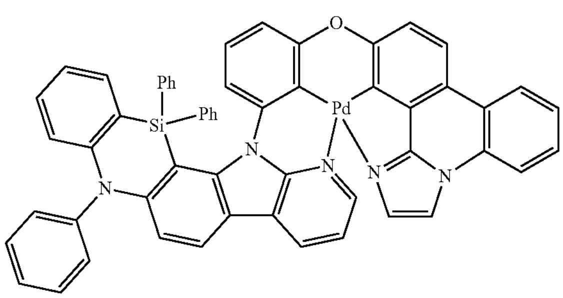
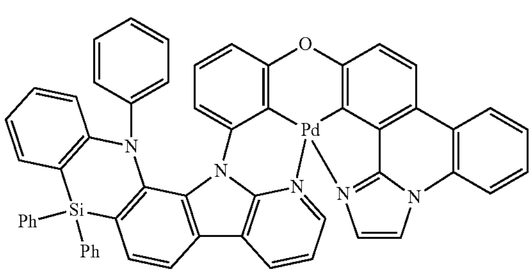
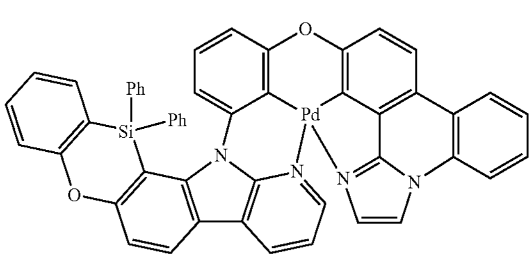
-continued
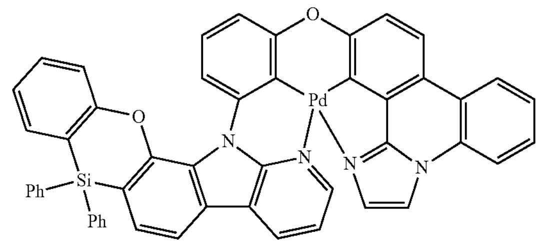
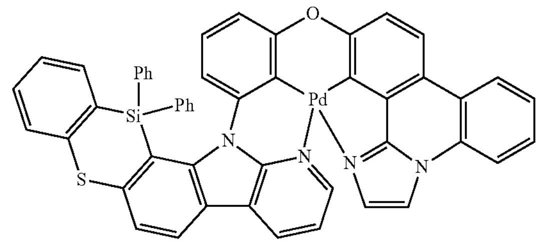
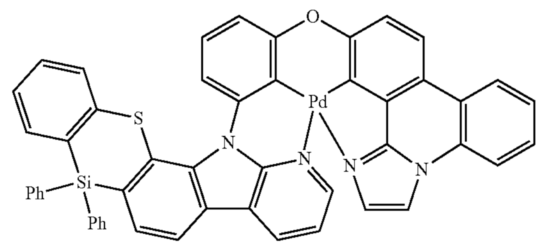
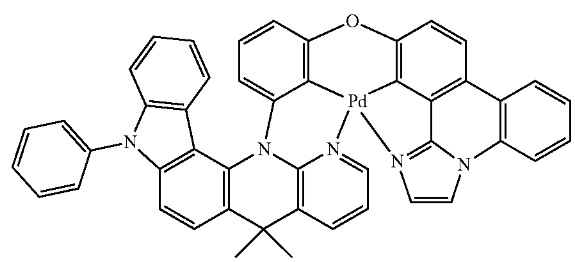
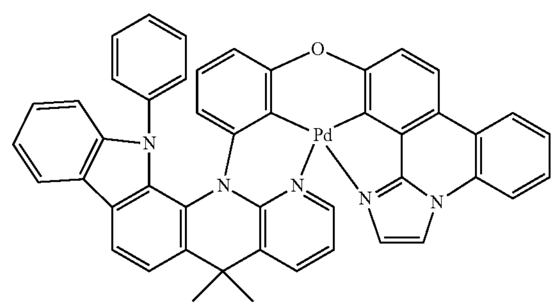
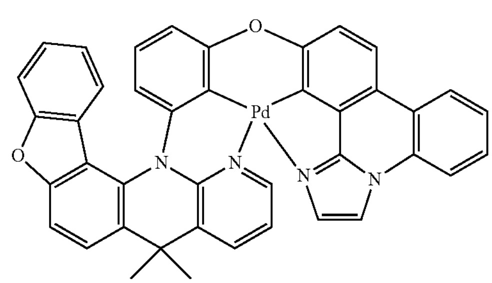

-continued
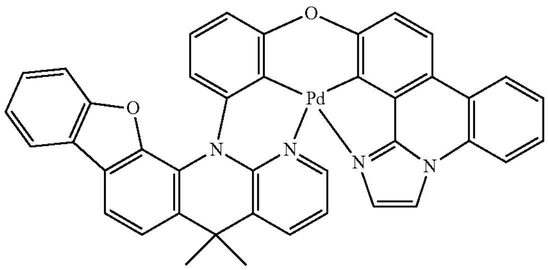
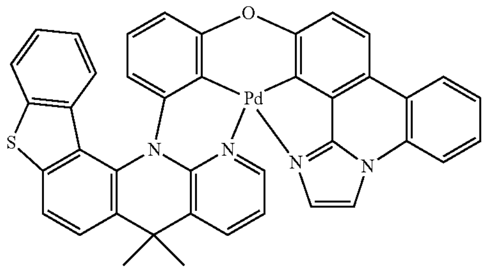
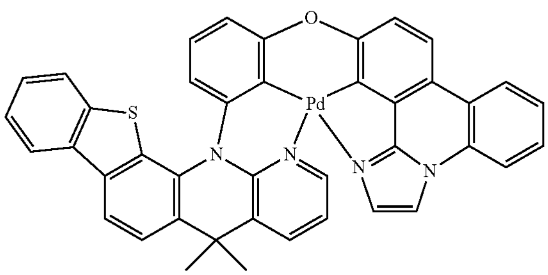
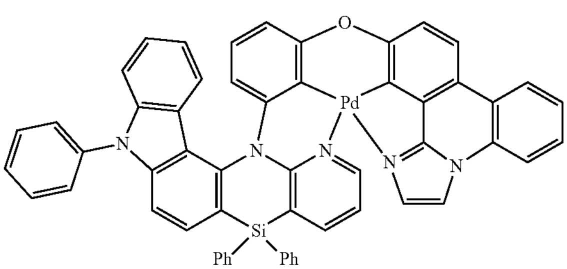
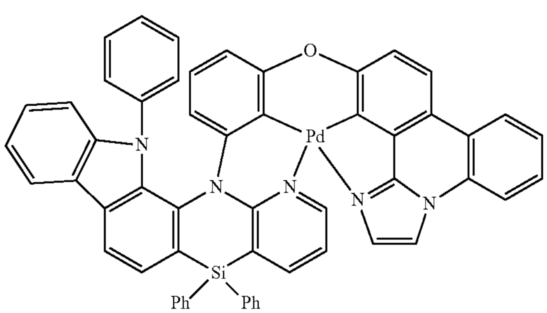
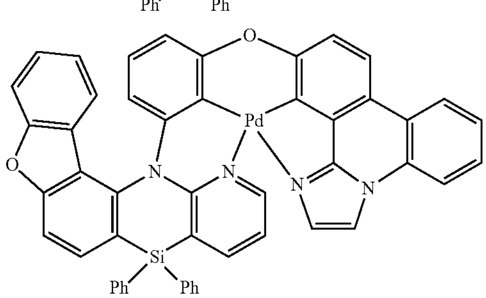
-continued
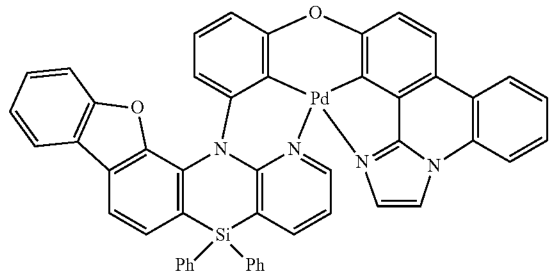
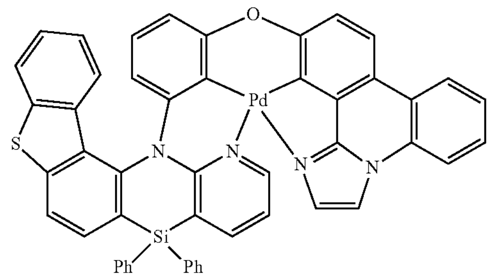
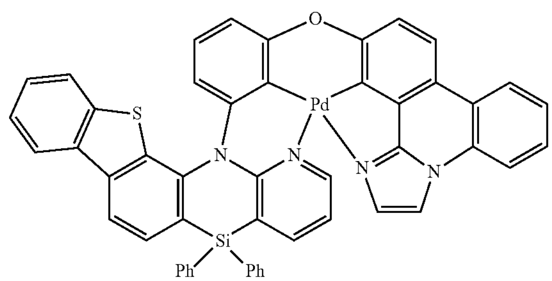
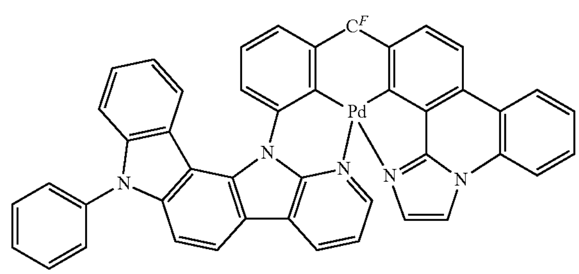
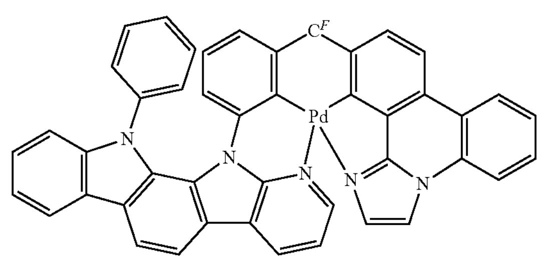
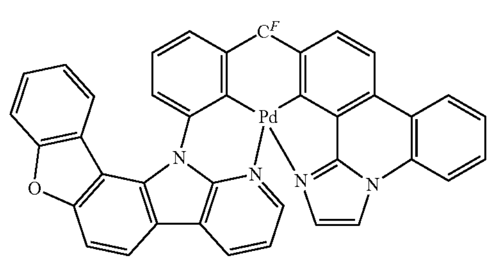

-continued
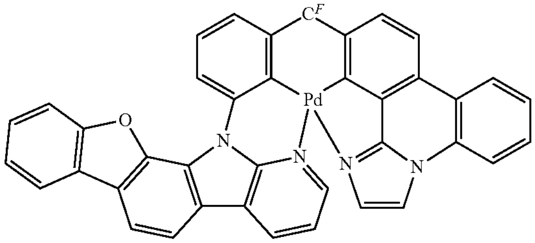
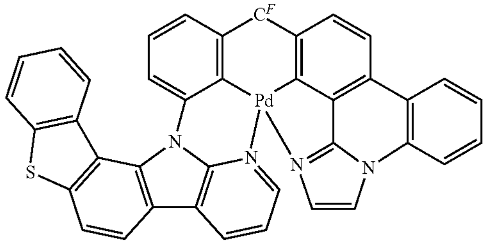
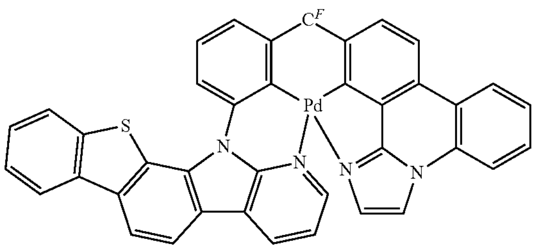
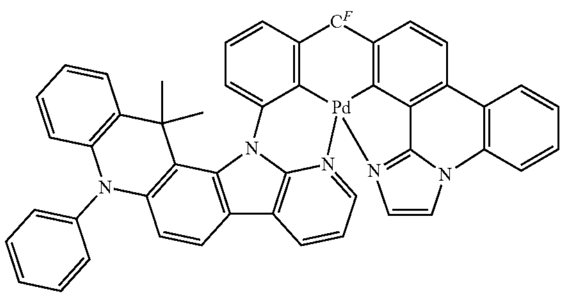
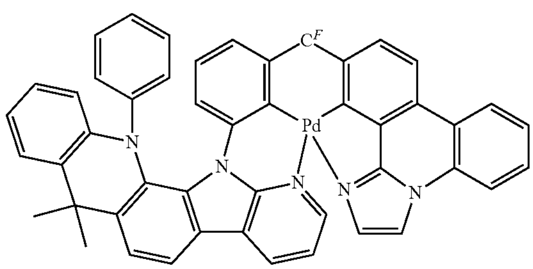
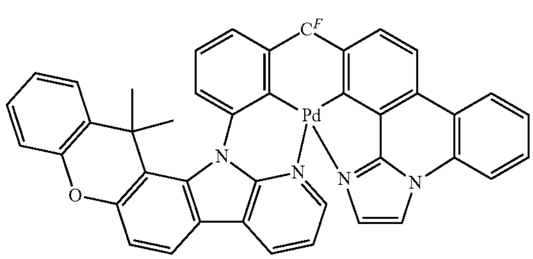
-continued
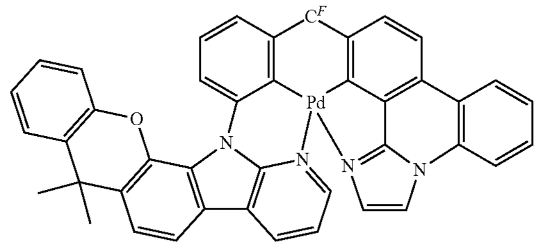
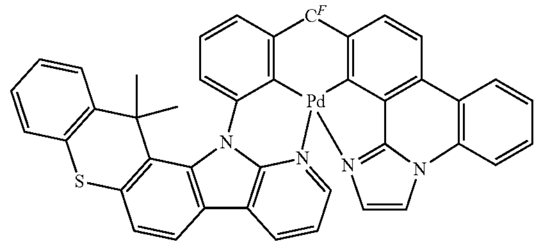
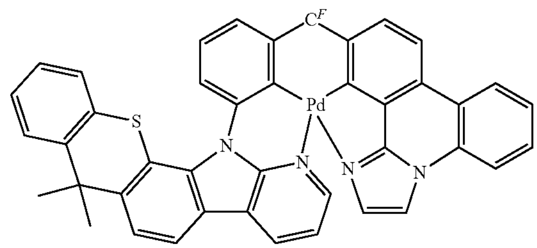
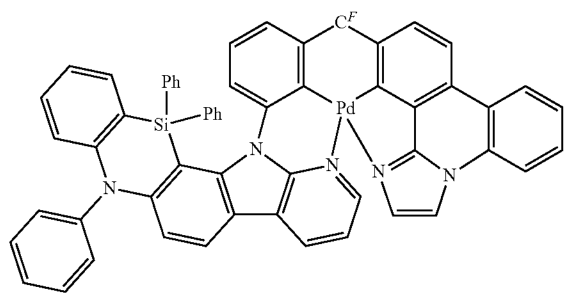
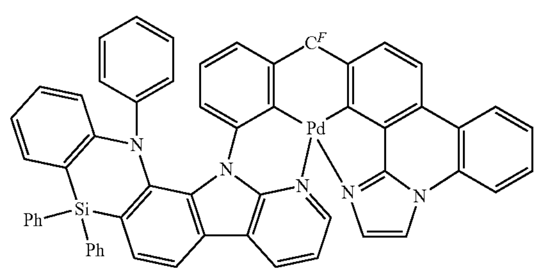
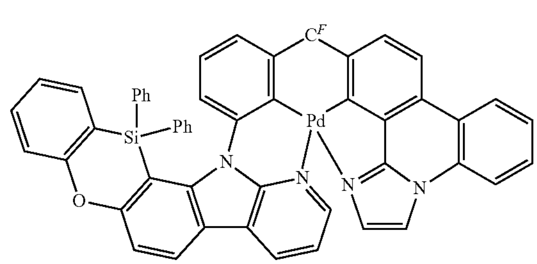

-continued
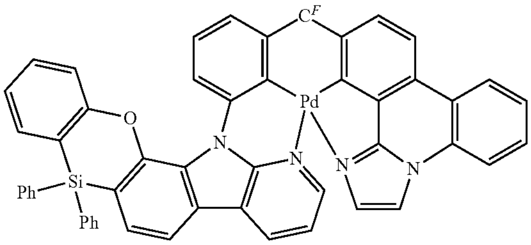
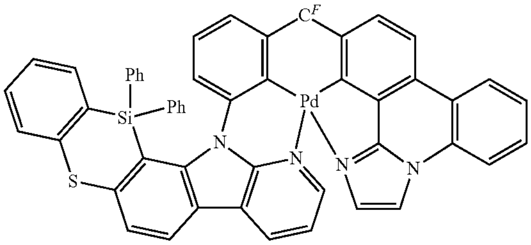
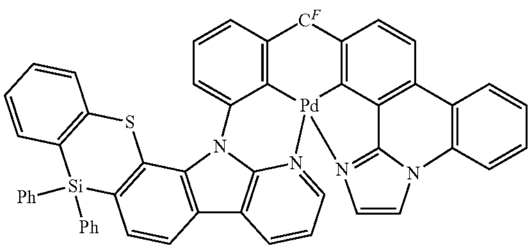
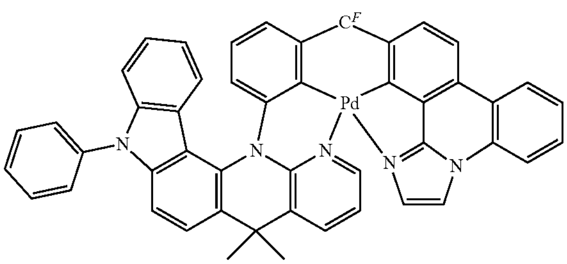
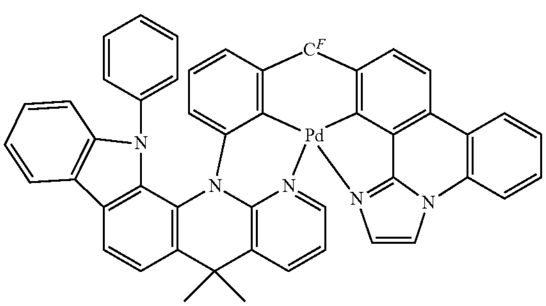
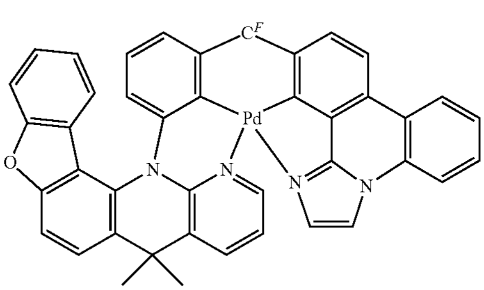
-continued
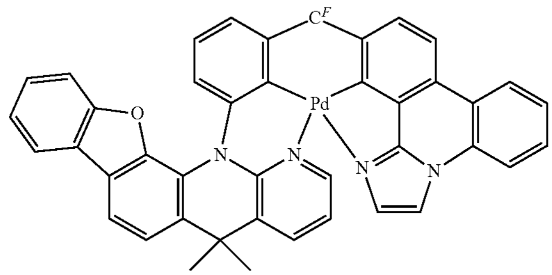
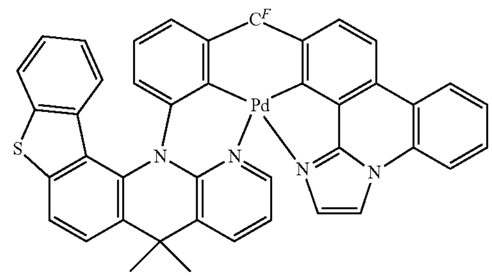
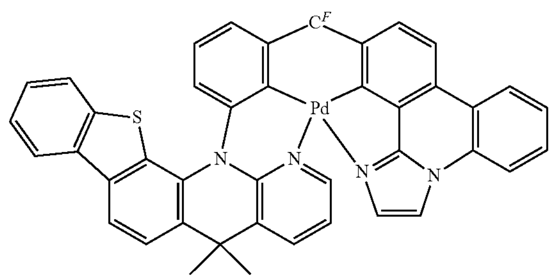
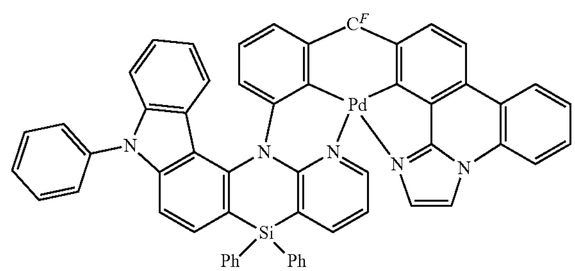
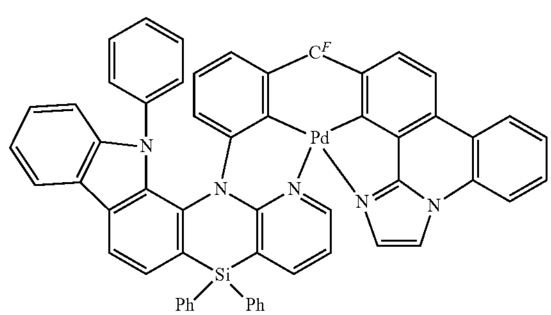
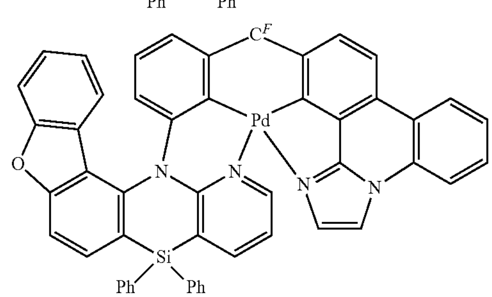

-continued
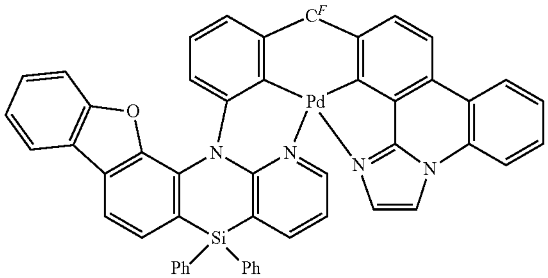
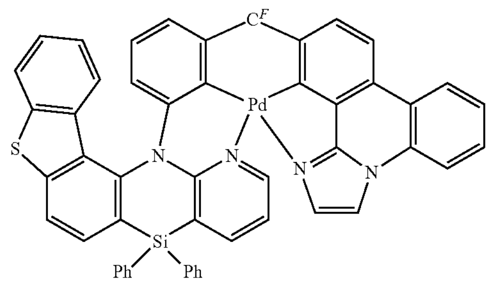
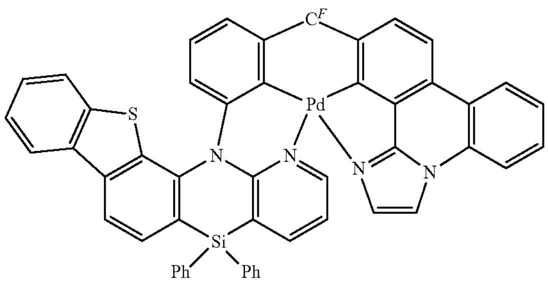
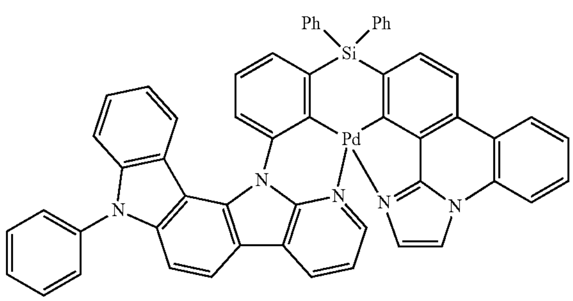
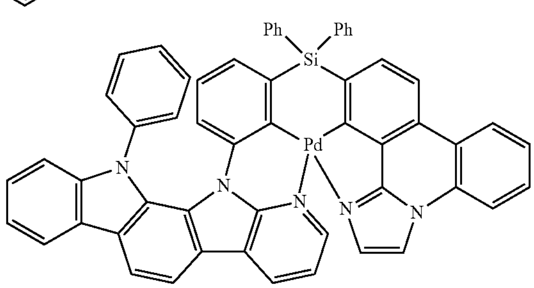
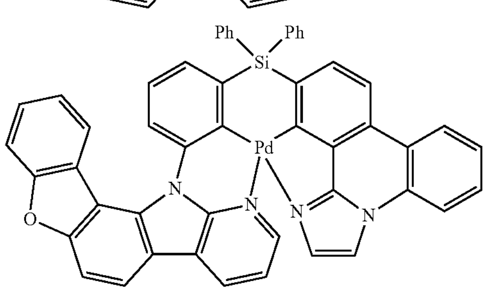
-continued
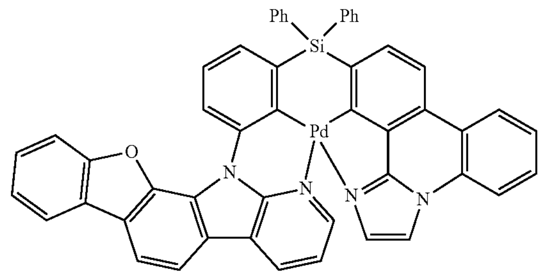
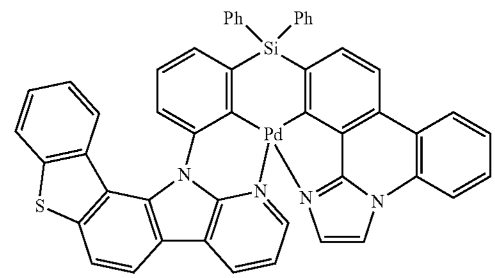
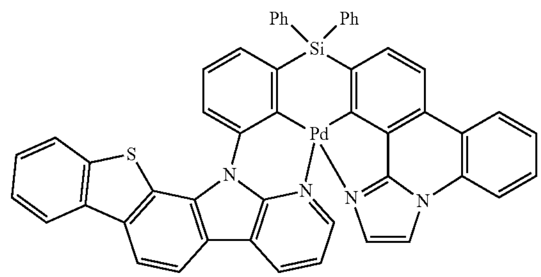
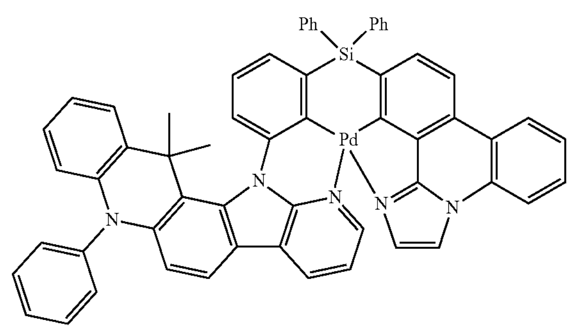
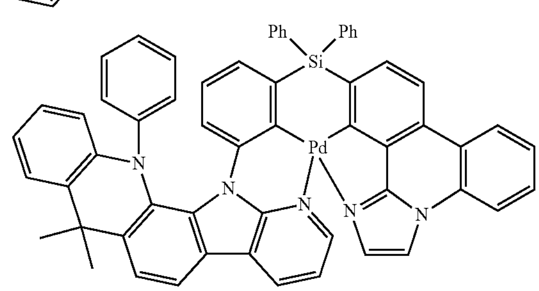
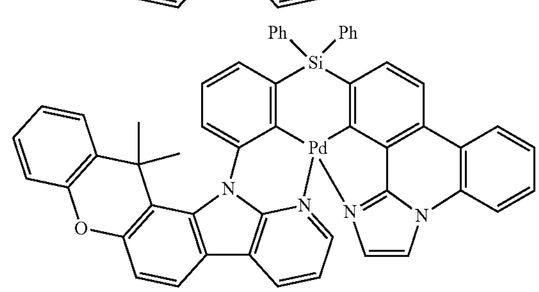

-continued
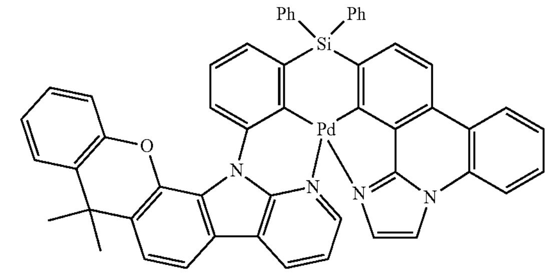
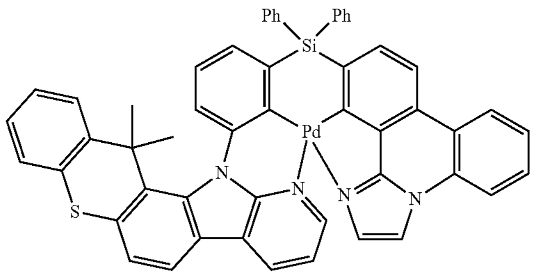
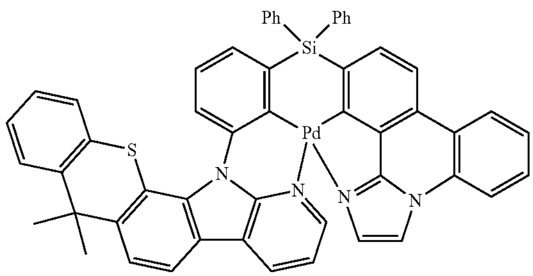
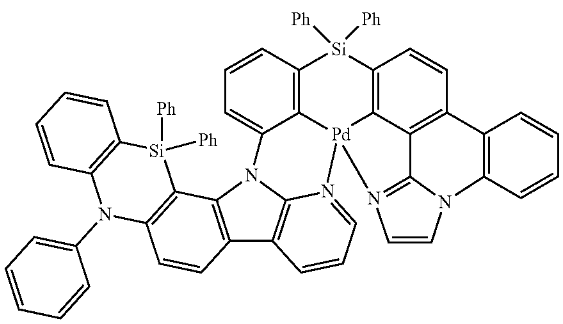
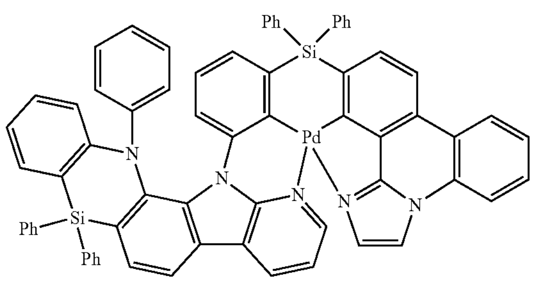
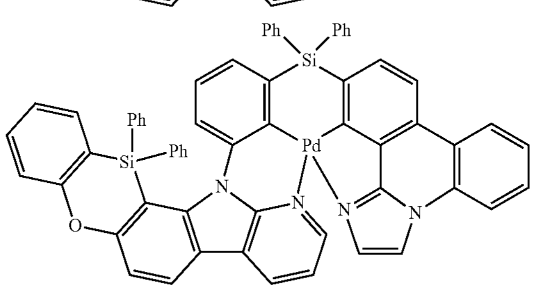
-continued
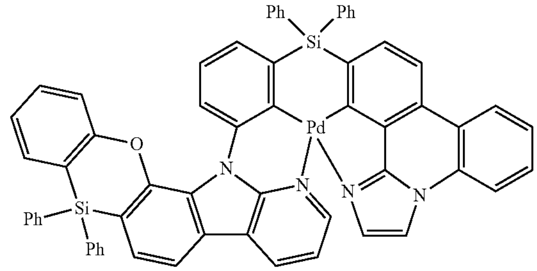
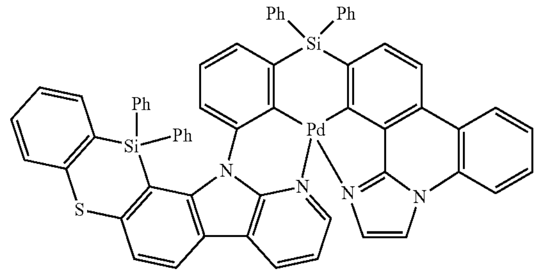
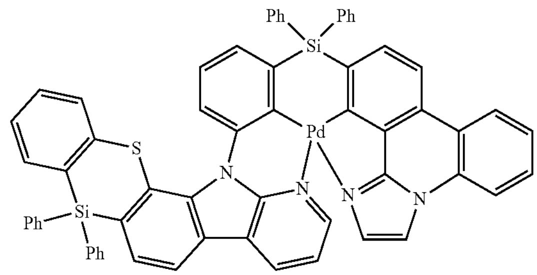
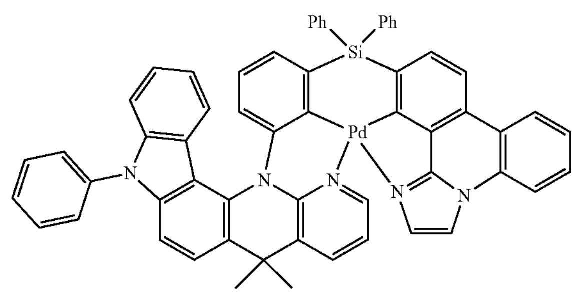
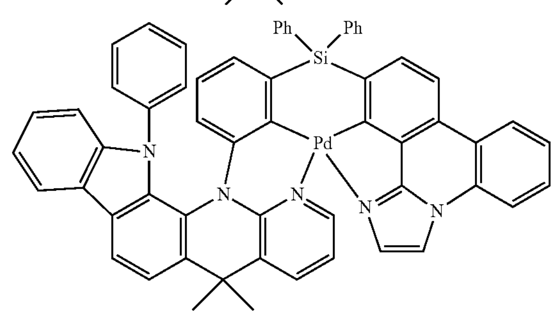
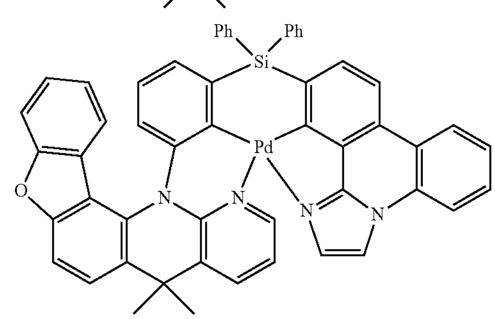

-continued
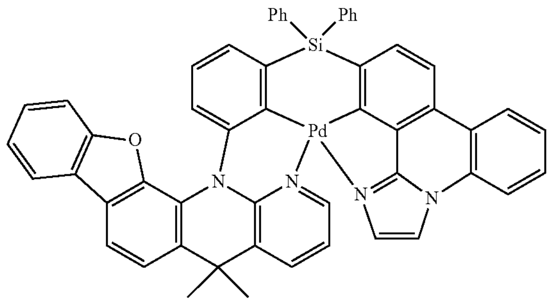
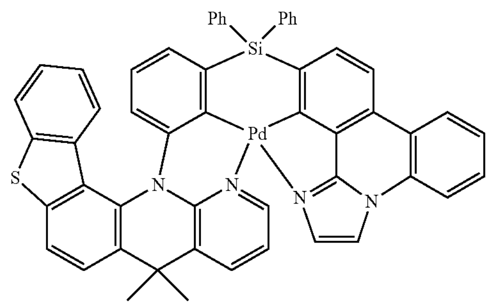
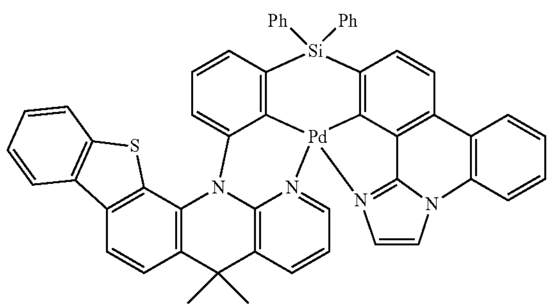
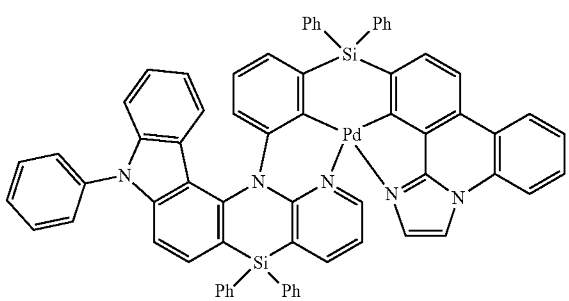
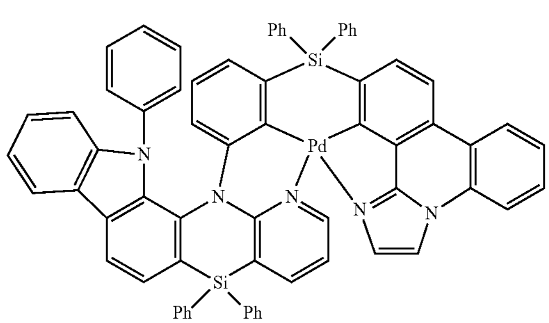
-continued
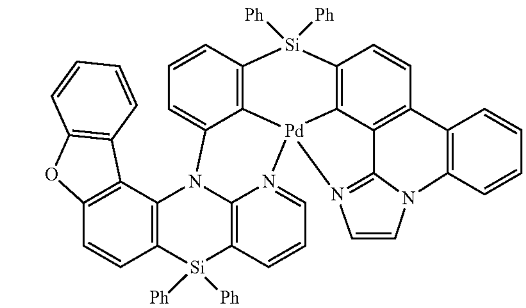
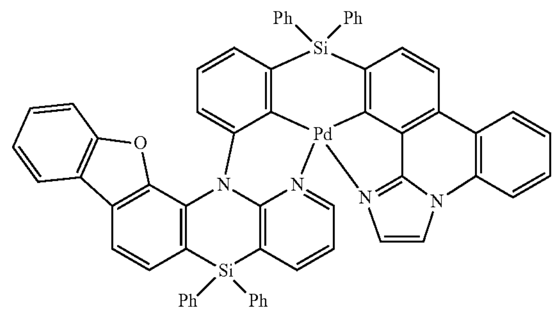
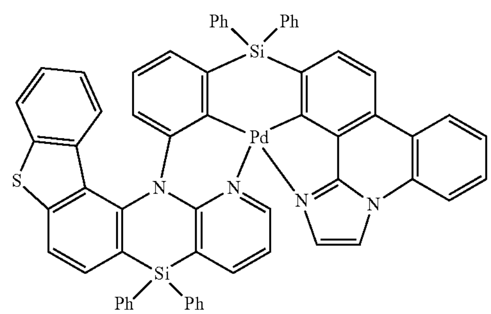
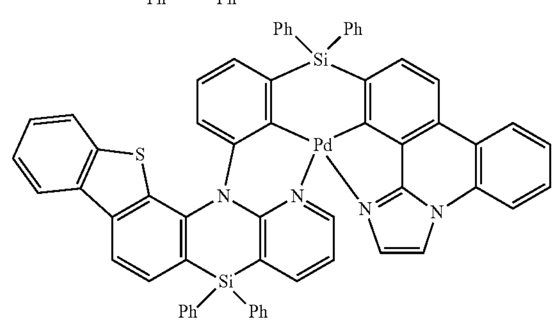
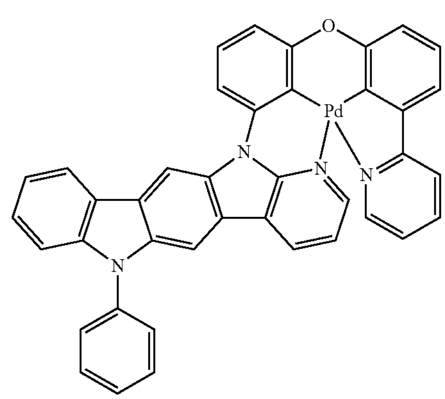

-continued
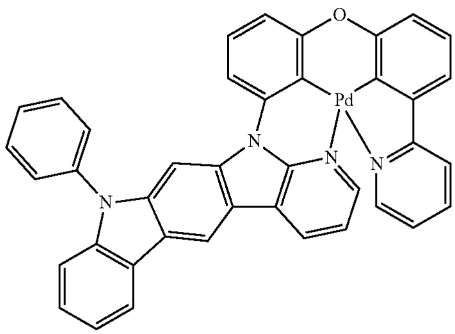
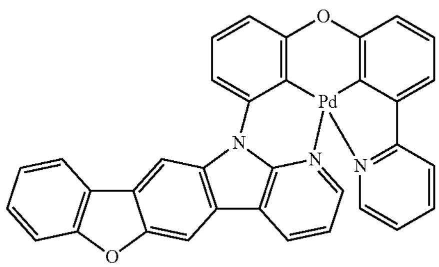
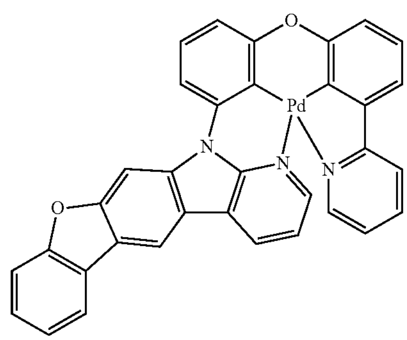
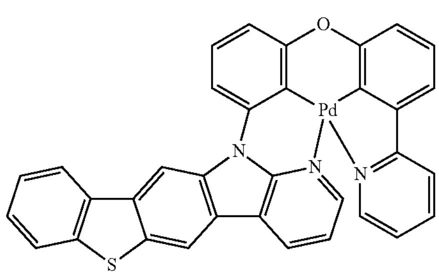
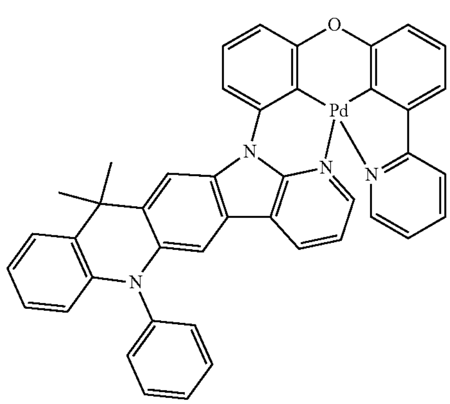
-continued
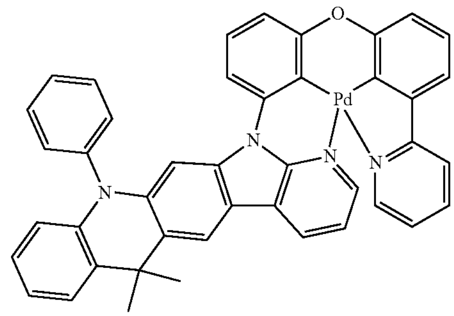
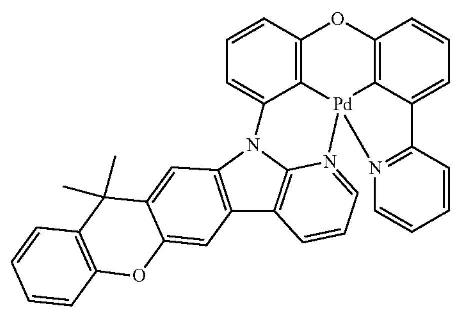
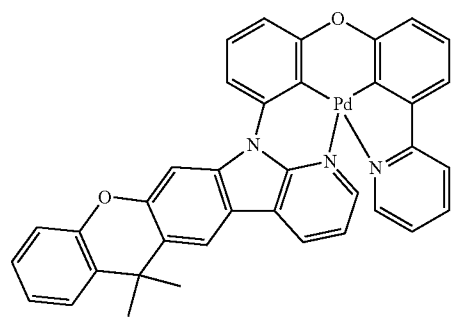
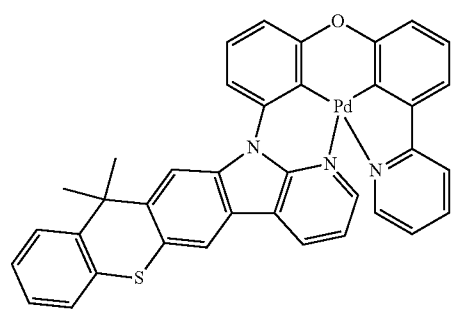
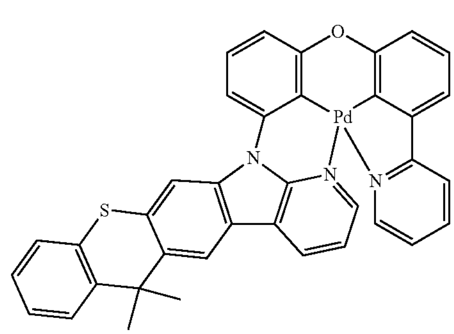

-continued
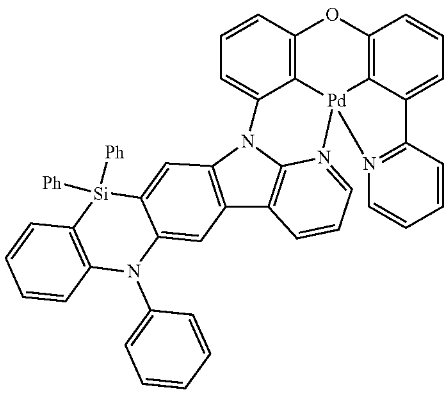
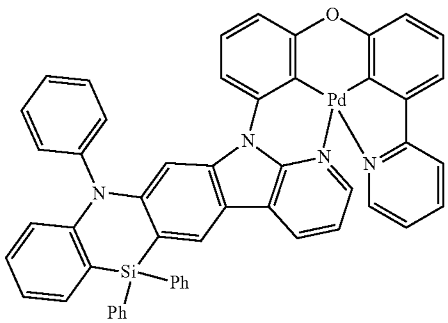
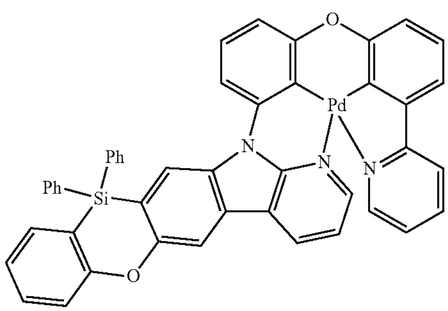
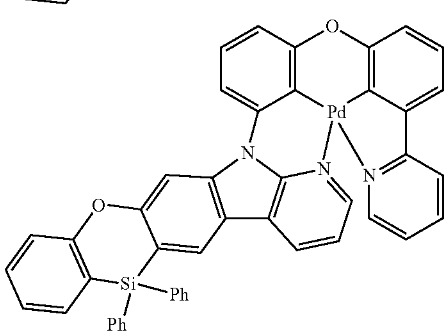
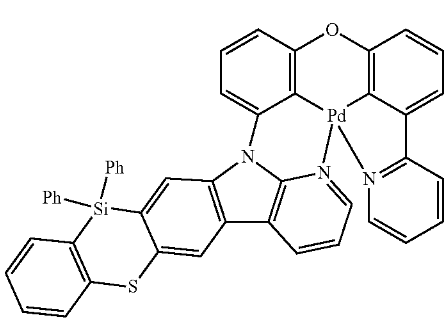
-continued
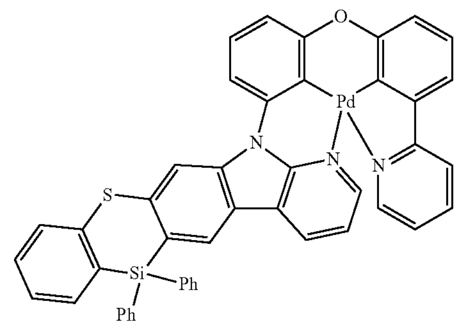
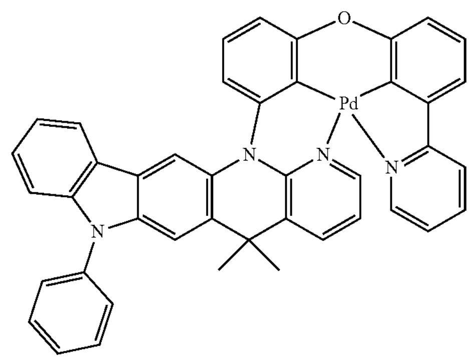
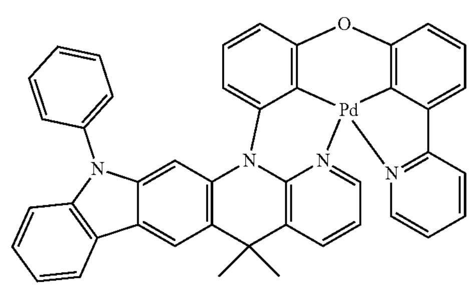
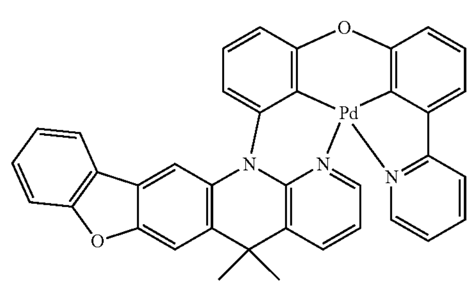
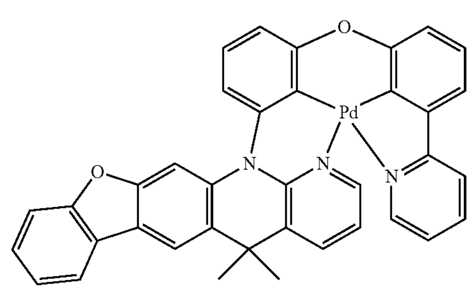

-continued
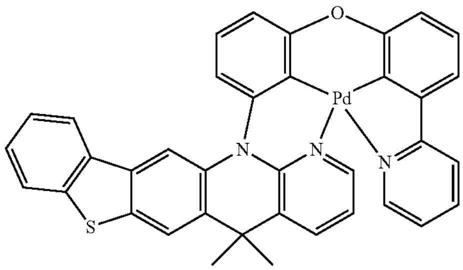
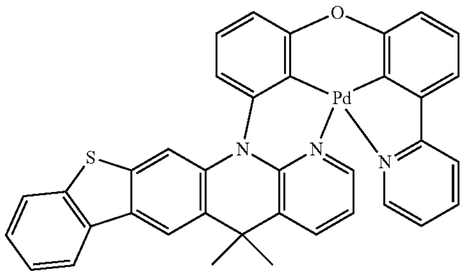
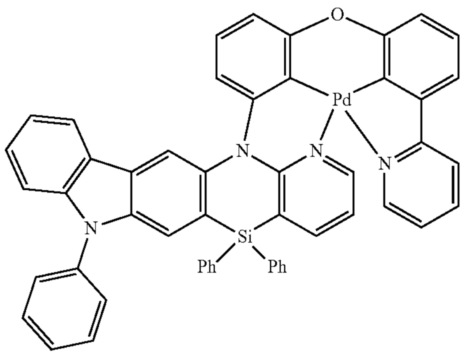
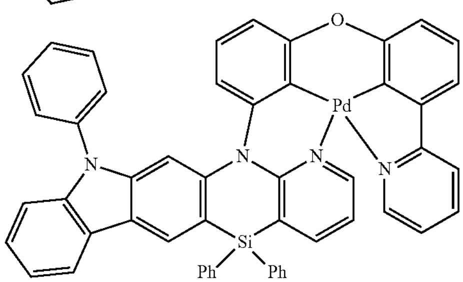
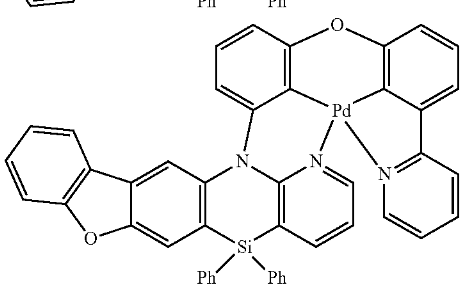
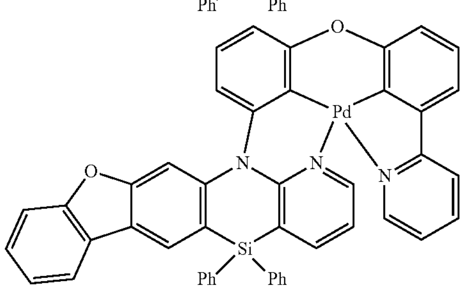
-continued
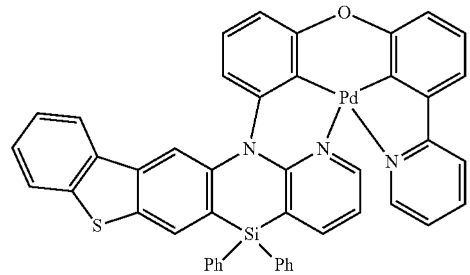
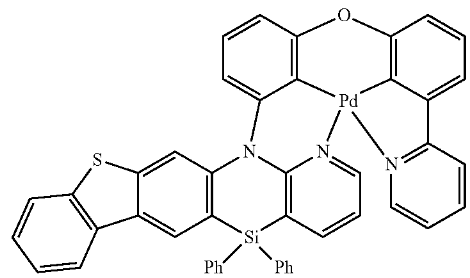
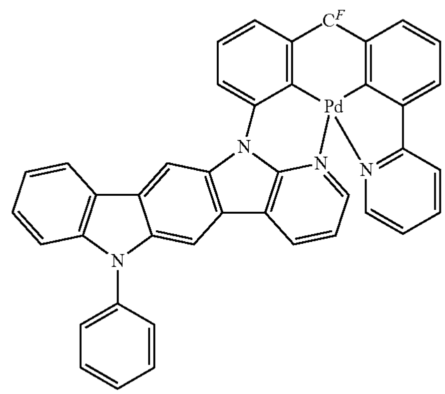
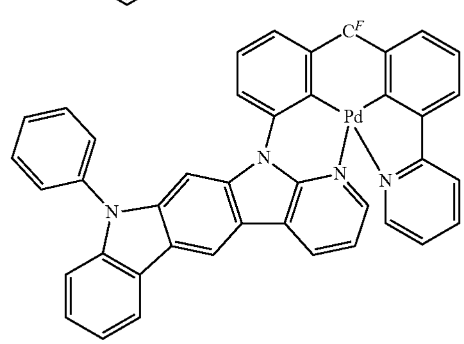
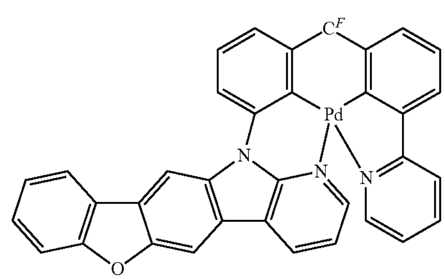

-continued
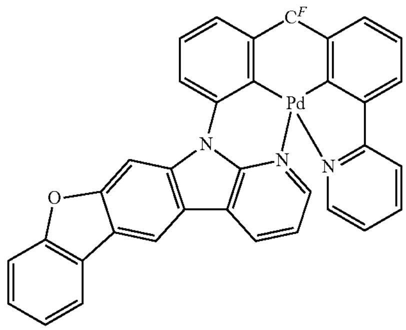
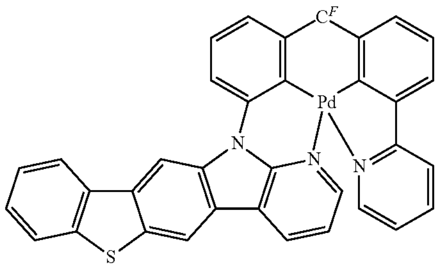
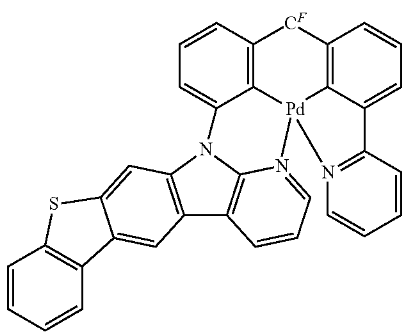
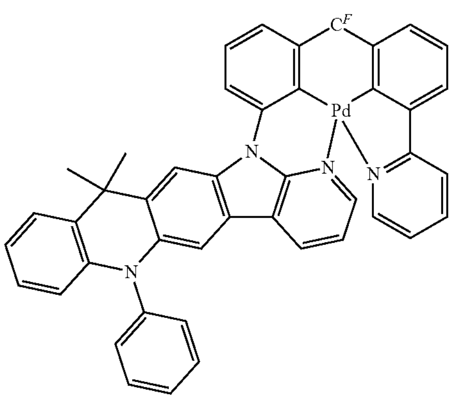
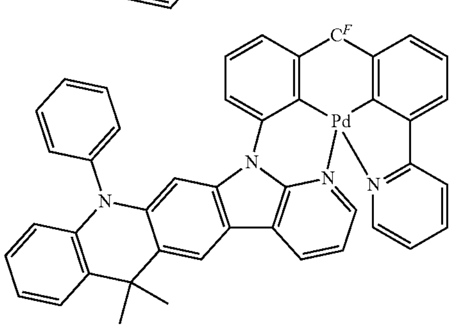
-continued
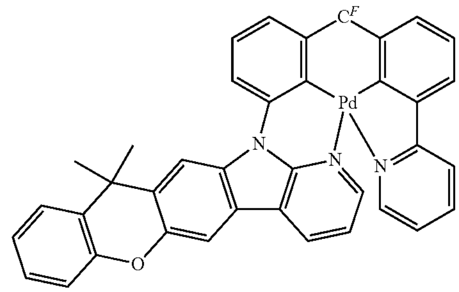
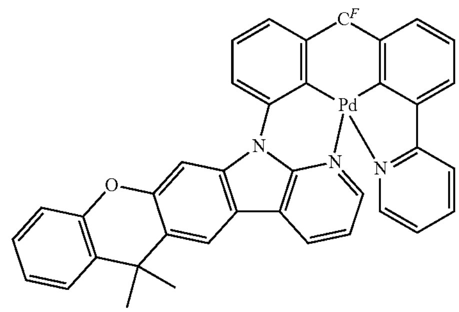
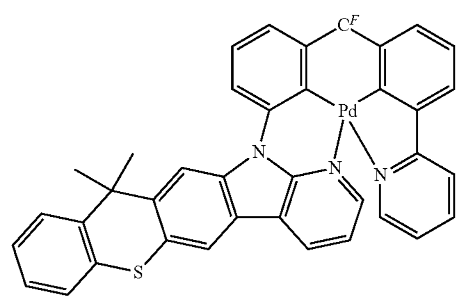
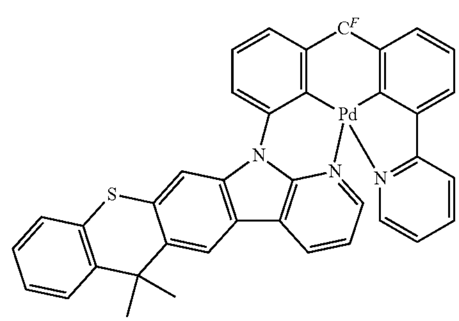
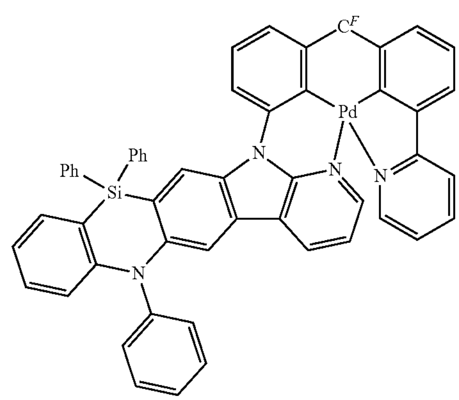

-continued
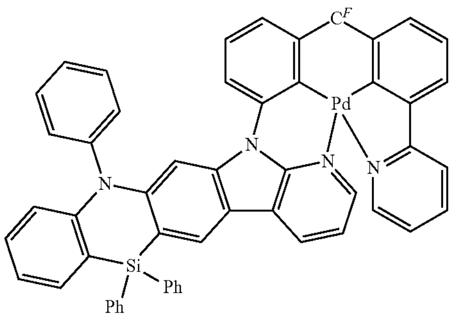
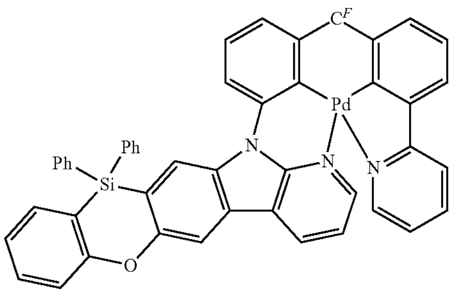
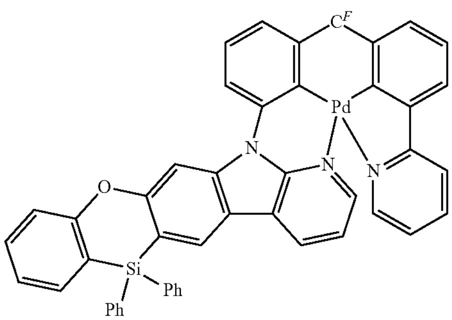
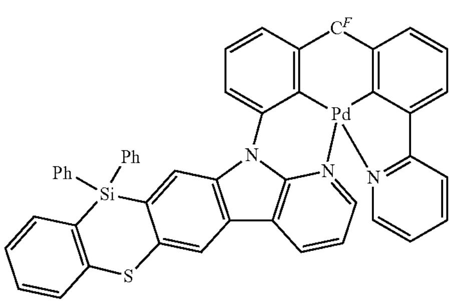
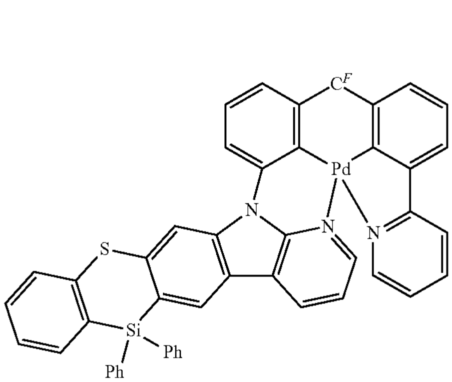
-continued
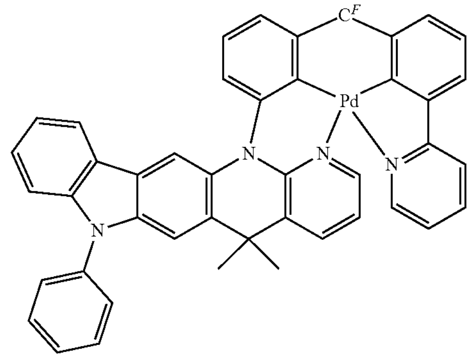
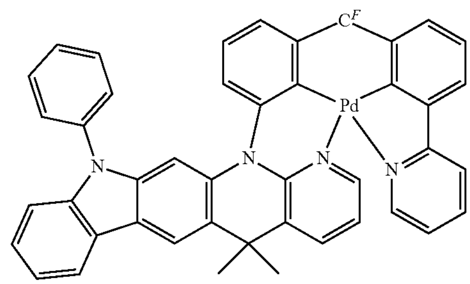
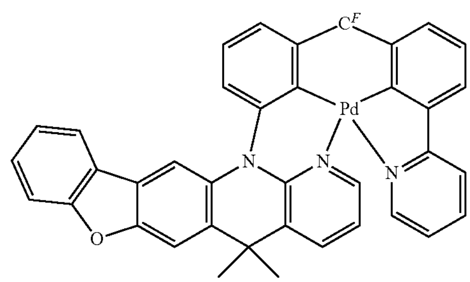
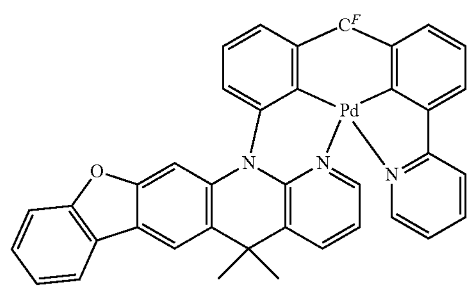
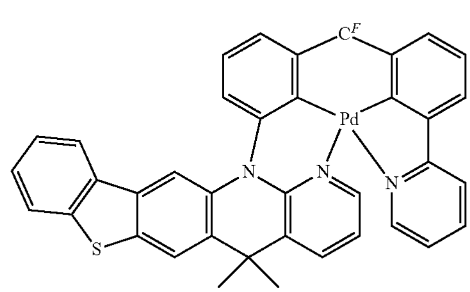

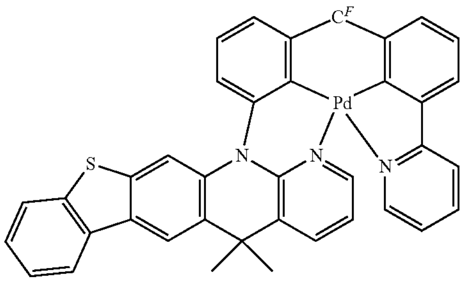
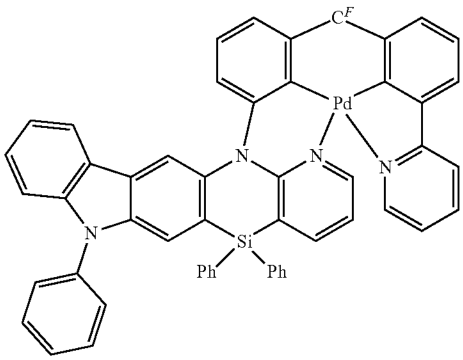
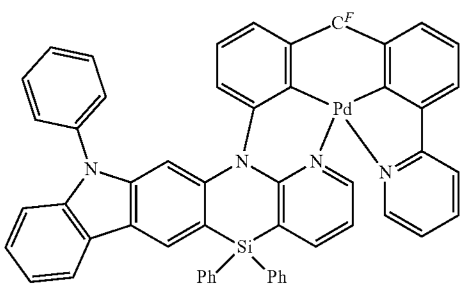
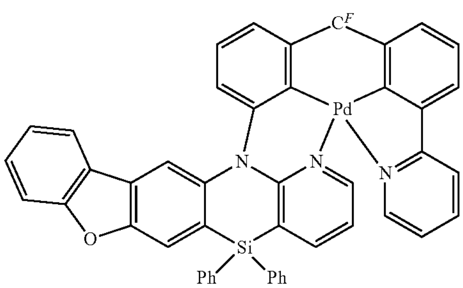
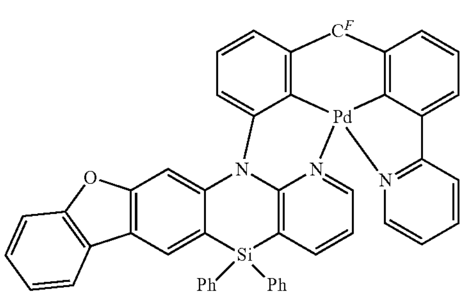
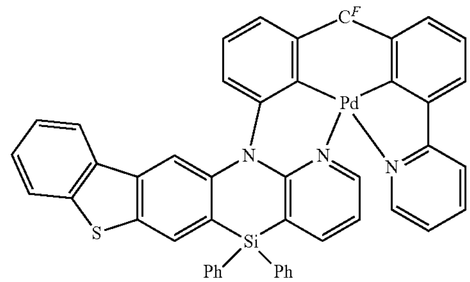
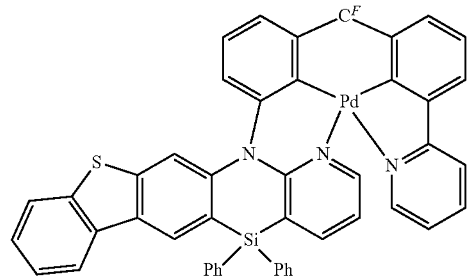
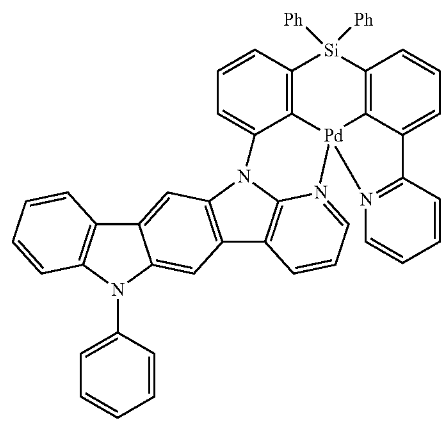
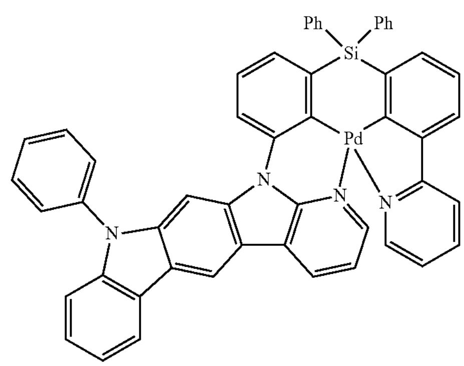
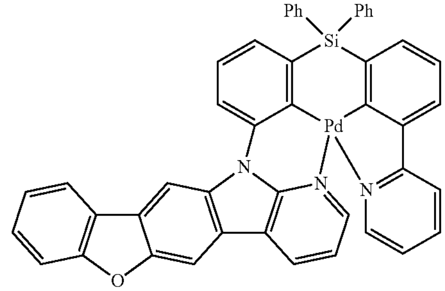

-continued
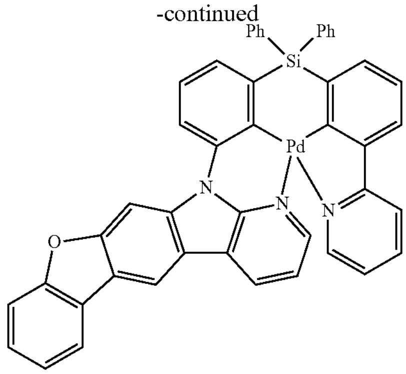
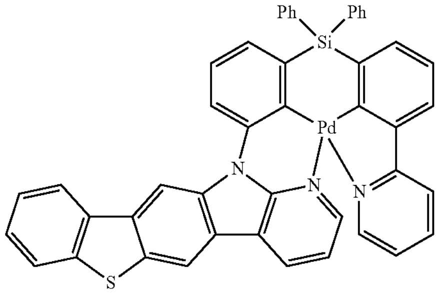
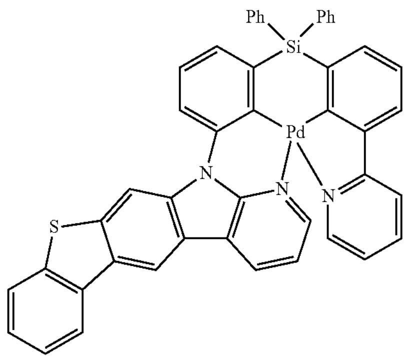
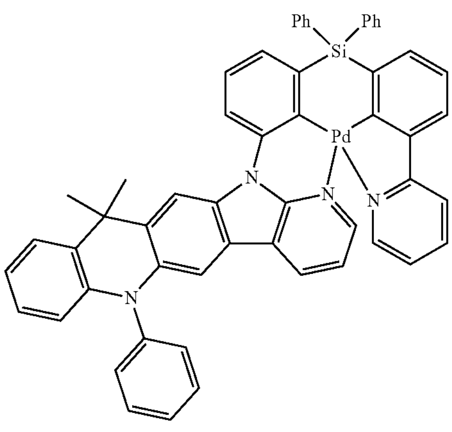
-continued
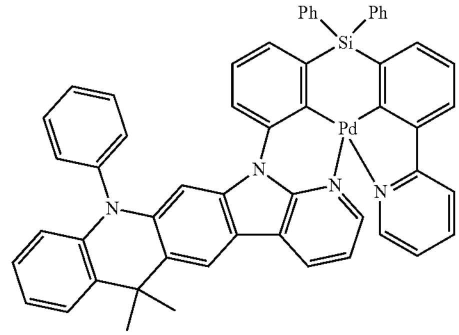
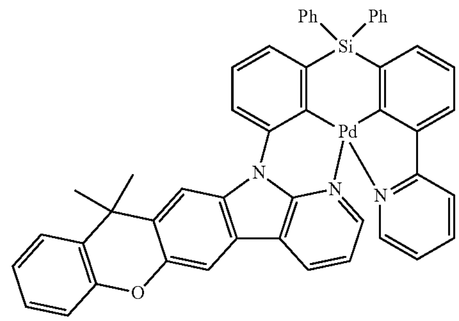
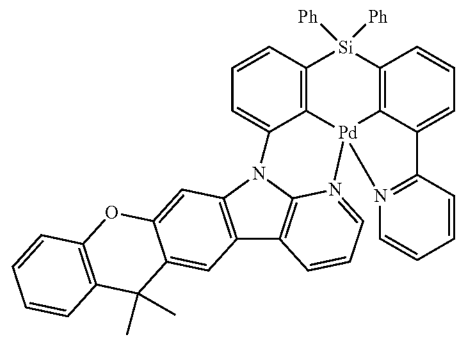
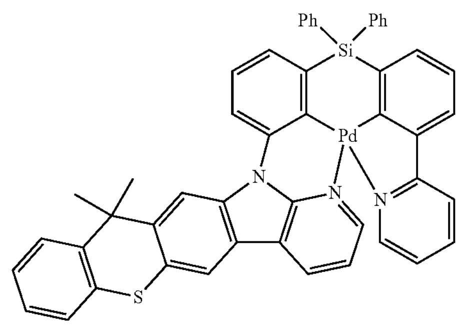
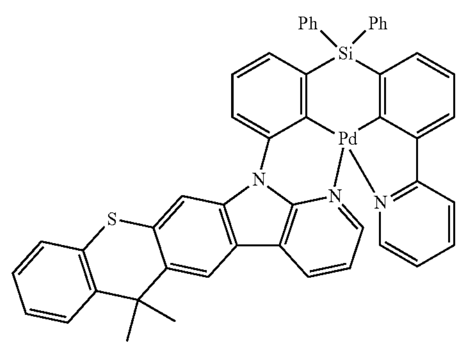

-continued
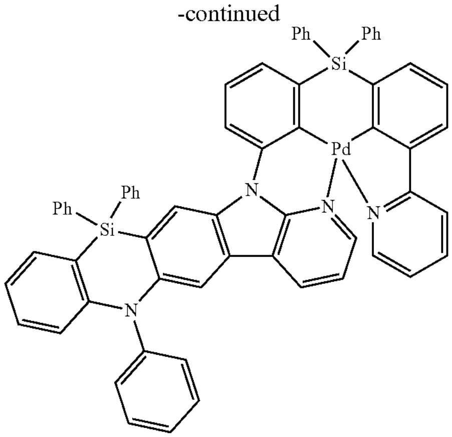
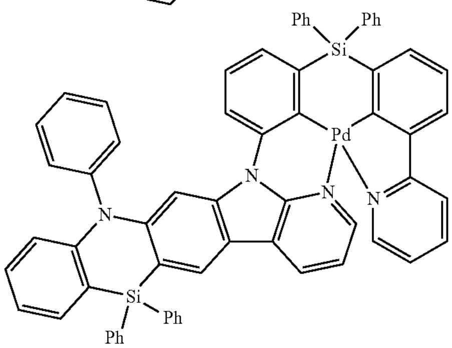
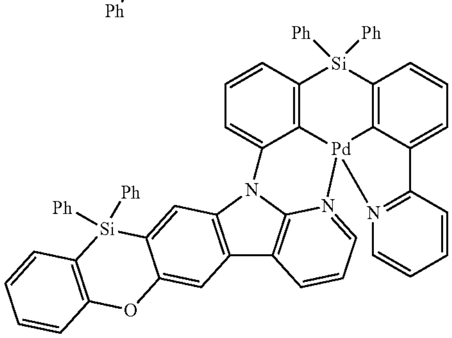
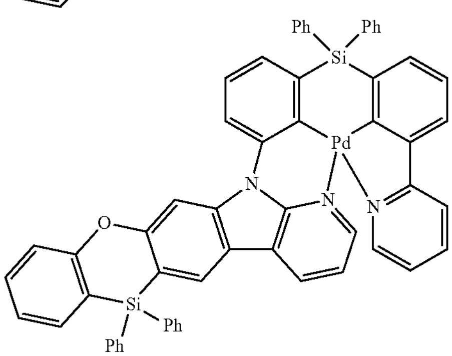
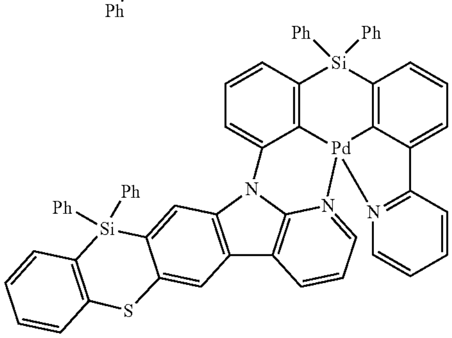
-continued
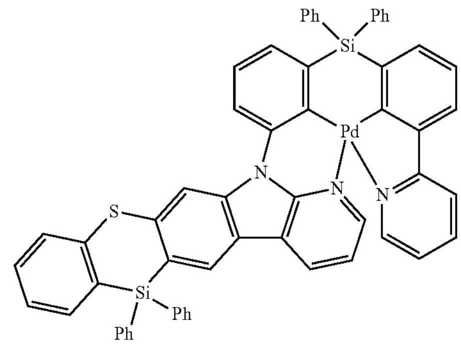
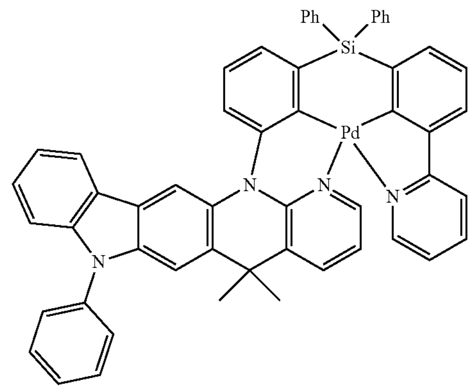
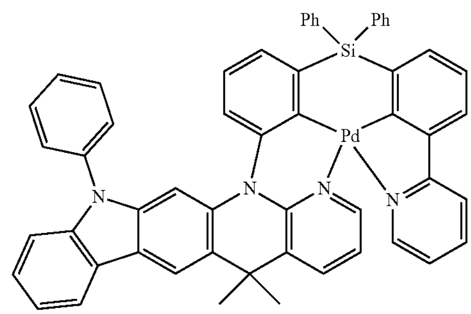
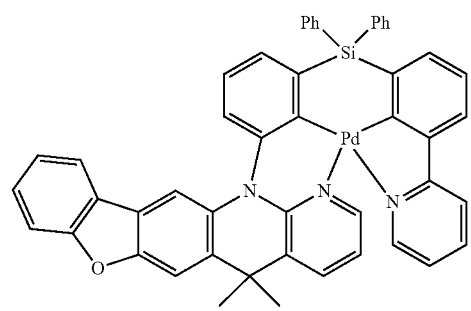
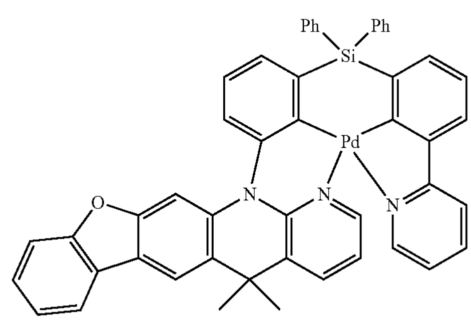

-continued
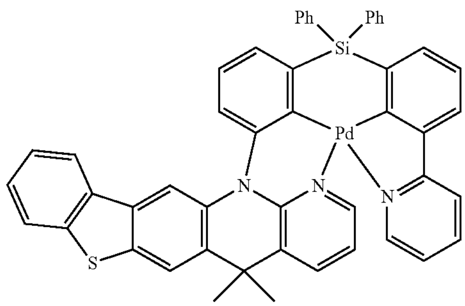
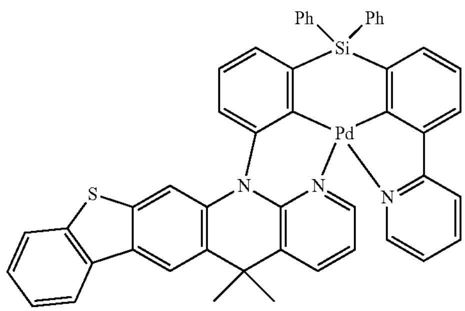
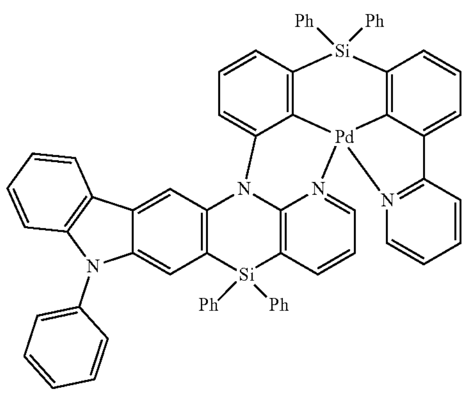
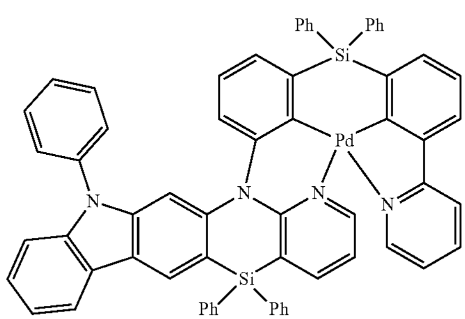
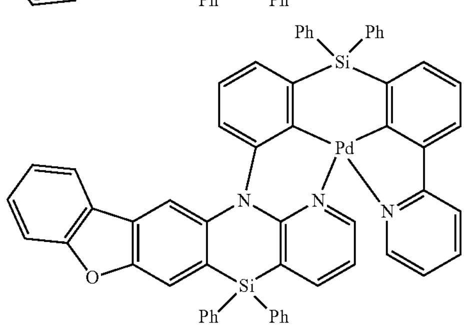
-continued
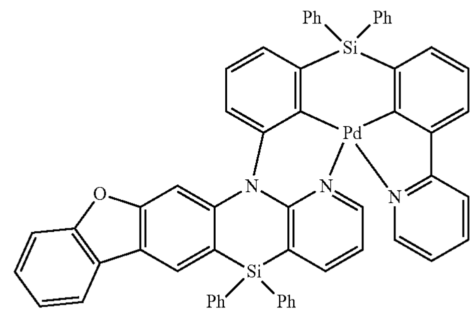
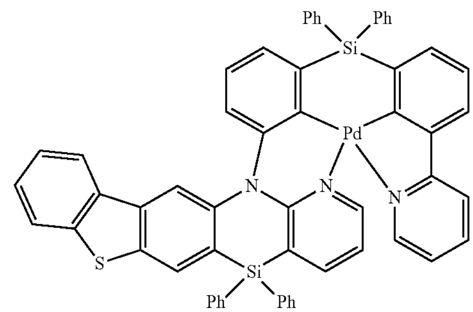
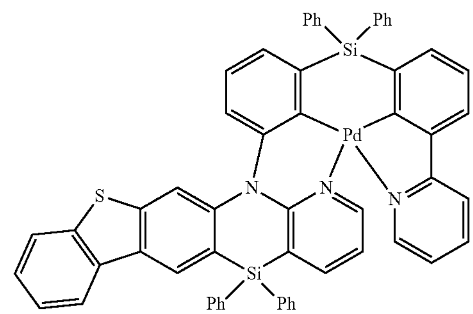
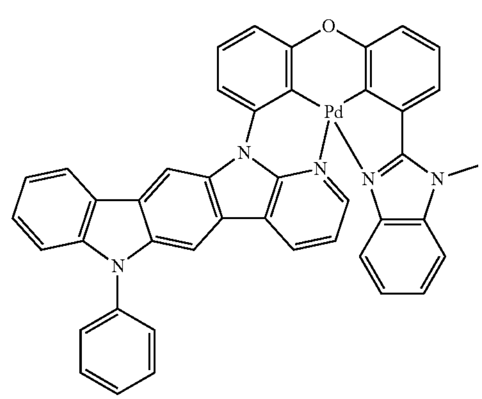
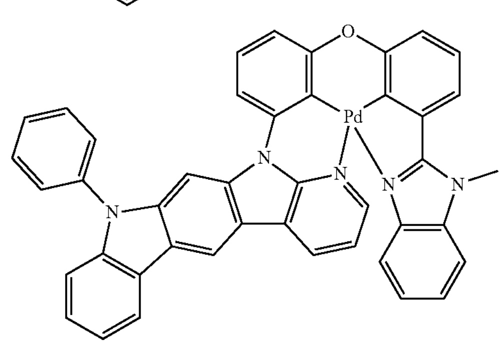

-continued
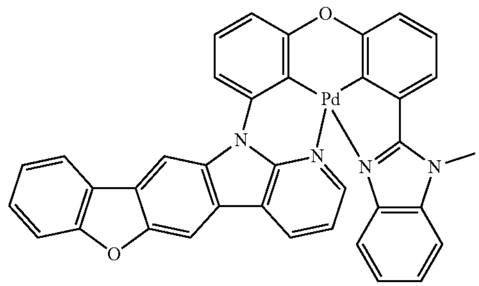
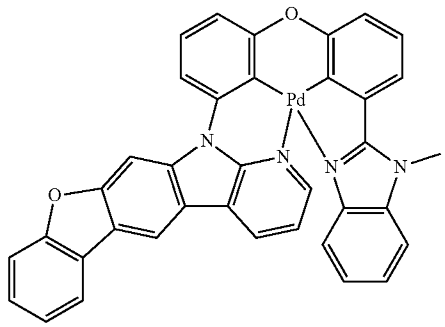
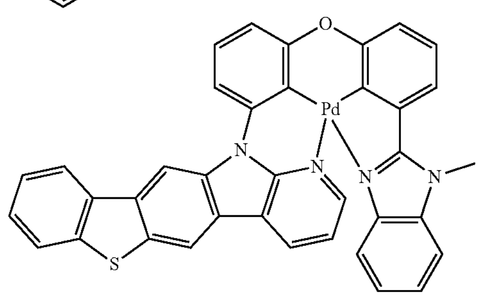
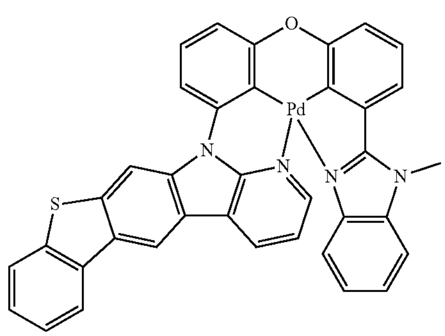
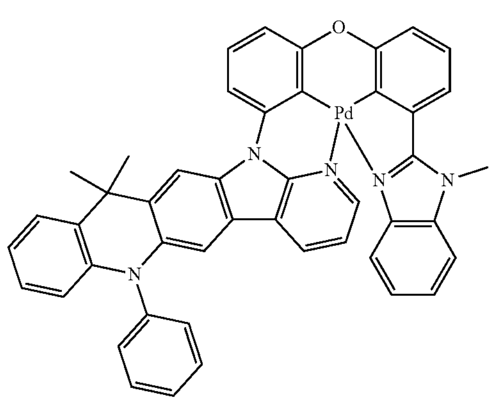
-continued
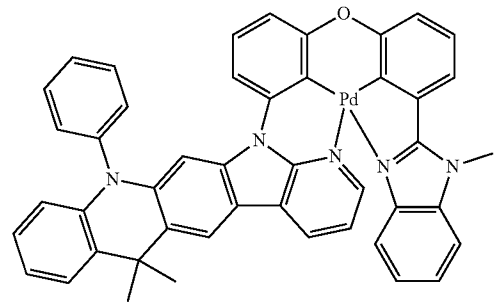
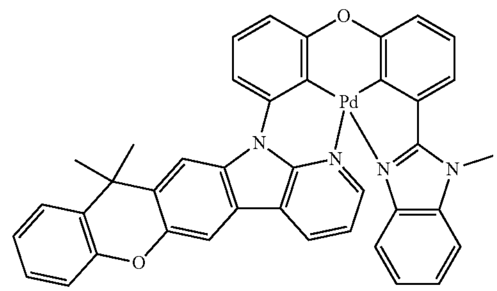
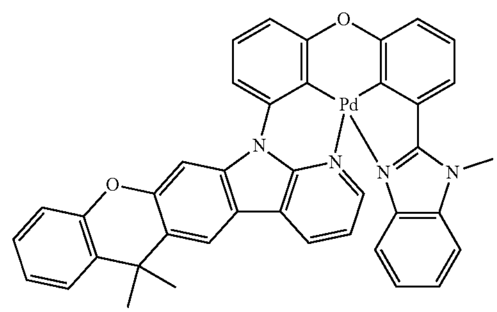
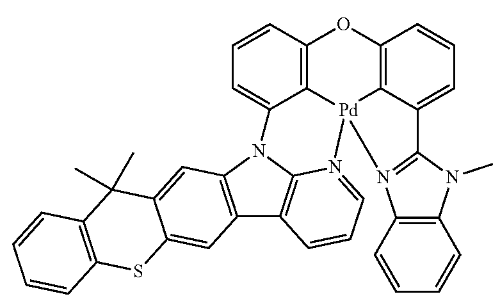
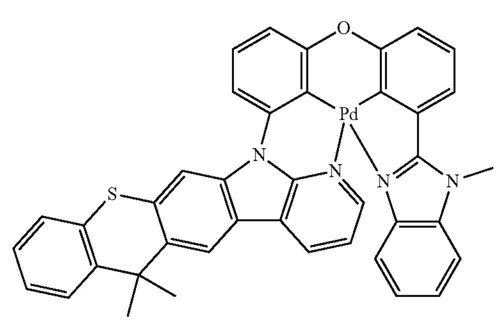

-continued
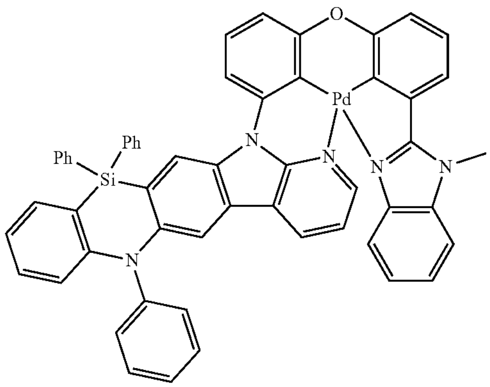
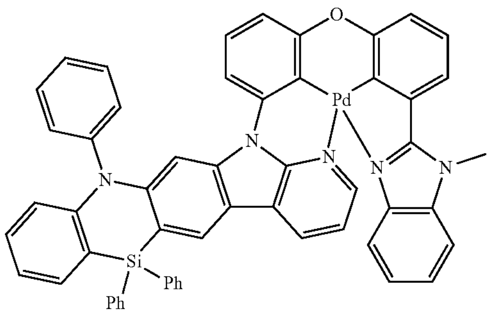
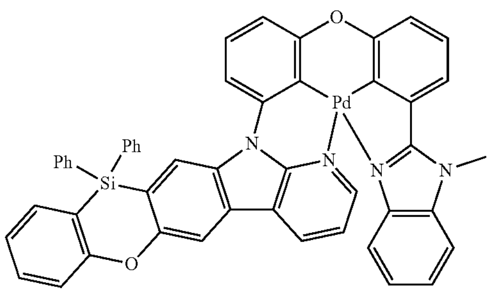
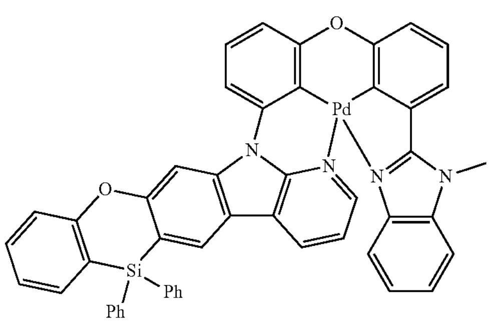
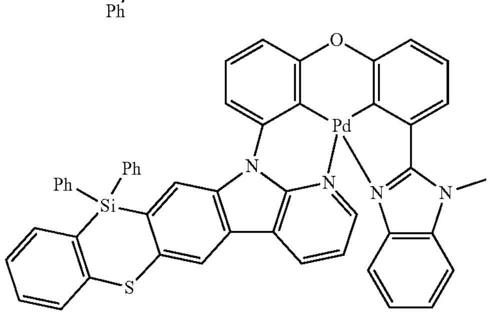
-continued
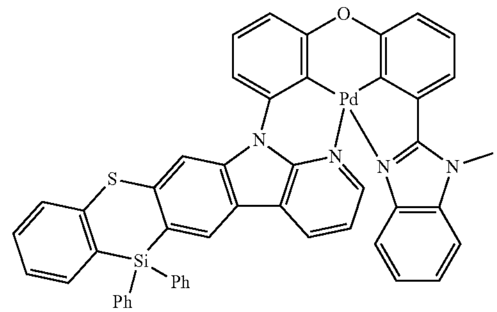
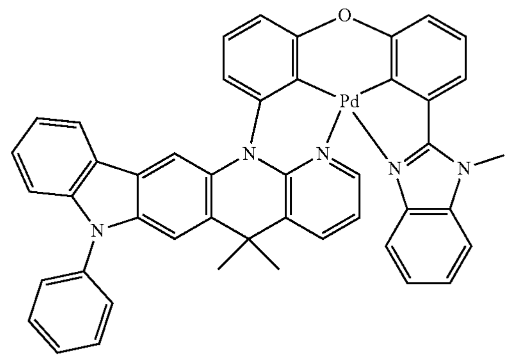
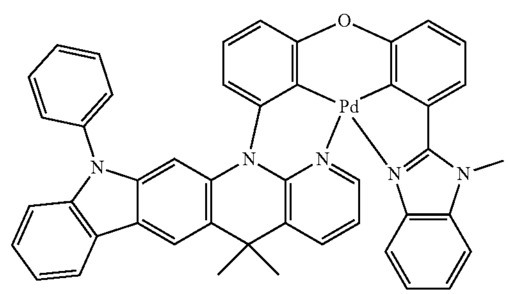
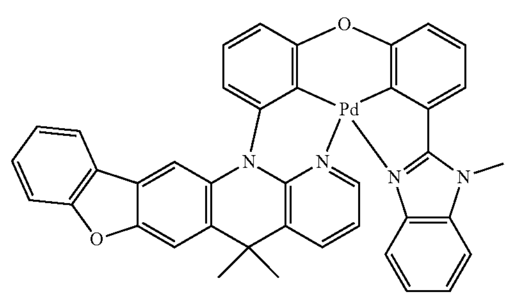
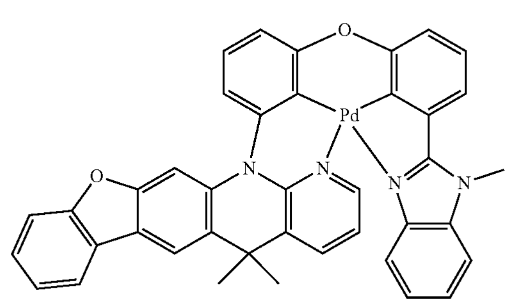

-continued
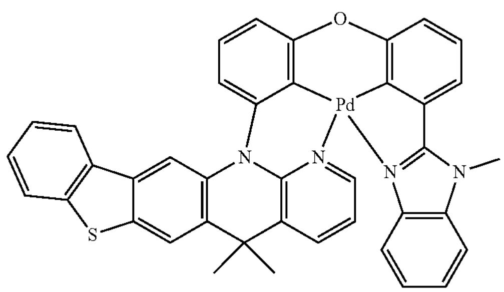
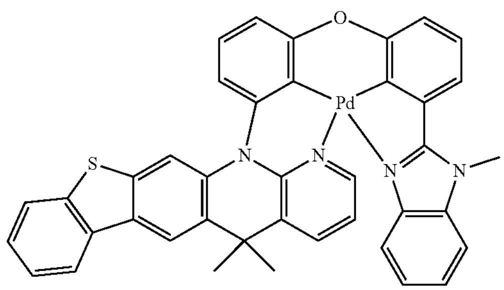
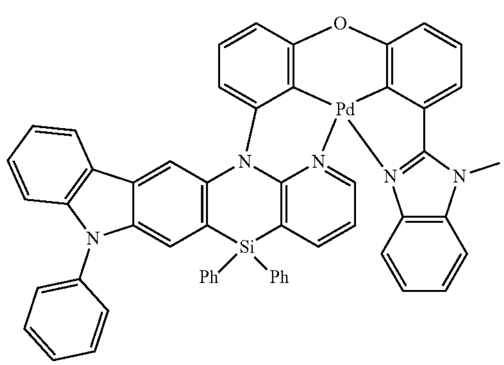
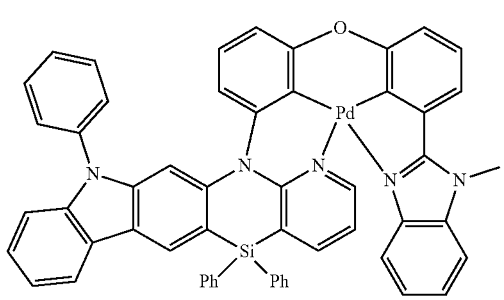
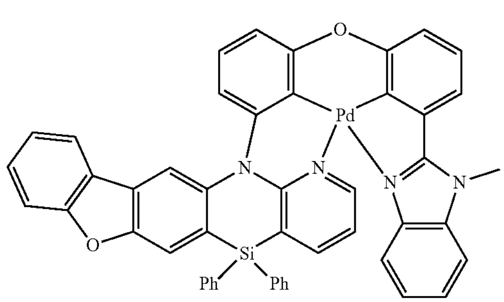
-continued
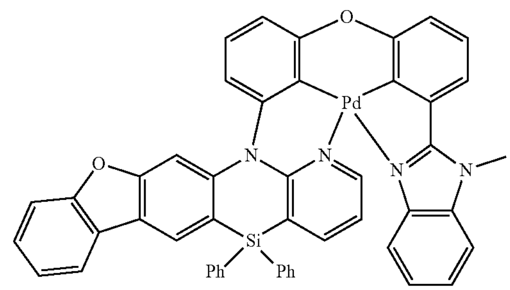
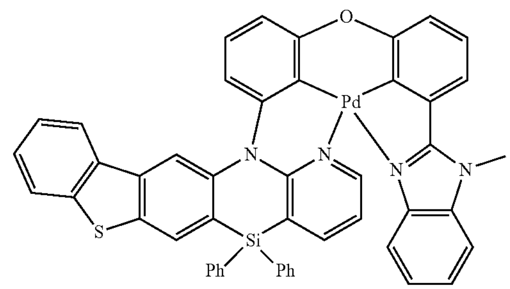
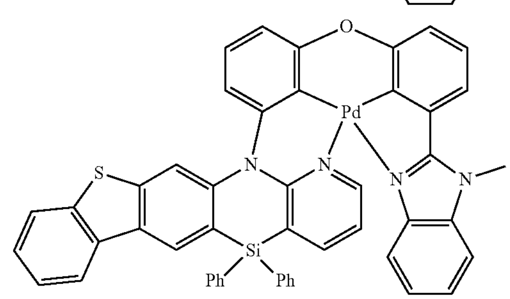
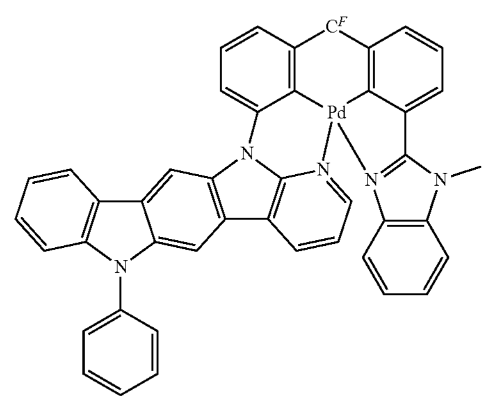
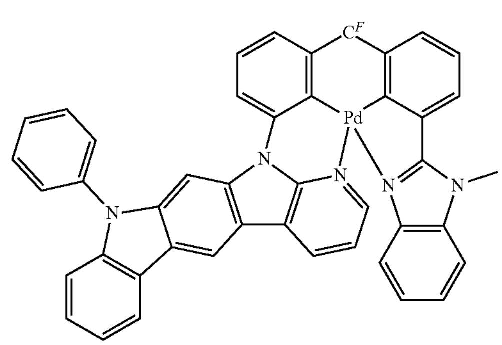

-continued
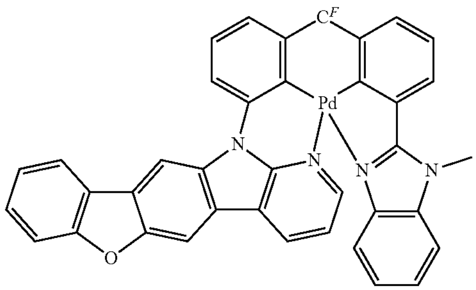
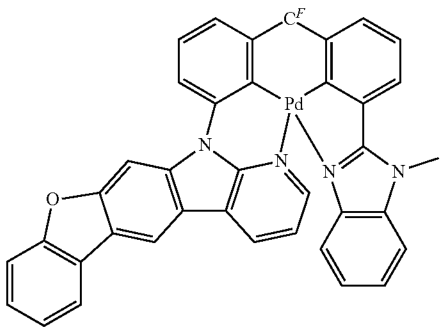
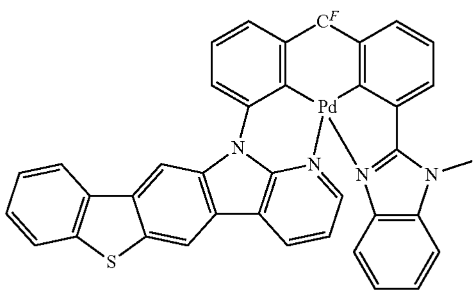
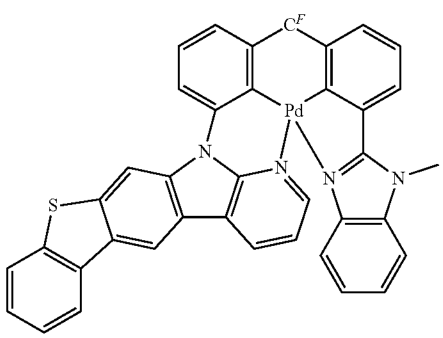
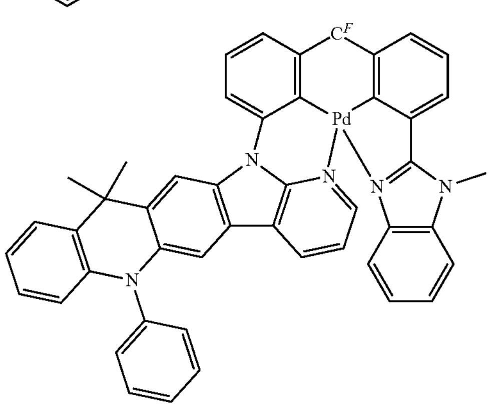
-continued
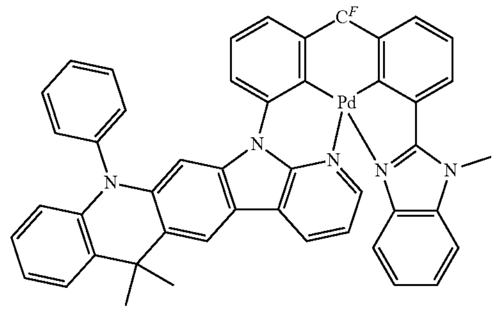
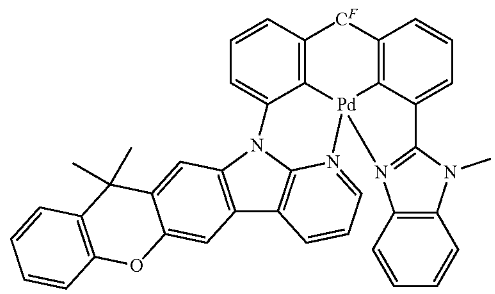
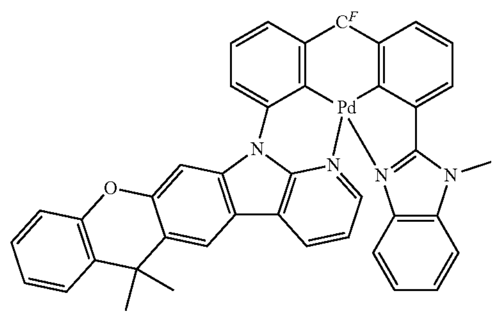
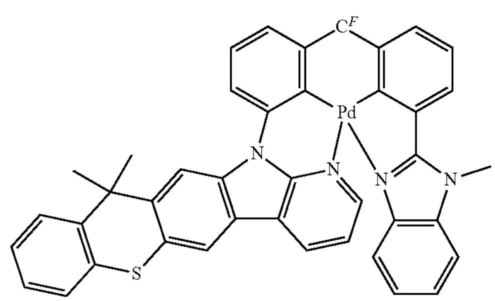
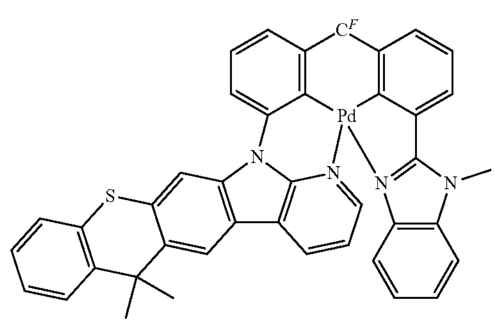

-continued
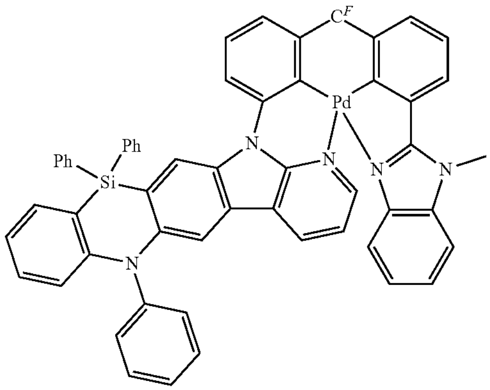
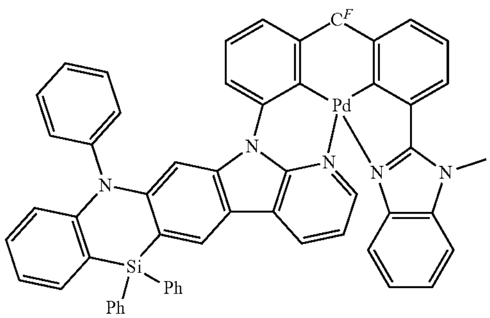
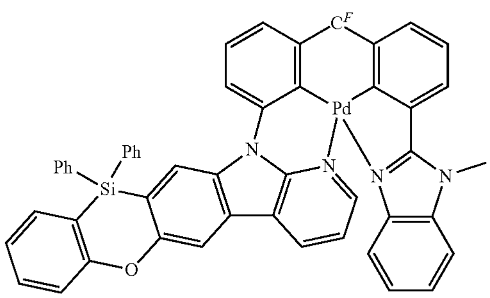
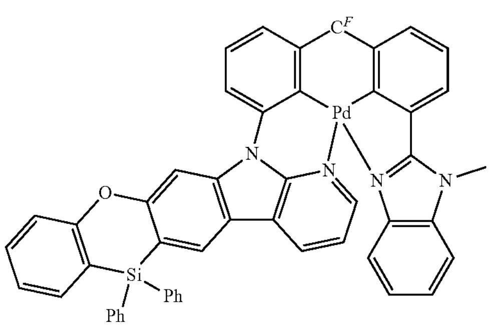
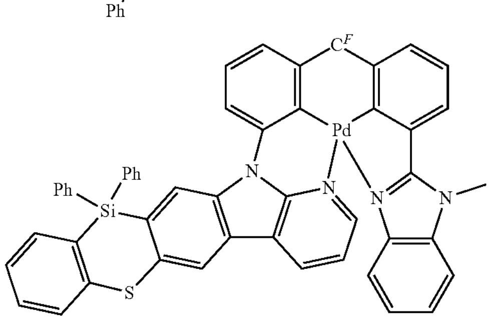
-continued
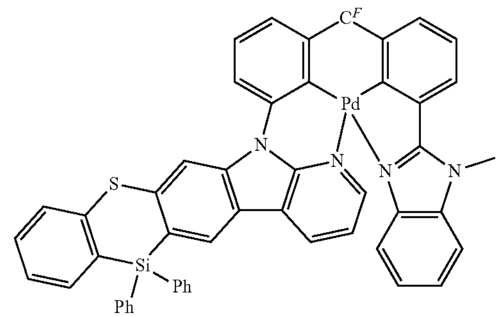
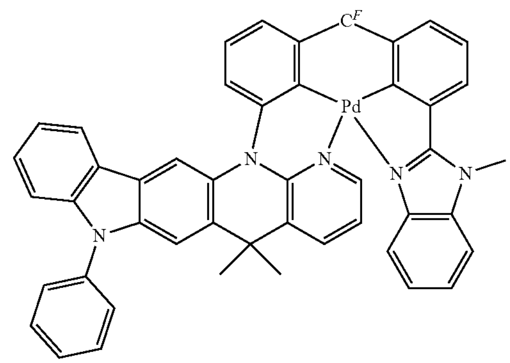
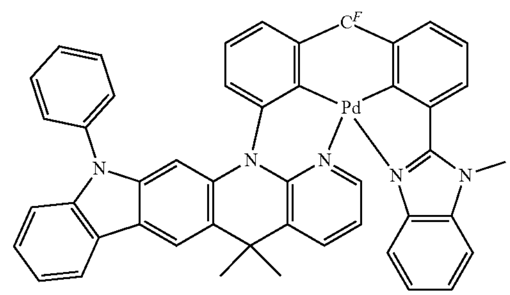
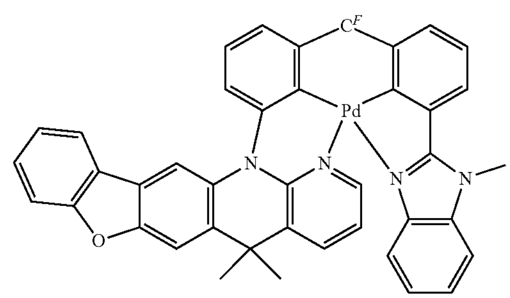
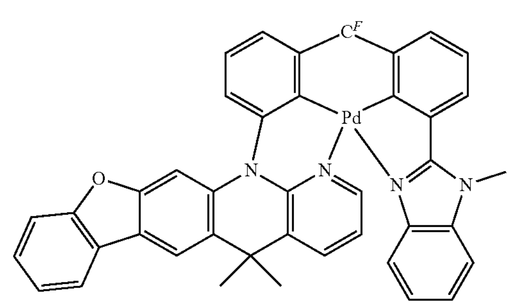

-continued
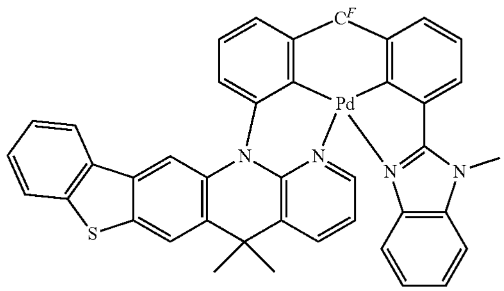
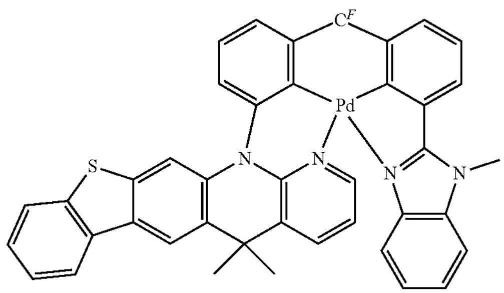
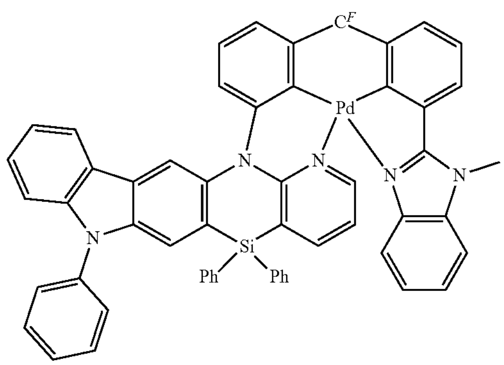
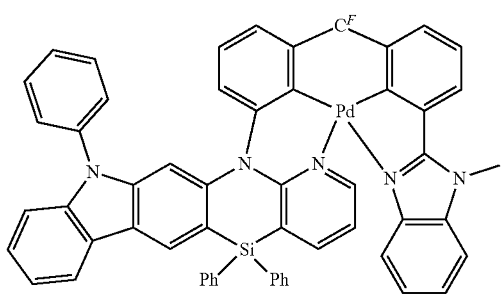
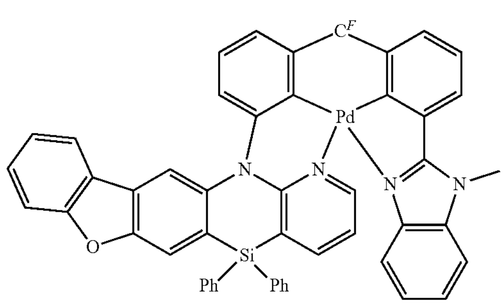
-continued
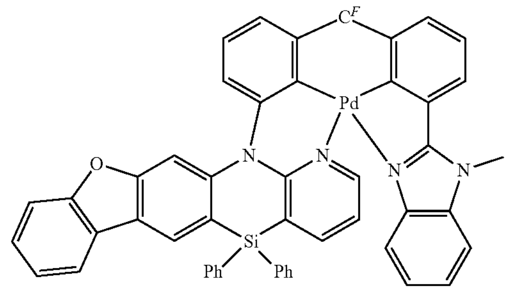
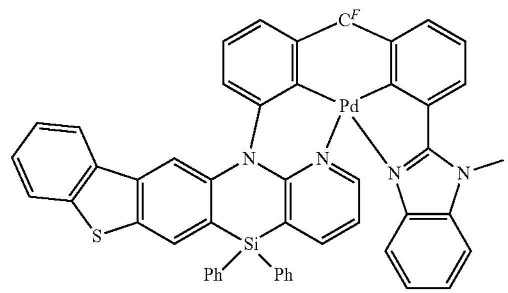
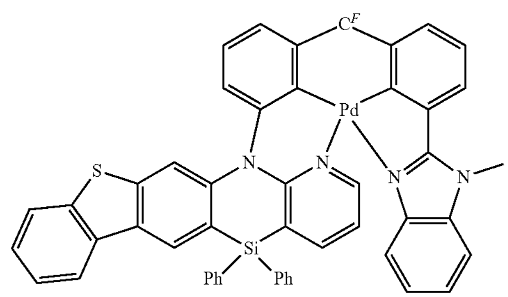
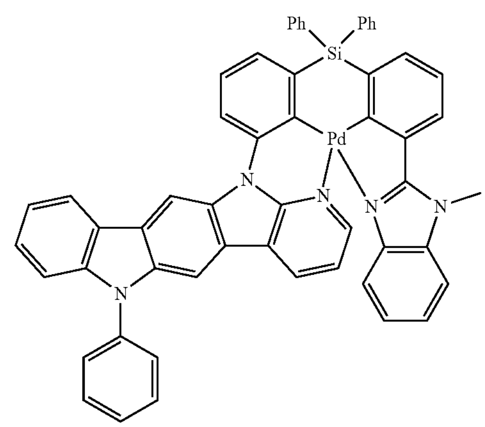
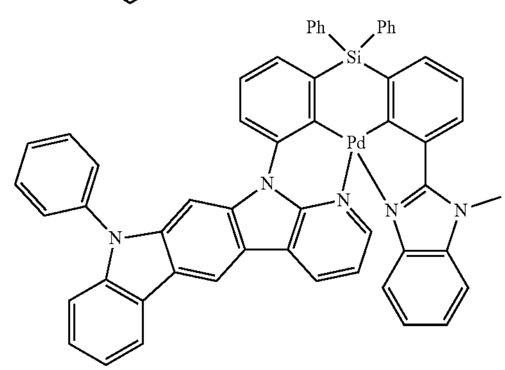

-continued
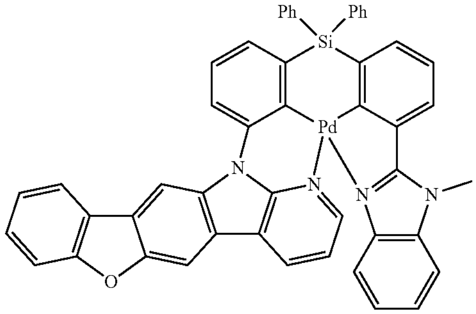
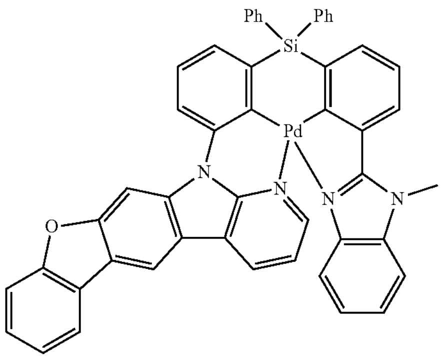
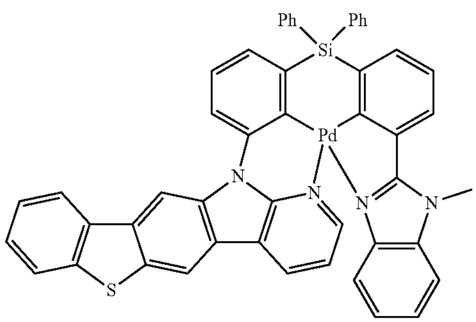
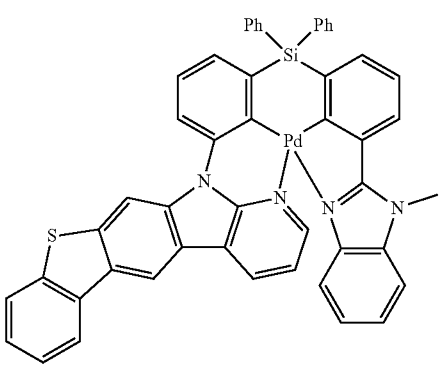
-continued
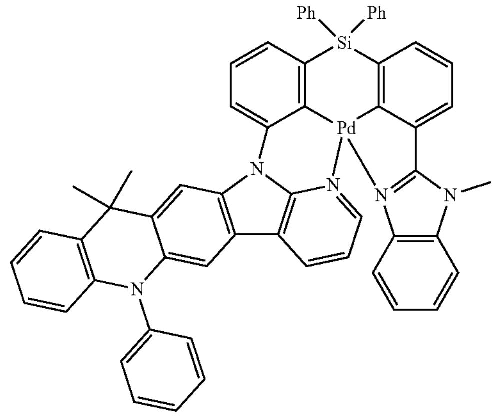
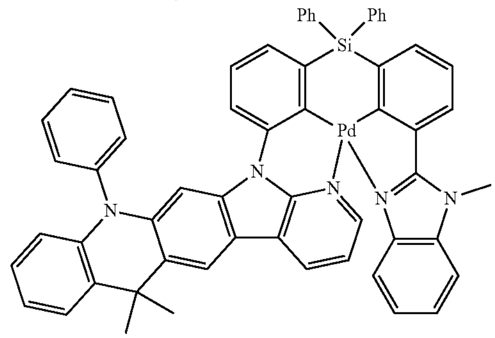
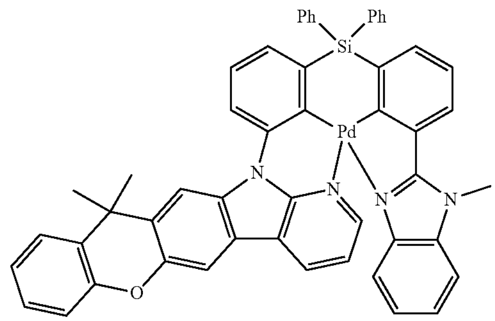
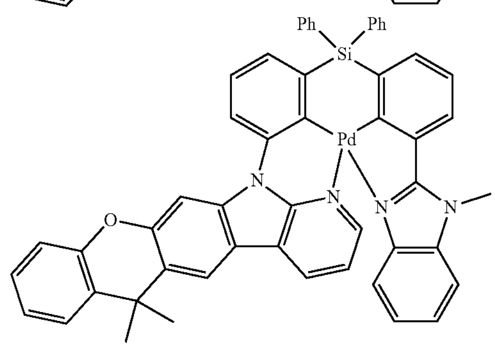
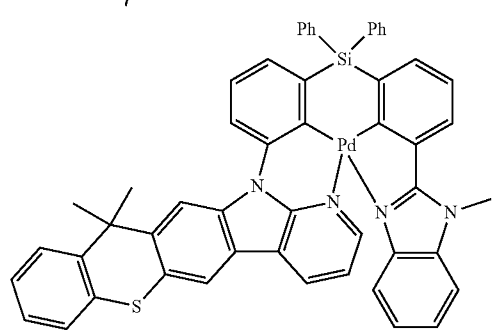

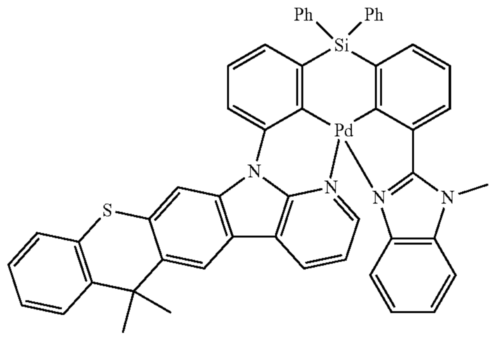
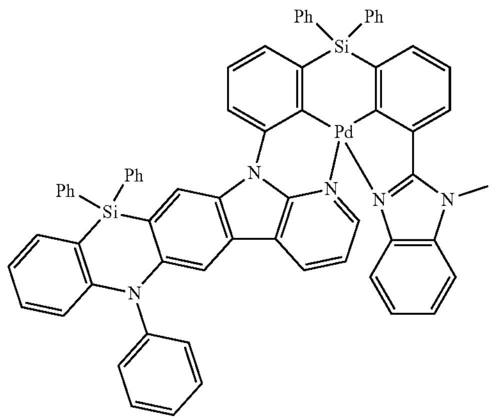
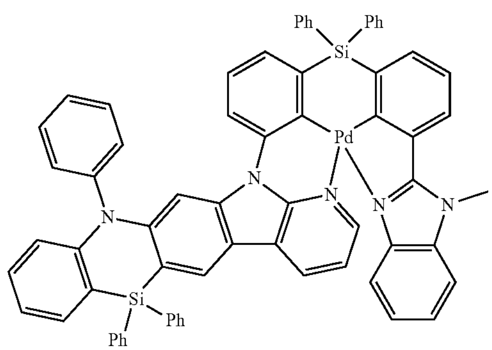
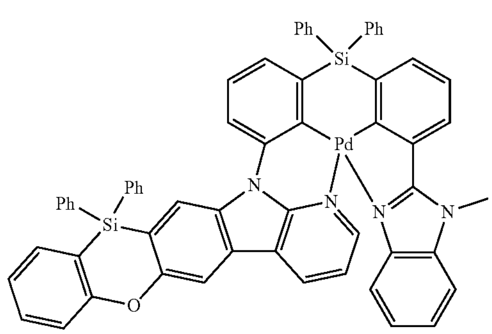
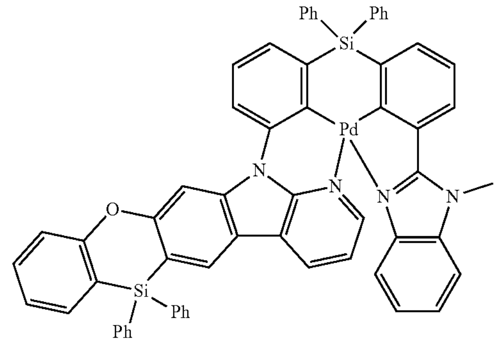
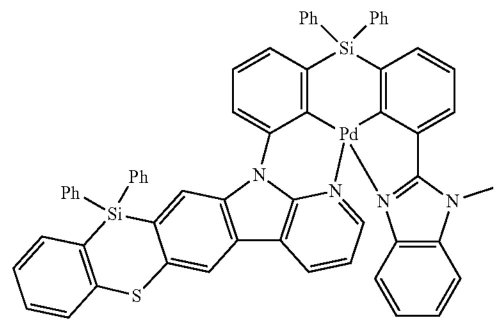
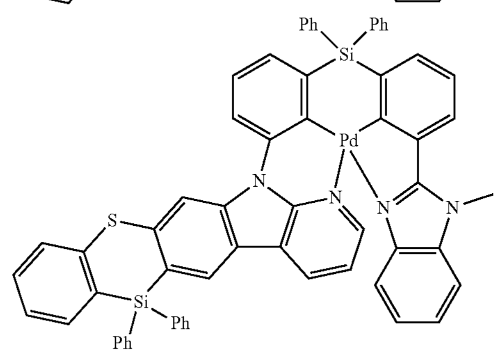
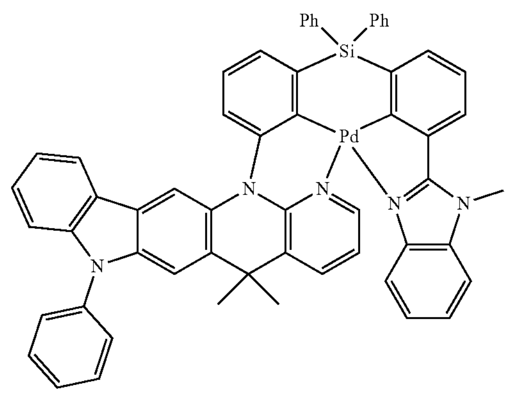
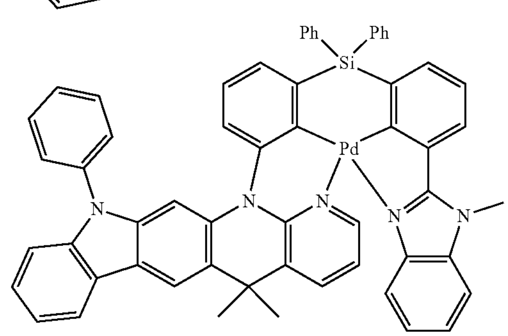

-continued
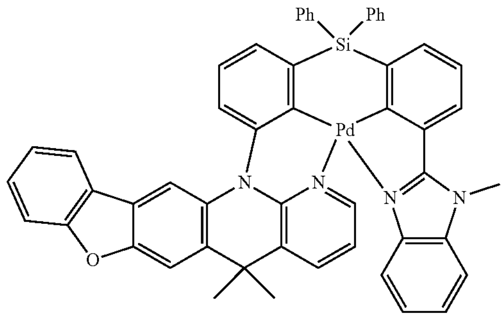
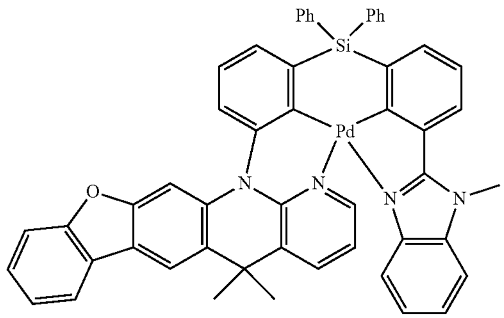
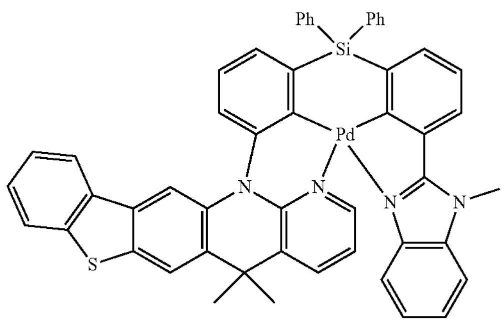
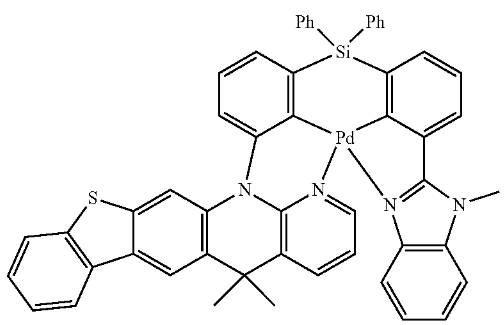
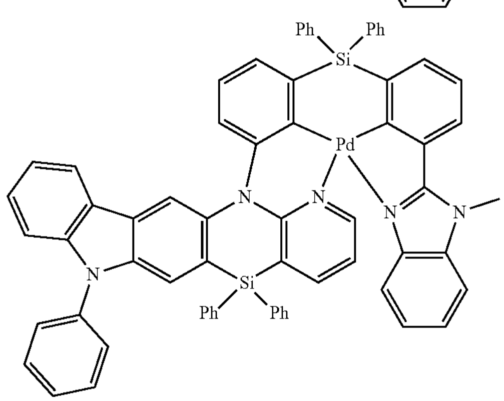
-continued
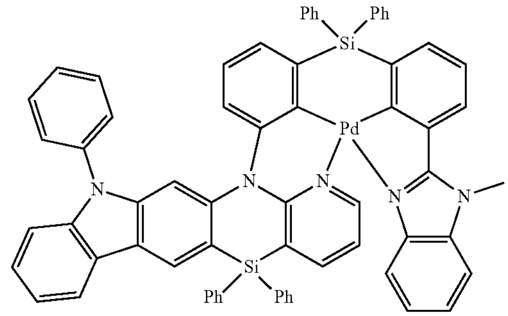
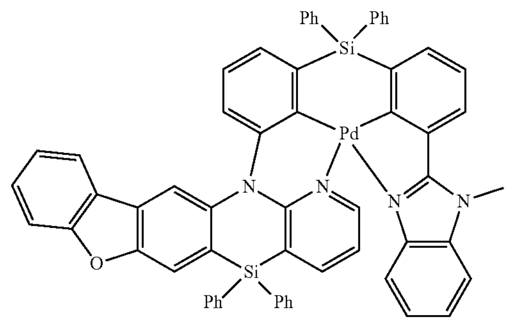
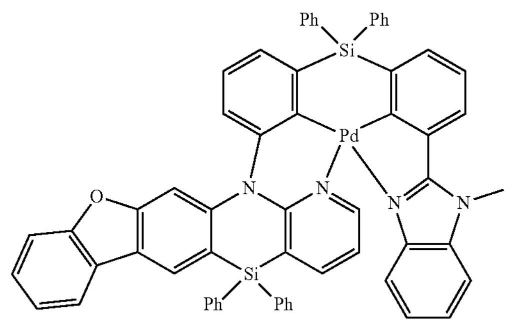
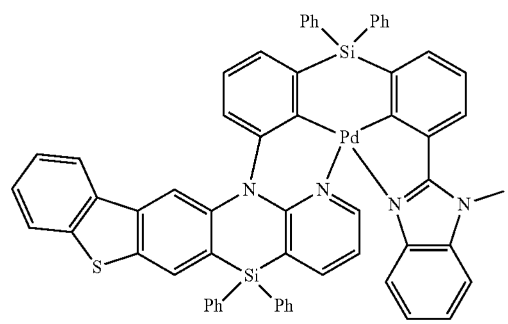
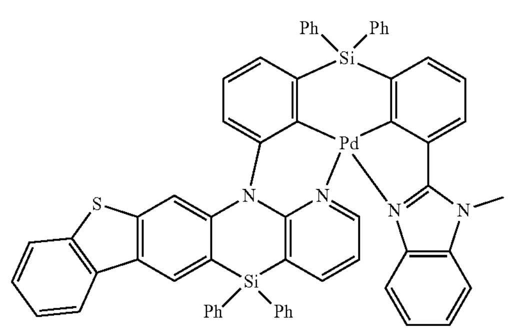

-continued
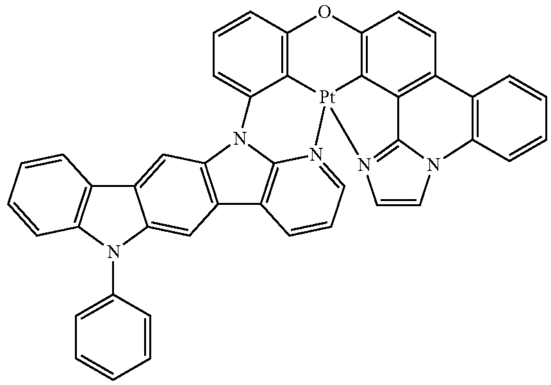
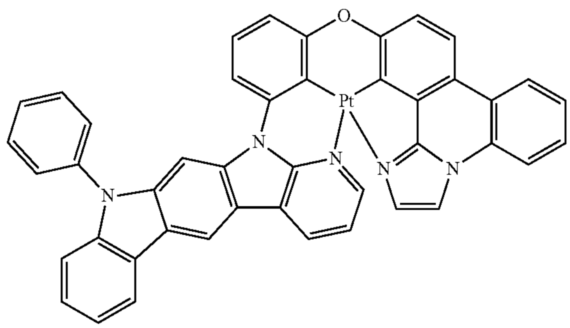
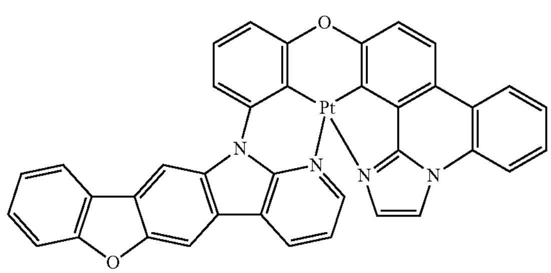
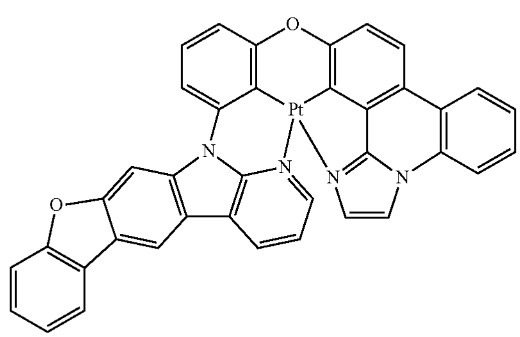
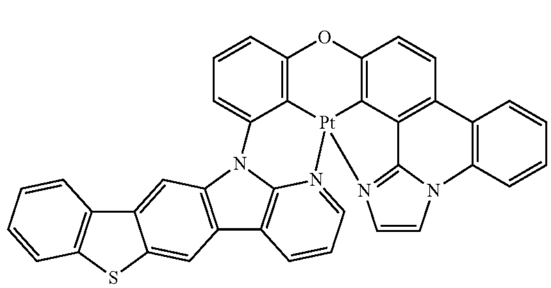
-continued
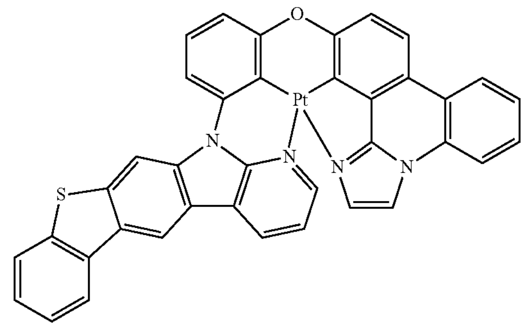
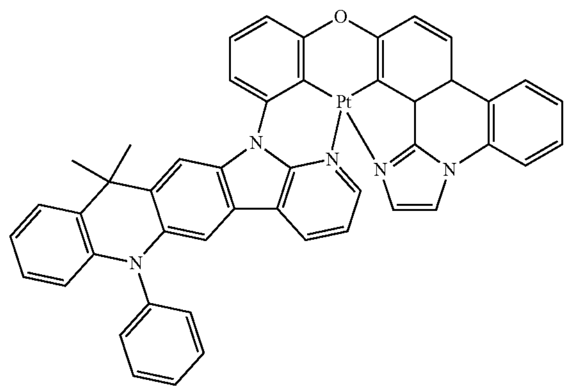
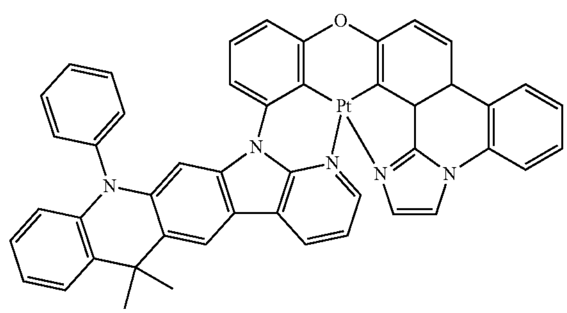
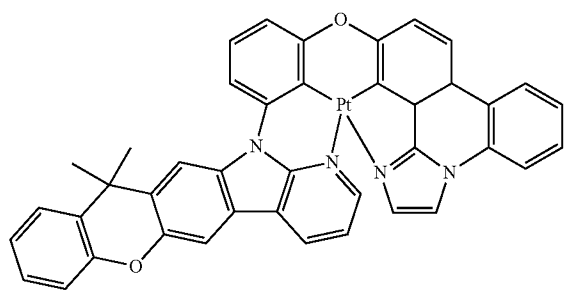
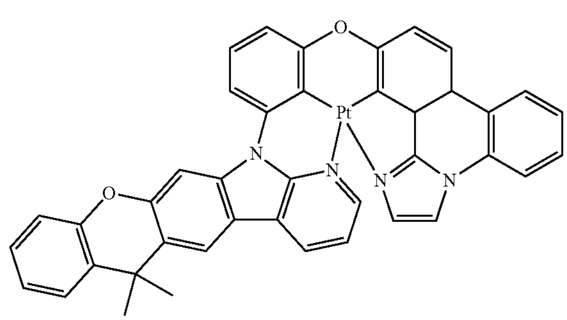

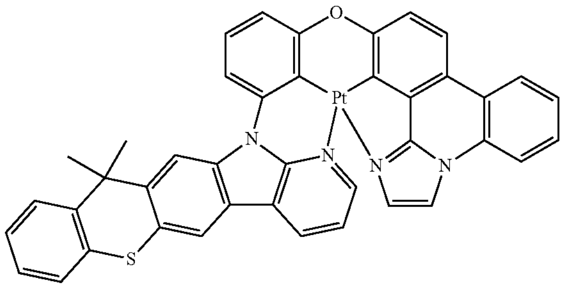
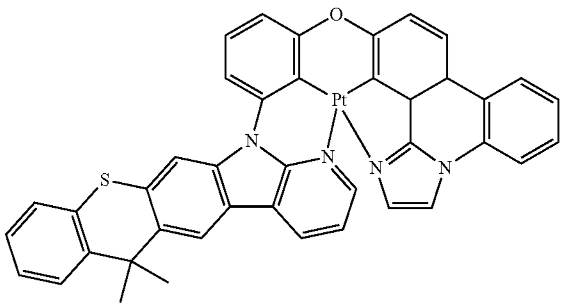
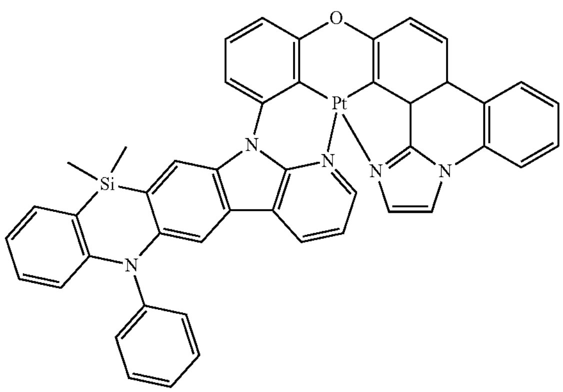
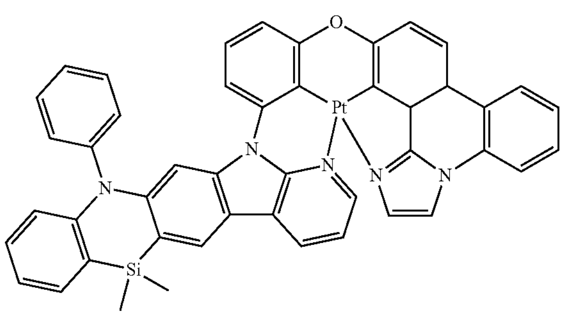
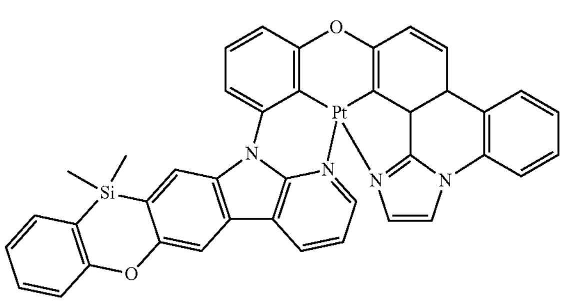
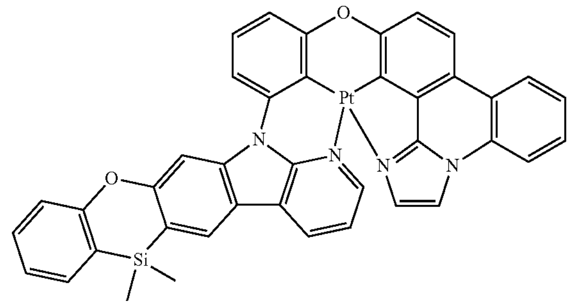
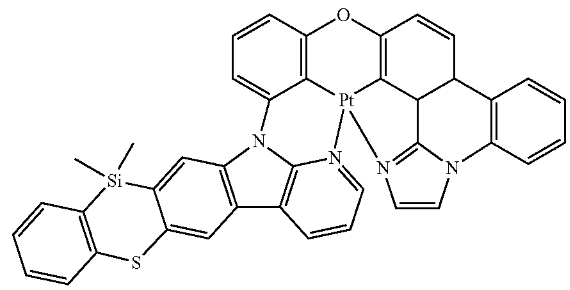
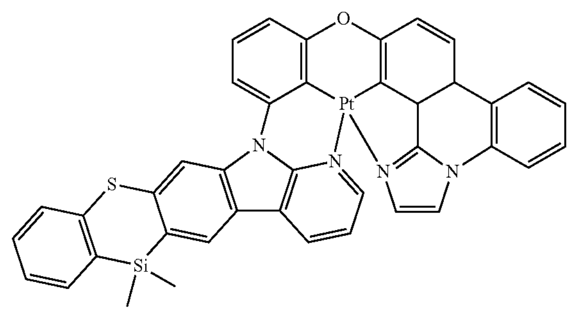
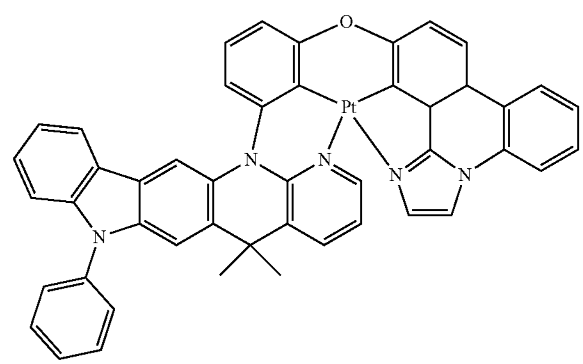
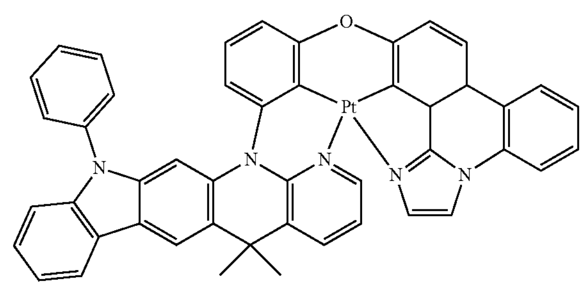

-continued
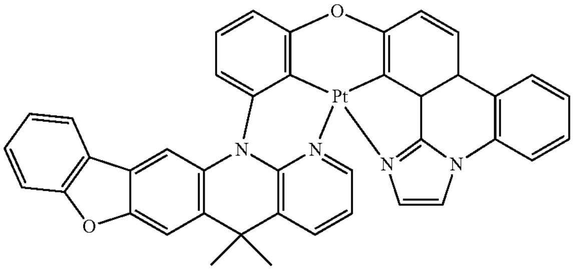
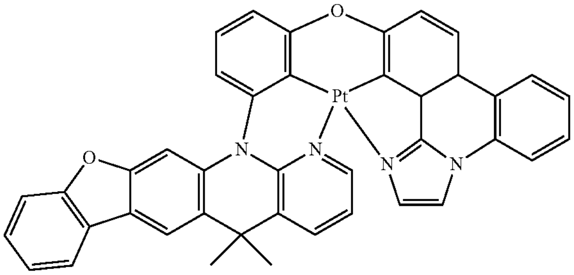
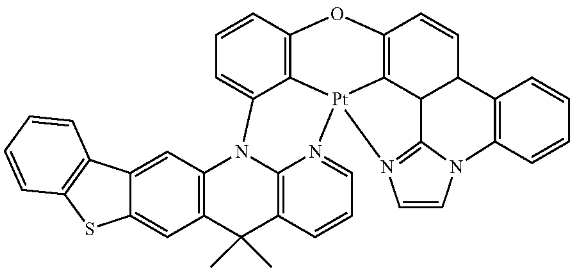
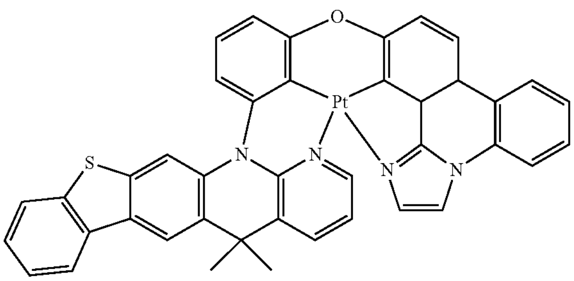
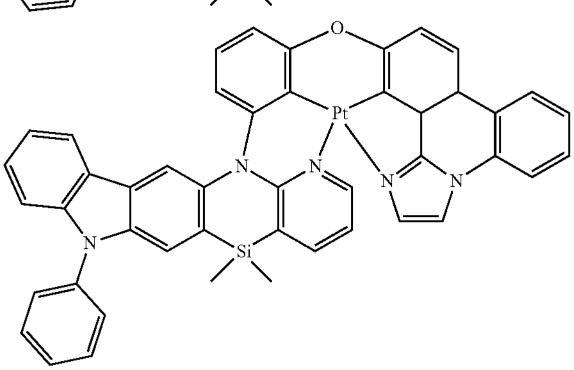
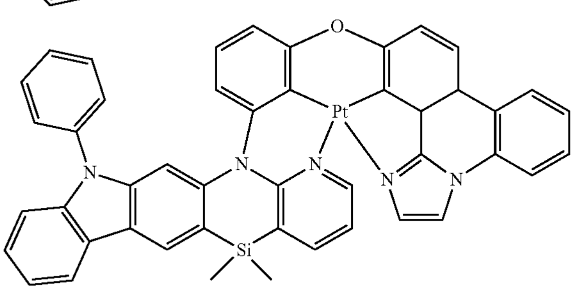
-continued
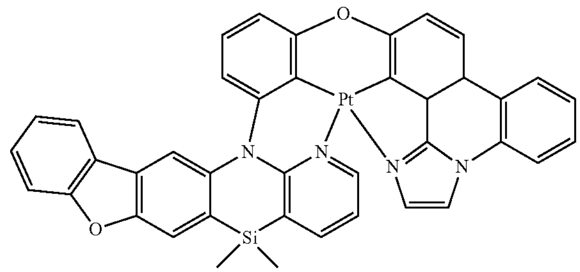
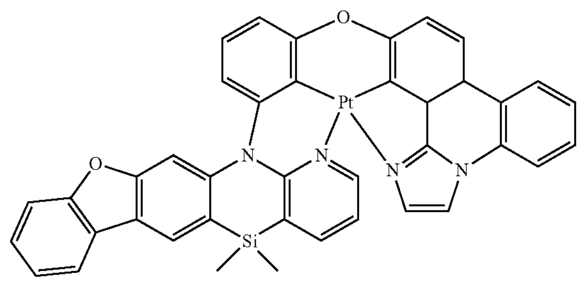
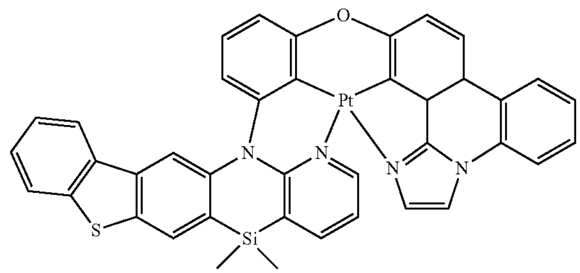
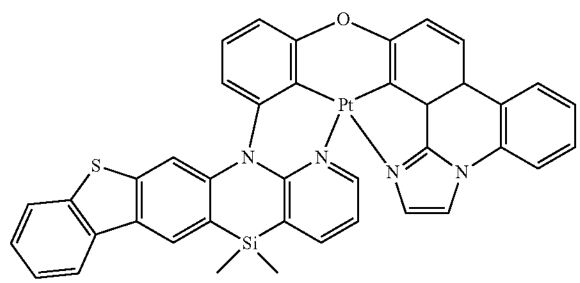
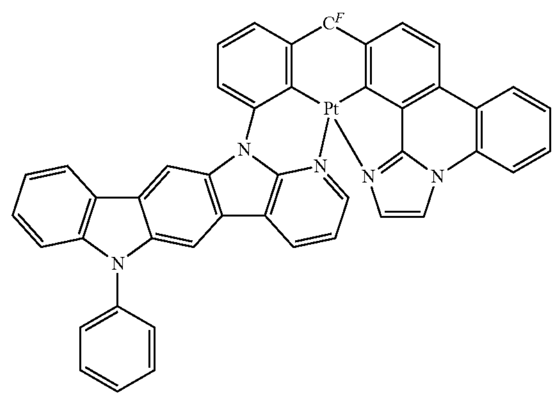

-continued
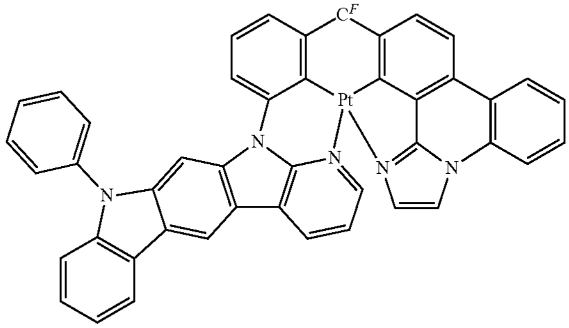
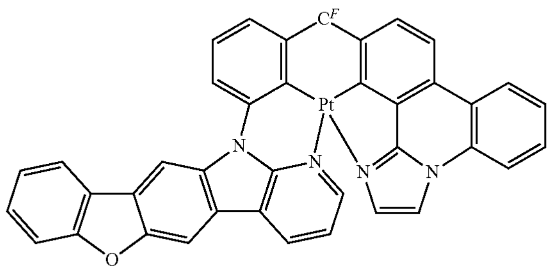
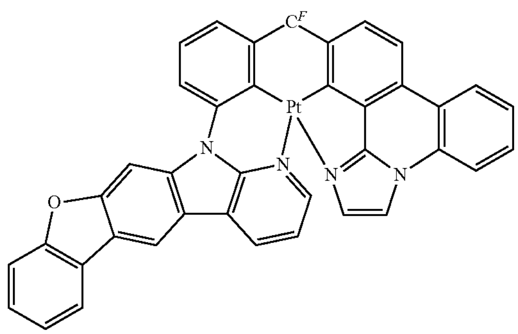
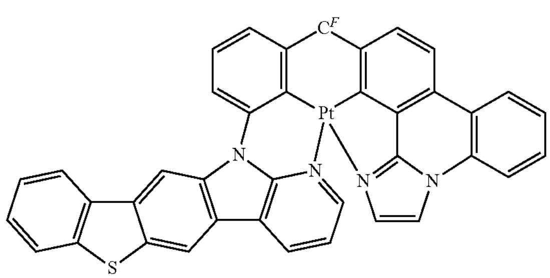
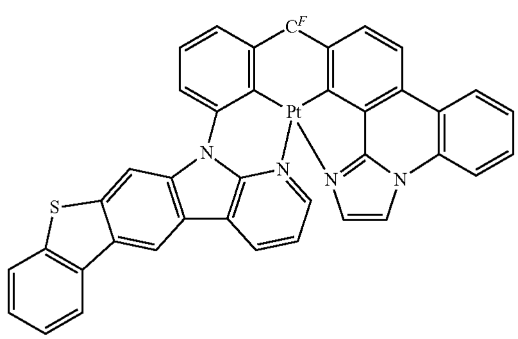
-continued
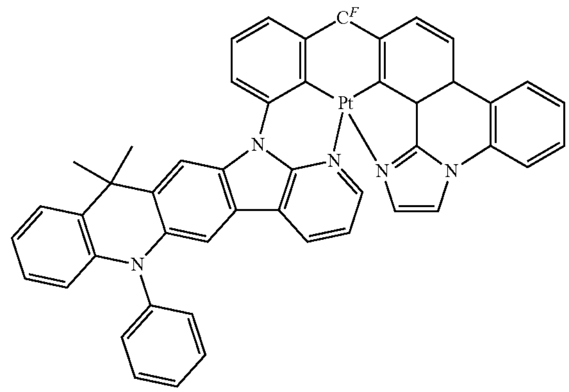
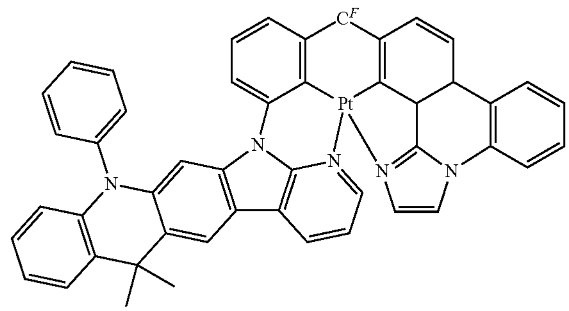
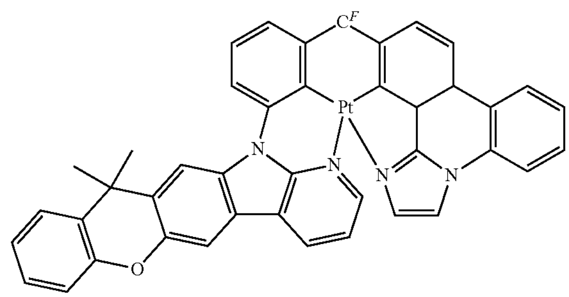
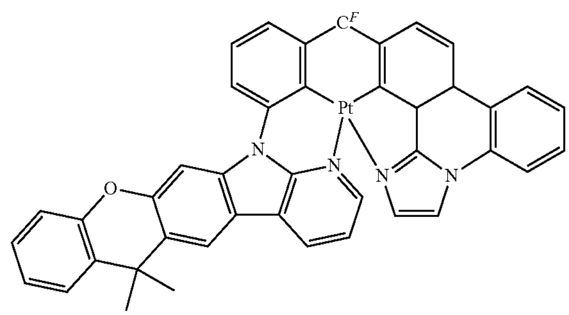
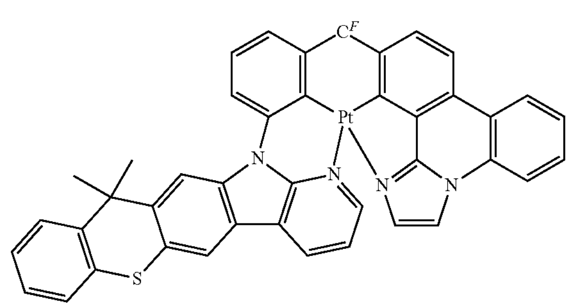

-continued
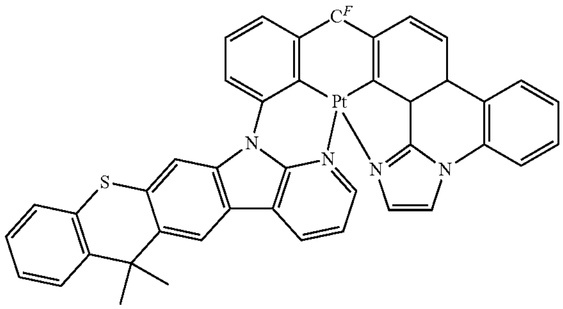
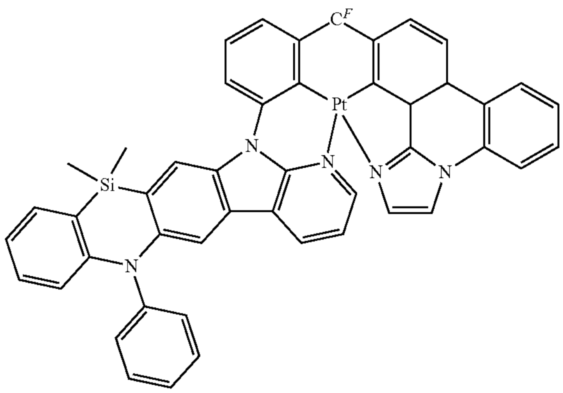
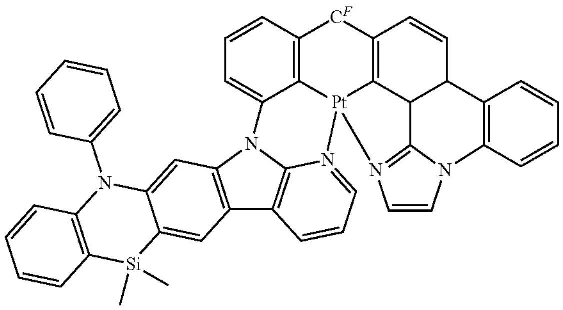
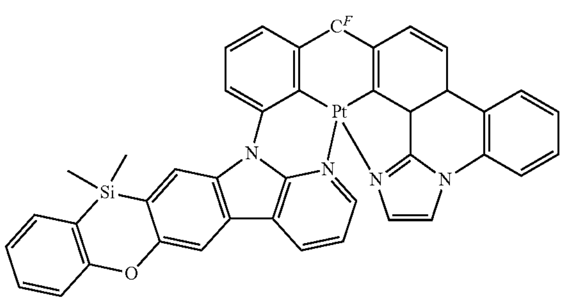
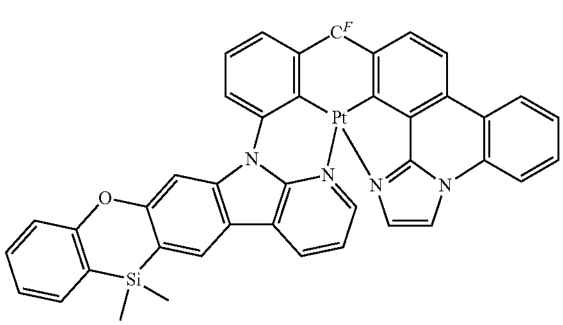
-continued
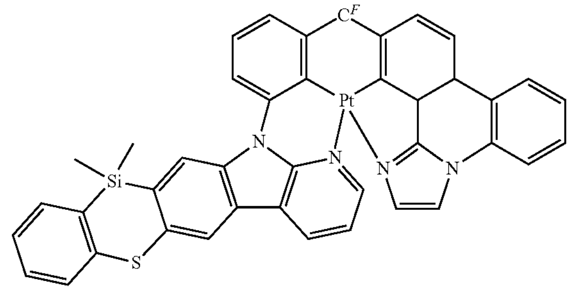
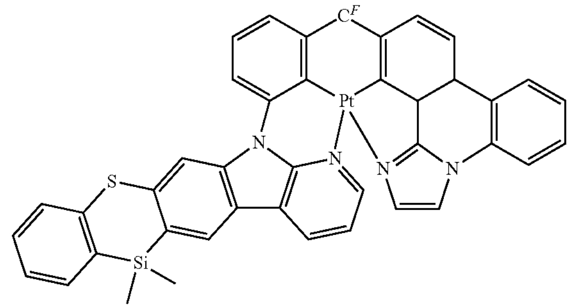
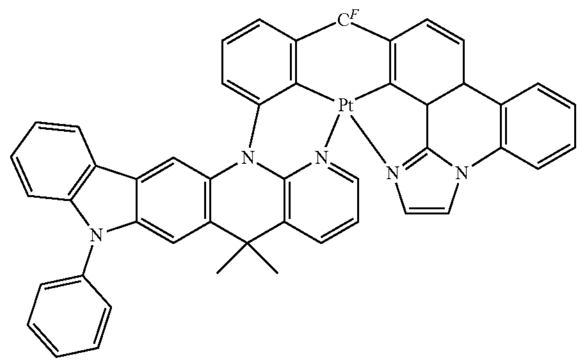
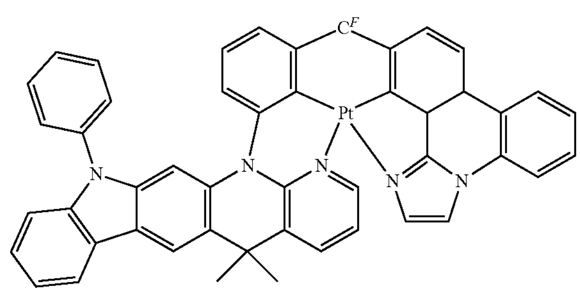
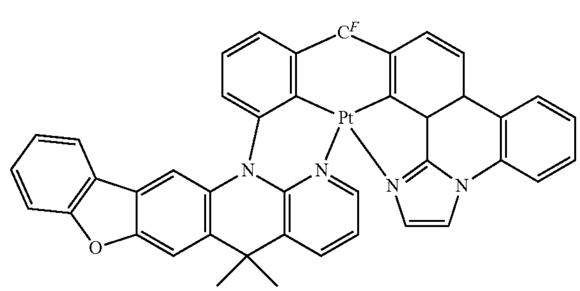

-continued
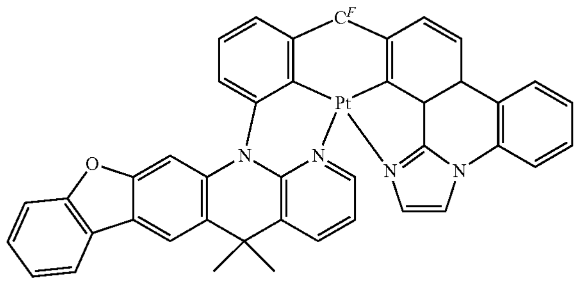
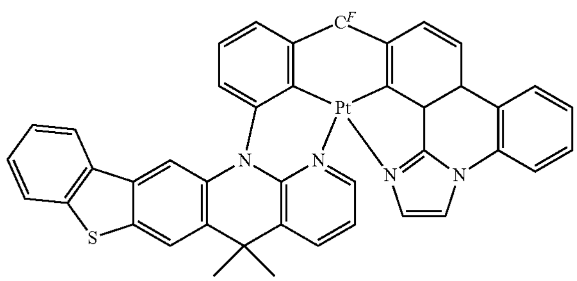
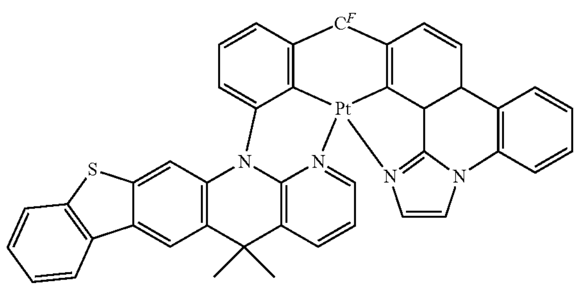
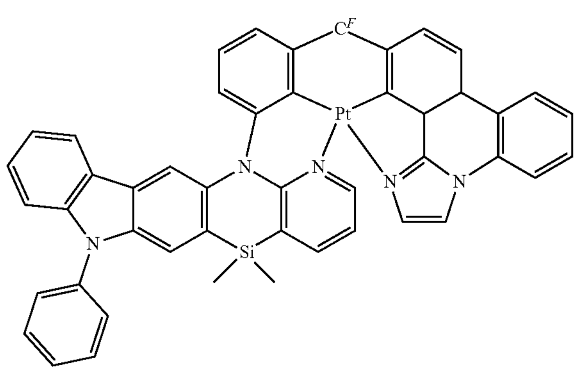
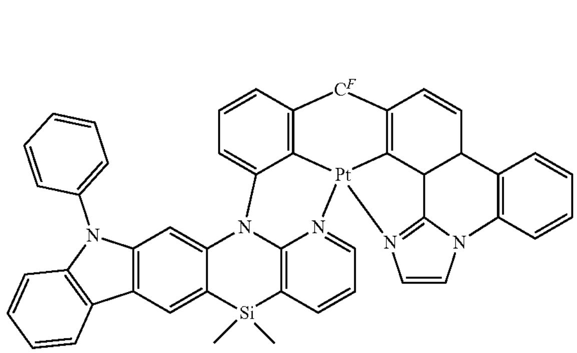
-continued
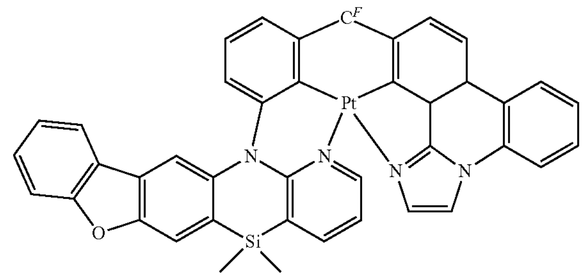
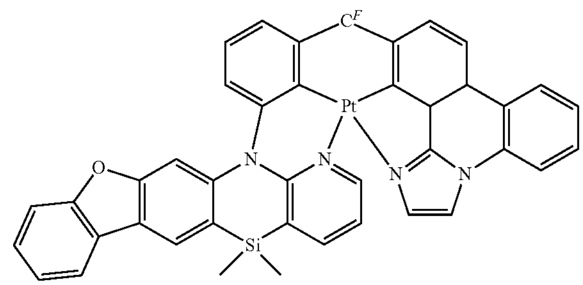
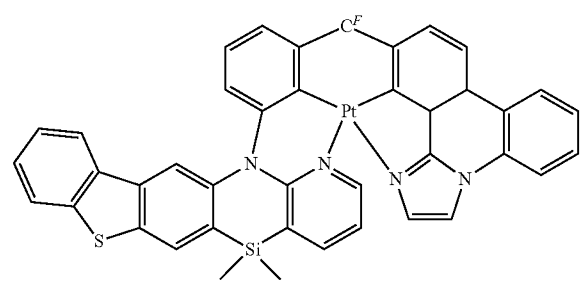
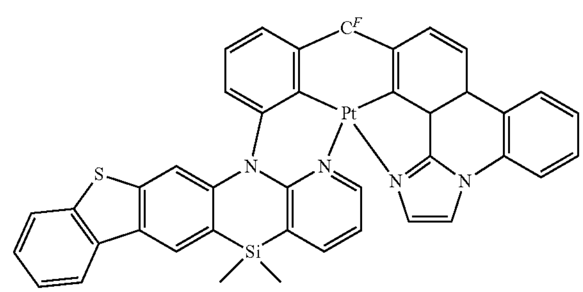
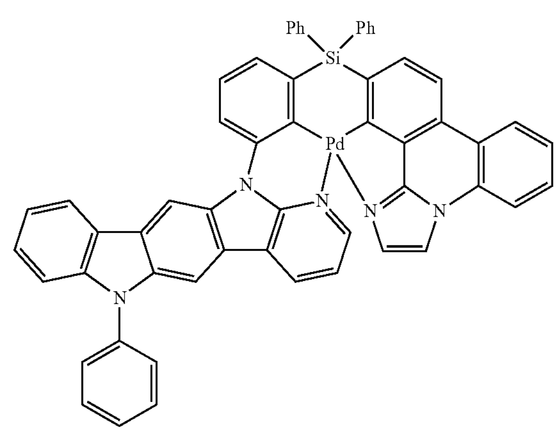

-continued
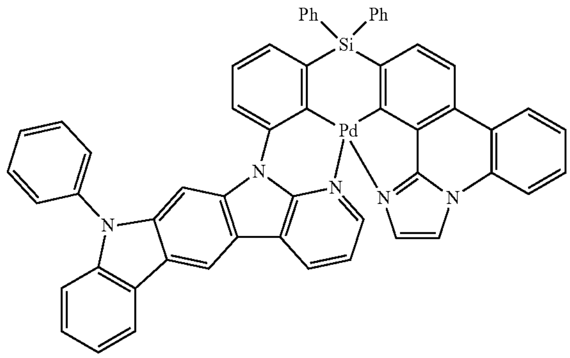
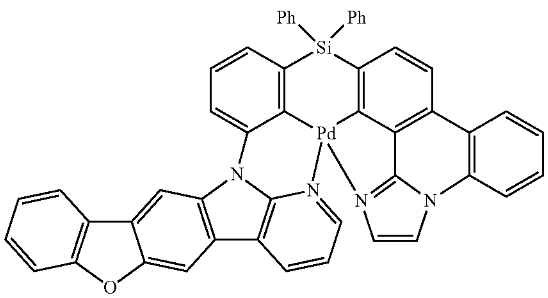
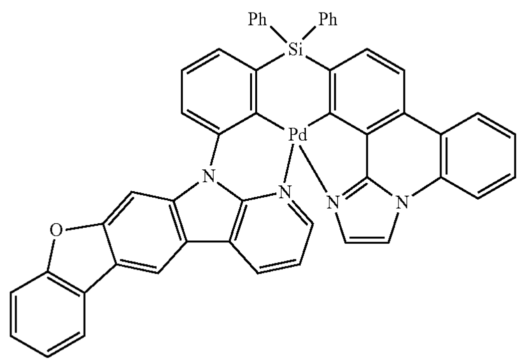
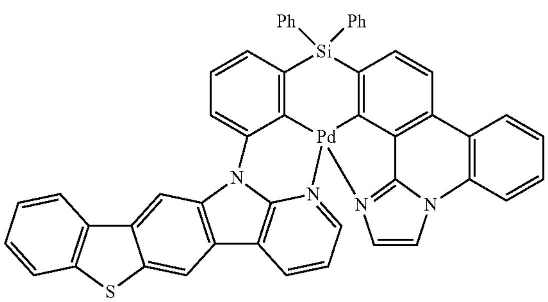
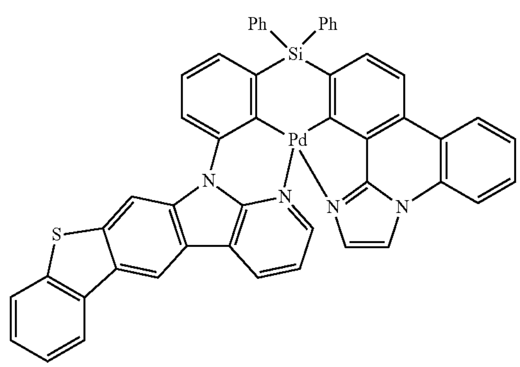
-continued
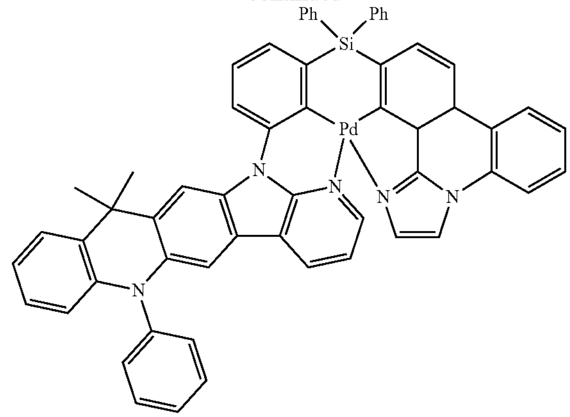
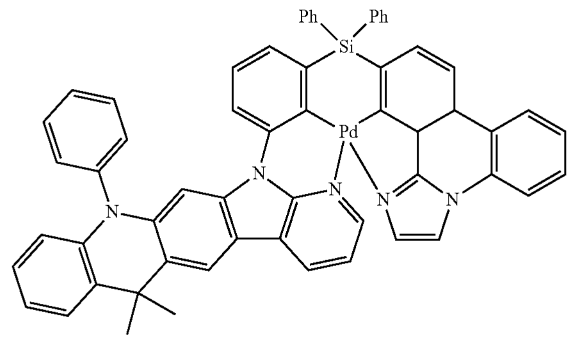
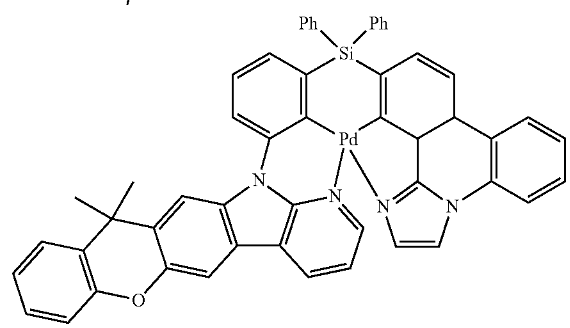
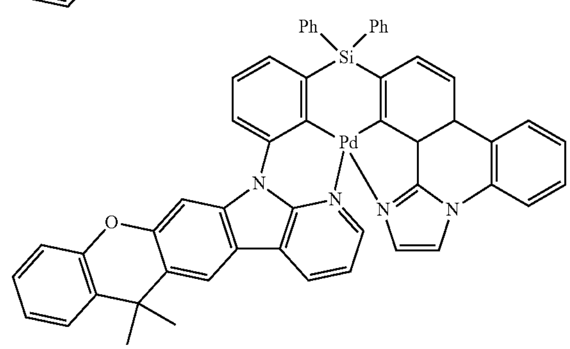
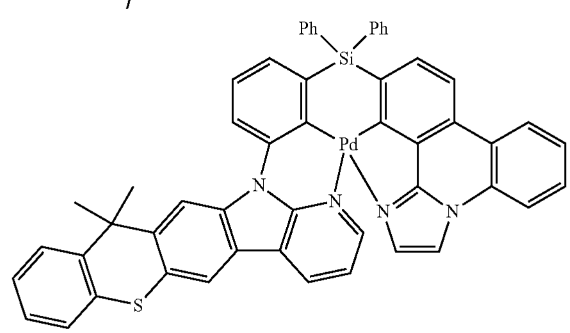

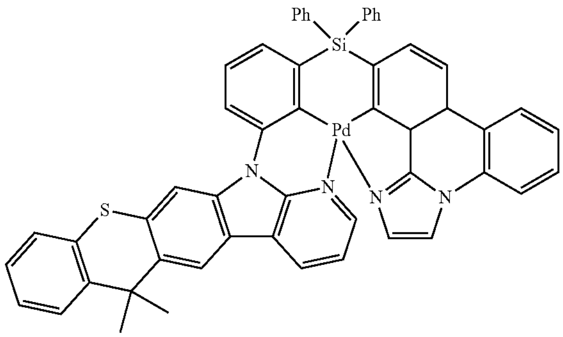
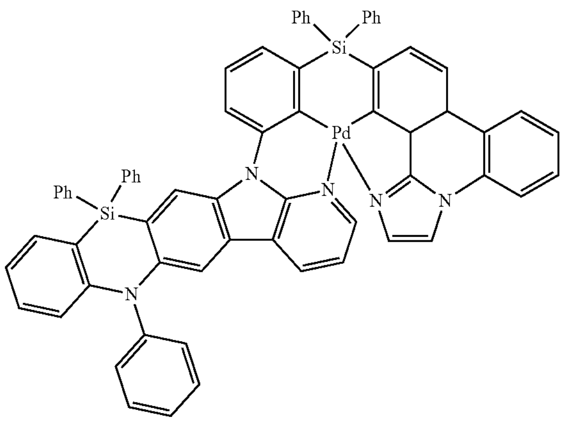
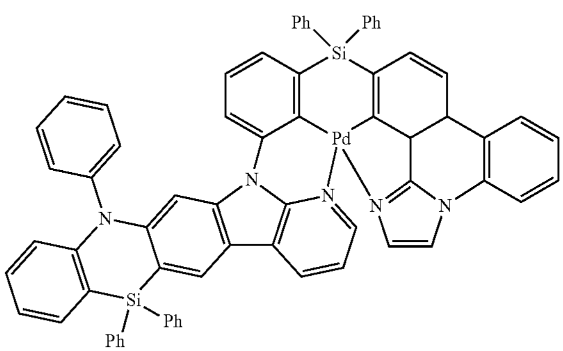
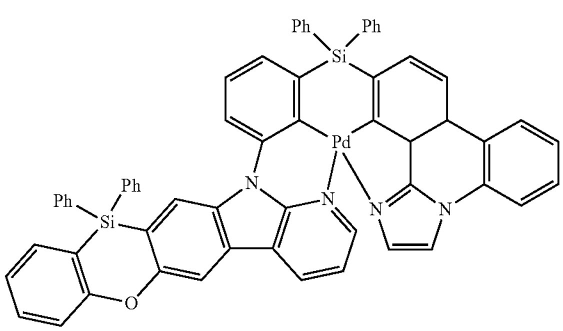
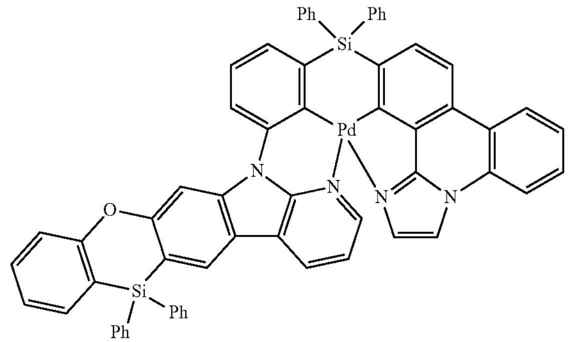
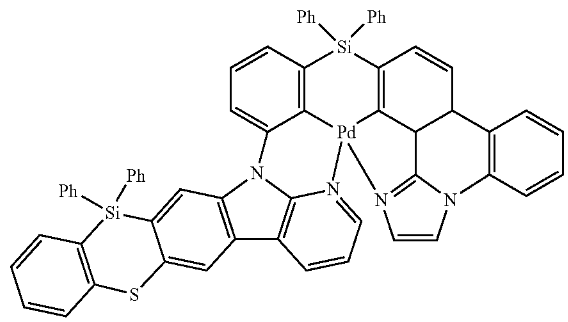
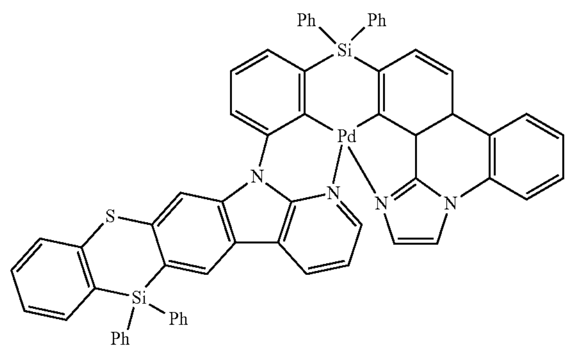
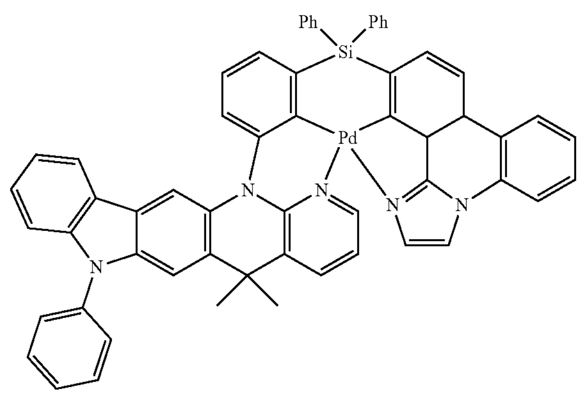
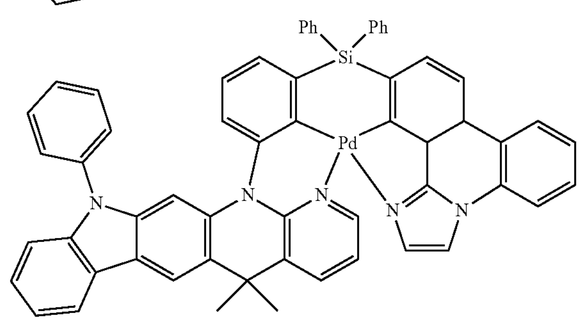

-continued
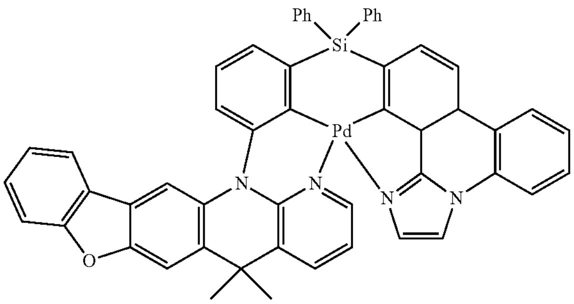
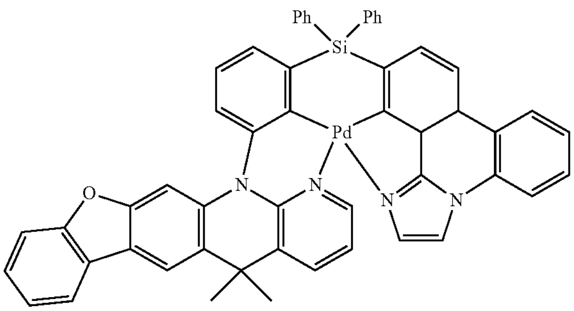
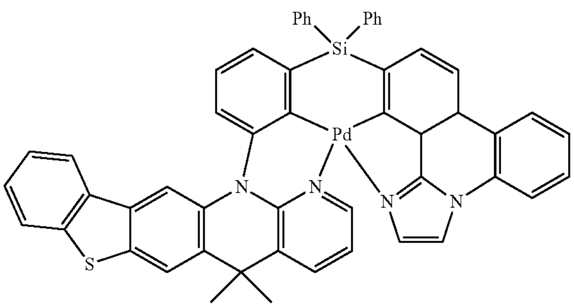
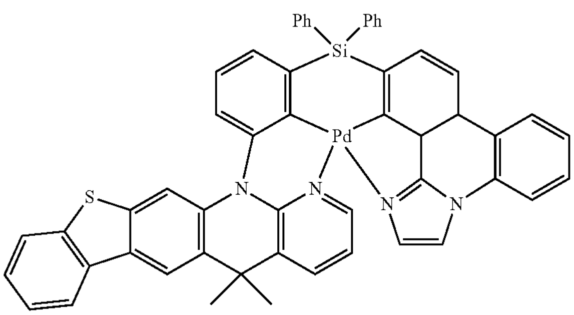
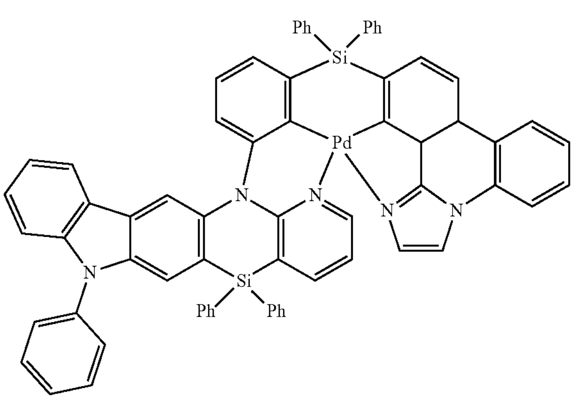
-continued
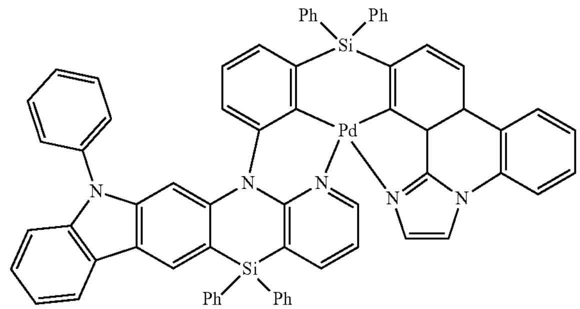
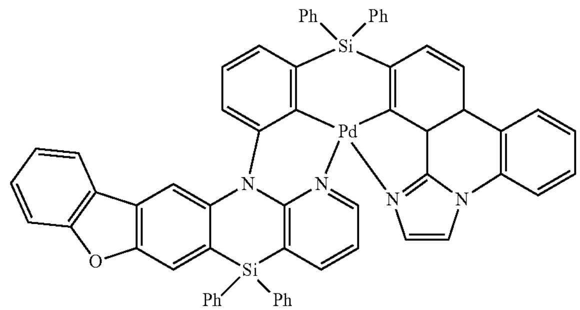
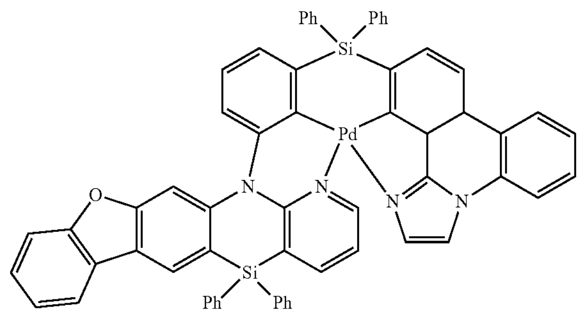
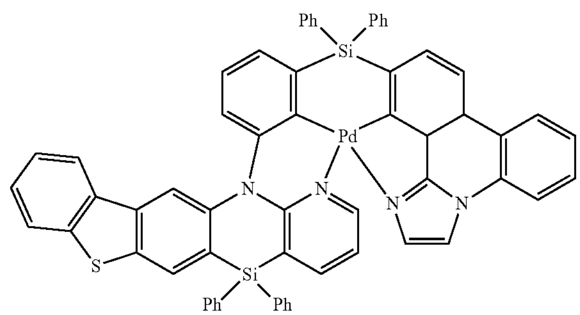
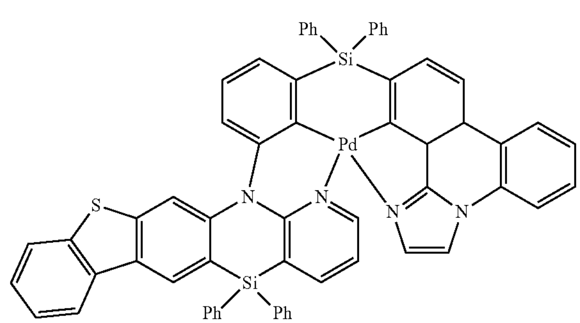

-continued
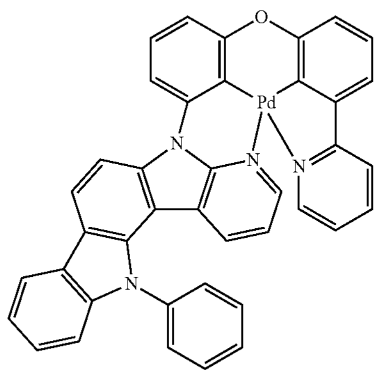
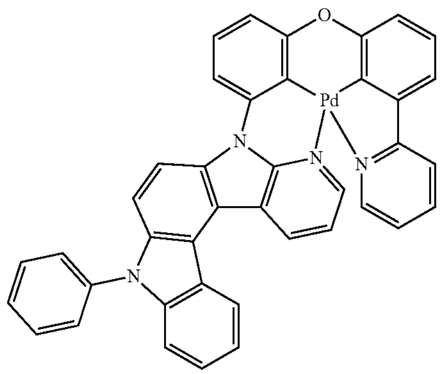
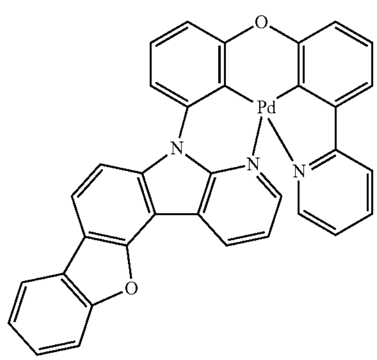
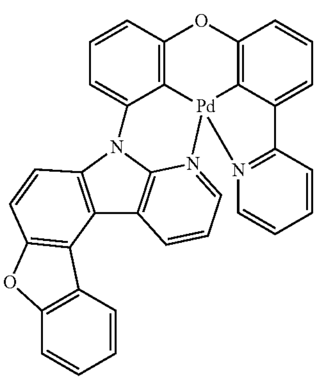
-continued
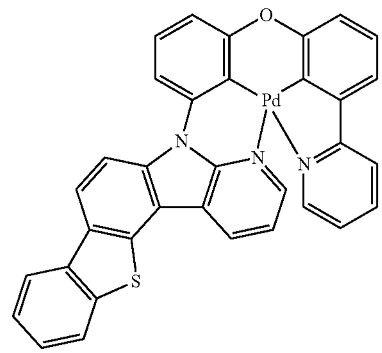
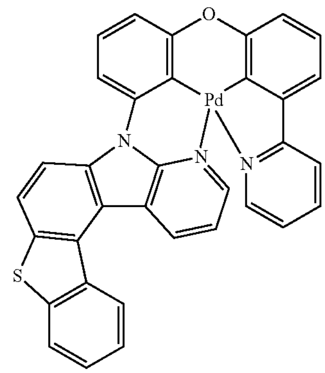
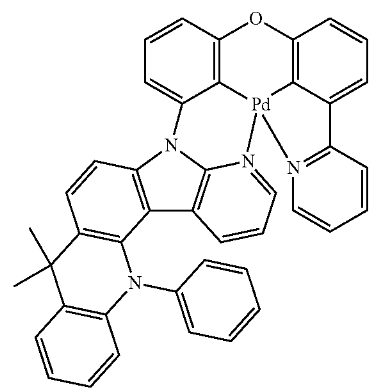
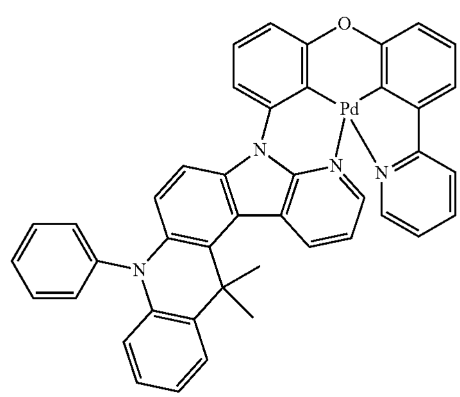

-continued
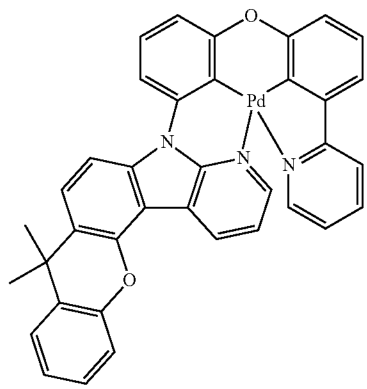
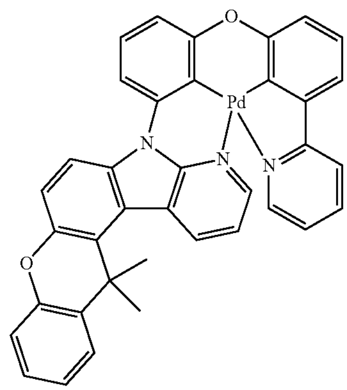
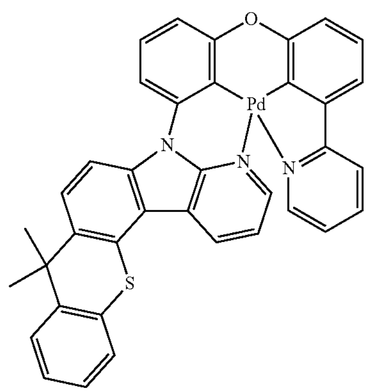
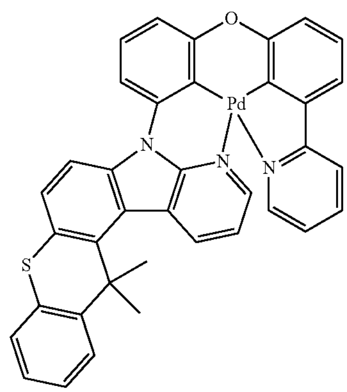
-continued
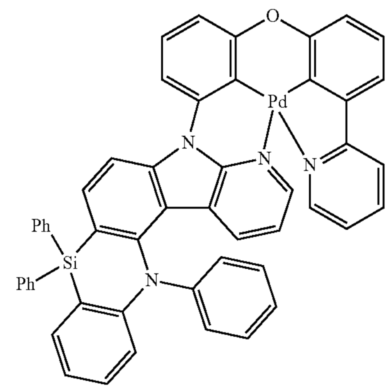
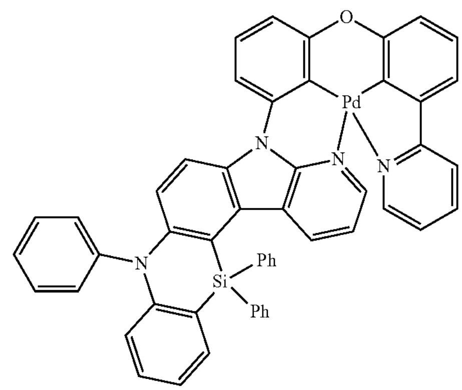
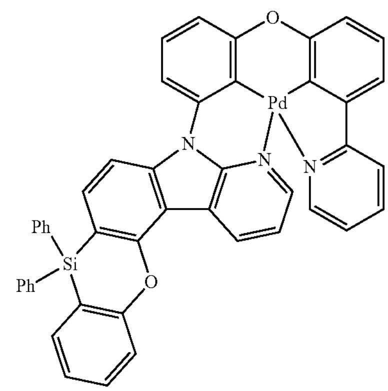
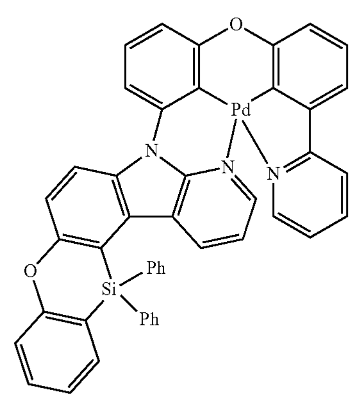

-continued
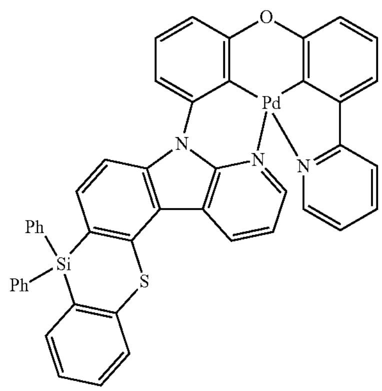
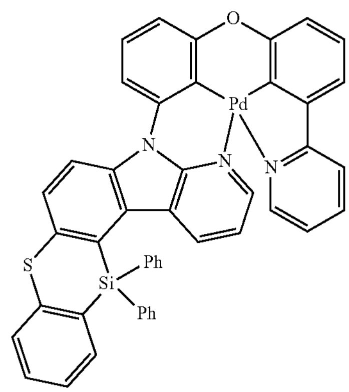
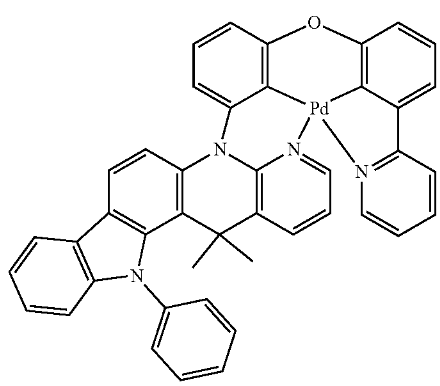
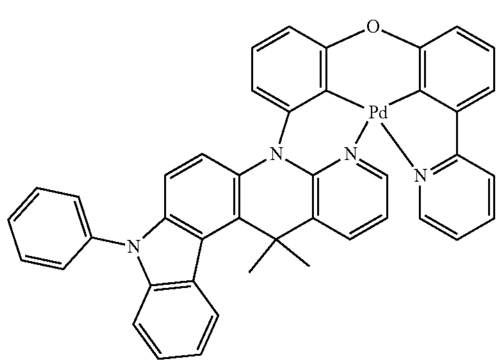
-continued
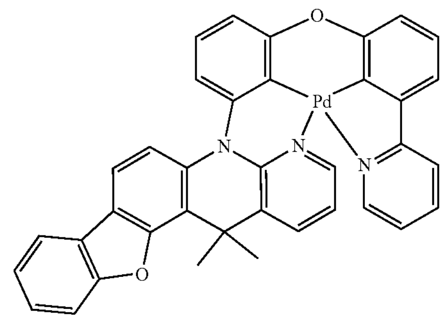
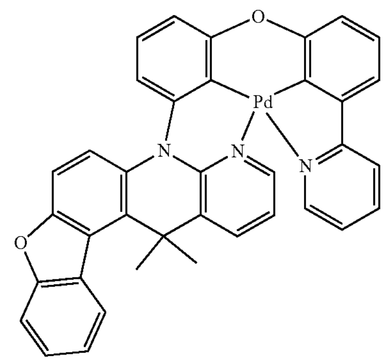
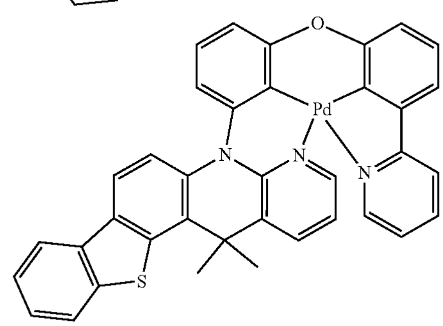
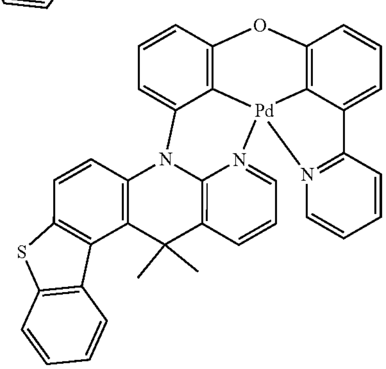
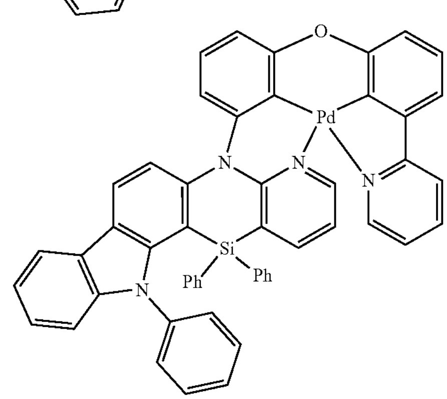

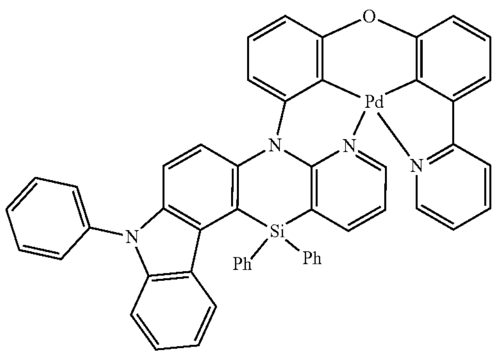
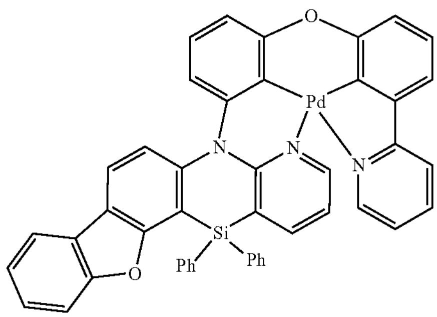
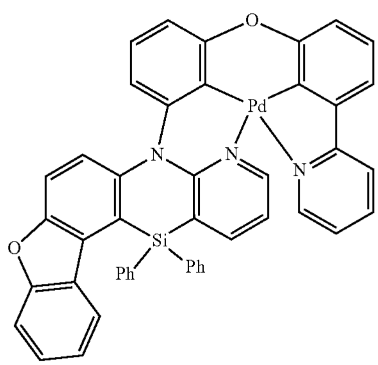
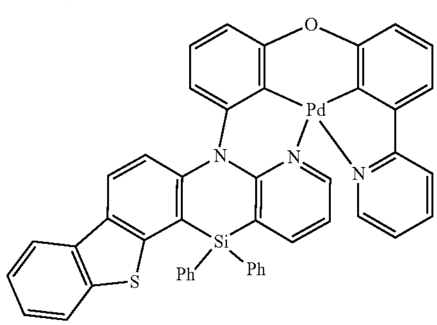
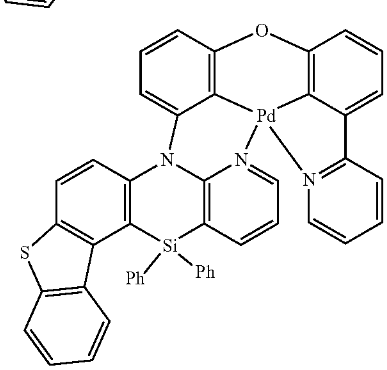
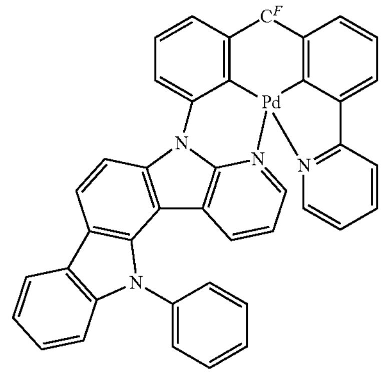
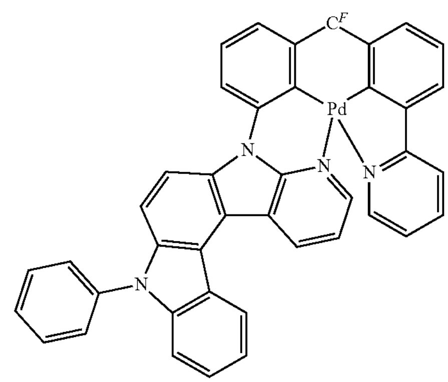
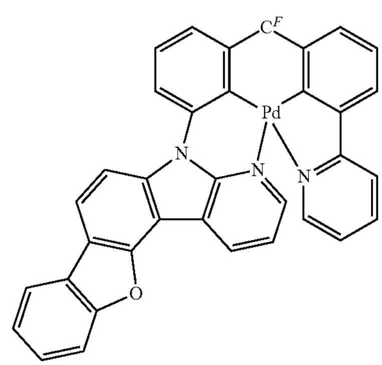
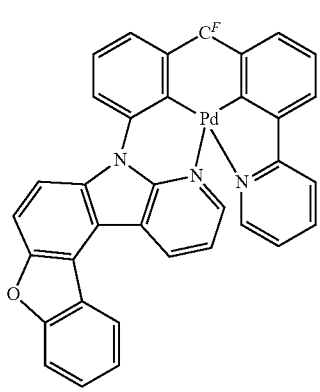

-continued
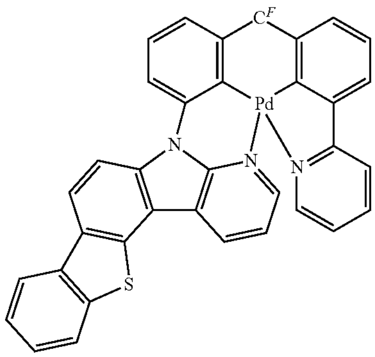
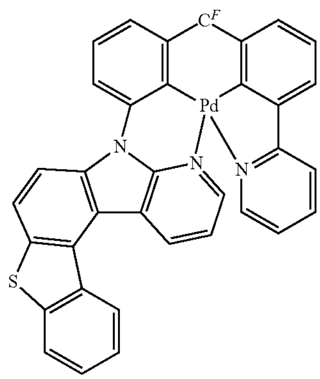
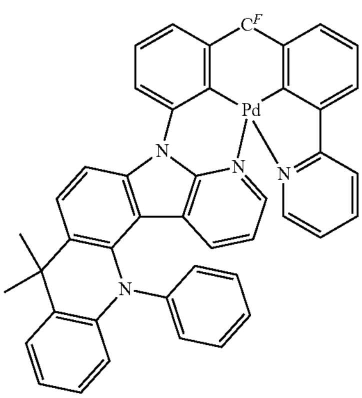
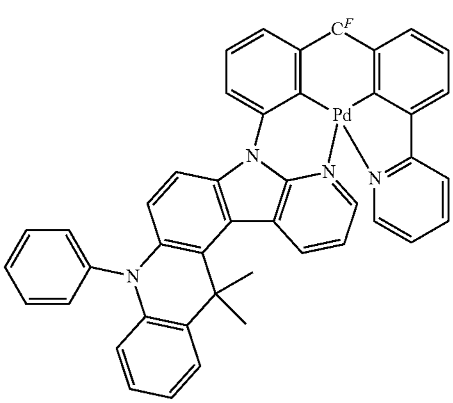
-continued
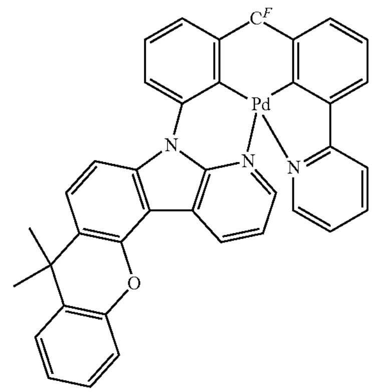
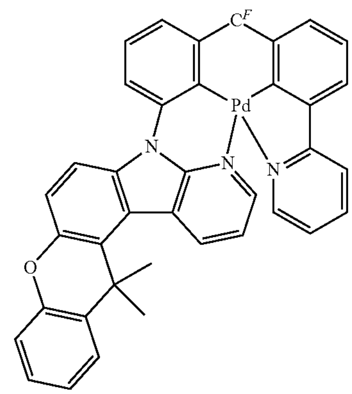
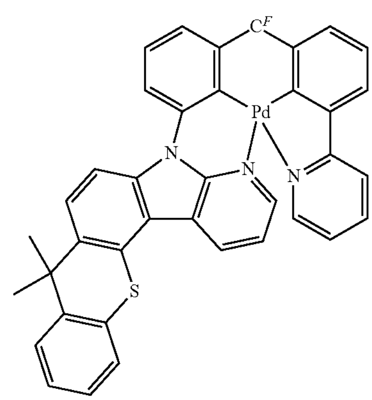
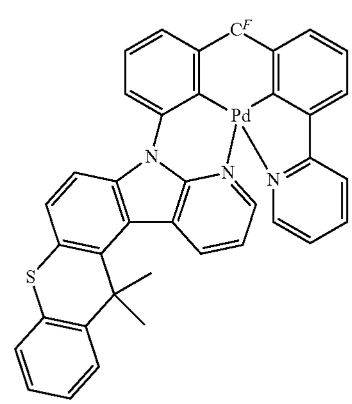

-continued
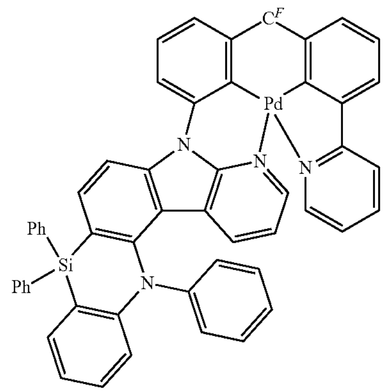
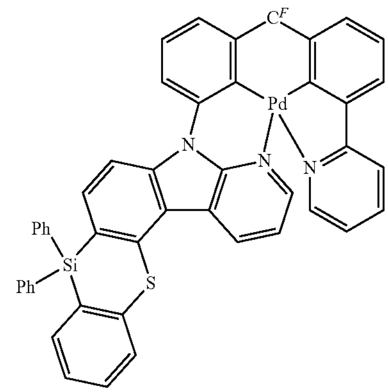
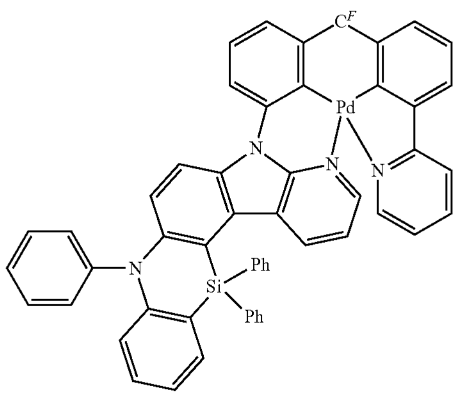
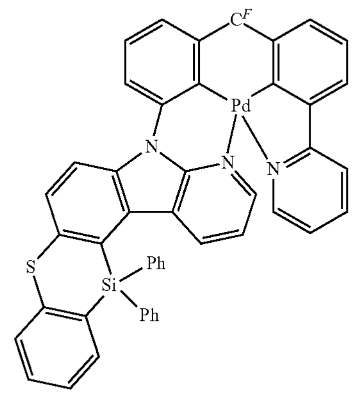
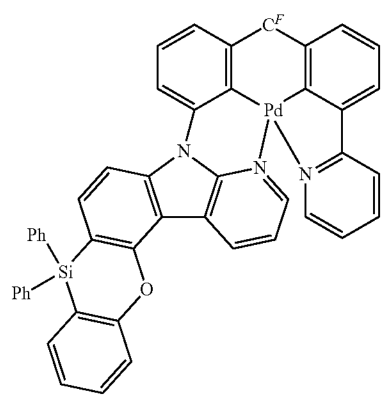
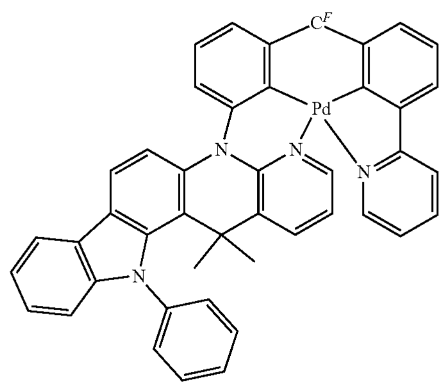
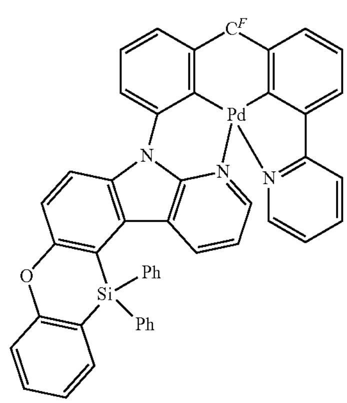
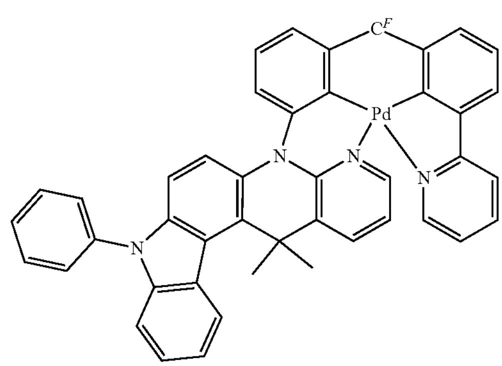

-continued
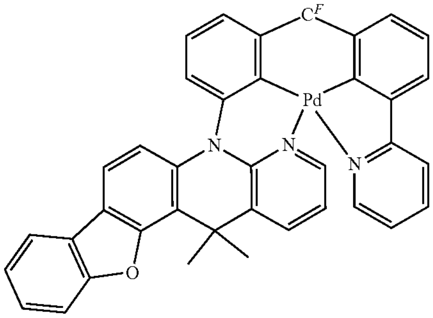
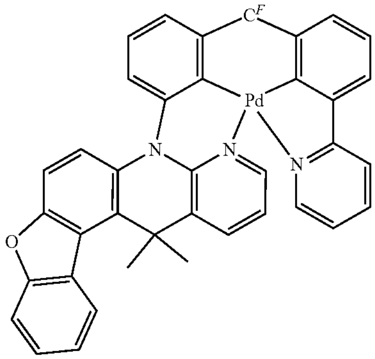
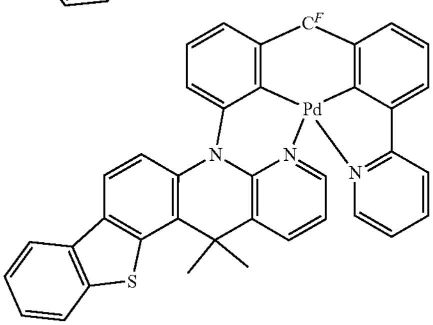
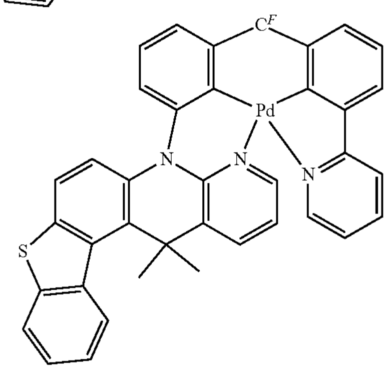
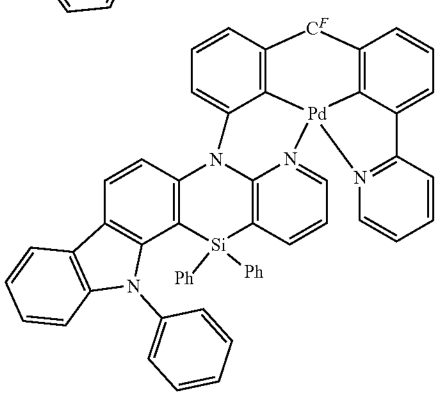
-continued
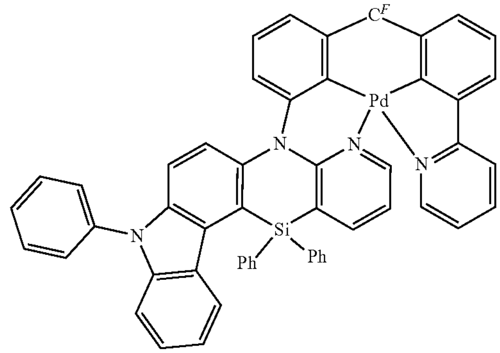
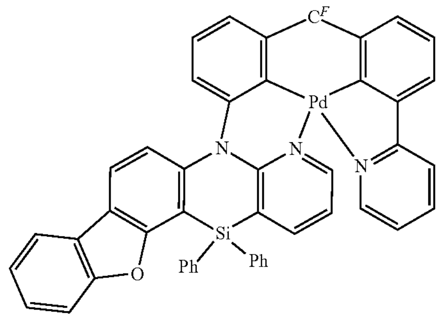
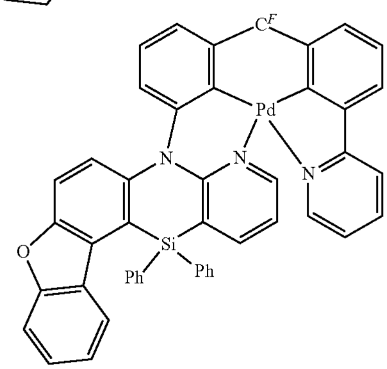
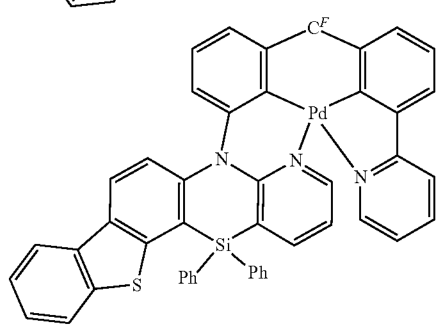
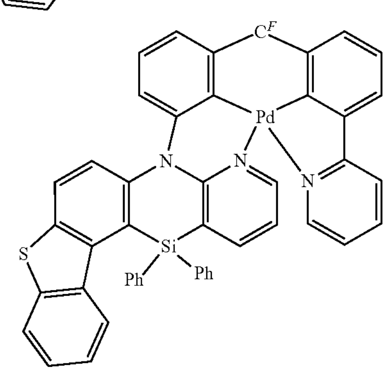

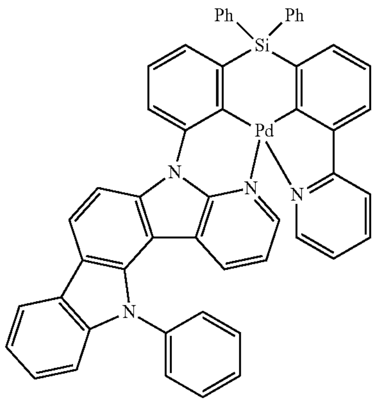
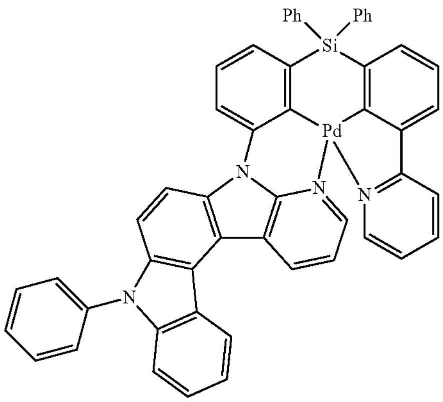
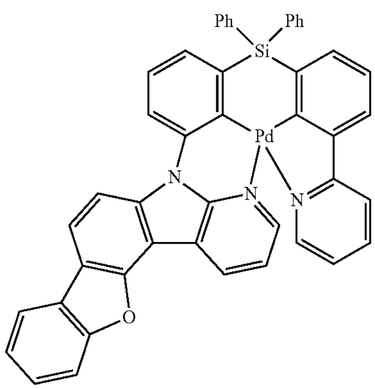
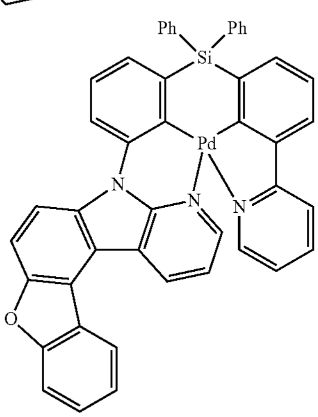
-continued
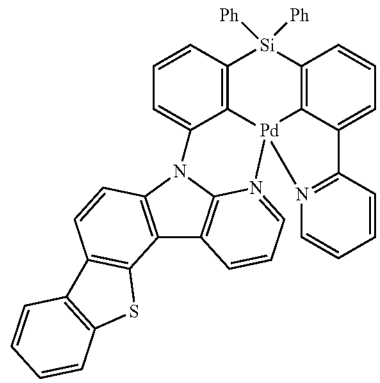
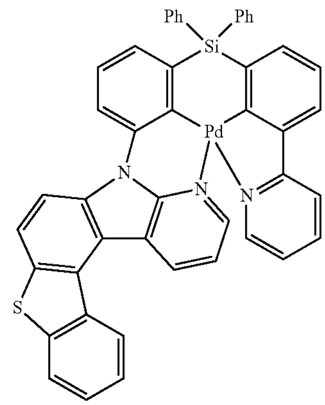
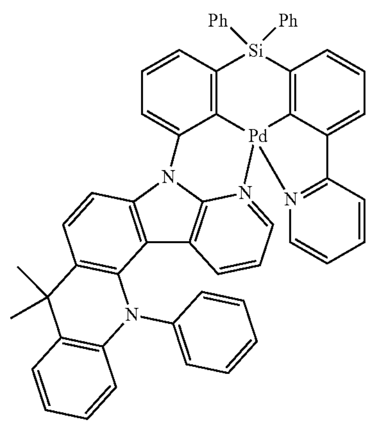
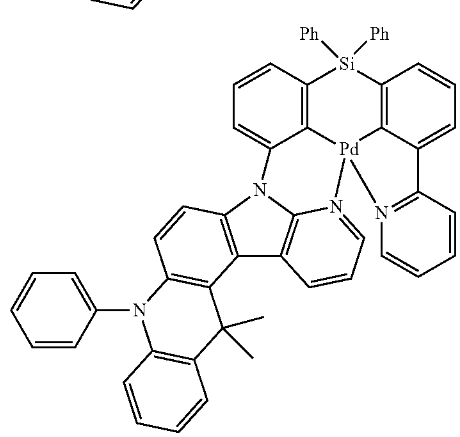

-continued
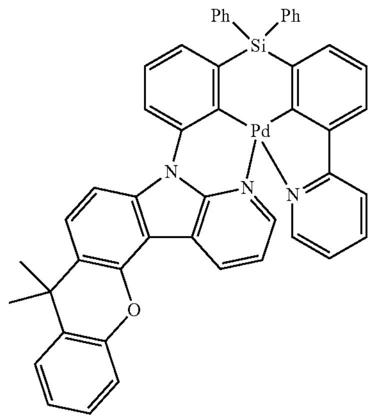
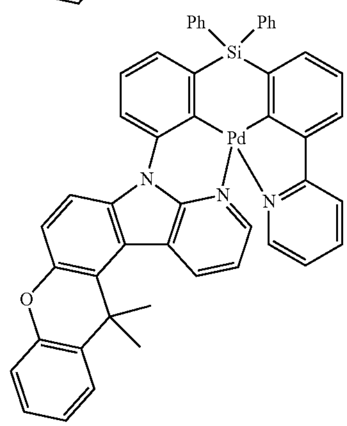
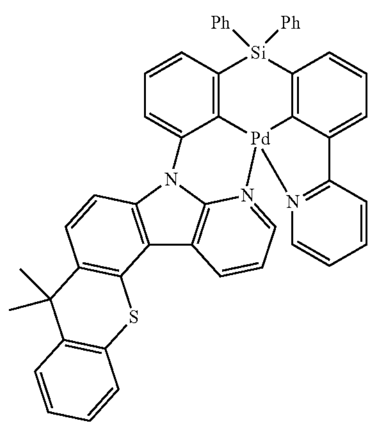
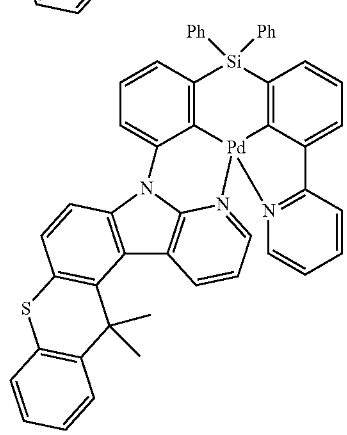
-continued
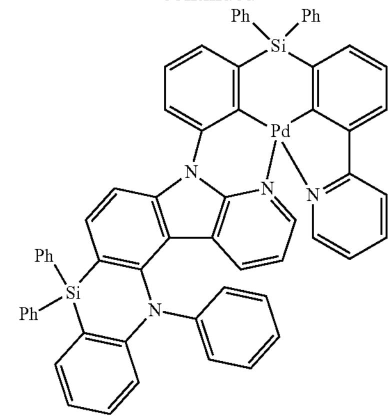
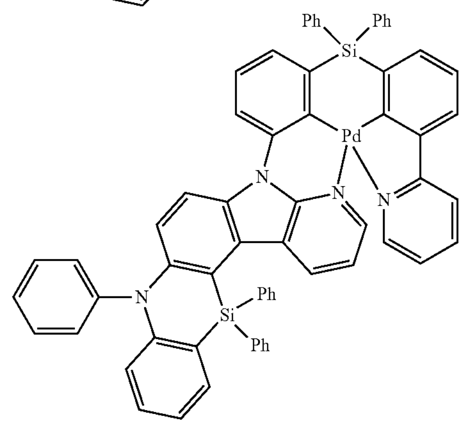
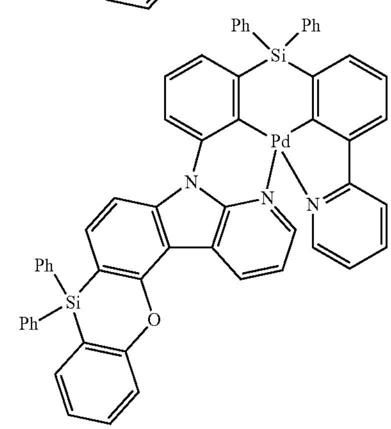
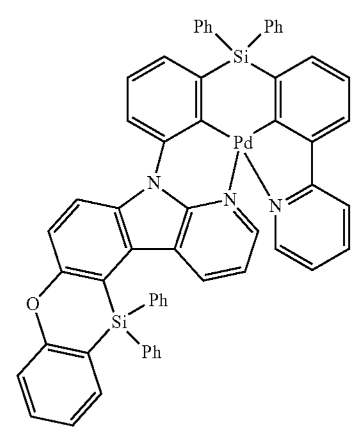

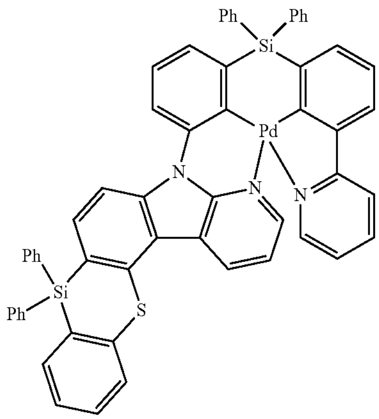
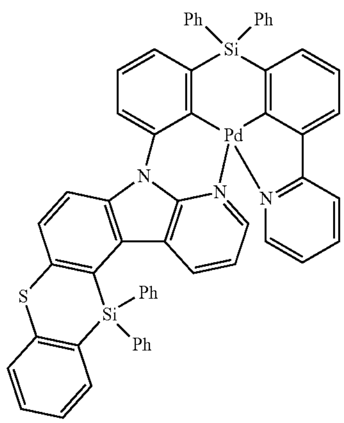
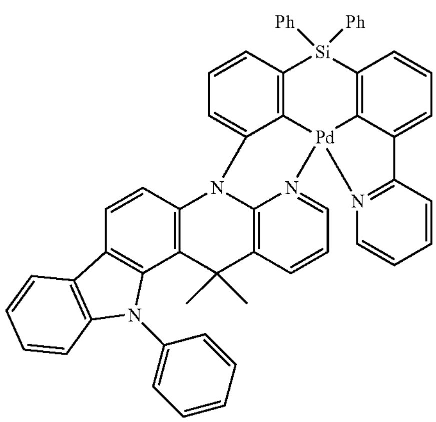
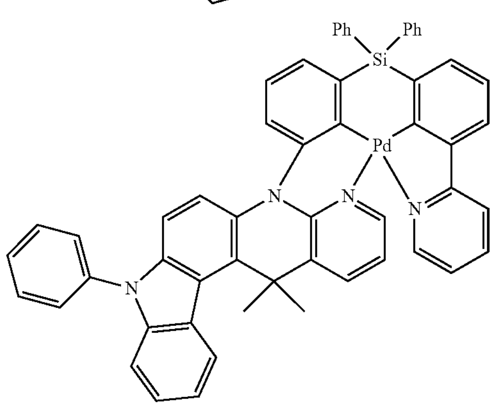
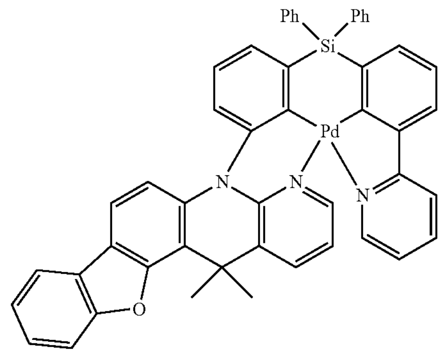
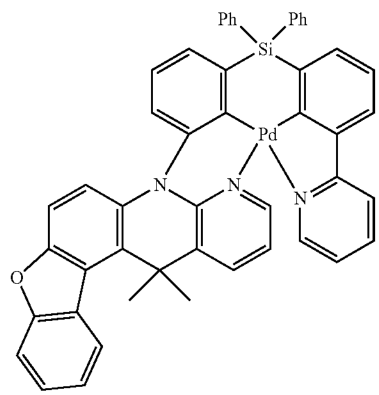
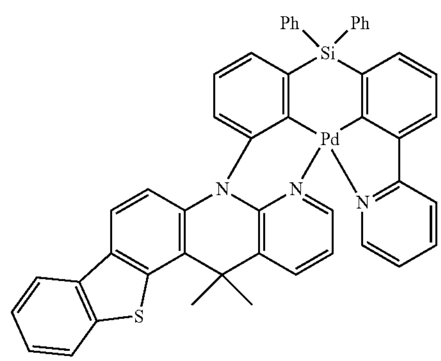
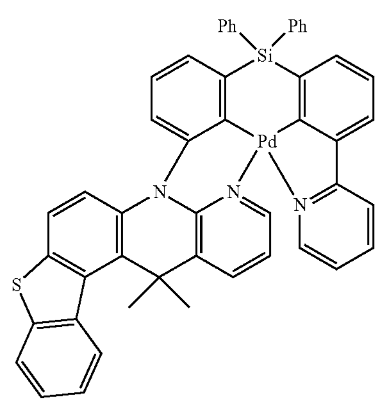

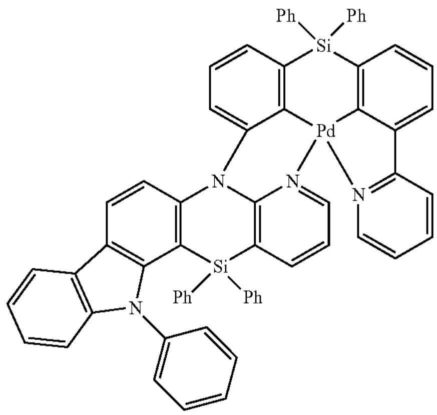
Ph
Ph
Si
Pd
N
N
N
Si
Ph
Ph
N
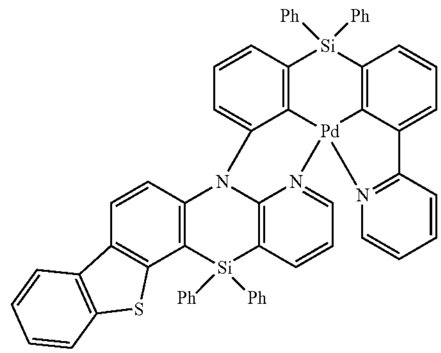
Ph
Ph
Si
Pd
N
N
N
S
Si
Ph
Ph
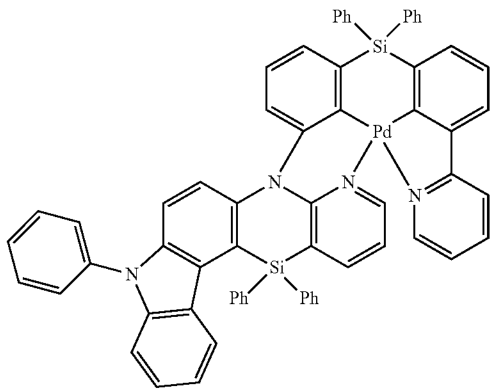
Ph
Ph
Si
Pd
N
N
N
N
Si
Ph
Ph
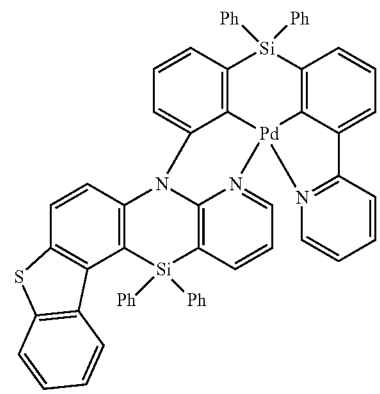
Ph
Ph
Si
Pd
N
N
N
S
Si
Ph
Ph
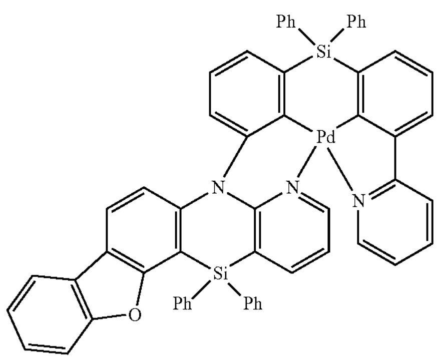
Ph
Ph
Si
Pd
N
N
N
Si
O
Ph
Ph
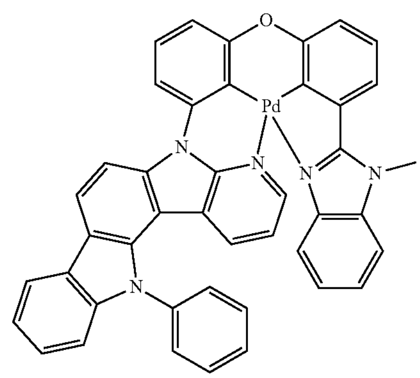
O
Pd
N
N
N
N
N
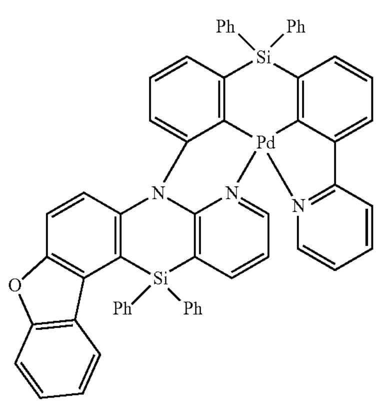
Ph
Ph
Si
Pd
N
N
N
O
Si
Ph
Ph
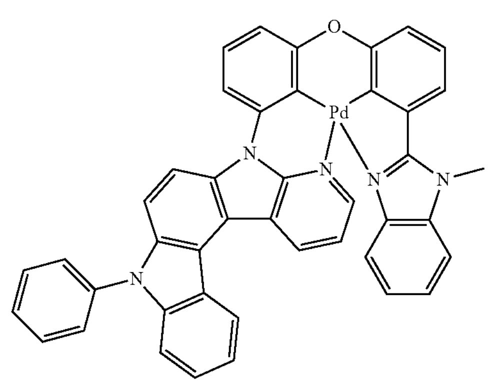
O
Pd
N
N
N
N
N -continued
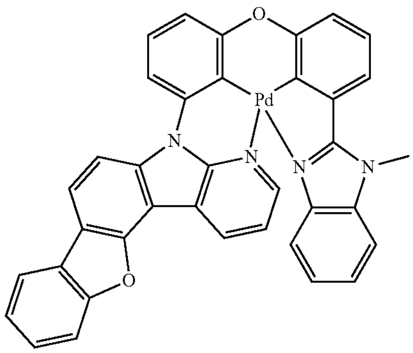
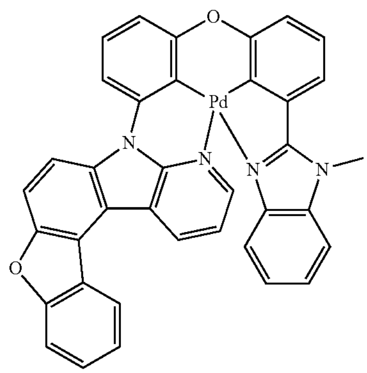
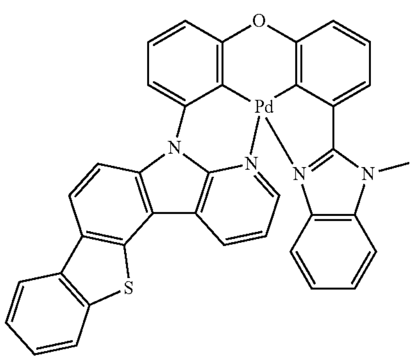
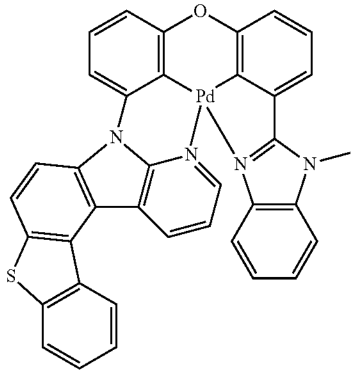
-continued
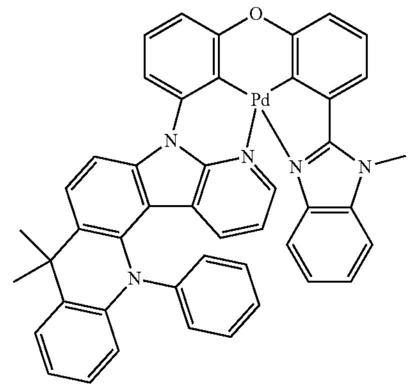
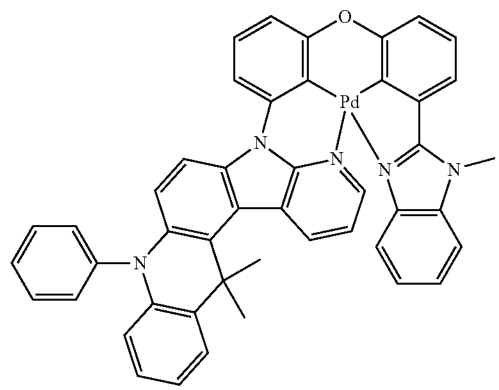
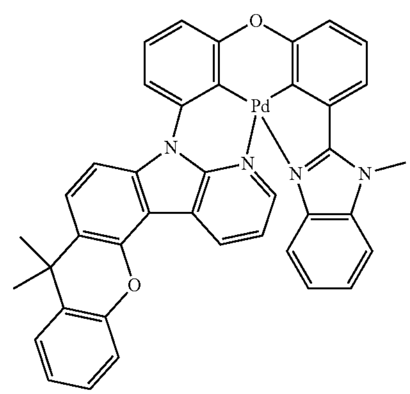
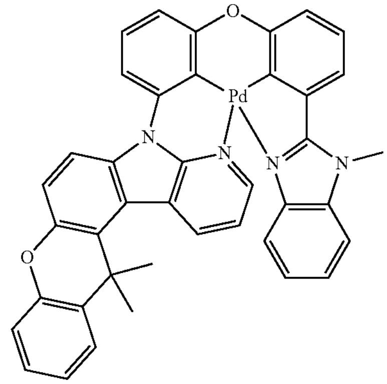

-continued
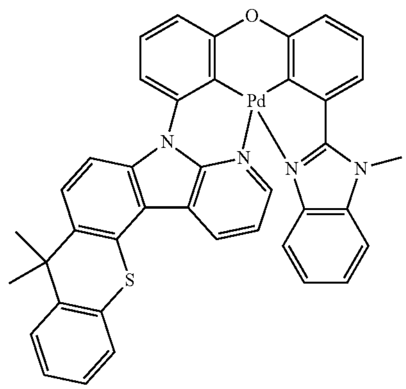
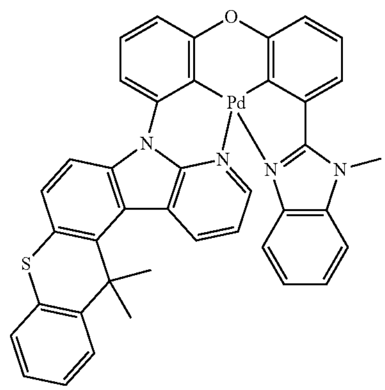
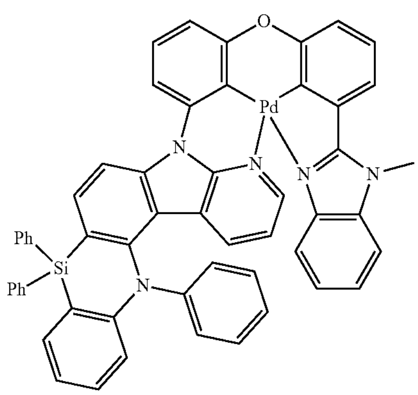
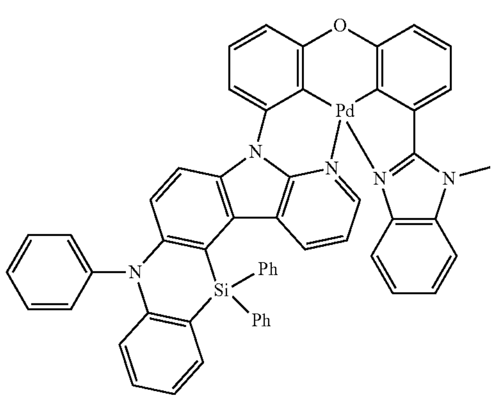
-continued
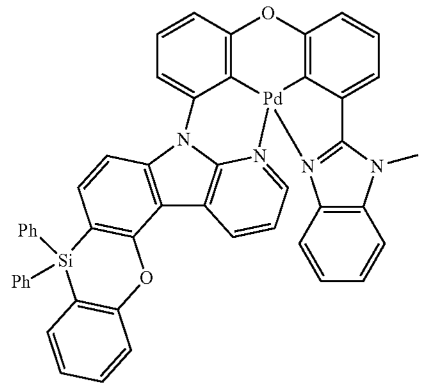
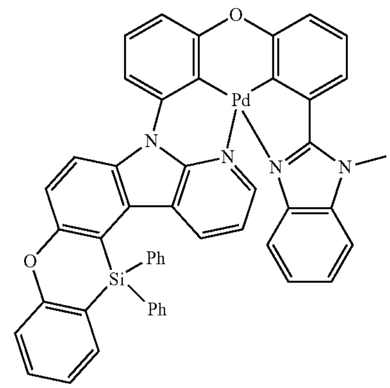
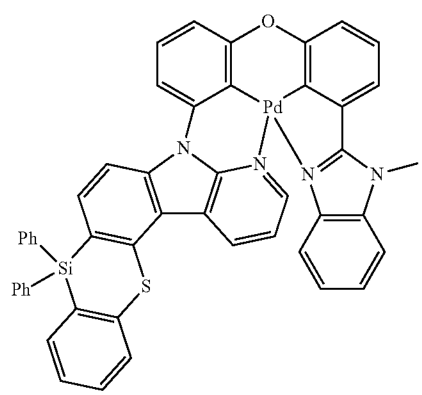
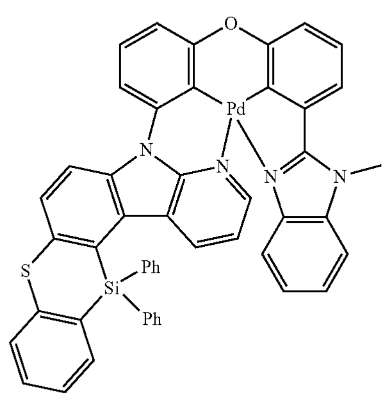

-continued
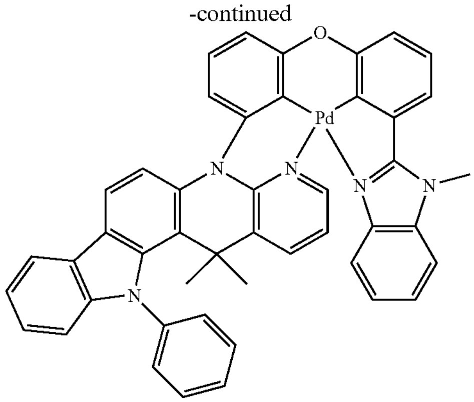
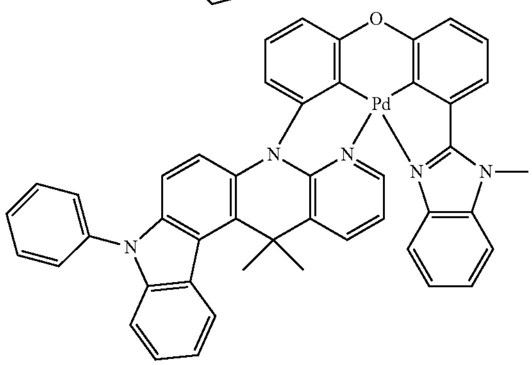
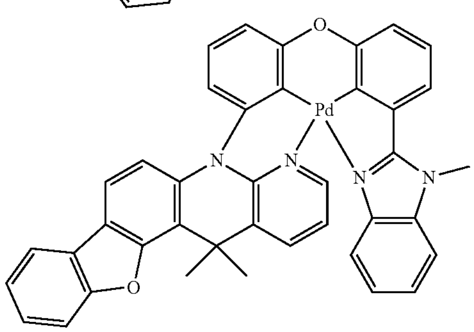
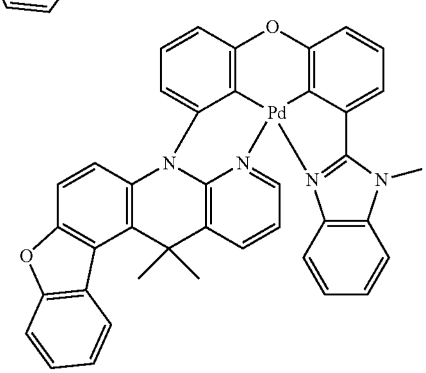
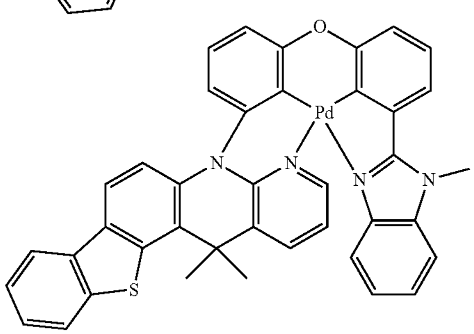
-continued
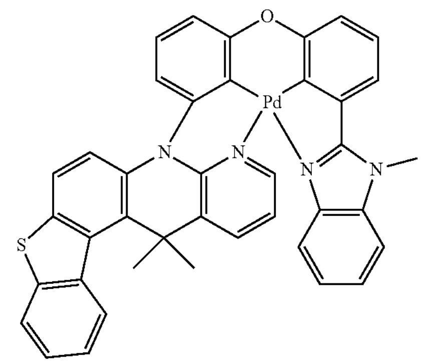
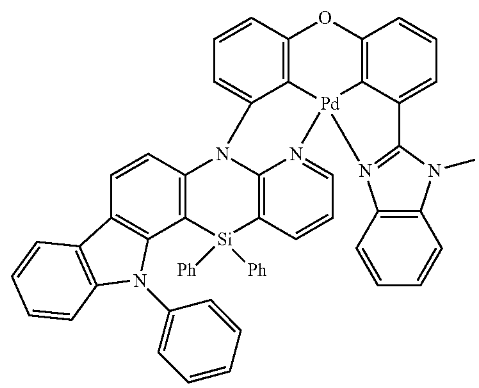
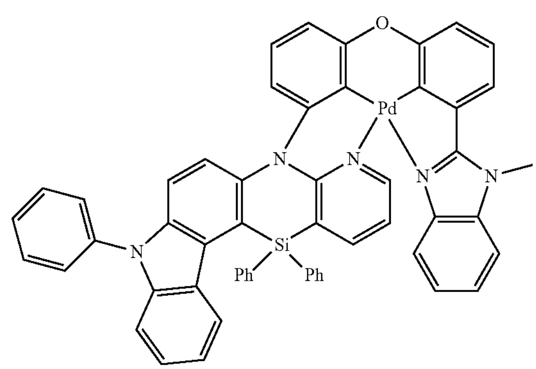
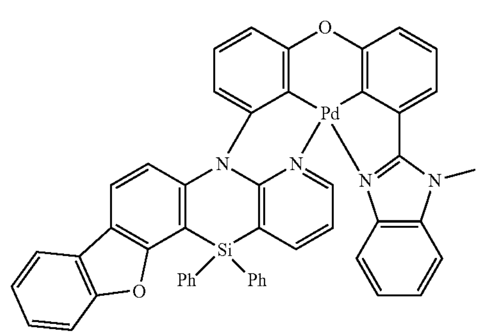

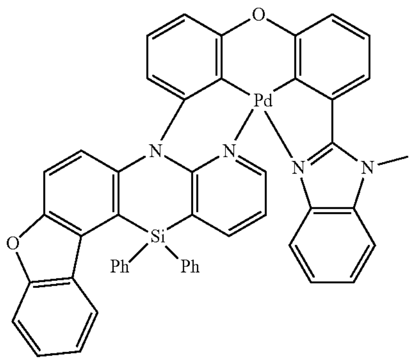
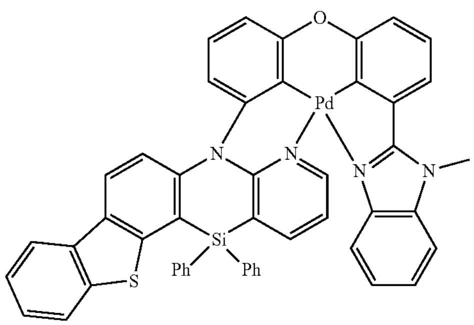
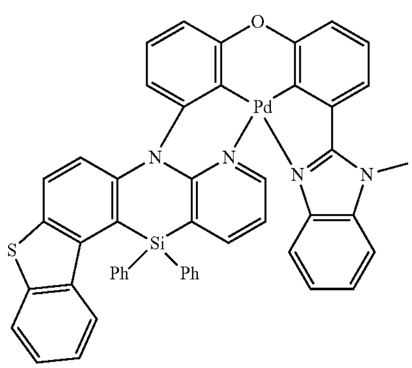
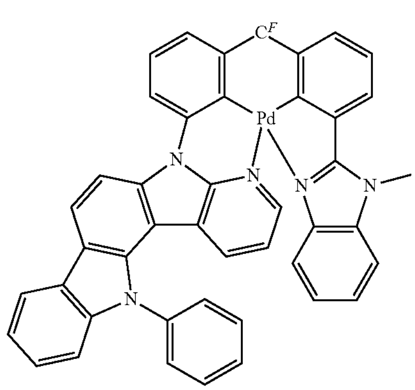
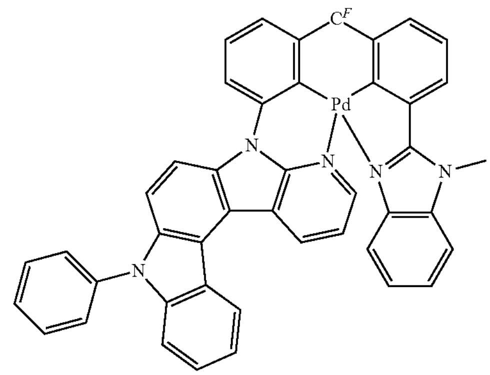
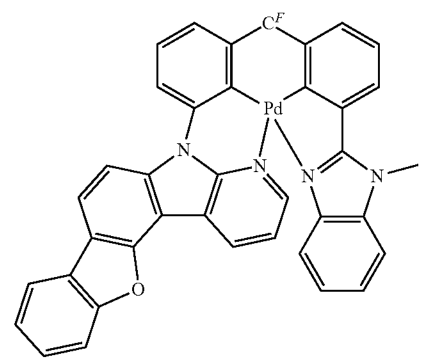
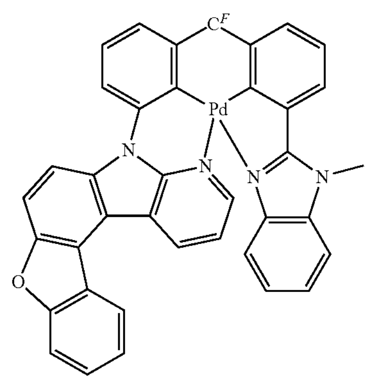
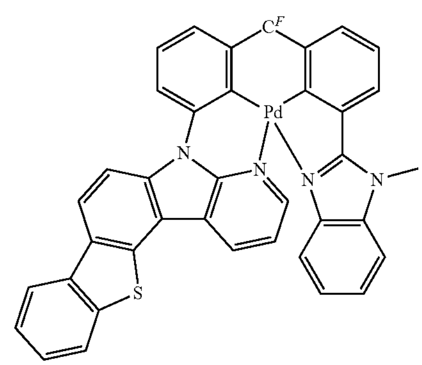

-continued
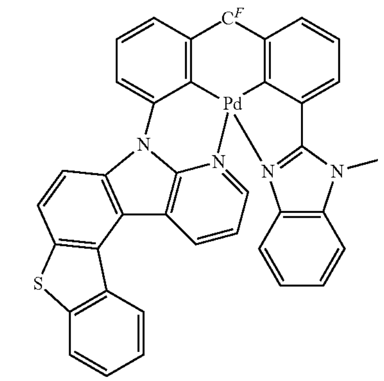
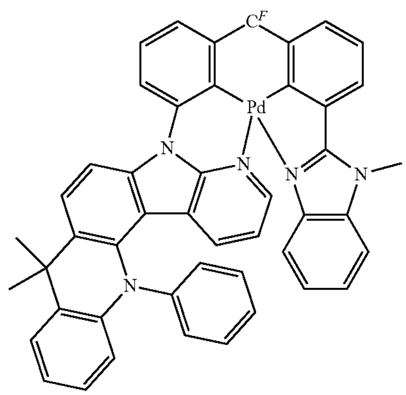
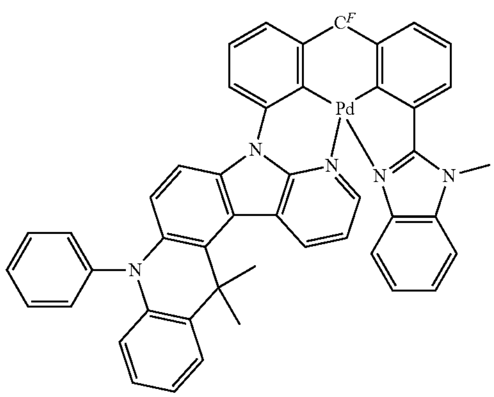
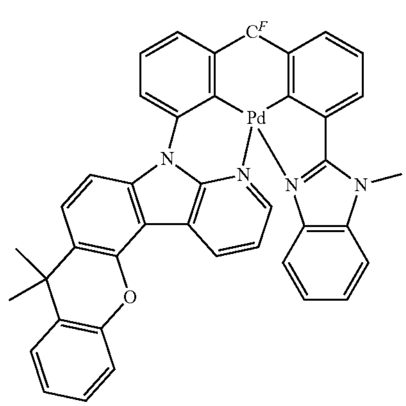
-continued
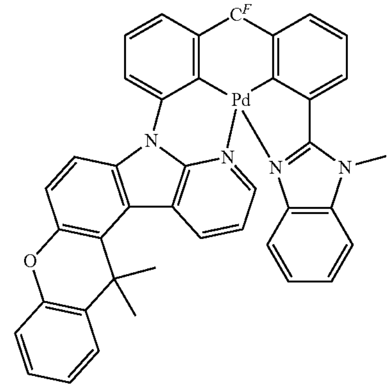
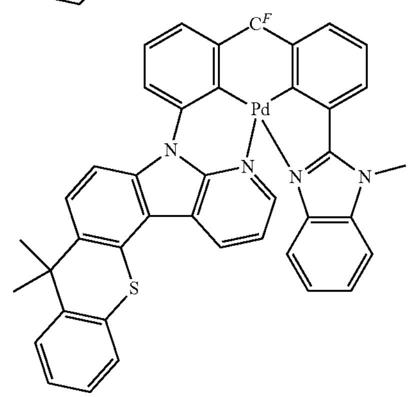
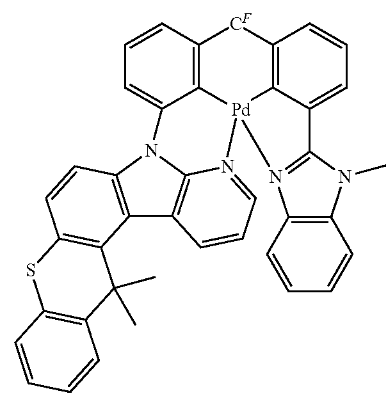
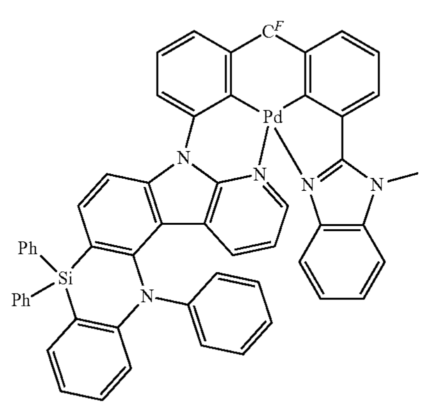

-continued
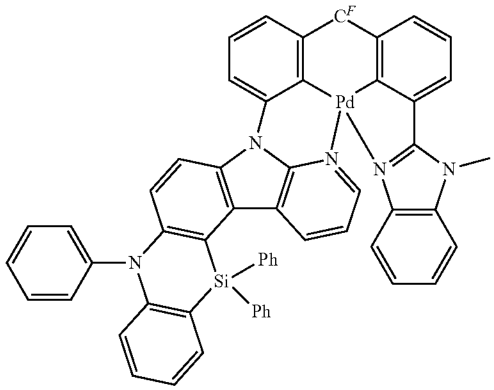
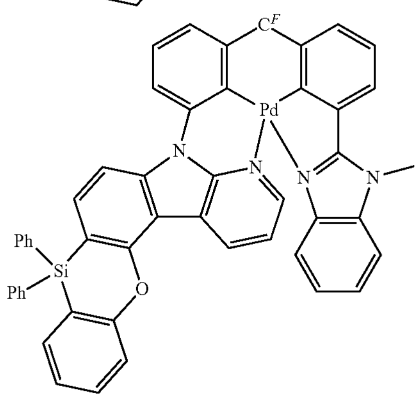
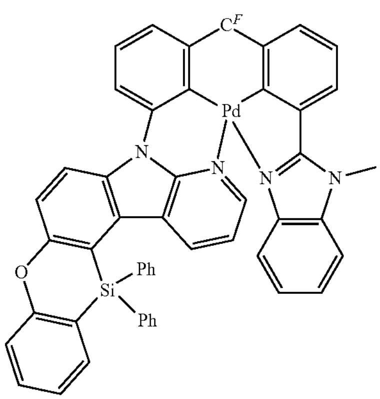
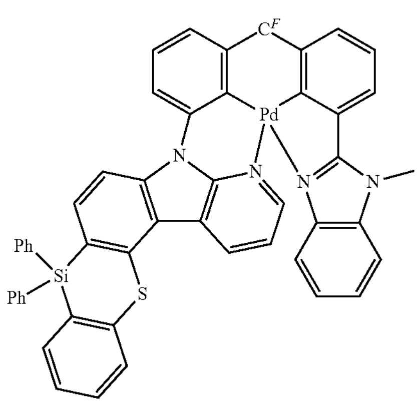
-continued
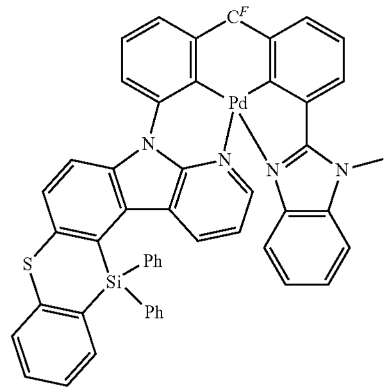
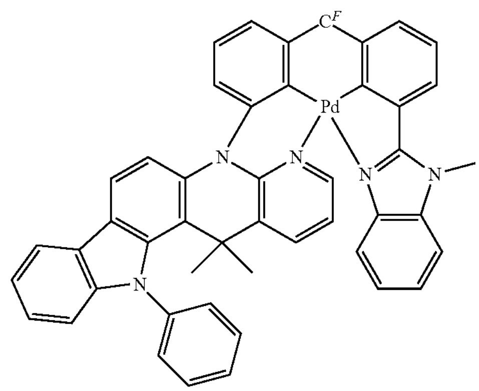
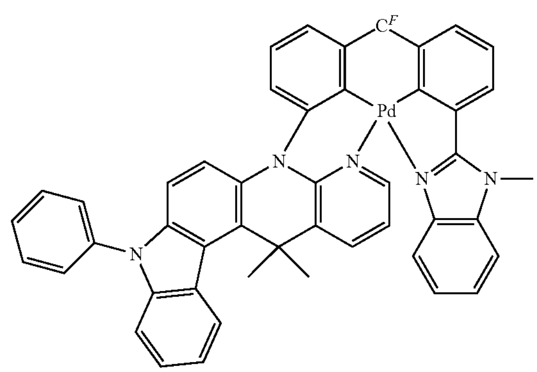
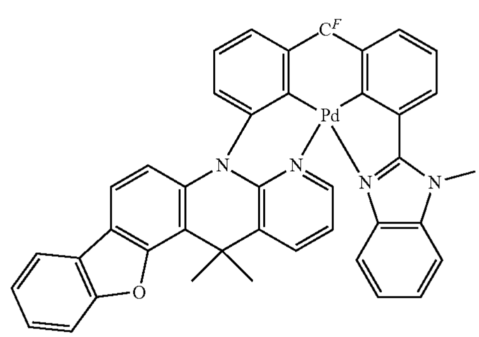

-continued
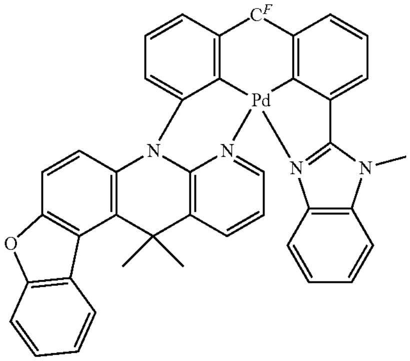
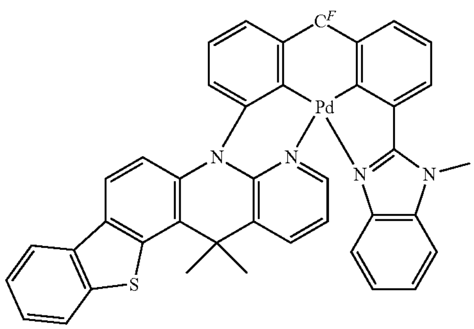
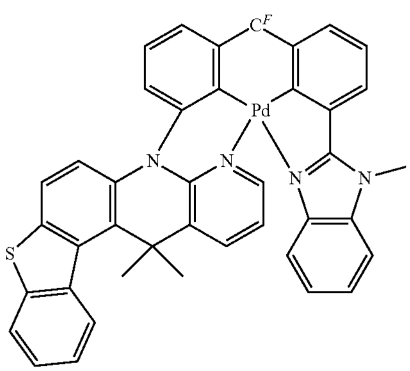
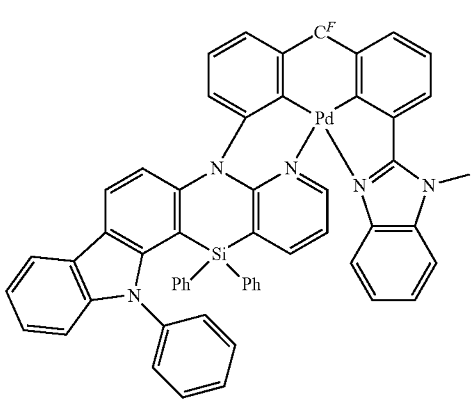
-continued
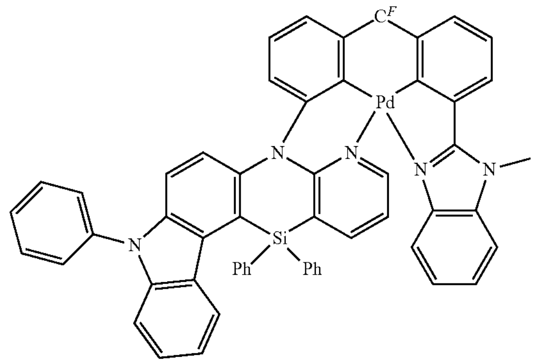
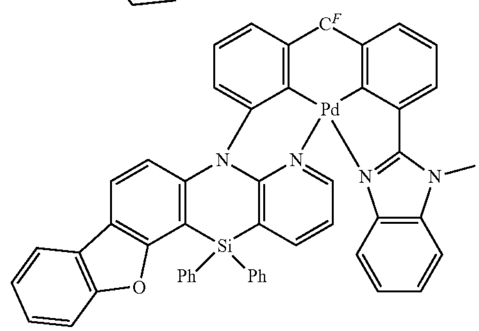
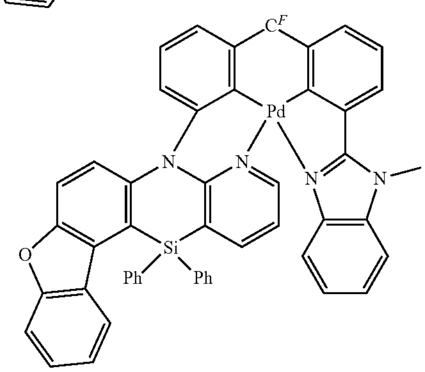
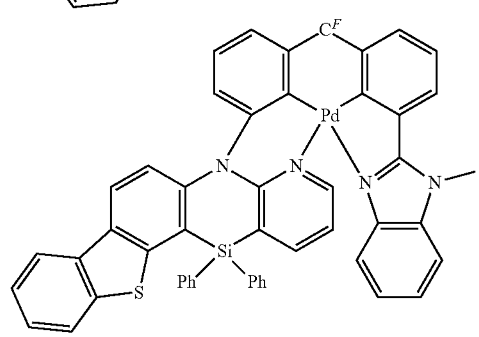
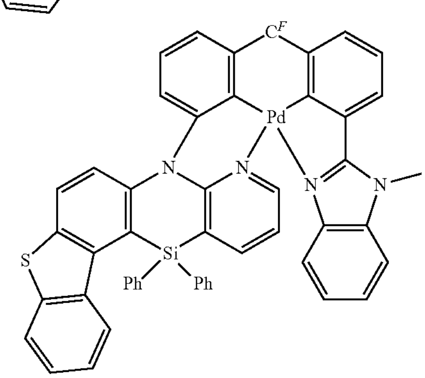

-continued
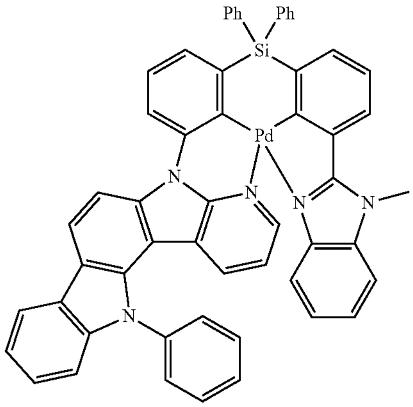
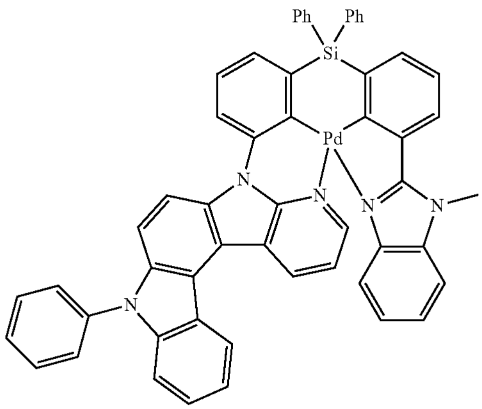
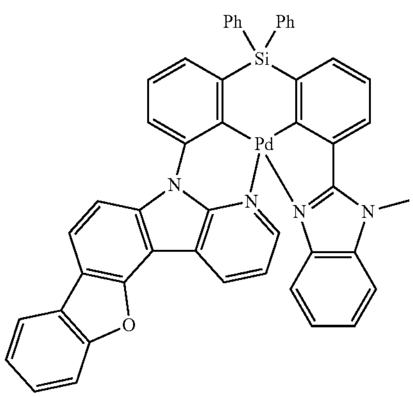
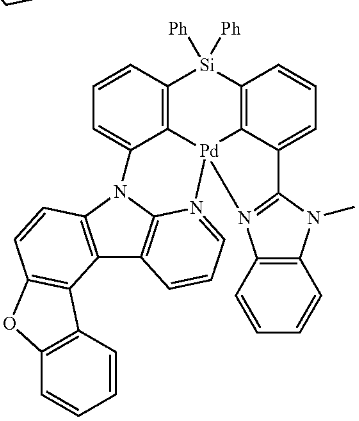
-continued
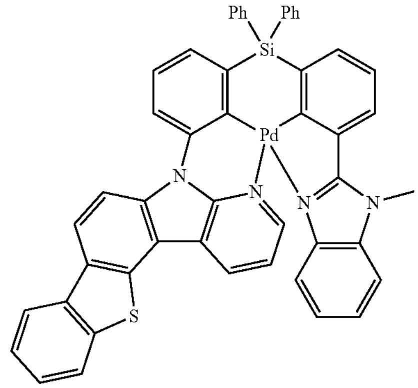
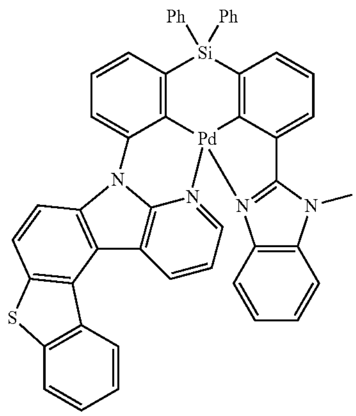
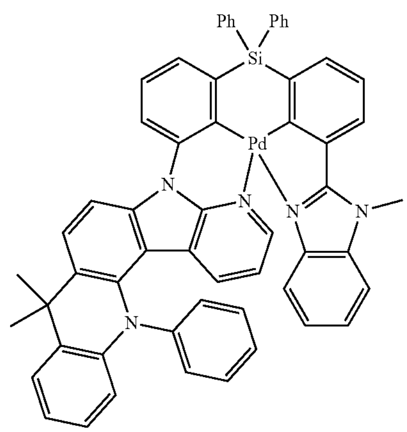
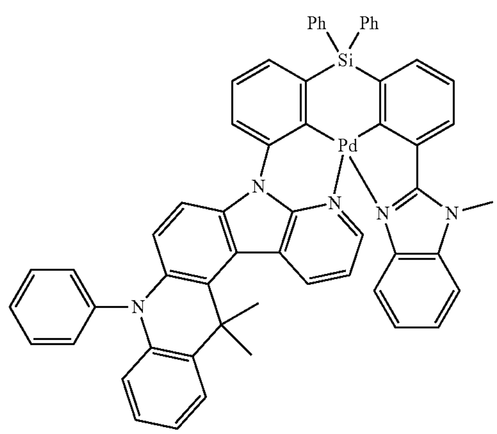

-continued
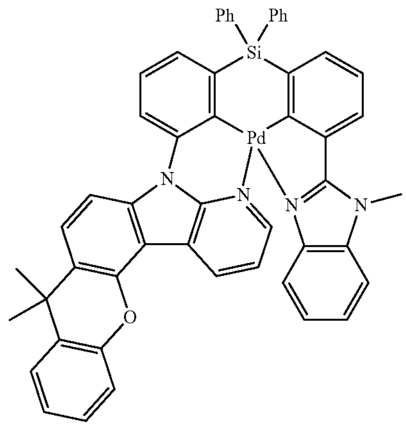
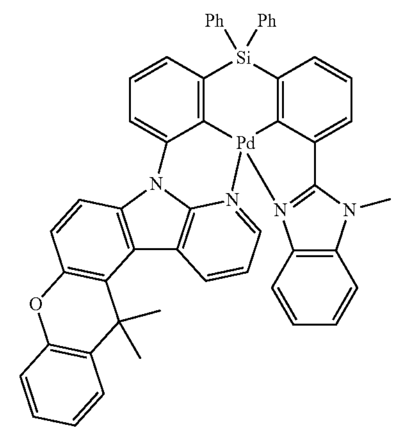
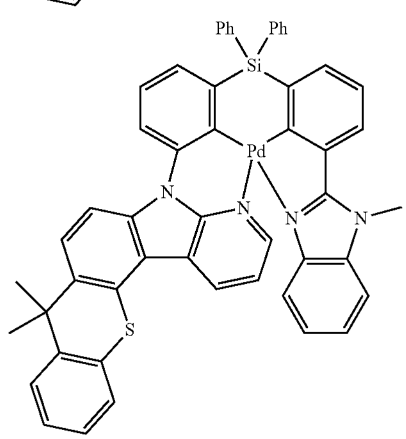
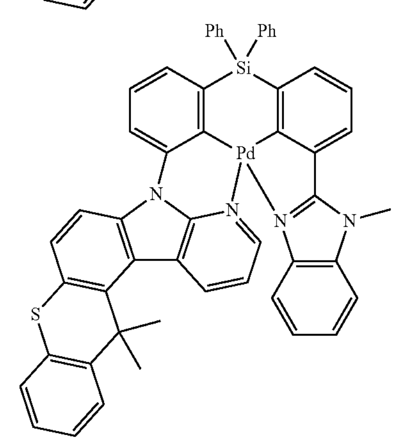
-continued
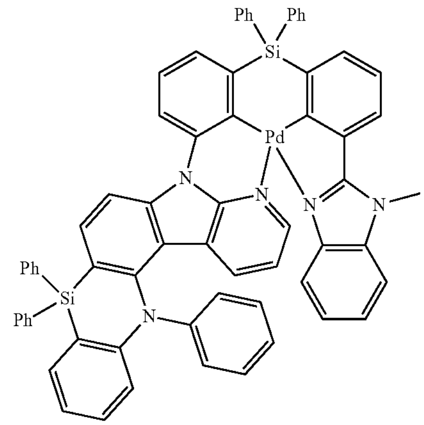
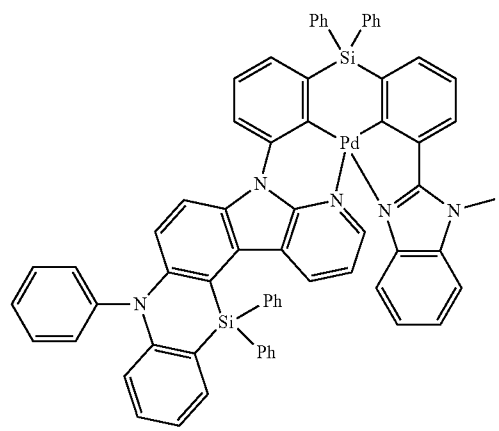
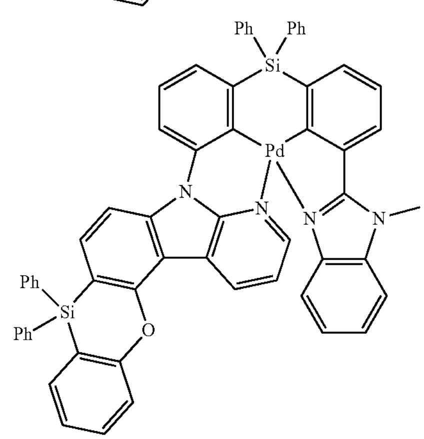
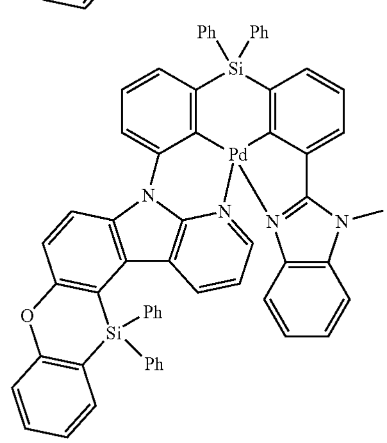

-continued
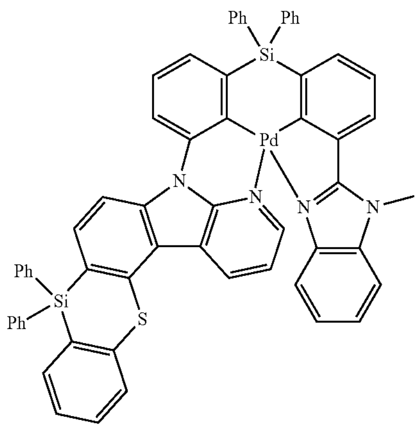
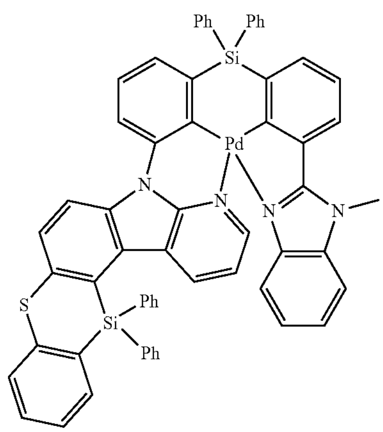
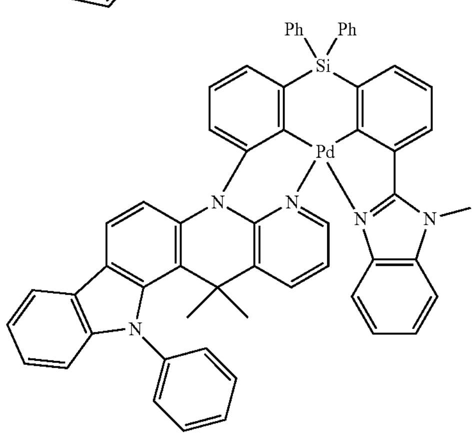
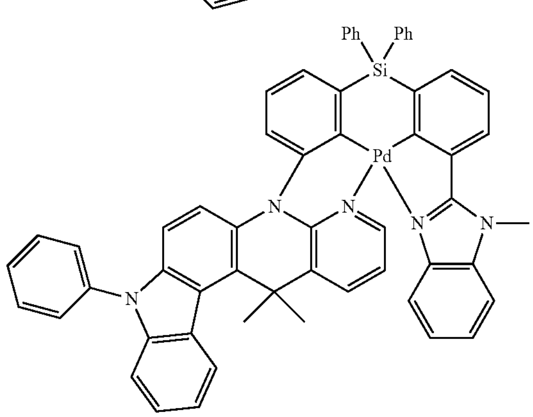
-continued
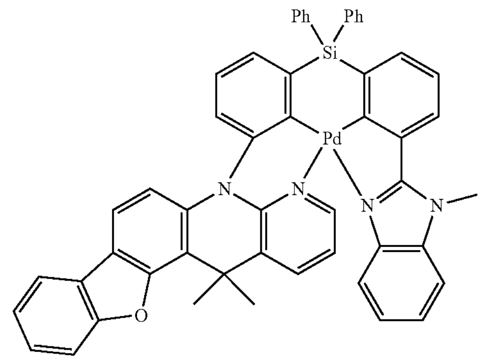
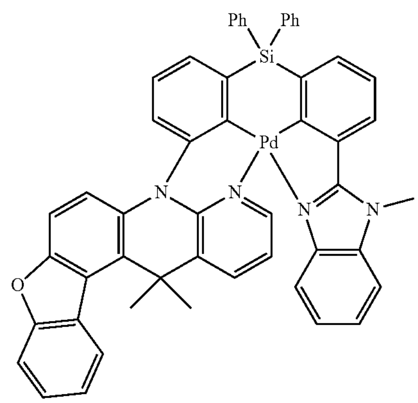
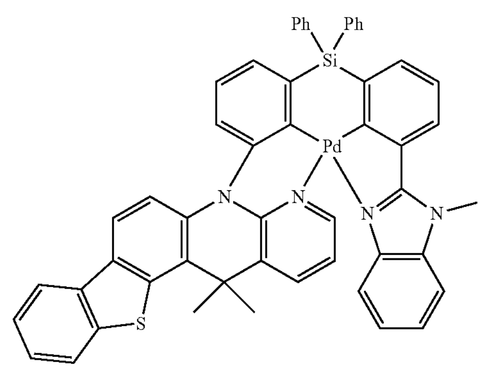
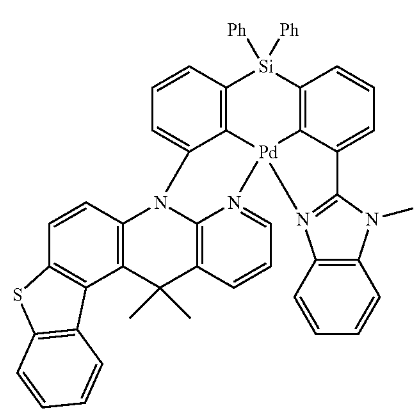

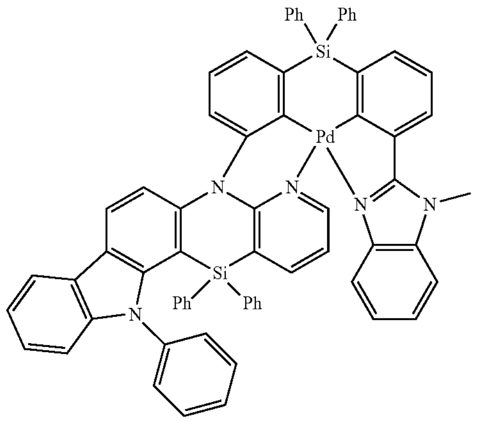
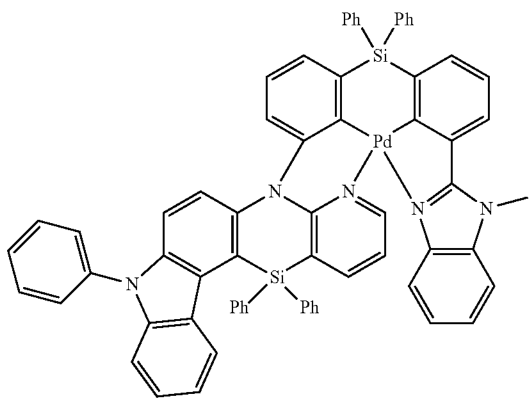
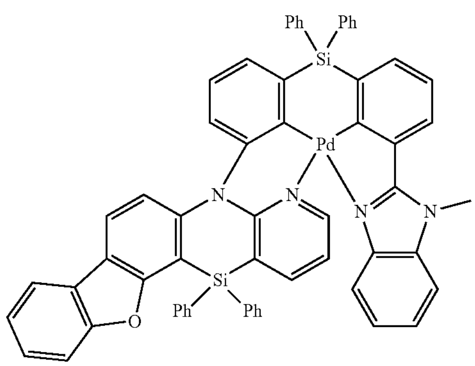
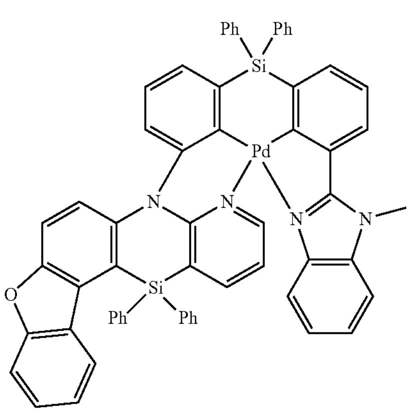
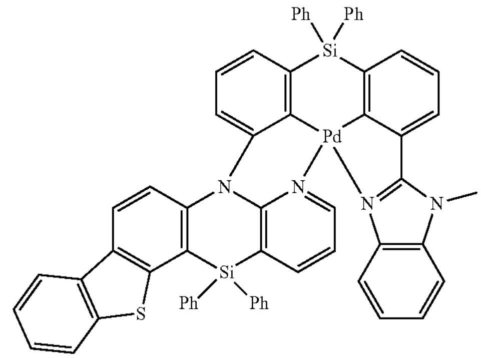
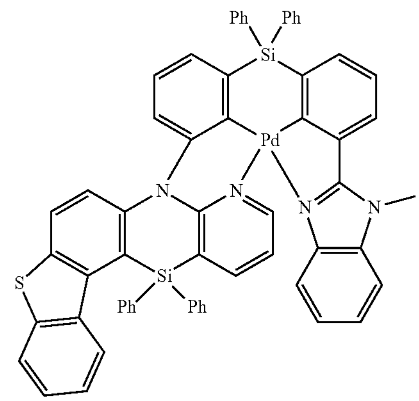
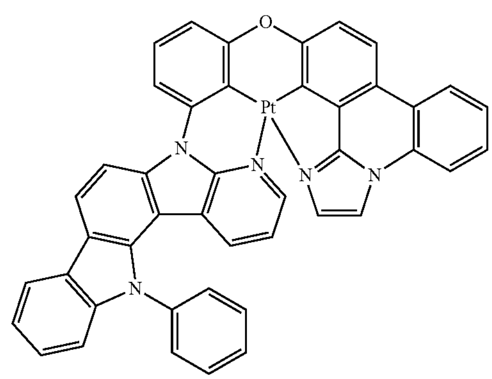
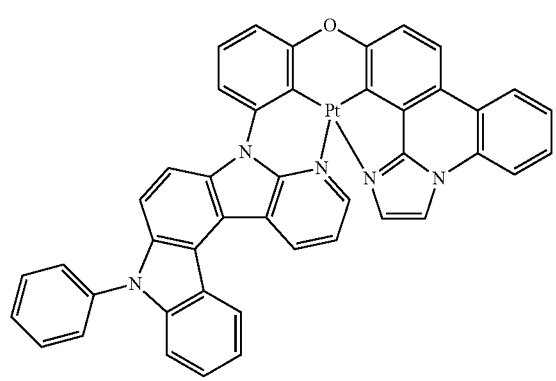

-continued
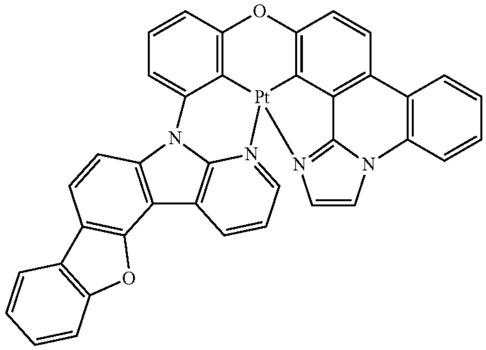
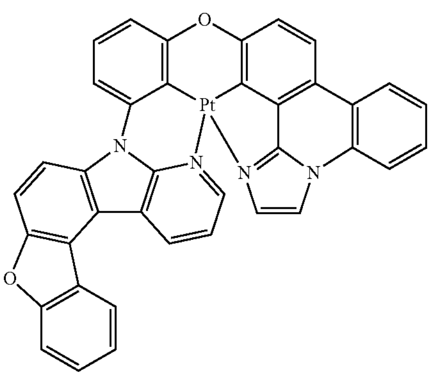
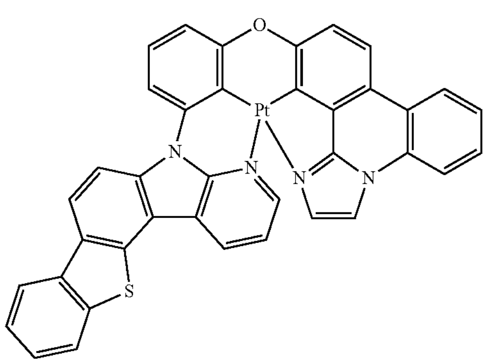
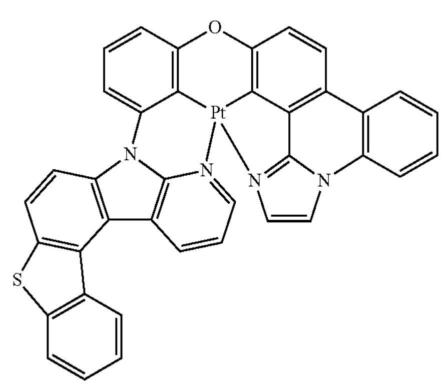
-continued
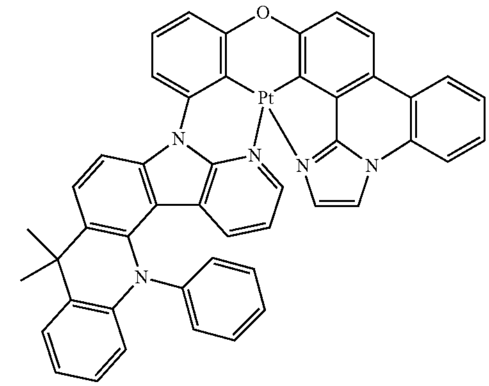
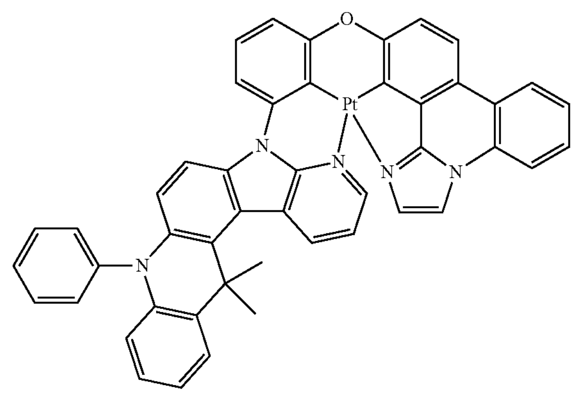
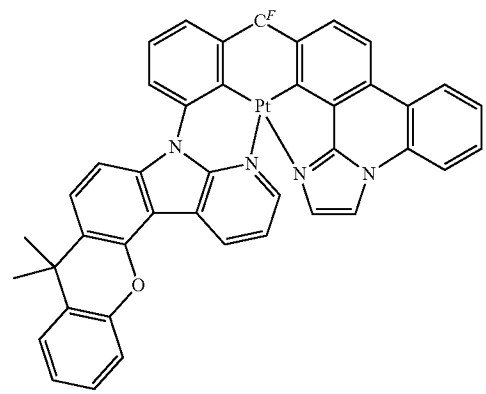
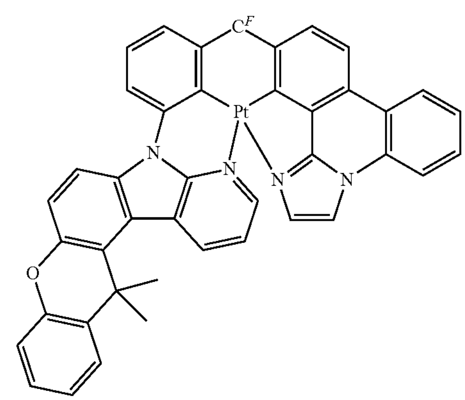

-continued
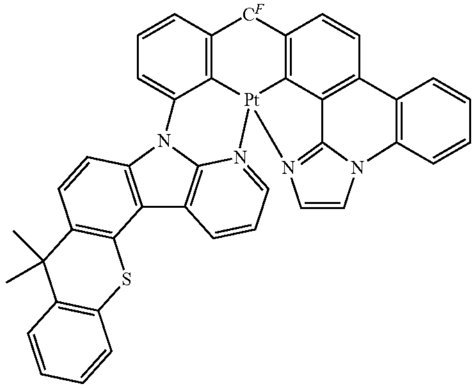
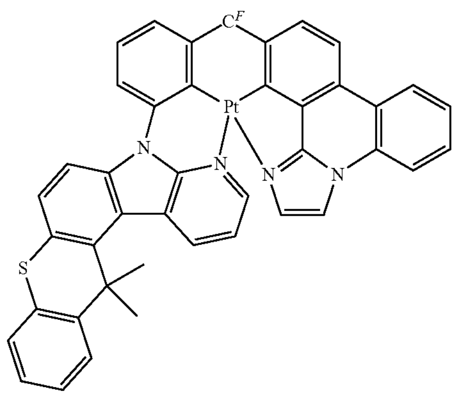
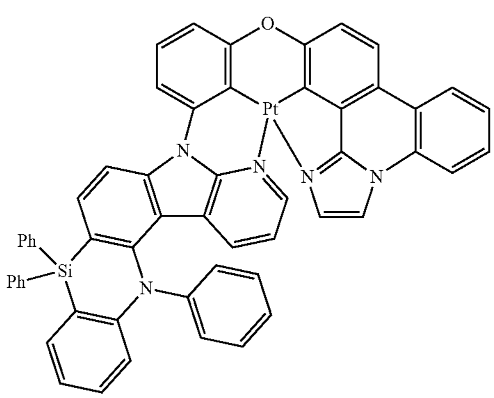
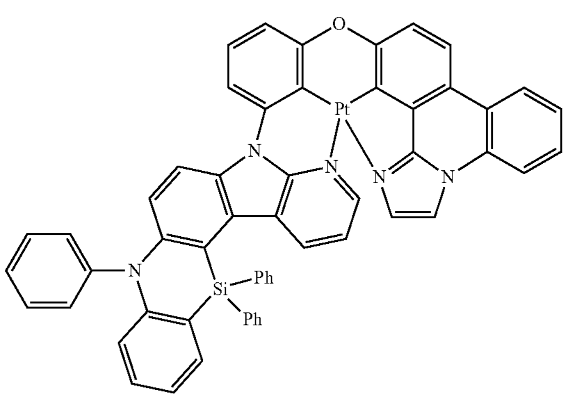
-continued
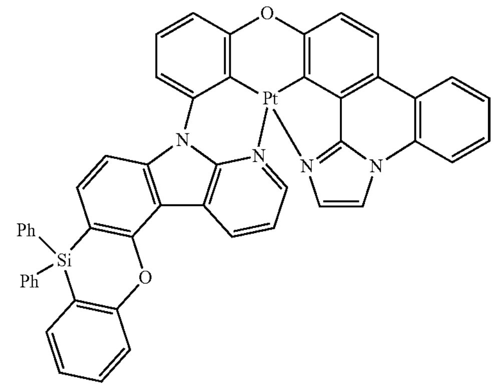
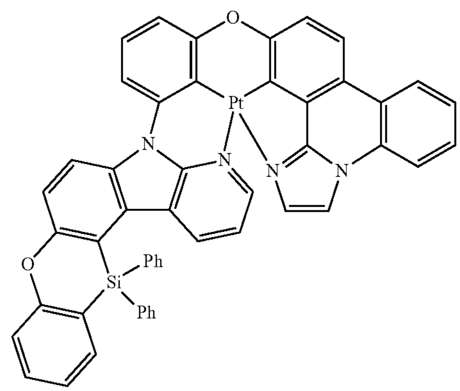
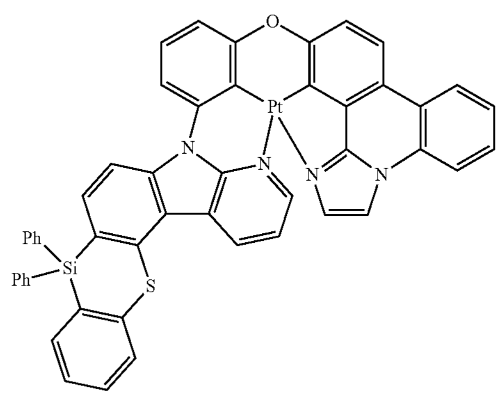
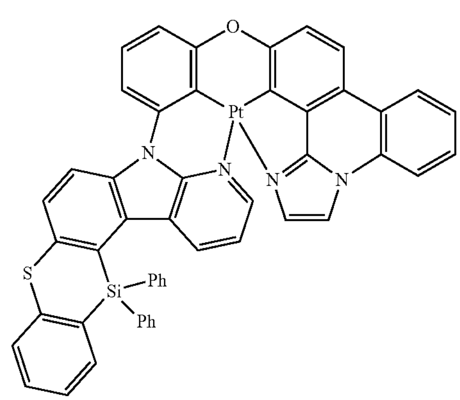

-continued
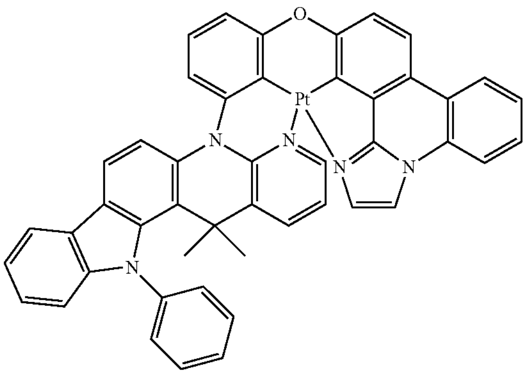
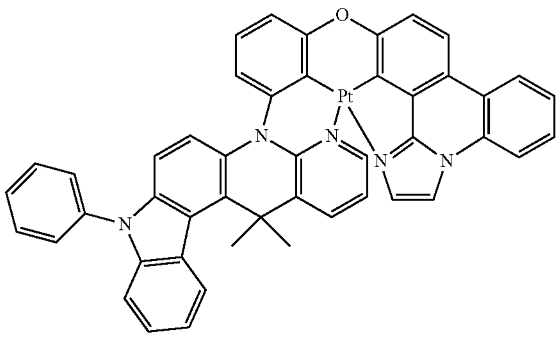
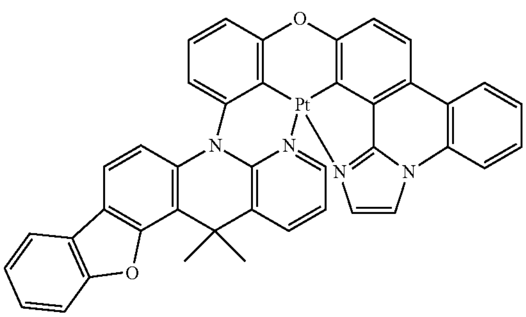
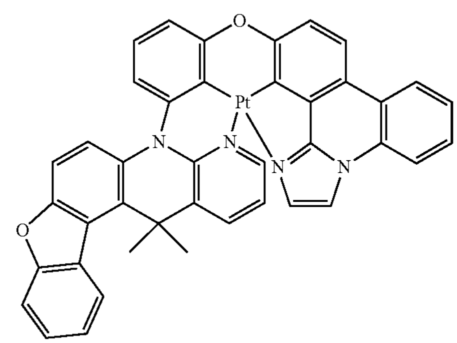
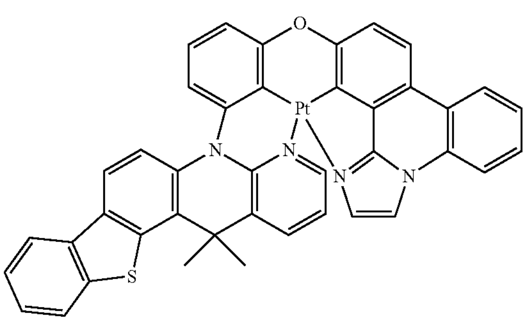
-continued
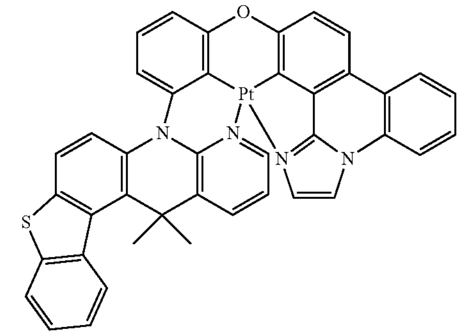
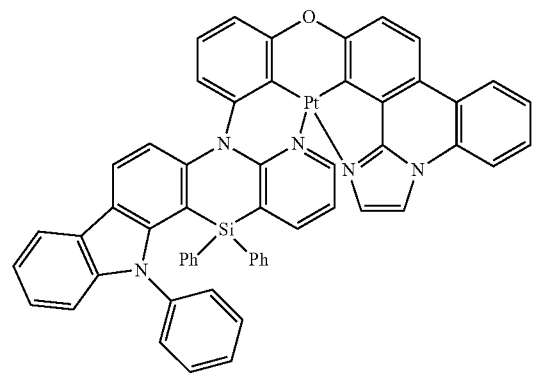
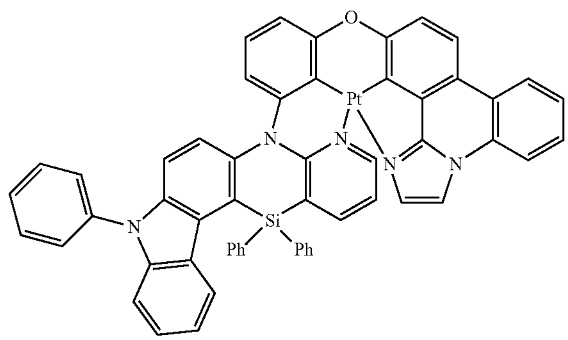
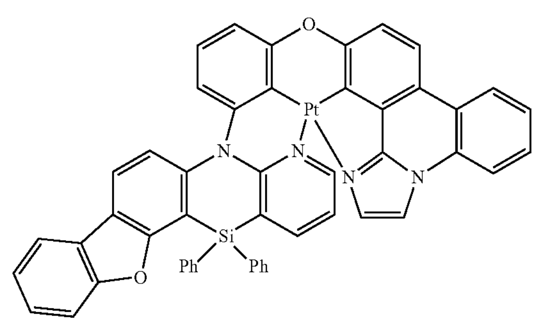
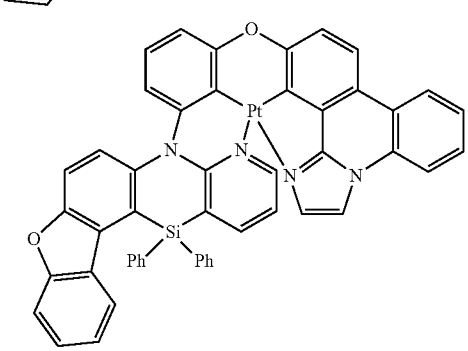

-continued
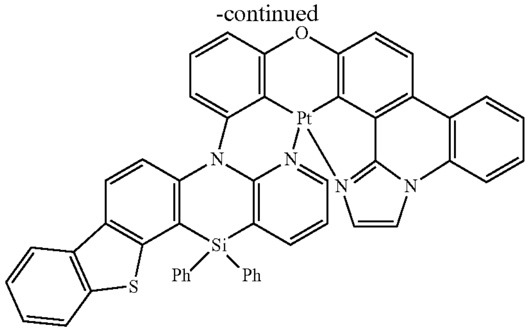
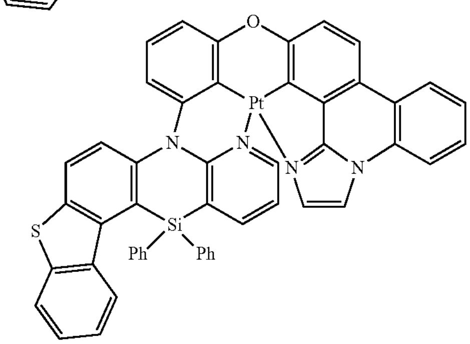
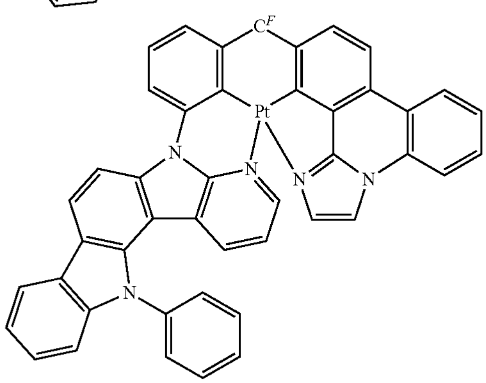
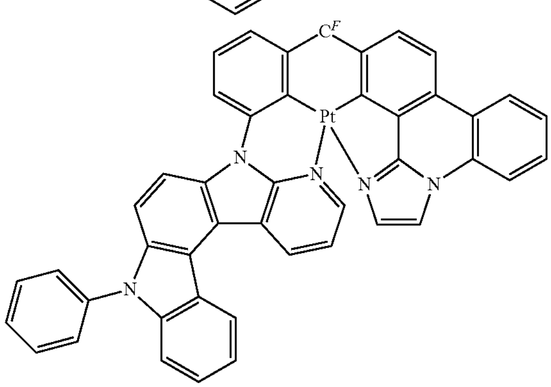
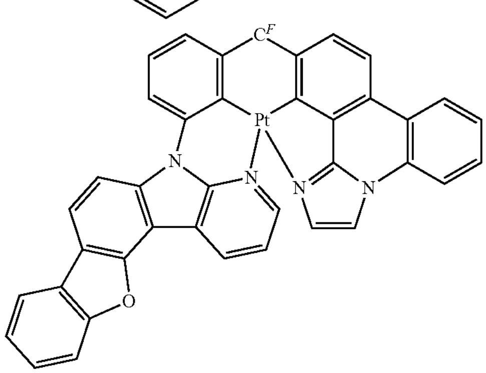
-continued
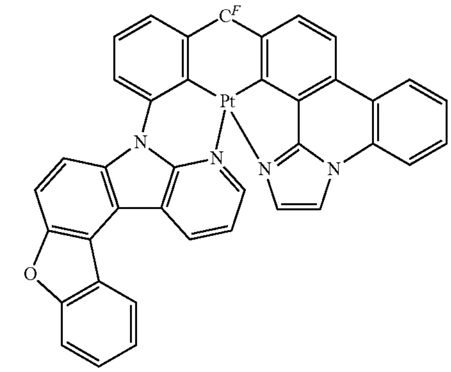
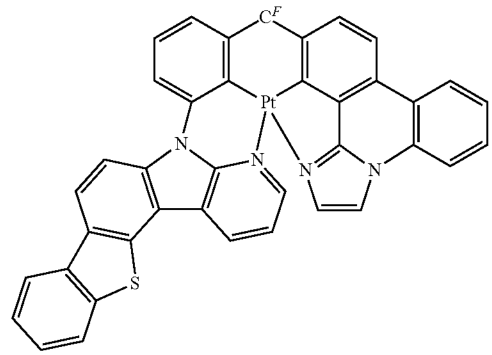
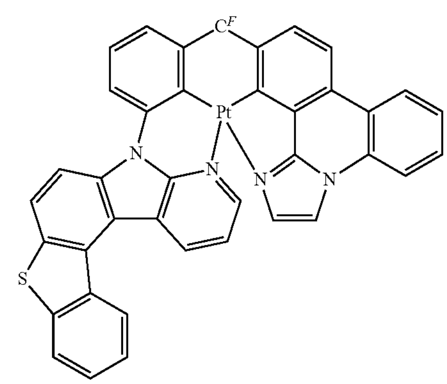
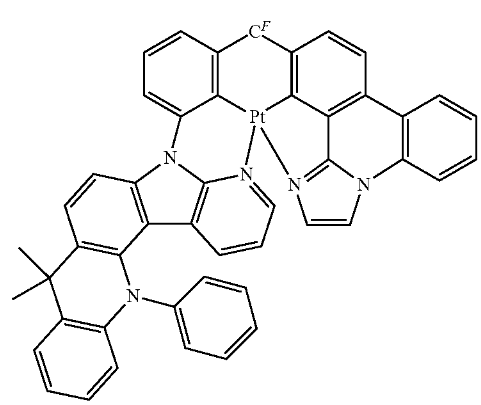

-continued
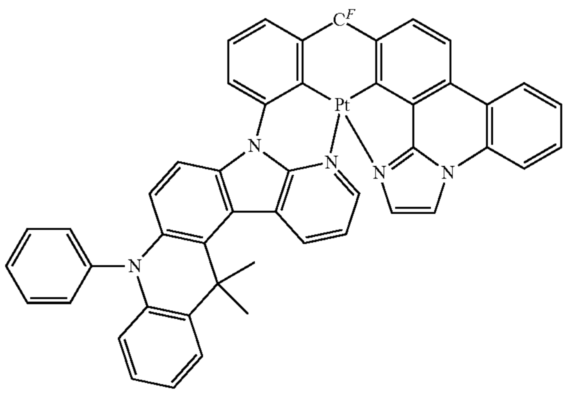
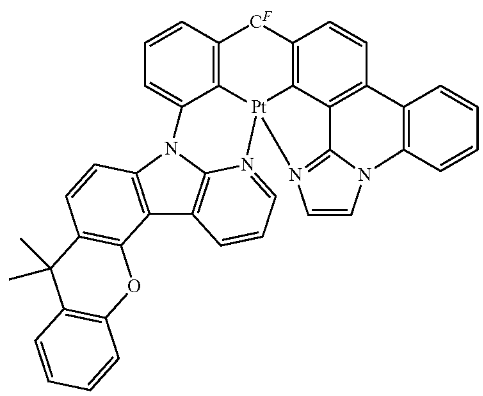
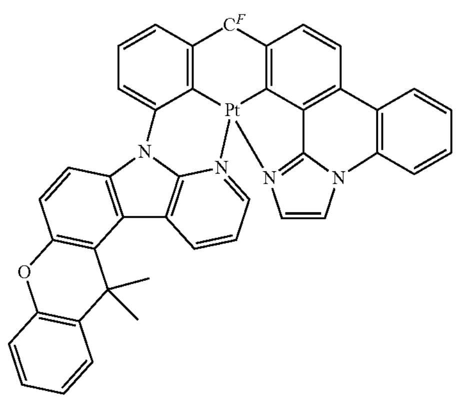
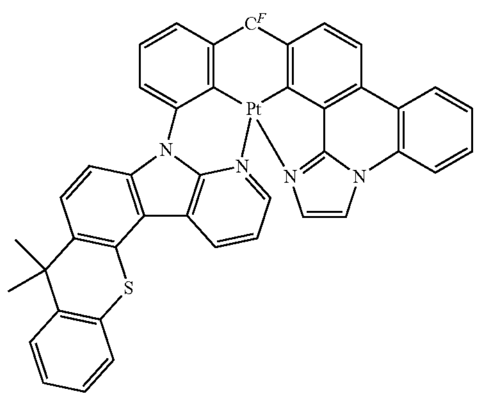
-continued
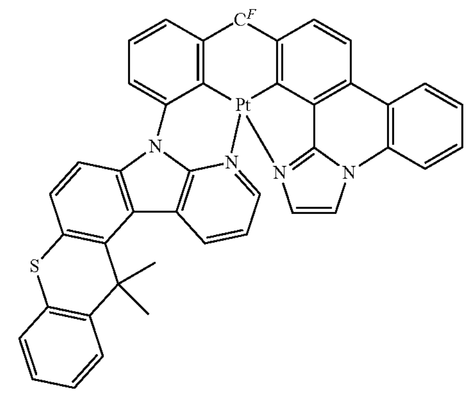
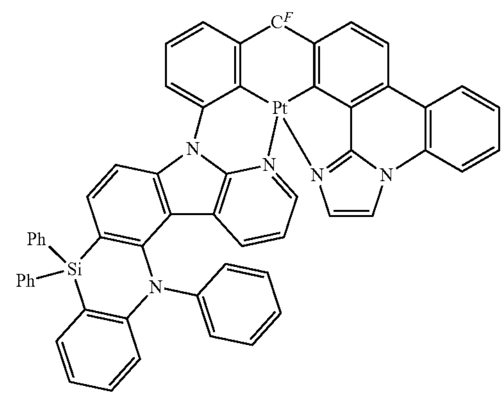
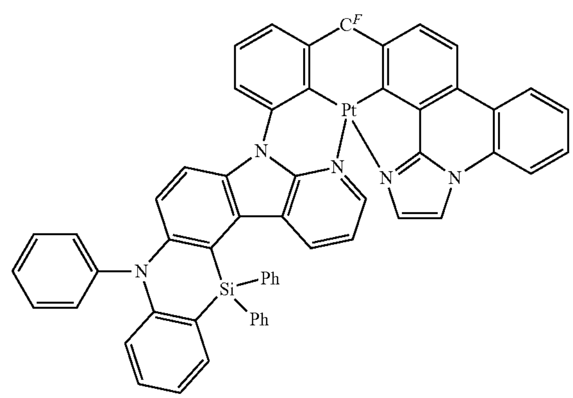
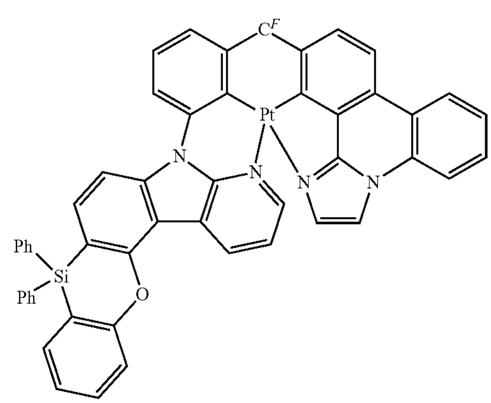

-continued
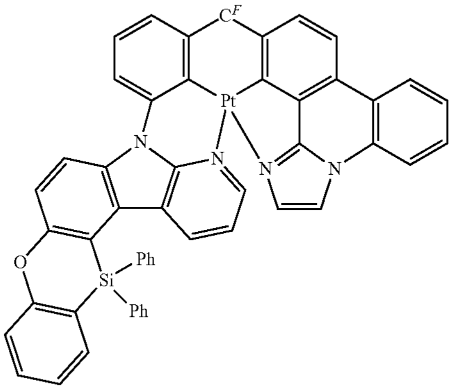
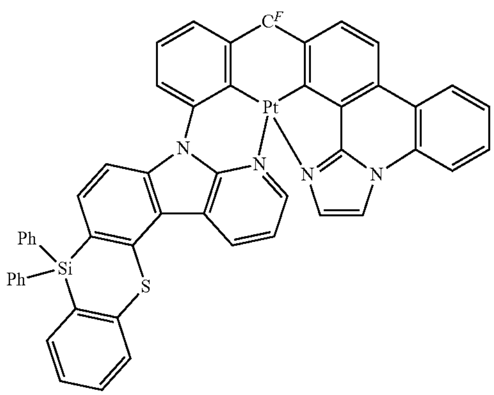
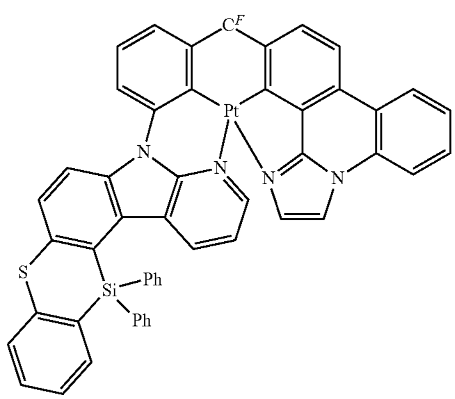
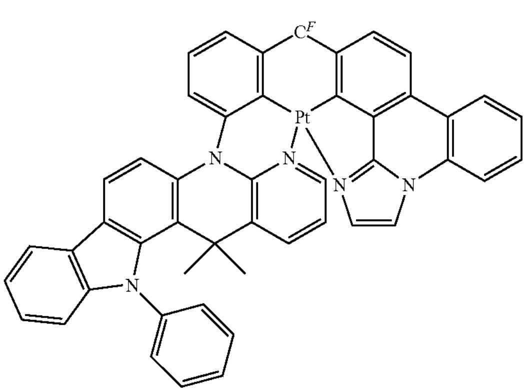
-continued
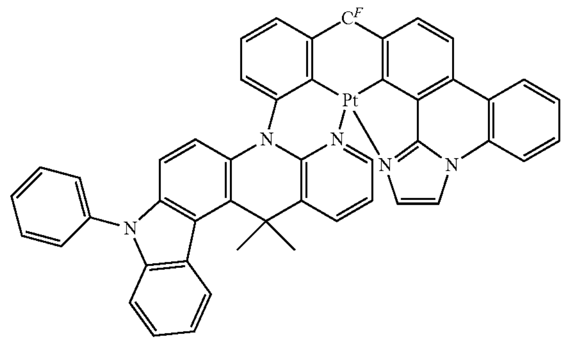
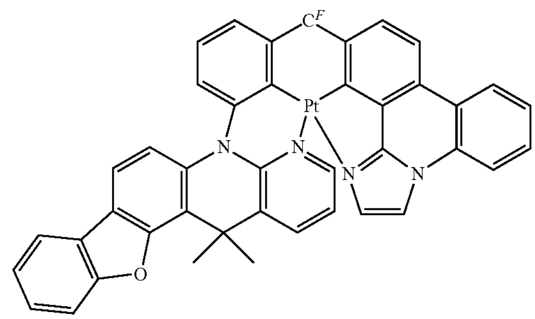
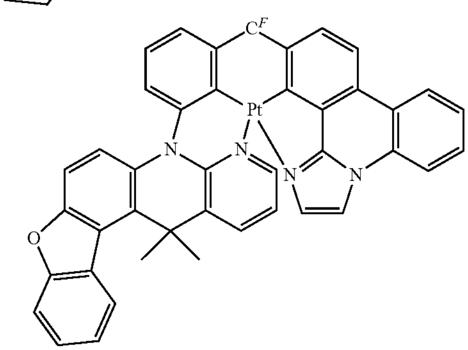
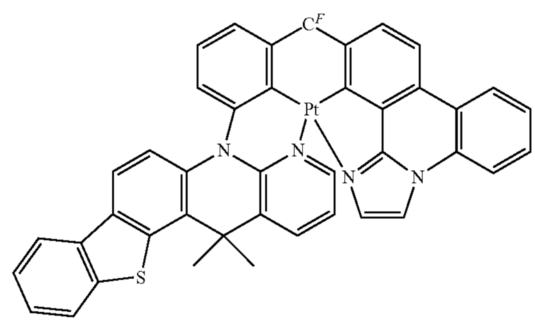
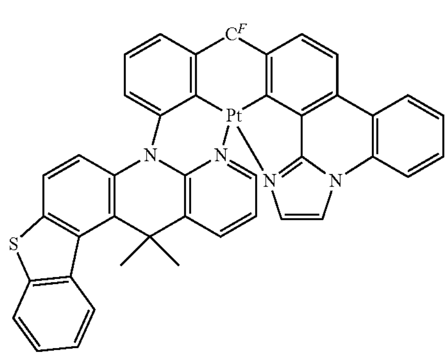

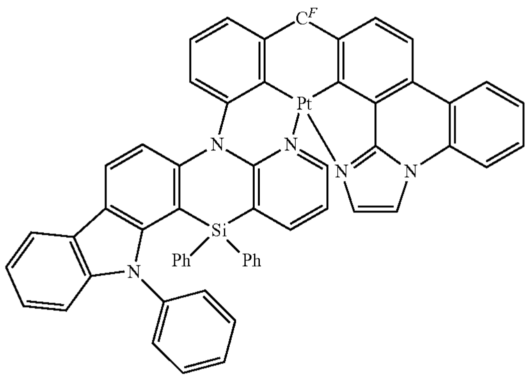
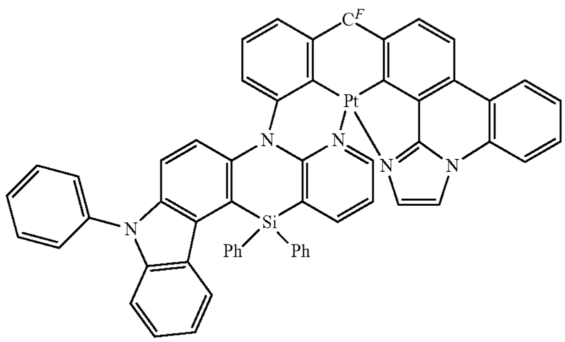
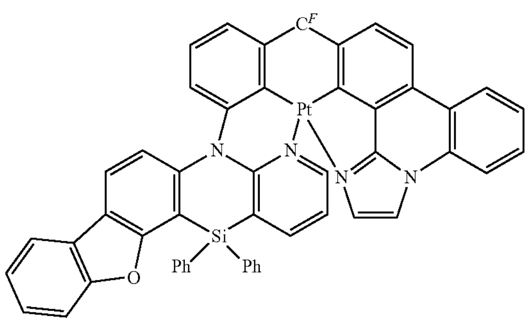
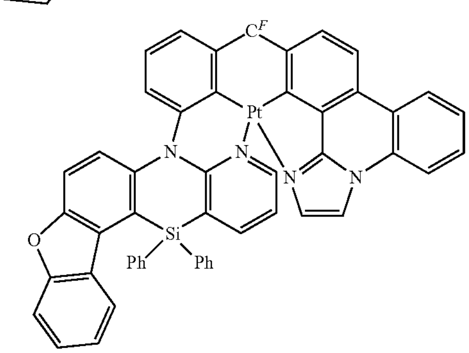
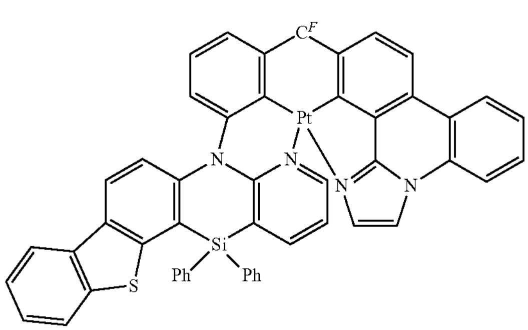
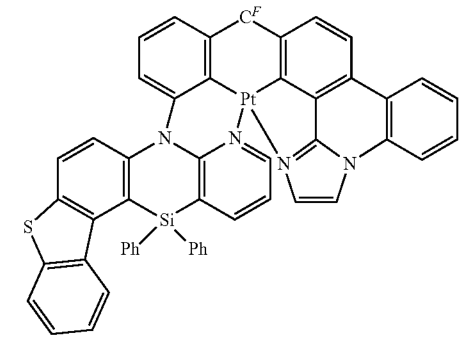
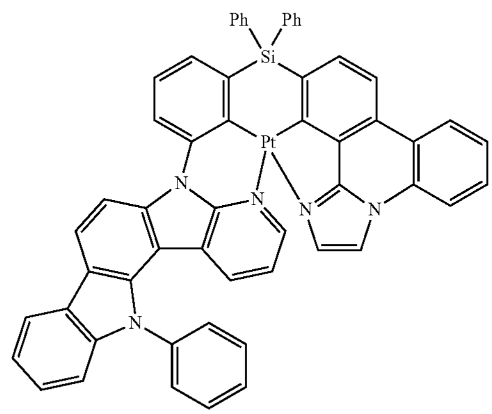
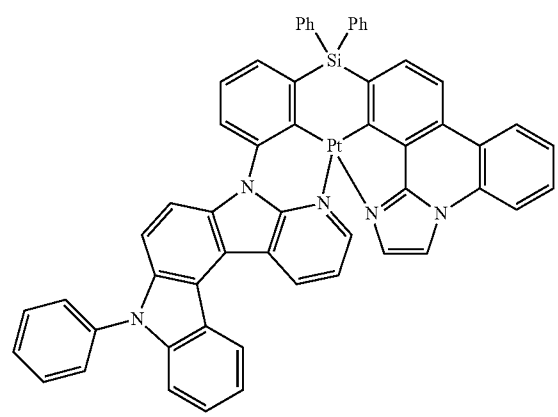
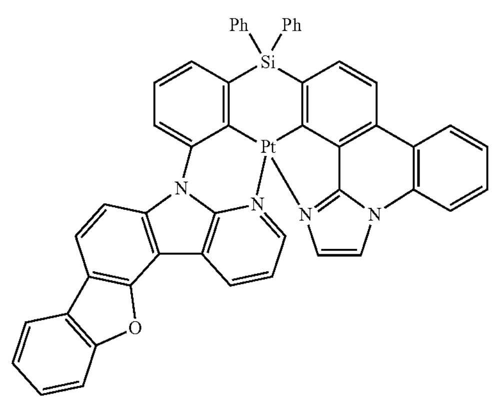

-continued
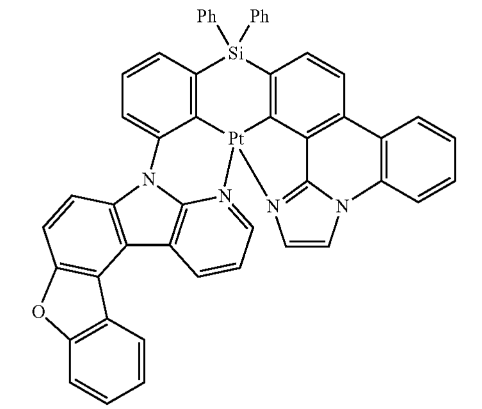
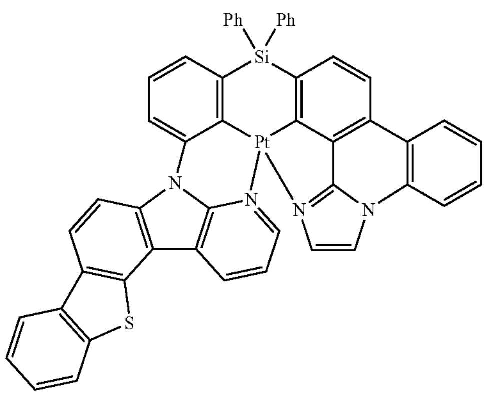
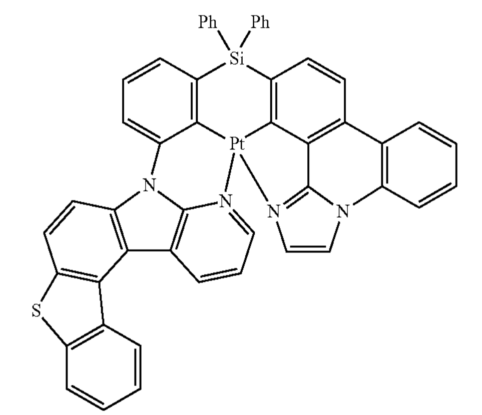
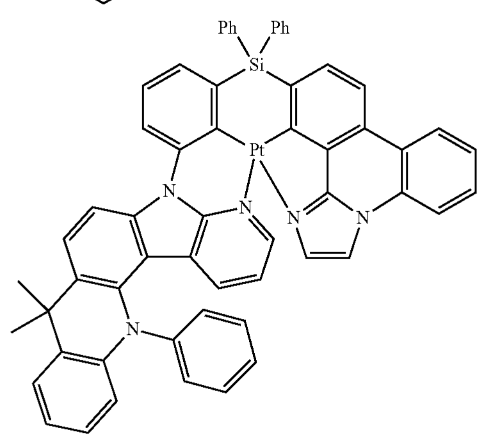
-continued
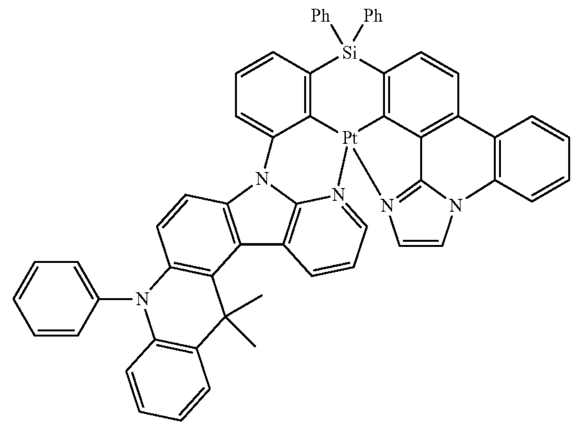
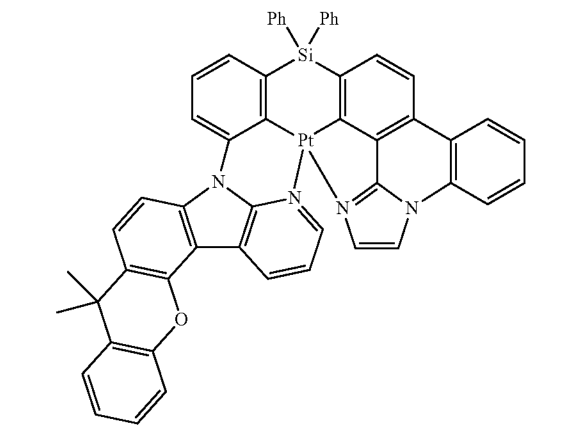
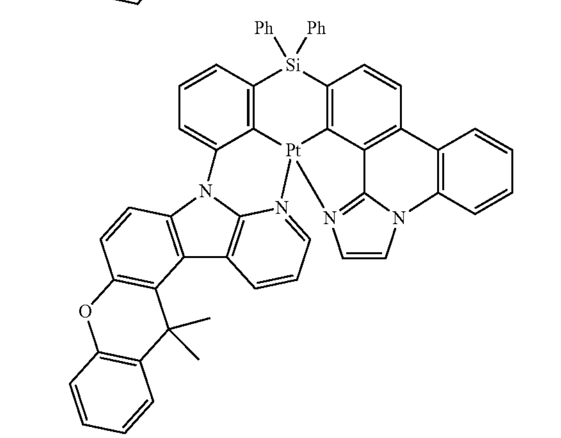
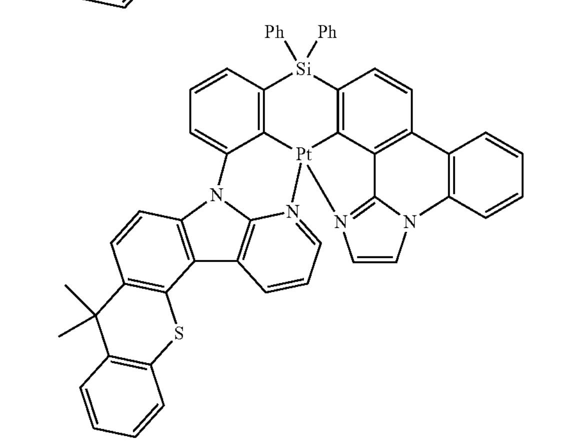

-continued
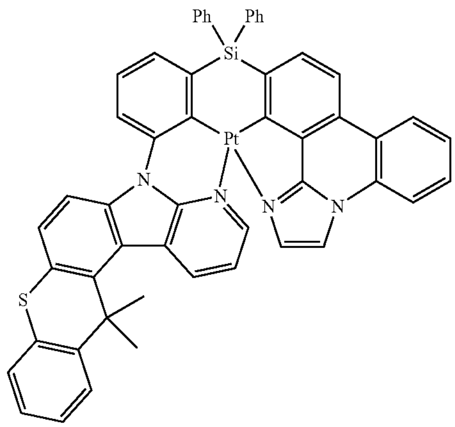
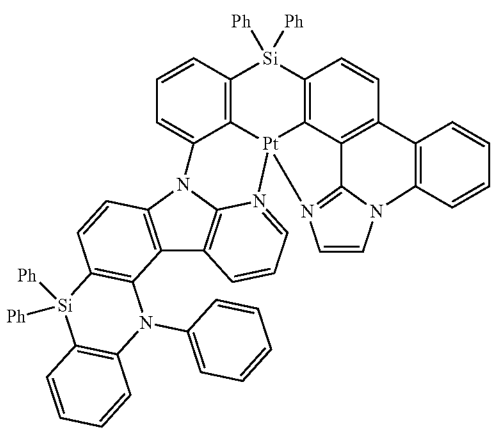
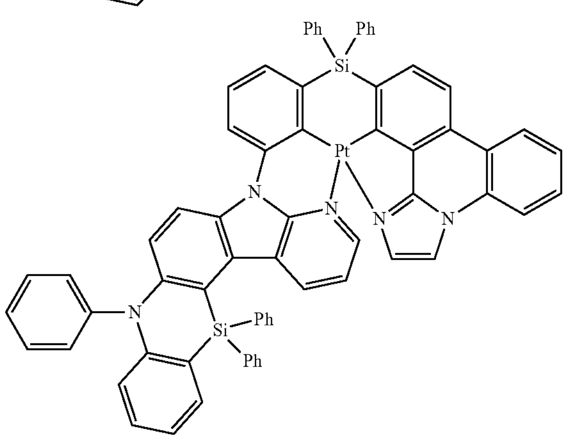
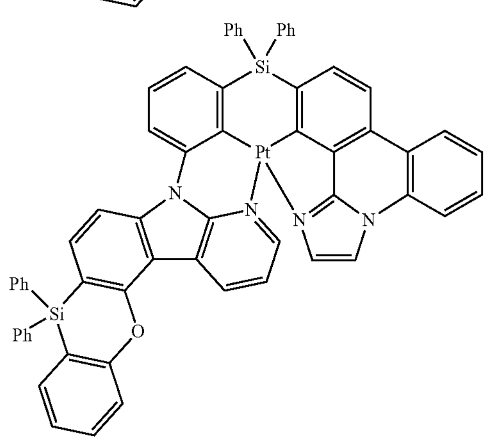
-continued
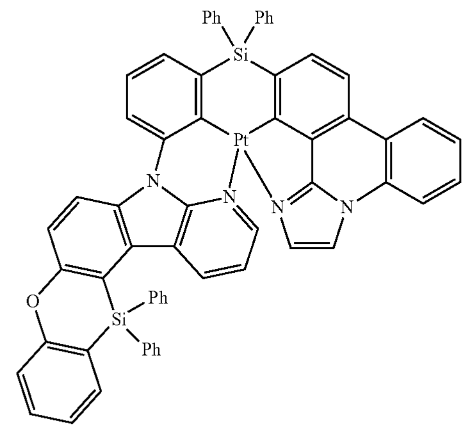
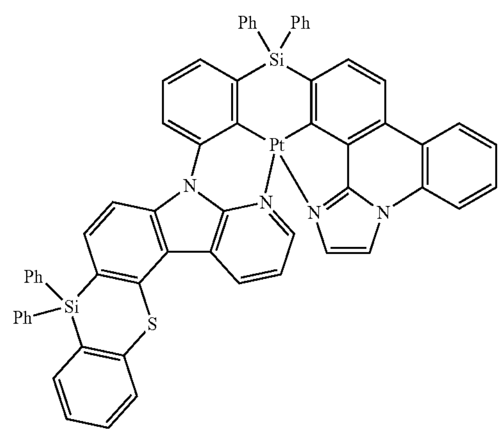
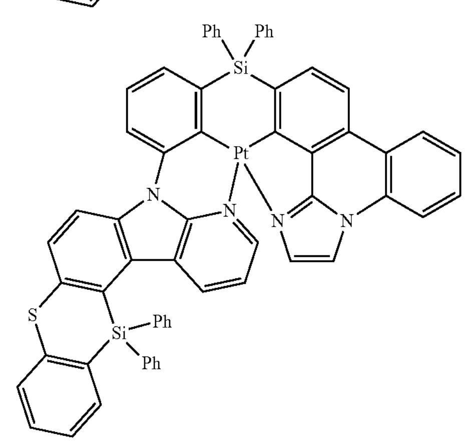
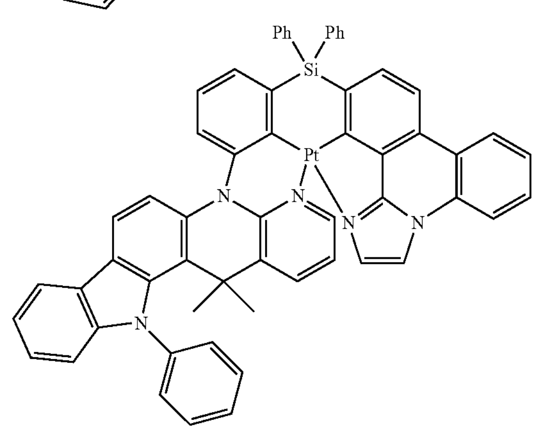

-continued
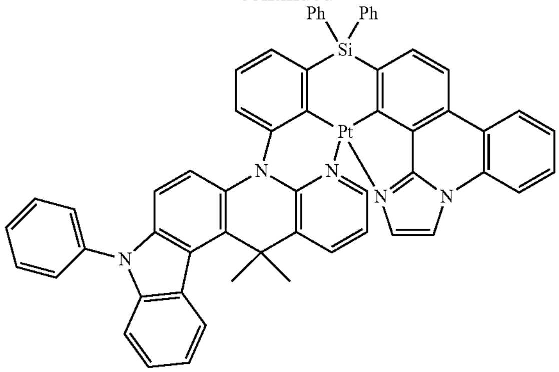
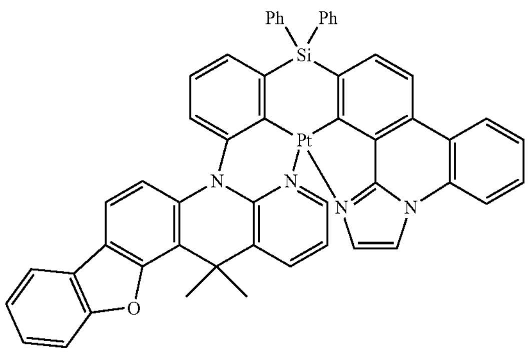
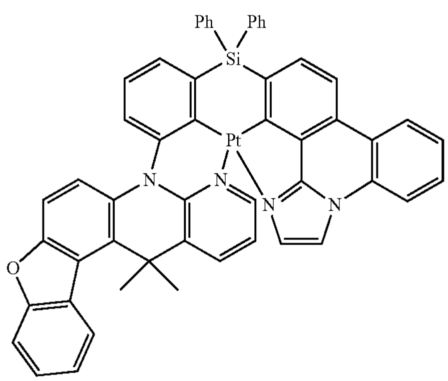
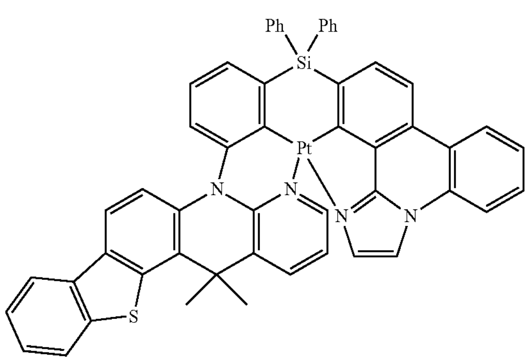
-continued
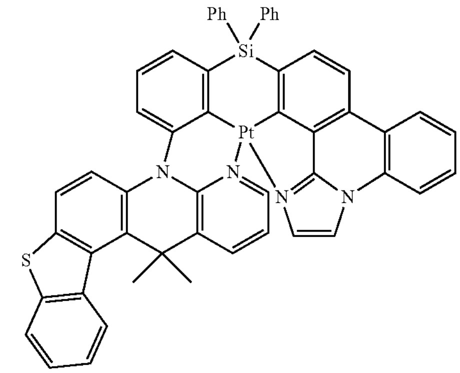
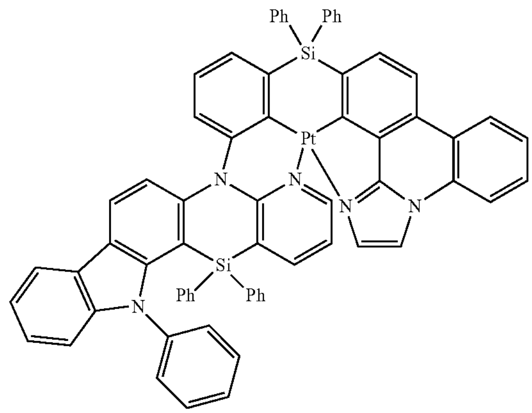
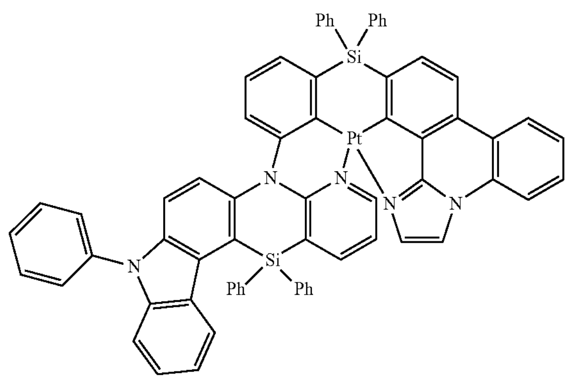
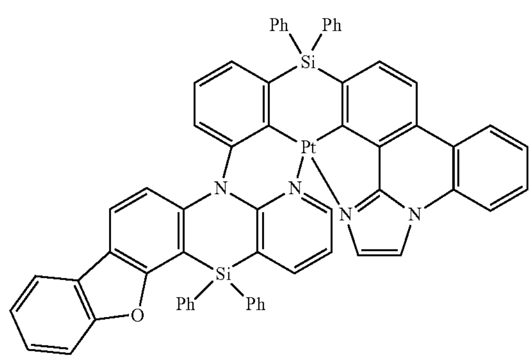

-continued
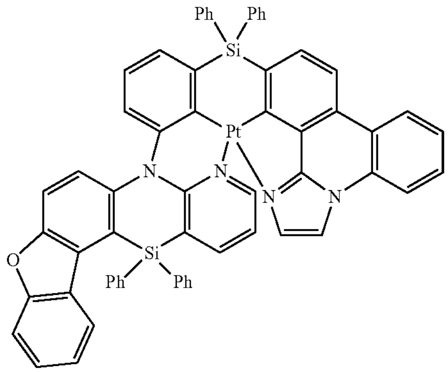
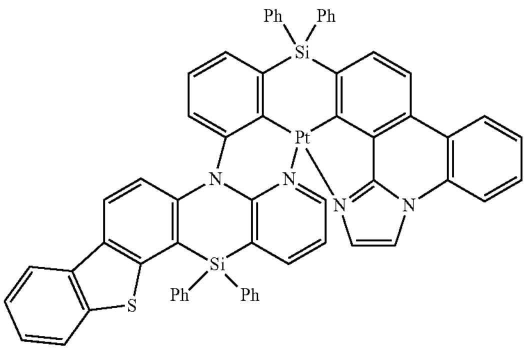
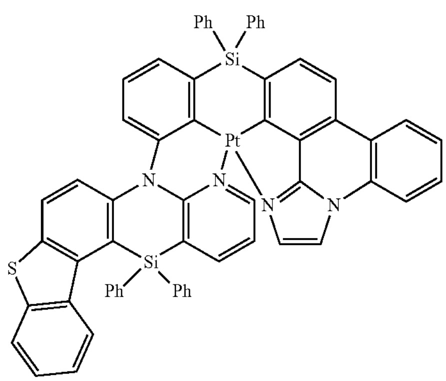
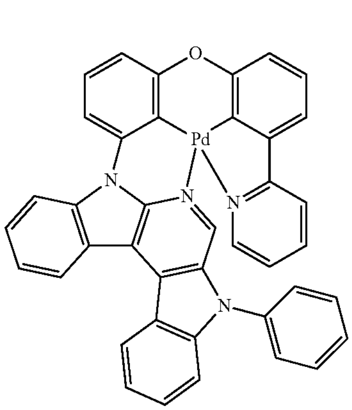
-continued
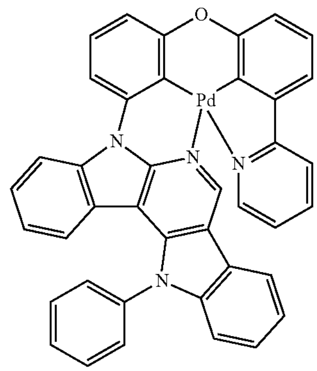
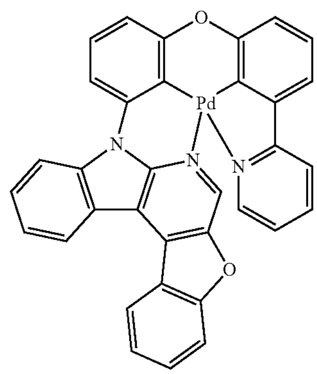
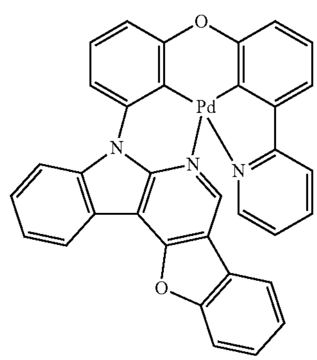
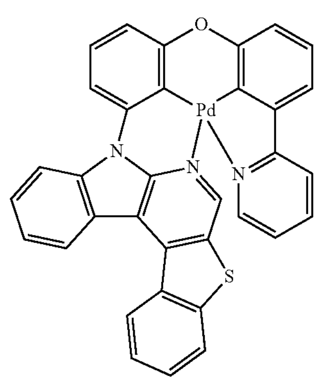

-continued
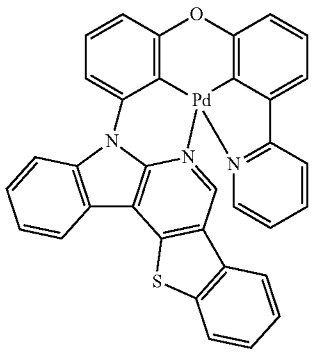
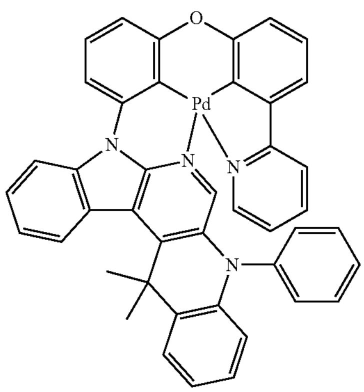
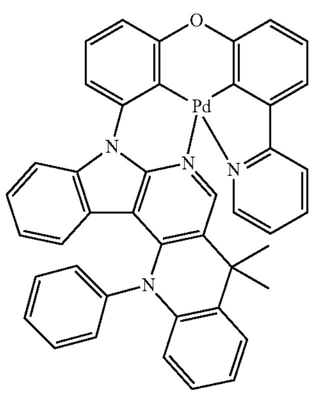
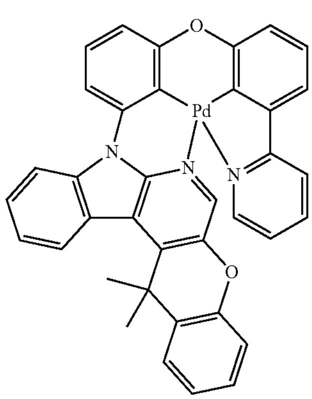
-continued
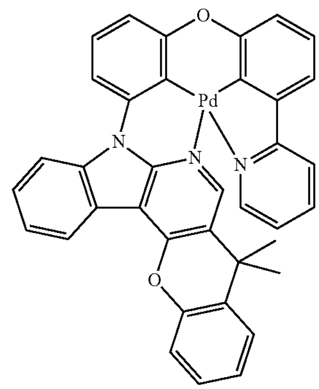
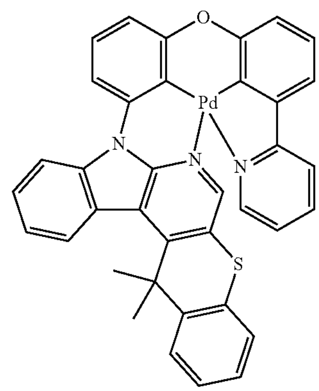
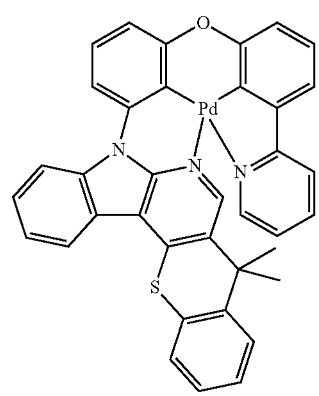
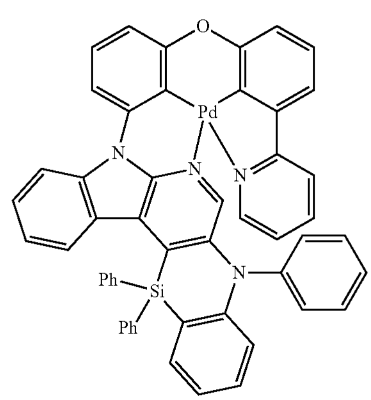

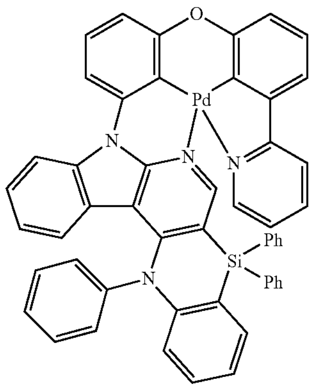
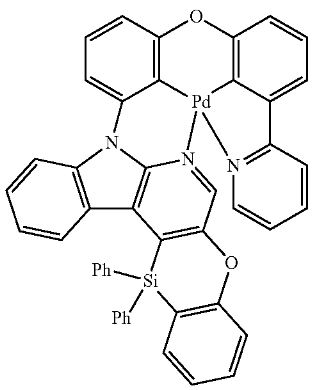
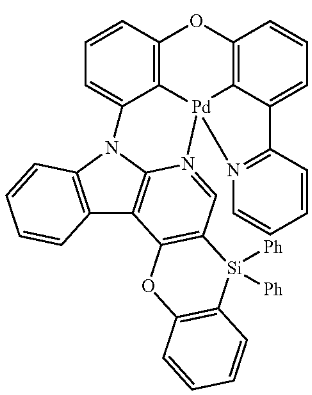
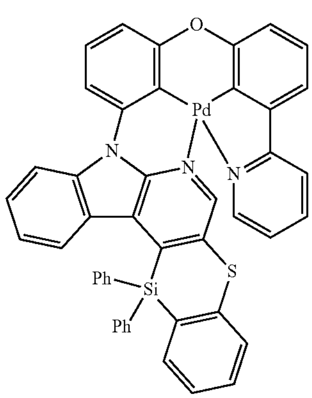
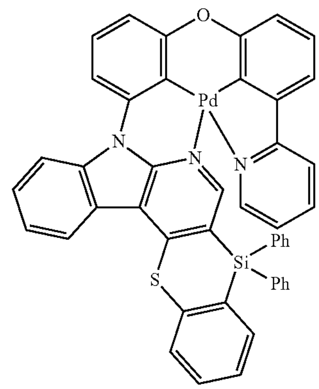
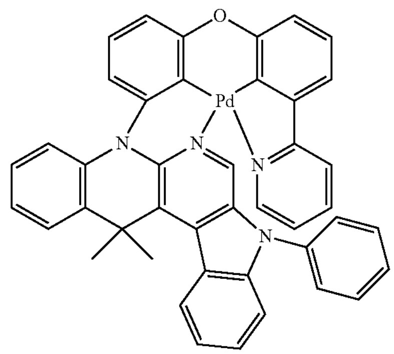
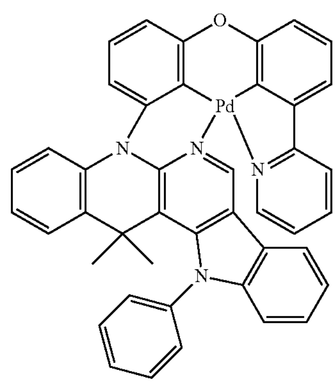
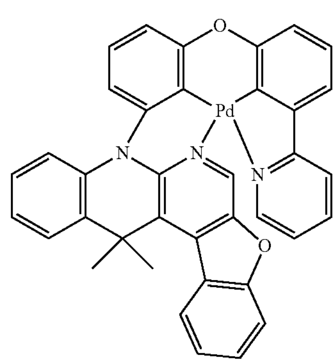

-continued
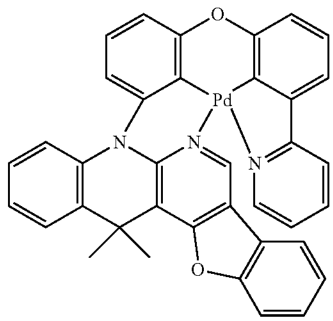
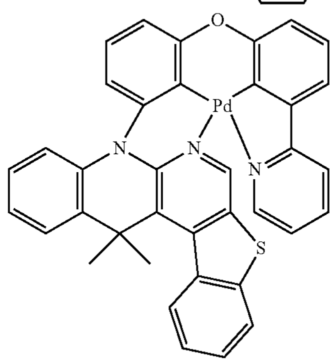
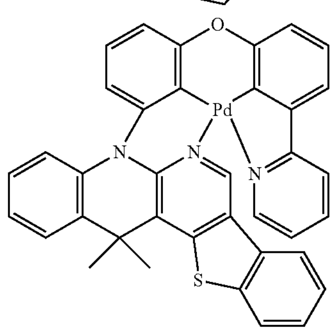
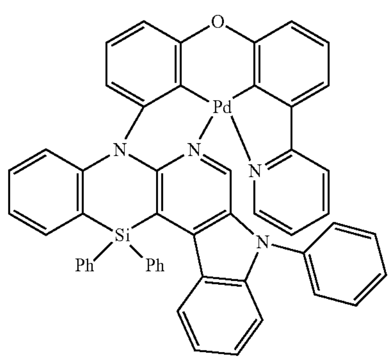
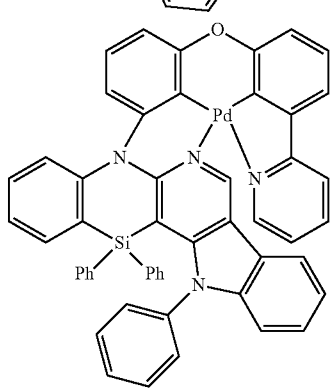
-continued
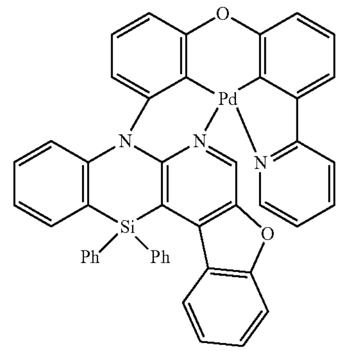
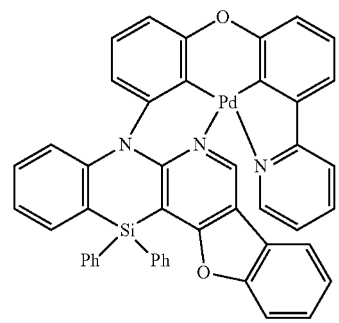
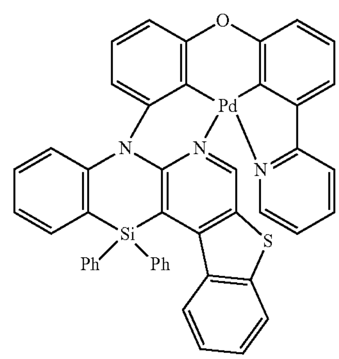
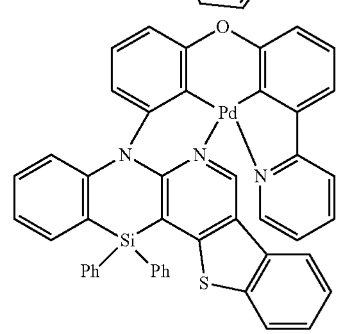
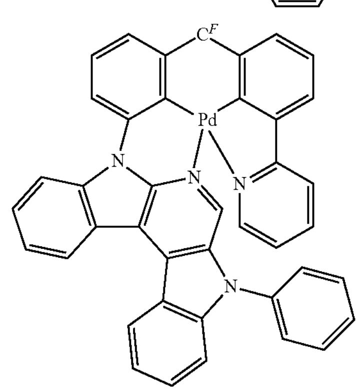

-continued
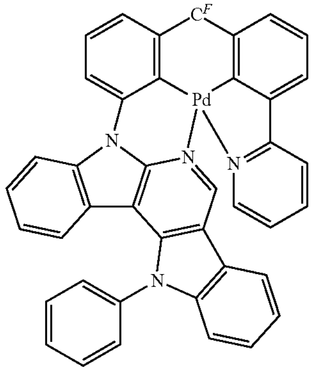
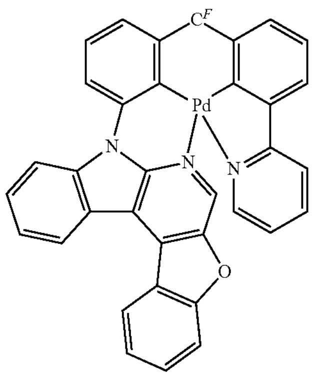
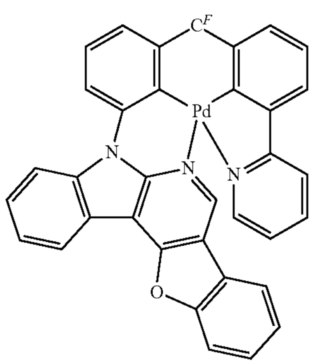
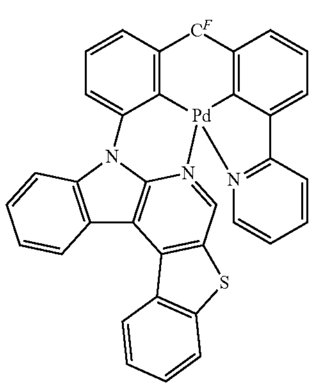
-continued
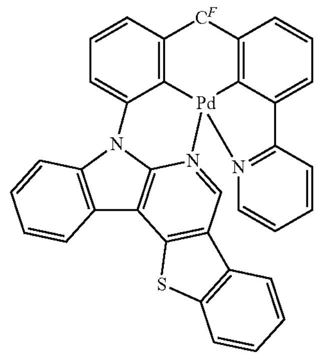
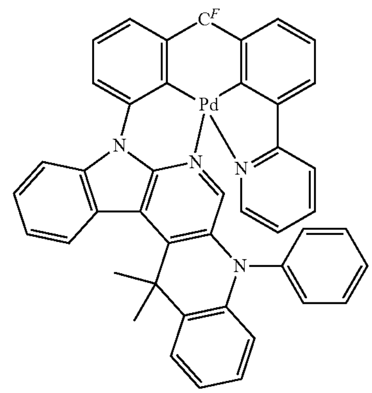
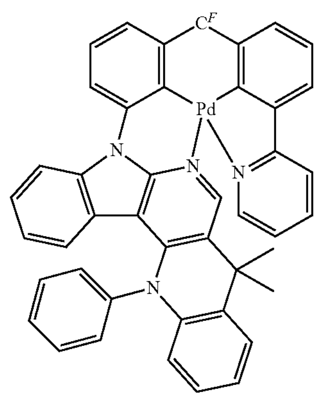
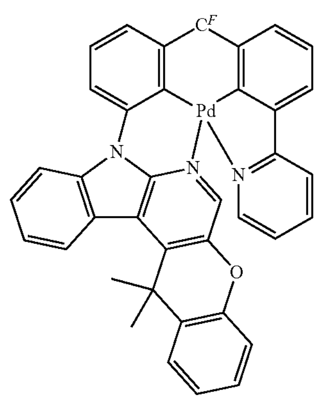

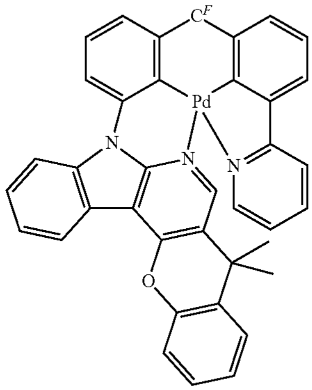
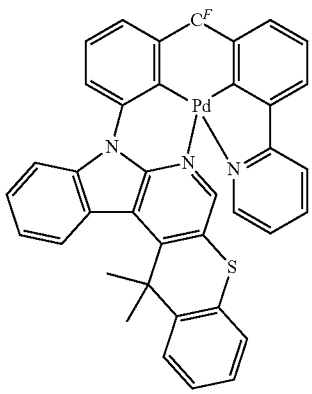
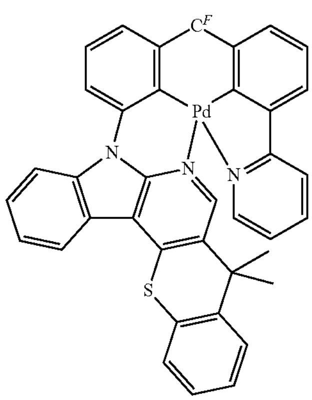
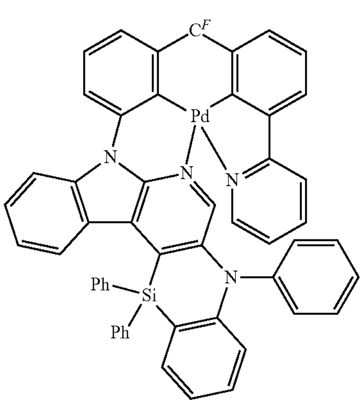
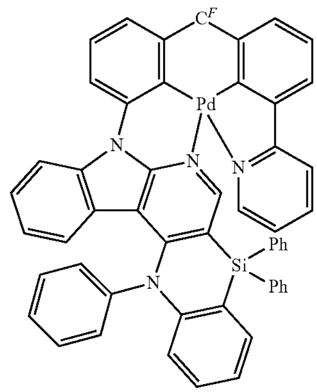
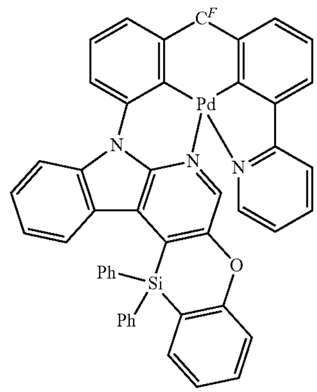
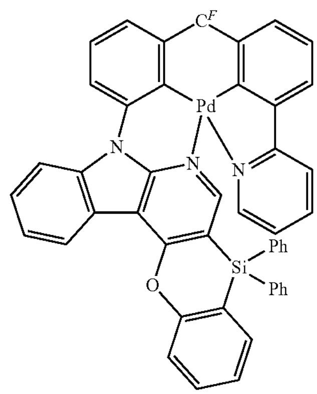
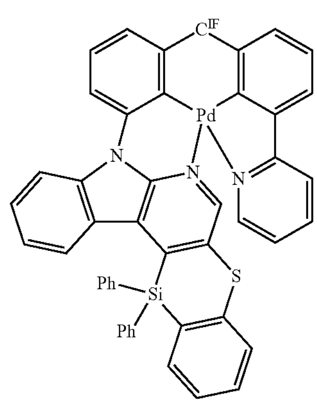

-continued
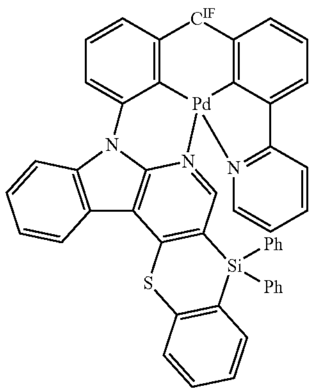
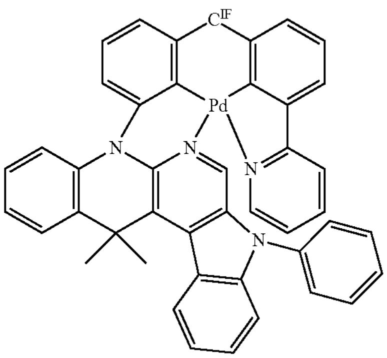
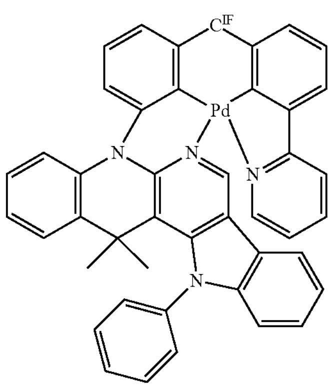
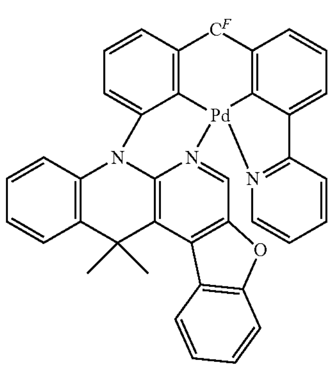
-continued
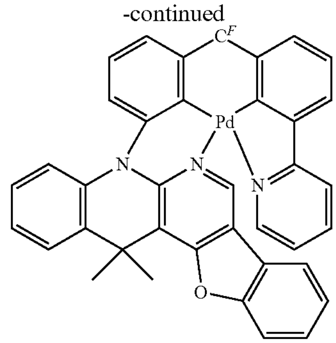
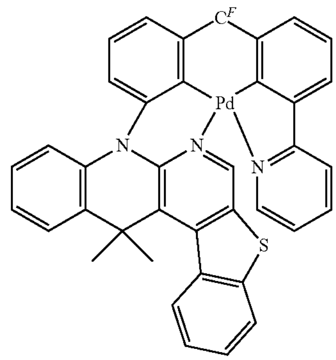
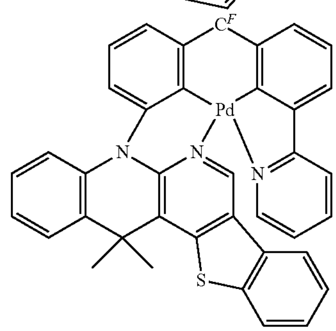
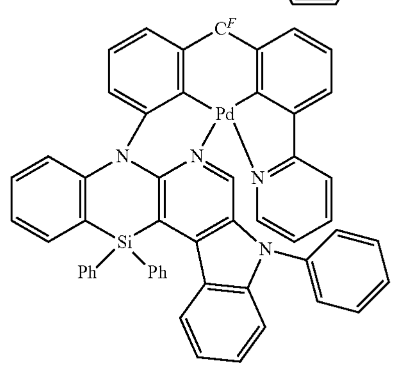
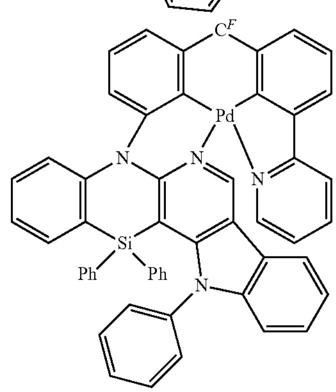

-continued
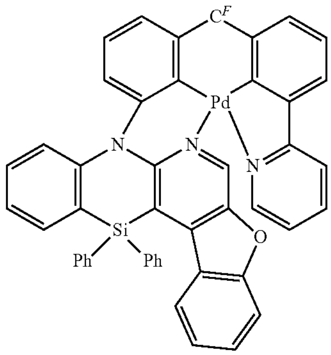
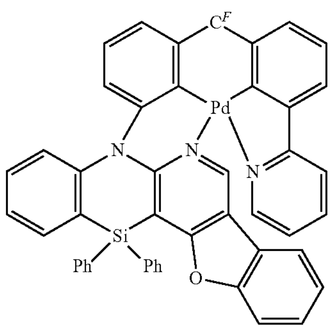
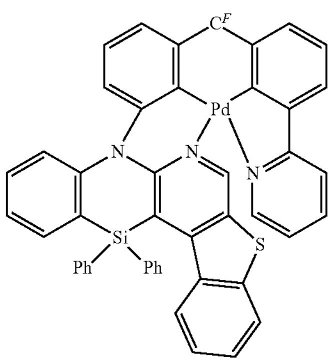
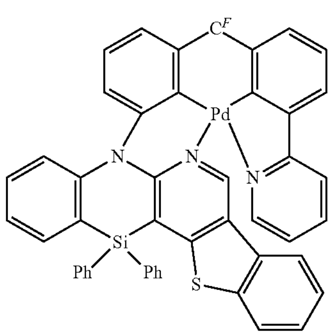
-continued
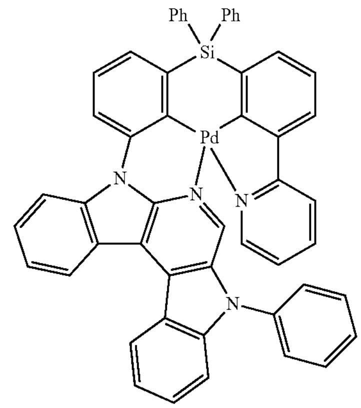
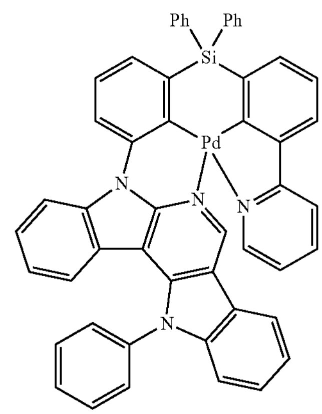
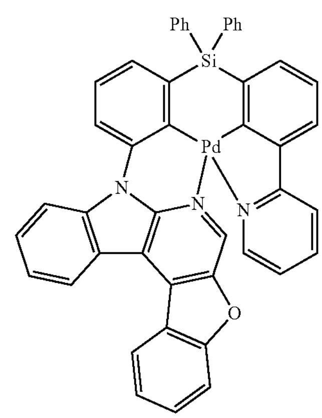
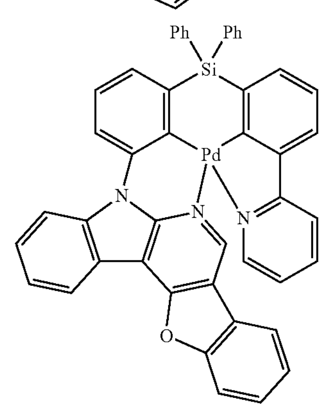

-continued
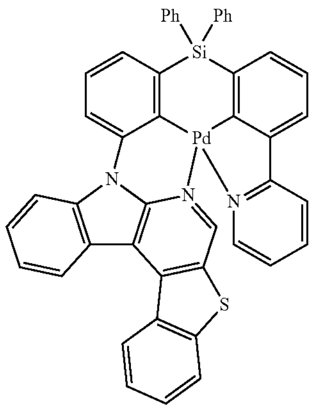
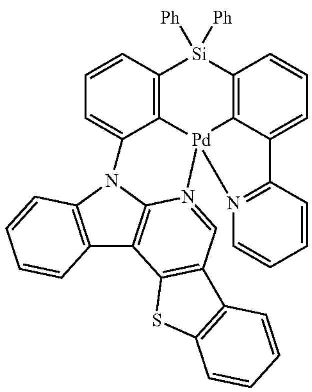
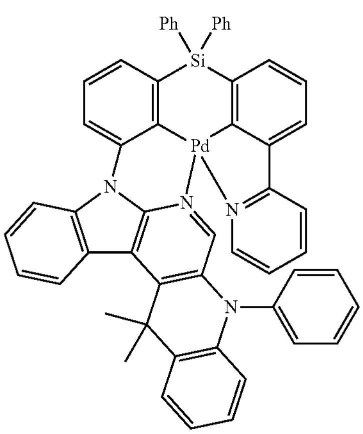
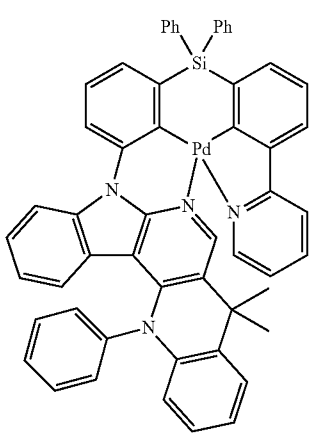
-continued
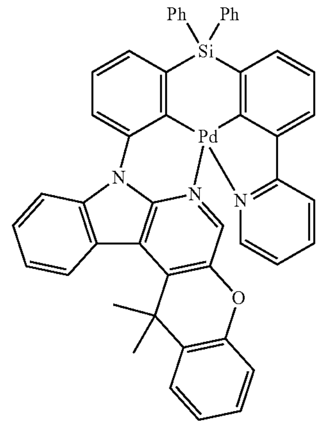
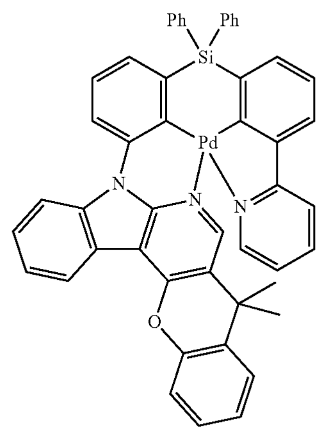
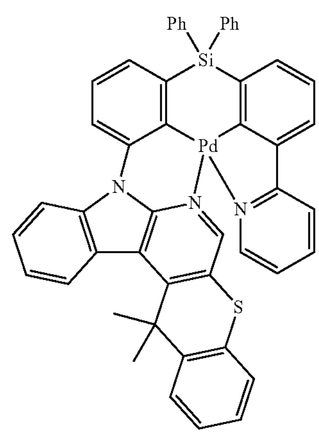
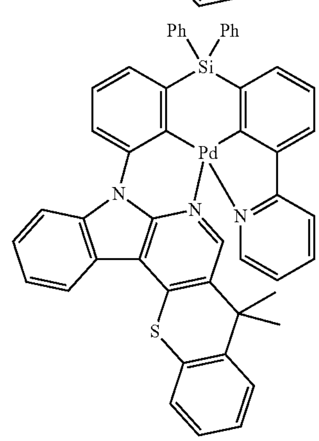

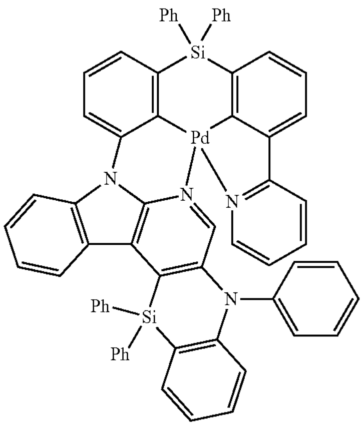
Ph
Ph
Si
Pd
N
N
N
N
Ph
Si
Ph
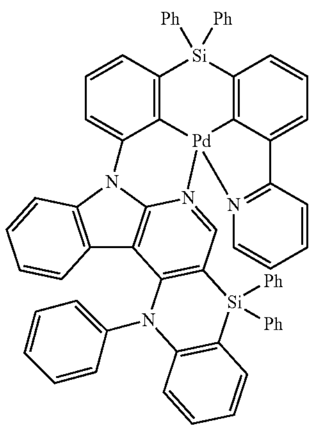
Ph
Ph
Si
Pd
N
N
N
Si
Ph
Ph
N
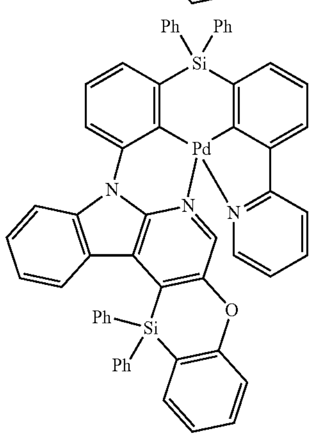
Ph
Ph
Si
Pd
N
N
N
O
Ph
Si
Ph
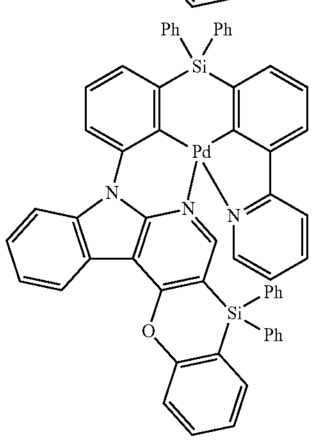
Ph
Ph
Si
Pd
N
N
N
Si
Ph
Ph
O
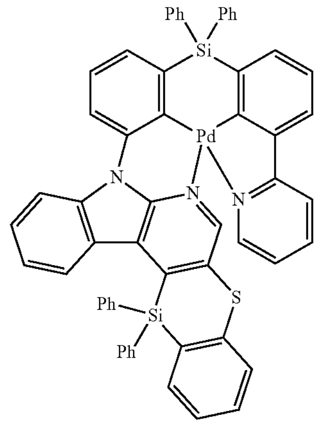
Ph
Ph
Si
Pd
N
N
N
S
Ph
Si
Ph
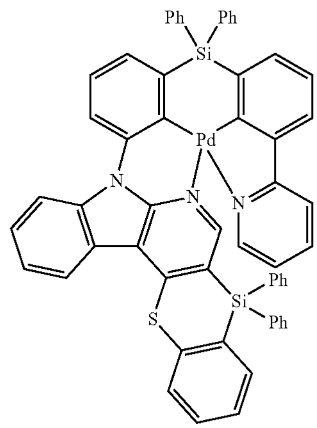
Ph
Ph
Si
Pd
N
N
N
Si
Ph
Ph
S
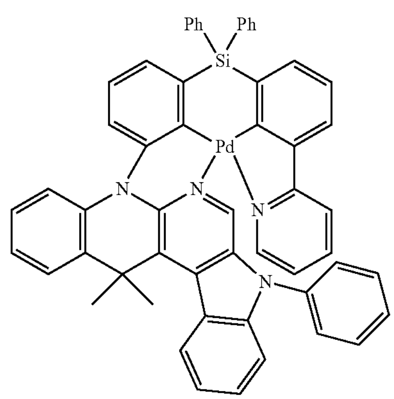
Ph
Ph
Si
Pd
N
N
N
N
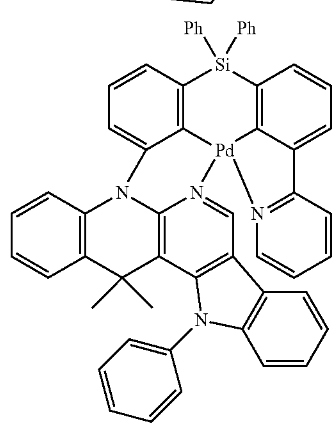
Ph
Ph
Si
Pd
N
N
N
N -continued
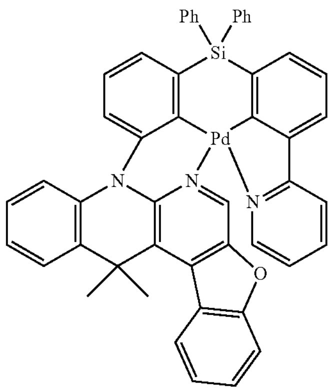
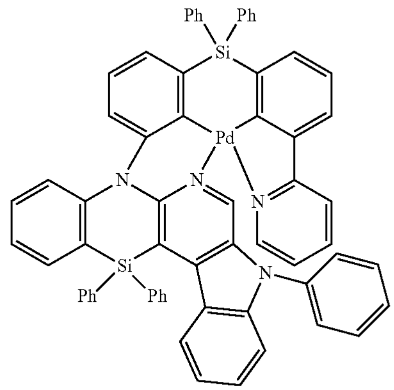
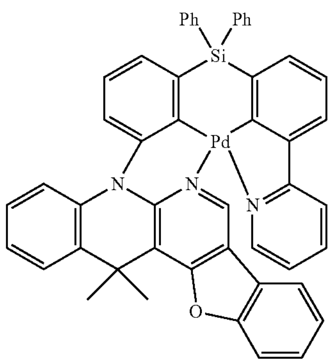
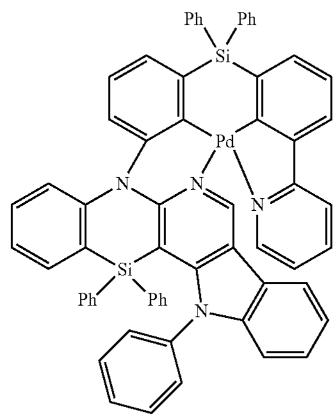
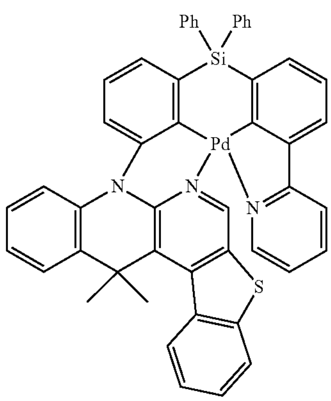
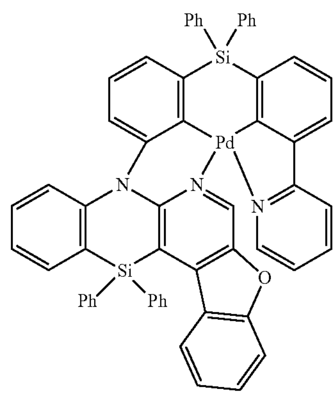
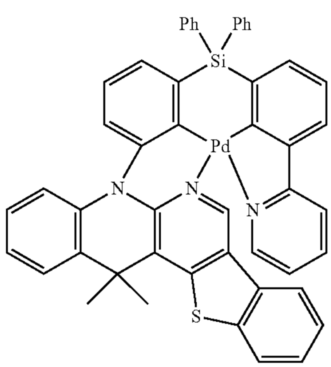
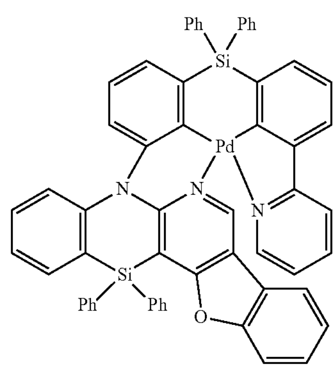

-continued
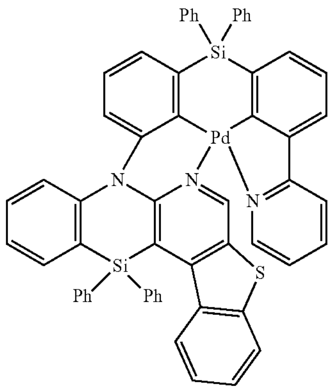
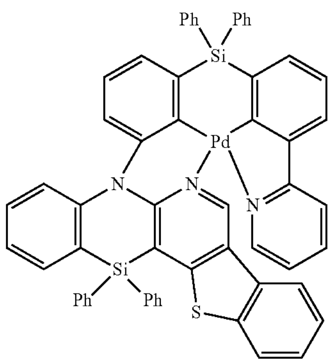
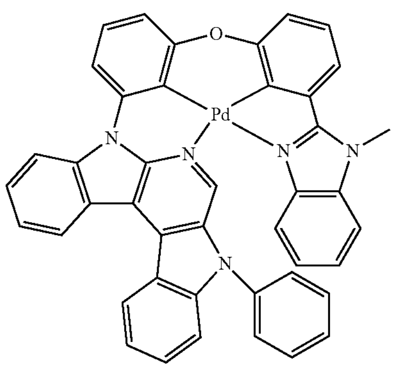
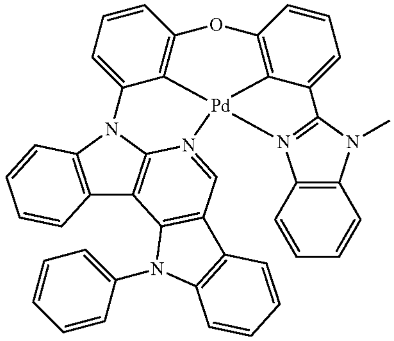
-continued
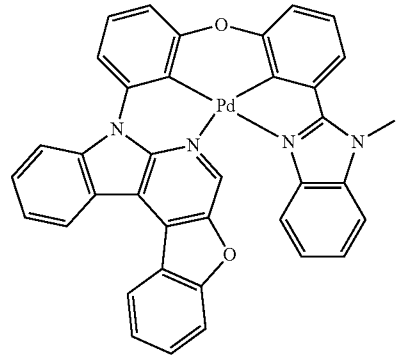
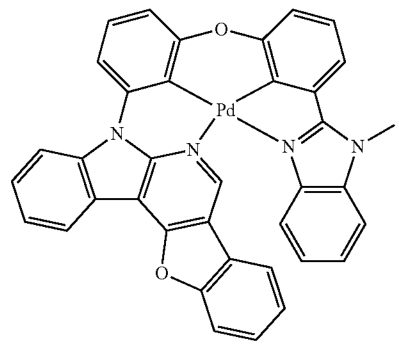
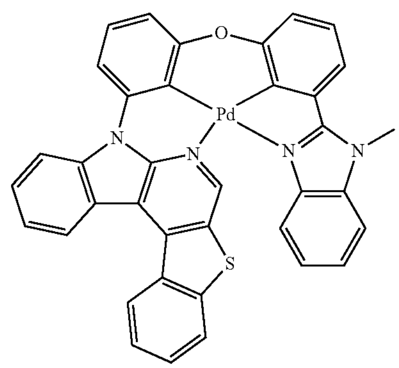
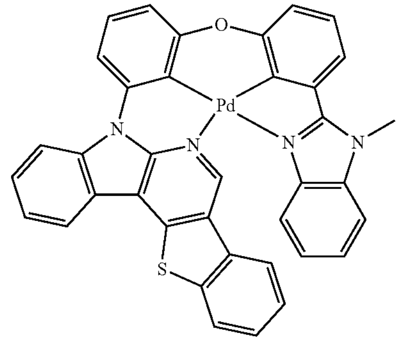

-continued
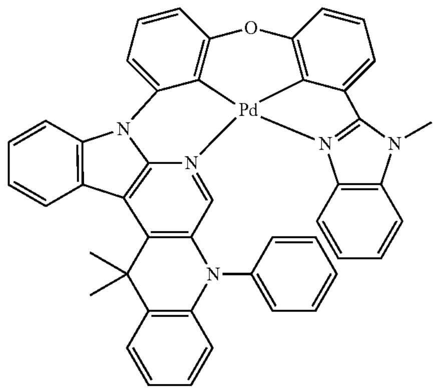
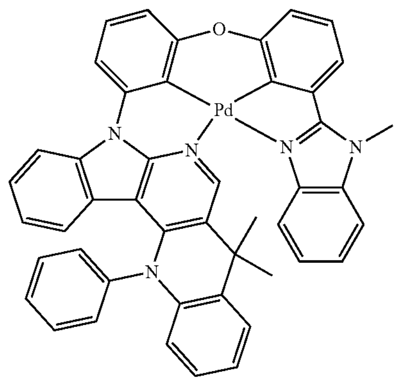
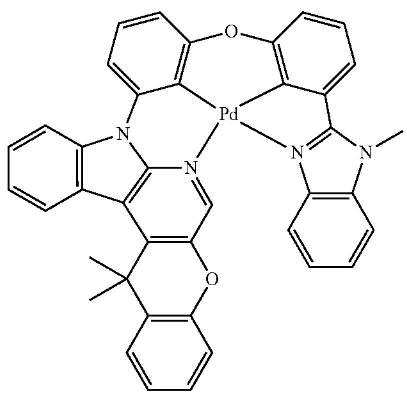
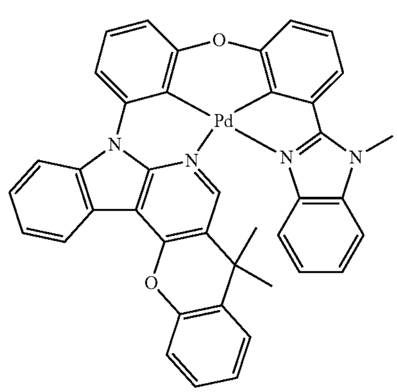
-continued
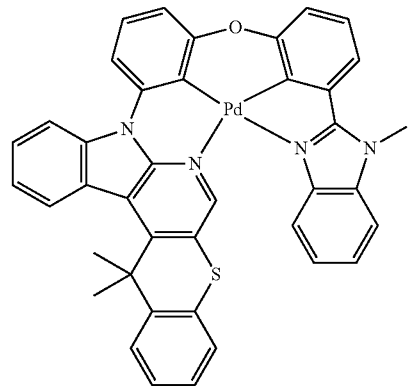
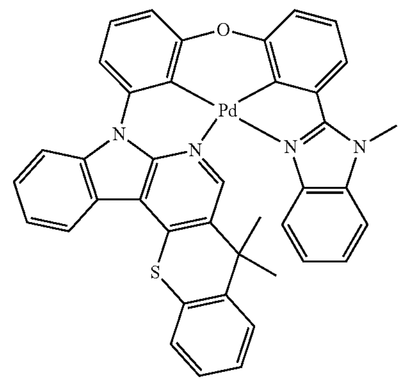
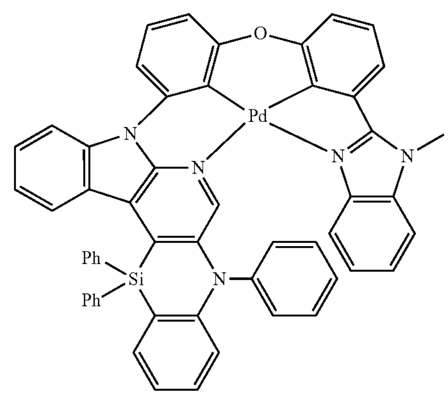
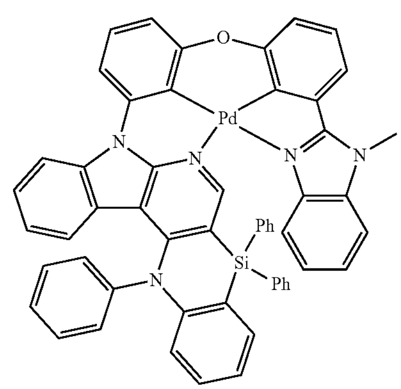

-continued
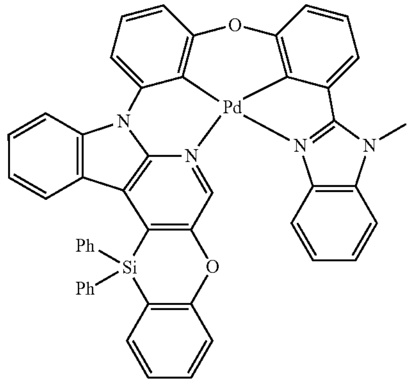
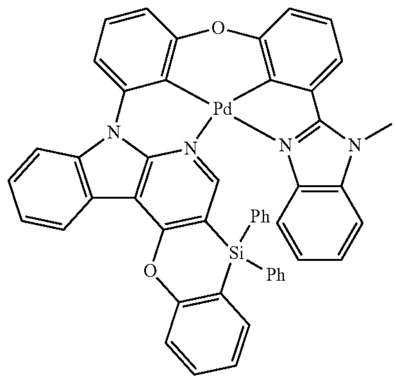
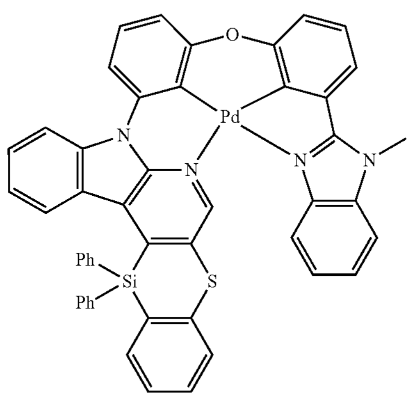
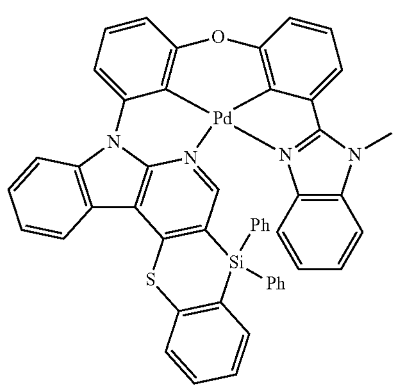
-continued
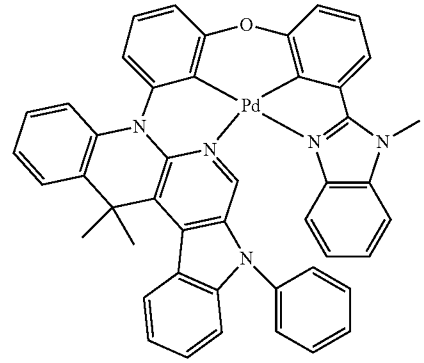
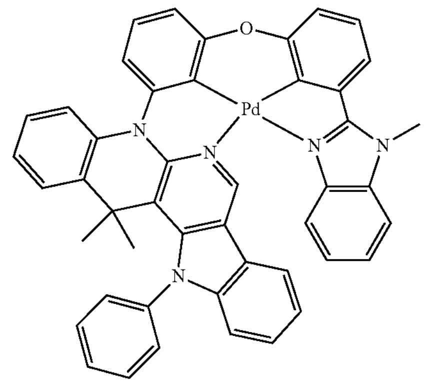
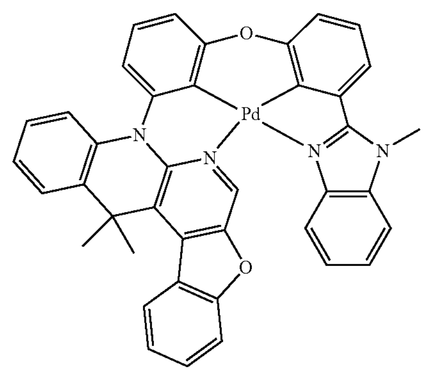
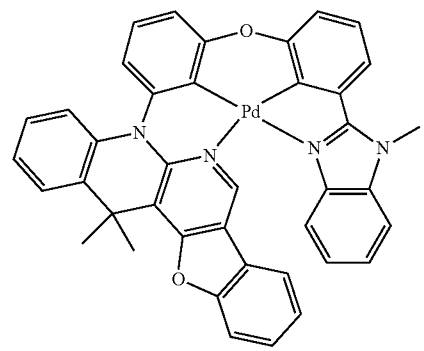

-continued
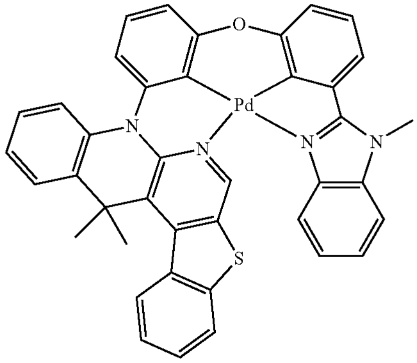
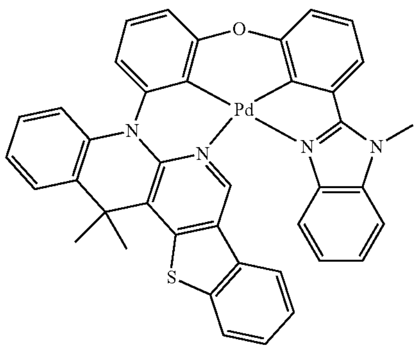
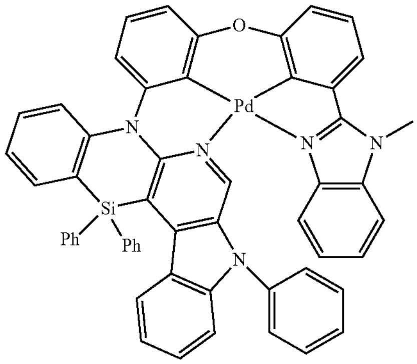
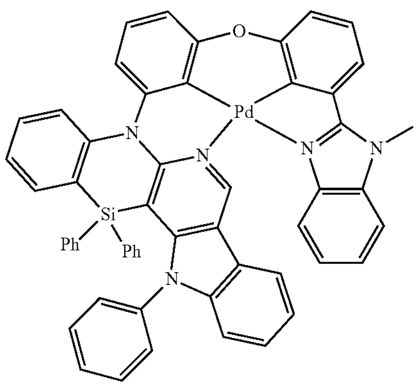
-continued
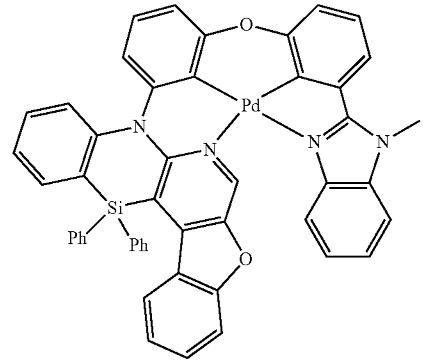
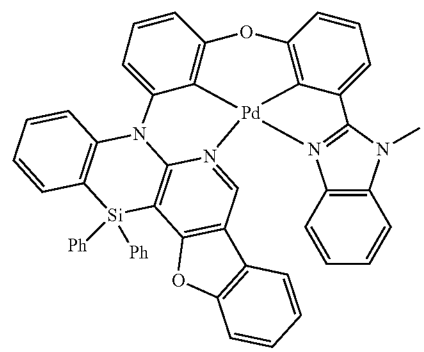
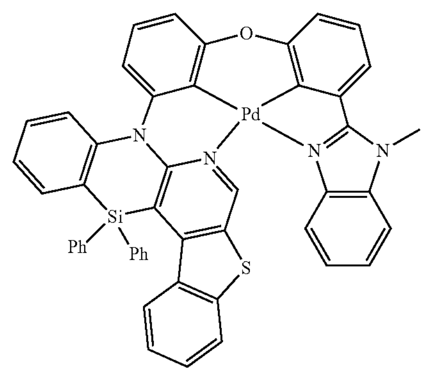
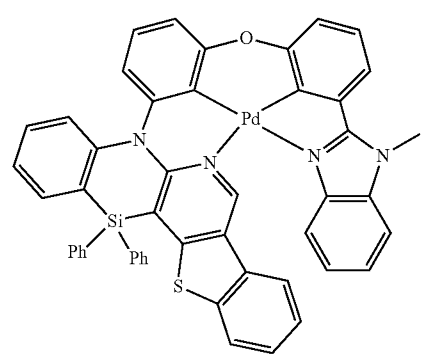

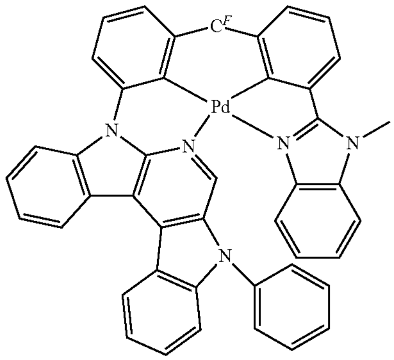
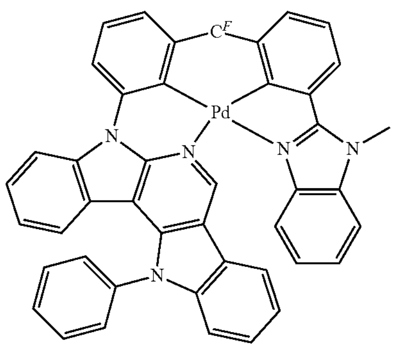
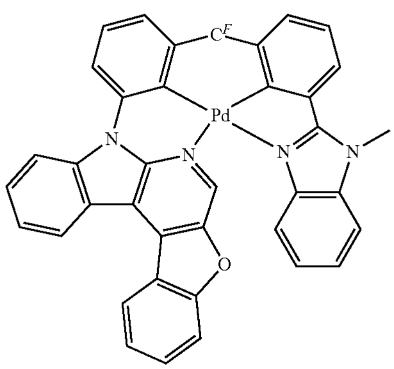
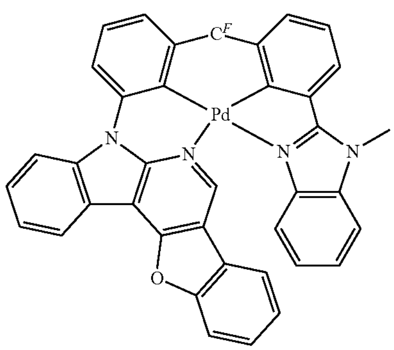
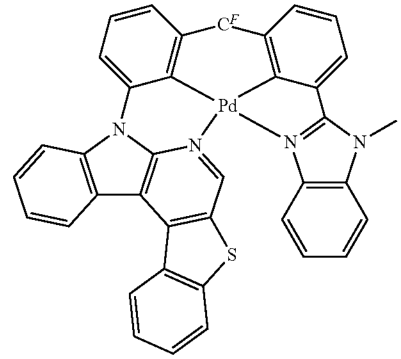
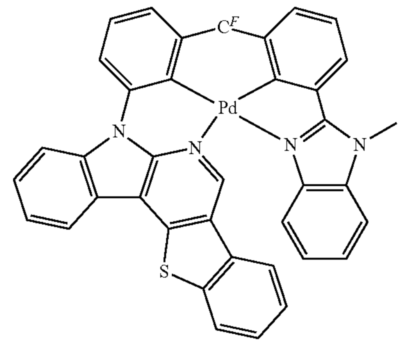
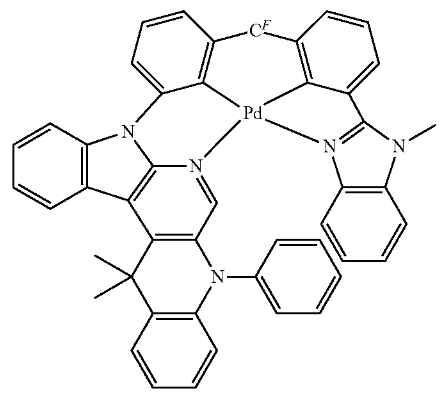
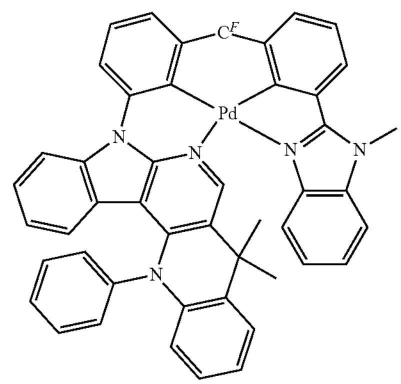

-continued
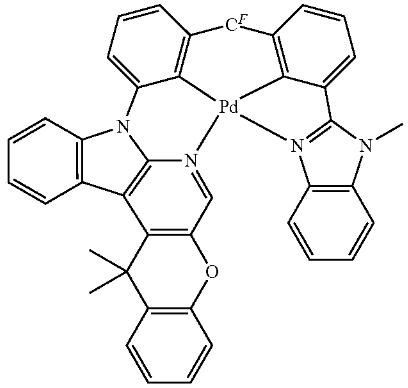
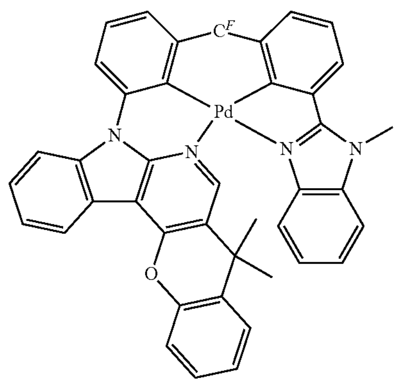
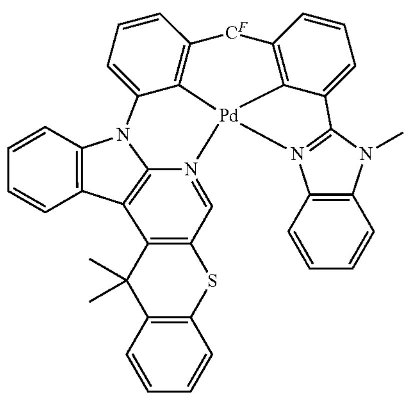
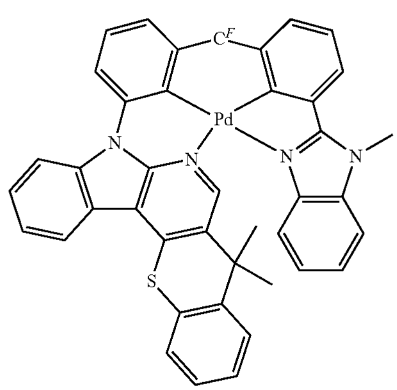
-continued
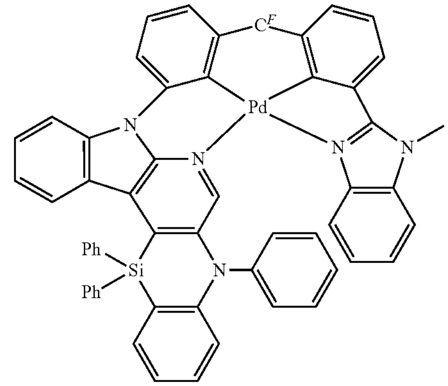
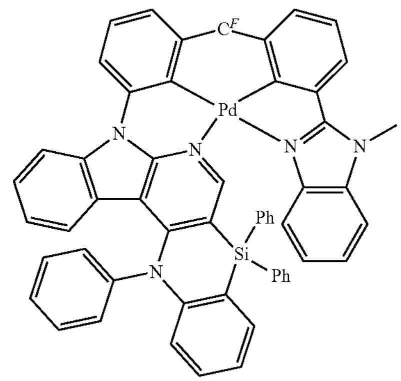
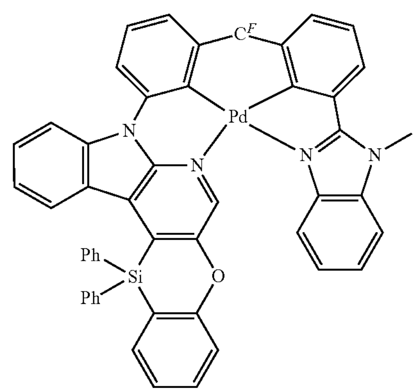
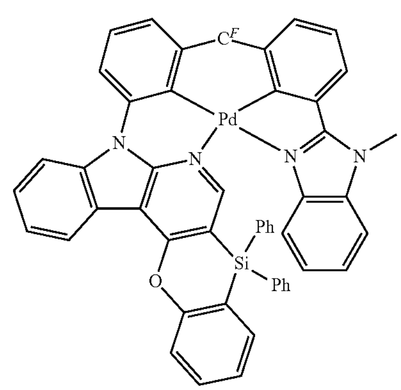

-continued
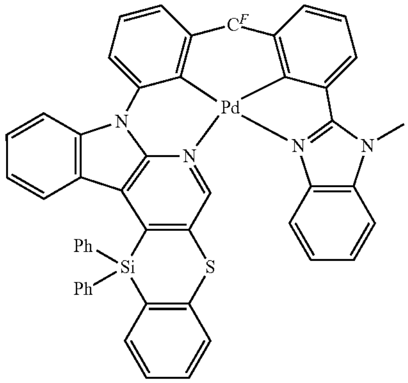
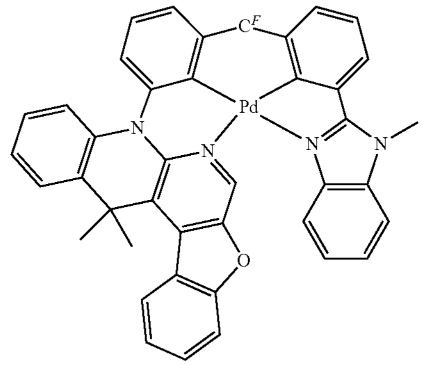
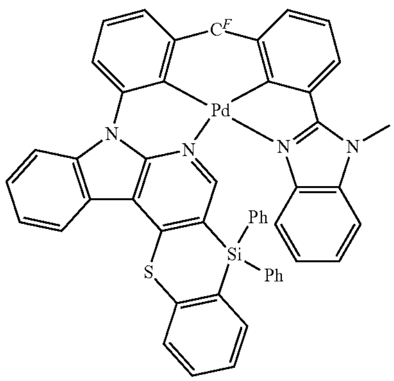
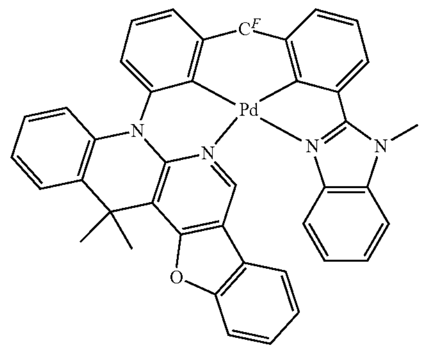
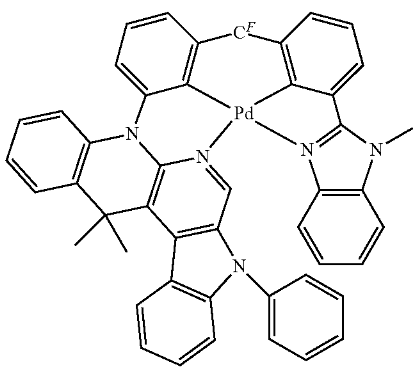
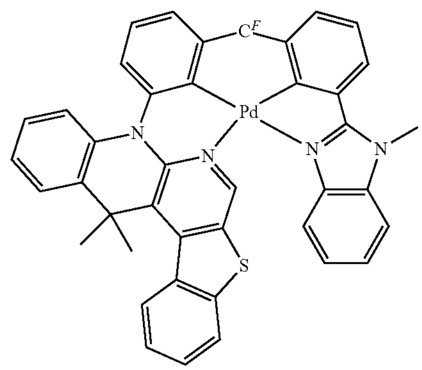
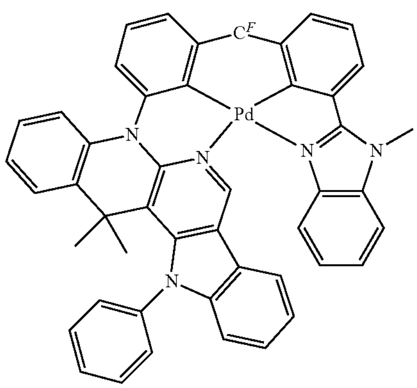
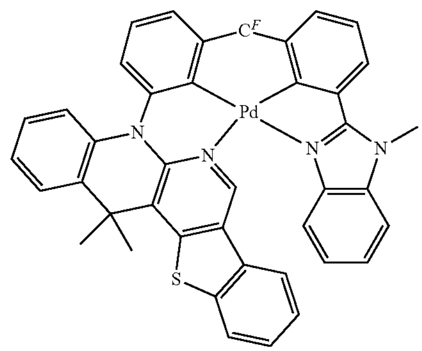

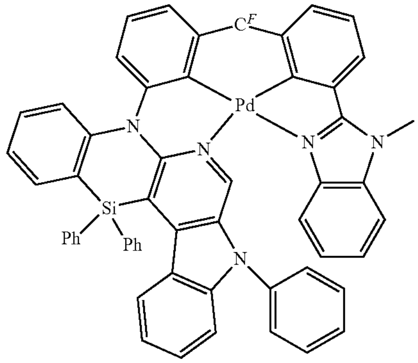
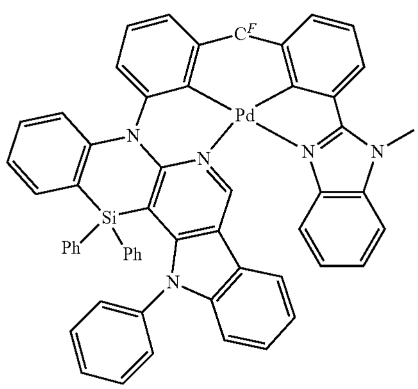
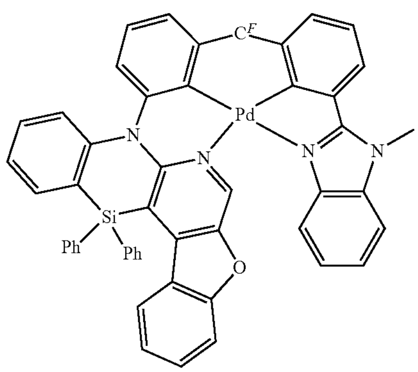
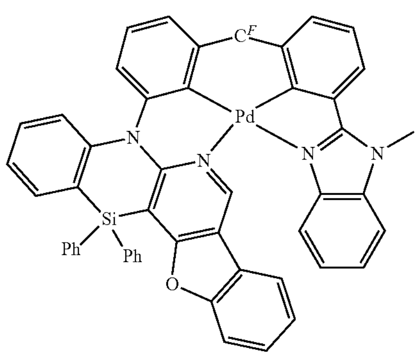
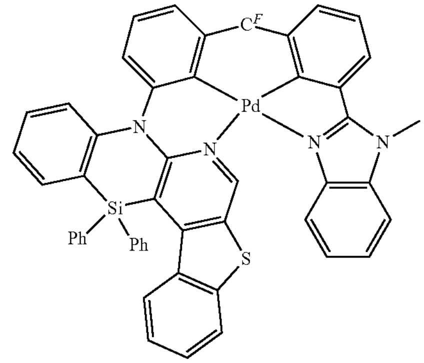
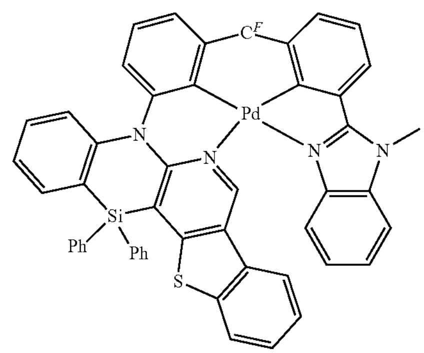
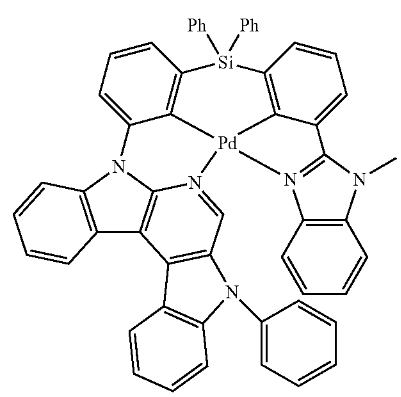
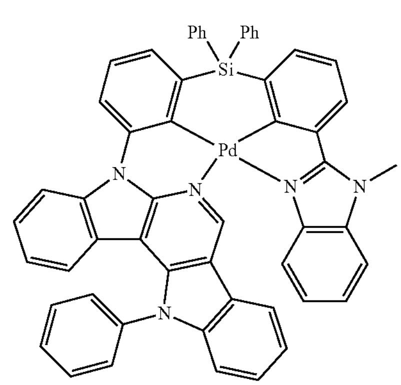

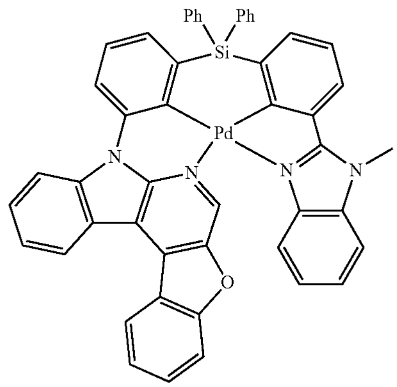
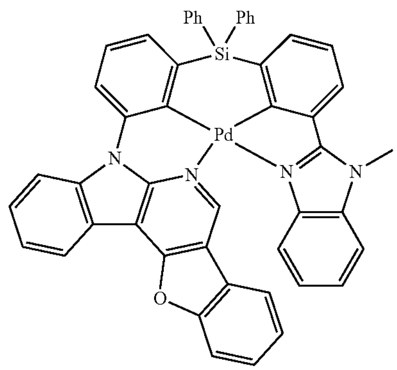
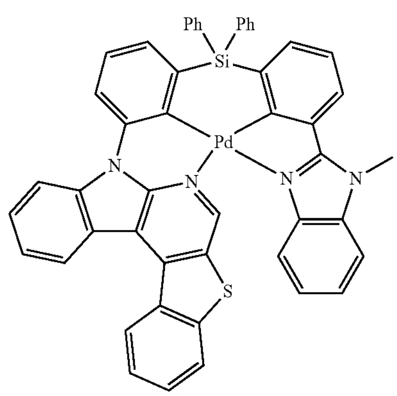
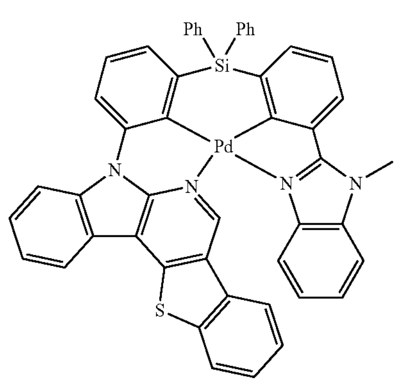
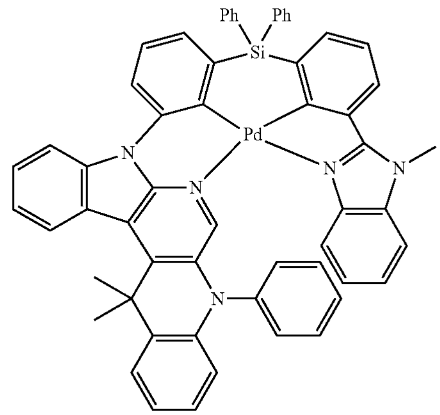
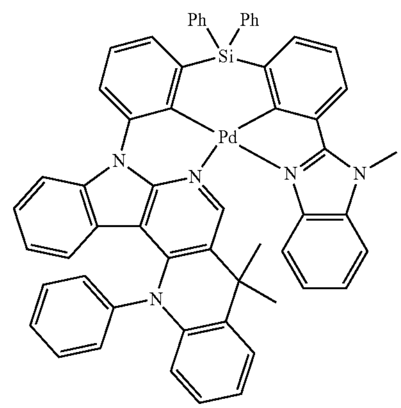
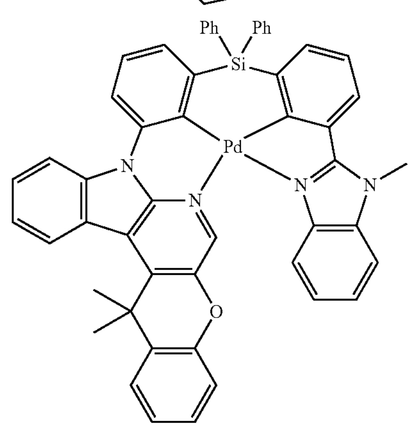
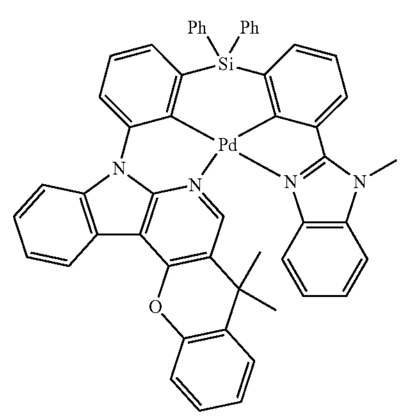

-continued
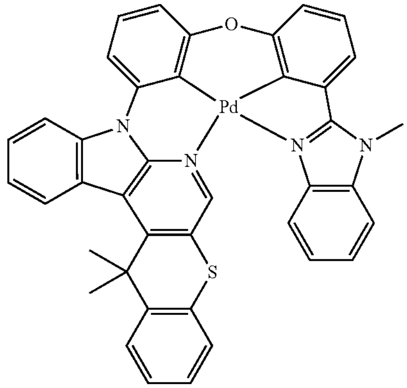
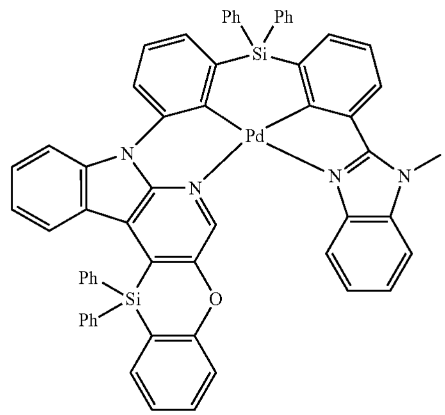
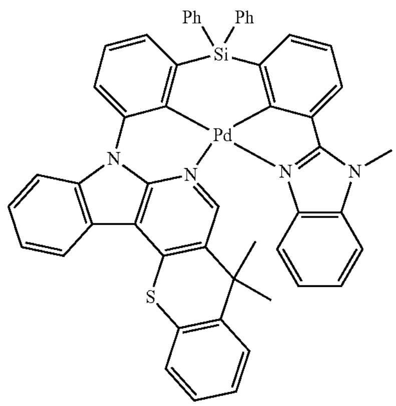
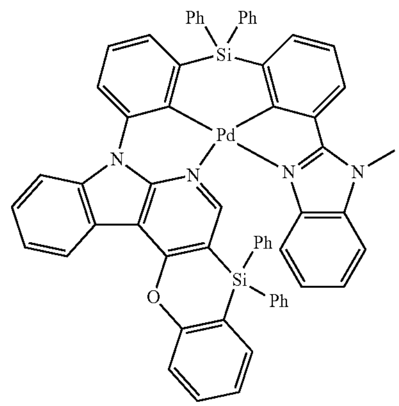
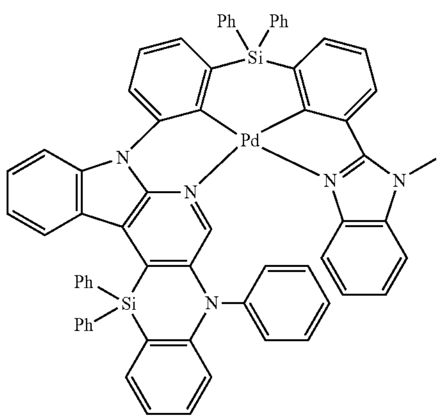
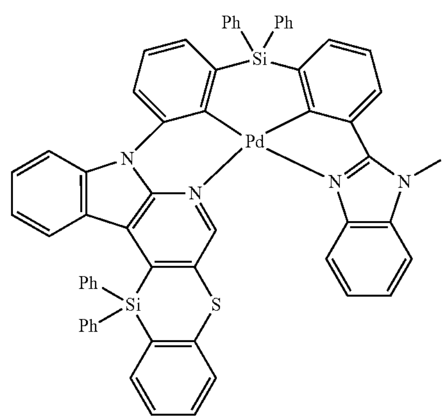
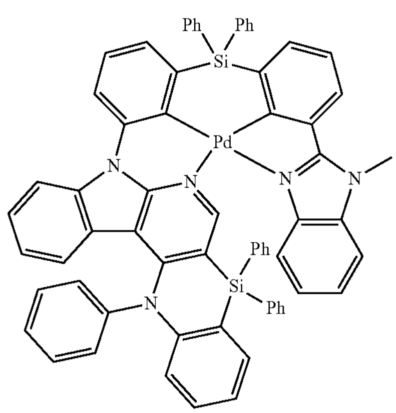
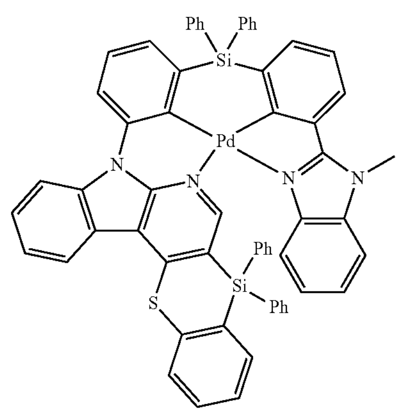

-continued
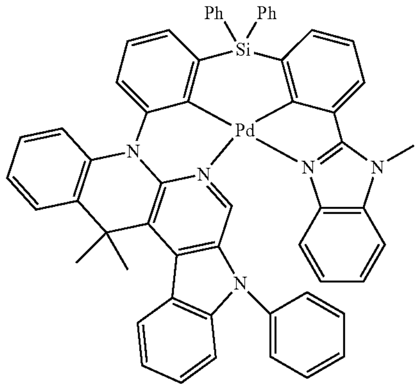
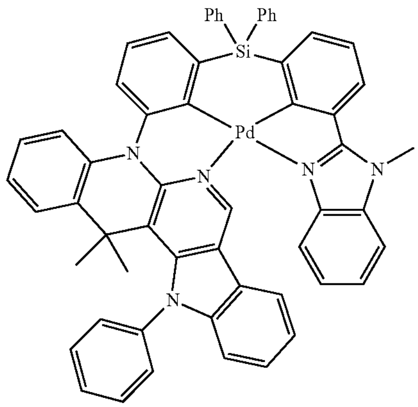
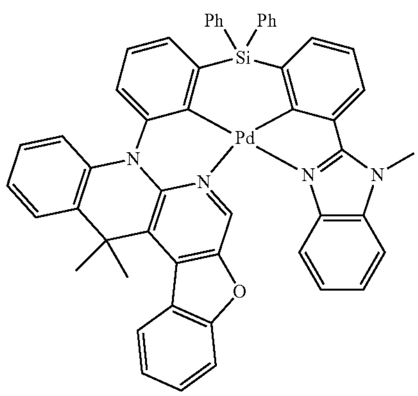
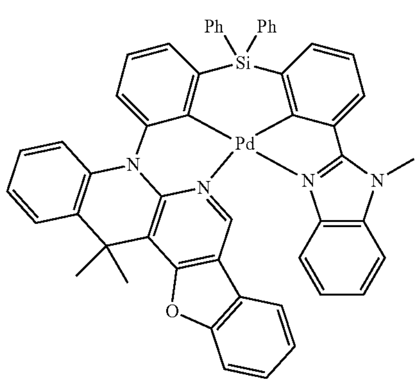
-continued
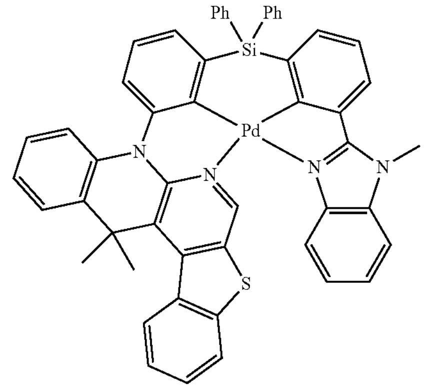
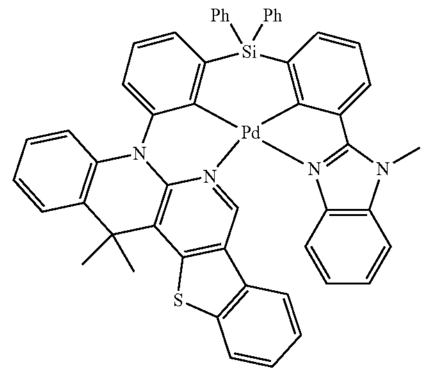
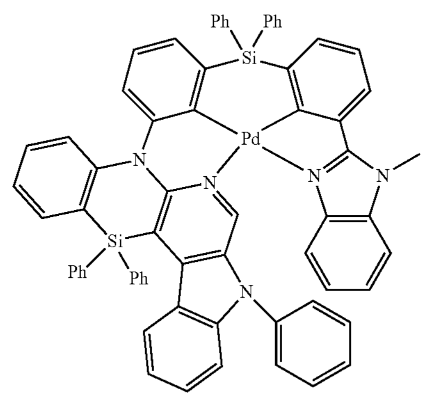
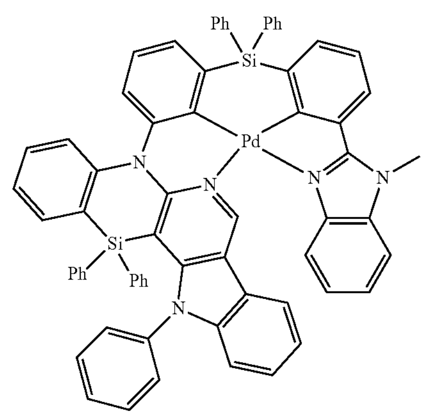

-continued
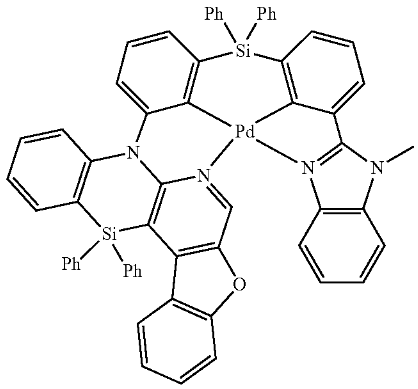
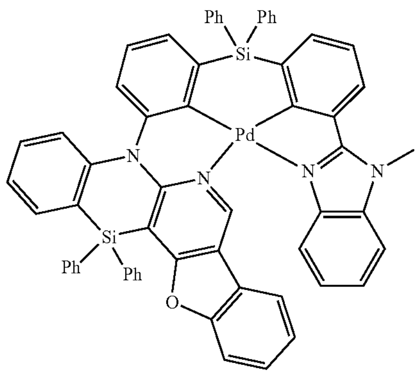
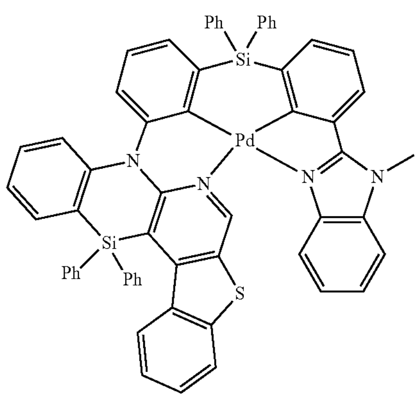
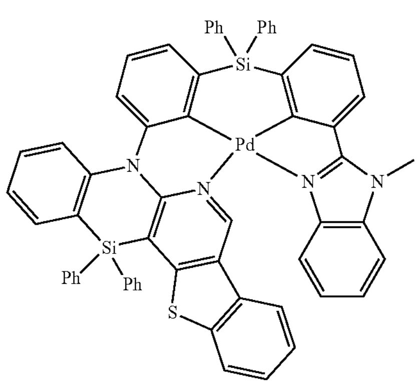
-continued
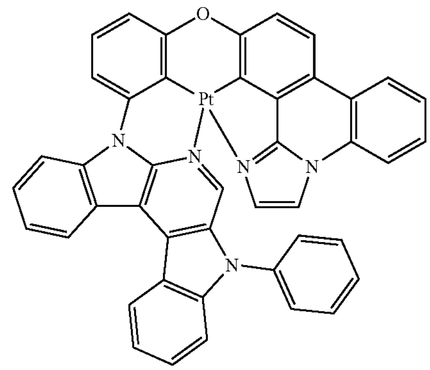
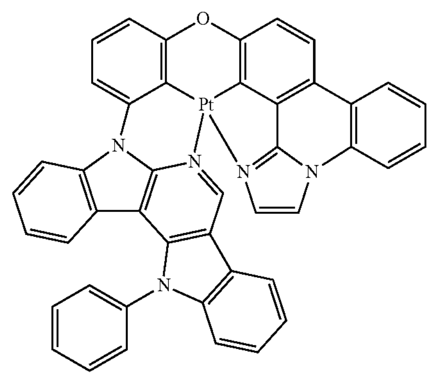
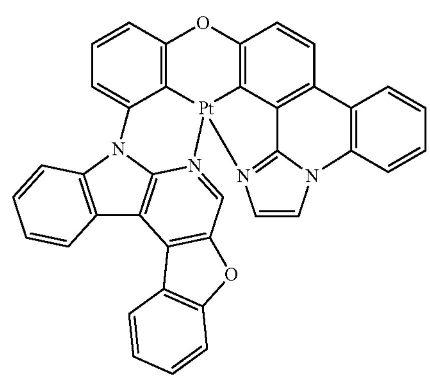
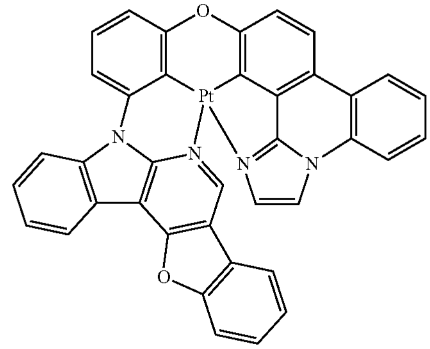

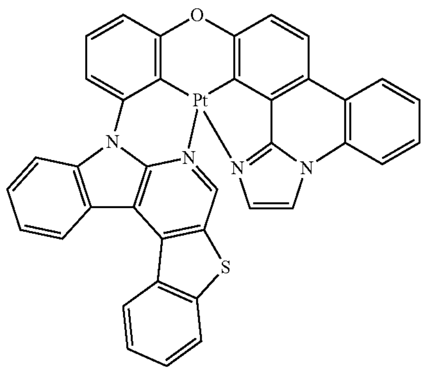
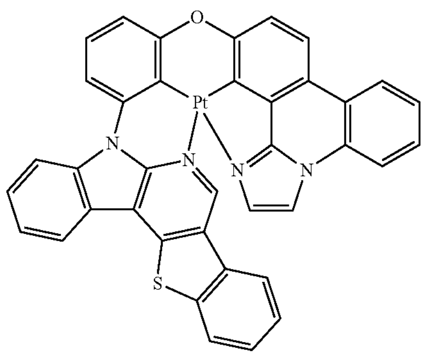
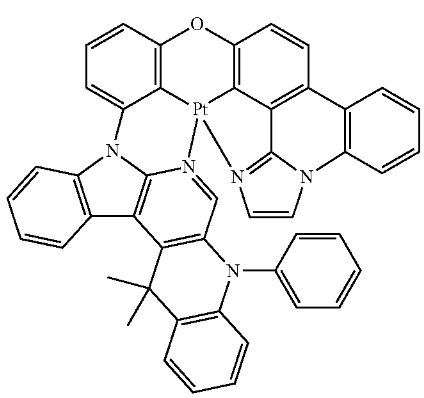
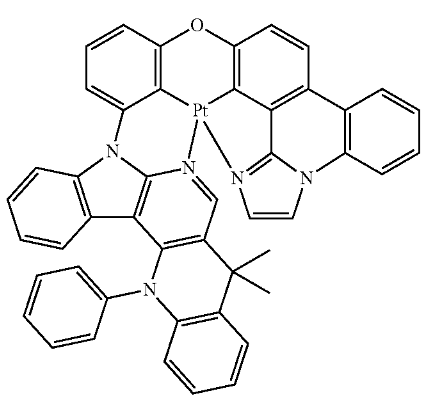
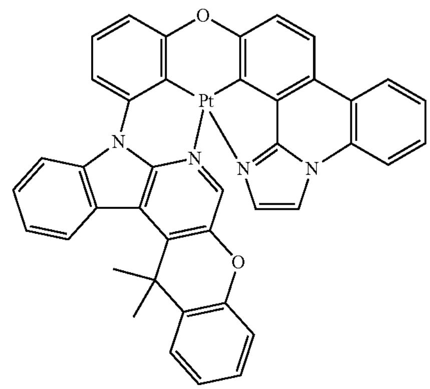
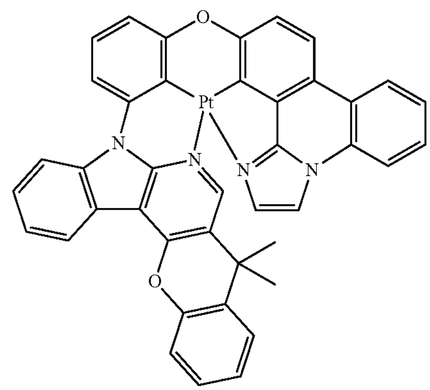
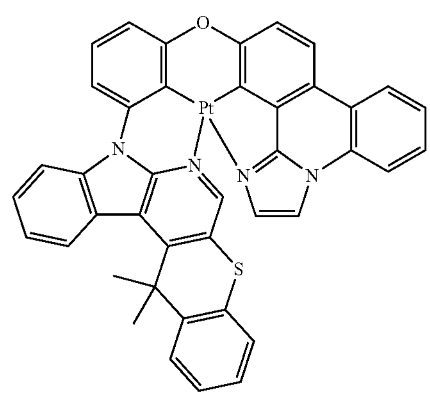
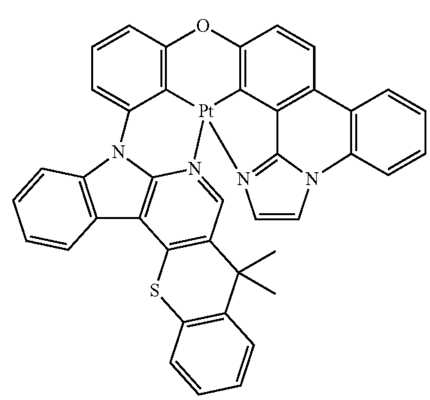

-continued
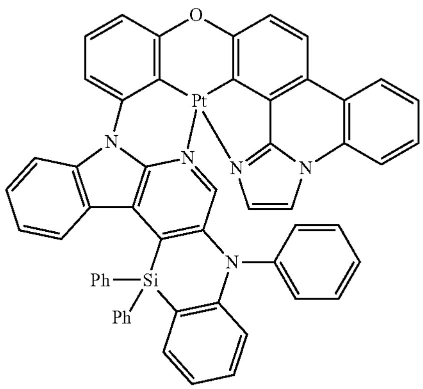
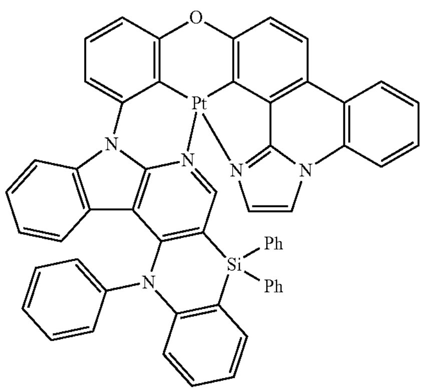
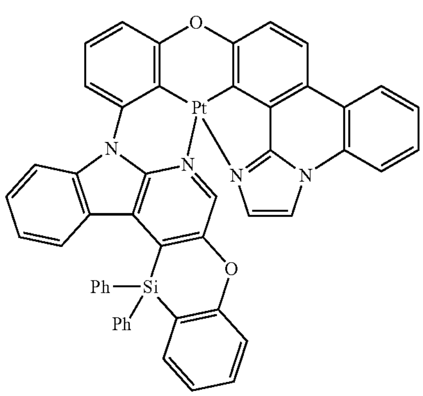
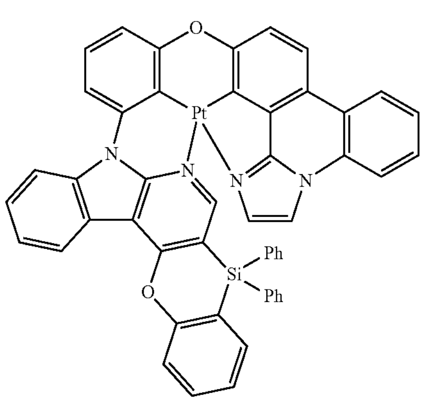
-continued
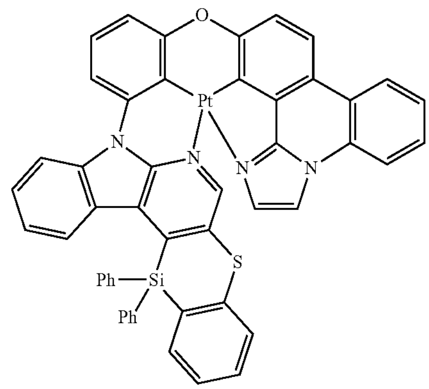
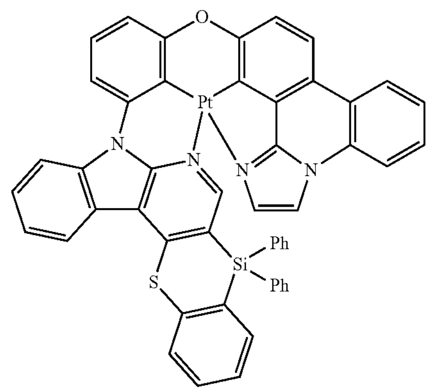
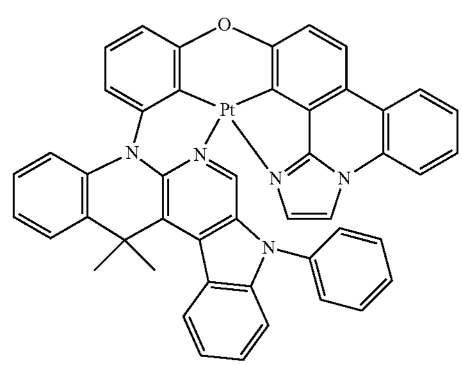
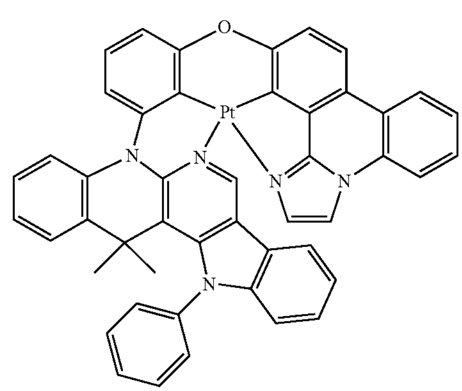

-continued
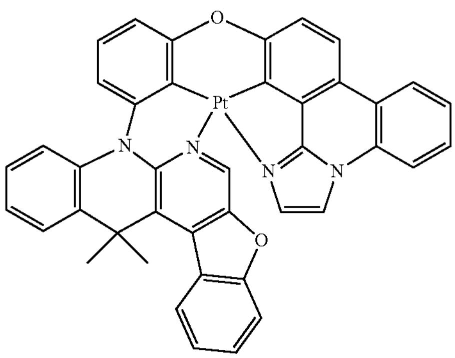
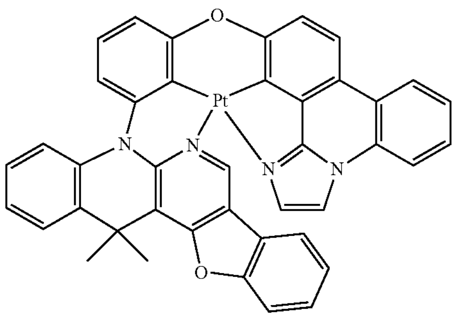
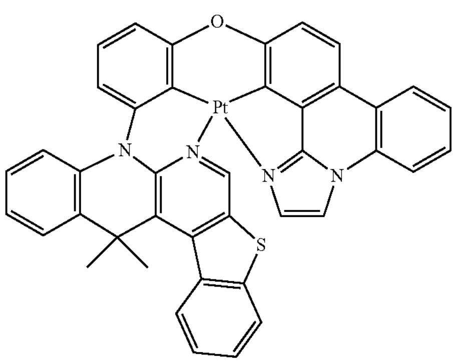
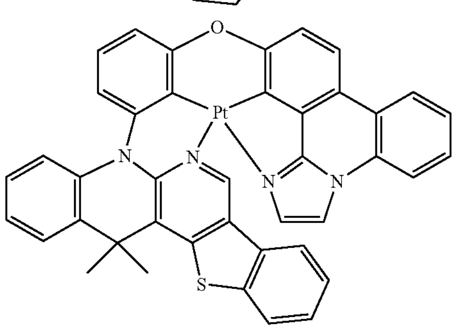
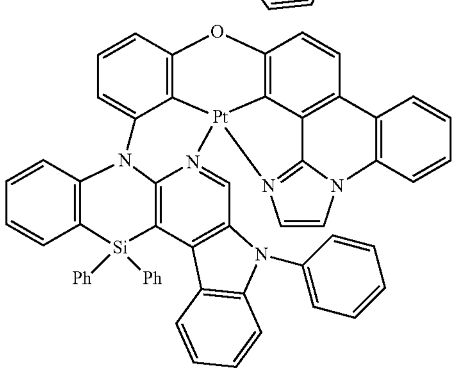
-continued
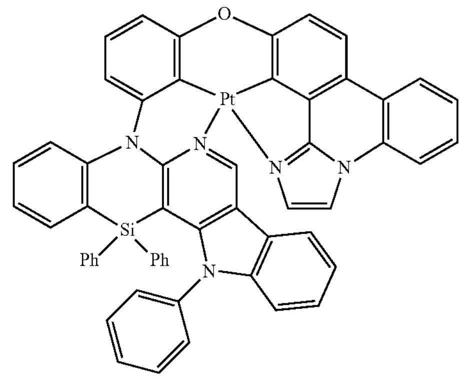
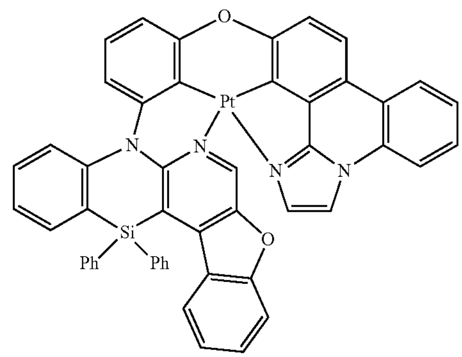
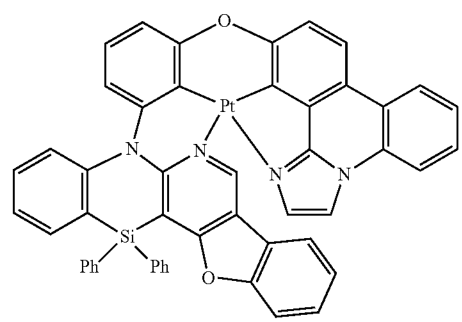
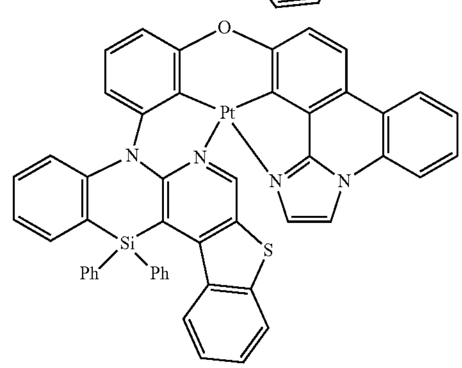
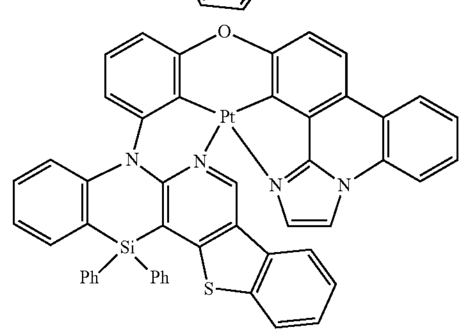

-continued
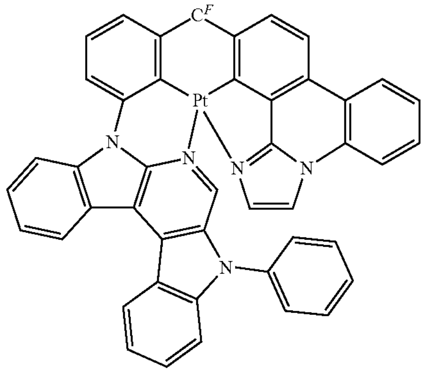
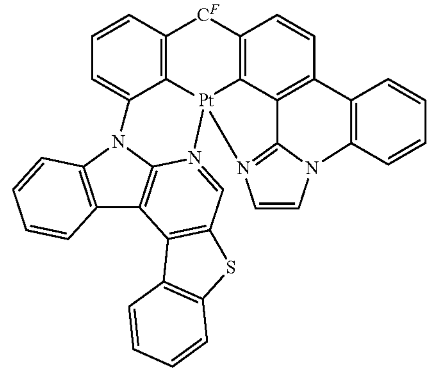
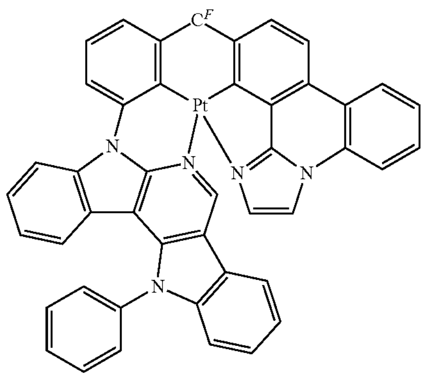
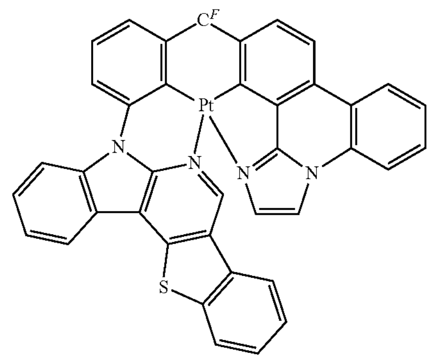
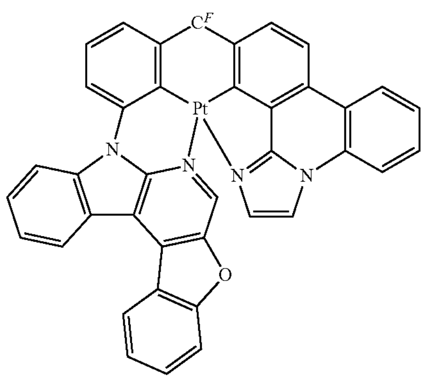
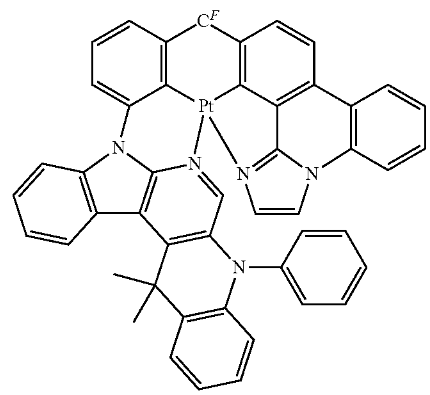
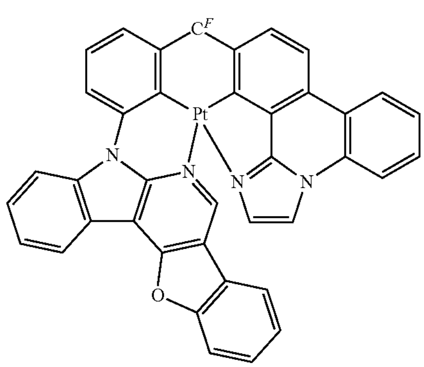
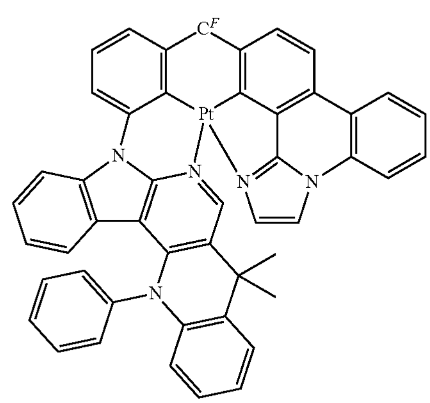

-continued
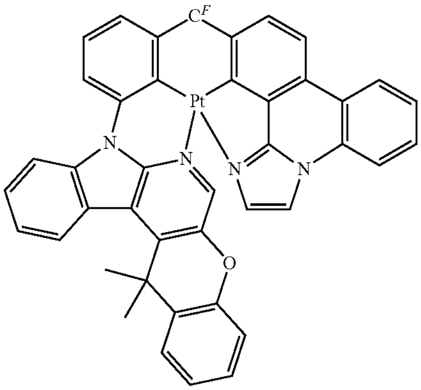
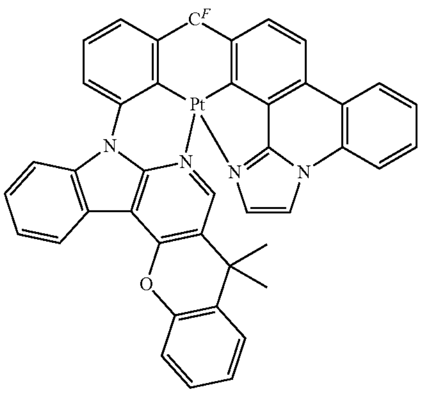
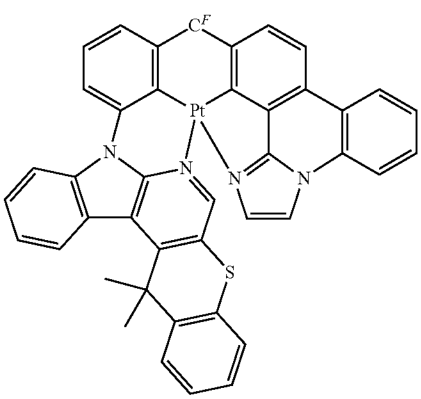
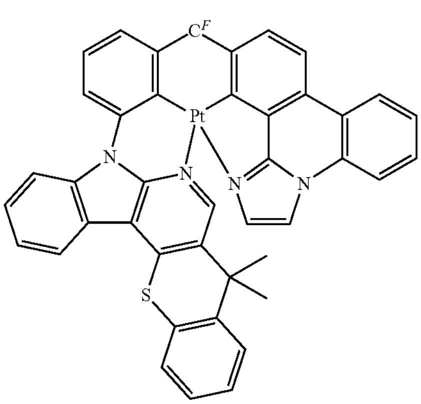
-continued
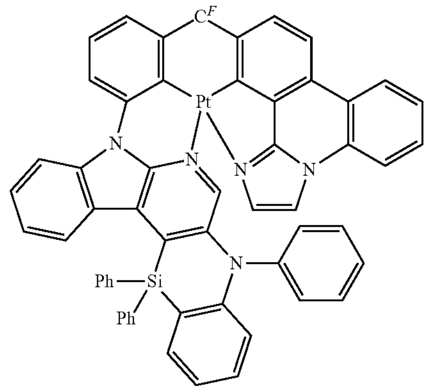
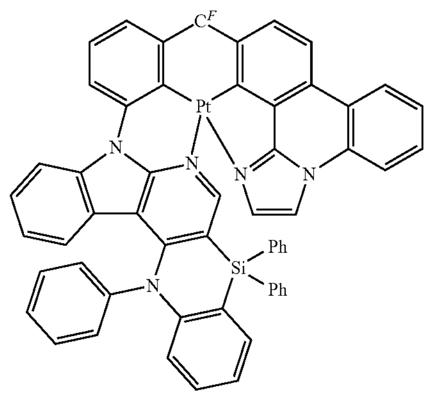
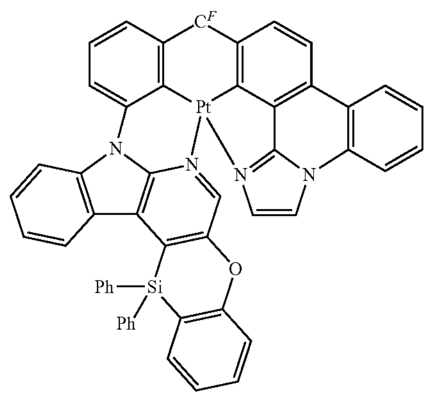
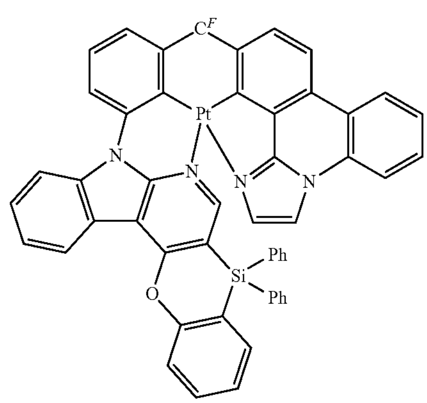

-continued
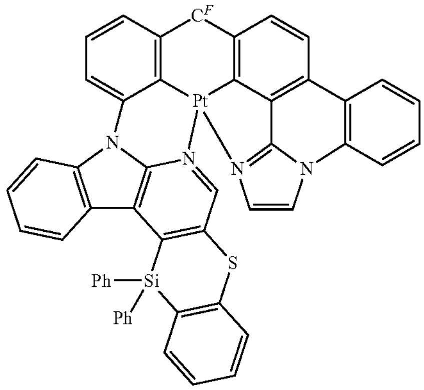
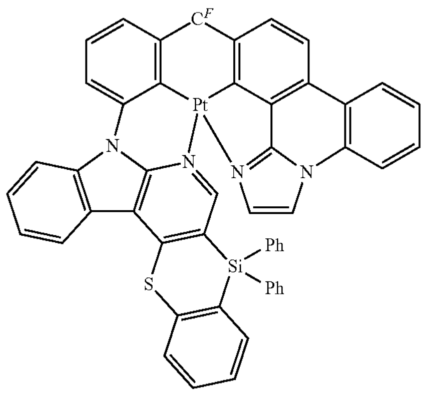
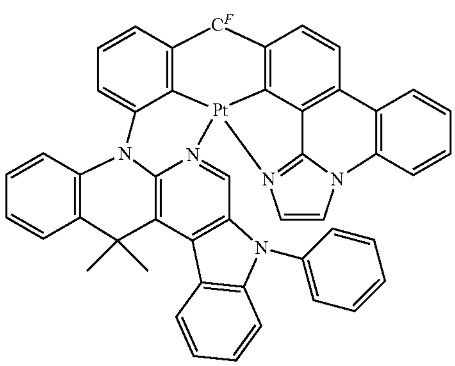
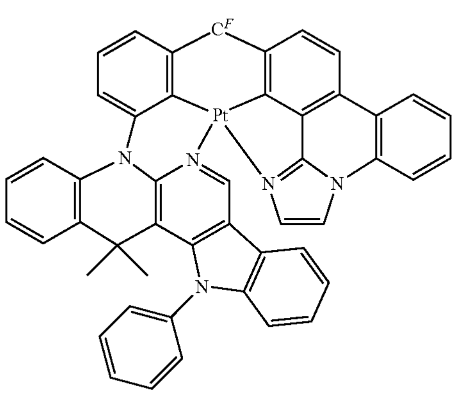
-continued
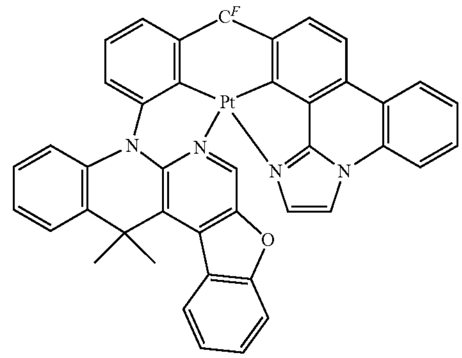
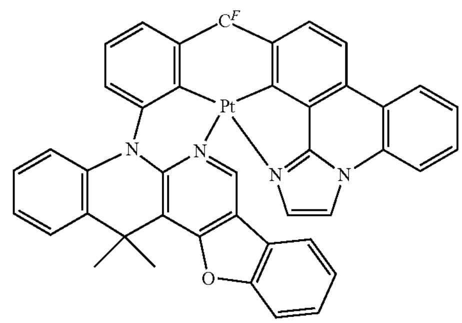
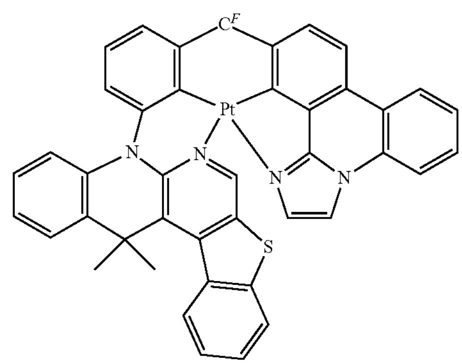
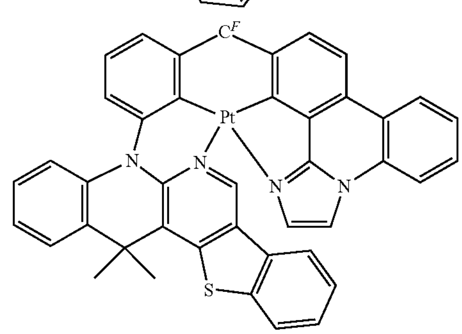
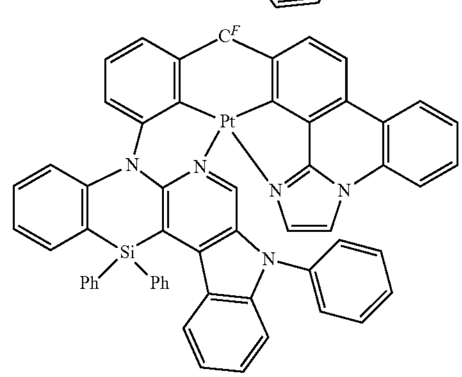

-continued
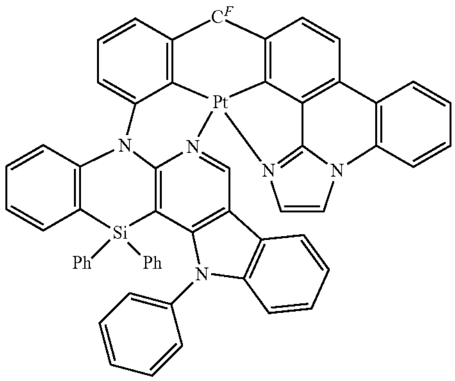
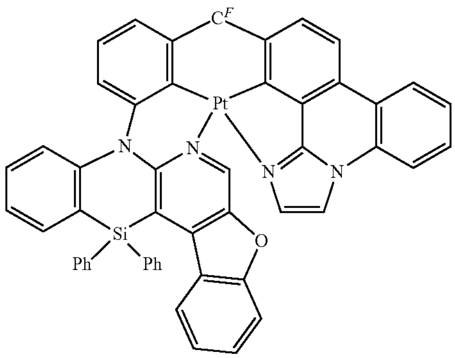
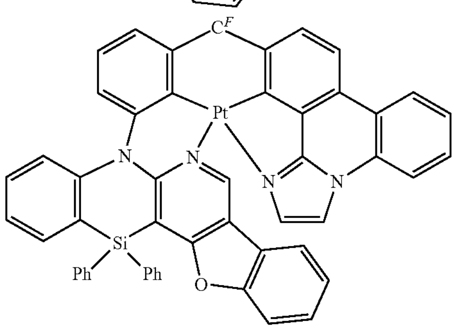
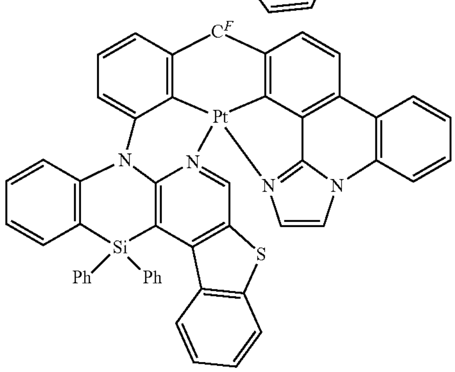
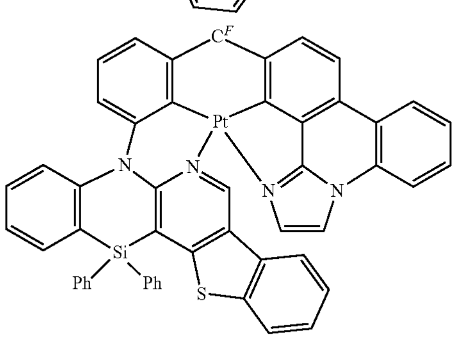
-continued
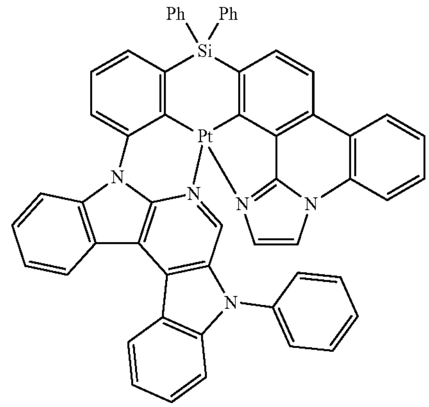
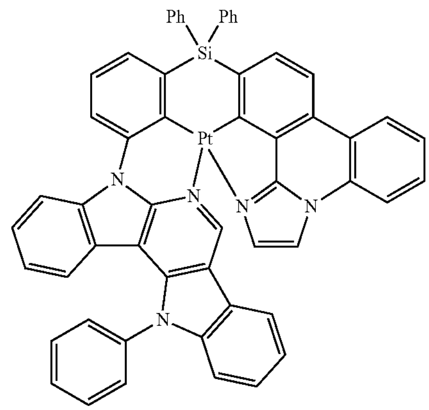
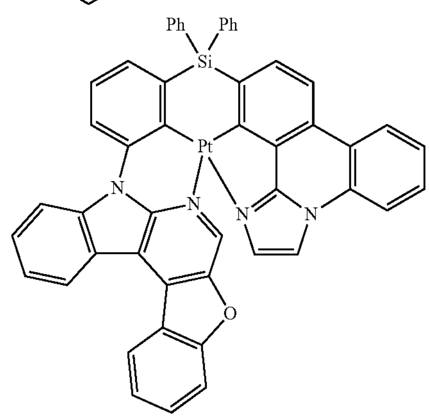
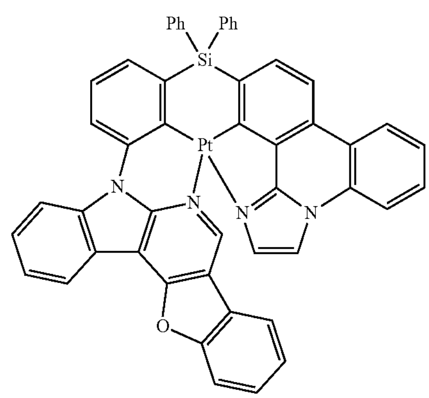

-continued
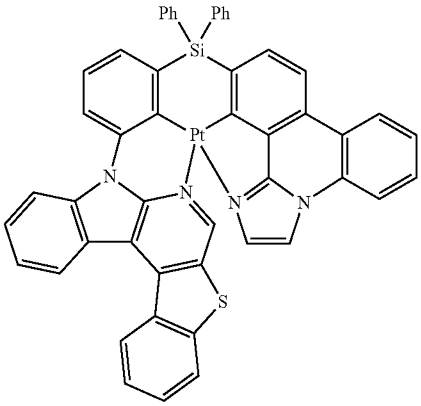
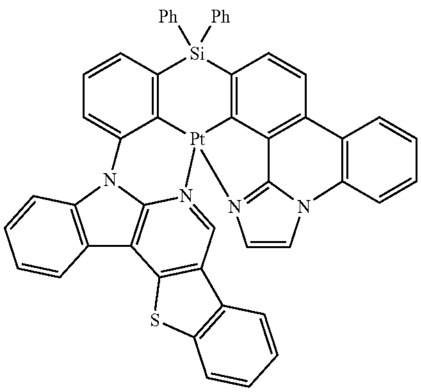
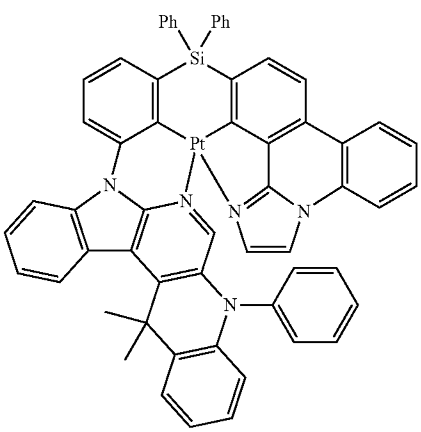
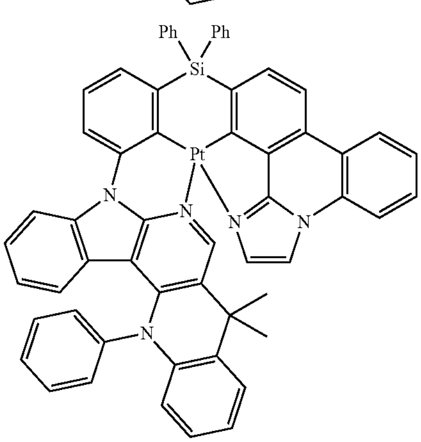
-continued
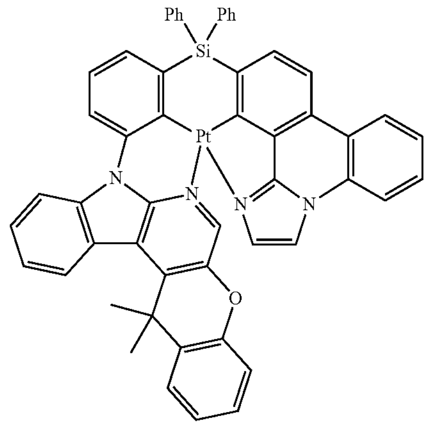
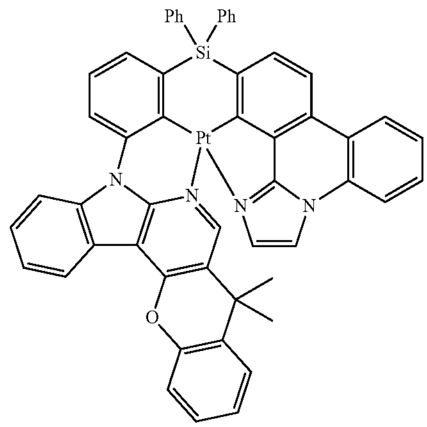
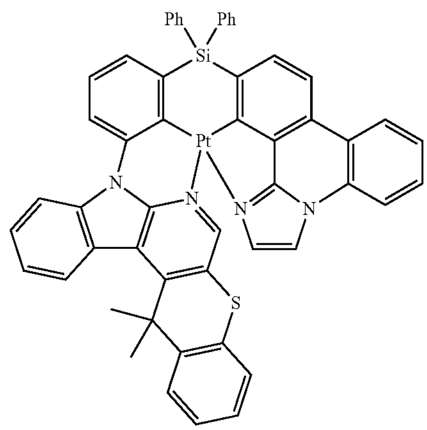
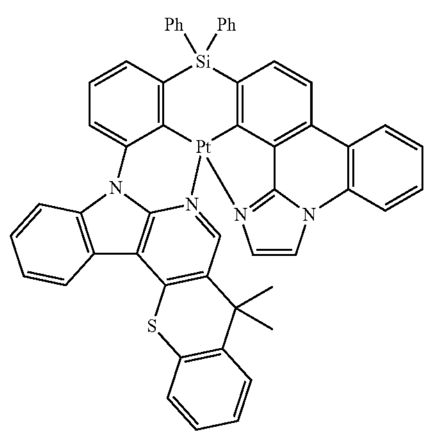

-continued
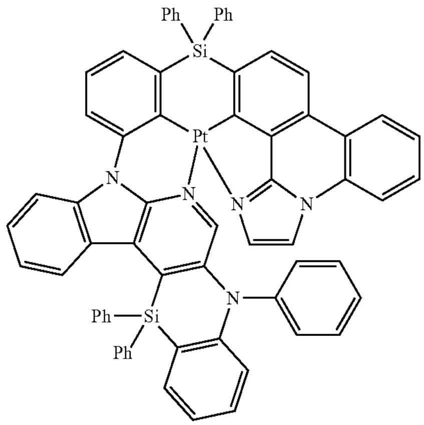
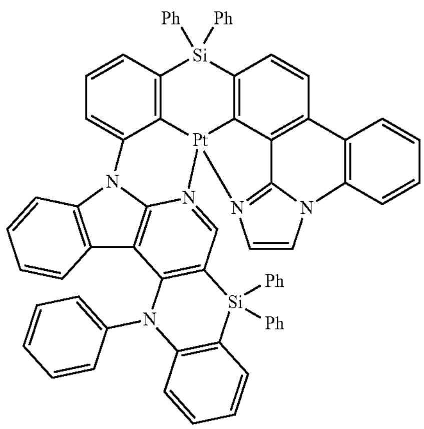
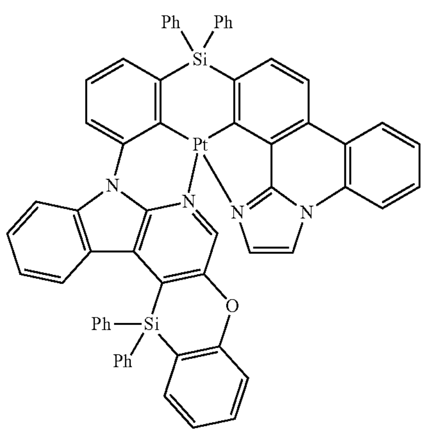
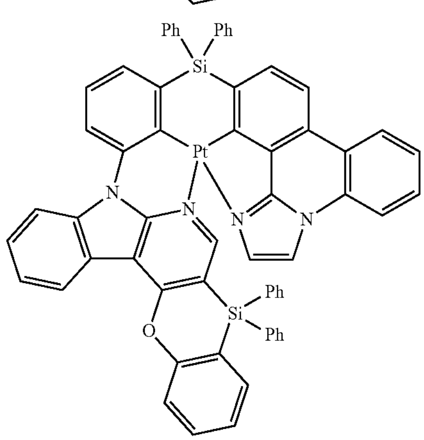
-continued
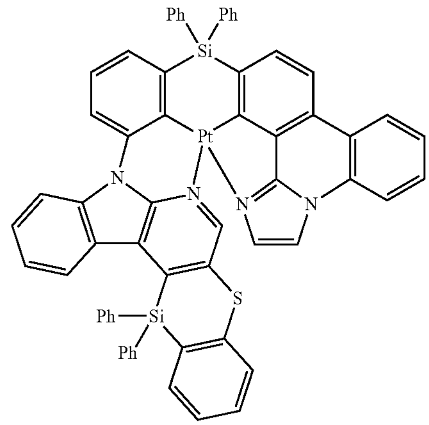
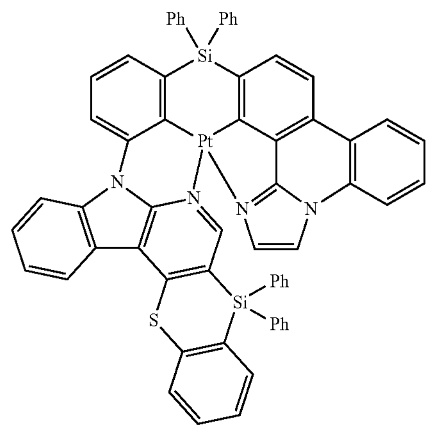
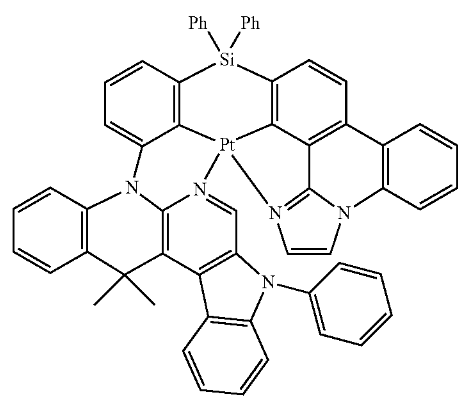
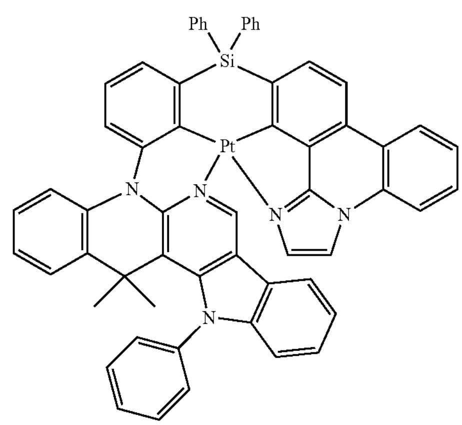

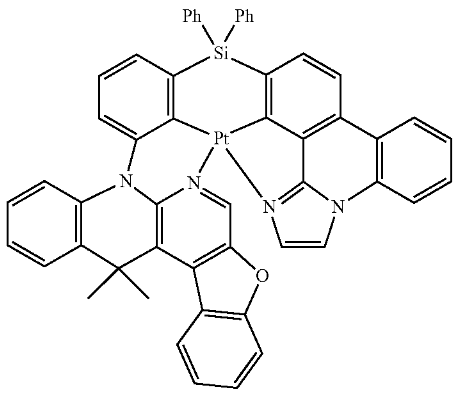
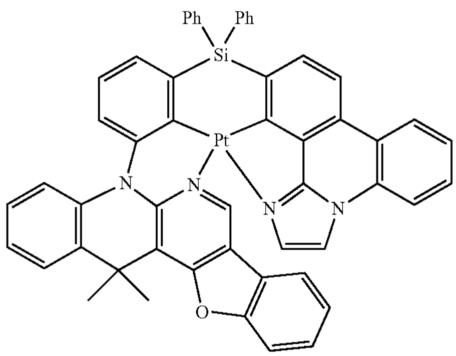
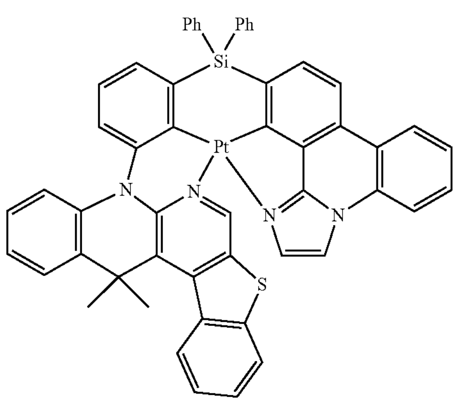
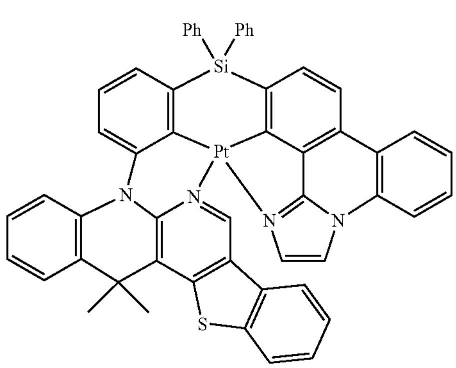
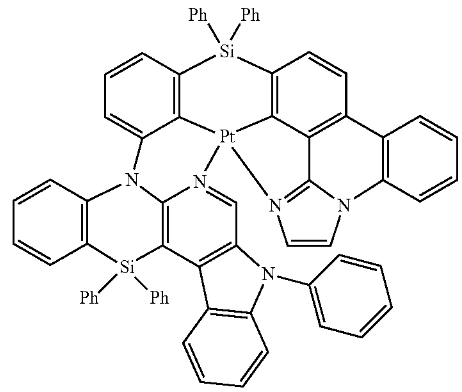
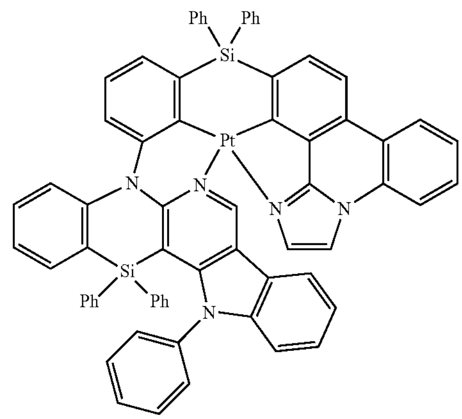
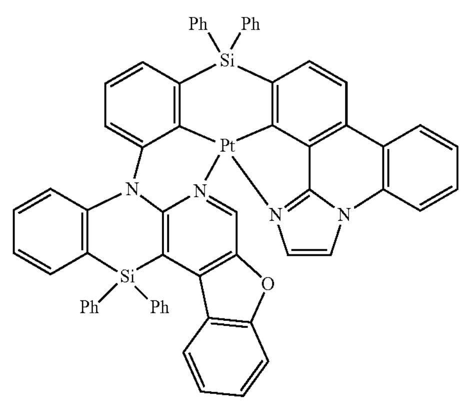
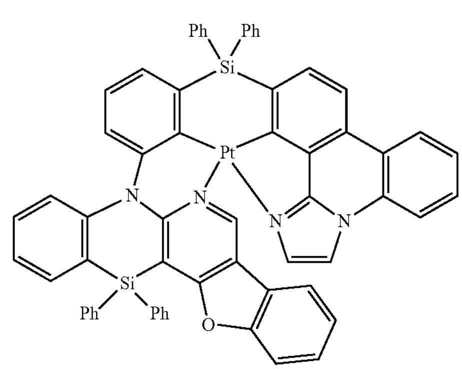

-continued
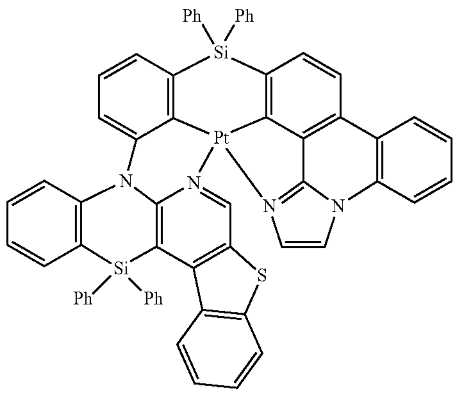
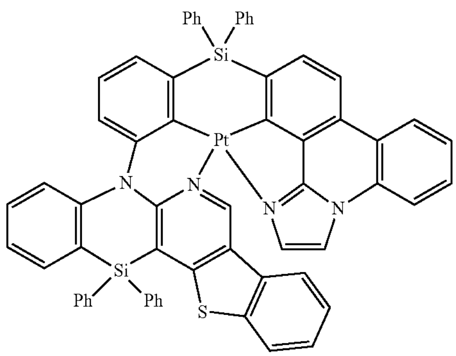
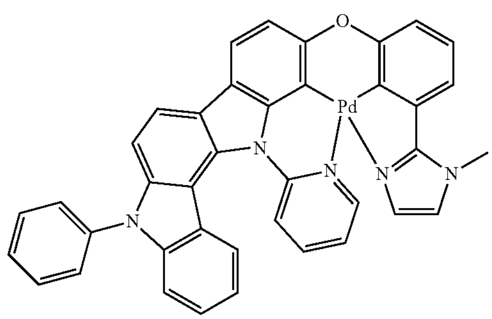
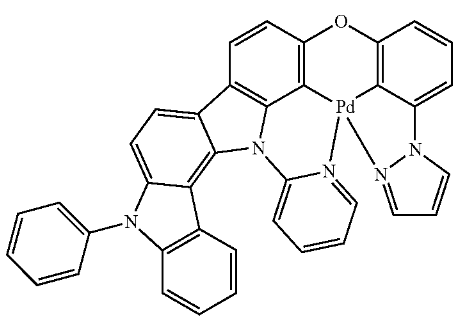
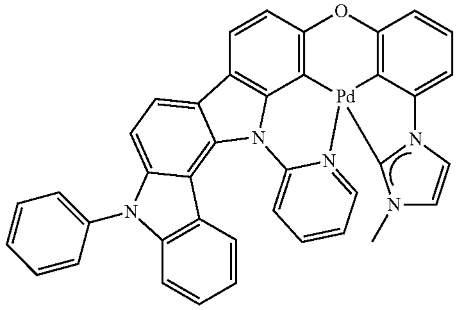
-continued
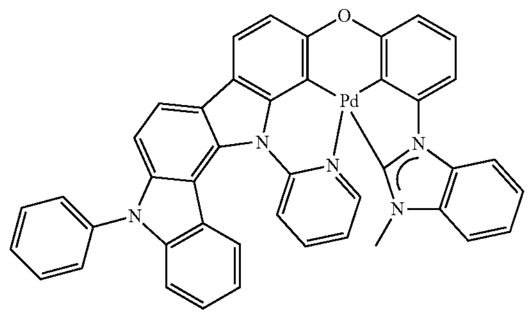
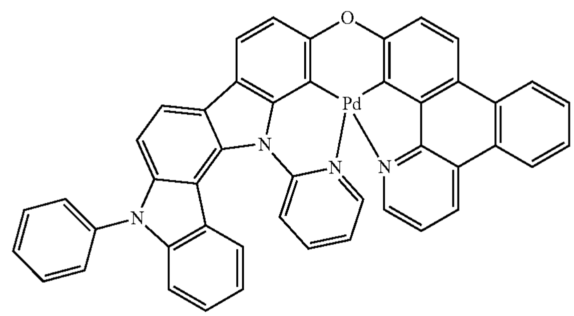
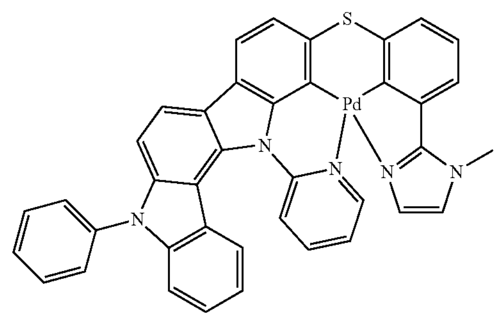
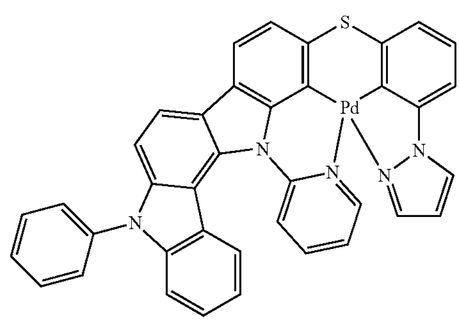
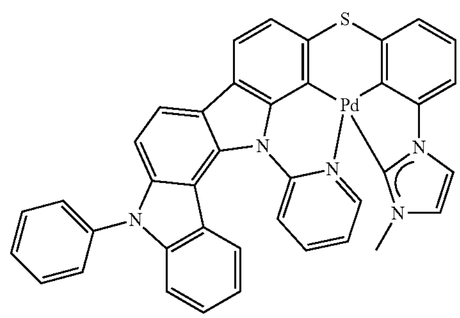

-continued
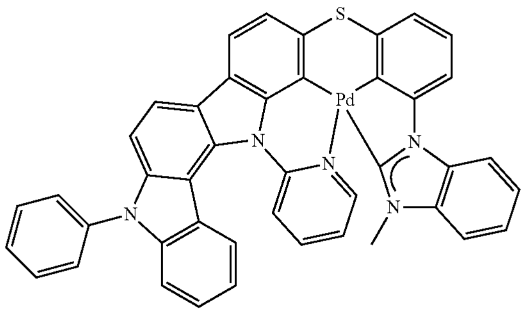
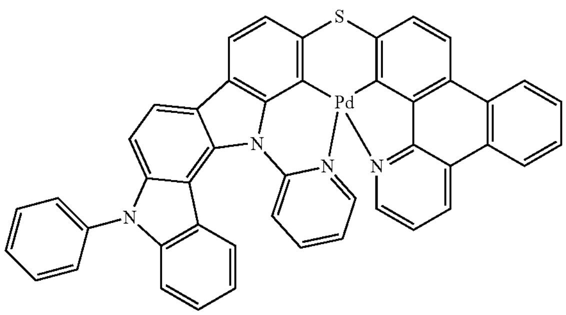
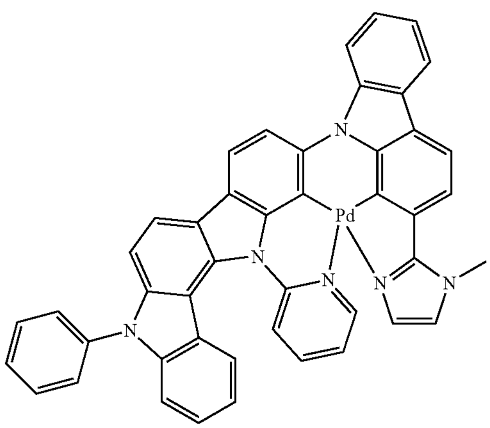
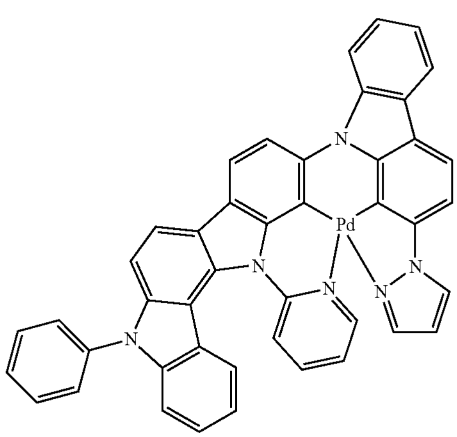
-continued
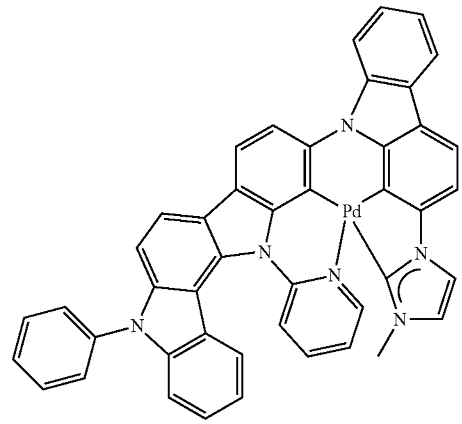
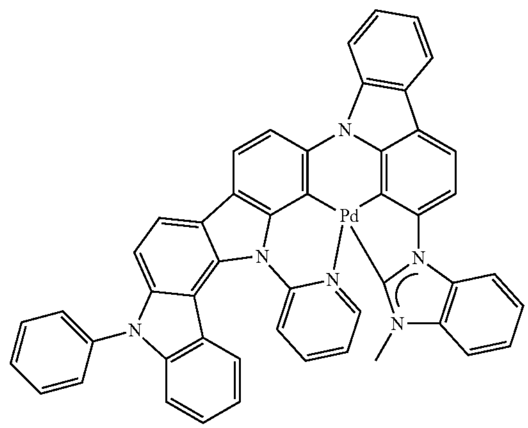
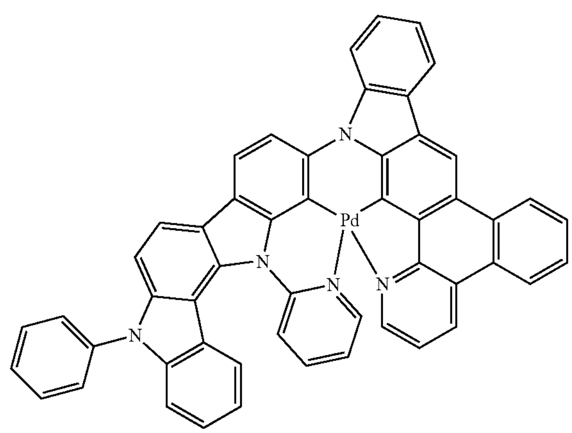
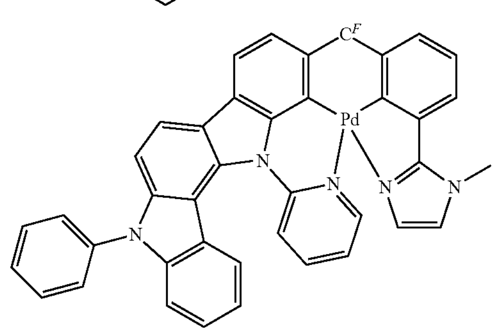

-continued
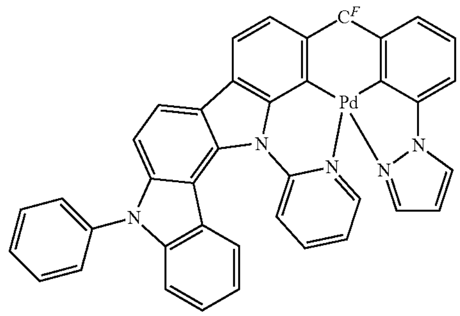
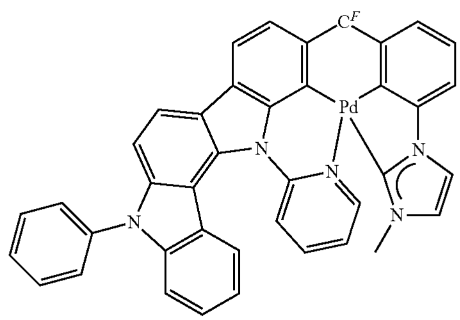
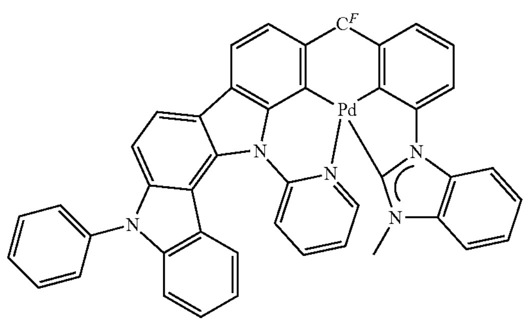
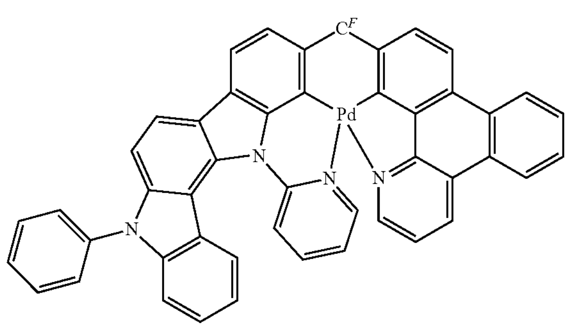
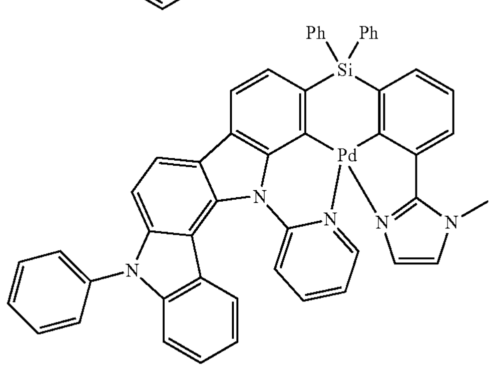
-continued
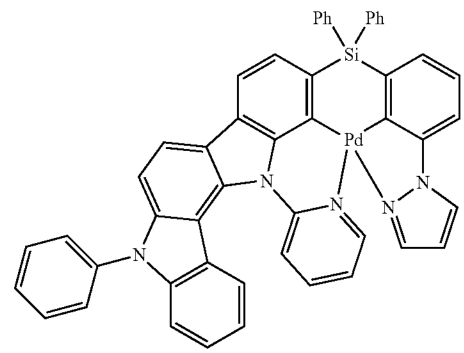
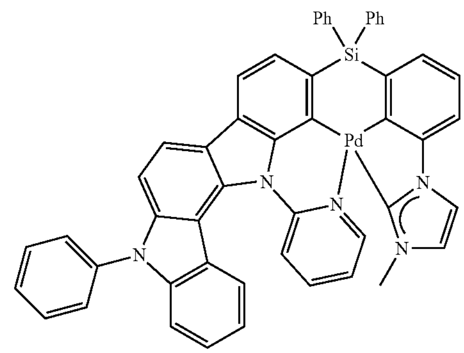
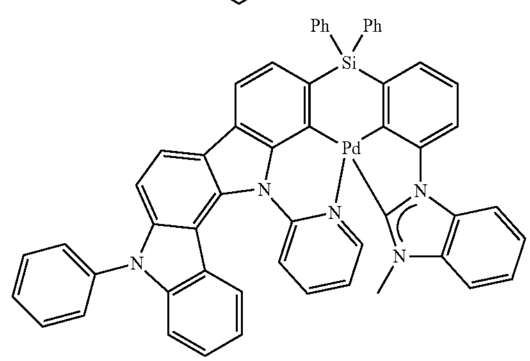
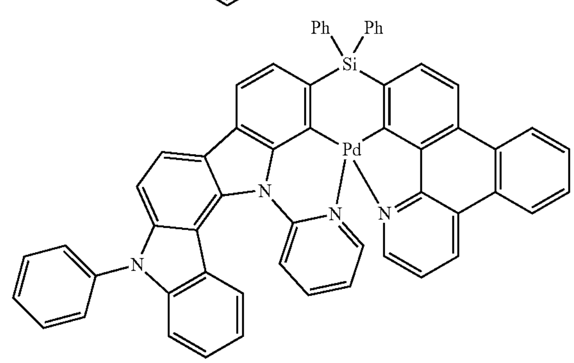
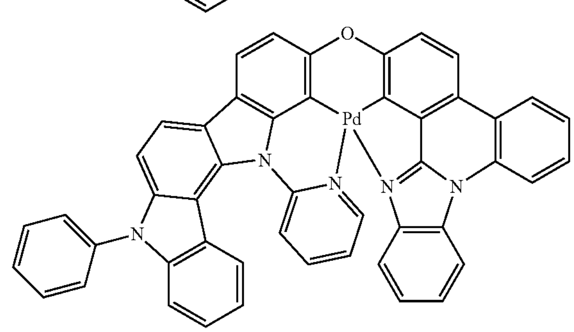

-continued
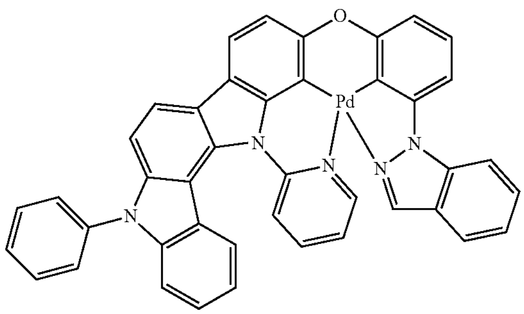
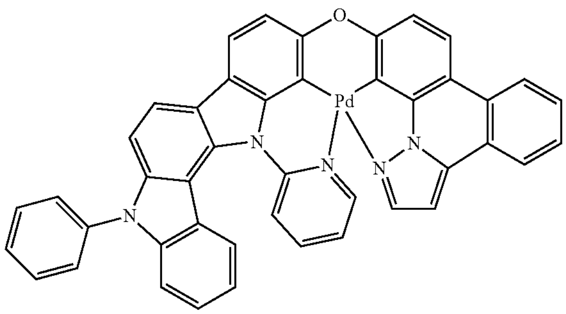
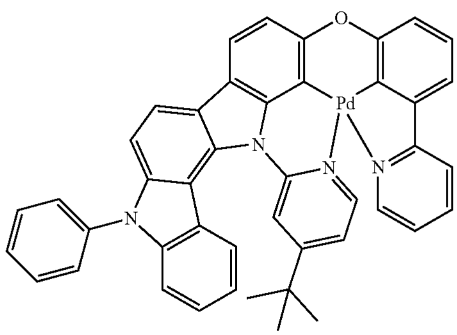
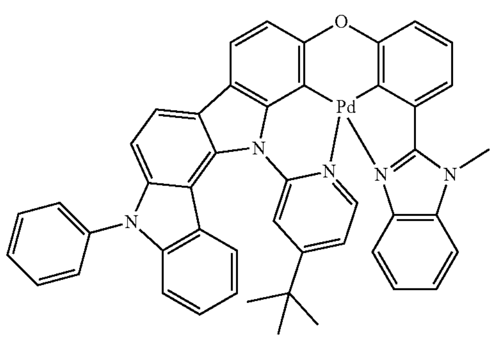
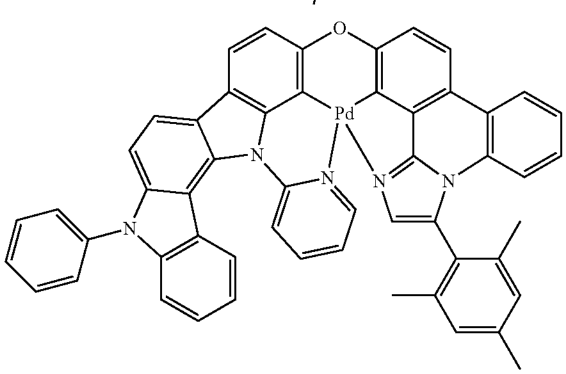
-continued
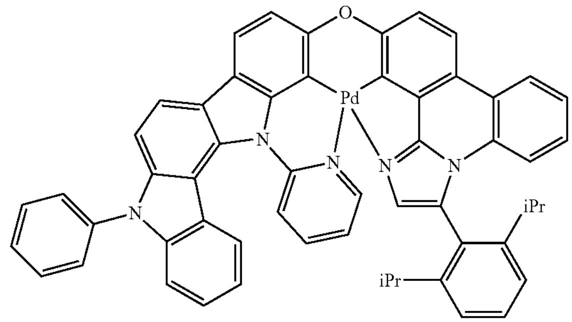
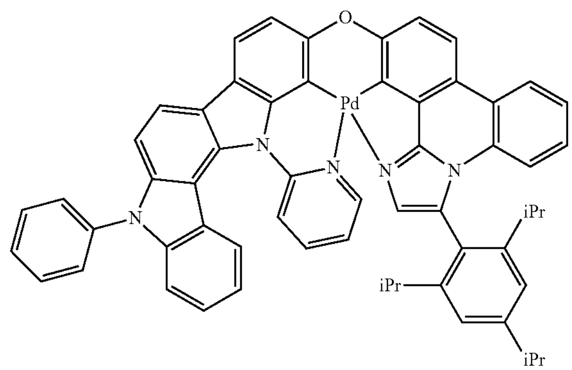
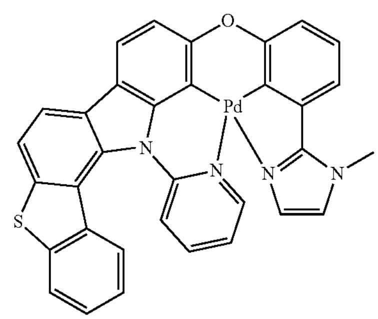
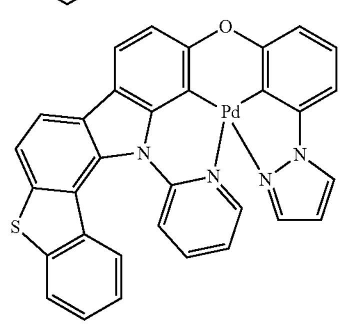
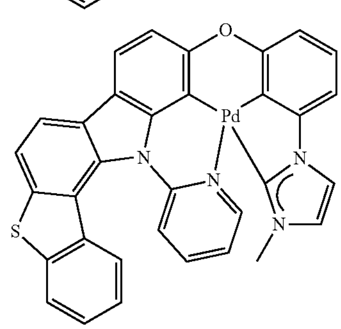

-continued
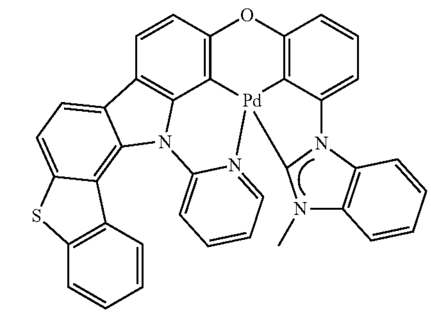
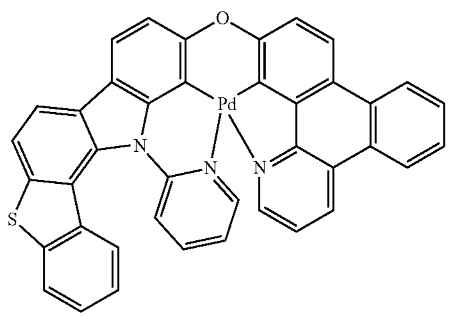
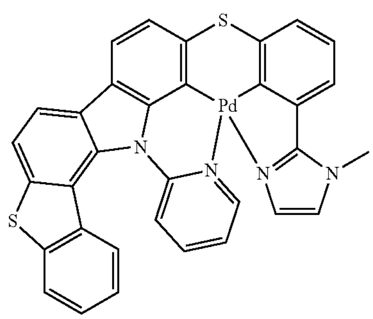
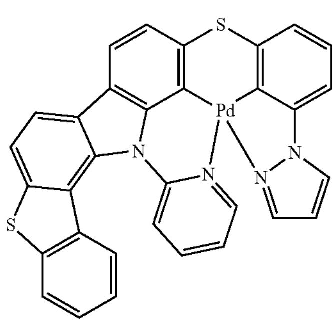
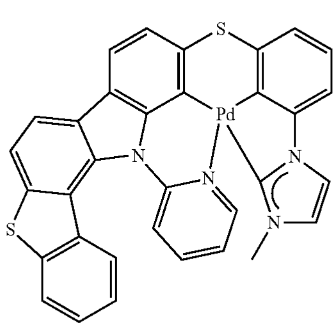
-continued
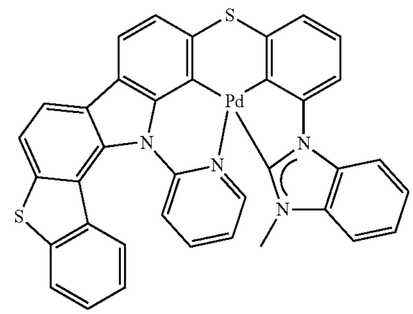
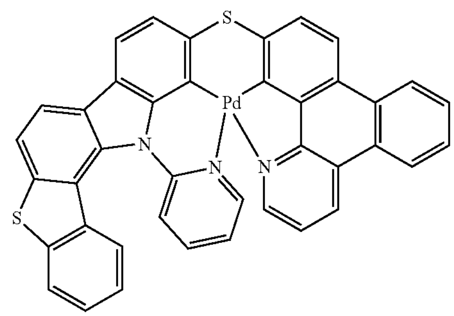
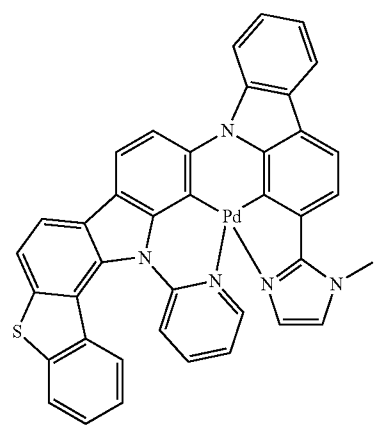
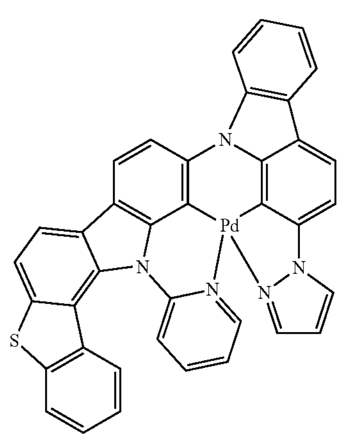

-continued
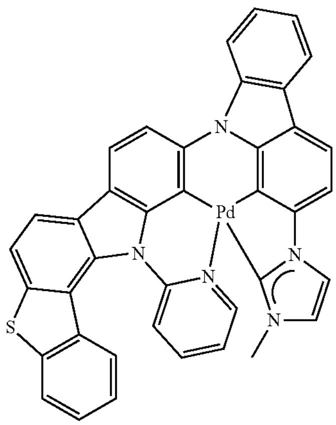
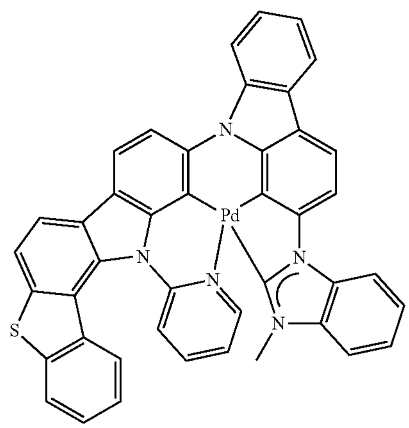
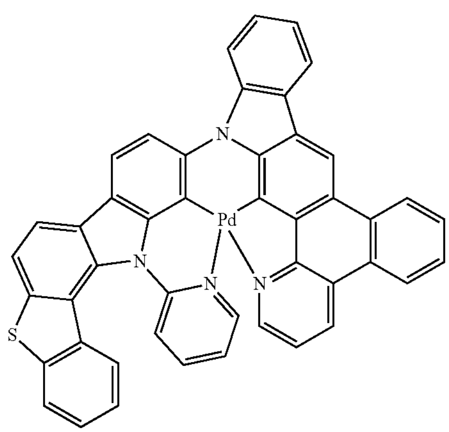
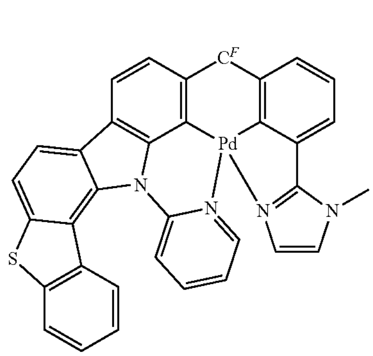
-continued
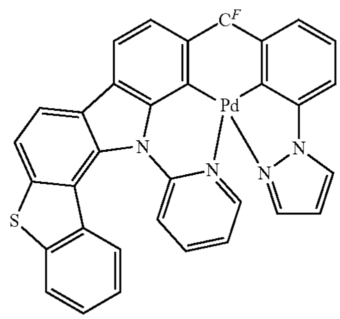
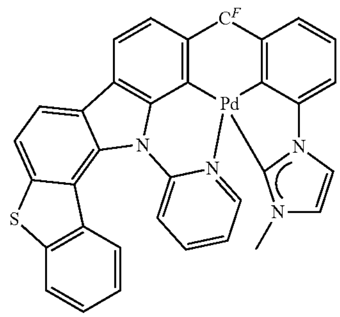
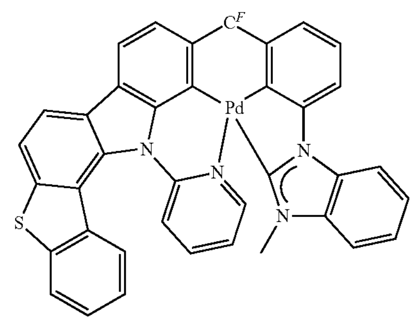
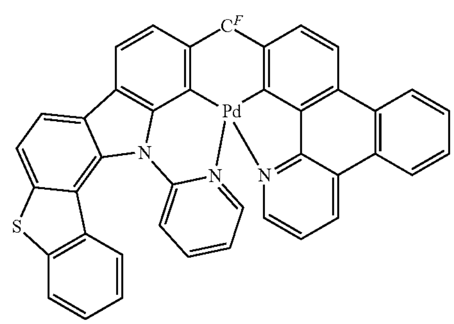
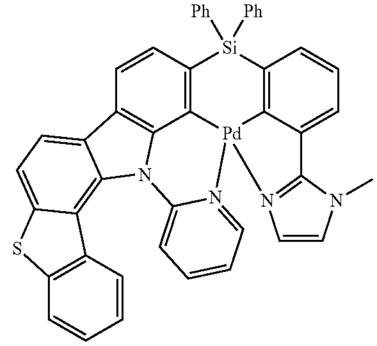

-continued
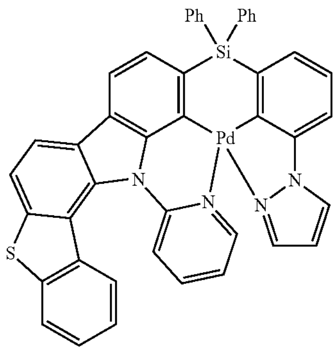
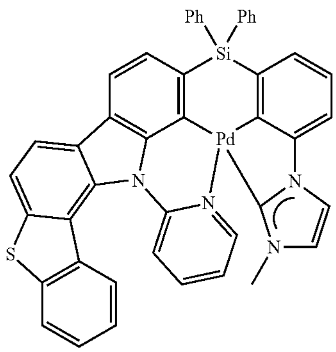
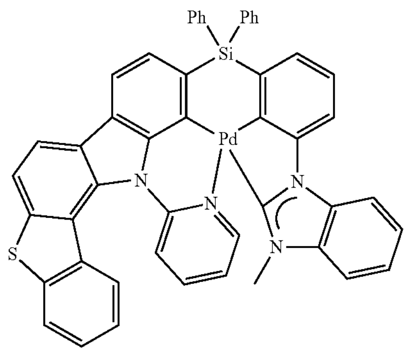
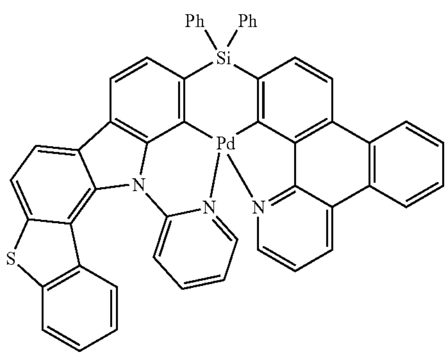
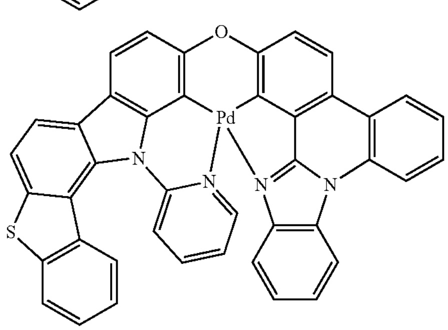
-continued
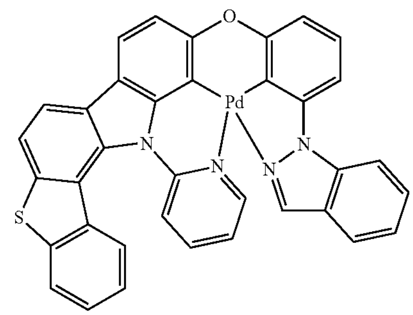
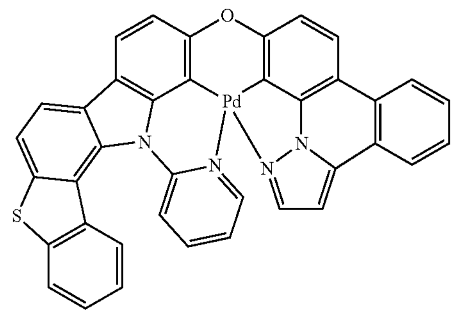
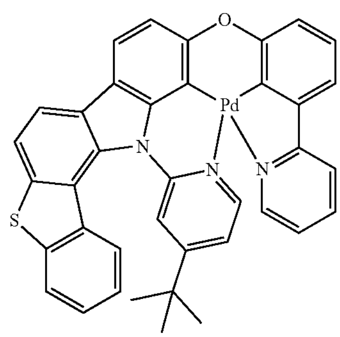
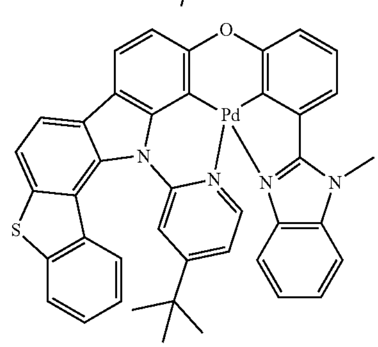
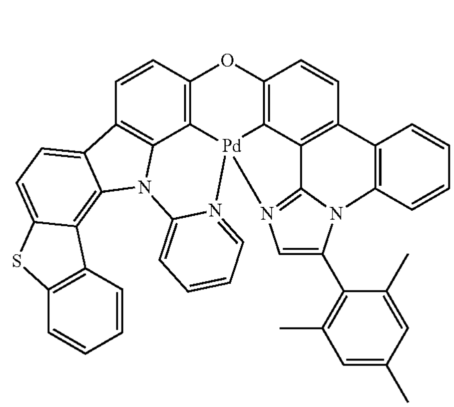

-continued
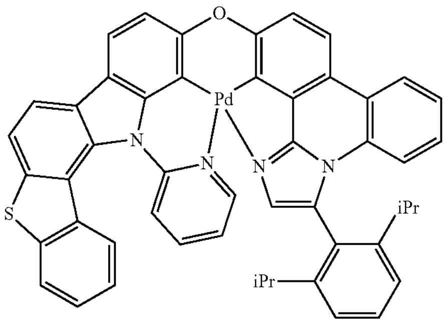
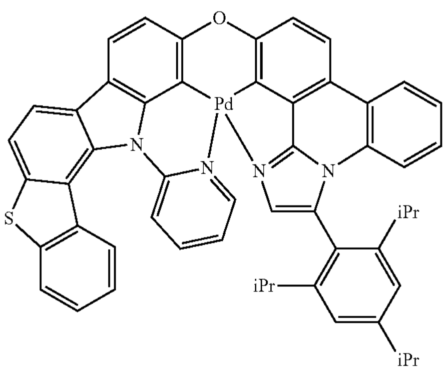
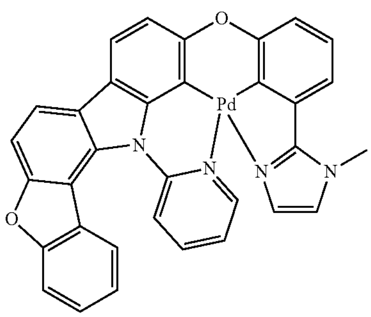
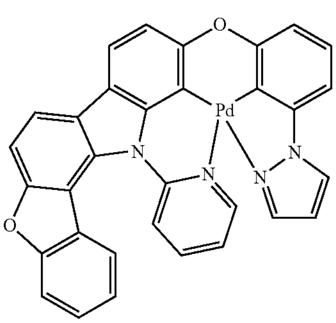
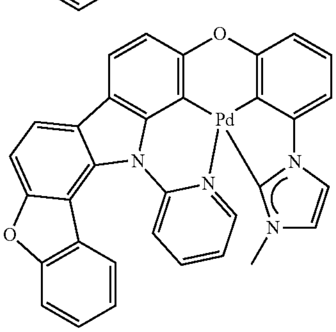
-continued
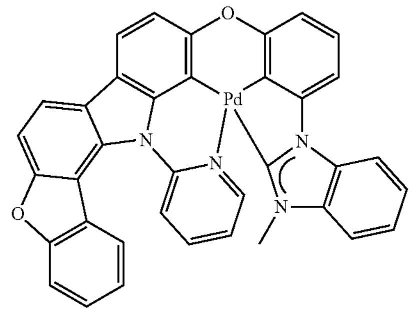
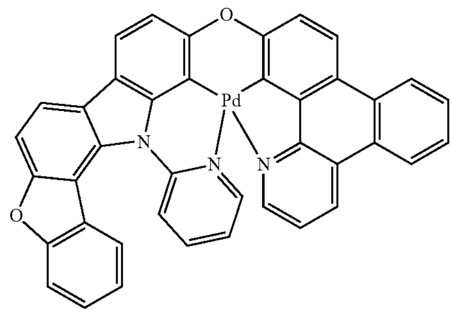
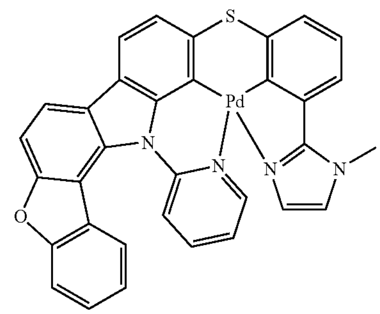
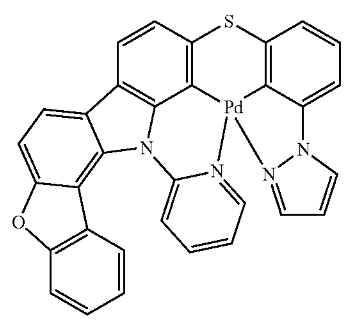
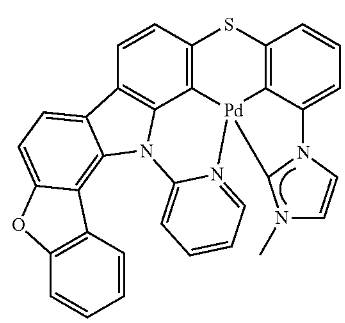

-continued
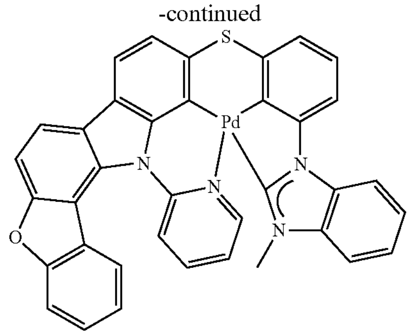
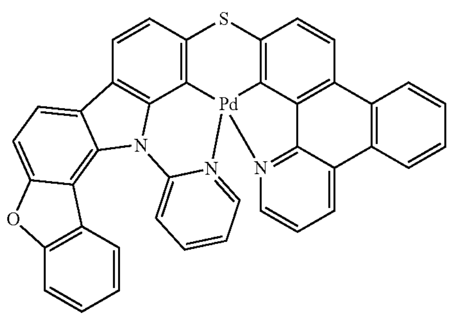
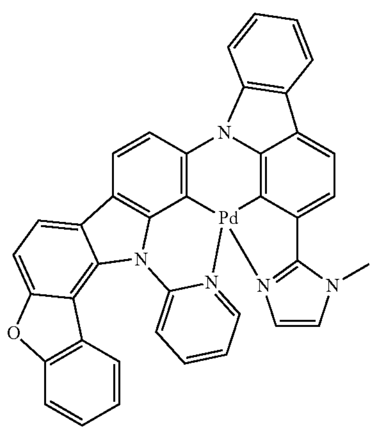
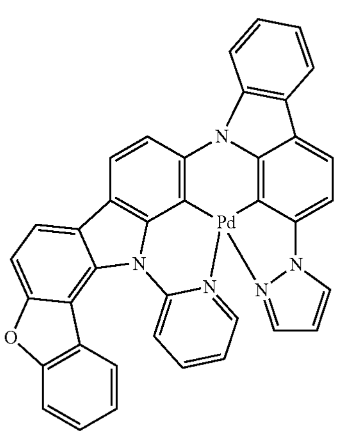
-continued
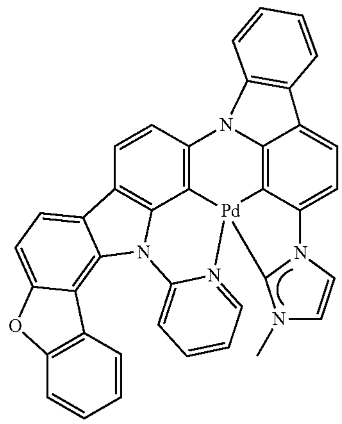
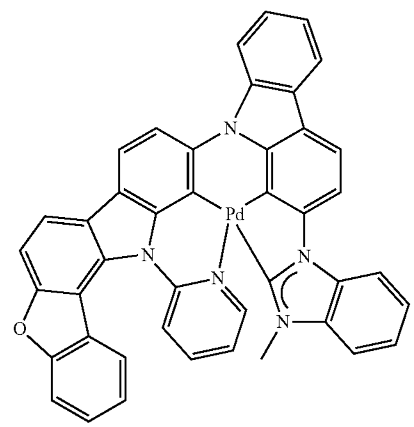
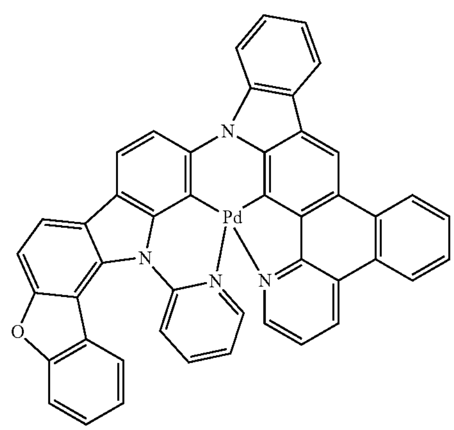
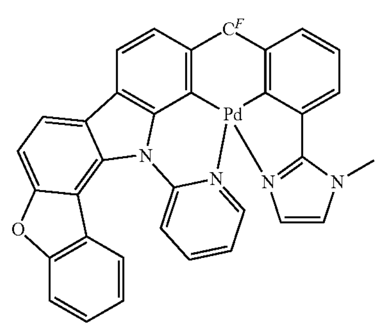

-continued
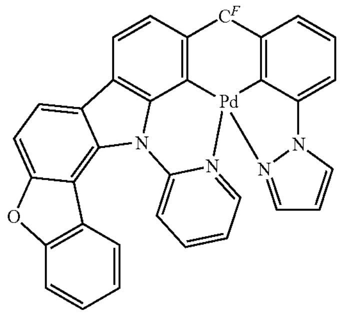
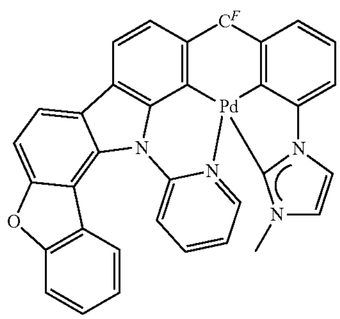
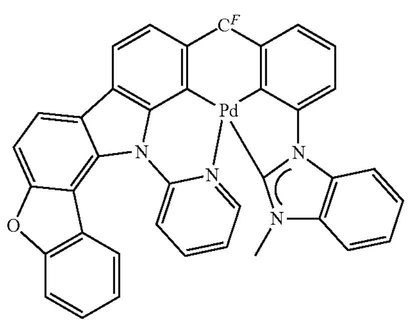
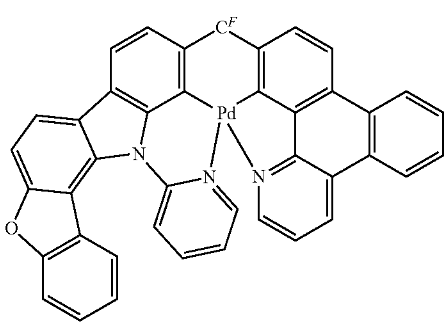
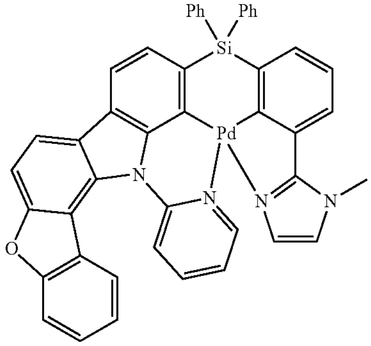
-continued
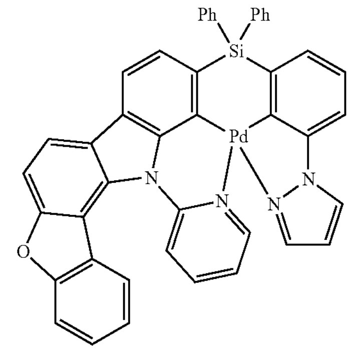
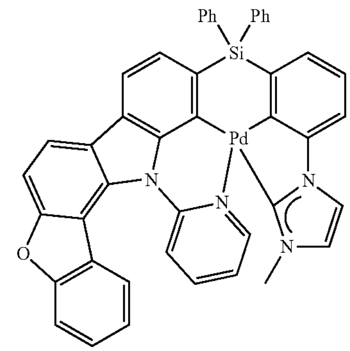
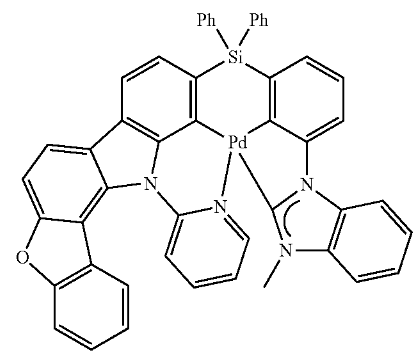
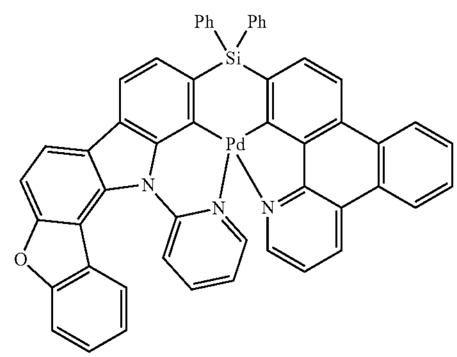
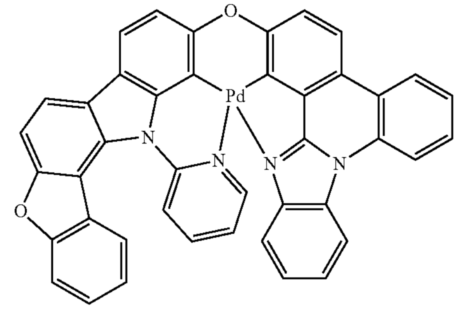

-continued

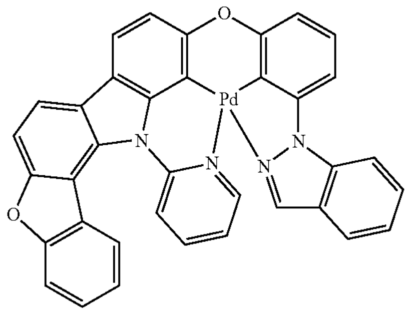

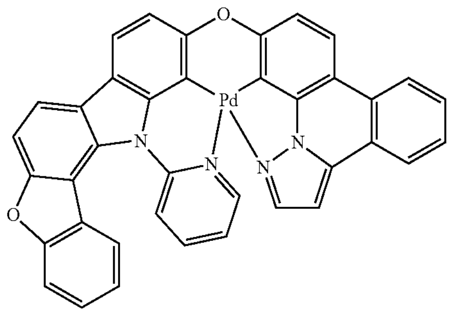

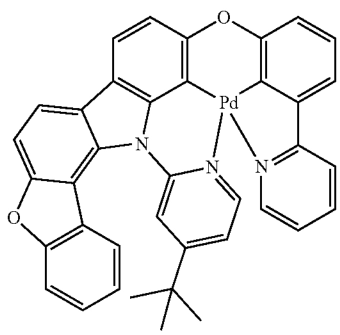

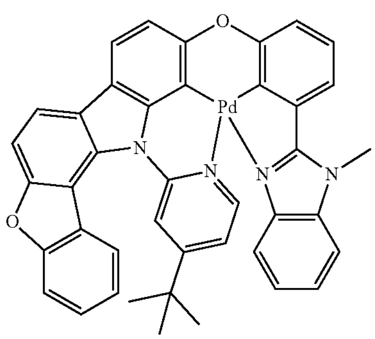

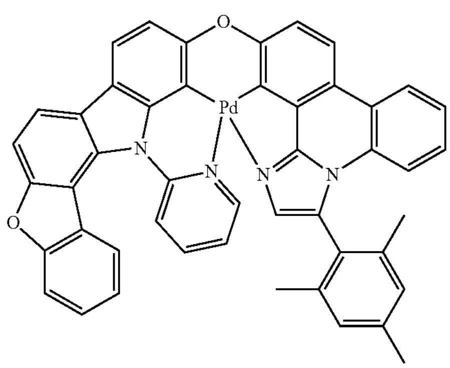

-continued

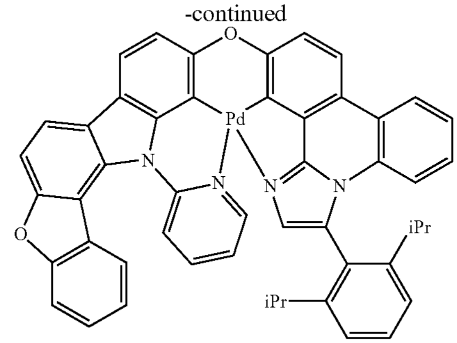

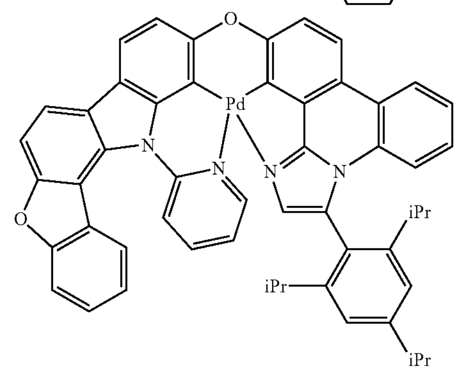

As referred to herein, a linking atom or group connects two atoms such as, for example, an N atom and a C atom. A linking atom or group is in one aspect disclosed as $L^1$, $L^2$, $L^3$, etc. herein. The linking atom can optionally, if valency permits, have other chemical moieties attached. For example, in one aspect, an oxygen would not have any other chemical groups attached as the valency is satisfied once it is bonded to two groups (e.g., N and/or C groups). In another aspect, when carbon is the linking atom, two additional chemical moieties can be attached to the carbon. Suitable chemical moieties include amine, amide, thiol, aryl, heteroaryl, cycloalkyl, and heterocyclyl moieties. The term "cyclic structure" or the like terms used herein refer to any cyclic chemical structure which includes, but is not limited to, aryl, heteroaryl, cycloalkyl, cycloalkenyl, heterocyclyl, carbene, and N-heterocyclic carbene.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

In defining various terms, "$A^1$", "$A^2$", "$A^3$", "$A^4$" and "$A^5$" are used herein as generic symbols to represent various specific substituents. These symbols can be any substituent, not limited to those disclosed herein, and when they are defined to be certain substituents in one instance, they can, in another instance, be defined as some other substituents.

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dode cyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, norbornyl, and the like. The term "heterocycloalkyl" is a type of cycloalkyl group as defined above, and is included within the meaning of the term "cycloalkyl," where at least one of the carbon atoms of the ring is replaced with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, cycloalkyl, alkoxy, amino, ether, halide, hydroxy, nitro, silyl, sulfo-oxo, or thiol as described herein.

The terms "alkoxy" and "alkoxyl" as used herein to refer to an alkyl or cycloalkyl group bonded through an ether linkage, that is, an "alkoxy" group can be defined as —$OA^1$ where $A^1$ is alkyl or cycloalkyl as defined above. "Alkoxy" also includes polymers of alkoxy groups as just described; that is, an alkoxy can be a polyether such as —$OA^1$-$OA^2$ or —$OA^1$-$(OA^2)_a$-$OA^3$, where "a" is an integer of from 1 to 200 and $A^1$, $A^2$, and $A^3$ are alkyl and/or cycloalkyl groups.

The term "alkenyl" as used herein is a hydrocarbon group of from 2 to 24 carbon atoms with a structural formula containing at least one carbon-carbon double bond. Asymmetric structures such as $(A^1A^2)C{=}C(A^3A^4)$ are intended to include both the E and Z isomers. This can be presumed in structural formulae herein wherein an asymmetric alkene is present, or it can be explicitly indicated by the bond symbol C═C. The alkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkenyl" as used herein is a non-aromatic carbon-based ring composed of at least three carbon atoms and containing at least one carbon-carbon double bound, i.e., C═C. Examples of cycloalkenyl groups include, but are not limited to, cyclopropenyl, cyclobutenyl, cyclopentenyl, cyclopentadienyl, cyclohexenyl, cyclohexadienyl, norbornenyl, and the like. The term "heterocycloalkenyl" is a type of cycloalkenyl group as defined above, and is included within the meaning of the term "cycloalkenyl," where at least one of the carbon atoms of the ring is replaced with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "alkynyl" as used herein is a hydrocarbon group of 2 to 24 carbon atoms with a structural formula containing at least one carbon-carbon triple bond. The alkynyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkynyl" as used herein is a non-aromatic carbon-based ring composed of at least seven carbon atoms and containing at least one carbon-carbon triple bound. Examples of cycloalkynyl groups include, but are not limited to, cycloheptenyl, cyclooctynyl, cyclononynyl, and the like. The term "heterocycloalkynyl" is a type of cycloalkenyl group as defined above, and is included within the meaning of the term "cycloalkynyl," where at least one of the carbon atoms of the ring is replaced with a heteroatom such as, but not limited to, nitrogen, oxygen, sulfur, or phosphorus. The cycloalkynyl group and heterocycloalkynyl group can be substituted or unsubstituted. The cycloalkynyl group and heterocycloalkynyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein. The term "biaryl" is a specific type of aryl group and is included in the definition of "aryl." Biaryl refers to two aryl groups that are bound together via a fused ring structure, as in naphthalene, or are attached via one or more carbon-carbon bonds, as in biphenyl.

The term "aldehyde" as used herein is represented by the formula —C(O)H. Throughout this specification "C(O)" is a short hand notation for a carbonyl group, i.e., C═O.

The terms "amine" or "amino" as used herein are represented by the formula $—NA^1A^2$, where $A^1$ and $A^2$ can be, independently, hydrogen or alkyl, cycloalkyl, alkenyl, cycloalkenyl, alkynyl, cycloalkynyl, aryl, or heteroaryl group as described herein.

The term "alkylamino" as used herein is represented by the formula —NH(-alkyl) where alkyl is a described herein. Representative examples include, but are not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl) amino group, hexylamino group, and the like.

The term "dialkylamino" as used herein is represented by the formula $—N(\text{-alkyl})_2$ where alkyl is a described herein. Representative examples include, but are not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N-ethyl-N-propylamino group and the like.

The term "carboxylic acid" as used herein is represented by the formula —C(O)OH.

The term "ester" as used herein is represented by the formula $—OC(O)A^1$ or $—C(O)OA^1$, where $A^1$ can be alkyl, cycloalkyl, alkenyl, cycloalkenyl, alkynyl, cycloalkynyl, aryl, or heteroaryl group as described herein. The term "polyester" as used herein is represented by the formula $-(A^1O(O)C-A^2-C(O)O)_a—$ or $-(A^1O(O)C-A^2-OC(O))_a—$, where $A^1$ and $A^2$ can be, independently, an alkyl, cycloalkyl, alkenyl, cycloalkenyl, alkenyl, cycloalkynyl, aryl, or heteroaryl group described herein and "a" is an integer from 1 to 500. "Polyester" is as the term used to describe a group that is produced by the reaction between a compound having at least two carboxylic acid groups with a compound having at least two hydroxyl groups.

The term "ether" as used herein is represented by the formula $A^1OA^2$, where $A^1$ and $A^2$ can be, independently, an alkyl, cycloalkyl, alkenyl, cycloalkenyl, alkynyl, cycloalkynyl, aryl, or heteroaryl group described herein. The term "polyether" as used herein is represented by the formula $-(A^1O-A^2O)_a—$, where $A^1$ and $A^2$ can be, independently, an alkyl, cycloalkyl, alkenyl, cycloalkenyl, alkynyl, cycloalkynyl, aryl, or heteroaryl group described herein and "a" is an integer of from 1 to 500. Examples of polyether groups include polyethylene oxide, polypropylene oxide, and polybutylene oxide.

The term "halide" or "halo" as used herein refers to the halogens fluorine, chlorine, bromine, and iodine.

The term "heterocyclyl," as used herein refers to single and multi-cyclic non-aromatic ring systems and "heteroaryl as used herein refers to single and multi-cyclic aromatic ring systems: in which at least one of the ring members is other than carbon. The terms includes azetidine, dioxane, furan, imidazole, isothiazole, isoxazole, morpholine, oxazole, oxazole, including, 1,2,3-oxadiazole, 1,2,5-oxadiazole and 1,3,4-oxadiazole, piperazine, piperidine, pyrazine, pyrazole, pyridazine, pyridine, pyrimidine, pyrrole, pyrrolidine, tetrahydrofuran, tetrahydropyran, tetrazine, including 1,2,4,5-tetrazine, tetrazole, including 1,2,3,4-tetrazole and 1,2,4,5-tetrazole, thiadiazole, including, 1,2,3-thiadiazole, 1,2,5-thiadiazole, and 1,3,4-thiadiazole, thiazole, thiophene, triazine, including 1,3,5-triazine and 1,2,4-triazine, triazole, including, 1,2,3-triazole, 1,3,4-triazole, and the like.

The term "hydroxyl" as used herein is represented by the formula —OH.

The term "ketone" as used herein is represented by the formula $A^1C(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "azide" as used herein is represented by the formula $—N_3$.

The term "nitro" as used herein is represented by the formula $—NO_2$.

The term "cyanide" as used herein is represented by the formula —CN.

The term "silyl" as used herein is represented by the formula $—SiA^1A^2A^3$, where $A^1$. $A^2$, and $A^3$ can be, independently, hydrogen or an alkyl, cycloalkyl, alkoxy, alkenyl, cycloalkenyl, alkynyl, cycloalkynyl, aryl, or heteroaryl group as described herein.

The term "sulfo-oxo" as used herein is represented by the formulas $—S(O)A^1$, $—S(O)_2A^1$, $—OS(O)_2A^1$, or $—OS(O)_2OA^1$, where $A^1$ can be hydrogen or an alkyl, cycloalkyl, alkenyl, cycloalkenyl, alkynyl, cycloalkynyl, aryl, or heteroaryl group as described herein. Throughout this specification "S(O)" is a short hand notation for S═O. The term "sulfonyl" is used herein to refer to the sulfo-oxo group represented by the formula $—S(O)_2A^1$, where $A^1$ can be hydrogen or an alkyl, cycloalkyl, alkenyl, cycloalkenyl, alkynyl, cycloalkynyl, aryl, or heteroaryl group as described herein. The term "sulfone" as used herein is represented by the formula $A^1S(O)_2A^2$, where $A^1$ and $A^2$ can be, independently, an alkyl, cycloalkyl, alkenyl, cycloalkenyl, alkynyl, cycloalkynyl, aryl, or heteroaryl group as described herein. The term "sulfoxide" as used herein is represented by the formula $A^1S(O)A^2$, where $A^1$ and $A^2$ can be, independently, an alkyl, cycloalkyl, alkenyl, cycloalkenyl, alknycloalkynyl, cycloalkylaryl, or heteroaryl group as described herein.

The term "thiol" as used herein is represented by the formula —SH.

"R," "$R^1$," "$R^2$," "$R^3$," "$R^n$," where n is an integer, as used herein can, independently, possess one or more of the groups listed above. For example, if $R^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

Compounds described herein may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents envisioned by this disclosure are preferably those that result in the formation of stable or chemically feasible compounds. In is also contemplated that, in certain aspects, unless expressly indicated to the contrary, individual substituents can be further optionally substituted (i.e., further substituted or unsubstituted).

In some aspects, a structure of a compound can be represented by a formula:

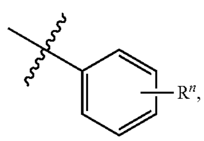

which is understood to be equivalent to a formula:

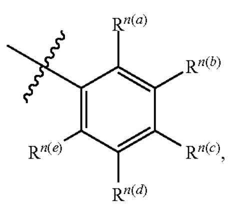

wherein n is typically an integer. That is, $R^n$ is understood to represent five independent substituents, $R^{n(a)}$, $R^{n(b)}$, $R^{n(c)}$, $R^{n(d)}$, $R^{n(c)}$. By "independent substituents," it is meant that each R substituent can be independently defined. For example, if in one instance $R^{n(a)}$ is halogen, then $R^{n(b)}$ is not necessarily halogen in that instance.

Several references to R, $R^1$, $R^2$, $R^3$, $R^4$, $R^5$, $R^6$, etc, are made in chemical structures and moieties disclosed and described herein. Any description of R, $R^1$, $R^2$, $R^3$, $R^4$, $R^5$, $R^6$, etc. in the specification is applicable to any structure or moiety reciting R, $R^1$, $R^2$, $R^3$, $R^4$, $R^5$, $R^6$, etc. respectively.

The complexes disclosed herein are suited for use in a wide variety of devices, including, for example, organic light emitting diodes (OLEDs) for full color displays and lighting applications.

Also disclosed herein are compositions including one or more complexes disclosed herein. The present disclosure provides light emitting devices that include one or more compositions described herein. The present disclosure also provides a photovoltaic device comprising one or more complexes or compositions described herein. Further, the present disclosure also provides a luminescent display device comprising one or more complexes described herein.

Complexes described herein can be used in a light emitting device such as an OLED. FIG. 1 depicts a cross-sectional view of an OLED 100. OLED 100 includes substrate 102, anode 104, hole-transporting material(s) (HTL) 106, light processing material 108, electron-transporting material(s) (ETL) 110, and a metal cathode layer 112. Anode 104 is typically a transparent material, such as indium tin oxide. Light processing material 108 may be an emissive material (EML) including an emitter and a host.

In various aspects, any of the one or more layers depicted in FIG. 1 may include indium tin oxide (ITO), poly(3,4-ethylenedioxythiophene) (PEDOT), polystyrene sulfonate (PSS), N,N'-di-1-naphthyl-N,N-diphenyl-1,1'-biphenyl-4,4'diamine (NPD), 1,1-bis((di-4-tolylamino)phenyl)cyclohexane (TAPC), 2,6-Bis(N-carbazolyl)pyridine (mCpy), 2,8-bis(diphenylphosphoryl)dibenzothiophene (PO15), LiF, Al, or a combination thereof.

Light processing material 108 may include one or more complexes of the present disclosure optionally together with a host material. The host material can be any suitable host material known in the art. The emission color of an OLED is determined by the emission energy (optical energy gap) of the light processing material 108, which can be tuned by tuning the electronic structure of the emitting complexes, the host material, or both. Both the hole-transporting material in the HTL layer 106 and the electron-transporting material(s) in the ETL layer 110 may include any suitable hole-transporter known in the art.

EXAMPLES

The following examples are put forth so as to provide those of ordinary skill in the art with a complete disclosure and description of how the complexes, compositions, articles, devices and/or methods claimed herein are made and evaluated, and are intended to be purely exemplary and are not intended to be limiting in scope. Some of these synthetic examples have been performed. Others are based on an understanding of related synthetic procedures and are predictive in nature. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Various methods for the preparation method of the complexes described herein are recited in the examples. These methods are provided to illustrate various methods of preparation, but are not intended to limit any of the methods recited herein. Accordingly, one of skill in the art in possession of this disclosure could readily modify a recited method or utilize a different method to prepare one or more of the complexes described herein. The following aspects are only exemplary and are not intended to be limiting in scope. Temperatures, catalysts, concentrations, reactant compositions, and other process conditions can vary, and one of skill in the art, in possession of this disclosure, could readily select appropriate reactants and conditions for a desired complex.

Example 1

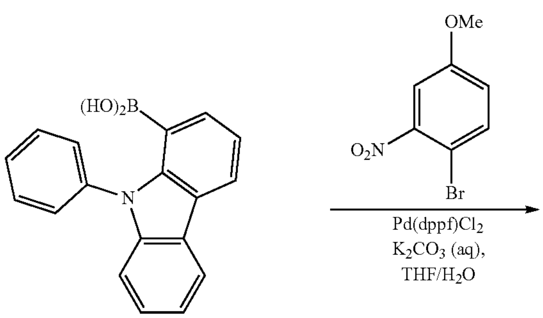

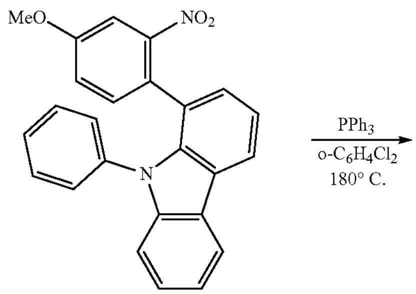

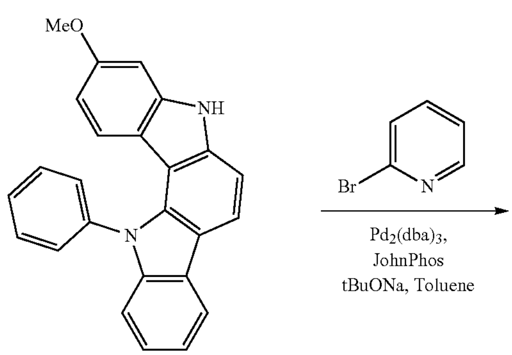

N34OMeNH

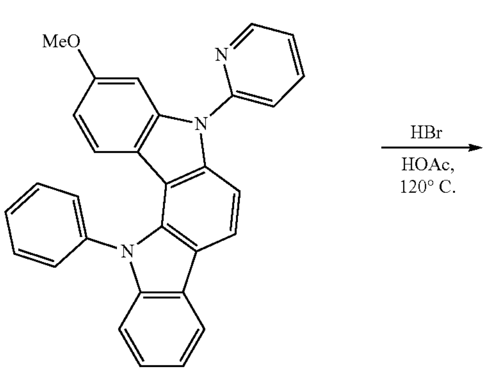

-continued

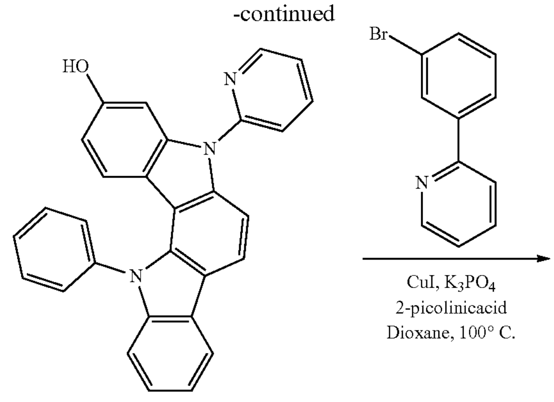

N34OH

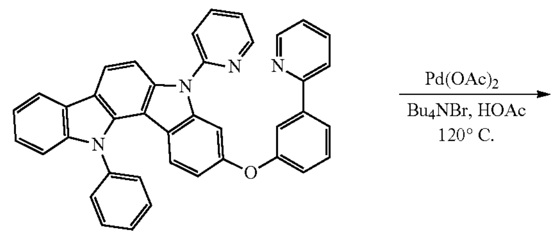

ON3N34 Ligand

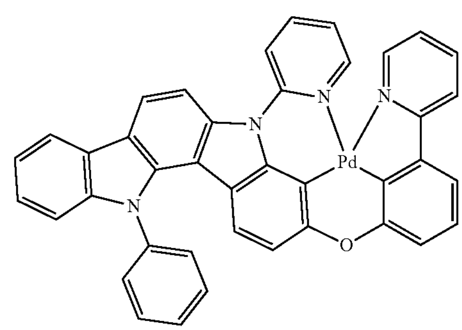

PdON3N34

Synthesis of ON3N34 Ligand

To a solution of 2-(3-bromophenyl)pyridine (1.5 eq) in dioxane (0.1 M) were added N34OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 76% yield.

Synthesis of PdON334

To a solution of ON3N34 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3N34 in 65% yield.

Example 2

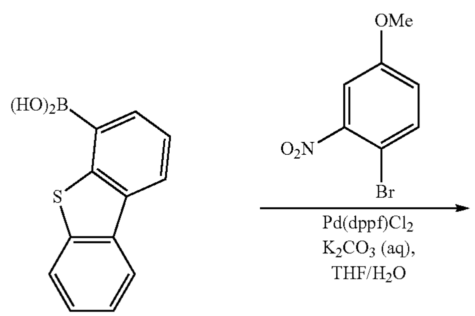

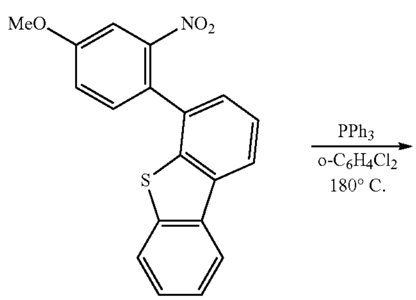

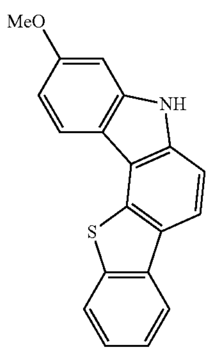

S34OMeNH

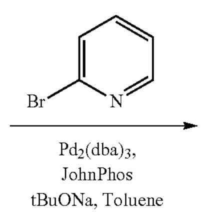

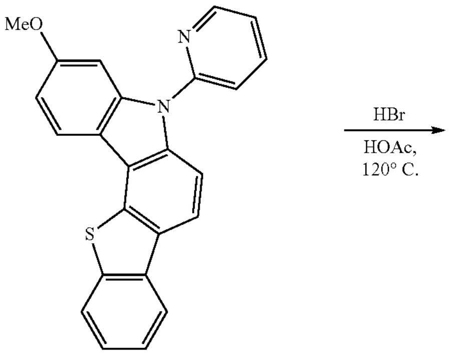

-continued

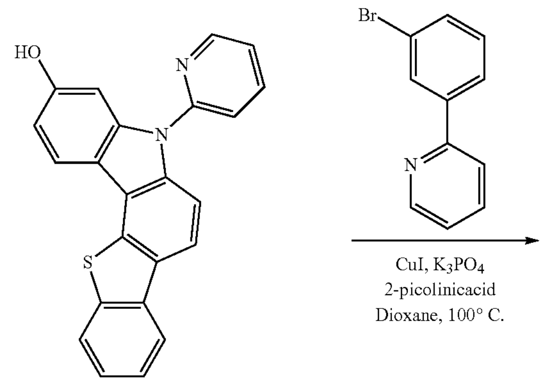

S34OH

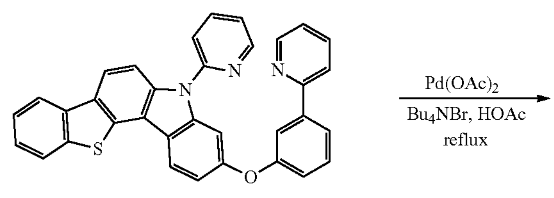

ON3S34 Ligand

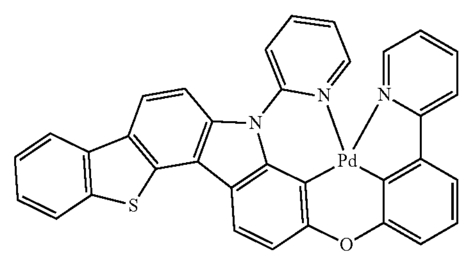

PdON3S34

Synthesis of ON3S34 Ligand

To a solution of 2-(3-bromophenyl)pyridine (1.5 eq) in dioxane (0.1 M) were added S34OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 84% yield.

Synthesis of PdON3S34

To a solution of ON3S34 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3S34 in 72% yield.

Example 3

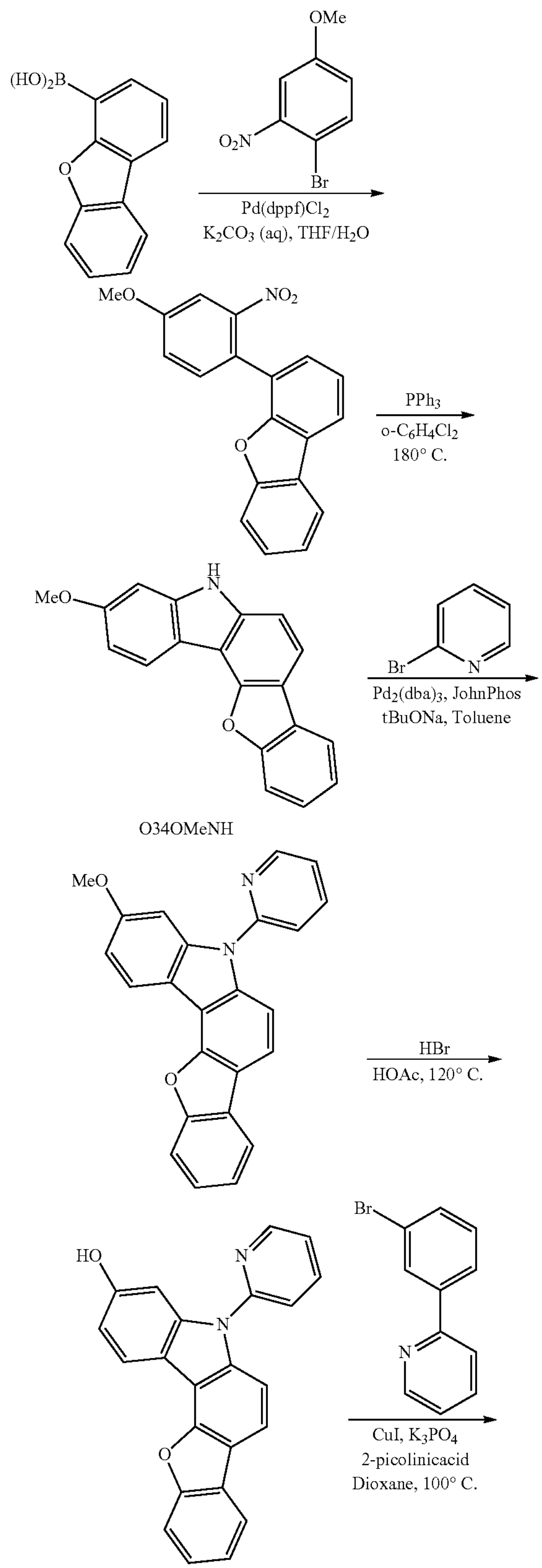

O34OH

-continued

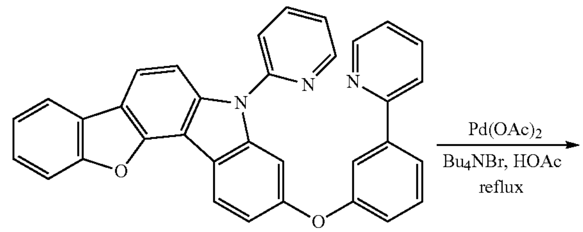

ON3O34 Ligand

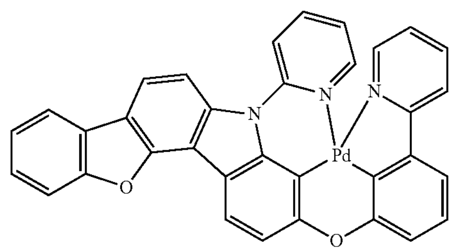

PdON3O34

Synthesis of ON3O34 Ligand

To a solution of 2-(3-bromophenyl)pyridine (1.5 eq) in dioxane (0.1 M) were added O34OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 77% yield.

Synthesis of PdON3O34

To a solution of ON3O34 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3O34 in 65% yield.

Example 4

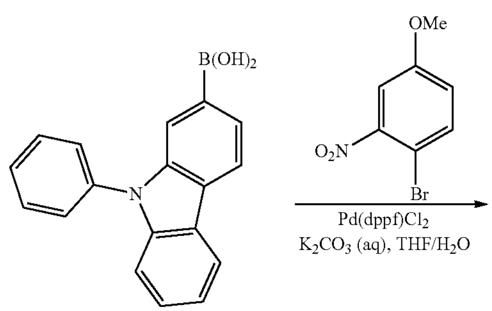

-continued

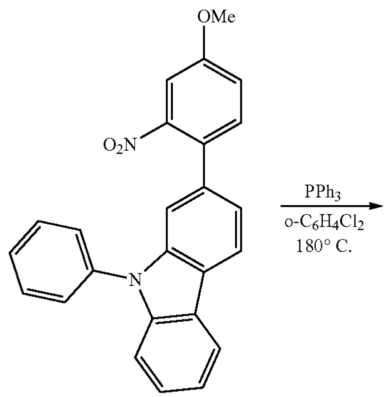

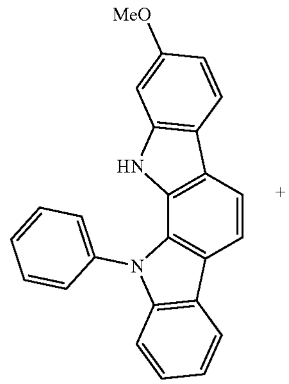

N65OMeNH

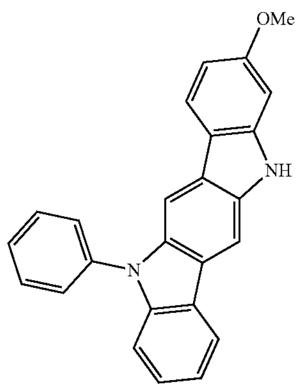

N45OMeNH

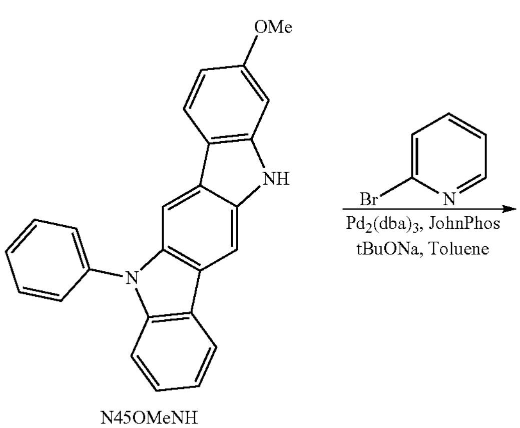

N45OMeNH

-continued

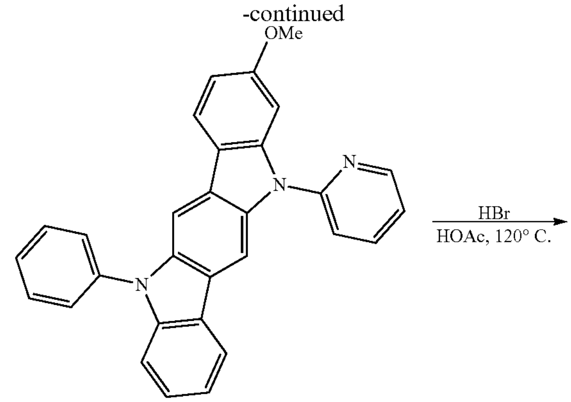

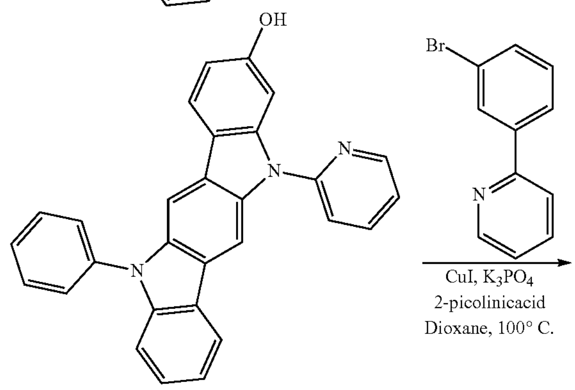

N45OH

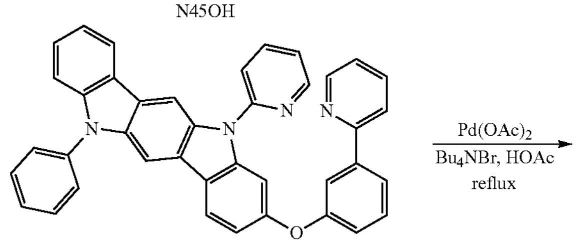

ON3N45 Ligand

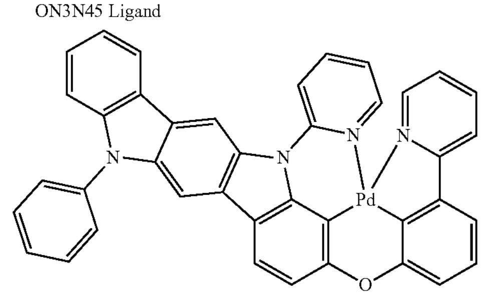

PdON3N45

Synthesis of ON3N45 Ligand

To a solution of 2-(3-bromophenyl)pyridine (1.5 eq) in dioxane (0.1 M) were added N45OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 73% yield.

Synthesis of PdON3N45

To a solution of ON3N45 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3N45 in 69% yield.

Example 5

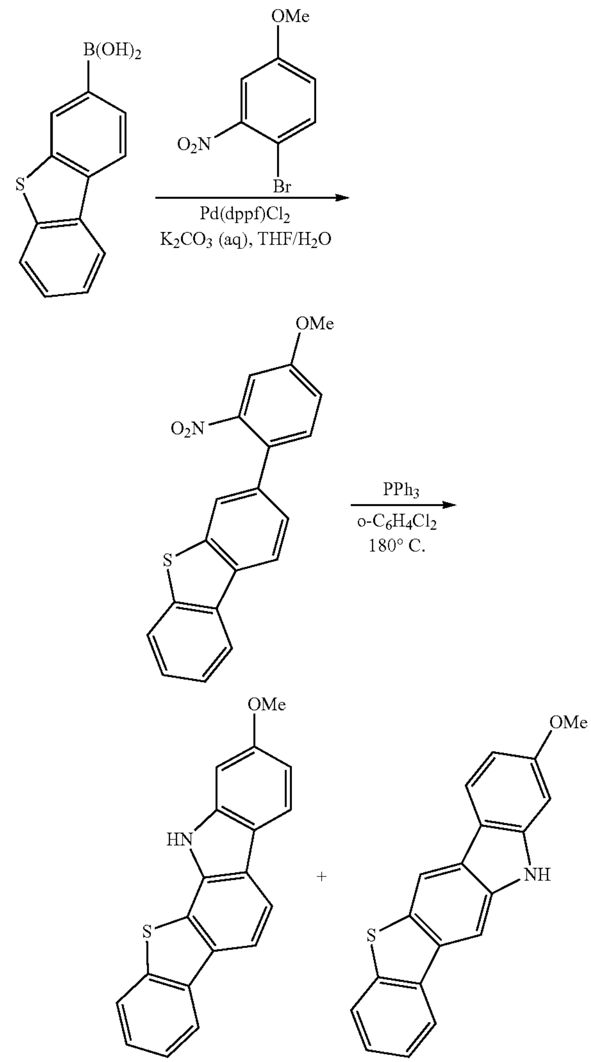

S65OMeNH S45OMeNH

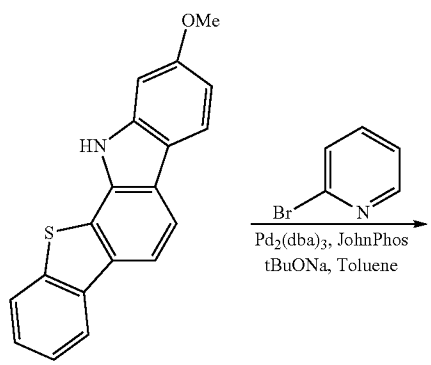

S65OMeNH

-continued

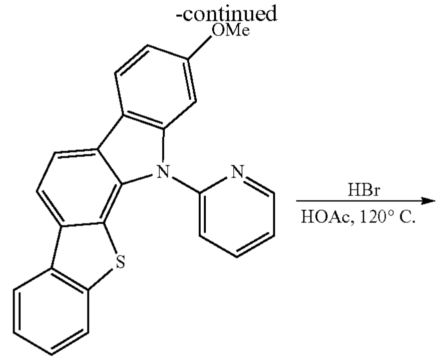

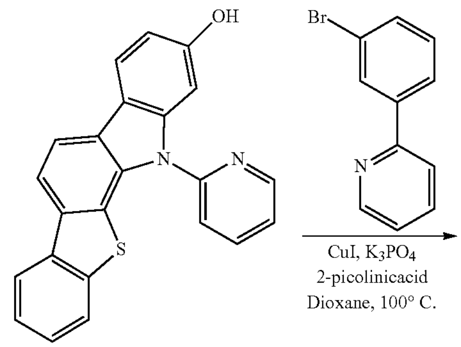

S65OH

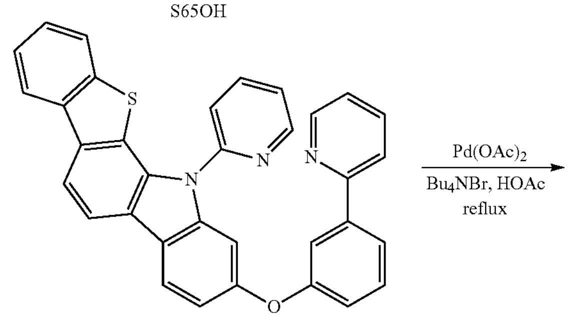

ON3S65 Ligand

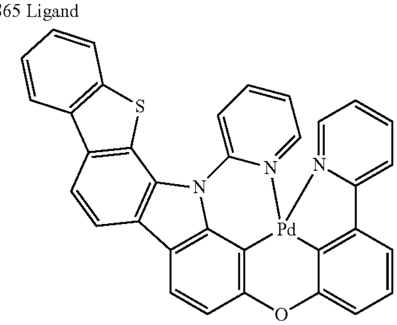

PdON3S65

Synthesis of ON3S65 Ligand

To a solution of 2-(3-bromophenyl)pyridine (1.5 eq) in dioxane (0.1 M) were added S65OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 67% yield.

Synthesis of PdON3S65

To a solution of ON3S65 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3S65 in 65% yield.

Example 6

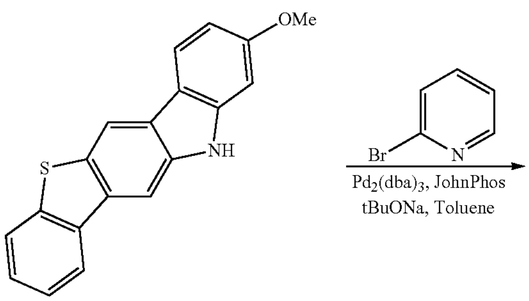

S45OMeNH

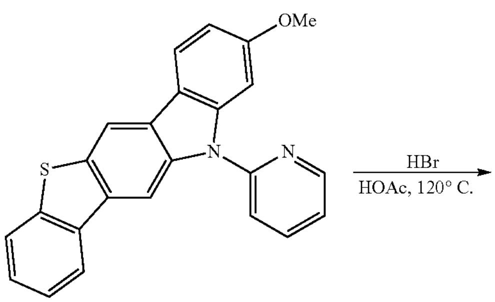

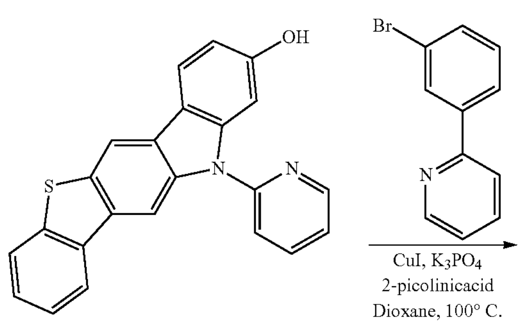

S45OH

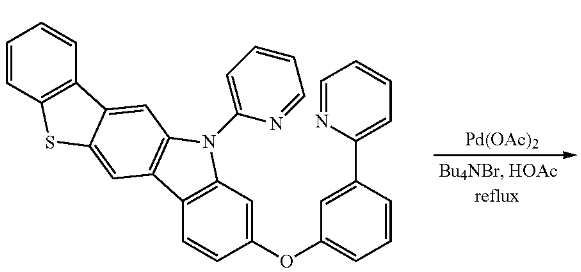

ON3S45 Ligand

-continued

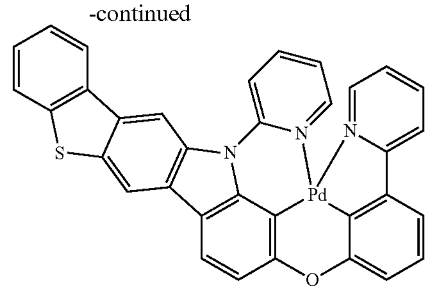

PdON3S45

Synthesis of ON3S45 Ligand

To a solution of 2-(3-bromophenyl)pyridine (1.5 eq) in dioxane (0.1 M) were added S45OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 75% yield.

Synthesis of PdON3S45

To a solution of ON3S45 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3S45 in 71% yield.

Example 7

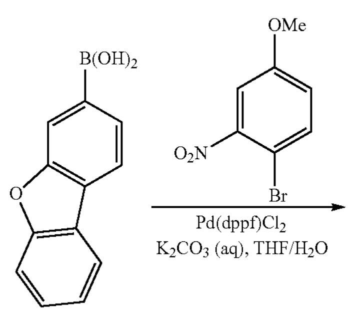

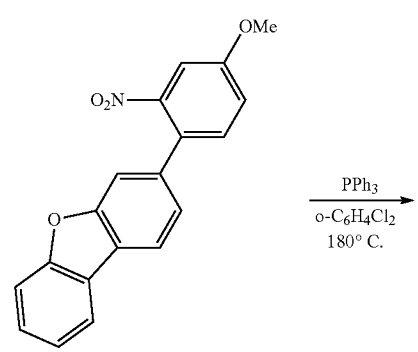

-continued

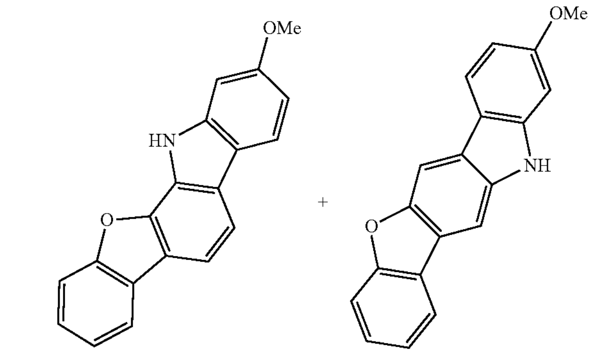

O65OMeNH

O45OMeNH

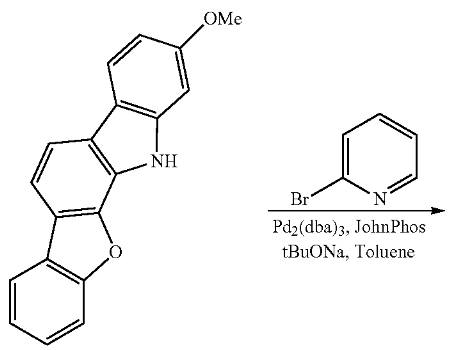

O65OMeNH

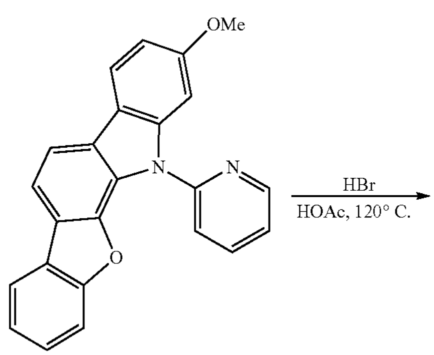

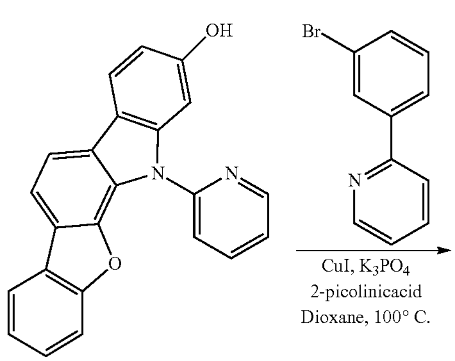

O65OH

-continued

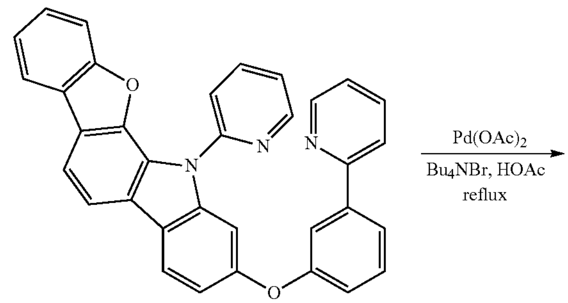

ON3O65 Ligand

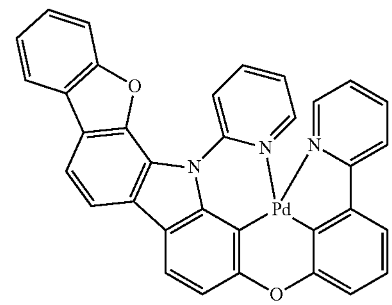

PdON3O65

Synthesis of ON3O65 Ligand

To a solution of 2-(3-bromophenyl)pyridine (1.5 eq) in dioxane (0.1 M) were added O65OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 70% yield.

Synthesis of PdON3O65

To a solution of ON3O65 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3O65 in 59% yield.

Example 8

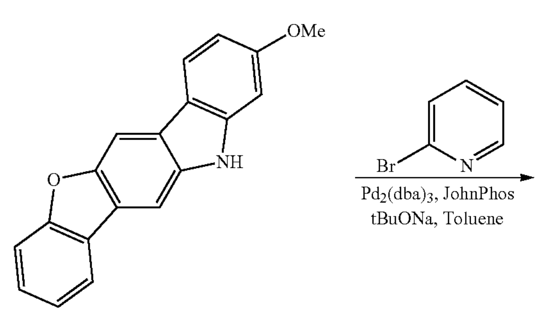

O45OMeNH

-continued

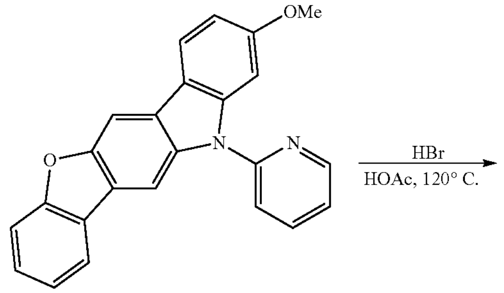

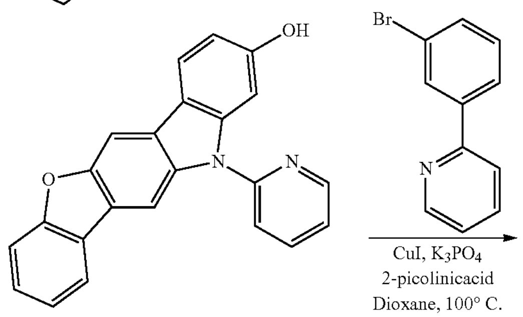

O45OH

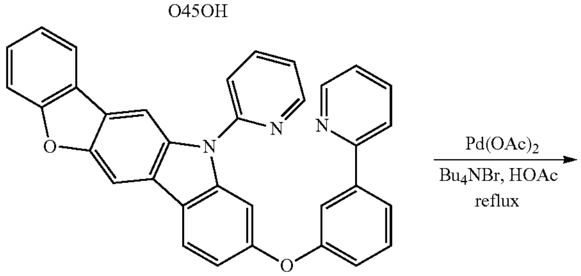

ON3O45 Ligand

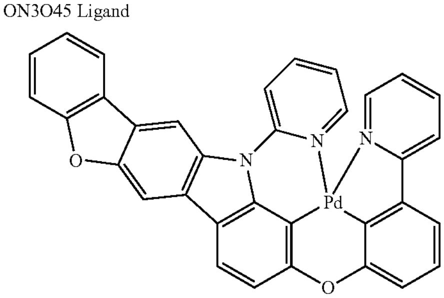

PdON3O45

Synthesis of ON3O45 Ligand

To a solution of 2-(3-bromophenyl)pyridine (1.5 eq) in dioxane (0.1 M) were added O45OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 66% yield.

Synthesis of PdON3O45

To a solution of ON3O45 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3O45 in 69% yield.

Example 9

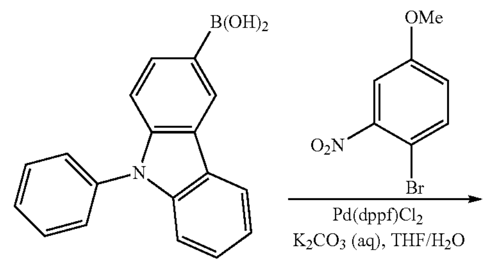

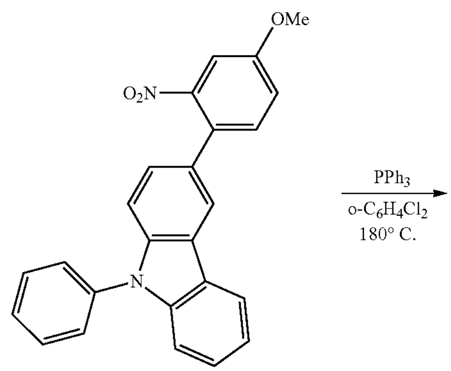

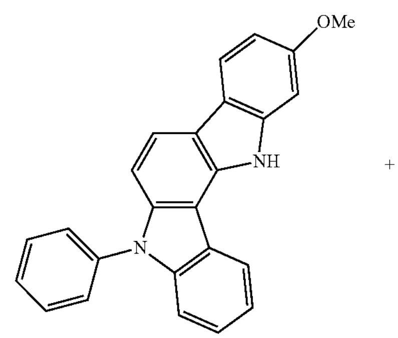

N56OMeNH

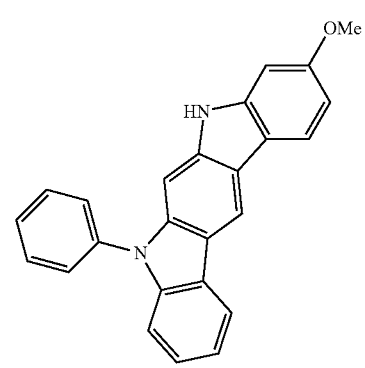

N54OMeNH

-continued

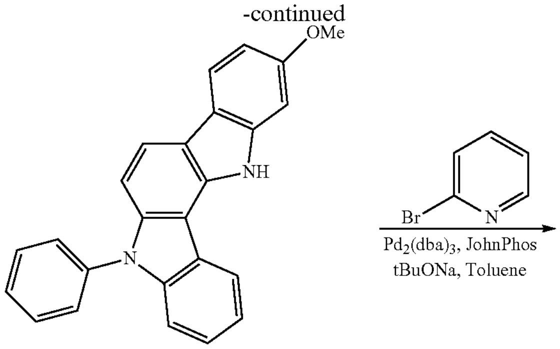

N56OMeNH

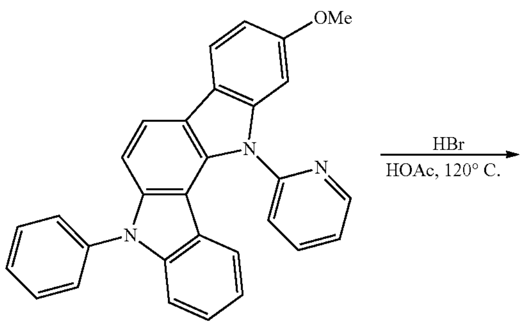

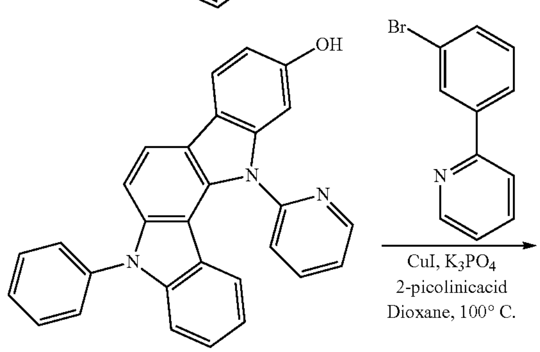

N56OH

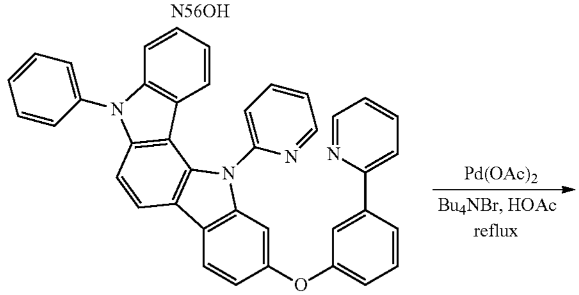

ON3N56 Ligand

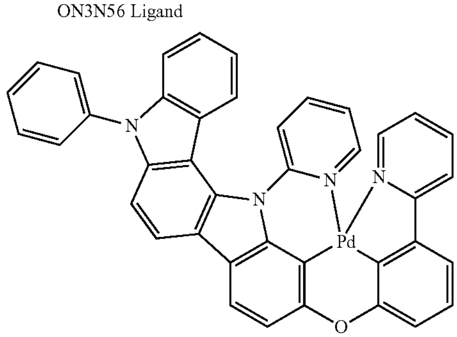

PdON3N56

Synthesis of ON3N56 Ligand

To a solution of 2-(3-bromophenyl)pyridine (1.5 eq) in dioxane (0.1 M) were added N56OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 78% yield.

Synthesis of PdON3N56

Figure 2:
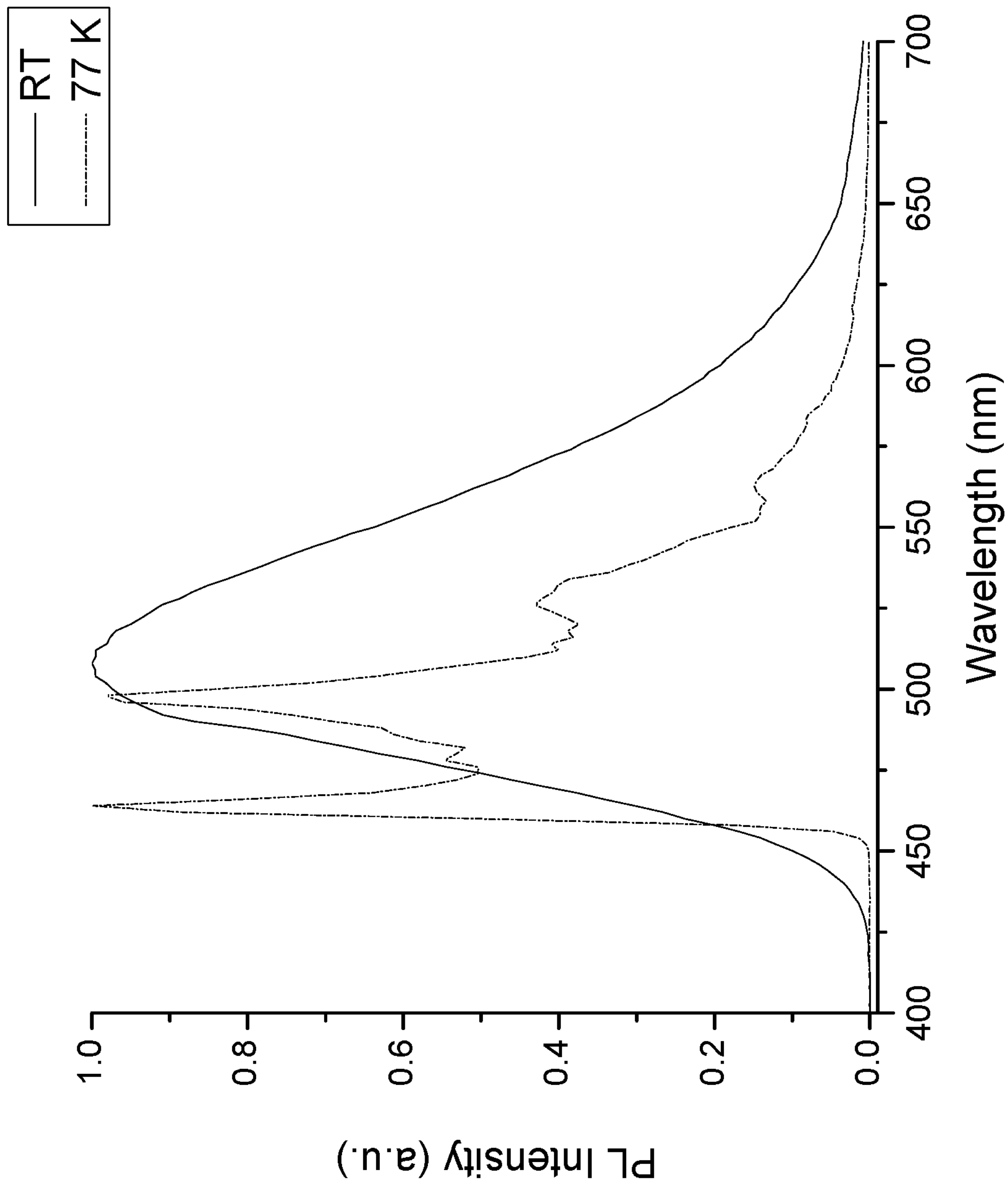
FIG. 2 shows PL spectra of PdON3N56, prepared as described in Example 9, measured in $CH_2Cl_2$ at room temperature and in 2-MeTHF at 77K.

To a solution of ON3N56 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3N56 in 74% yield. FIG. 2 shows PL spectra of PdON3N56 measured in $CH_2Cl_2$ at room temperature and in 2-MeTHF at 77K.

Example 10

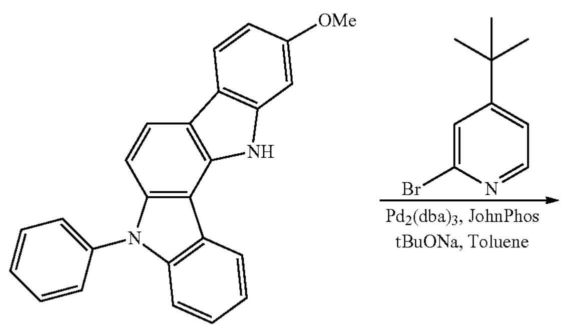

N56OMeNH

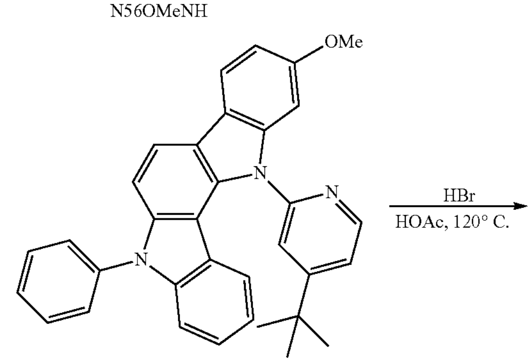

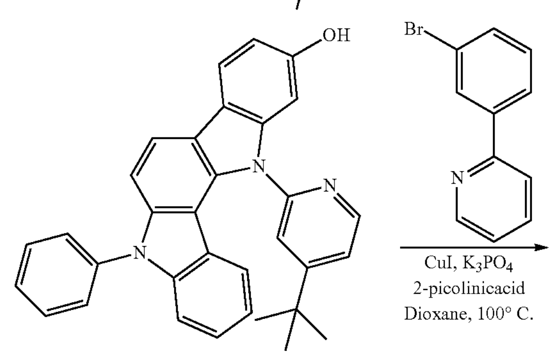

N56tBuOH

-continued

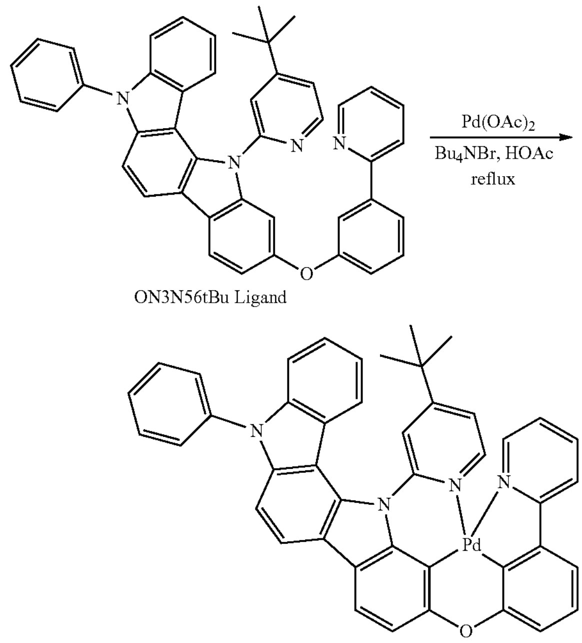

ON3N56tBu Ligand

PdON3N56tBu

Synthesis of ON3N56tBu Ligand

To a solution of 2-(3-bromophenyl)pyridine (1.5 eq) in dioxane (0.1 M) were added N56tBuOH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 65% yield.

Synthesis of PdON3N56tBu

To a solution of ON3N56tBu ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes:DCM) gave the PdON3N56tBu in 58% yield.

Example 11

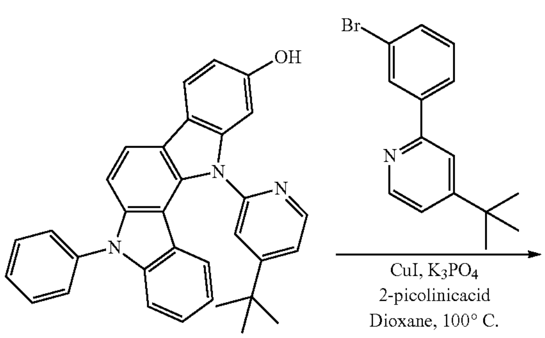

N56tBuOH

-continued

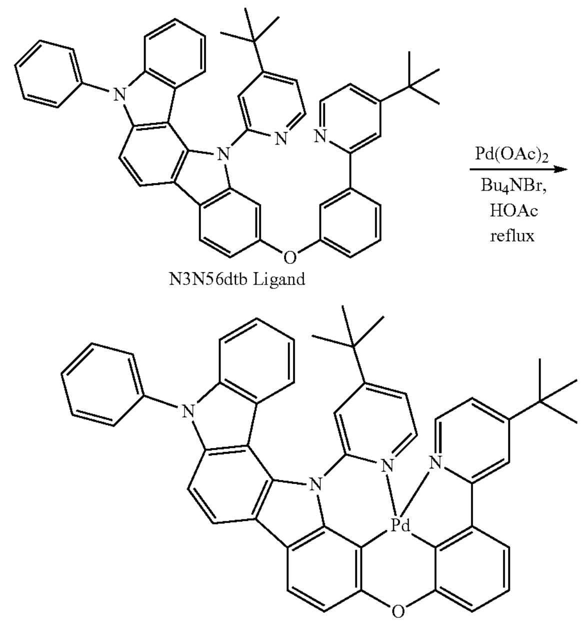

N3N56dtb Ligand

PdON3N56dtb

Synthesis of ON3N56dtb Ligand

To a solution of 2-(3-bromophenyl)-4-(tert-butyl)pyridine (1.5 eq) in dioxane (0.1 M) were added N56tBuOH (1 eq). CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 72% yield.

Synthesis of PdON3N56dtb

To a solution of ON3N56dtb ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes:DCM) gave the PdON3N56dtb in 63% yield.

Example 12

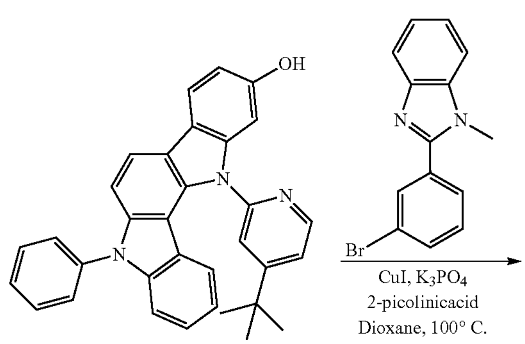

N56tBuOH

-continued

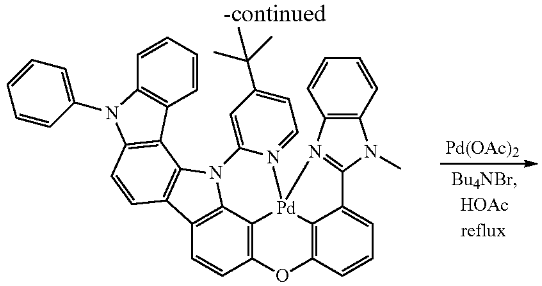

ON8N56tBu Ligand

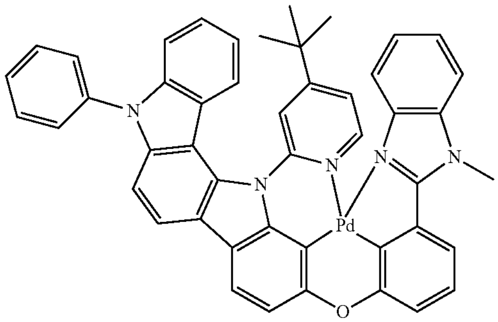

PdON8N56tBu

Synthesis of ON8N56tBu Ligand

To a solution of 2-(3-bromophenyl)-1-methyl-1H-benzo[d]imidazole (1.5 eq) in dioxane (0.1 M) were added N56tBuOH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 68% yield.

Synthesis of PdON8N56tBu

Figure 3:
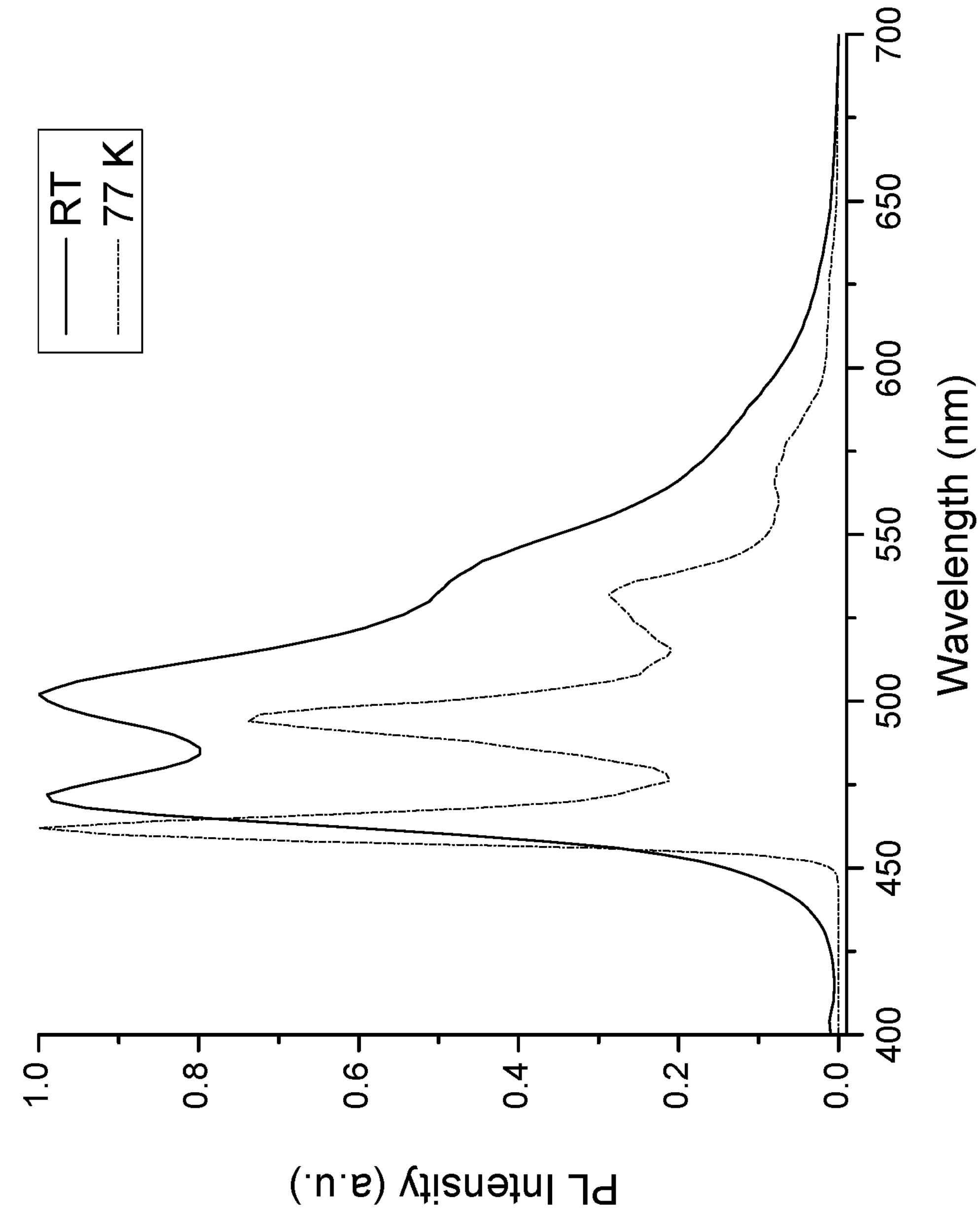
FIG. 3 shows PL spectra of PdON8N56tBu, prepared as described in Example 12, measured in $CH_2Cl_2$ at room temperature and in 2-MeTHF at 77K.

To a solution of ON8N56tBu ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes:DCM) gave the PdON8N56tBu in 57% yield. FIG. 3 shows PL spectra of PdON8N56tBu measured in $CH_2Cl_2$ at room temperature and in 2-MeTHF at 77K.

Example 13

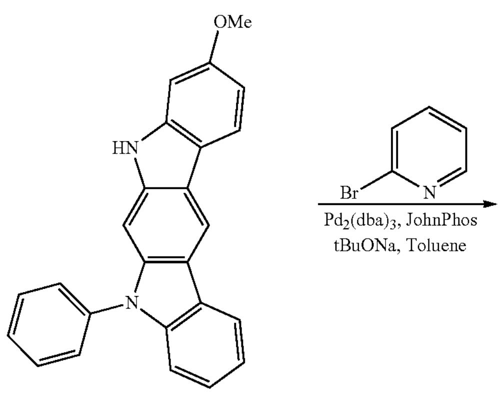

N54OMeNH

-continued

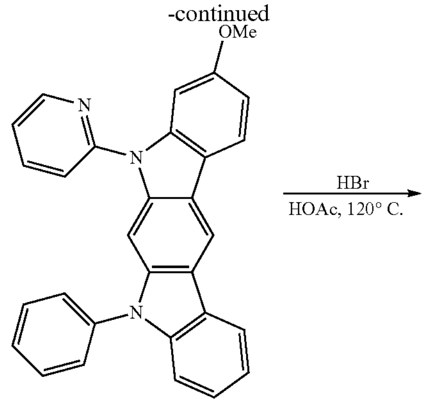

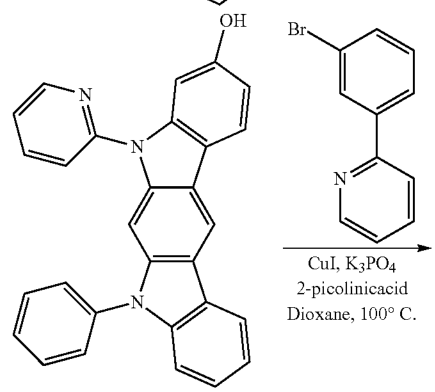

N54OH

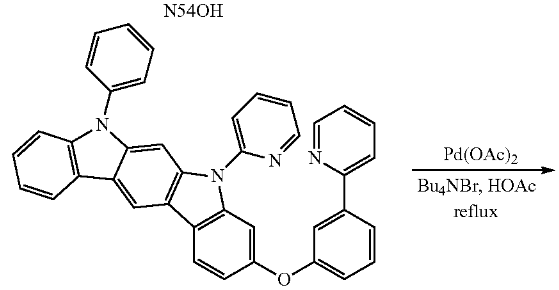

ON3N54 Ligand

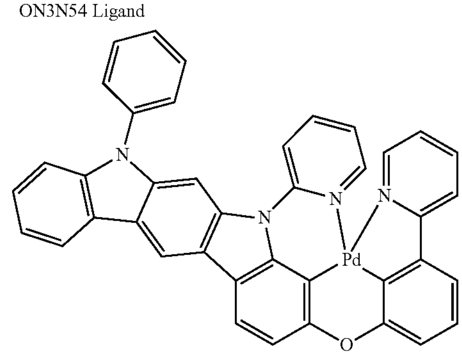

PdON3N54

Synthesis of ON3N54 Ligand

To a solution of 2-(3-bromophenyl)pyridine (1.5 eq) in dioxane (0.1 M) were added N54OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 74% yield.

Synthesis of PdON3N54

Figure 4:
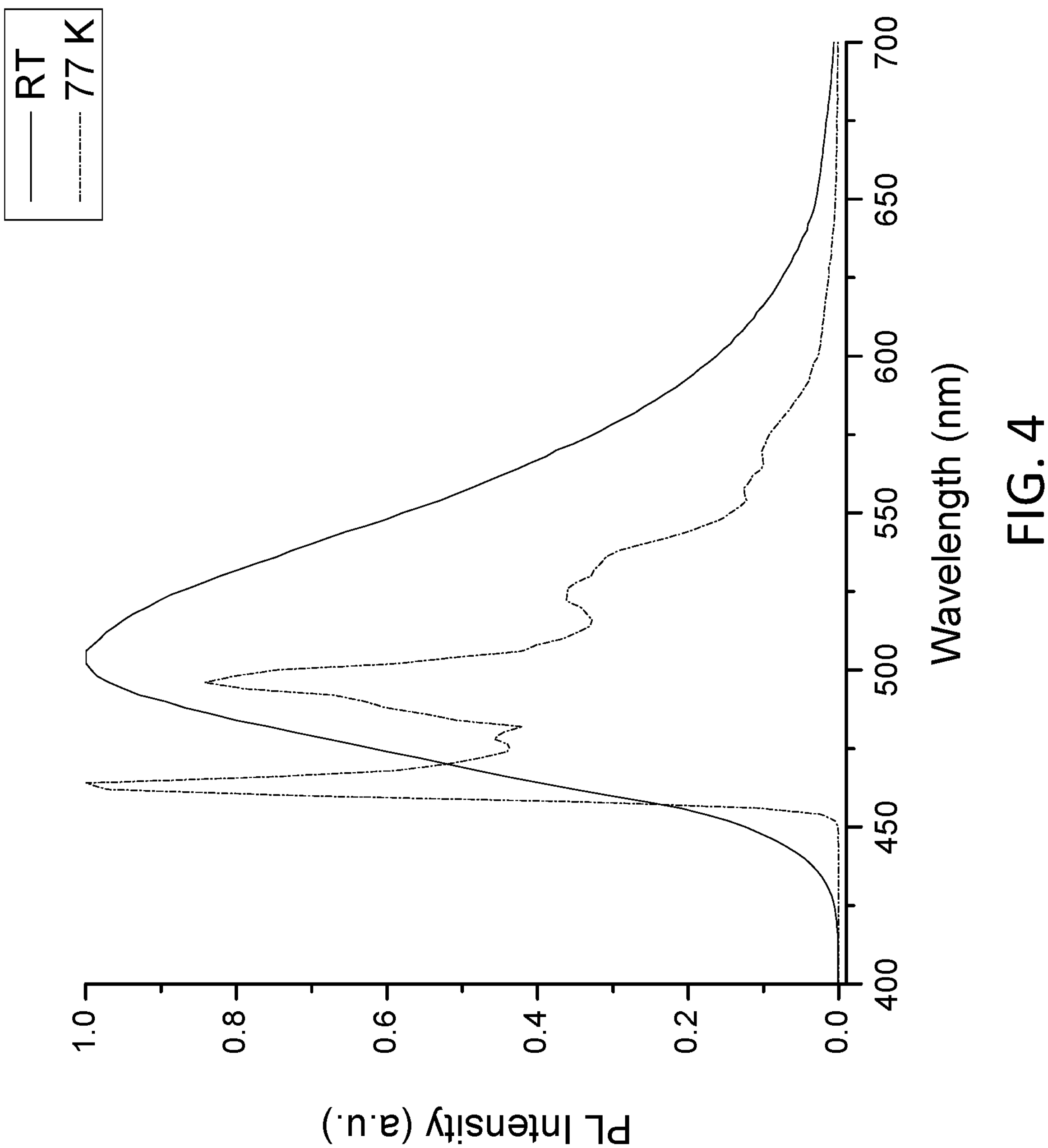
FIG. 4 shows PL spectra of PdON3N54, prepared as described in Example 13, measured in $CH_2Cl_2$ at room temperature and in 2-MeTHF at 77K.

To a solution of ON3N54 ligand (1 eq) in HOAc (0.02 M) were added $Pd(OAc)_2$ (1.2 eq) and $n\text{-}Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3N54 in 67% yield. FIG. 4 shows PL spectra of PdON3N54 measured in $CH_2Cl_2$ at room temperature and in 2-MeTHF at 77K.

Example 14

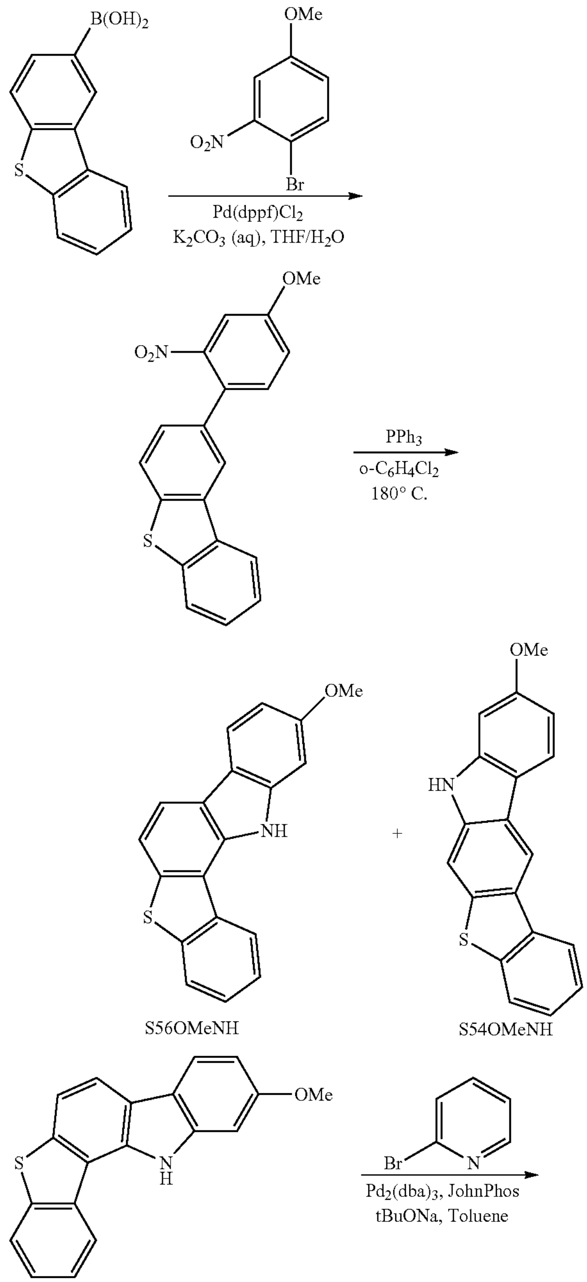

S56OMeNH S54OMeNH

S56OMeNH

-continued

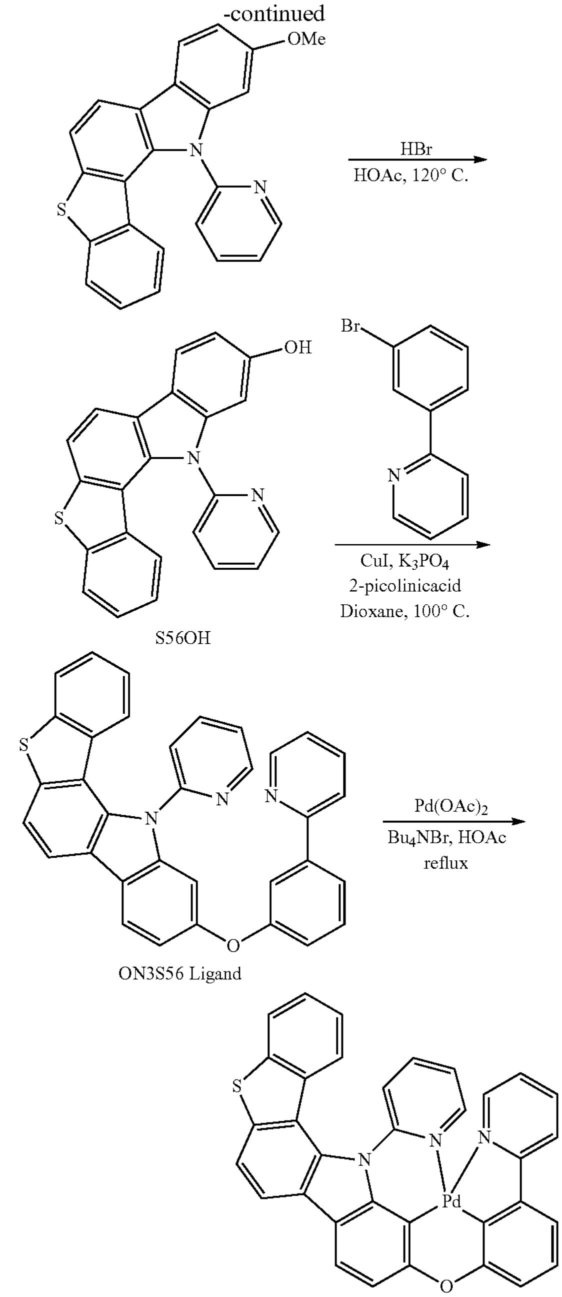

S56OH

ON3S56 Ligand

PdON3S56

Synthesis of ON3S56 Ligand

To a solution of 2-(3-bromophenyl)pyridine (1.5 eq) in dioxane (0.1 M) were added S56OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 71% yield.

Synthesis of PdON3S56

To a solution of ON3S56 ligand (1 eq) in HOAc (0.02 M) were added $Pd(OAc)_2$ (1.2 eq) and $n\text{-}Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3S56 in 63% yield.

Figure 5A:
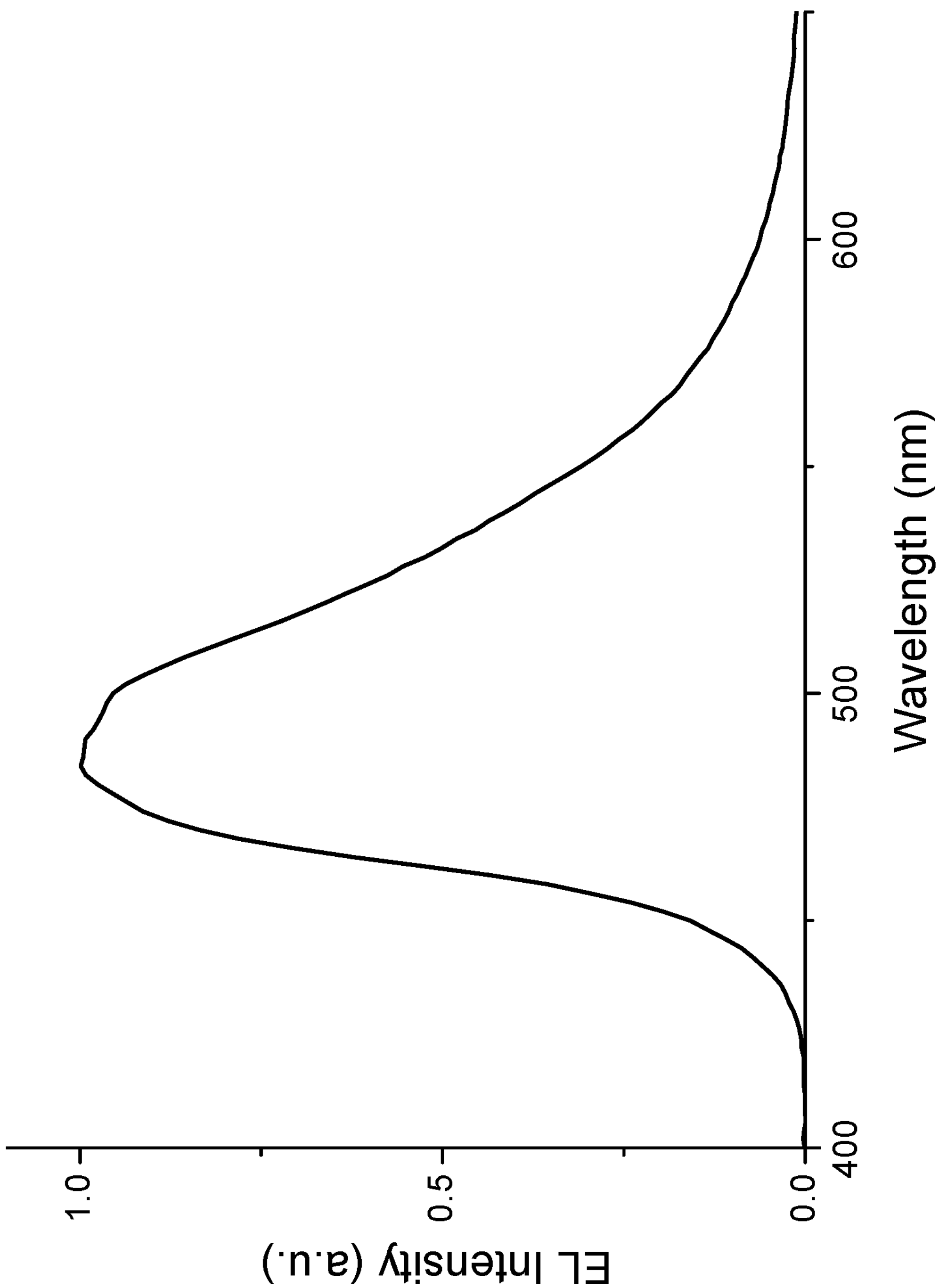
FIGS. 5A and 5B show an electroluminescence (EL) spectrum and a plot of EQE vs. luminance, respectively, of PdON3S56 in the device structure described in Example 14.
Figure 5B:
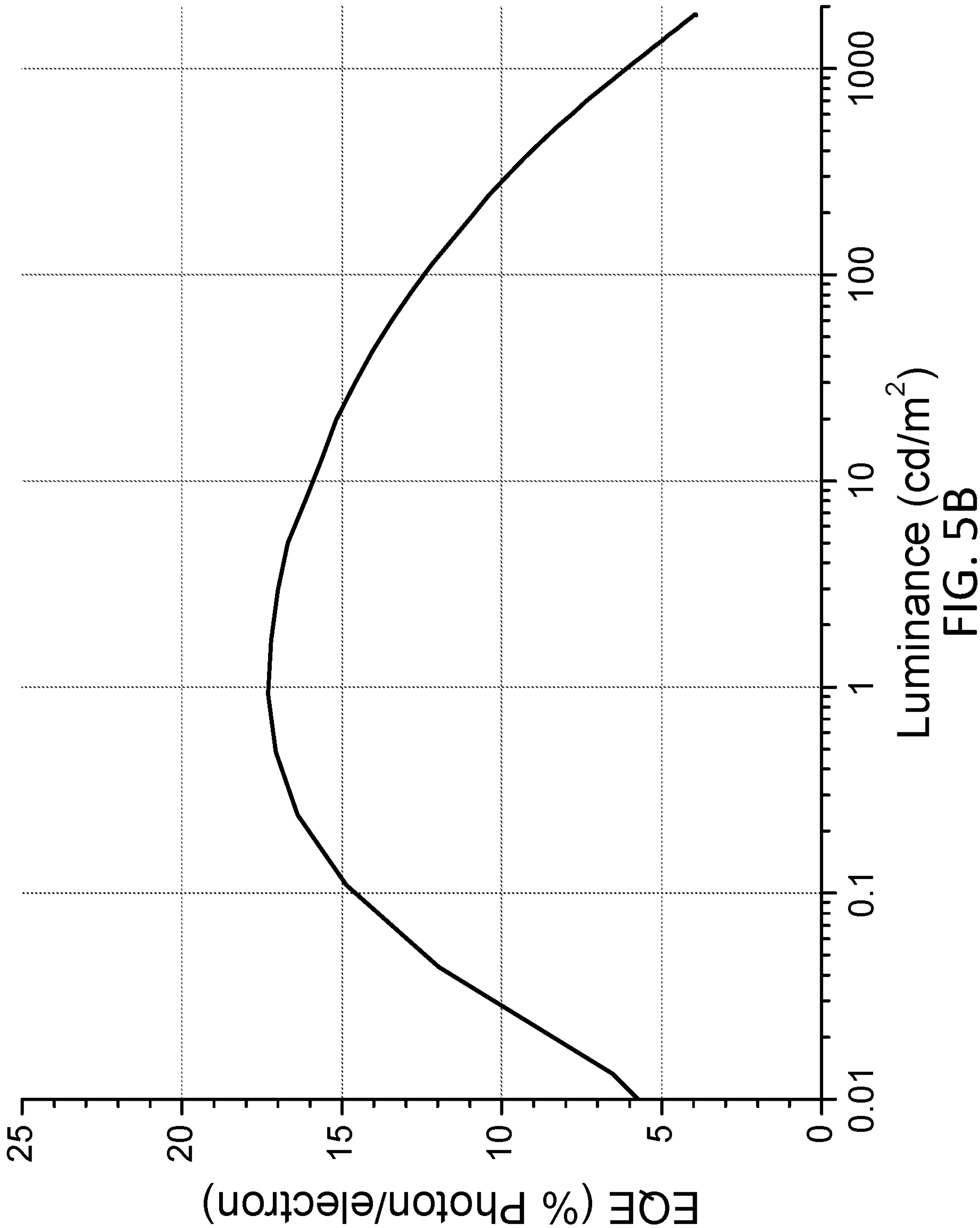
Figure 6:
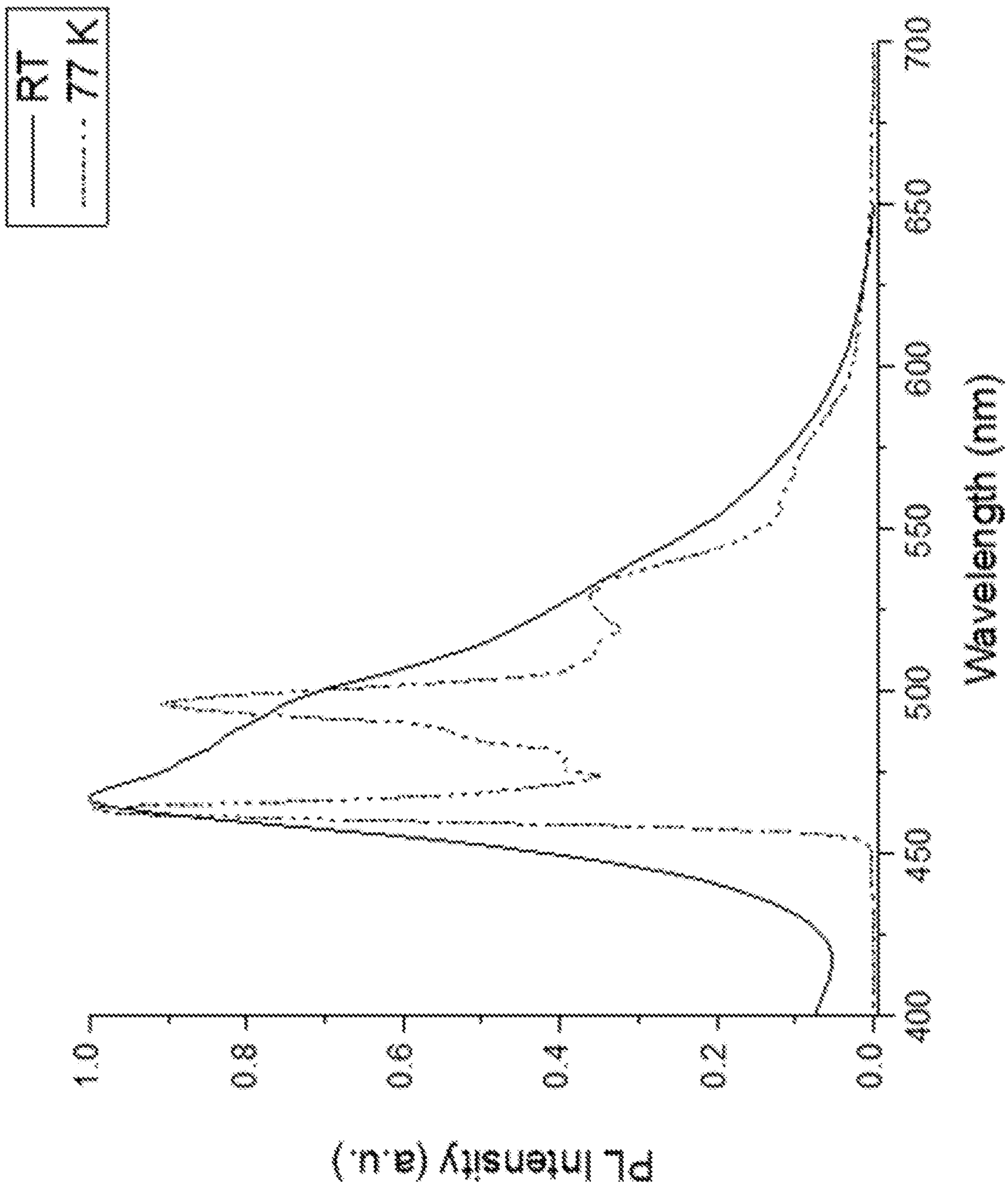
FIG. 6 shows PL spectra of PdON3S56, prepared as described in Example 14, measured in $CH_2Cl_2$ at room temperature and in 2-MeTHF at 77K.

FIGS. 5A and 5B show an electroluminescence (EL) spectrum and a plot of EQE vs. luminance, respectively, of PdON3S56 in a device having the structure: ITO (40 nm)/HATCN (10 nm), NPD (40 nm)/BisPCz (10 nm)/10% PdON3S56:mCBP (25 nm)/PO15 (10 nm)/BPyTP (40 nm)/Liq (2 nm)/Al (100 nm), where HATCN is 1,4,5,8,9,12-hexaazatriphenylene-hexacarbonitrile, NPD is N,N'-diphenyl-N,N'-bis(1-naphthyl)-1,1'-biphenyl-4,4"-diamine, BisPCz is 9,9'-diphenyl-9H,9'H-3,3'-bicarbazole, mCBP is 3,3'-di(9H-carbazol-9-yl)-1,1'-biphenyl, PO15 is dibenzo[b,d]thiophene-2,8-diylbis(diphenylphosphine oxide) and BPyTP is 2,7-di(2,2'-bipyridin-5-yl)triphenylene. FIG. 6 shows photoluminescence (PL) spectra of PdON3S56 measured in $CH_2Cl_2$ at room temperature and in 2-MeTHF at 77K.

Example 15

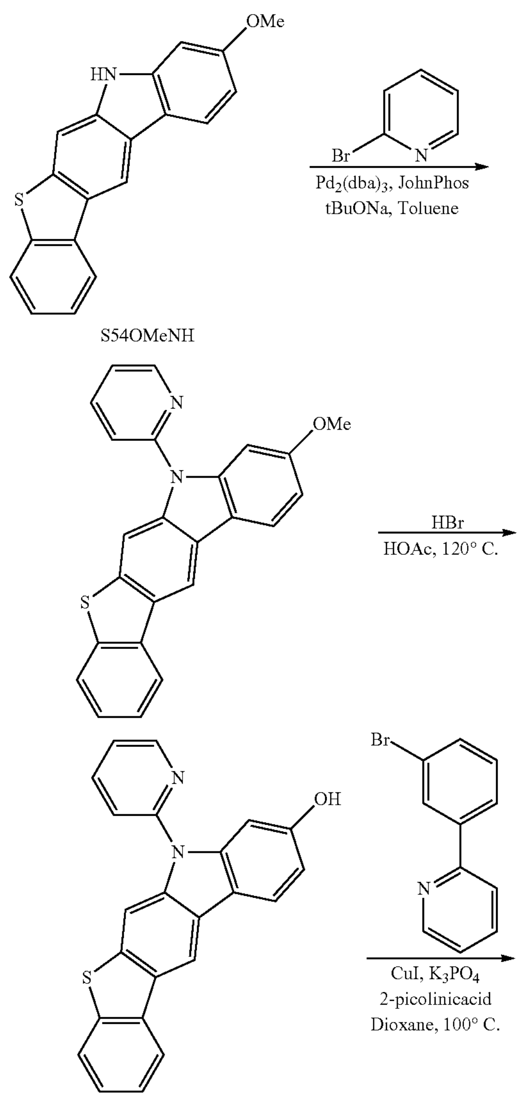

-continued

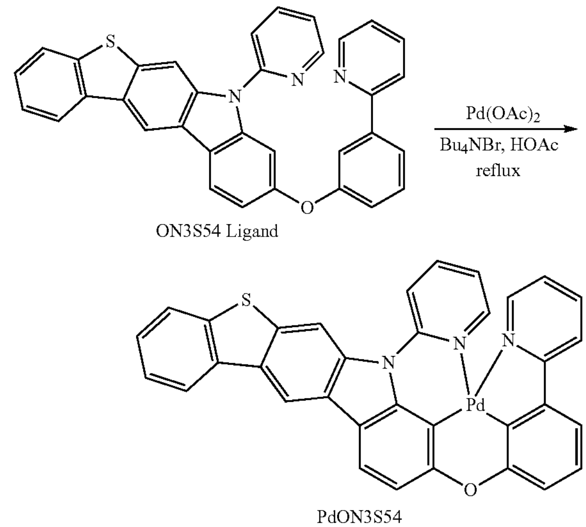

Synthesis of ON3S54 Ligand

To a solution of 2-(3-bromophenyl)pyridine (1.5 eq) in dioxane (0.1 M) were added S54OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 77% yield.

Synthesis of PdON3S54

To a solution of ON3S54 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3S54 in 65% yield.

Example 16

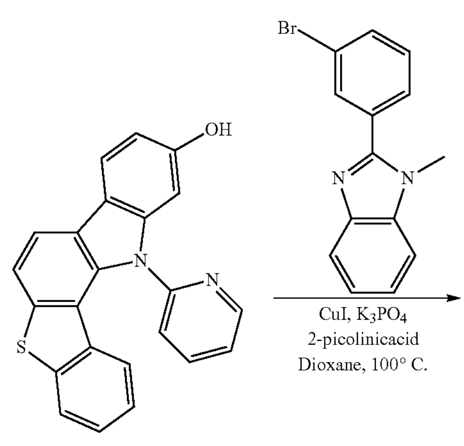

-continued

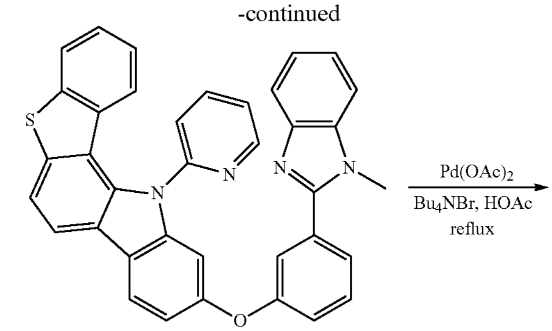

ON8S56 Ligand

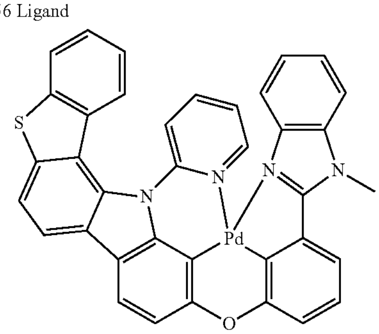

PdON8S56

Synthesis of ON8S56 Ligand

To a solution of 2-(3-bromophenyl)-1-methyl-1H-benzo[d]imidazole (1.5 eq) in dioxane (0.1 M) were added S56OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 78% yield.

Synthesis of PdON8S56

To a solution of ON8S56 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes:DCM) gave the PdON8S56 in 64% yield.

Example 17

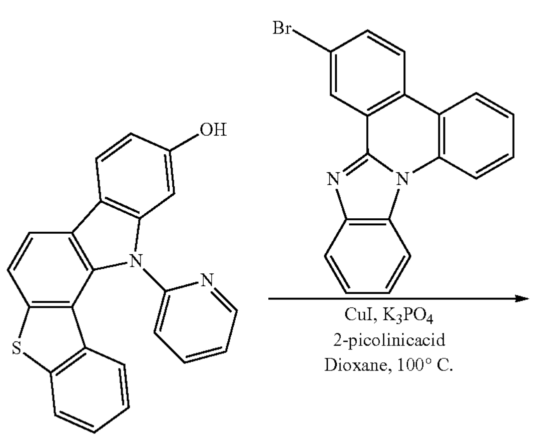

S56OH

-continued

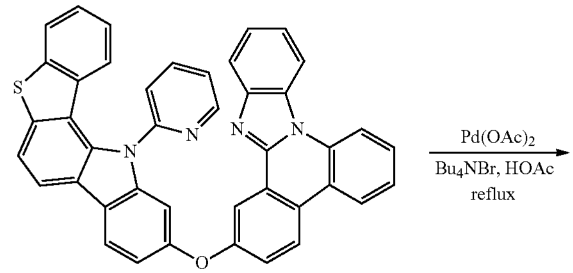

ON8-PS56 Ligand

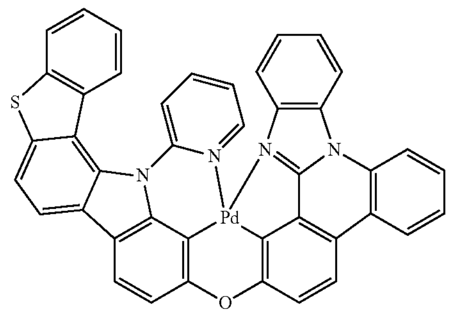

PdON8-PS56

Synthesis of ON8-PS56 Ligand

To a solution of 7-bromobenzo[4,5]imidazo[1,2-f]phenanthridine (1.5 eq) in dioxane (0.1 M) were added S56OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 72% yield.

Synthesis of PdON8-PS56

To a solution of ON8-PS56 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes:DCM) gave the PdON8-PS56 in 58% yield.

Example 18

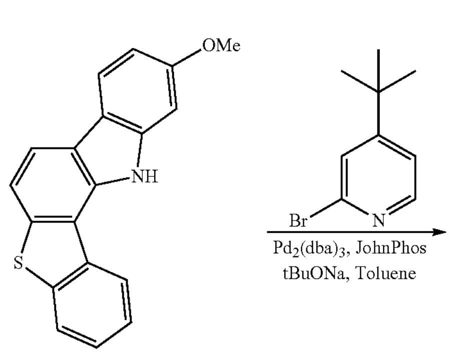

S56OMeNH

-continued

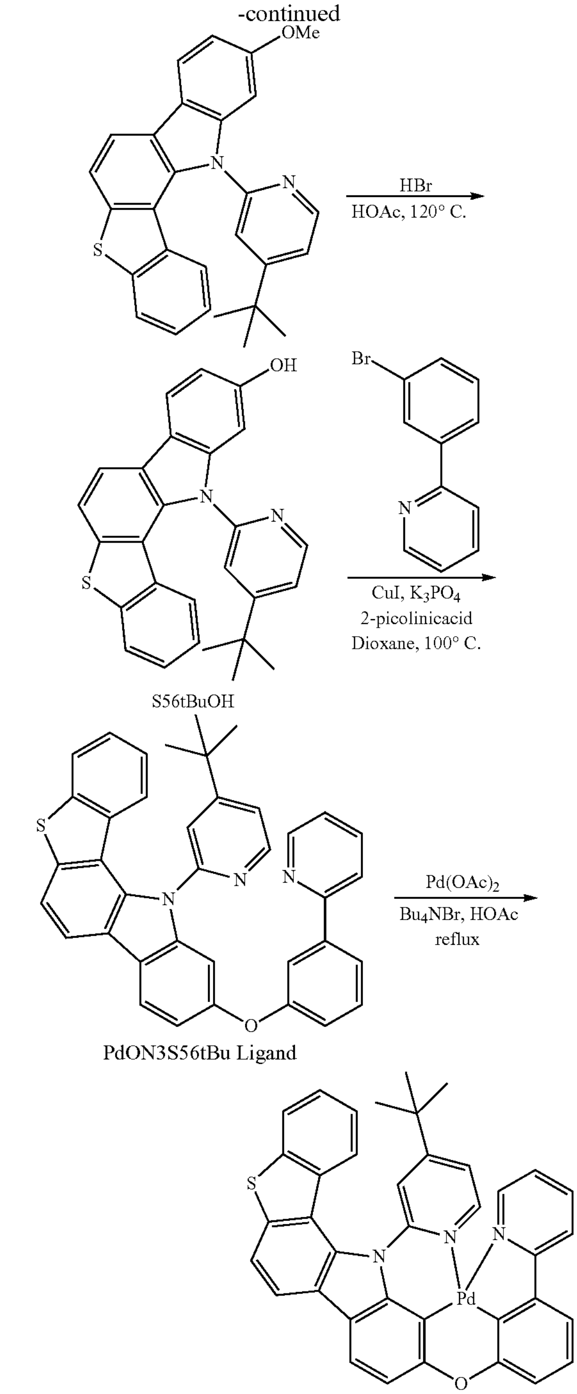

S56tBuOH

PdON3S56tBu Ligand

PdON3S56tBu

Synthesis of ON3S56tBu Ligand

To a solution of 2-(3-bromophenyl)pyridine (1.5 eq) in dioxane (0.1 M) were added S56tBuOH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 72% yield.

Synthesis of PdON3S56tBu

To a solution of ON3S56tBu ligand (1 eq) in HOAc (0.02 M) were added Pd(OAc)$_2$ (1.2 eq) and n-$Bu_4NBr$ (0.1 eq).

The mixture was heated to reflux and maintained at this temperature for 2 days. The reaction mixture was cooled to room temperature. The solvent was then removed under reduced pressure. Purification by column chromatography (hexanes:DCM) gave the PdON3S56tBu in 61% yield.

Example 19

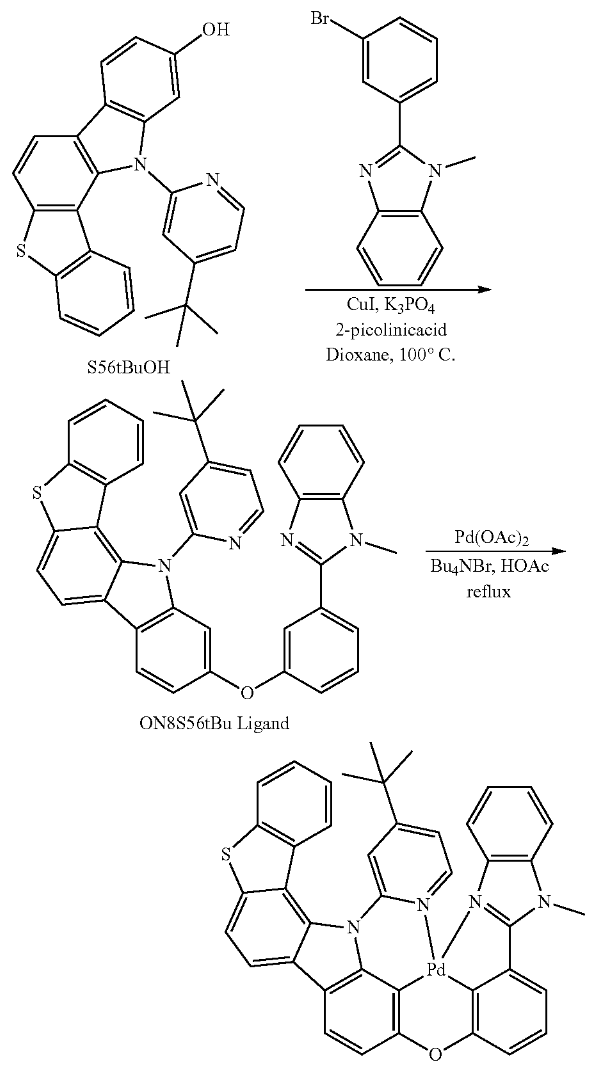

S56tBuOH

ON8S56tBu Ligand

PdON8S56tBu

Synthesis of ON8S56tBu Ligand

To a solution of 2-(3-bromophenyl)-1-methyl-1H-benzo[d]imidazole (1.5 eq) in dioxane (0.1 M) were added S56tBuOH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 72% yield.

Synthesis of PdON8S56tBu

To a solution of ON8S56tBu ligand (1 eq) in HOAc (0.02 M) were added Pd(OAc)$_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes:DCM) gave the PdON8S56tBu in 67% yield.

Example 20

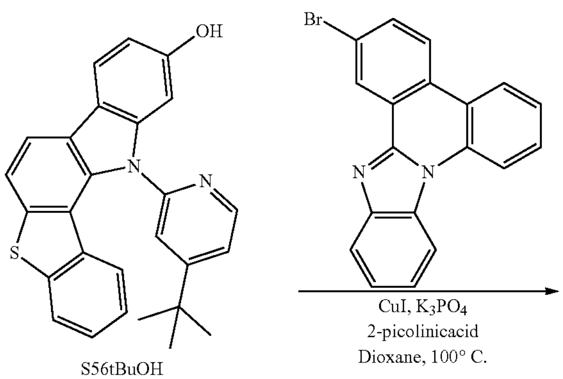

S56tBuOH

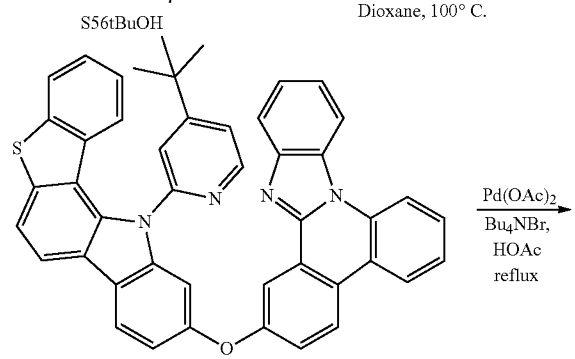

ON8-PS56tBu Ligand

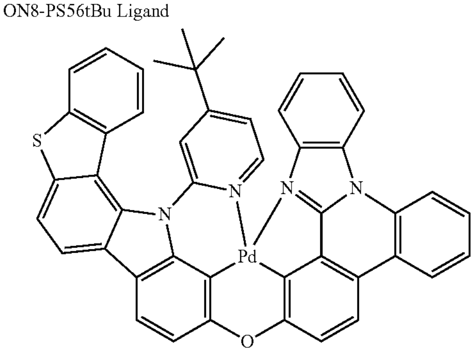

PdON8-PS56tBu

Synthesis of ON8-PS56tBu Ligand

To a solution of 7-bromobenzo[4,5]imidazo[1,2-f]phenanthridine (1.5 eq) in dioxane (0.1 M) were added S56tBuOH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 75% yield.

Synthesis of PdON8-PS56tBu

To a solution of ON8-PS56tBu ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes:DCM) gave the PdON8-PS56tBu in 63% yield.

Example 21

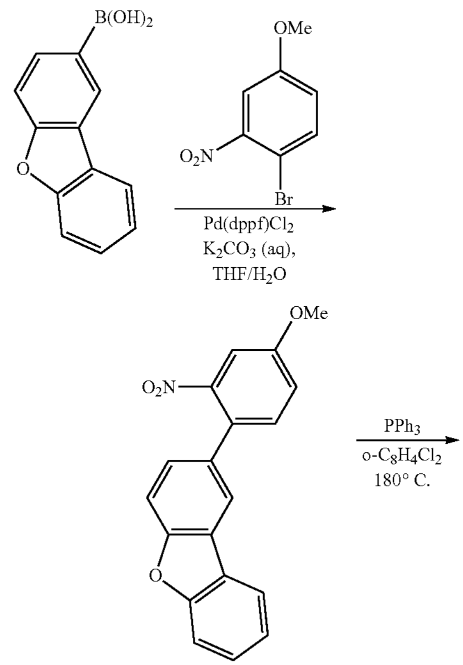

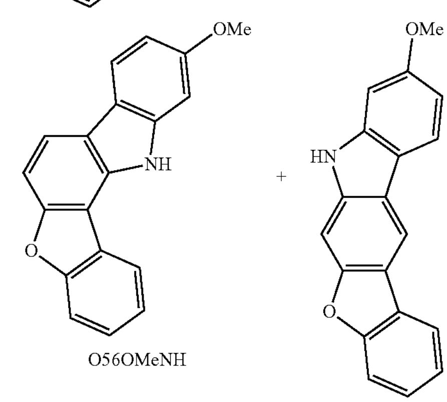

O56OMeNH

O54OMeNH

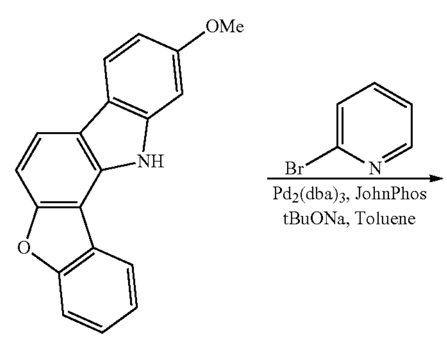

O56OMeNH

-continued

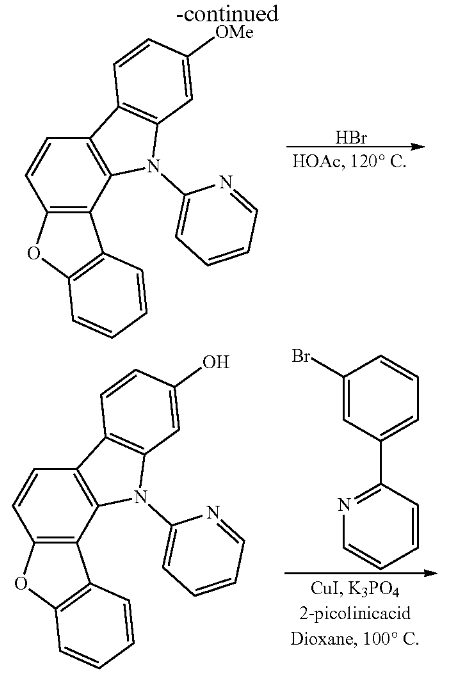

O56OH

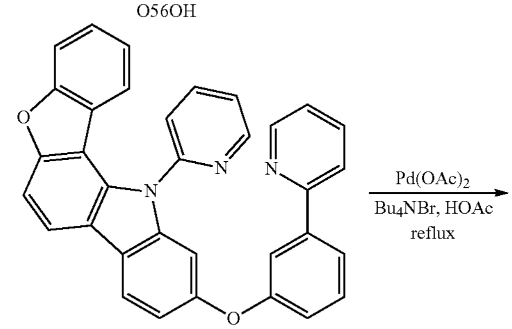

ON3O56 Ligand

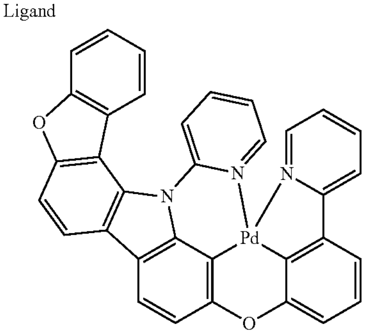

PdON3O56

Synthesis of ON3O56 Ligand

To a solution of 2-(3-bromophenyl)pyridine (1.5 eq) in dioxane (0.1 M) were added O56OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 76% yield.

Synthesis of PdON3056

To a solution of ON3O56 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3O56 in 68% yield.

Example 22

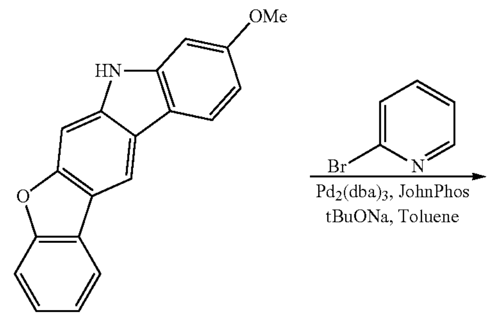

O54OMeNH

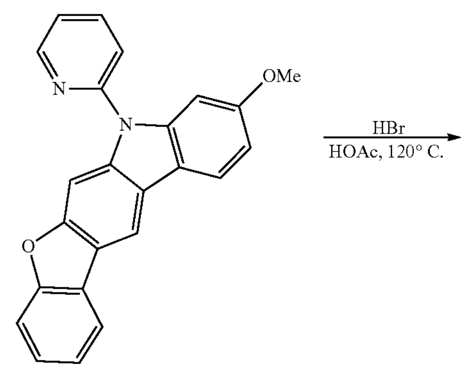

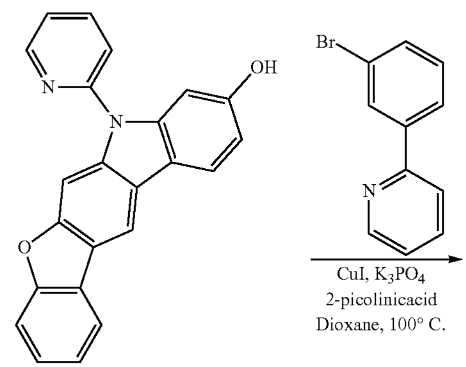

O54OH

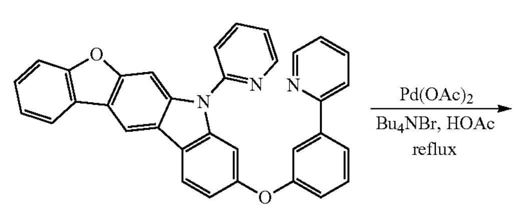

ON3O54 Ligand

-continued

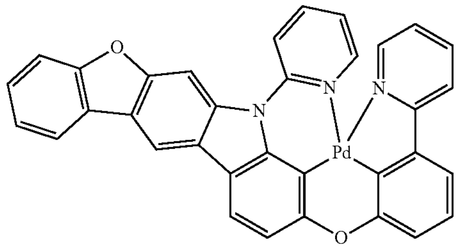

PdON3O54

Synthesis of ON3O54 Ligand

To a solution of 2-(3-bromophenyl)pyridine (1.5 eq) in dioxane (0.1 M) were added S56OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 81% yield.

Synthesis of PdON3O54

To a solution of ON3O54 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3O54 in 69% yield.

Example 23

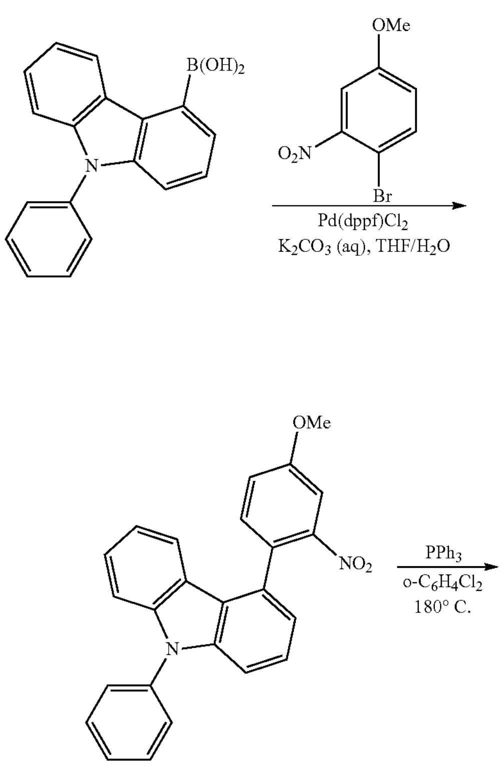

-continued

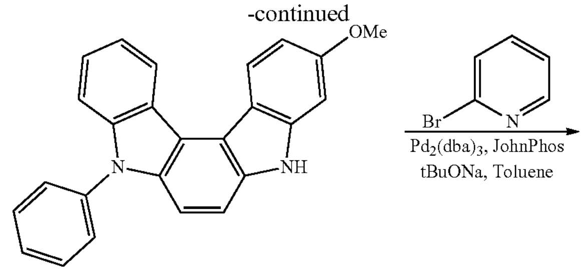

N43OMeNH

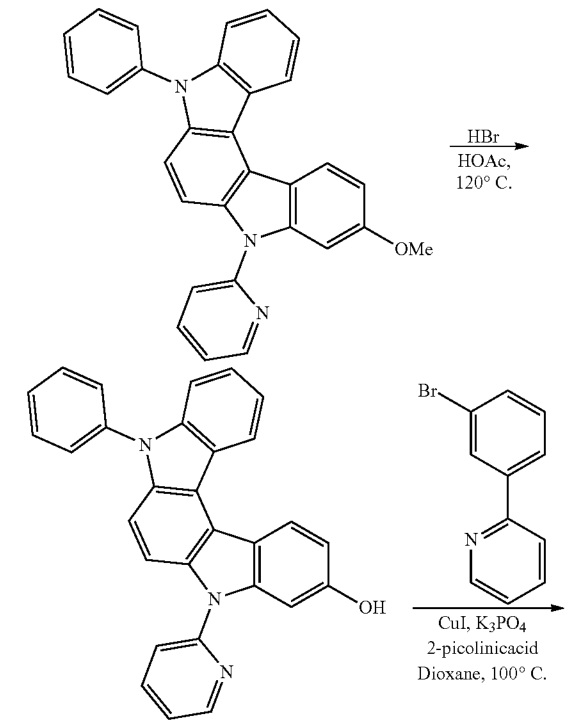

N43OH

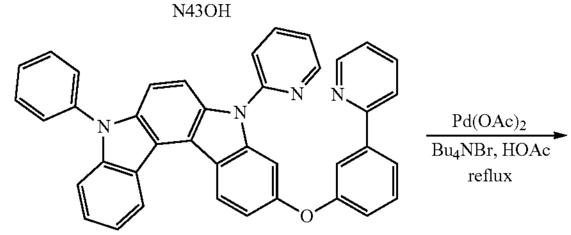

ON3N43 Ligand

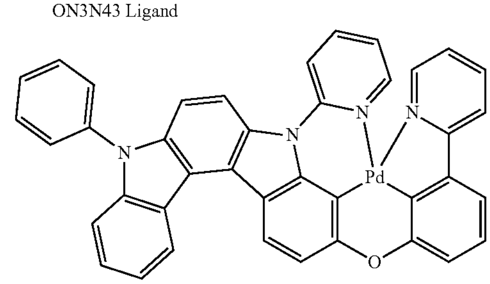

PdON3N43

Synthesis of ON3N43 Ligand

To a solution of 2-(3-bromophenyl)pyridine (1.5 eq) in dioxane (0.1 M) were added N43OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature.

The solvent was evaporated under reduced pressure. The residue was then purified by flash column chromatography to give the product in 78% yield.

Synthesis of PdON3N43

To a solution of ON3N43 ligand (1 eq) in HOAc (0.02 M) were added $Pd(OAc)_2$ (1.2 eq) and $n\text{-}Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3N43 in 66% yield.

Example 24

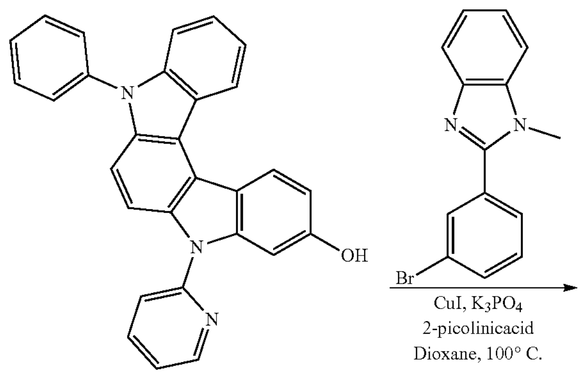

N43OH

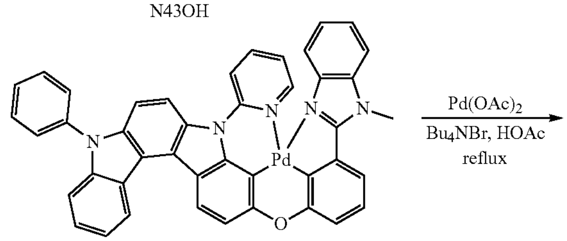

ON8N43 Ligand

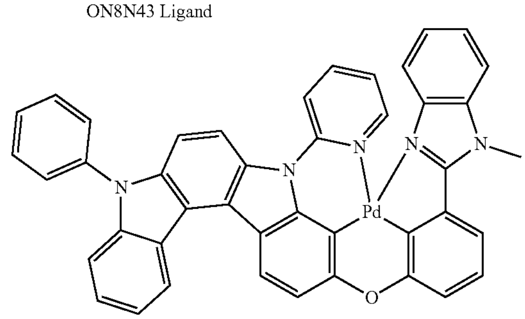

PdON8N43

Synthesis of ON8N43 Ligand

To a solution of 2-(3-bromophenyl)-1-methyl-1H-benzo[d]imidazole (1.5 eq) in dioxane (0.1 M) were added N43OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 66% yield.

Synthesis of PdON8N43

To a solution of ON8N43 ligand (1 eq) in HOAc (0.02 M) were added $Pd(OAc)_2$ (1.2 eq) and $n\text{-}Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON8N43 in 57% yield.

Example 25

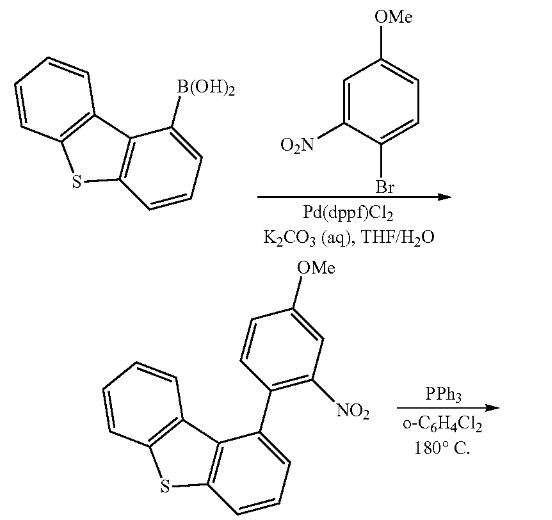

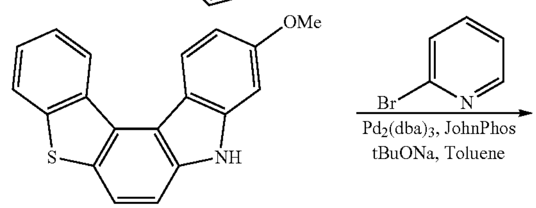

S43OMeNH

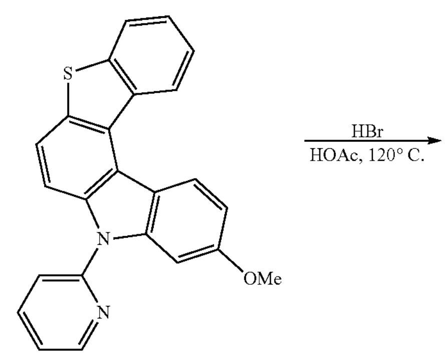

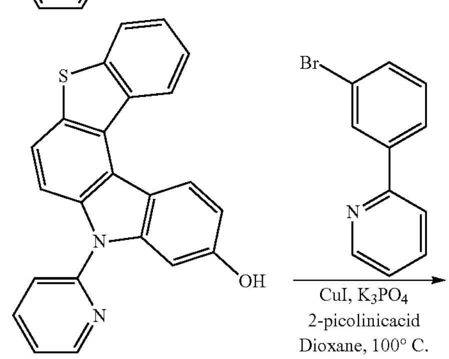

S43OH

-continued

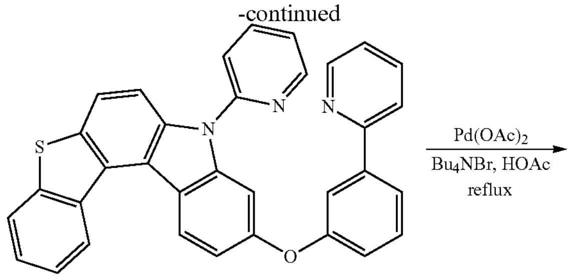

ON3S43 Ligand

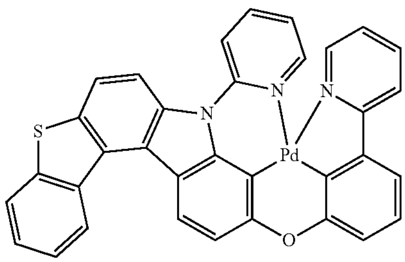

PdON3S43

Synthesis of ON3S43 Ligand

To a solution of 2-(3-bromophenyl)pyridine (1.5 eq) in dioxane (0.1 M) were added S43OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 73% yield.

Synthesis of PdON3S43

To a solution of ON3S43 ligand (1 eq) in HOAc (0.02 M) were added $Pd(OAc)_2$ (1.2 eq) and n-$Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3S43 in 61% yield.

Example 26

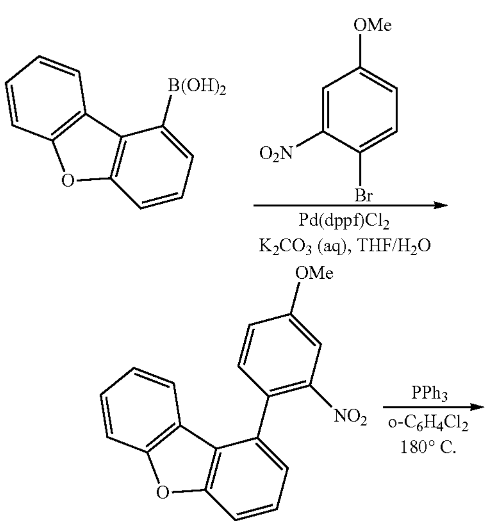

-continued

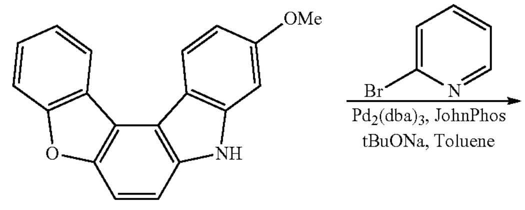

O43OMeNH

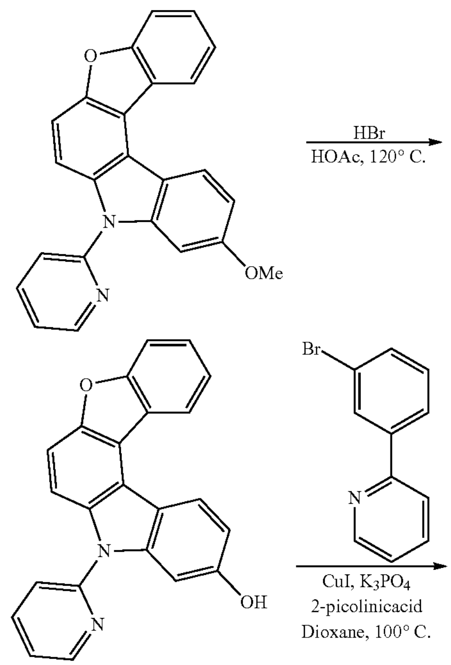

O43OH

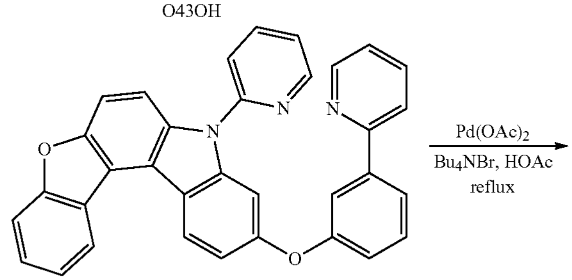

ON3O43 Ligand

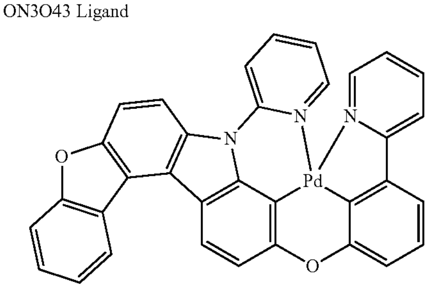

PdON3O43

Synthesis of ON3O43 Ligand

To a solution of 2-(3-bromophenyl)pyridine (1.5 eq) in dioxane (0.1 M) were added S43OH (1 eq), CuI (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 77% yield.

Synthesis of PdON3O43

To a solution of ON3O43 ligand (1 eq) in HOAc (0.02 M) were added $Pd(OAc)_2$ (1.2 eq) and $n\text{-}Bu_4NBr$ (0.1 eq). The mixture was heated to reflux and maintained at this temperature for 2 days. The reaction mixture was cooled to room temperature. The solvent was then removed under reduced pressure. Purification by column chromatography (hexanes: DCM) gave the PdON3O43 in 65% yield.

Example 27

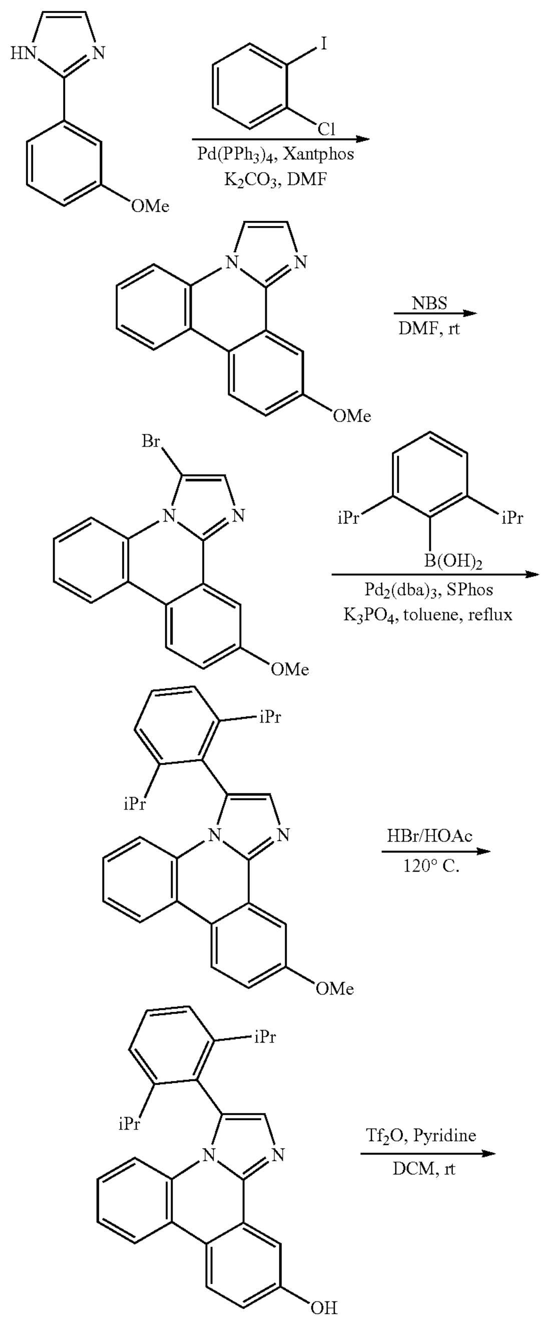

-continued

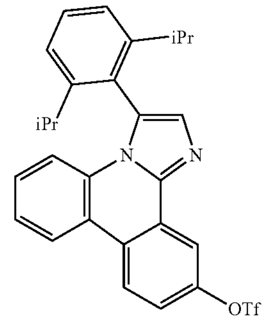

2-PiPrOTf

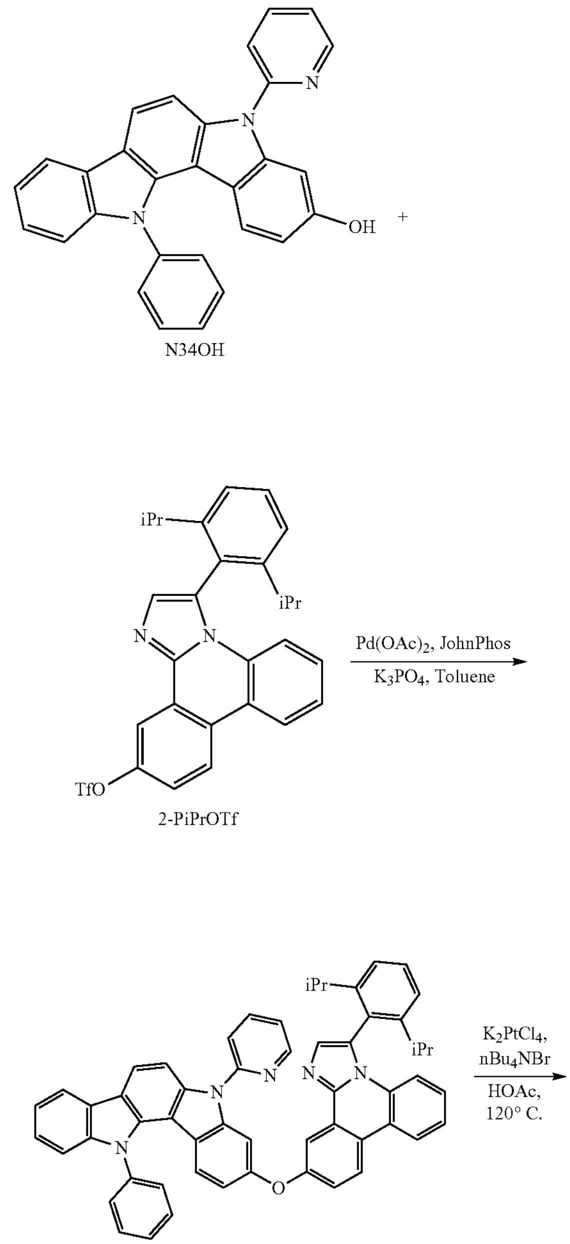

-continued

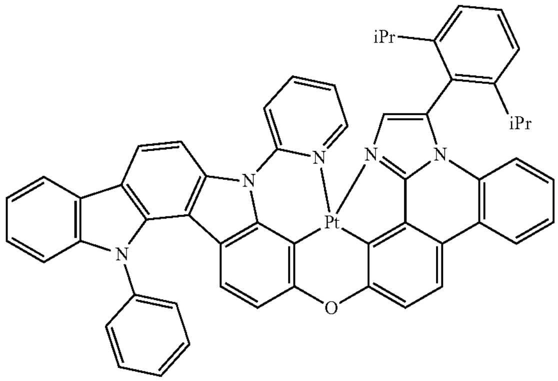

PtON2-PiPrN34

Synthesis of ON2-PiPrN34 Ligand

To a solution of 2PiPrOTf (1.5 eq) in toluene (0.1 M) were added N34OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 31% yield.

Synthesis of PtON2-PiPrN34

To a solution of ON2-PiPrN34 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrN34 in 48% yield.

Example 28

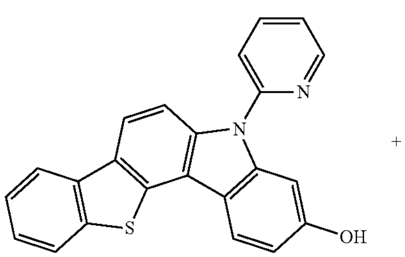

S34OH

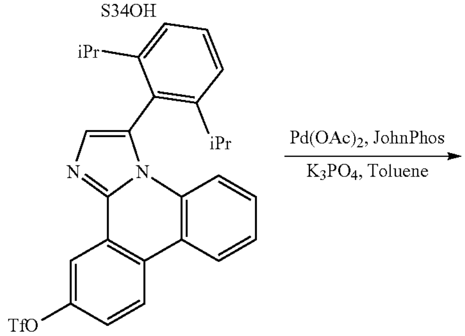

2-PiprOTf

-continued

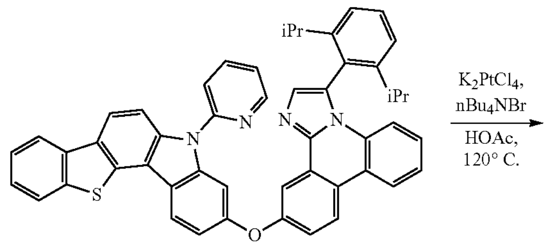

ON2-PiPrS34 Ligand

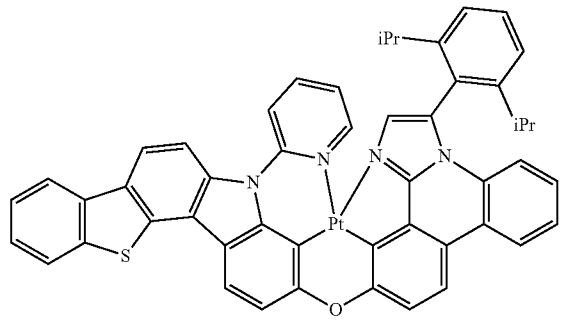

PtON2-PiPrS34

Synthesis of ON2-PiPrS34 Ligand

To a solution of 2PiPrOTf (1.5 eq) in toluene (0.1 M) were added S34OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 28% yield.

Synthesis of PtON2-PiPrS34

To a solution of ON2-PiPrS34 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrS34 in 41% yield.

Example 29

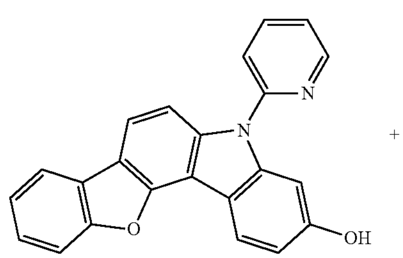

O34OH

-continued

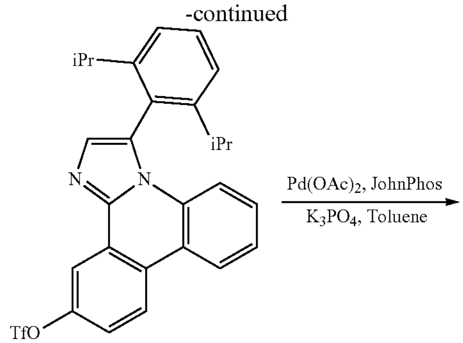

2-PiPrOTf

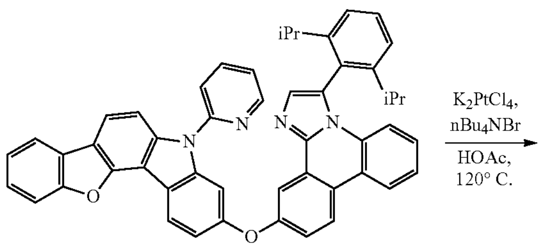

ON2-PiPrO34 Ligand

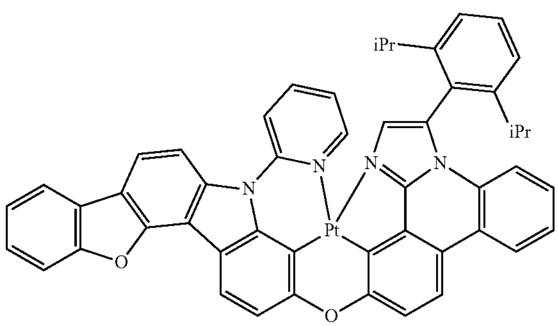

PtON2-PiPrO34

Synthesis of ON2-PiPrO34 Ligand

To a solution of 2PiPrOTf (1.5 eq) in toluene (0.1 M) were added O34OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 25% yield.

Synthesis of PtON2-PiPrO34

To a solution of ON2-PiPrO34 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrO34 in 44% yield.

Example 30

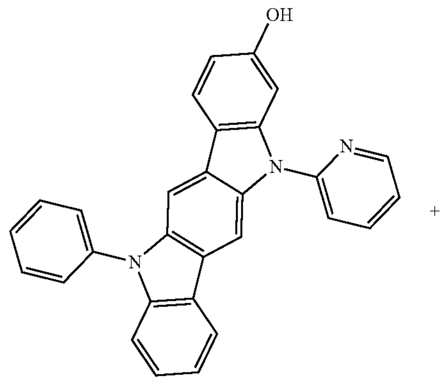

N45OH

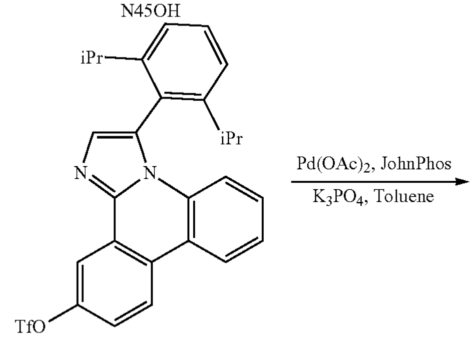

2-PiPrOTf

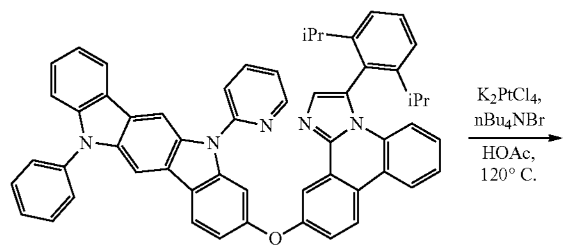

ON2-PiPrN45 Ligand

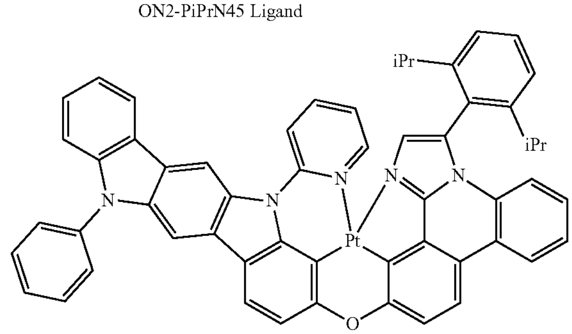

PtON2-PiPrN45

Synthesis of ON2-PiPrN45 Ligand

To a solution of 2PiPrOTf (1.5 eq) in toluene (0.1 M) were added N45OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 27% yield.

Synthesis of PtON2-PiPrN45

To a solution of ON2-PiPrN45 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrN45 in 38% yield.

Example 31

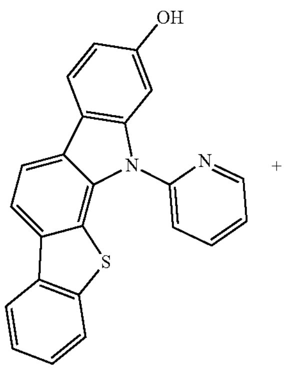

S65OH

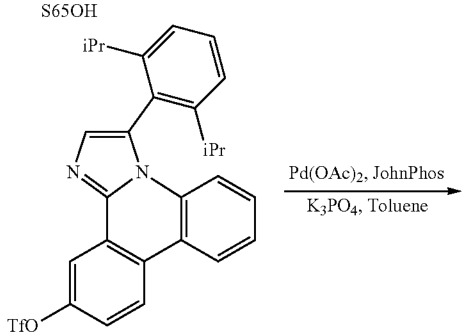

2-PiPrOTf

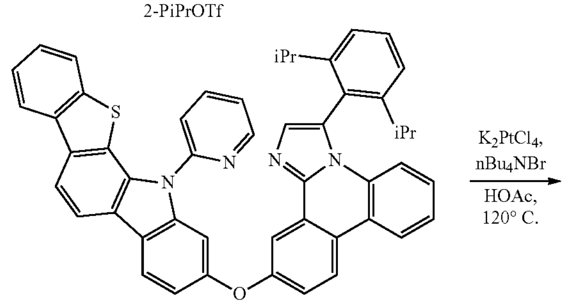

ON2-PiPrS65 Ligand

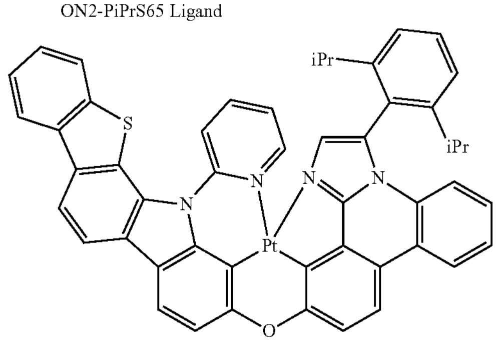

PtON2-PiPrS65

Synthesis of ON2-PiPrS65 Ligand

To a solution of 2PiPrOTf (1.5 eq) in toluene (0.1 M) were added S65OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 25% yield.

Synthesis of PtON2-PiPrS65

To a solution of ON2-PiPrS65 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrS65 in 44% yield.

Example 32

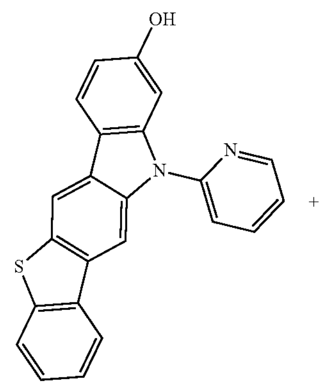

S45OH

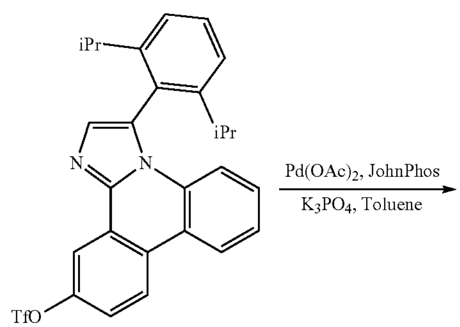

2-PiPrOTf

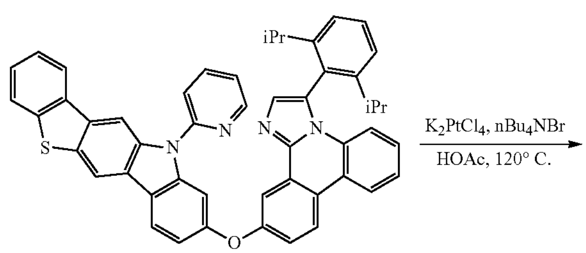

ON2-PiPrS45 Ligand

-continued

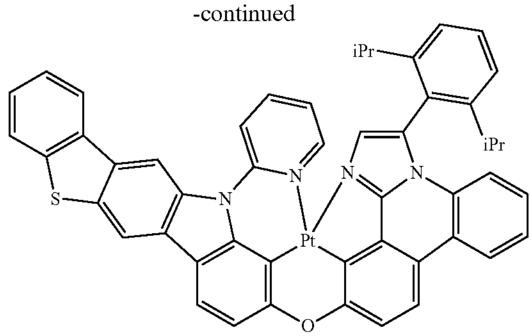

PtON2-PiPrS45

Synthesis of ON2-PiPrS45 Ligand

To a solution of 2PiPrOTf (1.5 eq) in toluene (0.1 M) were added S45OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 32% yield.

Synthesis of PtON2-PiPrS45

To a solution of ON2-PiPrS45 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrS45 in 47% yield.

Example 33

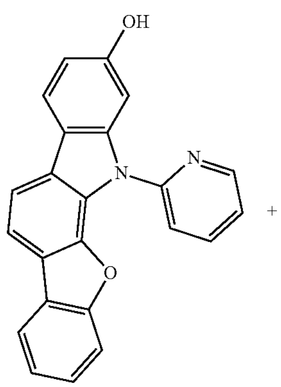

O65OH

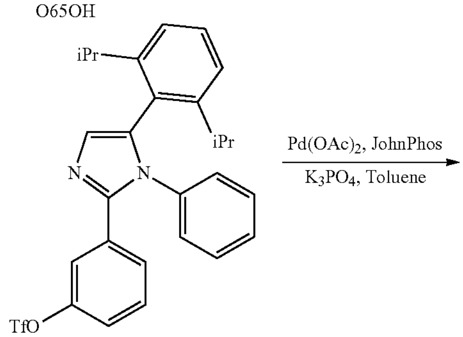

2-PiPrOTf

-continued

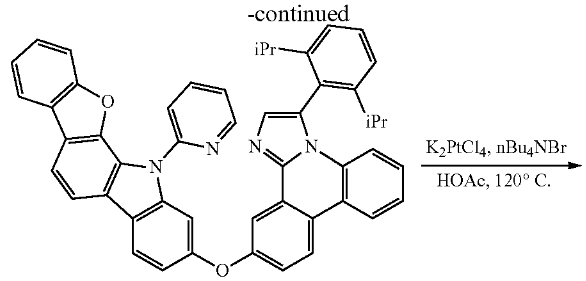

ON2-PiPrO65 Ligand

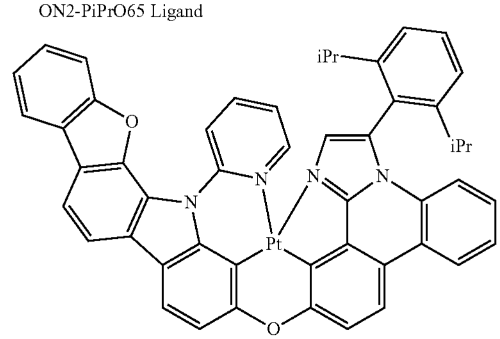

PtON2-PiPrO65

Synthesis of ON2-PiPrO65 Ligand

To a solution of 2PiPrOTf (1.5 eq) in toluene (0.1 M) were added O65OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 27% yield.

Synthesis of PtON2-PiPrO65

To a solution of ON2-PiPrO65 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrO65 in 42% yield.

Example 34

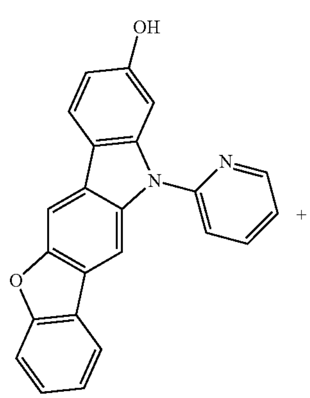

O45OH

-continued

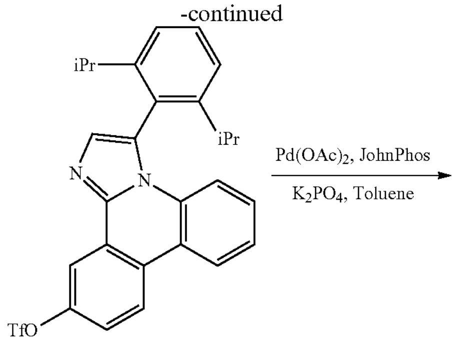

2-PiPrOTf

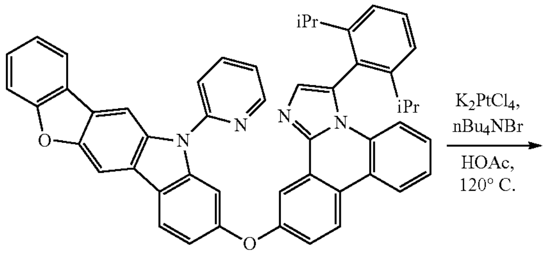

ON2-PiPrO45
Ligand

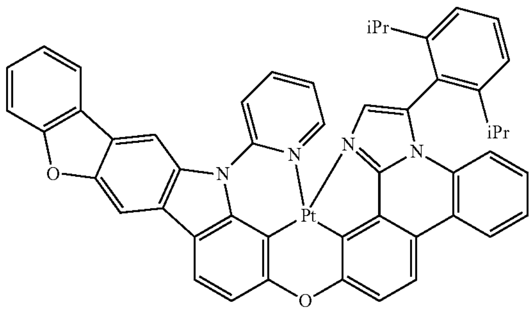

PtON2-PiPr045

Synthesis of ON2-PiPrO45 Ligand

To a solution of 2PiPrOTf (1.5 eq) in toluene (0.1 M) were added O45OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 25% yield.

Synthesis of PtON2-PiPrO45

To a solution of ON2-PiPrO45 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrO45 in 44% yield.

Example 35

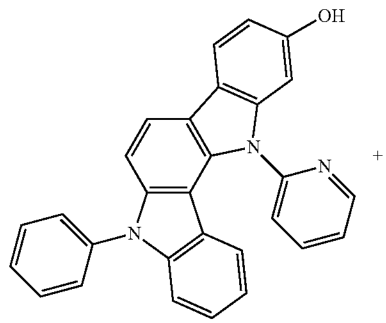

N56OH

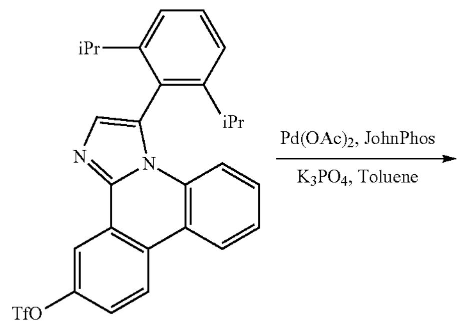

2-PiPrOTf

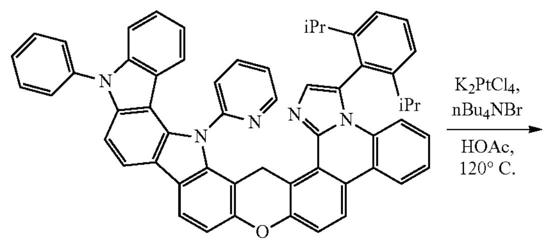

ON2-PiPrN56
Ligand

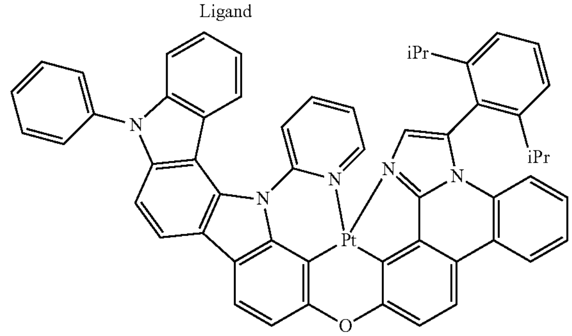

PtON2-PiPrN56

Synthesis of ON2-PiPrN56 Ligand

To a solution of 2PiPrOTf (1.5 eq) in toluene (0.1 M) were added N56OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 28% yield.

Synthesis of PtON2-PiPrN56

To a solution of ON2-PiPrN56 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrN56 in 41% yield.

Example 36

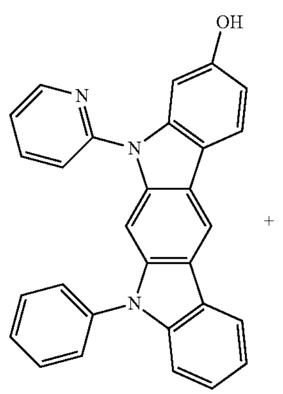

N54OH

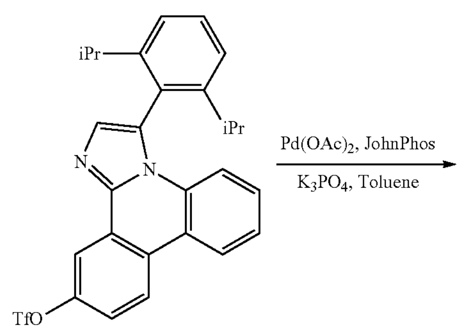

2-PiPrOTf

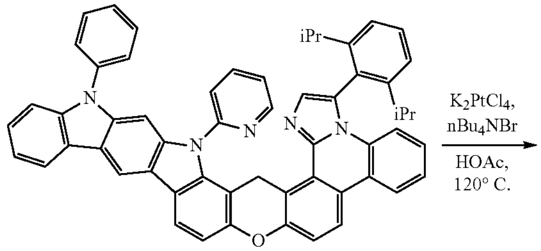

ON2-PiPrN54
Ligand

-continued

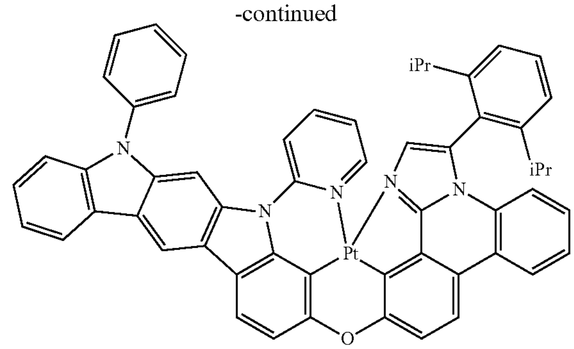

PtON2-PiPrN54

Synthesis of ON2-PiPrN54 Ligand

To a solution of 2PiPrOTf (1.5 eq) in toluene (0.1 M) were added N54OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 24% yield.

Synthesis of PtON2-PiPrN54

To a solution of ON2-PiPrN54 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrN54 in 49% yield.

Example 37

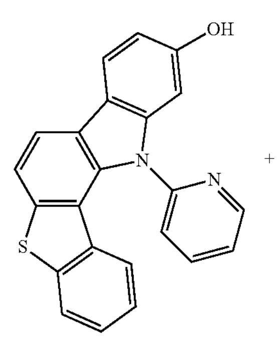

S56OH

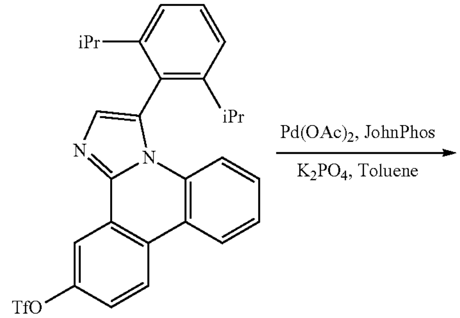

2-PiPrOTf

-continued

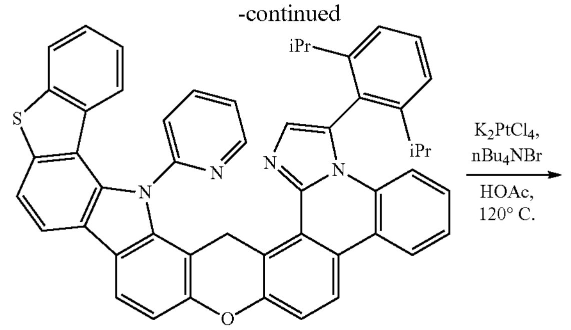

ON2-PiPrS56
Ligand

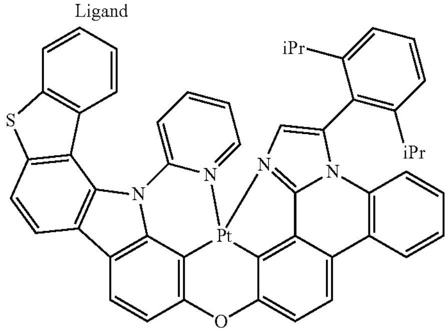

PtON2-PiPrS56

Synthesis of ON2-PiPrS56 Ligand

To a solution of 2PiPrOTf (1.5 eq) in toluene (0.1 M) were added S56OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 27% yield.

Synthesis of PtON2-PiPrS56

To a solution of ON2-PiPrS56 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrS56 in 53% yield.

Example 38

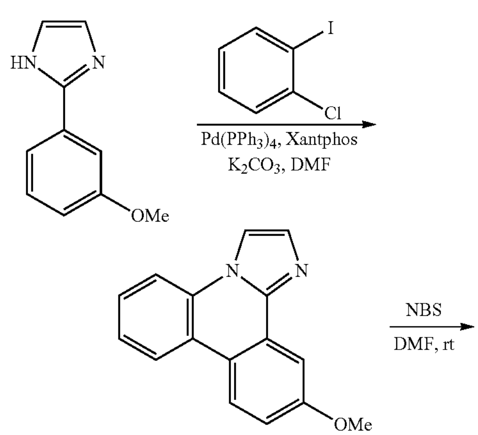

-continued

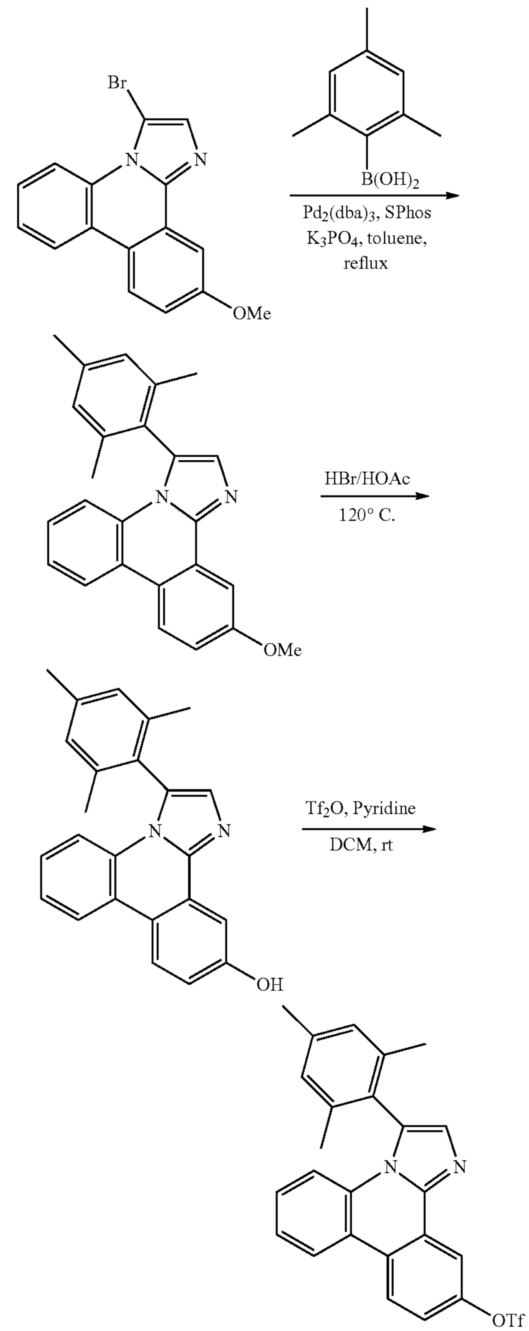

2-PMesOTf

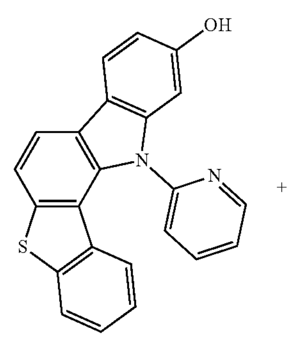

S56OH

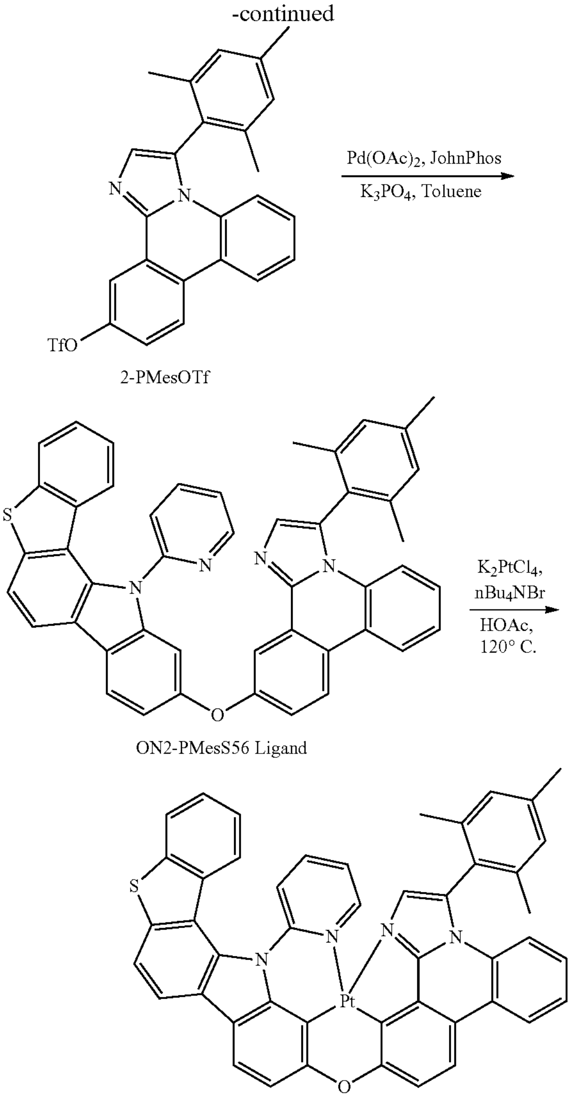

Synthesis of ON2-PiPrS56 Ligand

To a solution of 2-PMesOTf (1.5 eq) in toluene (0.1 M) were added S56OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 29% yield.

Synthesis of PtON2-PMesS56

To a solution of ON2-PMesS56 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PMesS56 in 49% yield.

Example 39

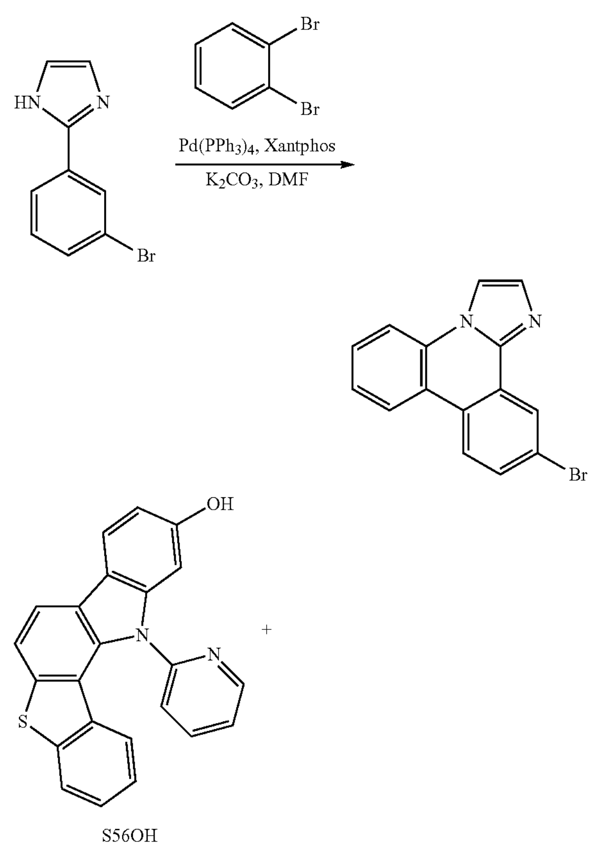

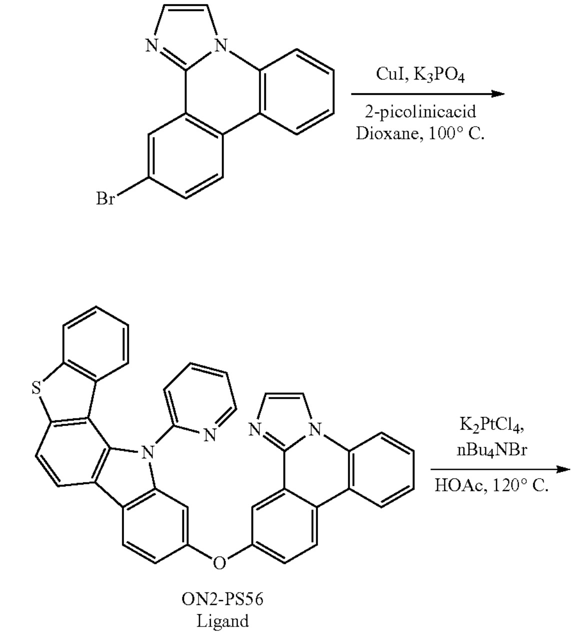

-continued

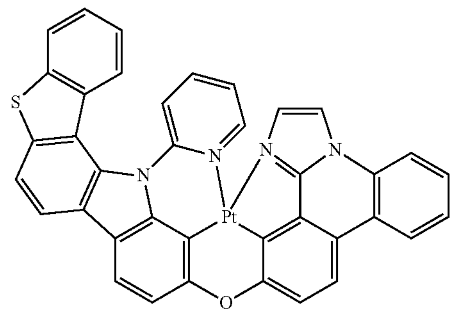

PtON2-PS56

Synthesis of ON2-PS56 Ligand

To a solution of 11-bromoimidazo[1,2-f]phenanthridine (1.5 eq) in dioxane (0.1 M) were added S56OH (1 eq), $Pd(OAc)_2$ (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 72% yield.

Synthesis of PtON2-PS56

To a solution of ON2-PS56 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes: DCM) gave the PtON2-PS56 in 49% yield.

Example 40

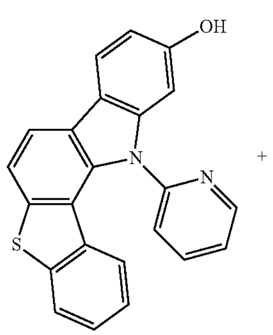

S56OH

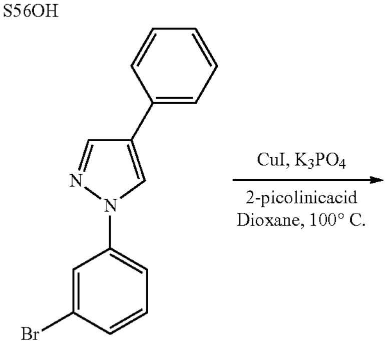

-continued

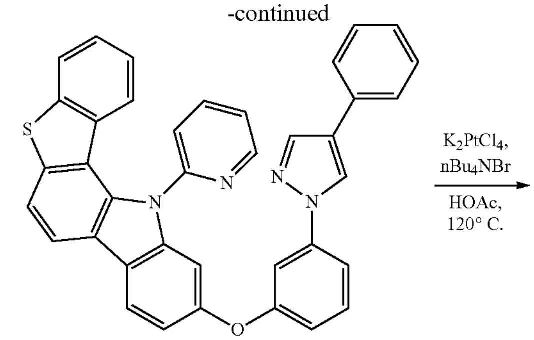

ON6S56
Ligand

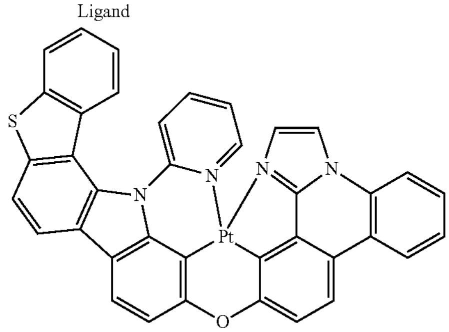

PtON6S56

Synthesis of ON6S56 Ligand

To a solution of 1-(3-bromophenyl)-4-phenyl-1H-pyrazole (1.5 eq) in dioxane (0.1 M) were added S56OH (1 eq), $Pd(OAc)_2$ (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product in 77% yield.

Synthesis of PtON6S56

To a solution of ON6S56 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes: DCM) gave the PtON6S56 in 39% yield.

Example 41

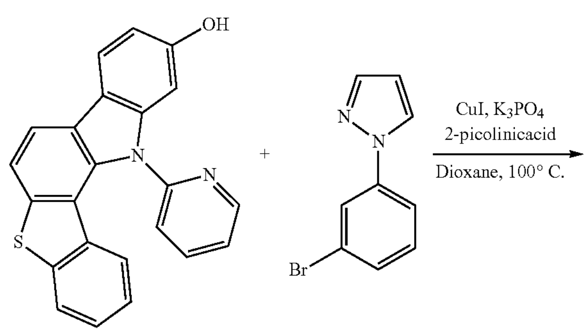

S56OH

-continued

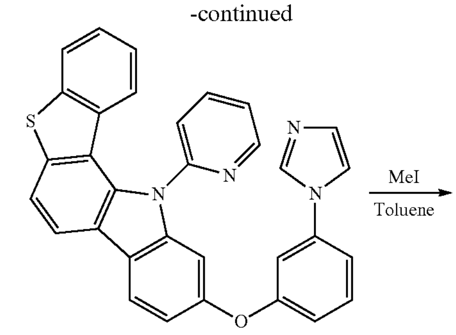

ON7S56 LP-1

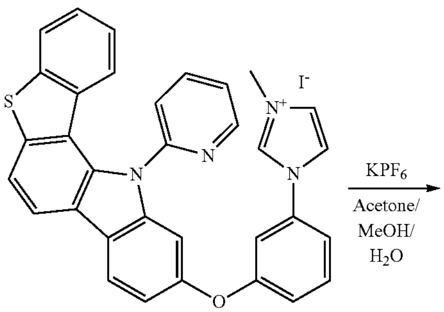

ON7S56 LP-2

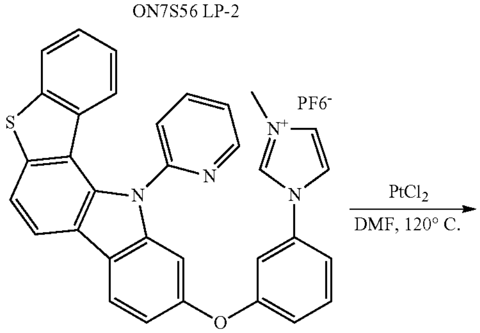

ON7S56 Ligand

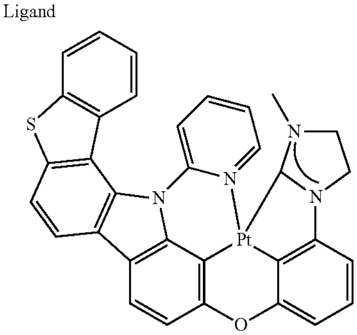

PtON7S56

Synthesis of ON7S56 Ligand

To a solution of 1-(3-bromophenyl)-1H-imidazole (1.5 eq) in dioxane (0.1 M) were added S56OH (1 eq), $Pd(OAc)_2$ (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product ON7S56 LP-1 in 79% yield.

To a solution of ON7S56 LP-1 (1 eq) in toluene (0.1 M) was added $CH_3I$ (1.05 eq). The reaction mixture was heated at 40° C. and maintained at this temperature until the TLC shows the complete consumption of ON7S56 LP-1. The reaction mixture was then cooled to room temperature and the precipitate was collected by filtration to give the ON7S56 LP-2 in 85% yield.

ON7S56 LP-2 was dissolved in a mixture of water, methanol and acetone (1:1:1, 0.05-0.1 M) and treated with an aqueous solution of $KPF_6$ (1.2 eq). After 12 h, acetone and methanol were removed at reduced pressure. The precipitate was filtered and washed with water. The water layer was extracted with $CH_2Cl_2$. The precipitate was dissolved in the combined organic layer, washed with water and evaporated under reduced pressure to give the product ON7S56 Ligand in 87% yield.

Synthesis of PtON7S56

To a solution of ON7S56 ligand (1 eq) in DMF (0.02 M) were added $PtCl_2$ (1.2 eq). The mixture was heated to 120° C. and maintained at this temperature for 3 days. The reaction mixture was cooled to room temperature. The solvent was then removed under reduced pressure. Purification by column chromatography (hexanes:DCM) gave the PtON7S56 in 23% yield.

Example 42

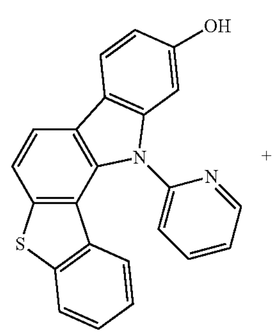

S56OH

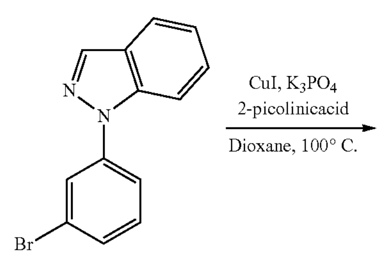

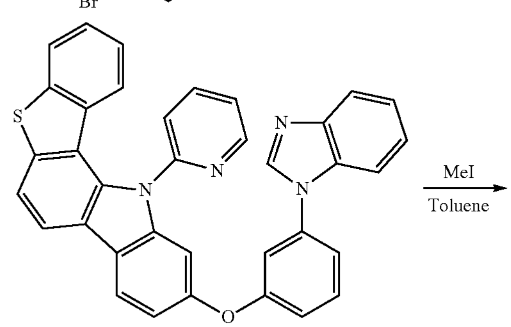

ON5S56 LP-1

-continued

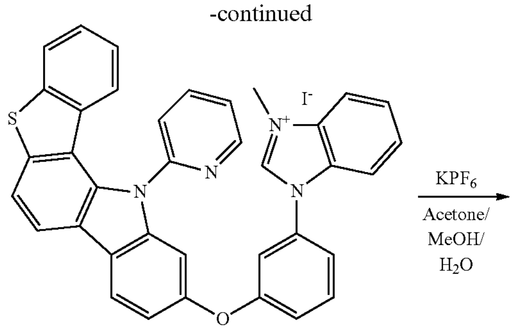

ON5S56 LP-2

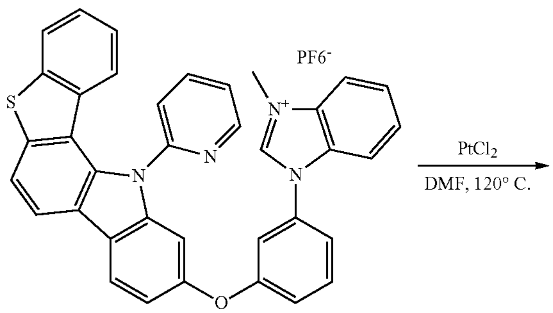

ON5S56 Ligand

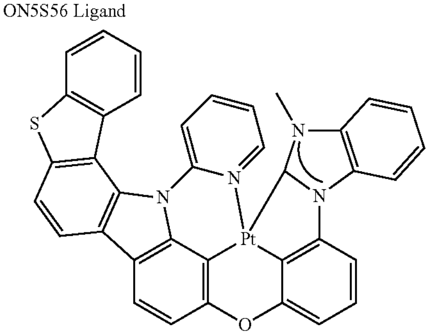

PtON5S56

Synthesis of ON5S56 Ligand

To a solution of 1-(3-bromophenyl)-1H-imidazole (1.5 eq) in dioxane (0.1 M) were added S56OH (1 eq), $Pd(OAc)_2$ (0.1 eq), 2-picolinic acid (0.2 eq), and $K_3PO_4$ (2 eq). The mixture was heated to 100° C. and maintained at this temperature for 24 hours. The mixture was then cooled to room temperature. The solvent was evaporated under reduced pressure. The residue was then purified by flash column chromatography to give the product ON5S56 LP-1 in 81% yield.

To a solution of ON5S56 LP-1 (1 eq) in toluene (0.1 M) was added $CH_3I$ (1.05 eq). The reaction mixture was heated at 40° C. and maintained at this temperature until the TLC shows the complete consumption of ON5S56 LP-1. The reaction mixture was then cooled to room temperature and the precipitate was collected by filtration to give the ON5S56 LP-2 in 83% yield.

ON5S56 LP-2 was dissolved in a mixture of water, methanol and acetone (1:1:1, 0.05-0.1 M) and treated with an aqueous solution of $KPF_6$ (1.2 eq). After 12 h, acetone and methanol were removed at reduced pressure. The precipitate was filtered and washed with water. The water layer was extracted with $CH_2Cl_2$. The precipitate was dissolved in the combined organic layer, washed with water and evaporated under reduced pressure to give the product ON5S56 Ligand in 89% yield.

Synthesis of PtON5S56

To a solution of ON5S56 ligand (1 eq) in DMF (0.02 M) were added $PtCl_2$ (1.2 eq). The mixture was heated to 120° C. and maintained at this temperature for 3 days. The reaction mixture was cooled to room temperature. The solvent was then removed under reduced pressure. Purification by column chromatography (hexanes:DCM) gave the PtON5S56 in 27% yield.

Example 43

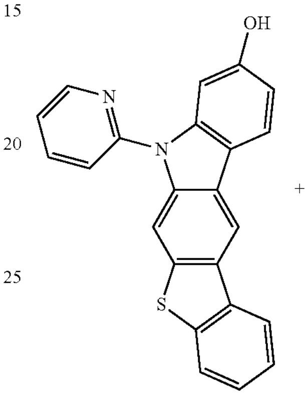

S54OH

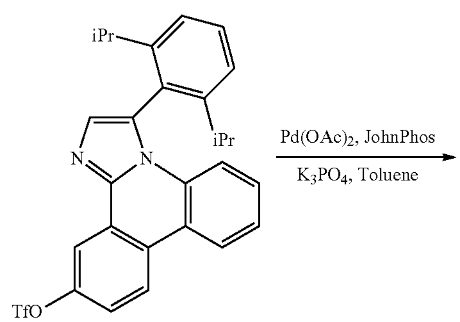

2-PiPrOTf

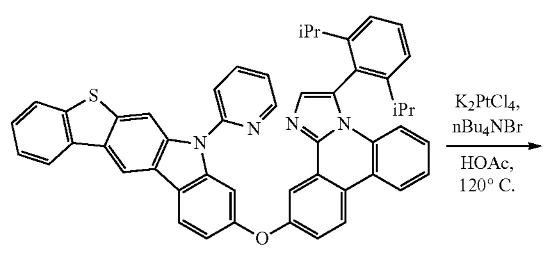

ON2-PiPrS54
Ligand

-continued

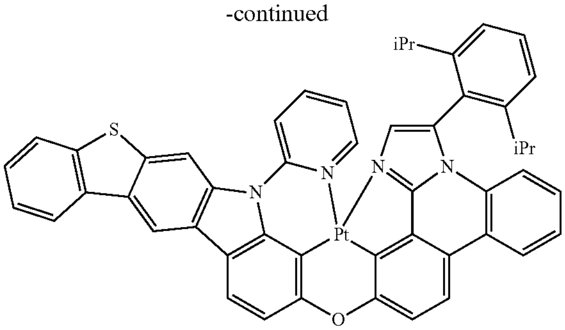

PtON2-PiPrS54

Synthesis of ON2-PiPrS54 Ligand

To a solution of 2PiPrOTf (1.5 eq) in toluene (0.1 M) were added S54OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 33% yield.

Synthesis of PtON2-PiPrS54

To a solution of ON2-PiPrS54 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrS54 in 46% yield.

Example 44

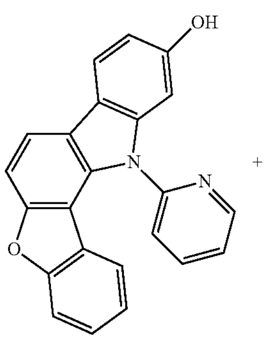

O56OH

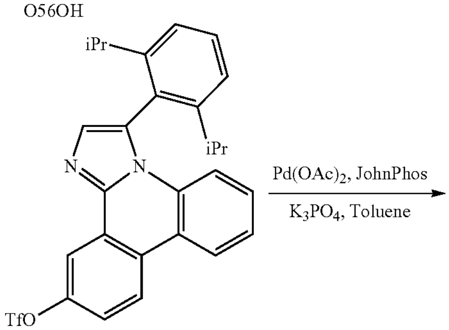

2-PiPrOTf

-continued

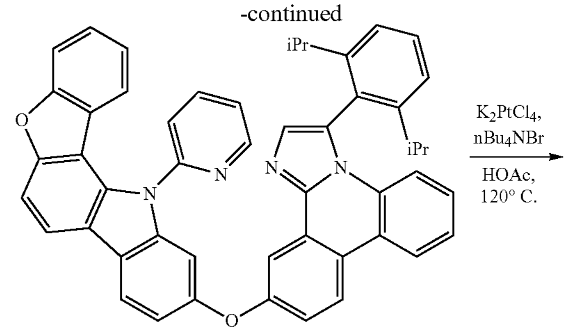

ON2-PiPrO56
Ligand

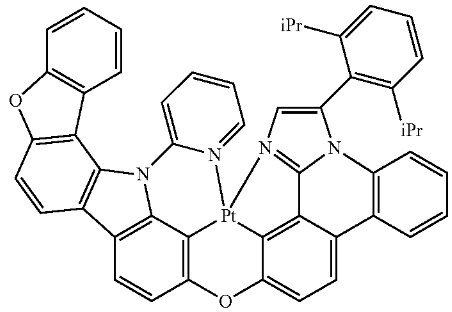

PtON2-PiPrO56

Synthesis of ON2-PiPrO56 Ligand

To a solution of 2PiPrOTf (1.5 eq) in toluene (0.1 M) were added 056OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 28% yield.

Synthesis of PtON2-PiPrO56

To a solution of ON2-PiPrO56 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrO56 in 54% yield.

Example 45

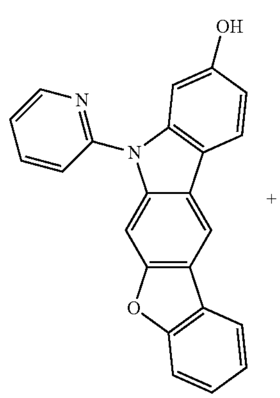

O54OH

-continued

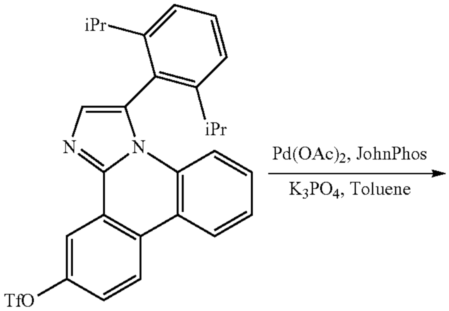

2-PiPrOTf

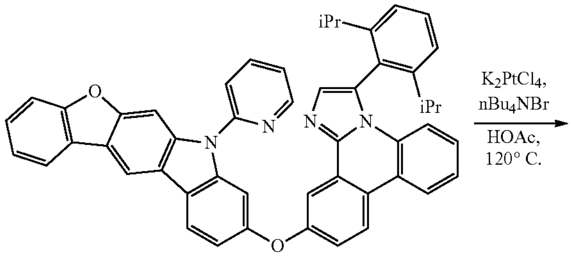

ON2-PiPrO54
Ligand

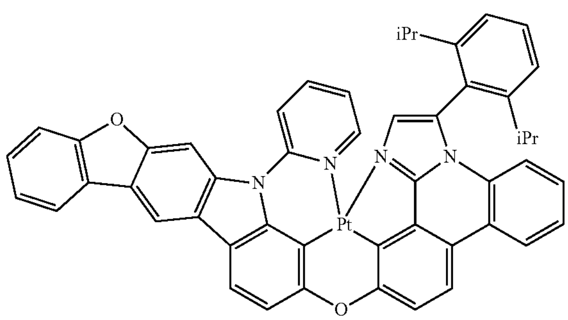

PtON2-PiPrO54

Synthesis of ON2-PiPrO54 Ligand

To a solution of 2PiPrOTf (1.5 eq) in toluene (0.1 M) were added 054OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 24% yield.

Synthesis of PtON2-PiPrO54

To a solution of ON2-PiPrO54 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrO54 in 49% yield.

Example 46

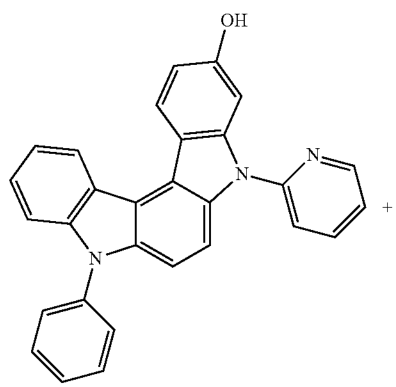

N43OH

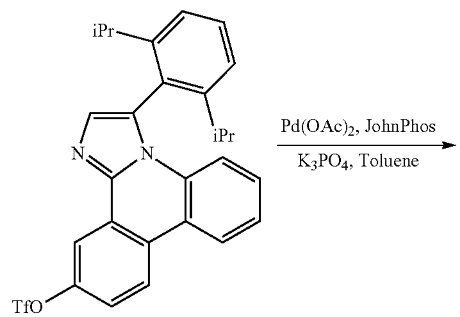

2-PiprOTf

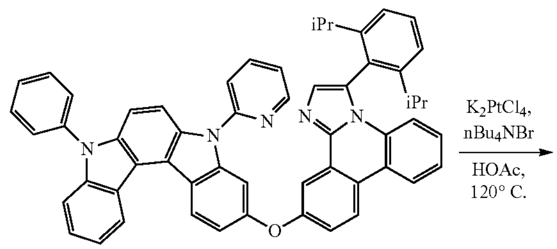

ON2-PiPrN43
Ligand

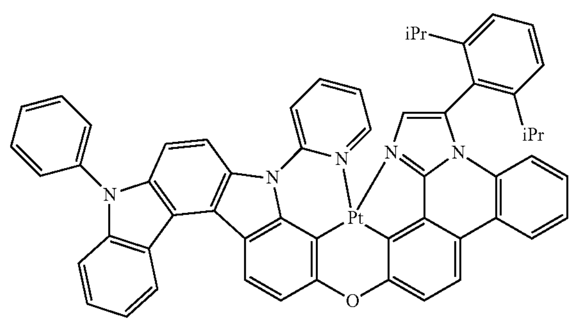

PtON2-PiPrN43

Synthesis of ON2-PiPrN43 Ligand

To a solution of 2PiPrOTf (1.5 eq) in toluene (0.1 M) were added N43OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 28% yield.

Synthesis of PtON2-PiPrN43

To a solution of ON2-PiPrN43 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrN43 in 41% yield.

Example 47

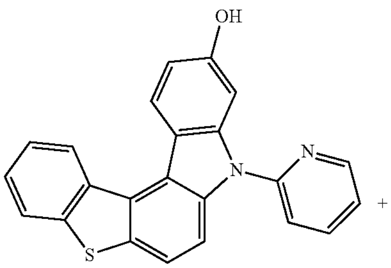

S43OH

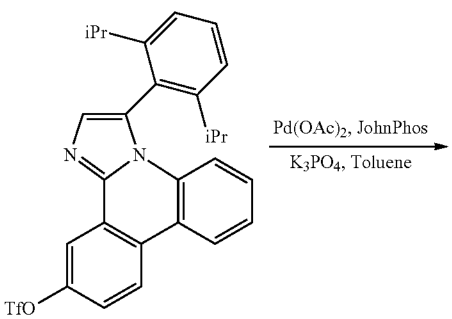

2-PiprOTf

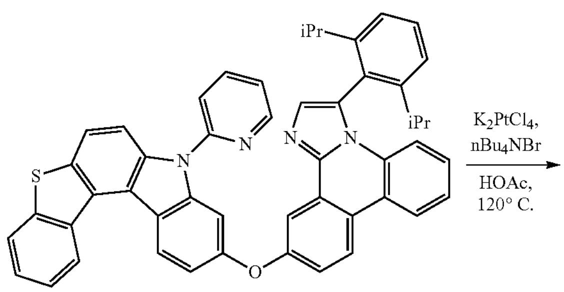

ON2-PiPrS43
Ligand

-continued

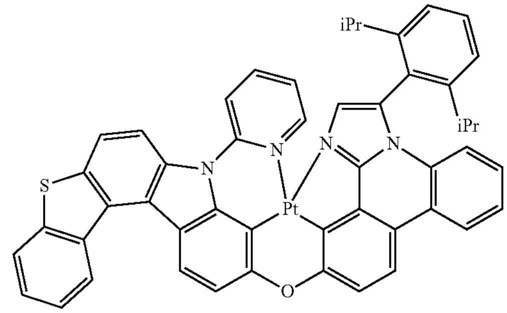

PtON2-SiPrS43

Synthesis of ON2-PiPrS43 Ligand

To a solution of 2PiPrOTf (1.5 eq) in toluene (0.1 M) were added S43OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 32% yield.

Synthesis of PtON2-PiPrS43

To a solution of ON2-PiPrS43 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrS43 in 46% yield.

Example 48

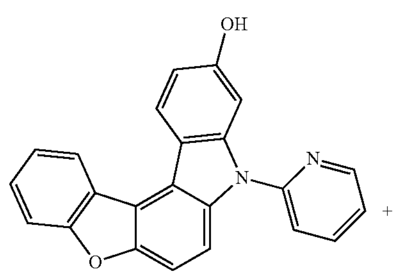

O43OH

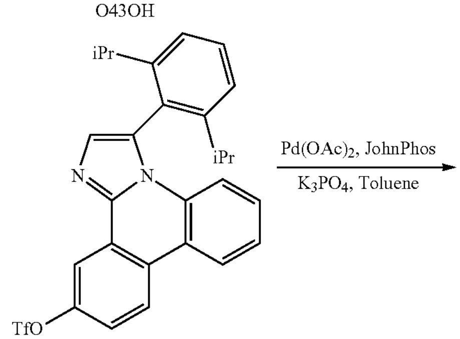

2-PiprOTf

-continued

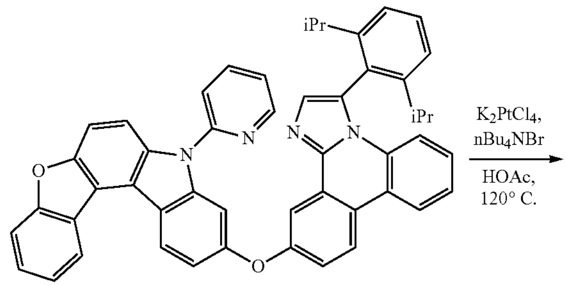

ON2-PiPrO43
Ligand

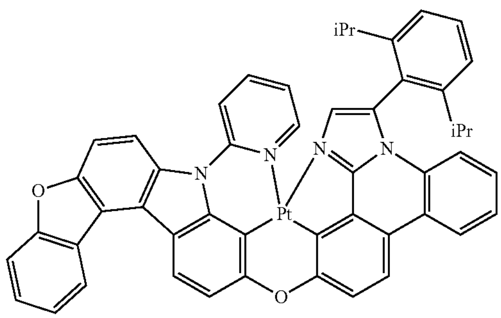

PtON2-PiPrO43

Synthesis of ON2-PiPrO43 Ligand

To a solution of 2PiPrOTf (1.5 eq) in toluene (0.1 M) were added O43OH (1 eq), $Pd(OAc)_2$ (0.1 eq), JohnPhos (0.2 eq), and $K_3PO_4$ (2 eq). The mixture was heated to reflux and maintained at this temperature for 48 hours. The mixture was then cooled to room temperature. The solvent was evaporated under reduced pressure. The residue was then purified by flash column chromatography to give the product in 25% yield.

Synthesis of PtON2-PiPrO43

To a solution of ON2-PiPrO43 ligand (1 eq) in HOAc (0.02 M) were added $K_2PtCl_4$ (1.2 eq) and n-$Bu_4NBr$ (0.1 eq). The mixture was heated to reflux and maintained at this temperature for 3 days. The reaction mixture was cooled to room temperature. The solvent was then removed under reduced pressure. Purification by column chromatography (hexanes:DCM) gave the PtON2-PiPrO43 in 51% yield.

Only a few implementations are described and illustrated. Variations, enhancements and improvements of the described implementations and other implementations can be made based on what is described and illustrated in this document.

What is claimed is:

1. The complex, wherein the complex is selected from the following structures:

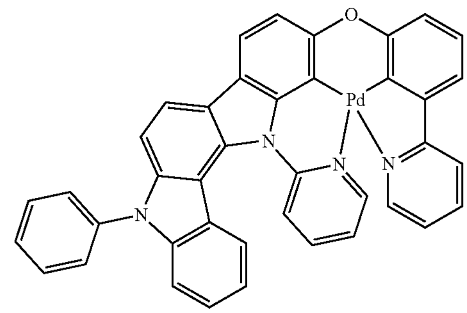

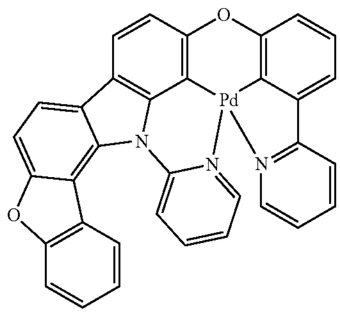

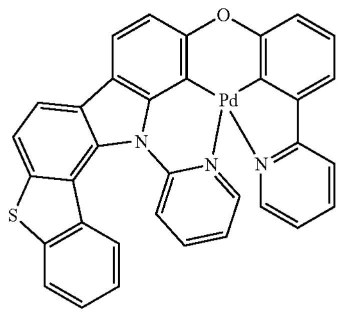

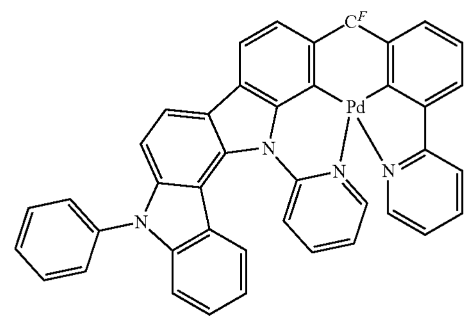

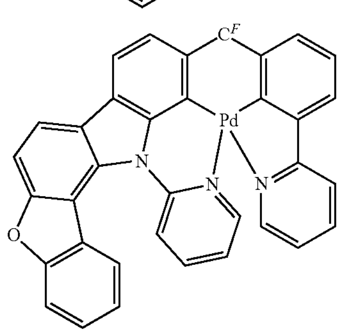

-continued
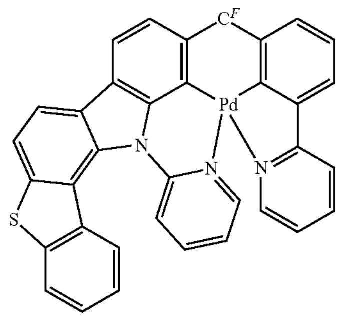
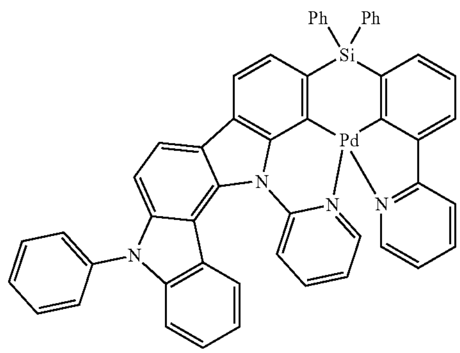
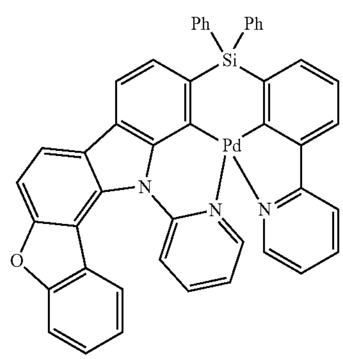
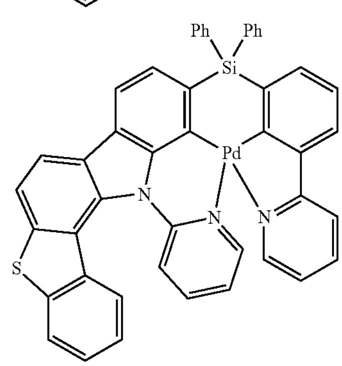
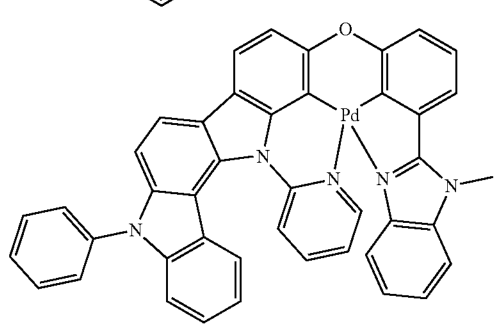
-continued
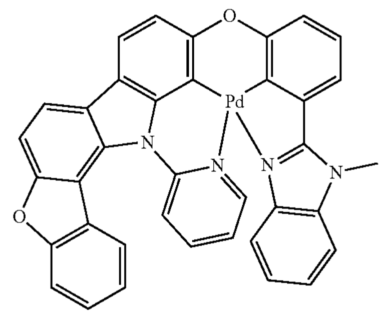
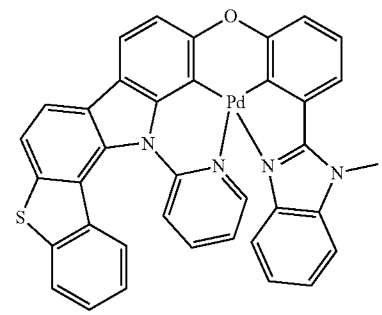
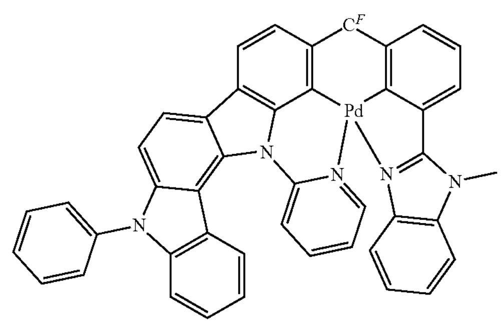
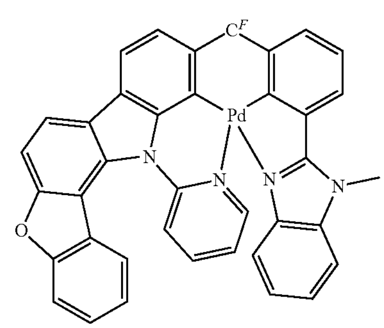
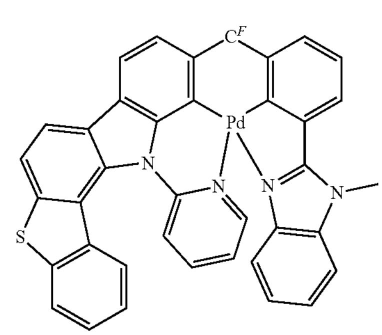

-continued
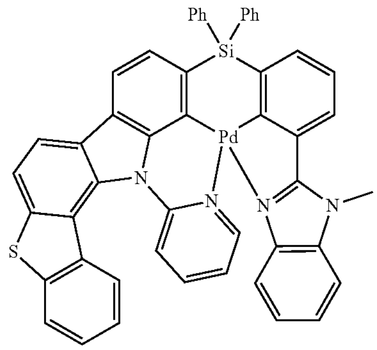
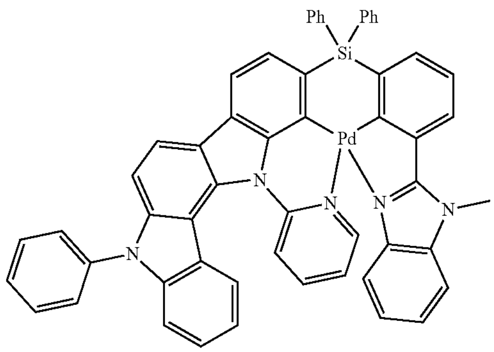
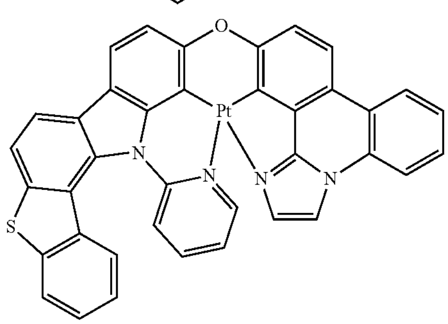
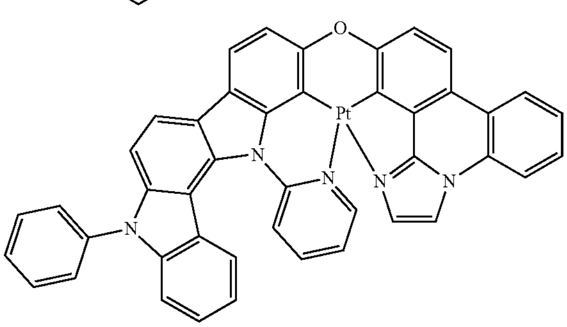
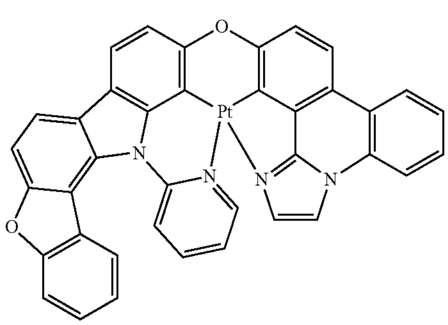
-continued
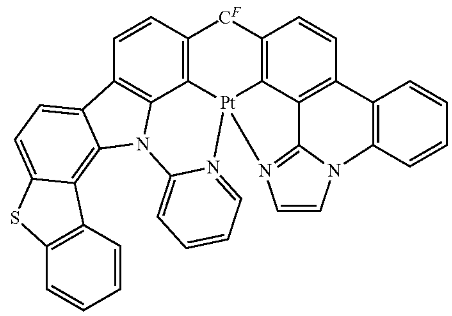
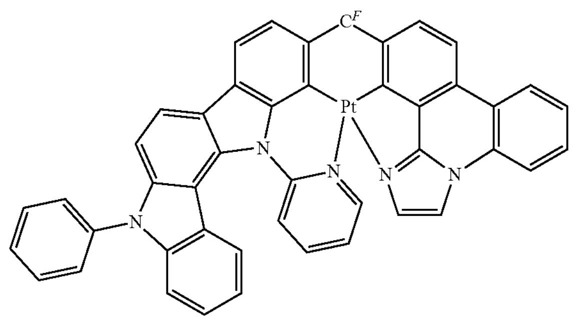
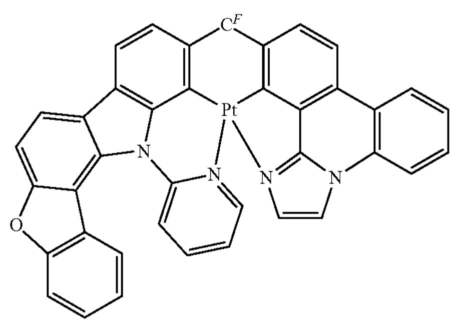
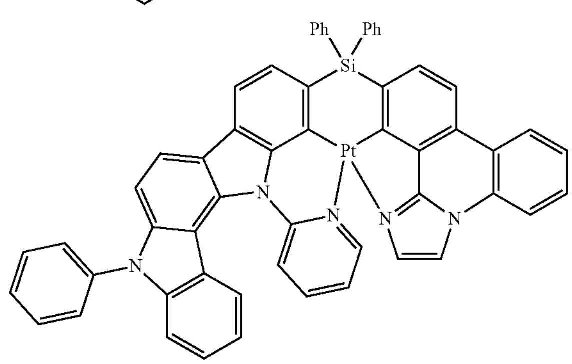
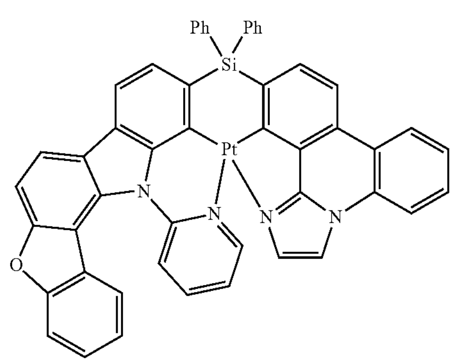

-continued
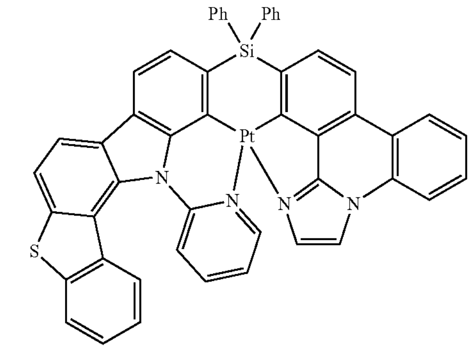
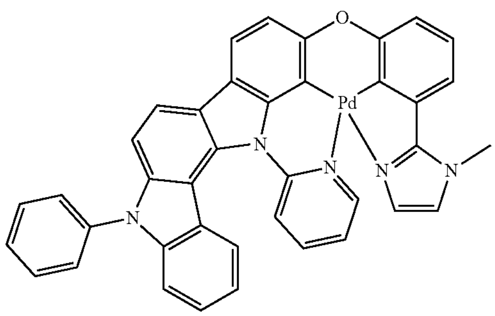
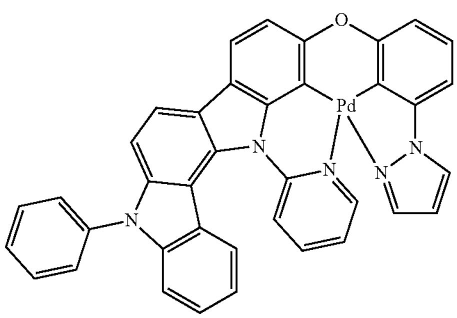
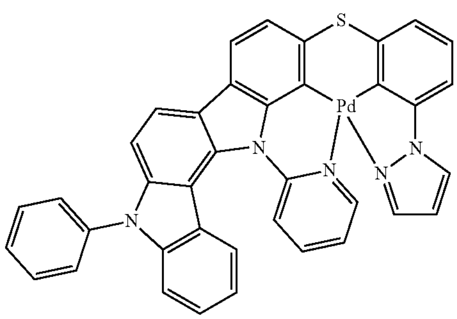
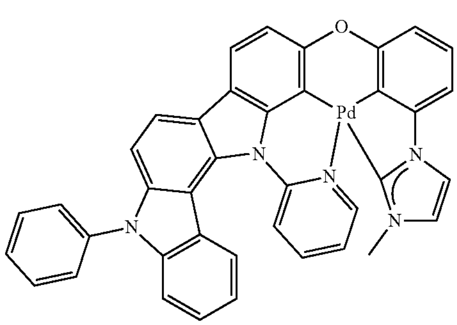
-continued
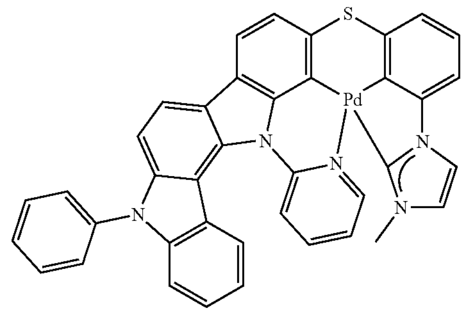
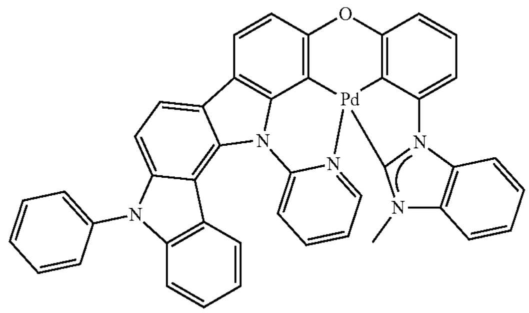
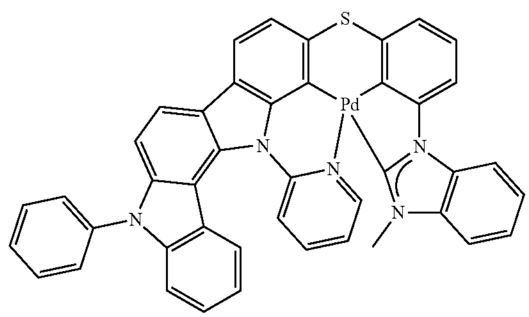
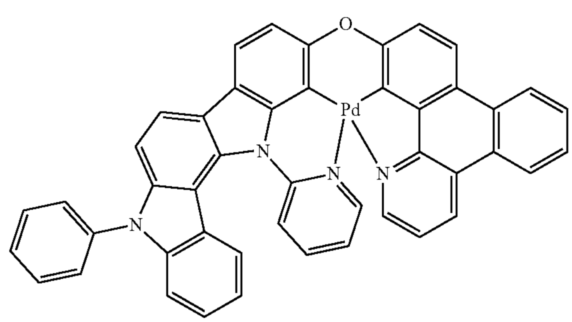
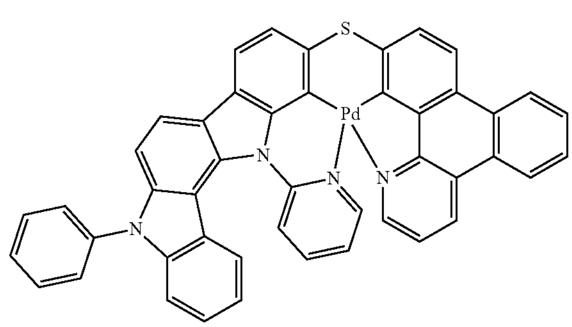

-continued
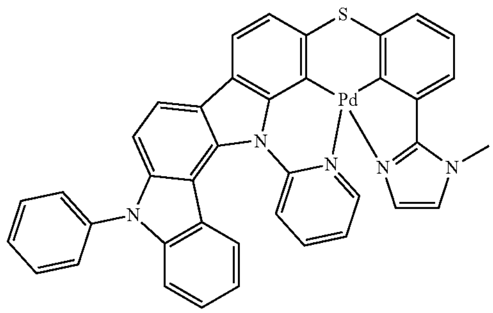
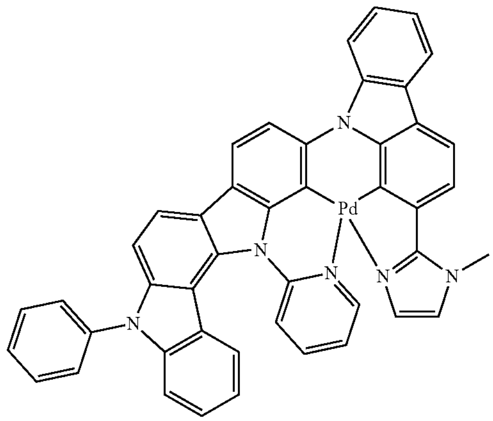
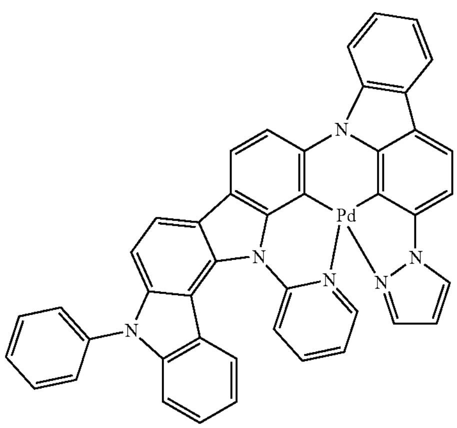
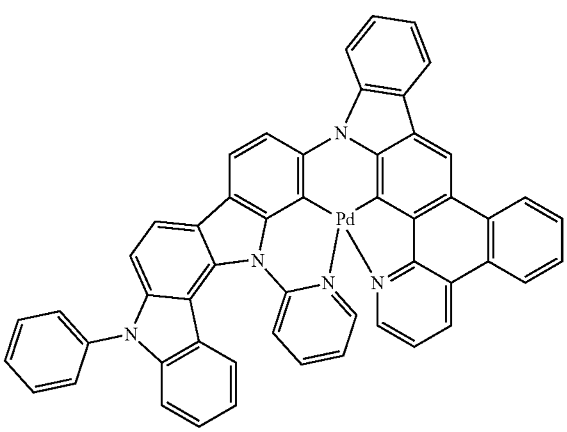
-continued
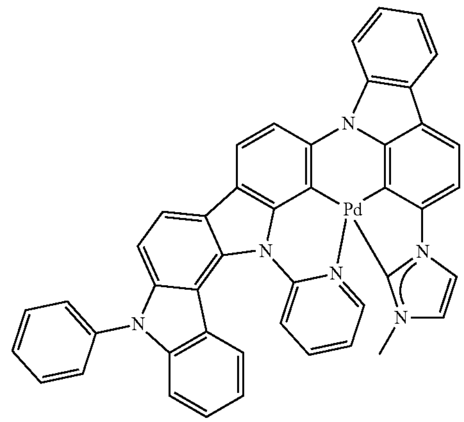
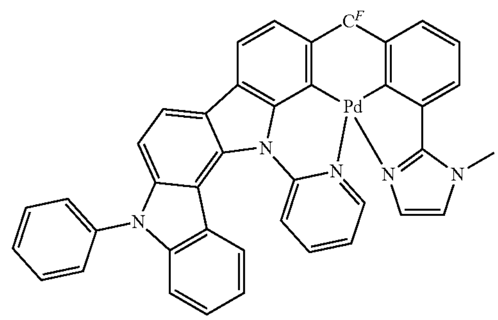
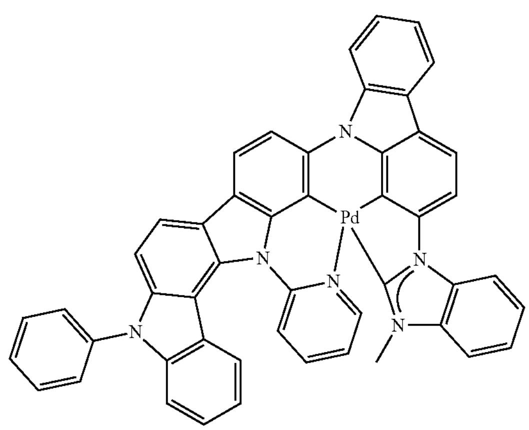
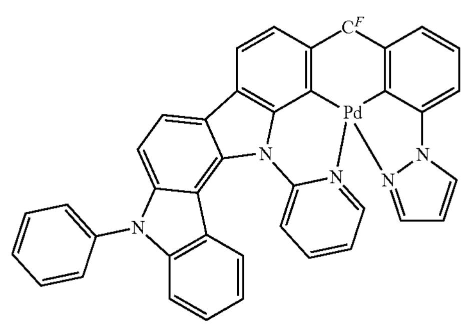

-continued
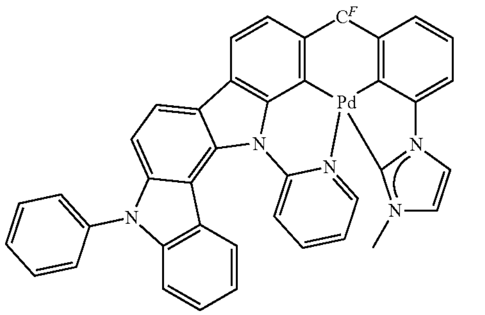
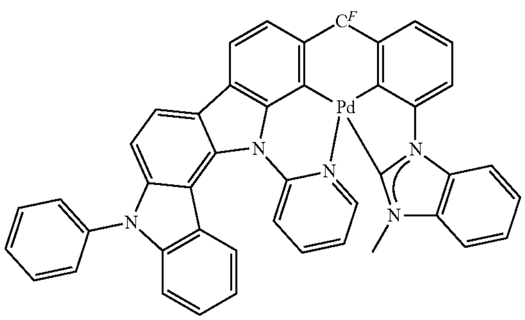
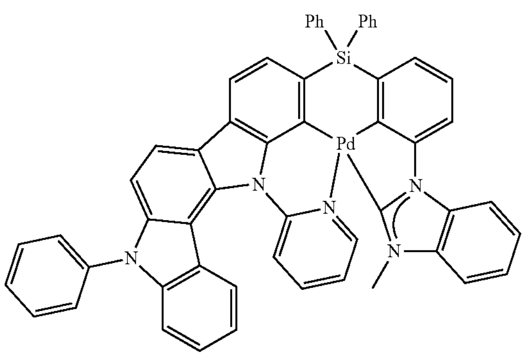
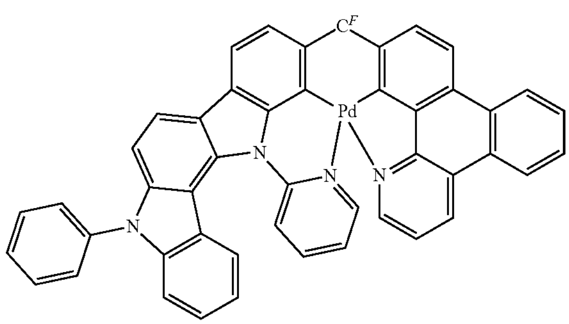
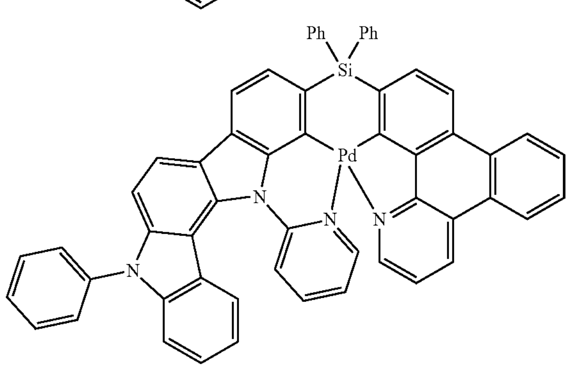
-continued
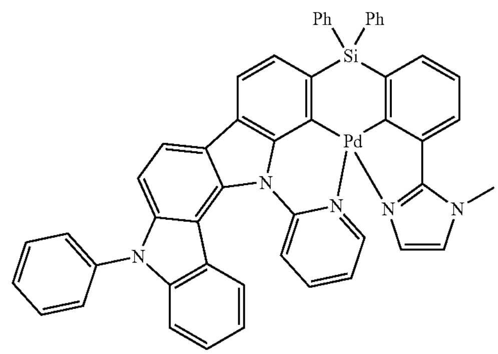
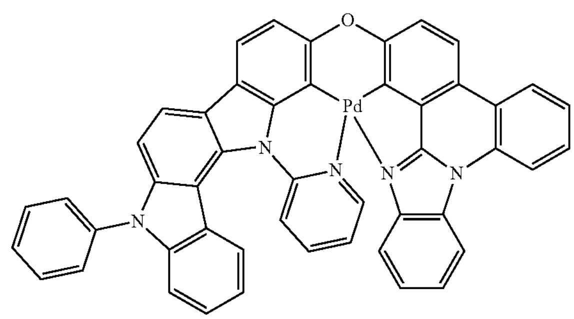
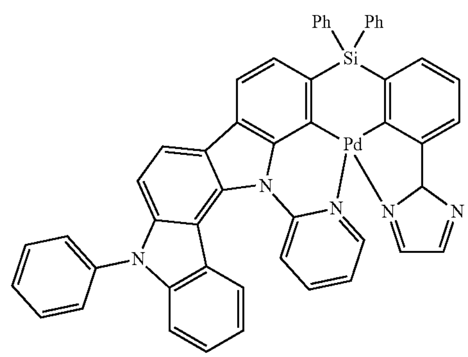
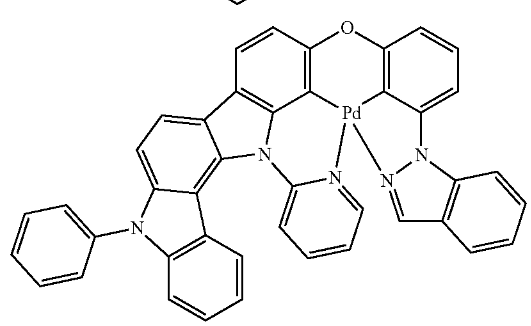
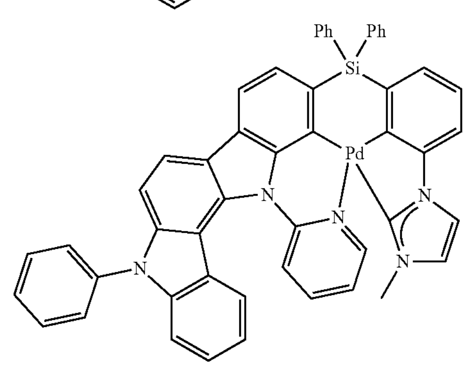

-continued
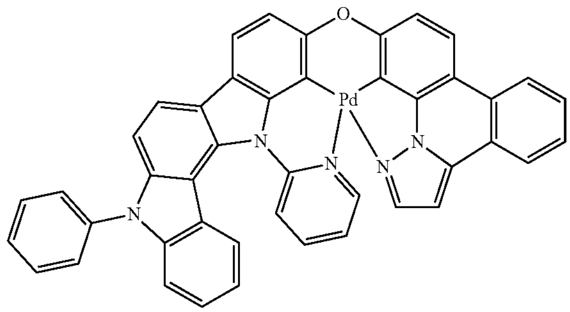
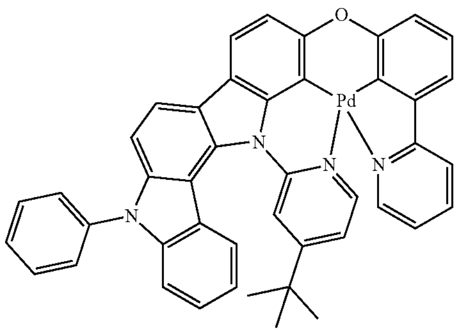
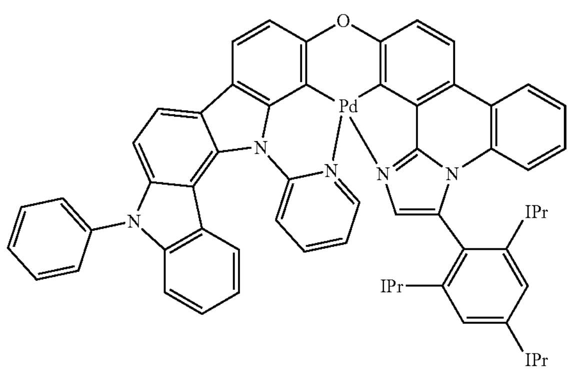
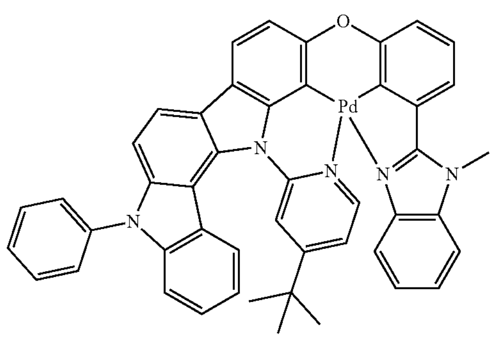
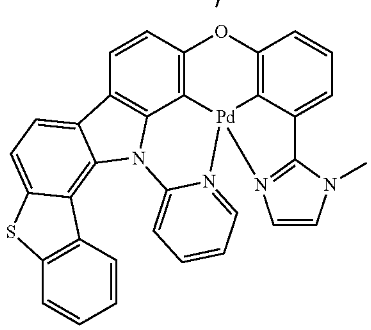
-continued
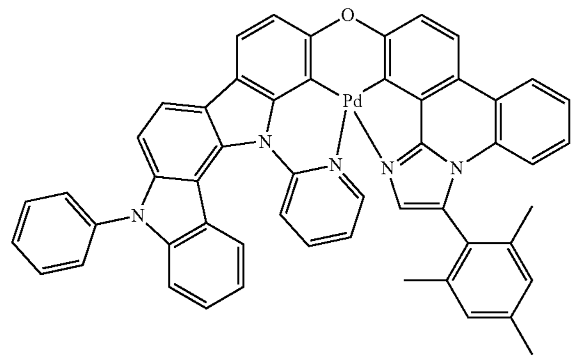
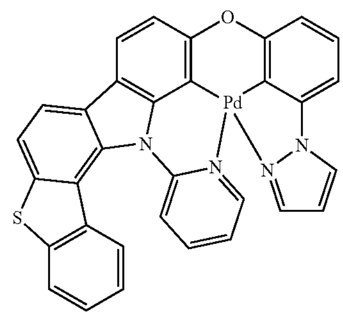
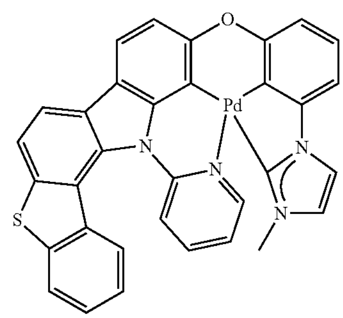
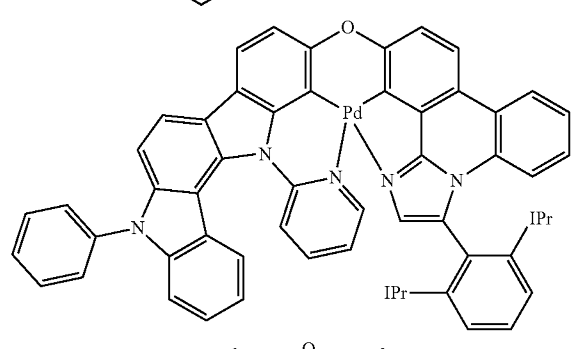
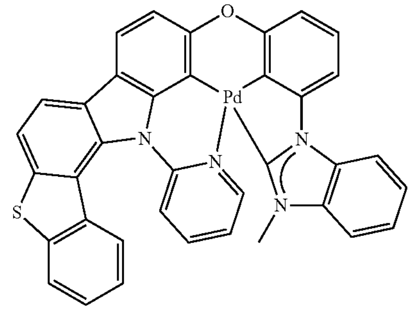

-continued
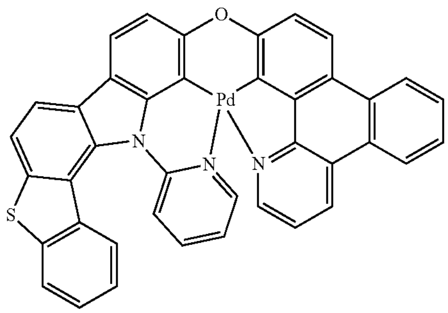
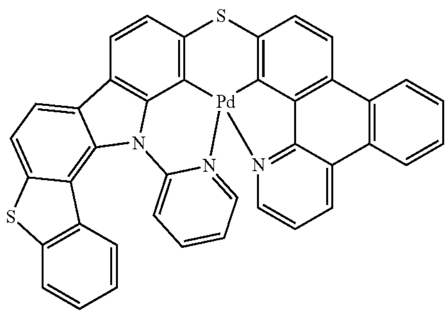
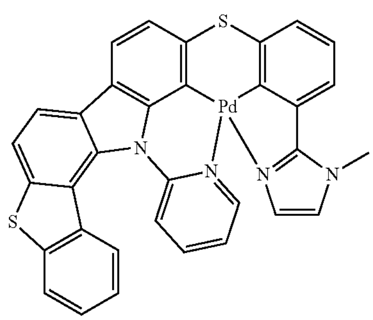
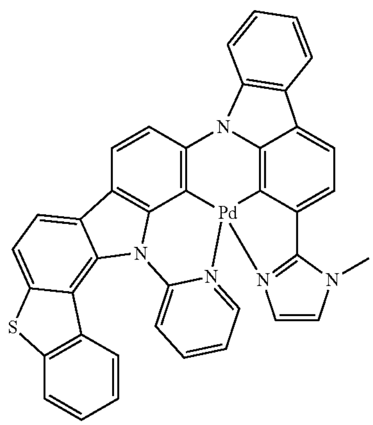
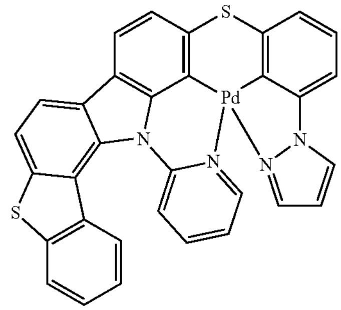
-continued
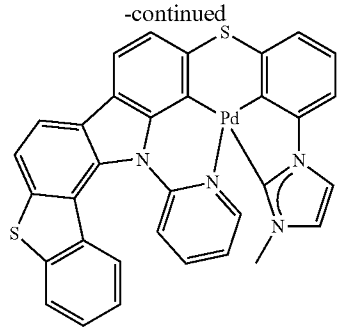
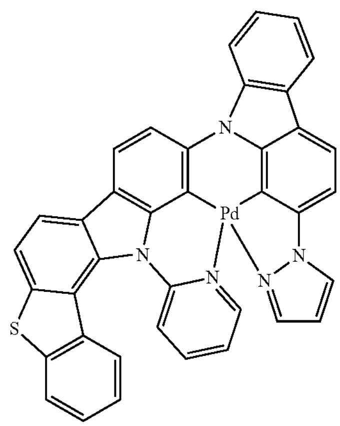
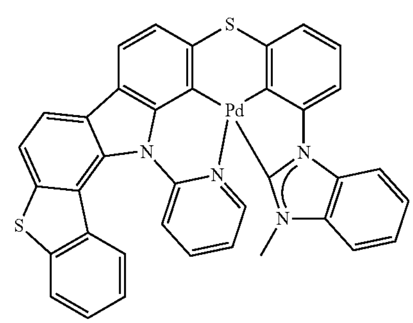
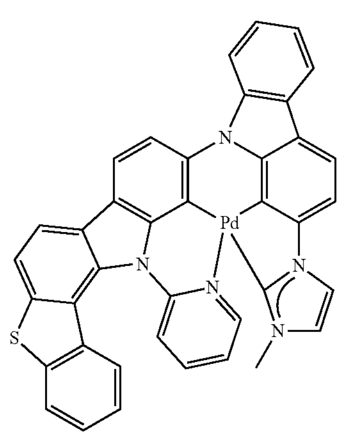

-continued
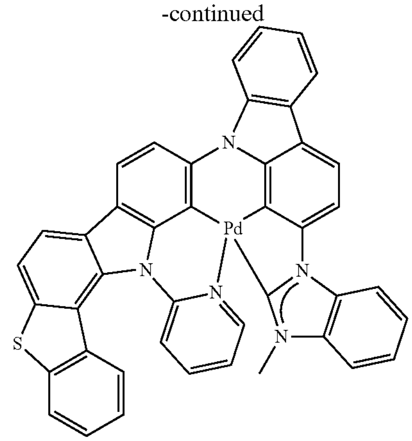
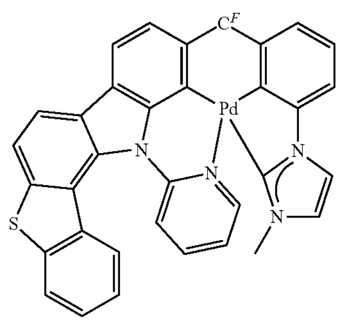
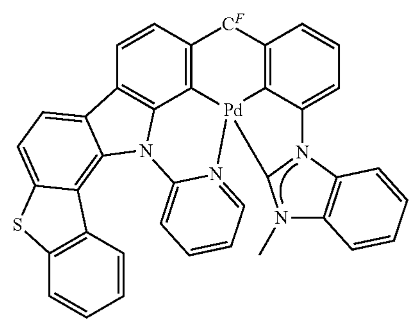
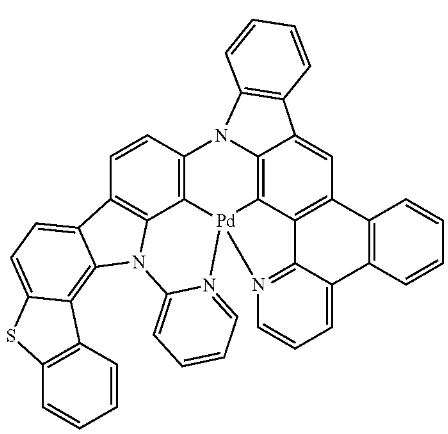
-continued
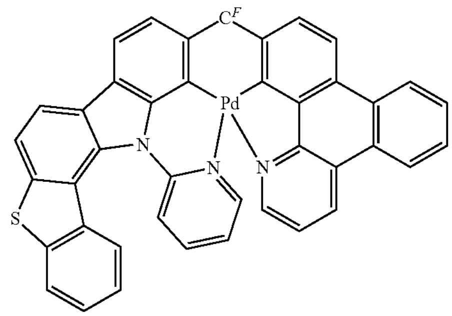
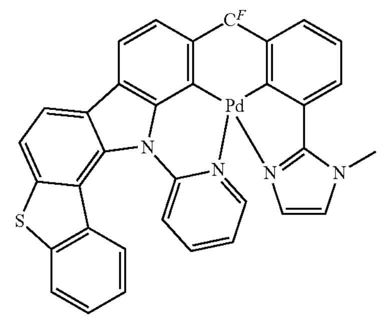
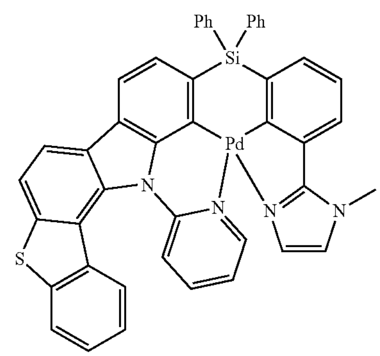
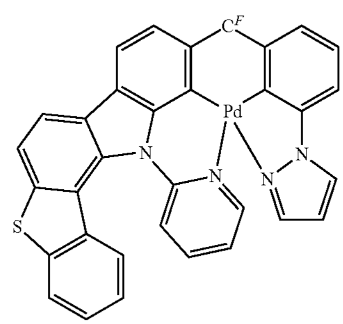
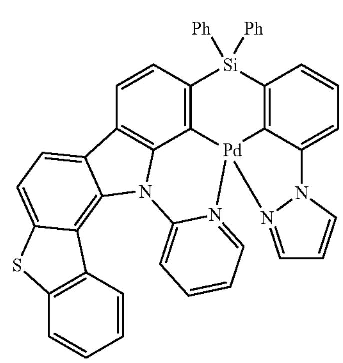

-continued
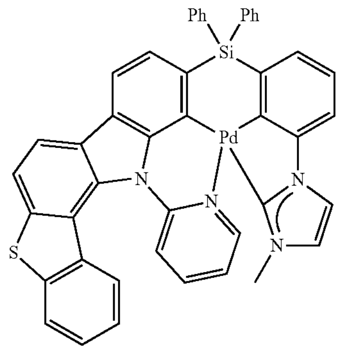
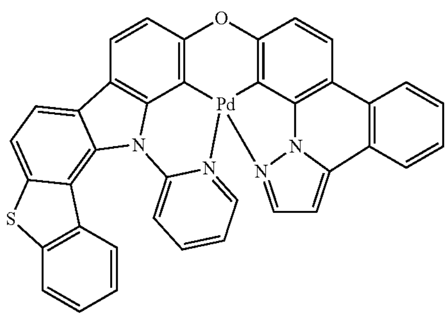
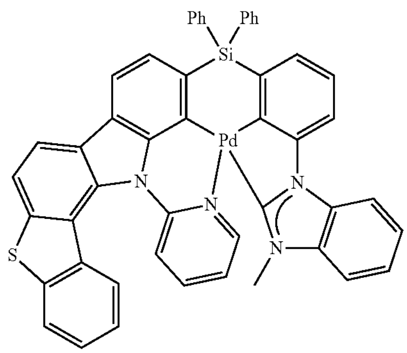
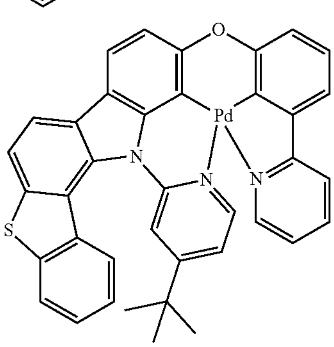
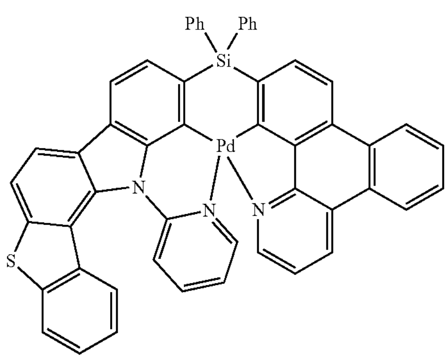
-continued
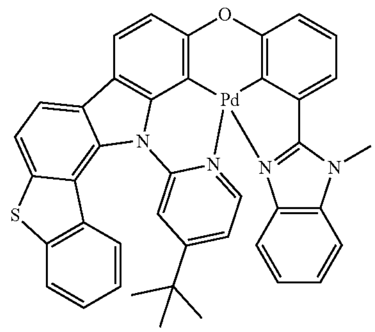
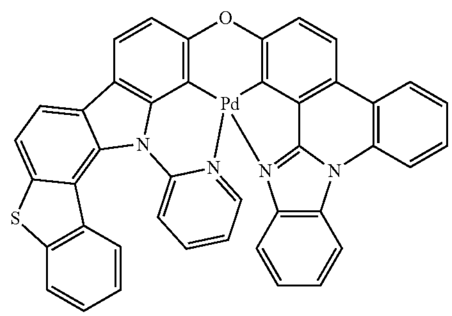
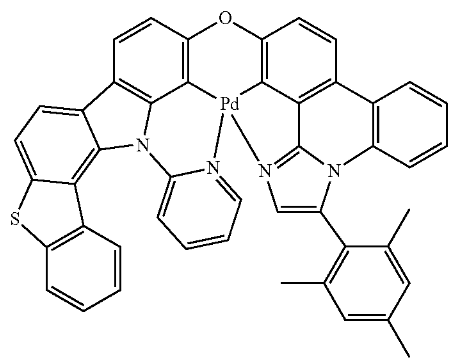
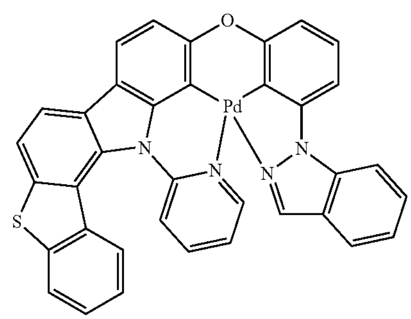
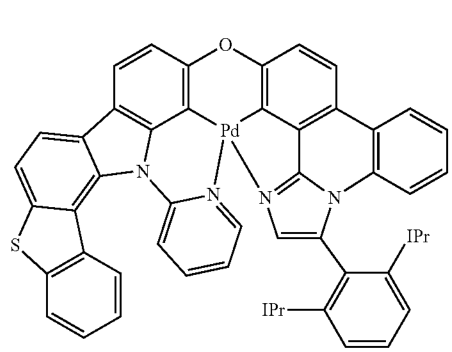

-continued
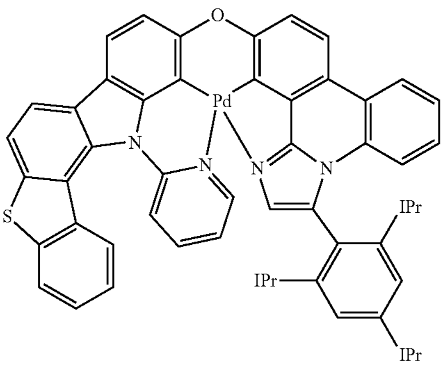
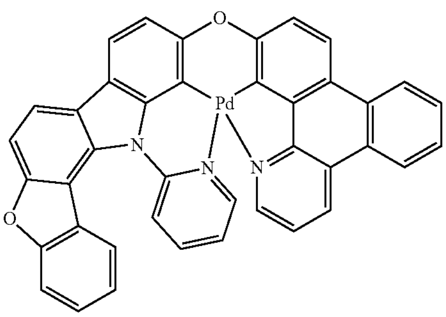
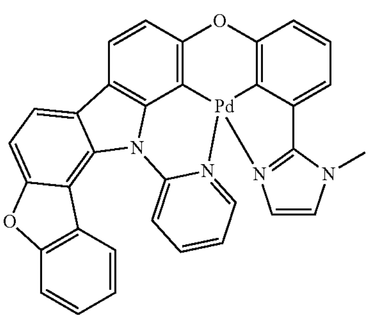
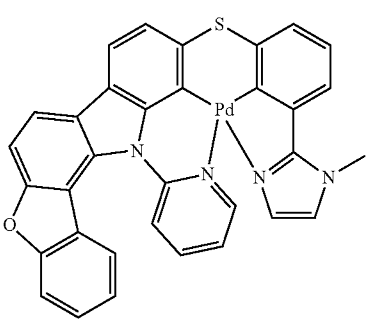
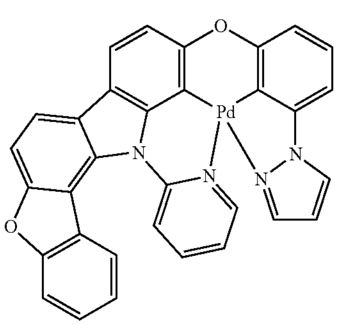
-continued
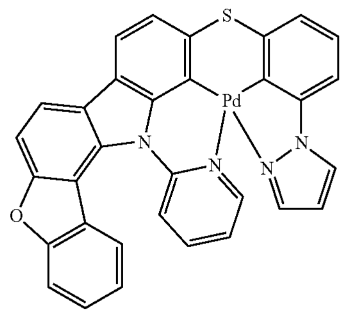
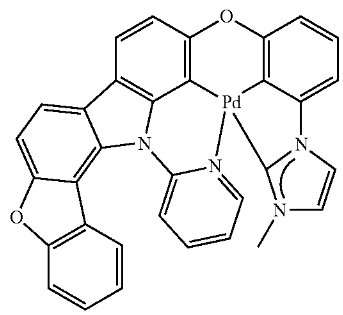
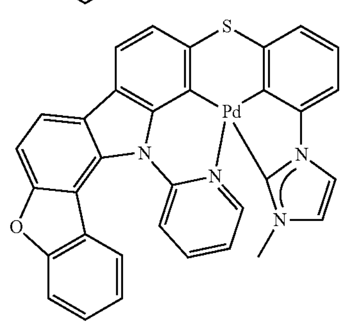
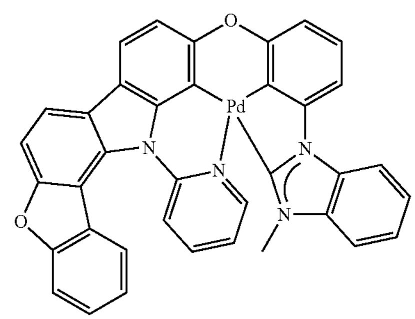
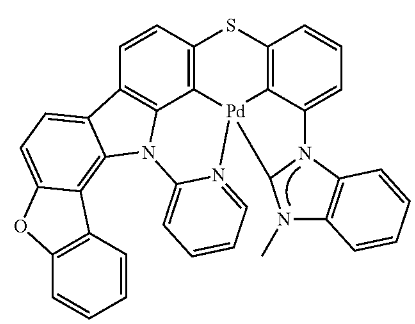

-continued
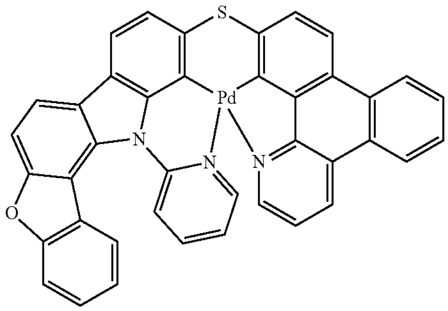
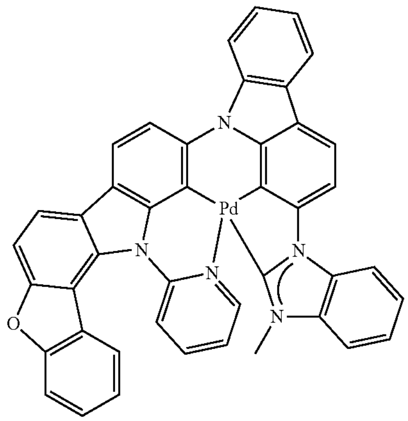
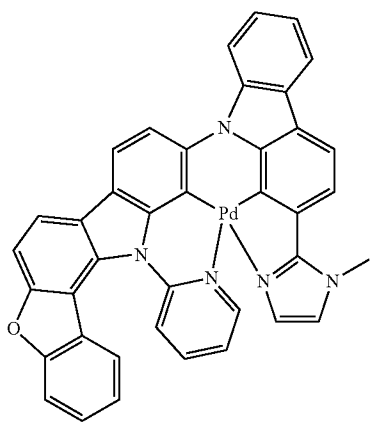
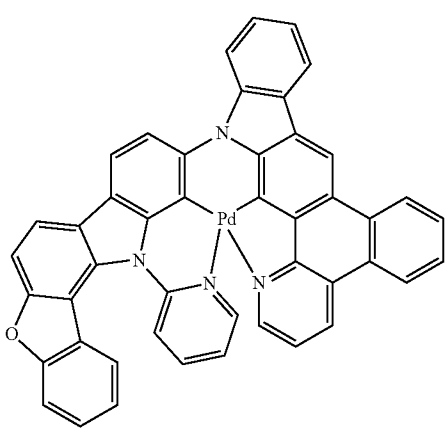
-continued
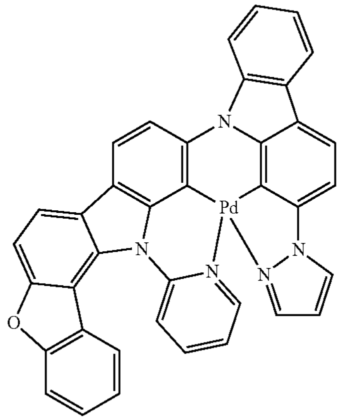
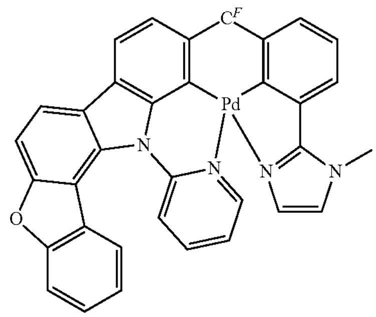
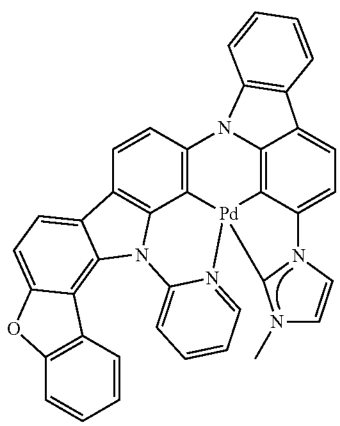
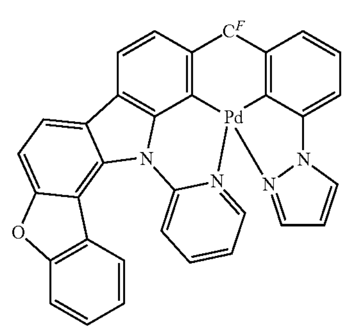

-continued
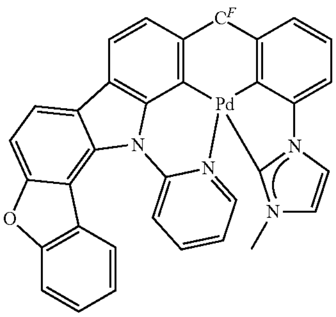
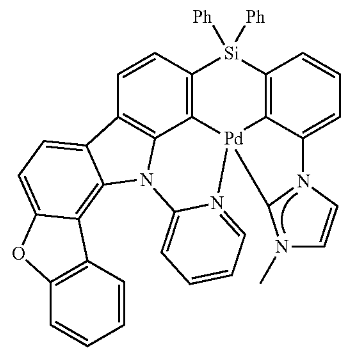
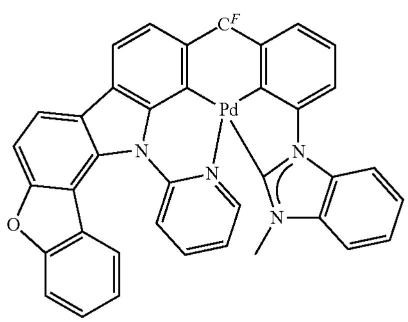
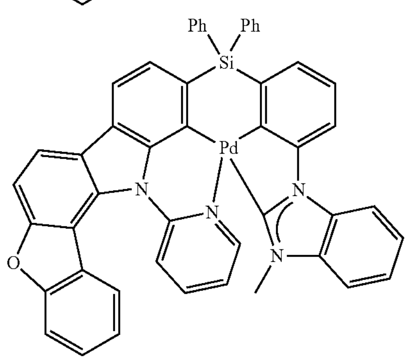
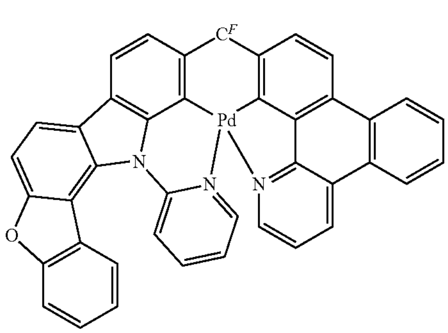
-continued
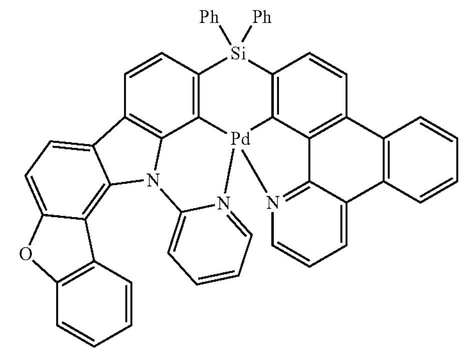
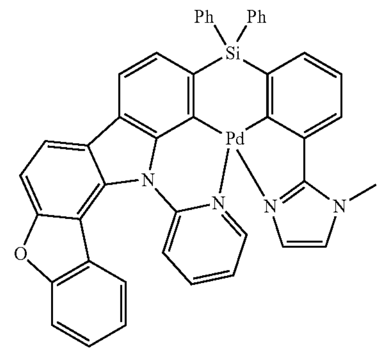
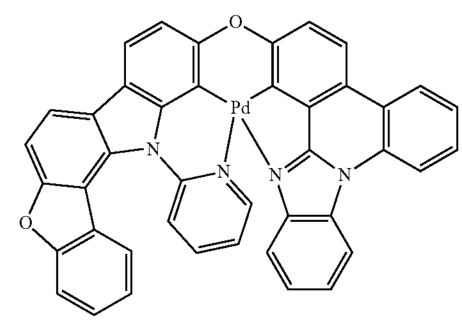
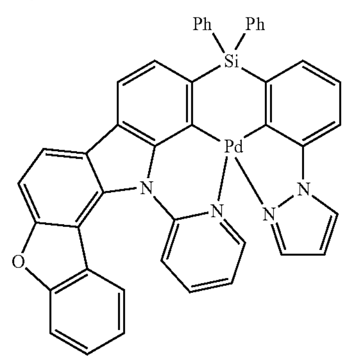
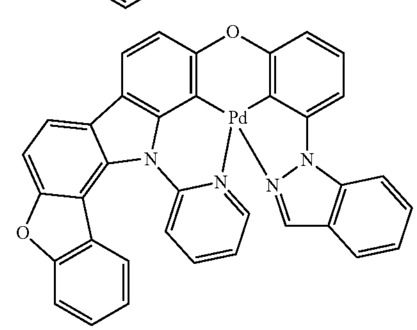

-continued
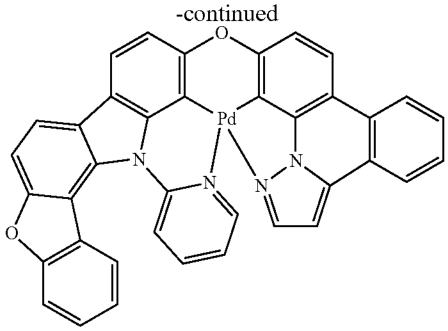
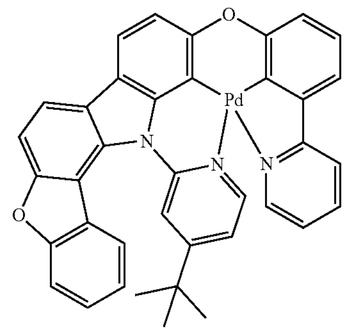
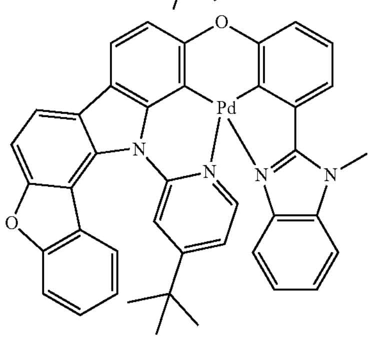
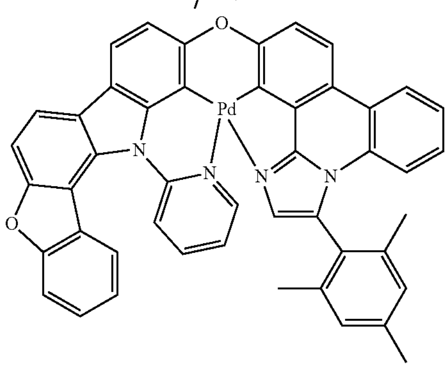
-continued
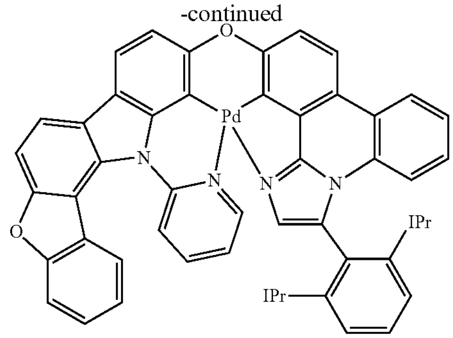
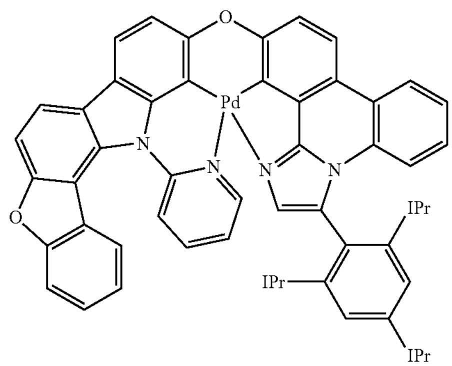
wherein
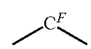 is 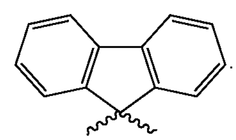.
2. A light emitting diode comprising the complex of claim 1.
3. A light emitting device comprising the light emitting diode of claim 2.
* * * * *